US005101492A

United States Patent [19]

Schultz et al.

[11] Patent Number: 5,101,492

[45] Date of Patent: Mar. 31, 1992

[54] DATA REDUNDANCY AND RECOVERY PROTECTION

[75] Inventors: Stephen M. Schultz, Houston; David S. Schmenk, The Woodlands; David L. Flower; E. David Neufeld, both of Tomball, all of Tex.

[73] Assignee: Compaq Computer Corporation, Houston, Tex.

[21] Appl. No.: 431,741

[22] Filed: Nov. 3, 1989

[51] Int. Cl.[5] .................................... G06F 11/20

[52] U.S. Cl. .................................... 395/575; 371/10.2

[58] Field of Search .................... 371/10.1, 10.2, 40.1; 364/268.3, 268.5, 268.9, 269.2; 395/575

[56] References Cited

U.S. PATENT DOCUMENTS

| | | | |
|---|---|---|---|
| 4,276,595 | 6/1989 | Brereton et al. | 364/200 |
| 4,454,595 | 6/1984 | Cage | 364/900 |
| 4,612,613 | 9/1986 | Gershenson | 364/200 |
| 4,773,004 | 9/1988 | Gershenson | 364/200 |
| 4,775,978 | 8/1988 | Hartness . | |
| 4,805,090 | 2/1989 | Coogan | 364/200 |
| 4,811,279 | 3/1989 | Bean et al. . | |
| 4,817,035 | 3/1989 | Timsit | 364/900 |
| 4,825,403 | 4/1989 | Gershenson | 364/900 |
| 4,843,544 | 6/1989 | DuLac et al. | 364/200 |
| 4,849,929 | 7/1989 | Timsit | 364/900 |
| 4,914,656 | 4/1990 | Dunphy, Jr. et al. | 371/10.2 |

OTHER PUBLICATIONS

D. Patterson et al, "A Case for Redundant Arrays of Inexpensive Disks (Raid)", ACM Sigmod Conference, Jun. 1-3, 1988.

M. Schulze, "Considerations in the Design of a Raid Prototype," Univ. of California Berkley, Aug. 1988.

C. Gibson, et al., "Coding Techniques for Handling Failures on Large Disk Arrays," Univ. of Cal. Berkley, Dec. 1988.

W. Moren, "Disk Arrays, Performance and Data Availability," IEEE Systems Design Conference, May 24, 1989.

M. Schulze, et al., "How Reliable is Raid?" Univ. of Cal. Berkley, 1989, appointed by IEEE.

D. Patterson, et al., "Introduction to Redundant Arrays of Inexpensive Disk (Raid)," Univ. of Cal. Berkley, 1989, reprinted by IEEE.

P. Chen, et al., "Two Papers on Raids," Univ. of Cal. Berkley, Dec., 1988.

D. Anderson, et al., "Disk Array Considerations" Imprimis Technology Corp. date unknown.

Promotional Literature, 1976 Inc., 1989.

Article Excert "IBM SCSI Card . . . " Infoworld, date unknown.

Informational Literature on Intogra-I, Pacstor Inc., date unknown.

Informational Literature, Fault Tolerance, Pacstore Inc., date unknown.

Informational Literature, Use of DOS V. Unix in Disk Storage Array, Pacstor Inc., date unknown.

Integra-III Block Diagram, Pacstor Inc., 1988.

Promotional Literature for Integra I, Pacstor Inc., 1989.

S. Kousky, "Pacstor Shows Subsystem with 'Fail Safe' Software", Apr. 11, 1988, CSN.

D. Britton "Arm Scheduling in Shadowed Disks," Mar, 1989 Compcon, reprinted by IEEE Computer Society.

S. Ng, "Some Design Issues of Disk Arrays," Mar. 1989 Compcon, reprinted by IEEE Computing Society.

W. Meador, "Disk Array Systems," Mar. 1989 Compcon, reprinted IEEE Computing Society.

Dataquist Research News Letter on Pacstor Inc., Integra III, May, 1988.

T. Dodge "Disk Arrays: Here Comes the Disk Drive Sextuples," Nov. 1, 1988, Electronic Business.

"Breake the Data-Rate Logjam with Arrays of Small Disk Drives," Feb. 1989, Electronics.

Promotional Literature of Cipricio Inc. for Parallel Disk Array Controller, date unknown.

D. Chandler, "Disk Arrays Promise Reliability, Better Access," Oct. 17, 1988 PC Week.

Disk Array Forum, Conference Proceedings, Sep. 18, 1989.

T. Williams, "Disk Array Features 1-Gbyte Fault-Tolerant Storage," Jun. 15, 1988, Computer Design.

"Synchronized 5¼—In. Winchester Drives Operates in Parallel and Store 1.5 G Bytes" EDN Nov. 26, 1987.

*Primary Examiner*—Charles E. Atkinson

*Attorney, Agent, or Firm*—Pravel, Gambrell, Hewitt, Kimball & Krieger

[57] ABSTRACT

A method for detecting the presence of a replacement disk in a fault tolerant, intelligent mass storage disk array subsystem having a microprocessor based controller in a personal computer system and rebuilding the replacement disk independent of the computer system processor. The method calls for the microprocessor controller to run a disk array check at system powerup or at specified intervals to detect the existence of a replacement drive. The microprocessor then builds a series of disk drive commands which attempt to read every sector on the replacement disk. The read commands will return a null data read, indicating that the sector must be restored. The microprocessor controller converts the replacement read commands for all sectors on the replacement disk to write-restore commands. The microprocessor executes the write commands and restores the data to the replacement drive.

10 Claims, 20 Drawing Sheets

DATA REDUNDANCY AND RECOVERY PROTECTION

BACKGROUND OF THE INVENTION

1. Field of the Invention

The present invention relates to the control of multiple disk drives within computer systems and more particularly to a method for maintaining data redundancy and recovering data stored on a disk in an intelligent mass storage disk drive array subsystem for a personal computer system.

2. Description of the Related Art

Microprocessors and the personal computers which utilize them have become more powerful over the recent years. Currently available personal computers have capabilities easily exceeding the mainframe computers of 20 to 30 years ago and approach the capabilities of many computers currently manufactured. Microprocessors having word sizes of 32 bits wide are now widely available, whereas in the past 8 bits was conventional and 16 bits was common.

Personal computer systems have developed over the years and new uses are being discovered daily. The uses are varied and, as a result, have different requirements for various subsystems forming a complete computer system. Because of production volume requirements and the reduced costs as volumes increase, it is desirable that as many common features as possible are combined into high volume units. This has happened in the personal computer area by developing a basic system unit which generally contains a power supply, provisions for physically mounting the various mass storage devices and a system board, which in turn incorporates a microprocessor, microprocessor related circuitry, connectors for receiving circuit boards containing other subsystems, circuitry related to interfacing the circuit boards to the microprocessor, and memory. The use of connectors and interchangeable circuit boards allows subsystems of the desired capability for each computer system to be easily incorporated into the computer system. The use of interchangeable circuit boards necessitated the development of an interface or bus standard so that the subsystems could be easily designed and problems would not result from incompatible decisions by the system unit designers and the interchangeable circuit board designers.

The use of interchangeable circuit boards and an interface standard, commonly called a bus specification because the various signals are provided to all the connectors over a bus, was incorporated into the original International Business Machines Corporations (IBM) personal computer, the IBM PC. The IBM PC utilized an Intel Corporation 8088 as the microprocessor. The 8088 has an 8 bit, or 1 byte, external data interface but operates on a 16 bit word internally. The 8088 has 20 address lines, which means that it can directly address a maximum of 1 Mbyte of memory. In addition, the memory components available for incorporation in the original IBM PC were relatively slow and expensive as compared to current components. The various subsystems such as video output units or mass storage units, were not complex and also had relatively low performance levels because of the relative simplicity of the devices available at a reasonable costs at that time.

With these various factors and the component choices made in mind, an interface standard was developed and used in the IBM PC. The standard utilized 20 address lines and 8 data lines, had individual lines to indicate input or output (I/O) space or memory space read/write operations, and had limited availability of interrupts and direct memory access (DMA) channels. The complexity of the available components did not require greater flexibility or capabilities of the interface standard to allow the necessary operations to occur. This interface standard was satisfactory for a number of years.

As is inevitable in the computer and electronics industry, capabilities of the various components available increased dramatically. Memory component prices dropped in capacities and speeds increased. Performance rate and capacities of the mass storage subsystems increased, generally by the incorporation of hard disk units for previous floppy disk units. The video processor technology improved so that high resolution color systems were reasonably affordable. These developments all pushed the capabilities of the existing IBM PC interface standard so that the numerous limitations in the interface standard became a problem. With the introduction by Intel Corporation of the 80286, IBM developed a new, more powerful personal computer called the AT. The 80286 has a 16 bit data path and 24 address lines so that it can directly address 16 Mbytes of memory. In addition, the 80286 has an increased speed of operation and can easily perform many operations which taxed 8088 performance limits.

It was desired that the existing subsystem circuit boards be capable of being used in the new AT, so the interface standard used in the PC was utilized and extended. A new interface standard was developed, which has become known as the industry standard architecture (ISA). A second connector for each location was added to contain additional lines for the signals used in the extension. These lines included additional address and data lines to allow the use of the 24 bit addressing capability and 16 bit data transfers, additional interrupt and direct memory access lines and lines to indicate whether the subsystems circuit board was capable of using the extended features. While the address values are presented by the 80286 microprocessor relatively early in the operation cycle, the PC interface standard could not utilize the initial portions of the address availability because of different timing standards for the 8088 around which the PC interface was designed. This limited the speed at which operations could occur because they were now limited to the interface standard memory timing specifications and could not operate at the rates available with the 80286. Therefore, the newly added address lines included address signals previously available, but the newly added signals were available at an early time in the cycle. This change in the address signal timing allowed operations which utilized the extended portions of the architecture to operate faster.

With the higher performance components available, it became possible to have a master unit other than the system microprocessor or direct memory access controller operating the bus. However, because of the need to cooperate with circuit boards which operated under the new 16 bit standard or the old 8 bit standard, each master unit was required to understand and operate with all the possible combinations of circuit boards. This increased the complexity of the master unit and resulted in a duplication of components, because the master unit had to incorporate many of the functions and features already performed by the logic and circuitry on the system board and other master units. Additionally, the master unit was required to utilize the direct memory access controller to gain control of the bus, limiting prioritizing and the number of master units possible in a given computer system.

The capability of components continued to increase. Memory speeds and sizes increased, mass storage units and size increased, video unit resolutions increased and Intel Corporation introduced the 80386. The increased capabilities of the components created a desire for the use of master units, but the performance of a master unit was limited by the ISA specification and capabilities. The 80386 could not be fully utilized because it offered the capability to directly address 4 Gbytes of memory using 32 bits of address and could perform 32 bit wide data transfers, while the ISA standard allowed only 16 bits of data and 24 bits of address. The local area network (LAN) concept, where information and file stored on one computer called server and distributed to local work stations having limited or no mass storage capabilities, started becoming practical with the relatively low cost of high capability of components needed for adequate servers and the low costs of the components for work stations. An extension similar to that performed in developing the ISA could be implemented to utilize the 80386's capabilities. However, this type of extension would have certain disadvantages. With the advent of the LAN concept and the high performance requirements of the server and of video graphics work stations used in computer-added design and animation work, the need for a very high data transfer rates became critical. An extension similar to that performed in developing the ISA would not provide this capability, even if slightly shorter standard cycle times were provided, because this would still leave the performance below desired levels.

With the increased performance of computer systems, it became apparent that mass storage subsystems, such as fixed disk drives, played an increasingly important role in the transfer on data to and from the computer system. In the past few years, a new trend in storage subsystems has emerged for improving data transfer performance, capacity and reliability. This is generally known as a disk array subsystem. One key reason for wanting to build a disk array subsystem is to create a logical device that has very high data transfer rate. This may be accomplished by "ganging" multiple standard disk drives together and transferring data to or from these drives to the system memory. If n drives are ganged together, then the effective data transferred rate is increased n times. This technique, called "striping" originated in the super computing environment where the transfer of large amounts of data to and from secondary storage is a frequent requirement. With this approach, the end physical drives would become a single logical device and may be implemented either through software or hardware.

Two data redundancy techniques have generally been used to restore data in the event of a catastrophic drive failure. One technique is that of a mirrored drive. A mirrored drive in effect creates a redundant data drive for each data drive. A write to a disk array utilizing the mirrored drive fault tolerance technique will result in a write to the primary data disk and a write to its mirror drive. This technique results in a minimum loss of performance in the disk array. However, there exist certain disadvantages to the use of mirrored drive fault tolerance techniques. The primary disadvantage is that this technique uses 50% of total data storage available for redundancy purposes. This results in a relatively high cost per available storage.

Another technique is the use of a parity scheme which reads data blocks being written to various drives within the array and uses a known exclusive or (XOR) technique to create parity information which is written to a reserved or parity drive in the array. The advantage to this technique is that it may be used to minimize the amount of data storage dedicated to redundancy and data recovery purposes when compared with mirror techniques. In an 8 drive array, the parity technique would call for one drive to be used for parity information; 12.5% of total storage is dedicated to redundancy as compared to 50% using the mirror technique. The use of the parity drive technique decreases the cost of data storage. However, there exist a number of disadvantages to the use of parity fault tolerance mode. The primary among the disadvantages is the loss of performance within the disk array as the parity drive must be updated each time a data drive is updated. The data must undergo the XOR process in order to write to the parity drive as well as writing the data to the data drives.

The use of the system processor to perform XOR parity information generation requires that the drive data go from the drives to a transfer buffer, to the system processor local memory to create the XOR parity information and that the parity information be written back to the drive via the transfer buffer. As a result, the host system processor encounters significant overhead in managing the generation of the XOR parity. The use of the local processor within the disk array controller also encounters many of the same problems that a system processor would. The drive data must again go from the drives to a transfer buffer to local processor memory to generate the XOR parity information and then back to the parity drive via the transfer buffer.

Related to this field of data error correction is U.S. Pat. No. 4,775,978 for data error correction system.

A number of reference articles on the design of disk arrays have been published in recent years. These include "Some Design Issues of Disk Arrays" by Spencer Ng, April 1989 IEEE; "Disk Array Systems" by Wes E. Meador, April 1989 IEEE; and "A Case for Redundant Arrays of Inexpensive Disks (RAID)" by D. Patterson, G. Gibson and R. Catts report No. UCB/CSD 87/391, December 1987, Computer Science Division, University of California, Berkley, Calif.

In the past when a drive has failed and has been replaced, it has been necessary to request special commands and operations to restore the data to the disk. Many times these operations require the dedication of the computer system such that it is not available to system users during the rebuild process. Both of these situations create transparency problems when recovering lost data.

SUMMARY OF THE INVENTION

The present invention is for use with a personal computer having a fault tolerant, intelligent disk array controller system; the controller being capable of managing the operation of an array of up to 8 standard integrated disk drives connected in drive pairs without supervision by the computer system host. Specifically, the present invention is directed towards a method and apparatus for maintaining data redundancy and restoring data to a failed disk within a disk array in a manner transparent to the host system and user.

The apparatus of the present invention contemplates the use of a dedicated XOR parity engine to be incorporated in the transfer controller. The parity XOR engine utilizes a disk array DMA channel which is itself composed of four individual subchannels. The XOR engine utilizes one of the subchannels, generating parity data on a word for word basis from up to four different transfer buffer blocks. Further, the XOR engine is capable of writing the result to either a specified disk drive or to a transfer buffer through the subchannel. The parity control circuitry within the transfer controller includes a 16 bit parity control register. Information with the parity control register includes: a parity enable bit which enables the disk DMA channel for parity operation; a parity direction bit which determines if the XOR result is to be placed in a transfer buffer or written to a disk; two parity count bits which are used to determine the number of data blocks that are to be XOR'd together during the parity operation; an interrupt enable bit; and a parity return bit which indicates whether a parity channel comparison was successful. The parity count operation bit refers to the number of separate transfer buffer memory ranges that are to be XOR'd together. Each of the memory ranges requires a separate starting memory address pointer.

The transfer controller parity circuitry also incorporates four 16 bit parity RAM address registers (0–3) used in conjunction with parity operations. The RAM address registers provide the starting pointers to the transfer buffer memory locations which contain the data blocks to be XOR'd together. Register 0 is assigned to the disk DMA subchannel 3, which, when enabled, is used to manage parity operations. The operation of the parity RAM address registers varies with the number of different blocks that are selected to be XOR'd together and whether the XOR result is to be written back to the transfer buffer or to the parity drive. If four separate block ranges are specified, data will be read from the blocks pointed to by the parity RAM address registers, the data will be XOR'd together and the results will be written to the block addressed by the last parity RAM register or to the parity drive. Should three separate block ranges be selected, the XOR result will be written to the memory location addressed by the parity RAM address register 2. Similarly, when two block ranges are selected, the XOR result will be written to the memory location addressed by parity RAM address register 1.

BRIEF DESCRIPTION OF THE DRAWINGS

A better understanding of the invention can be had when the following detailed description of the preferred embodiment is considered in conjunction with the following drawings, in which.

DETAILED DESCRIPTION OF THE PREFERRED EMBODIMENT

Table of Contents

I. Computer System Overview
II. Disk Array Controller
III. Command Protocol and Definition
IV. Data Recovery Operation
  A. Overview of Command Submission
  B. Data Recovery Technique
    1. Parity Recovery Examples
    2. Disk RIS Sectors
    3. Logical Unit Configuration
    4. All Consistent Module
    5. Vote
    6. Reconstruct
    7. Build Drive
    8. Regenerate
    9. Parity Regenerate
    10. Mirror Regenerate
Conclusion

Computer System Overview

Figure 1:
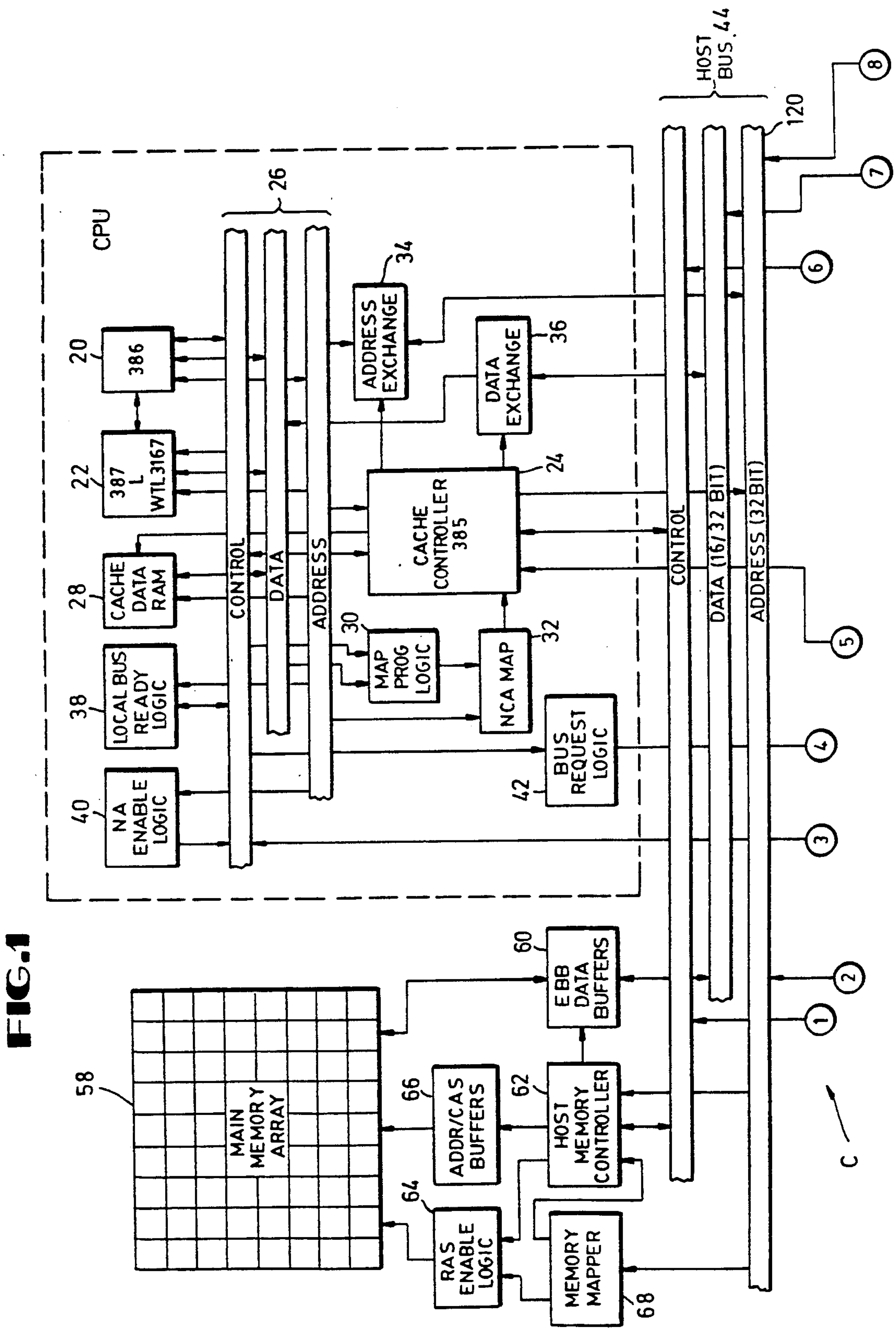
FIGS. 1, 2A and 2B are schematic block diagrams of a computer system incorporating the present invention.
Figure 2A:
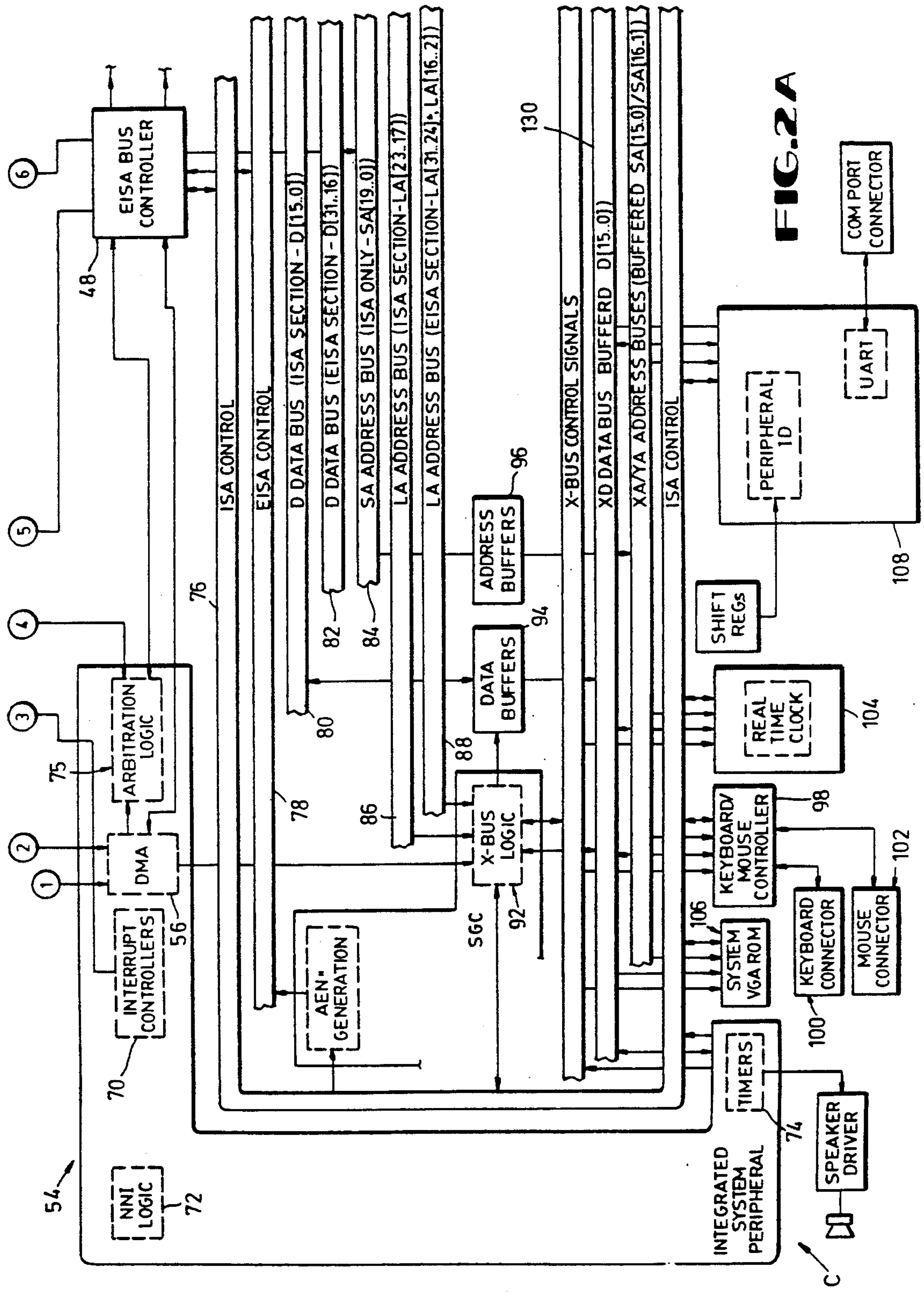
Figure 2B:
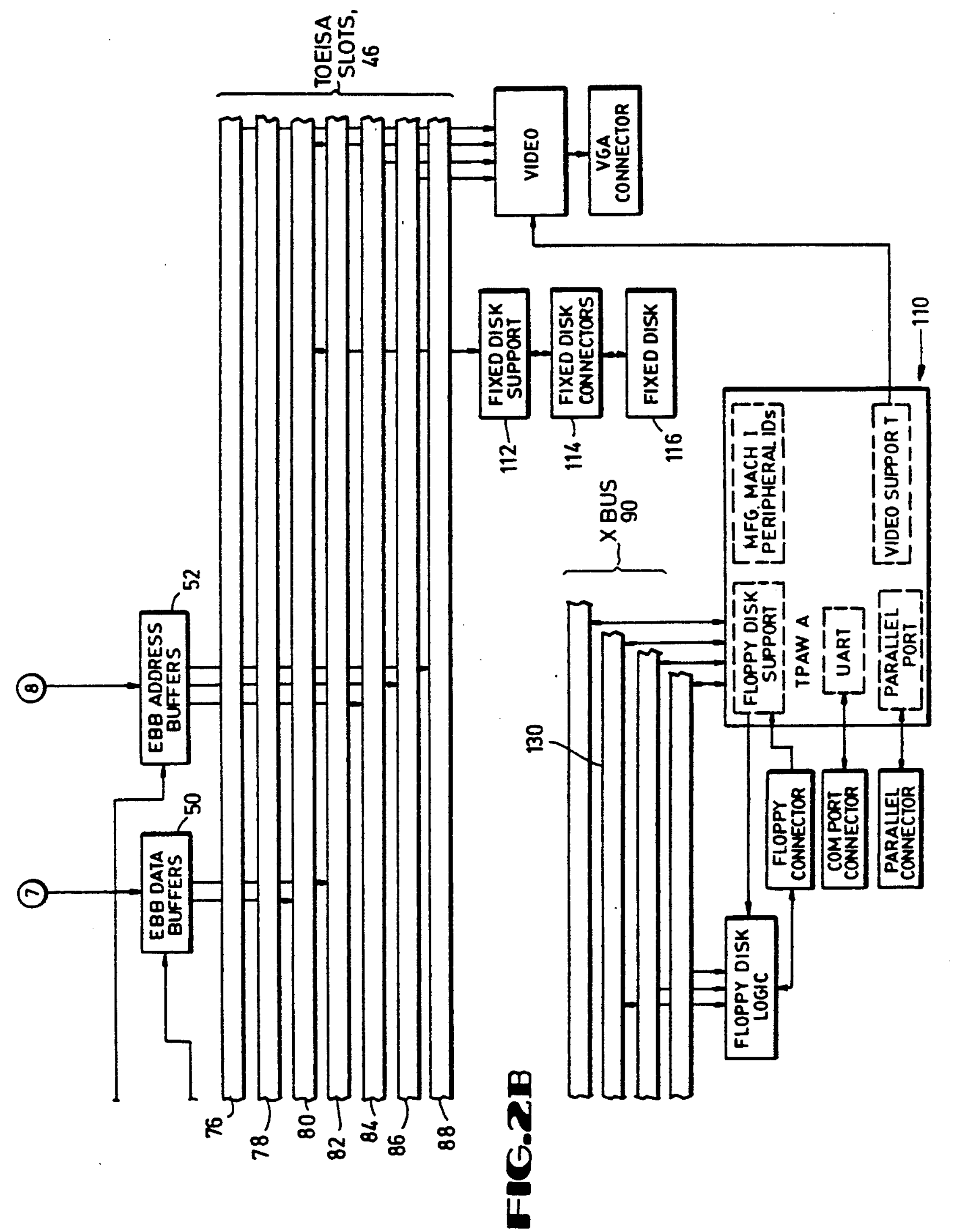

Referring now to FIGS. 1, 2A and 2B, the letter C designates generally a computer system incorporating the present invention. For clarity, system C is shown in two portions, with the interconnections between FIGS.

1, 2A and 2B designated by reference to the circled numbers one to eight. System C is comprised of a number of block elements interconnected via four buses.

In FIG. 1, a computer system C is depicted. A central processing unit CPU comprises a processor 20, a numerical coprocessor 22 and a cache memory controller 24 and associated logic circuits connected to a local processor bus 26. Associated with cache controller 24 is high speed cache data random access memory 28, noncacheable memory address map programming logic circuitry 30, noncacheable address memory 32, address exchange latch circuitry 34 and data exchange transceiver 36. Associated with the CPU also are local bus ready logic circuit 38, next address enable logic circuit 40 and bus request logic circuit 42.

The processor 20 is preferably an Intel 80386 microprocessor. The processor 20 has its control, address and data lines interfaced to the local processor bus 26. The coprocessor 22 is preferably an Intel 80387 and/or Weitek WTL 3167 numeric coprocessor interfacing with the local processor bus 26 and the processor 20 in the conventional manner. The cache ram 28 is preferably suitable high-speed static random access memory which interfaces with the address and data elements of bus 26 under control of the cache controller 24 to carry out required cache memory operations. The cache controller 24 is preferably an Intel 82385 cache controller configured to operate in two-way set associative master mode. In the preferred embodiment, the components are the 33 MHz versions of the respective units. Address latch circuitry 34 and data transceiver 36 interface the cache controller 24 with the processor 20 and provide a local bus interface between the local processor bus 26 and a host bus 44.

Circuit 38 is a logic circuit which provides a bus ready signal to control access to the local bus 26 and indicate when the next cycle can begin. The enable circuit 40 is utilized to indicate that the next address of data or code to be utilized by subsystem elements in pipelined address mode can be placed on the local bus 26.

Noncacheable memory address map programmer 30 cooperates with the processor 20 and the noncacheable address memory 32 to map noncacheable memory locations. The noncacheable address memory 32 is utilized to designate areas of system memory that are noncacheable to avoid many types of cache memory incoherency. The bus request logic circuit 42 is utilized by the processor 20 and associated elements to request access to the host bus 44 in situations such as when requested data is not located in the cache memory 28 and access to system memory is required.

In the drawings, system C is configured having the processor bus 26, the host bus 44, an extended industry standard architecture (EISA) bus 46 (FIG. 2) and an X bus 90. The details of the portion of the system illustrated in FIG. 2 and not discussed in detail below are not significant to the present invention other than to illustrate an example of a fully configured computer system. The EISA specification Version 3.1 is included as Appendix 1 to fully explain requirements of an EISA system. The portion of system C illustrated in FIG. 2 is essentially a configured EISA system which includes the necessary EISA bus 46, and EISA bus controller 48, data latches and transceivers 50 and address latches and buffers 52 to interface between the EISA bus 46 and the host bus 44. Also illustrated in FIG. 2 is an integrated system peripheral 54, which incorporates a number of the elements used in an EISA-based computer system.

The integrated system peripheral (ISP) 54 includes a direct memory access controller 56 for controlling access to main memory 58 (FIG. 1) or memory contained in EISA slots and input/output (I/O) locations without the need for access to the processor 20. The main memory array 58 is considered to be local memory and comprises a memory circuit array of a size suitable to accommodate the particular requirements of the system. The ISP 54 also includes interrupt controllers 70, nonmaskable interrupt logic 72 and system timers 74 which allow control of interrupt signals and generate necessary timing signals and wait states in a manner according to the EISA specification and conventional practice. In the preferred embodiment, processor generated interrupt requests are controlled via dual interrupt control circuits emulating and extending conventional Intel 8259 interrupt controllers. The ISP 54 also includes bus arbitration logic 75 which, in cooperation with the bus controller 48, controls and arbitrates among the various requests for the EISA bus 46 by the cache controller 24, the DMA controller 56 and bus master devices located on the EISA bus 46.

The main memory array 58 is preferably dynamic random access memory. Memory 58 interfaces with the host bus 44 via a data buffer circuit 60, a memory controller circuit 62 and a memory mapper 68. The buffer 60 performs data transceiving and parity generating and checking functions. The memory controller 62 and memory mapper 68 interface with the memory 58 via address multiplexer and column address strobe buffers 66 and row address enable logic circuit 64.

The EISA bus 46 includes ISA and EISA control buses 76 and 78, ISA and EISA control buses 80 and 82 and address buses 84, 86 and 88. System peripherals are interfaced via the X bus 90 in combination with the ISA control bus 76 from the EISA bus 46. Control and data/address transfer for the X bus 90 are facilitated by X bus control logic 92, data transceivers 94 and address latches 96.

Attached to the X bus 90 are various peripheral devices such as keyboard/mouse controller 98 which interfaces the X bus 90 with a suitable keyboard and mouse via connectors 100 and 102, respectively. Also attached to the X bus 90 are read only memory circuits 106 which contain basic operations software for the system C and for system video operations. A serial communications port 108 is also connected to the system C via the X bus 90. Floppy and fixed disk support, a parallel port, a second serial port, and video support circuits are provided in block circuit 110.

II. Disk Array Controller

Figure 3:
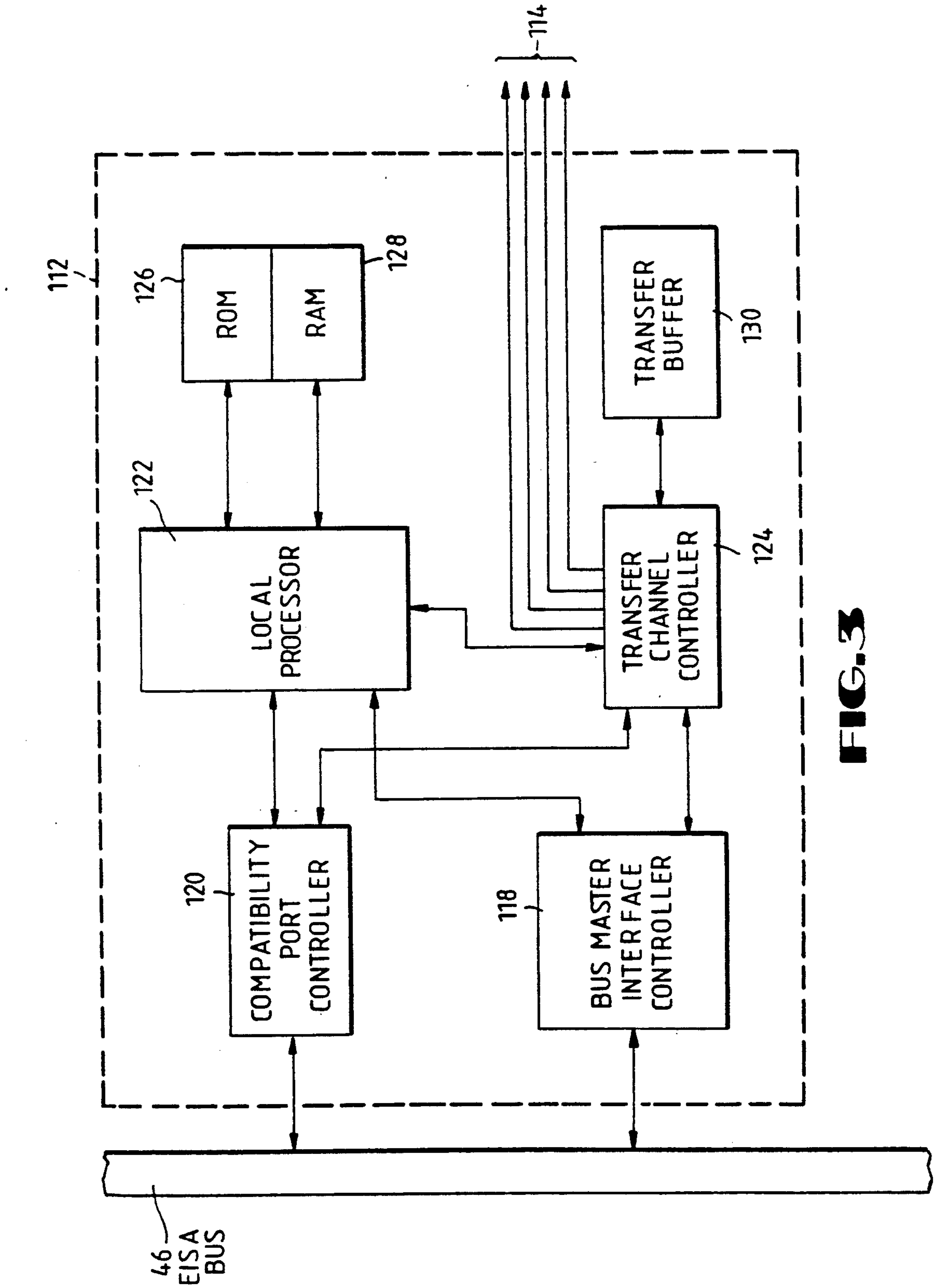
FIG. 3 is a schematic block diagram of a disk array controller incorporating the present invention.

The disk array controller 112 is connected to the EISA bus 46 to provide for the communication of data and address information through the EISA bus. Fixed disk connectors 114 are connected to the fixed disk support system and are in turn connected to a fixed disk array 116. FIG. 3 is a schematic block diagram of the disk array controller 112 incorporating the present invention. The disk array controller 112 incorporating the present invention includes a bus master interface controller 118 (BMIC), preferably an Intel Corporation 82355, which is designed for use in a 32 bit EISA bus master expansion board and provides all EISA control, address, and data signals necessary for transfers across the EISA bus. The BMIC 118 supports 16 and 32 bit burst transfers between the disk array system and system memory. Further, the BMIC is capable of converting a transfer to two 32 bit transfers if the memory to be transferred is nonburstable. Additionally, BMIC 118 provides for the transfers of varying data sizes between an expansion board and EISA and ISA devices.

The disk array controller 112 of the present invention also includes a compatibility port controller (CPC) 120. The CPC 120 is designed as a communication mechanism between the EISA bus 46 and existing host driver software not designed to take advantage of EISA capabilities.

Also included in the disk array controller 112 which incorporates the present invention is a microprocessor 122, preferably an Intel Corporation 80186 microprocessor. The local processor 122 has its control, address and data lines interfaced to the BMIC 118, CPC 120, and transfer channel controller 124. Further, the local processor 122 is also interfaced to local read only memory (ROM) 126 and dynamic random access memory (RAM) 128 located within the disk array controller 112.

The transfer channel controller (TCC) 124 controls the operation of four major DMA channels that access a static RAM transfer buffer 130. The TCC 124 assigns DMA channels to the BMIC 118, the CPC 120 the local processor 122 and to the disk array DMA channel 114. The TCC 124 receives requests from the four channels and assigns each channel a priority level. The local processor 122 has the highest priority level. The CPC 120 channel has the second highest priority level. The BMIC 118 channel has the third highest priority level and the disk array DMA channel 114 has the lowest priority level.

The disk array DMA channel 114 is comprised of four disk drive subchannels. The four disk drive subchannels may be assigned to any one of eight different disk drives residing in the disk array. The four drive subchannels have equal priority within the disk array DMA channel. The subchannels are rotated equally to become the source for the disk array DMA channel. One of the subchannels is inserted in rotation only if it has an active DMA request. The remaining three subchannels are always active in the rotation.

In the present invention a request is preferably submitted to the disk array controller 112 through the BMIC 118. The local processor 122 on receiving this request through the BMIC 118 builds a data structure in local processor RAM memory 128. This data structure is also known as a command list and may be a simple read or write request directed to the disk array, or it may be a more elaborate set of request containing multiple read/write or diagnostic and configuration requests. The command list is then submitted to the local processor 122 for processing. The local processor 122 then oversees the execution of the command list, including the transferring of data. Once the execution of the command list is complete, the local processor 122 notifies the operating system device driver. The submission of the command list and the notification of a command list completion are achieved by a protocol which uses the BMIC 118 I/O registers. To allow multiple outstanding requests to the disk array controller 112, these I/O registers are divided into two channels: a command list submit channel and a command list complete channel.

The method of the present invention is implemented as a number of application tasks running on the local processor 122 (FIG. 3). Because of the nature of interactive input/output operations, it is impractical for the present invention to operate as a single batch task on the local processor 122. Accordingly, the local processor 122 utilizes a real time multitasking use system which permits multiple tasks to be addressed by the local processor 122, including the present invention. Preferably, the operating system on the local processor 122 is the AMX86 Multitasking Executive by Kadak Products Limited. The AMX operating system kernel provides a number of system services in addition to the applications set forth in the method of the present invention.

III. Command Protocol and Definition

Figure 5:
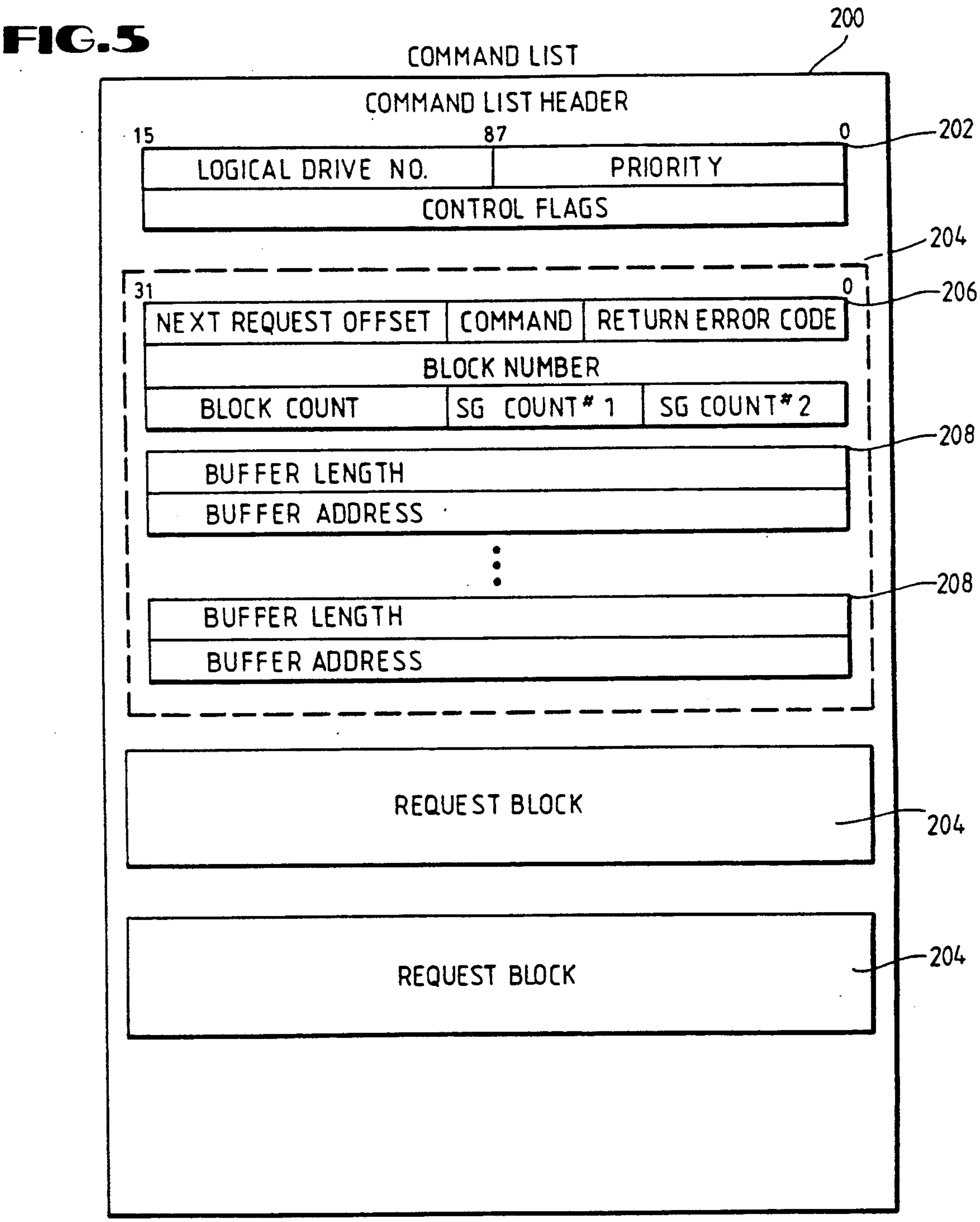
FIG. 5 is a schematic block diagram depicting a command list, including command list header and request blocks.

Referring now to FIG. 5, the method of the present invention includes the development of a data structure for the disk array controller 112 known as a command list 200. The command list 200 consist of a command list header 202, followed by a variable number of request blocks 204. The request blocks are variable in length and may be any combination of I/O requests which will be described further below. A command list 200 typically contains a number of related request blocks 204; from 1 to any number that take up less than 16 Kbyte of memory. The command list header 202 contains data that applies to all request blocks 204 in a given command list 200: logical drive number, priority and control flags. The request blocks 204 consist of a request block header 206 and other requested parameters, given the nature of the request. The request block header 206 has a fixed length, whereas other request parameters are variable in length.

The individual request blocks 204 each represent an individual I/O request. By forming a command list 200 out of several individual request blocks, and submitting the command list 200 to the disk array controller 112 (FIG. 2), the computer system C microprocessor 20 overhead is reduced.

Still referring to FIG. 5, a command list header 202 contains information that applies to each of the request blocks 204 contained in the command list 200. The command list header 202 is a total of 4 bytes in length. The logical drive number specifies which to logical drive that all request blocks 204 within the command list 200 apply. The method of the present invention permits a total of 256 logical drives to be specified. The priority bit is used to provide control over the processing of a command list. The disk array controller 112 is capable of operating upon many command lists concurrently. In specifying priority, the method of the present invention permits a command list to be processed prior to those already scheduled for processing by the disk array controller. The control flag bytes in the method of the present invention are used for error processing and ordering of request of the same priority. Ordered request are scheduled according to priority, however, they are placed after all previous request of the same priority. If all requests are of the same priority and the order flag is set, the request are performed on a first-come, first-serve basis.

Error condition reporting options are specified by error flags in the control flag bytes. In the event of an error, the disk array controller 112 can either: notify the requesting device and continue processing request blocks 204 in the list; notify the requesting device and stop processing of all other request blocks 204 in the list; or not notify the requesting device of the error. In all instances, an error code will be returned in the command list status register at the time the next command list complete notification and in the error code field in the request block 204 where the error occurred. Further, notification of completion may be set for each individual request block 204 or for the entire command list 200. In the event the EISA bus 46 is to be notified each time a request block has been completed a "notify on completion of every request" flag may be set in the control flags field.

A command list 200 has a variable number of request blocks 204. In order to quickly and efficiently traverse the list of variable request blocks 204 the request header includes a pointer or next request offset which specifies an offset of "n" bytes from the current request block address to the next request block. This field makes the command list 200 a set of linked list request blocks 204. The last request block 204 has a value of 000h in the next request offset to signify the end of the command list 200. Thus, the method in the present invention permits memory space between request blocks 204 within a command list 200 which may be used by an operating system device driver. However, it should be noted that the greater the extra space between the request blocks 204 the longer it will require the disk array controller 112 to transfer the command list 200 into its local memory.

A request block 204 is comprised of two parts, a fixed length request header 206 any variable length parameter list 208. The parameters are created as data structures known as scatter/gather (S/G) descriptors which define system memory 58 data transfer addresses. The request header 206 fields contain a link to the next request block 204, the I/O command, space for a return status, a block address and a block count, and a count of the scatter/gather descriptor structure elements for two S/G structures. The request header is a total of 12 bytes in length.

The scatter/gather descriptor counters are used to designate the number of scatter/gather descriptors 208 which utilized in the particular request. The number of scatter/gather descriptors 208 associated with the request block 204 will vary. Further, if the command is a read command, the request may contain up to two different sets of scatter/gather descriptors. Each scatter/gather descriptor 208 contains a 32 bit buffer length and a 32 bit address. This information is used to determine the system memory data transfer address which will be the source or destination of the data transfer. Unlike the requests blocks 204 in the command list, the scatter/gather descriptors must be contiguous and, if there exists a second scatter/gather descriptor set for a request, it must directly follow the first set of scatter gather descriptors.

The command specifies the function of the particular request block and implies the format of the parameter list. The commands supported by the disk array controller 112 include:

COMMAND

IDENTIFY LOGICAL DRIVE
IDENTIFY CONTROLLER
IDENTIFY LOGICAL DRIVE STATUS
START RECOVERY
READ
WRITE
DIAGNOSTIC MODE
SENSE CONFIGURATION
SET CONFIGURATION

The start recovery command is issued by EISA CMOS and is used to initiate rebuild of a mirror drive in the instance of a mirror fault tolerance mode or parity recovery to recover lost data information for a defective or replacement disk.

IV. Data Recovery

A. Overview of Command Submission

Figure 6:
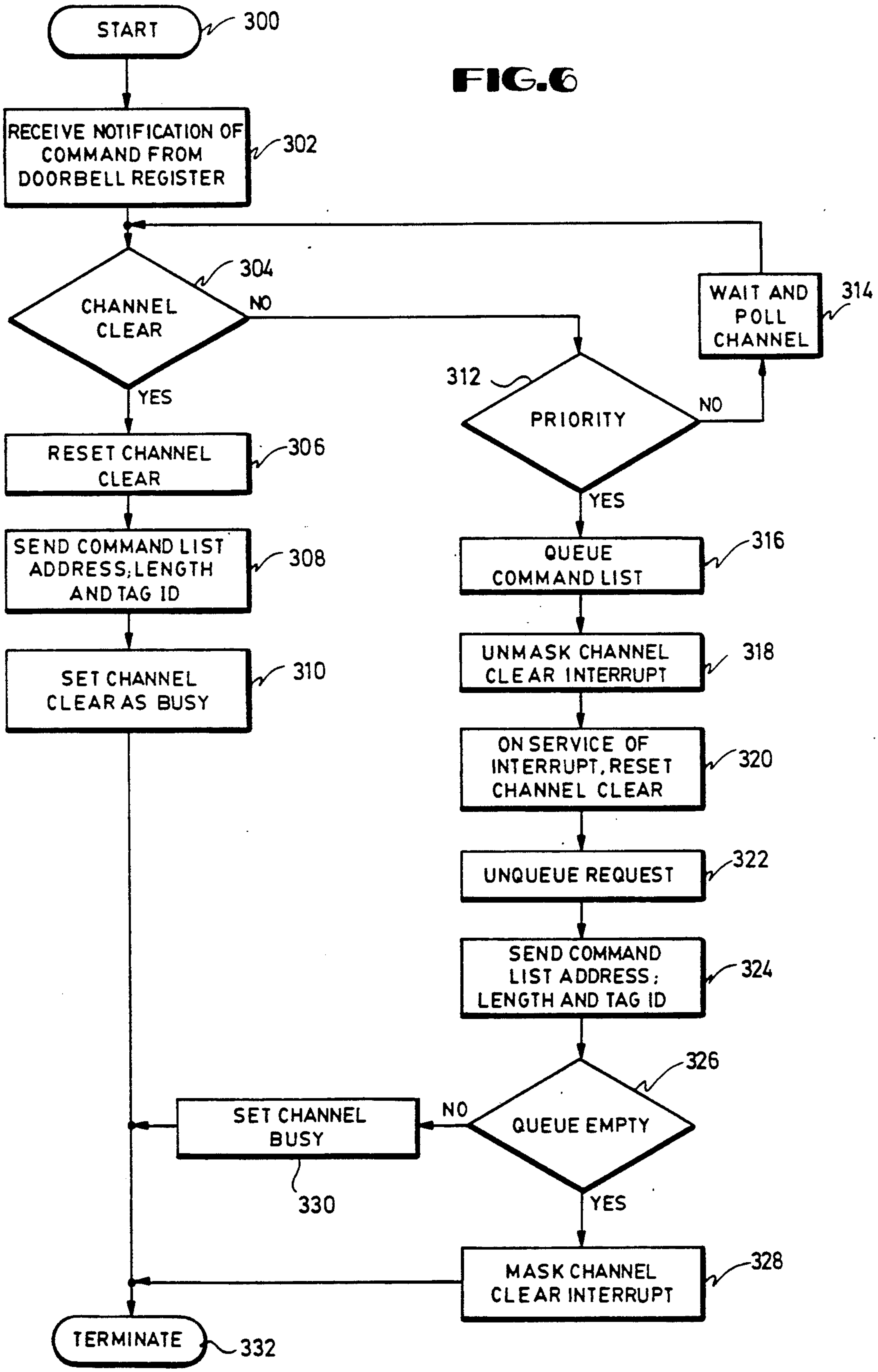
FIG. 6 is a flow diagram depicting the manner in which I/O requests are submitted to the disk array controller of the present invention.

When a new command list 200 is submitted to the disk array controller 112, the system processor 20 determines if the transfer channel is clear. If the channel is busy, the system processor 20 may poll, waiting for the channel to clear, or it may unmask the channel clear interrupt so that it will be notified when the disk array controller clears the channel. FIG. 6 is a flowchart of the method used to submit a new command list 200 to the disk array controller 112. Operation of submission begins at step 300. The local processor 122 receives notification of submission a command list 200 (FIG. 4) from the doorbell register in step 302 via BMIC 118. Control transfers to step 304 where the local processor 122 determines whether the channel 0 (command submission channel) is clear. If the channel is clear, control transfers to step 306 in which the BMIC 118 resets the channel clear bit. Control transfers to step 308 which loads the command list 200 address, length and tag I.D. to the mailbox registers to be read by the local processor 122. Control transfers to step 310 in which the local processor 122 sets the channel clear bit to busy. Control transfers to step 332 which terminates the submission of the command.

If in step 304 the local processor 122 determines that the command submit channel is not clear, the local processor 122 continues to poll for channel clear. If then channel is clear, control transfers to step 304. If the local processor 122 determines in step 312 that the command list 200 submission is a priority submission, control transfers to step 316 which places in a ring queue the 4 byte command list header which points back to the command list 200 to be transferred. Control transfers to step 318 in which the local processor 122 unmasks the channel clear interrupt bit. On service of the interrupt by the local processor 122, control transfers to step 320 which resets the channel clear. Control transfers to step 322 where the local processor 122 dequeues the command list header and transfers the command list 200 to the BMIC registers. Control transfers to step 324 which loads the command list address, length and tag I.D. into the channel registers. Control transfers to step 326 which determines whether the command list submission queue is empty. If the command list submission list queue is empty, control transfers to step 328 in which the local processor 122 masks the channel clear interrupt bit. Control transfers to step 332 which terminates the command list submission. If the local processor determines in step 326 that the queue is not empty, control transfers to step 330 which sets the channel busy bit. Control is then transferred to step 332 which terminates the submission of the command list.

B. Parity Recovery Examples

The use of a parity fault tolerance scheme in a disk array is depicted in a series of block diagrams depicting various steps in the process. It should be noted that the block diagrams are used solely to depict various methods of using parity fault tolerance. The reference to the TCC 124 in the block diagram is meant to refer both to the dedicated XOR parity engine incorporated in the TCC 124 and the disk DMA subchannel 3 used by the XOR parity engine in reading and writing parity data.

Figure 8:
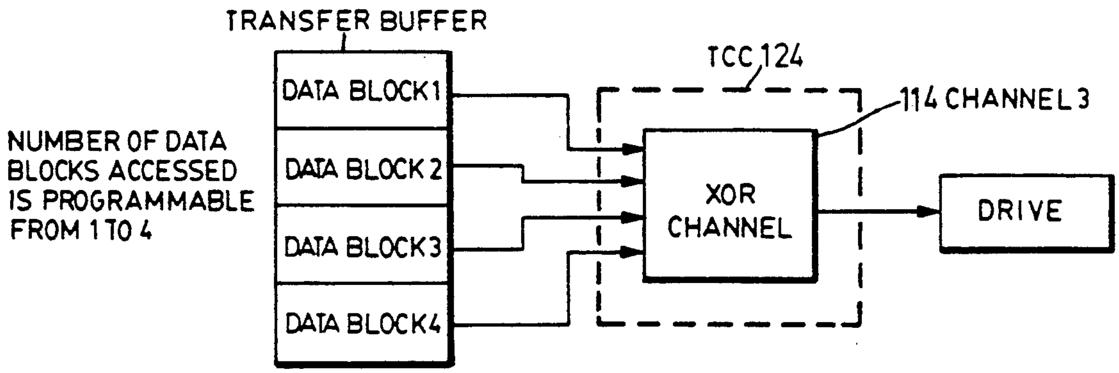
FIG. 8 is a schematic block diagram of one method of use of a parity XOR engine incorporated in the present invention.
Figure 9:
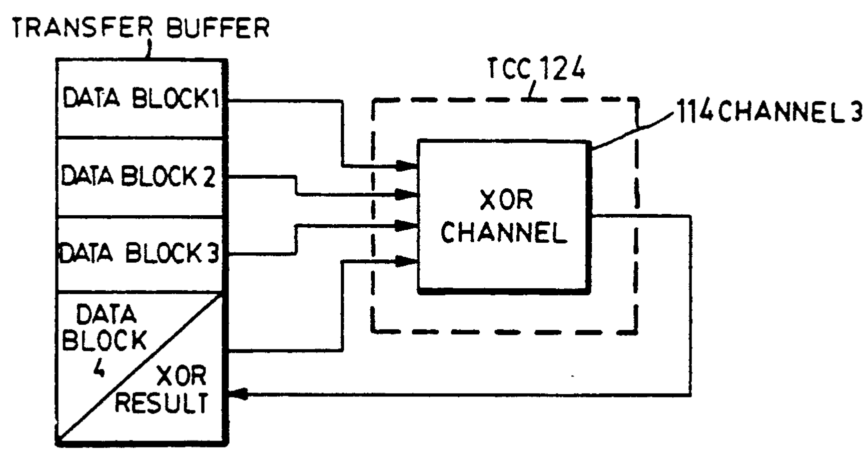
FIG. 9 is a schematic block diagram showing how parity information may be generated.

FIG. 8 is schematic block diagram of the manner in which the parity XOR engine incorporated into TCC 124 generates parity information to be written to the parity drive within an array. FIG. 8 depicts four different data blocks within a transfer buffer being read by the parity engine which is enabled on disk DMA channel 114 subchannel 3. The parity information is generated by the XOR engine by performing successive XOR operations on the data from the same relative location of each data block. The resulting parity information is written to the parity drive within the logical unit. Alternately, the parity information may be written back to the last transfer buffer as depicted in FIG. 9. In FIG. 9, data blocks 1–4 are read by the TCC 124 parity engine through disk DMA channel 114 subchannel 3. The parity information is generated by the XOR engine and is written back to the transfer buffer as a XOR result.

Figure 10A:
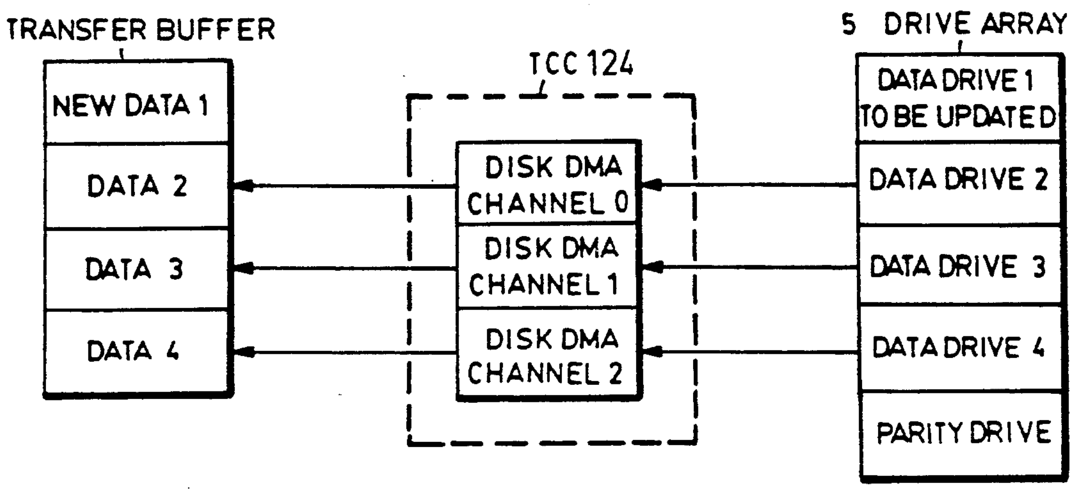
FIGS. 10A and 10B are schematic block diagrams showing the process by which a parity engine may be used to maintain a disk drive array having an excess of 4 drives in the array.
Figure 10B:
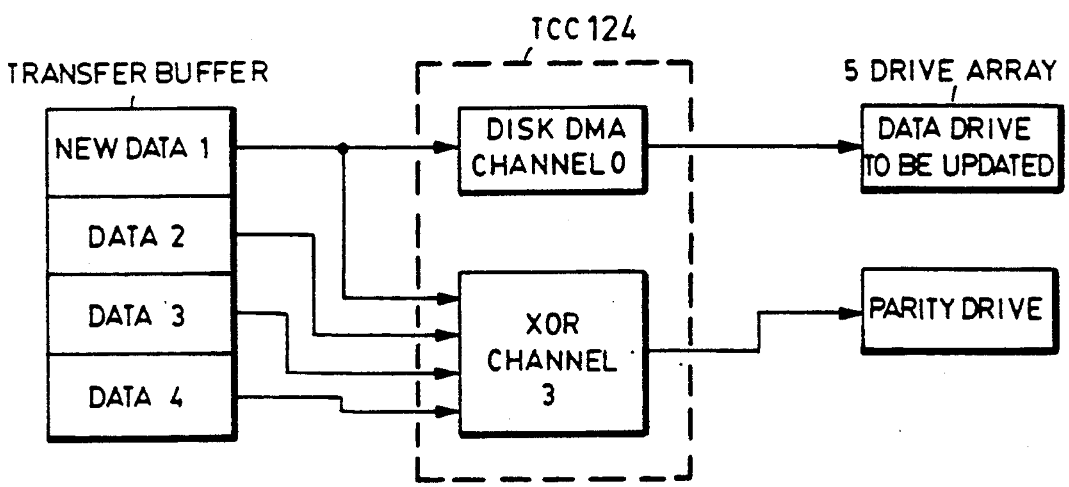

FIGS. 10A–10B are schematic block diagrams showing the process by which the parity engine may be used to maintain a disk drive array having four data drives and one parity drive within the array. The operation in FIG. 10 depicts the writing of new data contained within the transfer buffer to one drive in the five drive array. In step 1, (FIG. 10A), the local processor 122 programs TCC 124 to have disk DMA channels 0–2 read data from the three data drives not being updated and place this information in the transfer buffer. In step 2 the parity control register enables the XOR engine and (FIG. 10B) allocates subchannel 3 to create parity information and reads the data contained in the new data transfer buffer as well as the data which had been previously written from data drives 2–4. The new data is written through disk DMA channel 0 to disk number 1 which is to be updated. The same information as well as the data contained within data blocks 2–4 is read by the XOR channel and parity information generated. The parity information is then written to the parity drive within the five drive array.

Figure 11A:
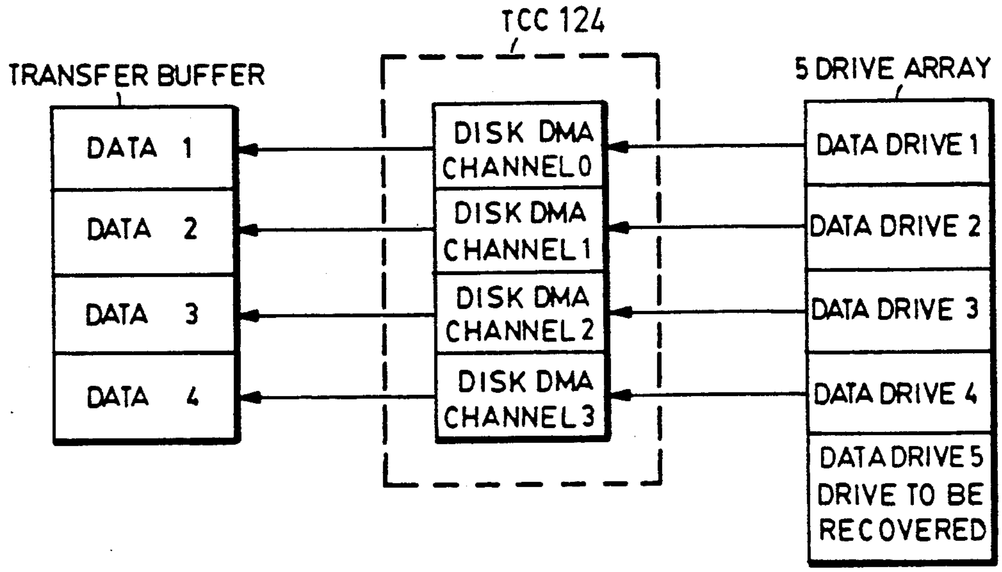
FIGS. 11A and 11B are schematic block diagrams depicting the manner in which the present invention may be used to recover a drive under parity fault tolerance mode.
Figure 11B:
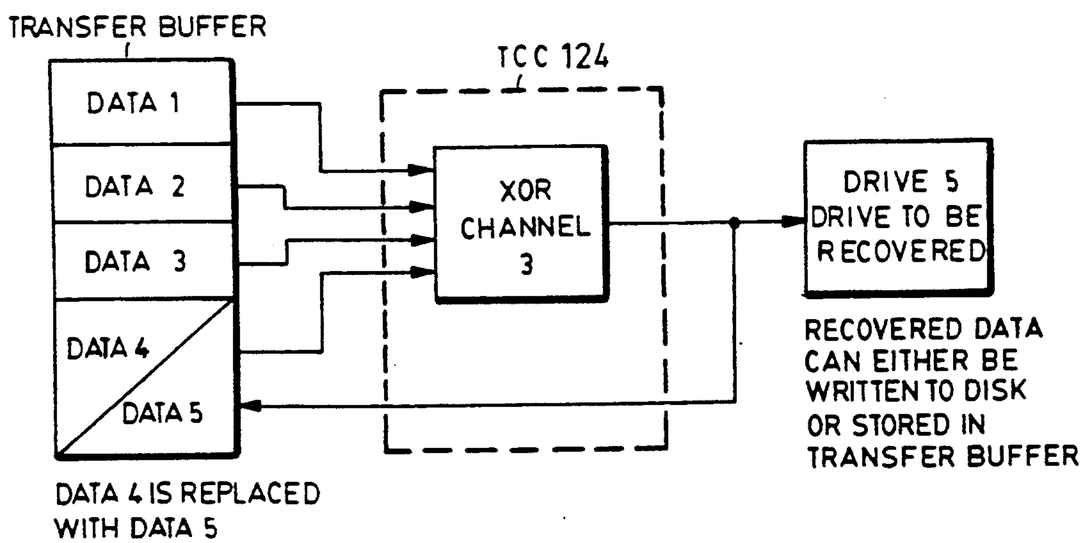
Figure 12A:
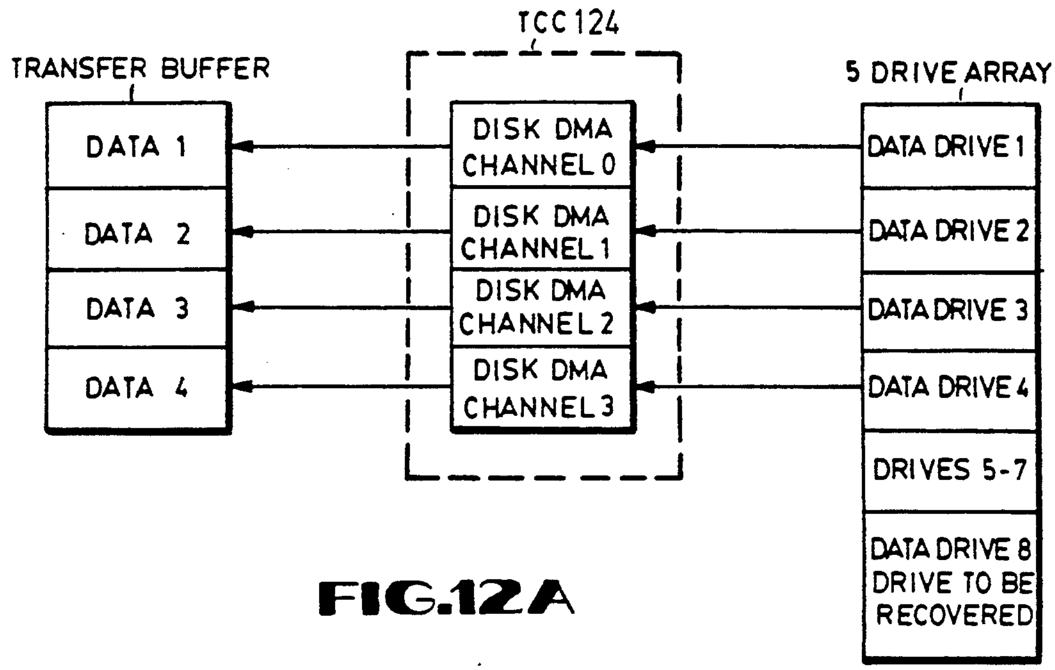
FIGS. 12A–12D are schematic block diagrams showing the method by which the XOR engine incorporated in the present invention may be used to recover data information in an 8 drive array.
Figure 12B:
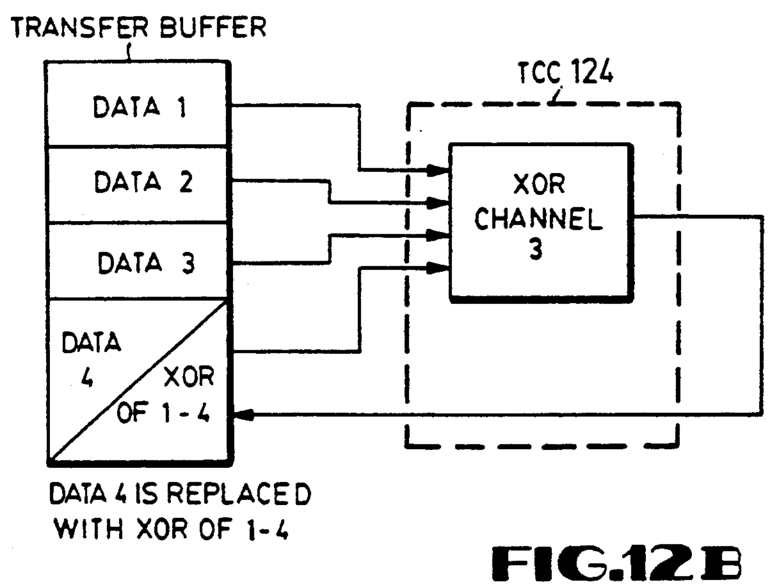
Figure 12C:
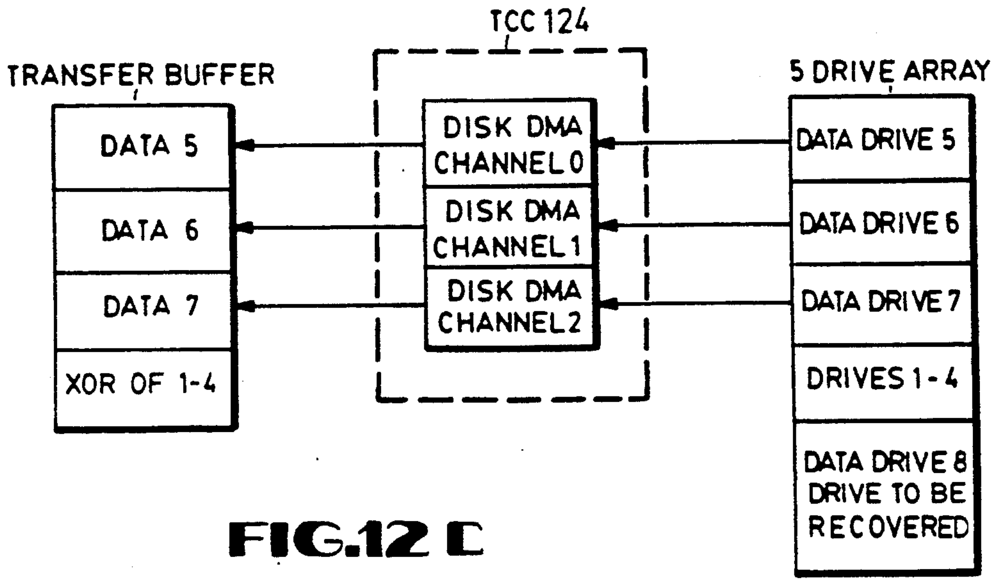
Figure 12D:
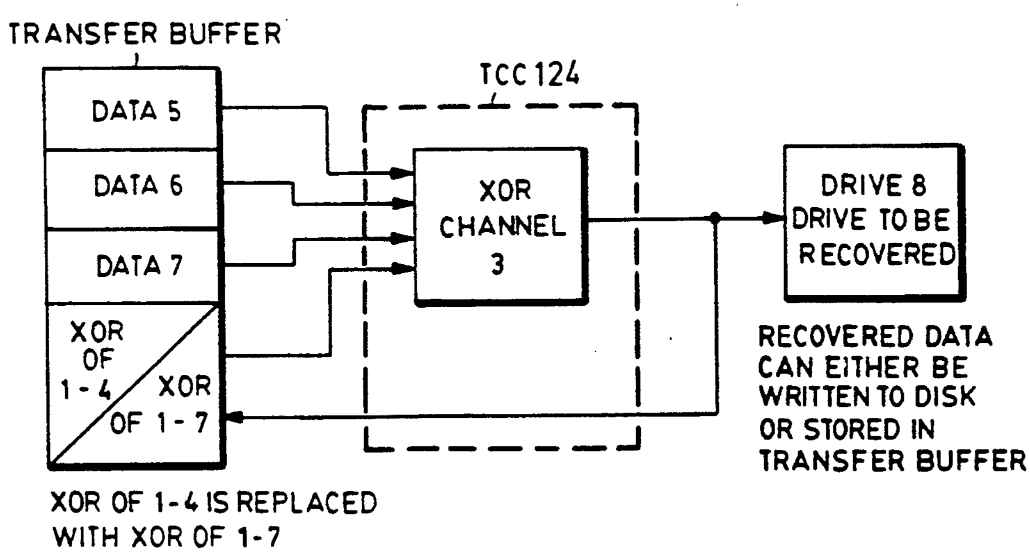

FIGS. 11A–11B are schematic block diagrams depicting the manner in which the present invention may be used to recover a drive in a parity fault tolerance mode. In step 1 (FIG. 11A), a five drive array is depicted with data drive 5 as the faulty drive array. In step 1, the local processor 122 upon receiving the recovery command instructs the TCC 124 to read data from drives 1–4 over disk DMA channels 0–3. It should be noted that in this instance, disk DMA subchannel 3 is not enabled to act as a parity channel but instead to operate as a disk DMA channel. The data from drives 1–4 is loaded into transfer buffer blocks. In step 2, (FIG. 11B), the vocal processor 122 instructs the TCC 124 to read the data from transfer buffer blocks 1–4 through disk DMA channel 3 which has now been enabled to act as the XOR parity channel, so that the XOR engine may generate parity information. The data generated by the parity XOR engine may be written to drive 5 or may be written back to the transfer buffer. This data is the recovered data if the drive 5 was not the parity drive. If the failed drive was the parity drive, the data is the regenerated parity information.

FIGS. 12A–12D are schematic block diagrams showing the method by which the XOR engine incorporated in the present invention may be used to recover data information in an 8 drive array. In step 1, (FIG. 12A), upon receiving a recover instruction, the local processor 122 instructs the TCC 124 to read data drives 1–4 over disk DMA channels 0–3 and the information is stored in transfer buffer blocks as data 1–4. In step 2 (FIG. 12B), the local processor 122 instructs the TCC 124 to read transfer buffer data blocks 1–4 over XOR channel 3 which is now been enabled to generate parity information. The parity information is written back to data block 4 as the results of the XOR of data contained within transfer buffer blocks 1–4. In step 3, (FIG. 12C), the local processor 122 instructs the TCC 124 to read the data from drives 5–7 over disk DMA channels 0–2 and places the information in transfer blocks as data 5, 6 and 7. In step 4 (FIG. 12D), the local processor 122 instructs the TCC 124 to read the transfer buffer blocks containing data 5–7 and the XOR of 1–4 over XOR parity channel 3 which has now been enabled to output parity information. The former XOR'd data may be written to drive 8 as a recovered drive data or may be written back to the transfer buffer as the results of the XOR of drives 1–7.

2. Data RIS Sectors

The method of the present invention calls for the use of information written to reserved sectors on each disk within the disk array. The reserved information sectors ("RIS") include information which relate to the individual drives, the drive array in its entirety and individual drive status. These RIS parameters include individual drive parameters such as: the number of heads for a particular drive; the number of bytes per track for a drive; the number of bytes per sector for a drive; and the number of sectors per track for a drive and the number of cylinders. On a more global level, RIS information will include the particular drive I.D.; the configuration signature; the RIS revision level; the drive configuration; the physical number of drives which make up the logical unit; the number of drives which make up the logical drive; and the drive state for a particular drive. The configuration signature is an information field generated by the EISA configuration utility which identifies the particular configuration. The RIS data also includes information which applies to the logical drive in its entirety as opposed to individual drives. This type of information includes the particular volume state; a compatibility port address; the type of operating system being used; the disk interleave scheme being used; the fault tolerance mode being utilized; and the number of drives which are actually available to the user, as well as logical physical parameters, including cylinder, heads, etc. The disk array controller 42 incorporating the present invention maintains GLOBAL RIS information, which applies to all disks within the logical unit as a data structure in local RAM memory 128. The RIS data is utilized for purposes of configuring the disk array as well as management of fault tolerance information.

3. Logical Unit Configuration

Figure 4A:
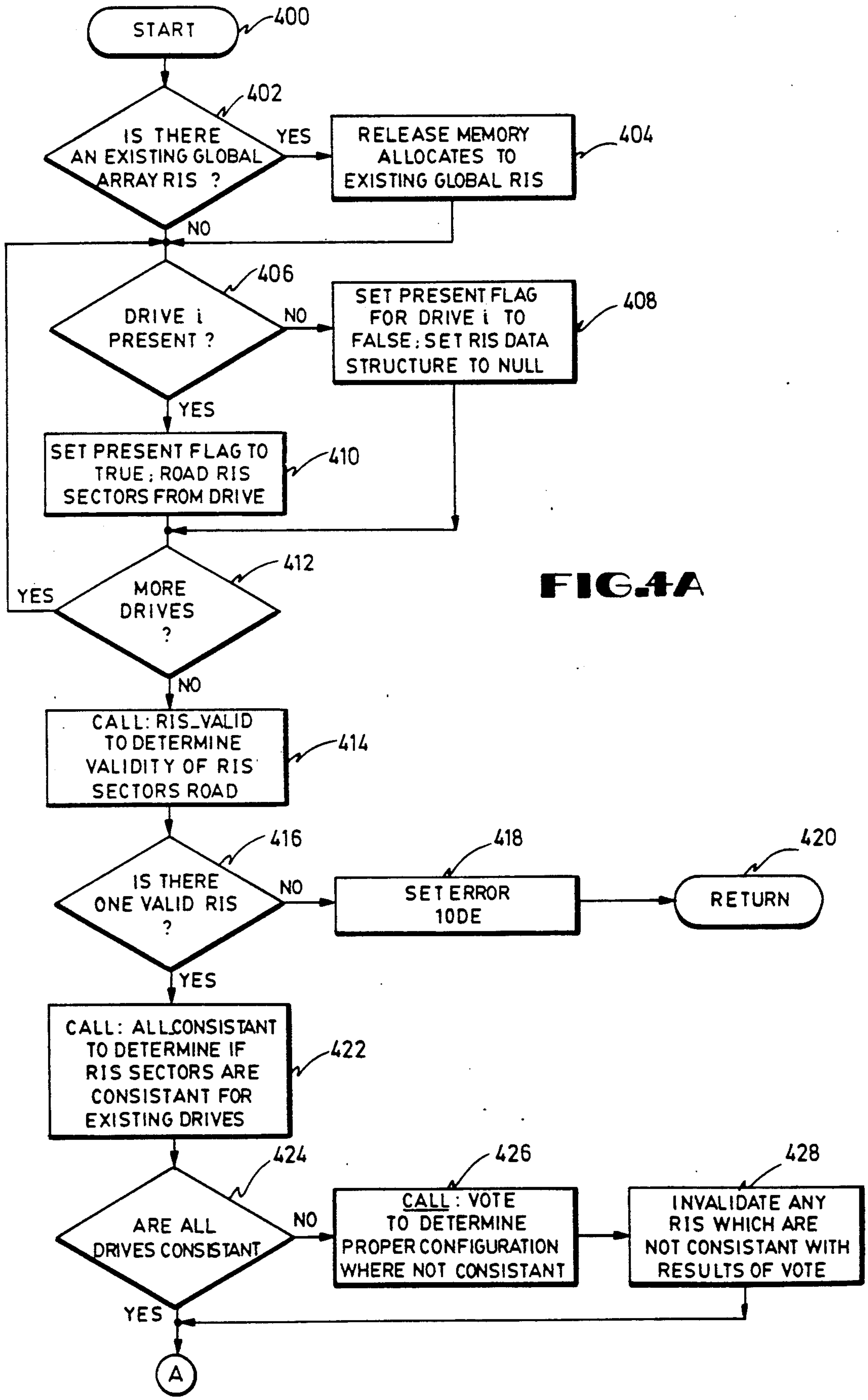
FIGS. 4A and 4B are flow diagrams depicting the loading of a disk array configuration within the present invention.
Figure 4B:
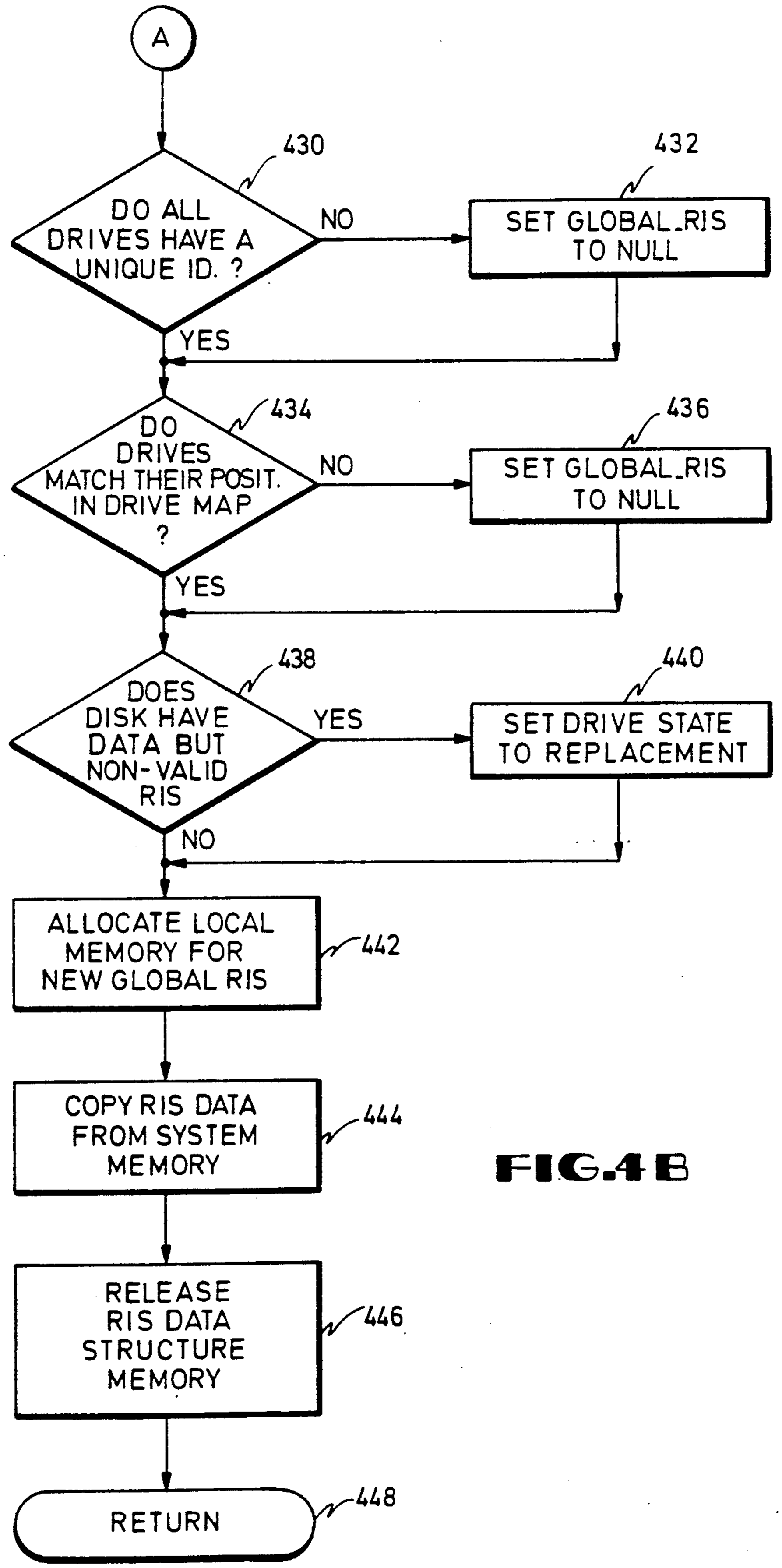

FIGS. 4A and 4B are flow diagrams of the method utilized by the present invention to load a configuration for a particular disk array. A disk array configuration signature is created by the EISA configuration utility (see Appendix 1) and stored in system CMOS memory. Upon power up of the computer system, the system processor 20 sets a pointer to the disk configuration signature in host system CMOS memory and sends the configuration signature to the local processor 122 via the BMIC 118. The local processor 122 then builds a configuration based on information within the logical drive RIS sectors and verifies the validity of the disk configuration via the configuration signature. If one or more of the drives are replacements, the disk controller 112 will mark the disk as not configured and proceed to configure the remainder of the drive in the logical unit. If all of the drives are consistent, the GLOBAL RIS will be created. If all the drives are not consistent, the present invention will VOTE as to which of the RIS data structures is to be used as a template. The EISA CMOS issues a command to start recovery upon being notified of a replacement disk, which will initiate the RECONSTRUCT module to rebuild the disk. Once the disk has been rebuilt, it will be activated.

If the local processor 122 is unable to build a configuration due to a conflicting configuration signature, the local processor 122 will set an error flag which will notify the system processor 20 to run the EISA configuration utility.

Operation begins at step 400. In step 402 the local processor 122 determines whether there is an existing global RIS. In step 406 the local processor 122 determines whether the first physical drive in the array is present. In determining whether a disk drive is present, the local processor 122 will attempt to write to specific sectors on the drive and read them back. If the drive is not present the attempted read will result in an error condition indicating that the physical drive is not present. If the first drive is not physically present, control transfers to step 406 wherein the local processor 122 since the present flag within the data structure allocated for the drive to false and sets the RIS data structure to null. Control transfers to step 408. If in step 406 it is determined that drive I is present, control transfers to step 410 wherein the local processor 122 sets the present flag within the data structure allocated to the disk equal to true and reads the RIS sectors from the drive and loads them into the local data structure. Control transfers to step 412. In step 412 the local processor 122 determines if there are additional drives within the array. If yes, the local processor 122 advances to the next drive within the drive map and control returns to step 406. If no, the local processor determines whether the RIS sectors for the drives present in the array are valid. This is accomplished by the local processor 122 reading disk parameters from the RIS sectors and determining whether the RIS parameters are valid for the drives installed within the array. Control transfers to step 416 wherein the local processor 122 determines if there is at least one valid RIS structure among the disk within the array. If no, control transfers to step 418 wherein the local processor 122 sets an error code and control returns to the calling program in step 420. If it is determined in step 416 that there exist at least one valid RIS structure within the disk in the array, control transfers to step 422 wherein the local processor 122 calls function ALL_CONSISTENT to determine if the RIS sectors for the drives within the array are consistent among themselves. Control transfers to step 424. In step 424 the local processor 122 determines whether all drives have consistent RIS data. If not, control transfers to step 426 wherein the local processor 122 calls function VOTE to determine the proper configuration to be utilized as a template. Control transfers to step 428 wherein the local processor 122 invalidates any RIS data structures which are not consistent with the results of VOTE. Control transfers to step 430.

If in step 424 it is determined that all drives are consistent, control transfers to step 430. In step 430, the local processor 122 determines whether all drives have a unique drive I.D. If the drives do not have unique drive I.D.'s, control transfers to step 432 wherein the local processor 122 sets the GLOBAL RIS data structure to null value and control transfers to step 434. In step 430, the local processor 122 determines that all drives have a unique I.D., control transfers to step 434. In step 434, the local processor 122 determines whether the drive being addressed matches its position in the drive map as determined by the GLOBAL RIS. This would indicate whether a particular drive within the array has been moved with respect to its physical location within the array. If the drives do not match their position within the drive map, control transfers to step 436 wherein the local processor 122 sets the GLOBAL RIS data structure to NULL. Control transfers to step 438. If it is determined in step 434 that the drives match their position within the drive map, control transfers to step 438 wherein the local processor 122 determines whether a disk has RIS data but a non-valid RIS. If the particular disk has RIS data but non-valid RIS data, control transfers to step 440 wherein the local processor 122 sets the drive status flag to indicate that the drive is a replacement drive. Control transfers to step 442. If it is determined in step 438 that the disk does not have RIS data and non-valid RIS structure, control transfers to step 442. Steps 430–440 are used to test each drive within the drive array. In step 442 the local processor 122 allocates local memory for a new GLOBAL RIS data structure. Control transfers to step 444 wherein the local processor 122 copies RIS data structure from either the consistent configuration or the template as determined by VOTE. Control transfers to step 446 wherein the local processor 122 releases local RIS data structure memory, and writes the new GLOBAL RIS to all drives within the array. Control transfers to step 448 which terminates operation of the current function.

4. All Consistent Module

Figure 7:
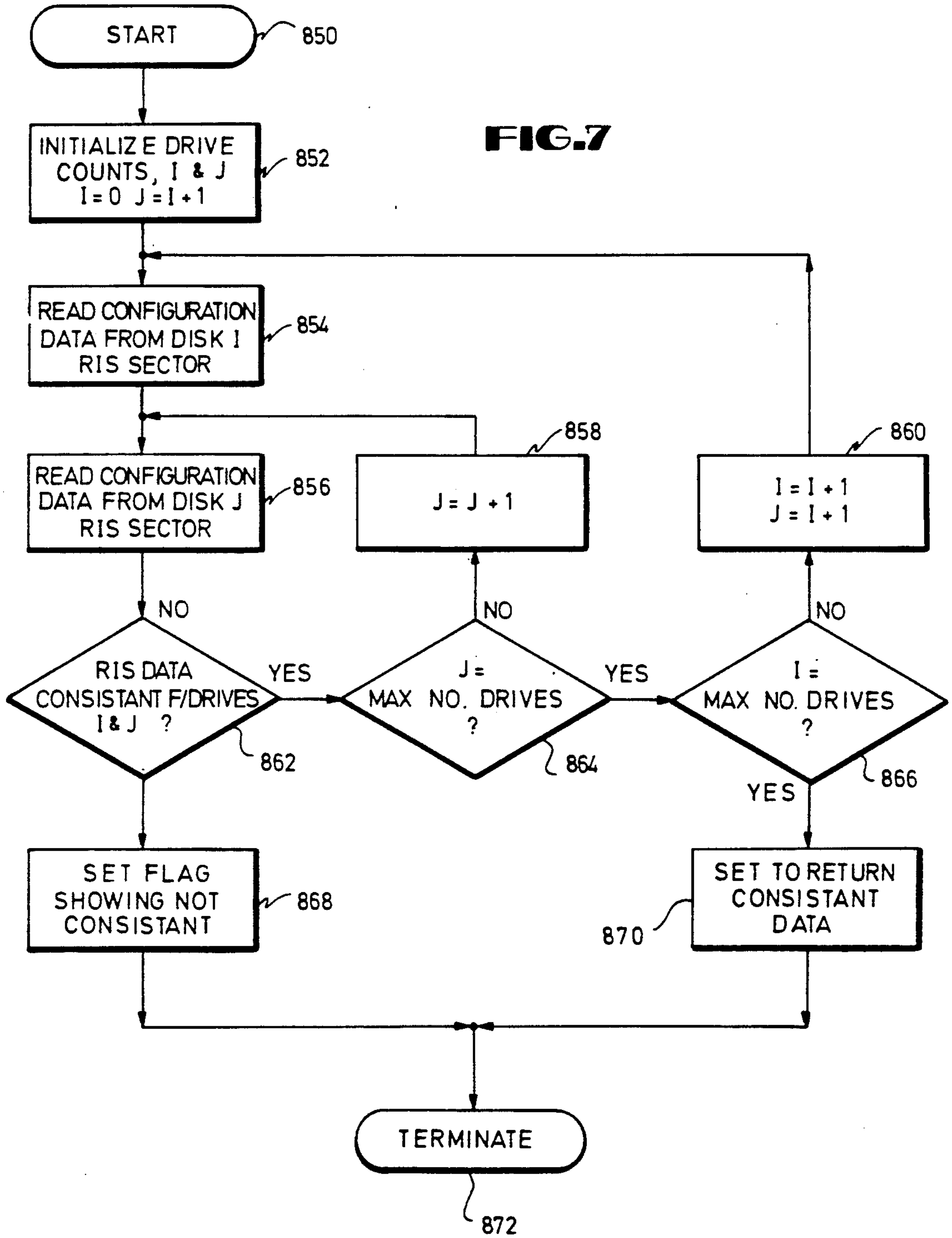
FIG. 7 is a flow diagram depicting the manner in which the present invention determines whether all drives within an array contain consistent drive parameter information.

FIG. 7 is a flow diagram of the manner in which the present invention determines whether all RIS sectors for disks within the array are consistent. In determining whether all drives are consistent, the local processor 122 will read the RIS sectors for the first drive in the drive map and compare the information therein with the corresponding RIS sectors for the second, third, etc. drives until it has compared the first disk with all other disks in the array. The local processor 122 will advance to the second drive and compare its RIS sectors with all subsequent drives in the array. This will continue until it is determined that all drives are consistent or the module determines an inconsistency exists. Operation begins at step 850. Control transfers to step 852 wherein the local processor 122 initializes drive count variables. Control transfers to step 854 wherein the local processor 122 reads the configuration data from a disk RIS sector (Drive I). Control transfers to step 856 wherein the local processor 122 reads the configuration data from the RIS sector of the next disk in the drive map (Drive J). Control transfers to step 862 wherein the local processor 122 determines whether the RIS data for the two drives I and J are consistent. If not consistent, control transfers to step 868, wherein the local processor 122 sets a flag indicating that the drives are not consistent. Control thereafter transfers to step 872 which returns to the calling program. If the RIS data is consistent for drives I and J, control transfers to step 864 wherein the local processor 122 determines whether J is equal to the maximum number of drives the array. If not equal to the maximum number of drives in the array, control transfers to step 858 which increments the J counter and control thereafter transfers to step 856. In this manner the program will read the first disk and compare RIS data from the first disk with the RIS data from all other drives. If J is equal to the maximum number of drives, control transfers to step 866 wherein the local processor 122 determines whether I is equal to the maximum number of drives in the disk array. If I is not equal to the maximum number of drives in the disk array, control transfers to step 860 wherein I is set equal to I+1 and J is equal to I+1. Control transfers to step 854. If I is equal to the maximum number of drives, control transfers to step 870, wherein the local processor 122 sets a flag indicating that all RIS disk sectors are consistent. Control transfers to step 872 which returns to the calling program.

5. VOTE

Figure 19:
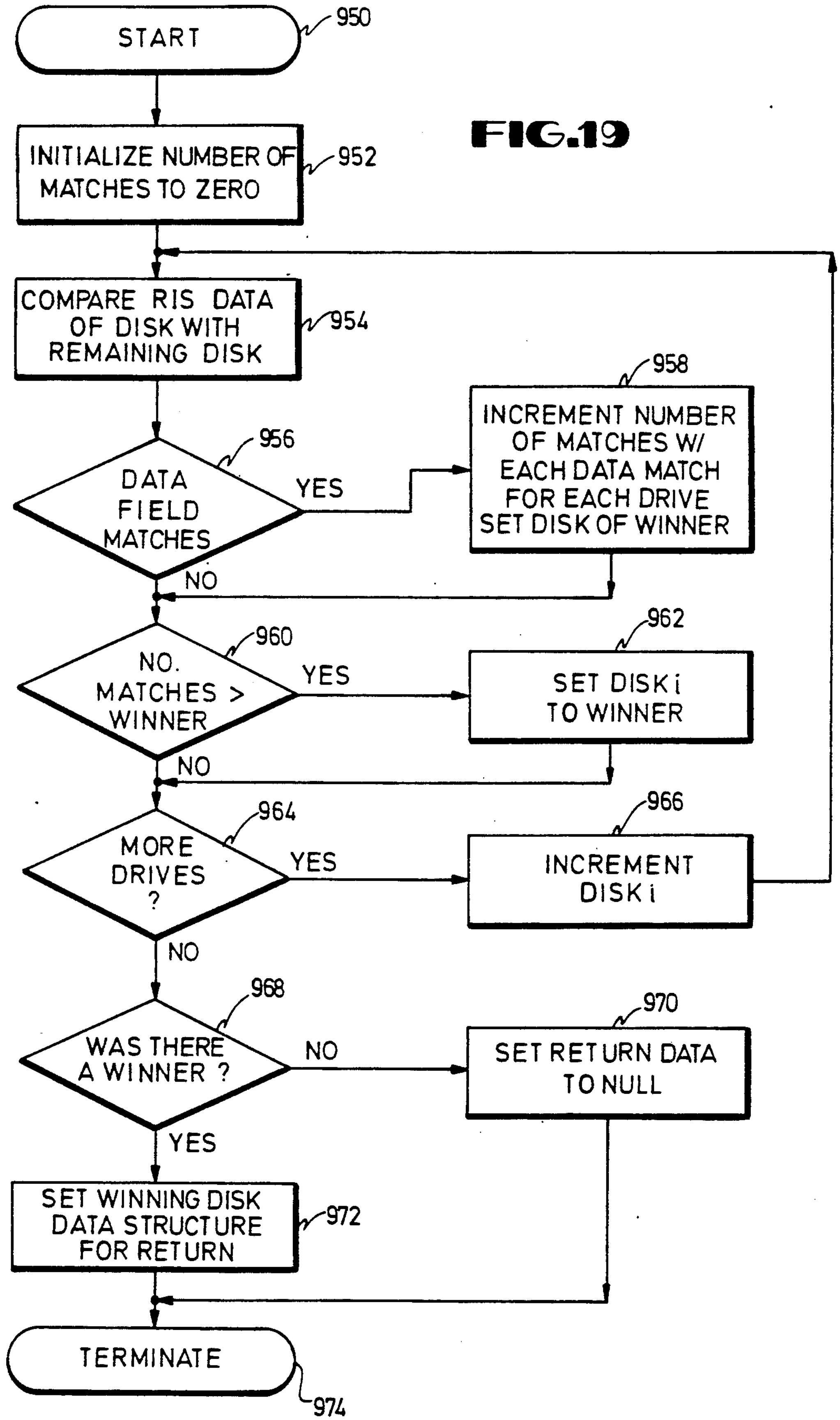

FIG. 19 is a flow diagram of the VOTE function by which the present invention determines which of any number of valid RIS configurations which may exist on a disk is to be used as a template for configuring the entire disk array. Operation begins at step 950. Control transfers to step 952 which initializes the winner to NULL and the number of matches to 0. Control transfers to step 954 wherein the local processor 122 compares the RIS data for the current disk (Disk I) with all remaining disks. Control transfers to step 956 wherein the local processor 122 determines whether the data field within the RIS structure for disk I matches the corresponding data fields in the remaining disk RIS structures. If a match exists, control transfers to step 958, wherein the local process 122 increments the number of matches with which each data match for each drive within the disk array. Upon finding the first match, the first drive is declared a temporary winner. Control transfers to step 960.

If there are no further data field matches in step 956, control transfers to step 960 wherein the local processor 122 determines whether the number of matches for the current disk being examined exceeds the number of matches determined for the disk currently designated as a winner. If yes, control transfers to step 962 which sets the current disk equal to the winner. Control transfers to step 964. In step 964 the local processor 122 determines whether there are additional drives to be examined in voting. If yes, control transfers to step 966 which increments the current disk to the next disk within the array. Control transfers to step 954.

The local processor will continue to loop between step 954 and 964 until all drives have been examined field by field and the drive with the most data matches is designated as a winner or in the case of no matches in the RIS sector of the disk there is no winner. If in step 964 it is determined there are no further drives in the array, control transfers to step 968 wherein the local processor 122 determines whether there has been a winner. If there is no winner, control transfers to step 970 which sets a return data to null. Control then transfers to step 974 which returns to the calling program. If in step 968 the local processor 122 determines that there is a winner, control transfers to step 972 wherein the winning disk data structure is flagged as the data structure template. Control transfers to step 974 which returns to the calling program.

The next set of modules are directed toward the detection of a replacement disk within an array and the regeneration of data. The present invention will initiate the rebuild request only if (1) the mirror or parity fault tolerance mode is active and (2) a read command has failed. If neither of the fault tolerance modes are active, the drive may be regenerated by restoring from a backup medium. A mirroring or parity fault will be detected when a physical request to read a specific block of data from any one of the drives within the disk array system returns a read failure code. The regeneration process presumes that both of the above conditions are true. As indicated in the command protocol section, the system processor 20 must issue a start recovery command to begin the rebuild process.

The following flow diagrams depict the method of rebuilding a disk which has been inserted as a replacement disk in a disk array system. The discussion presumes that a start recovery command has been received and acted upon by the local processor 122. The disk array controller 112 has the capacity to run a disk array check program. In module RECONSTRUCT, the local processor 122 will detect the presence of a replacement drive by reading the drive status from RIS sectors on each drive within the array and determine the fault tolerance mode in use in the array. If a replacement drive has been installed in the array, an attempt to read the RIS sectors on the drive will result in a read faulty, as the replacement drive will not have the RIS sectors. The local processor 122 will then call module BUILD_DRIVE.

The local processor 122 in the BUILD_DRIVE module creates a series of read requests for every sector on the replacement drive, based upon the information contained within the GLOBAL RIS structure. The read requests are executed, each returning a null read, indicating a failed read. The local processor 122 while running BUILD_DRIVE calls the REGENERATE module which determines the tolerance mode and instructs the local processor 122 to build a recovery command for each failed read request. The method of building the recovery command is set forth in modules MIRROR_REGEN and PARITY_REGEN are generally known in the art. The BUILD_DRIVE module then returns control of the local processor 122 to the RECONSTRUCT module. The RECONSTRUCT module then converts each failed read request to a write/rebuild request and links them to a recovery request header. The recovery request header and write/rebuild requests are then scheduled for execution by the disk array controller.

In this manner, the disk array controller is solely responsible for managing the rebuilding of the replacement disk. The system processor 20 is not involved in the determination that the drive is a replacement or the generation and execution of the rebuild commands. Accordingly, the rebuild of the replacement disk is virtually transparent to the computer system.

6. Reconstruct

Figure 17:
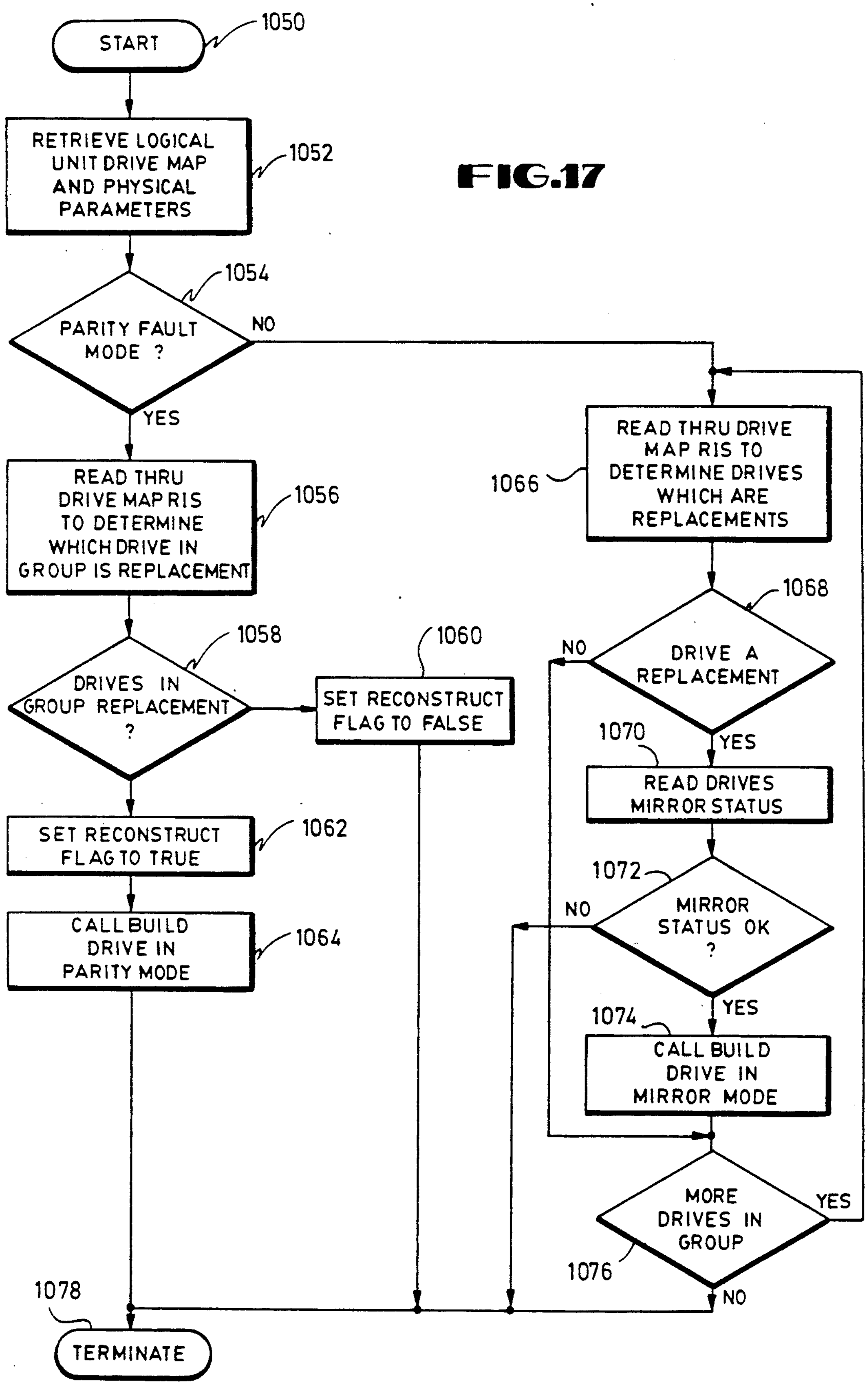
FIG. 17 is a flow diagram of the RECONSTRUCT function used to control the process of reconstructing data according to the present invention.

FIG. 17 is a flow diagram of the RECONSTRUCT function which is utilized to control the process of reconstructing data into a newly replaced drive in the array when a fault tolerance mode is active. Operation begins at step 1050. Control transfers to step 1052 wherein the local processor 122 retrieves logical unit drive map and physical parameters. Control transfers to step 1054 wherein the local processor 122 determines whether the drive group is in a PARITY_FAULT mode. If in a PARITY_FAULT mode, control transfers to step 1056 wherein the local processor 122 reads through all drive group RIS sectors to determine which of the drives within the group is a replacement drive. Control transfers to step 1058. An attempted read of a replacement drive will result in a null read, as the RIS structure will not exist on the replacement disk, as a null read indicates the existence of a replacement drive. If the local processor 122 fails to determine that any one of the drives within the drive group is a replacement, control transfers to step 1060, wherein the local processor 122 sets a reconstruction flag to FALSE. Control then transfers to step 1078 which returns to the calling program. If it is determined in step 1058 that there is one drive which is a replacement by way of the null read, control transfers to step 1062 where the local processor 122 sets a reconstruct flag equal to TRUE. Control transfers to step 1064 wherein the local processor 122 calls the BUILD_DRIVE function. Control transfers to step 1078 which returns to the calling program. If it is determined that in step 1054 that the PARITY_FAULT mode is not active, control transfers to step 1066 where the local processor 122 reads the RIS sectors for disks within the group to determine which of the drives are replacements by way of a null read. Control transfers to step 1068 wherein the local processor 122 determines whether a particular drive is a replacement. If yes, control transfers to step 1070 wherein the local processor 122 reads the drive's mirror drive status. Control transfers to step 1072 wherein the local processor 122 determines whether the current drive's mirror drive status is valid. If yes, control transfers to step 1074 in which the local processor 122 calls function BUILD_DRIVE. Control transfers to step 1076 wherein the local processor 122 determines whether there are additional drives within the particular drive group. Control then transfers to step 1066. If it is determined in step 1068 that the current drive is not a replacement, control transfers to step 1076. If it is determined in step 1072 that the current faulty drive's mirror drive status is not valid, control transfers to step 1078 which returns to the calling program. If it is determined in step 1076 that there are no additional drives in the group, control transfers to step 1078 which returns to the calling program.

7. Build Drive

Figure 18:
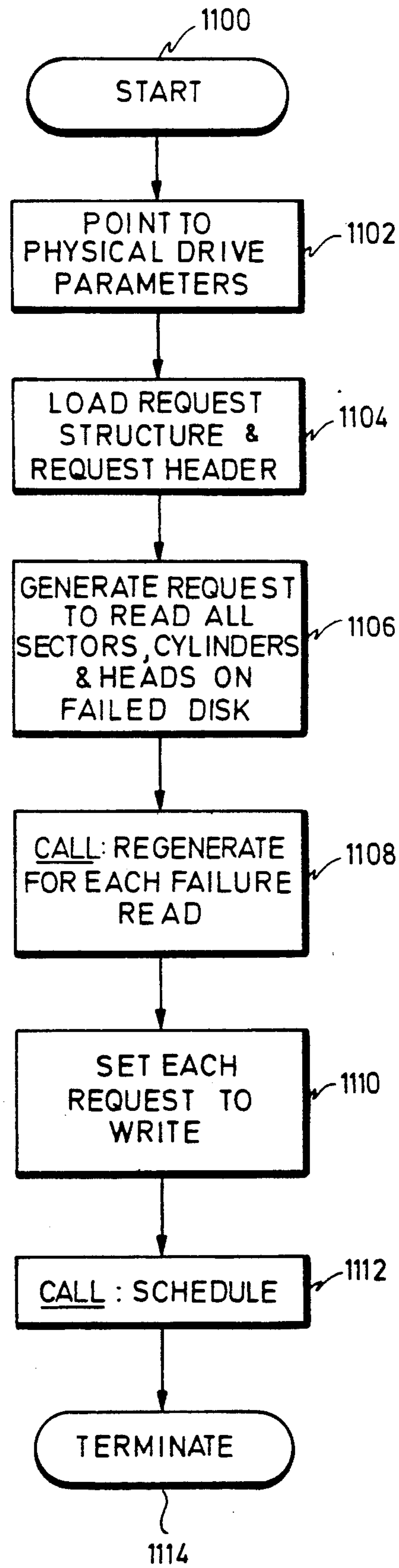
FIG. 18 is a flow diagram of the method utilized in the BUILD_DRIVE function called by the reconstruct function.

FIG. 18 is a flow diagram of the method utilized in the BUILD_DRIVE function. Operation begins at step 1100. Control transfers to step 1102 wherein the local processor 122 sets pointers to the physical drive parameters for the failed request. Control transfers to step 1104 wherein the local processor 122 allocates memory for and loads the request structure and request header. Control transfers to step 1106 wherein the local processor 122 builds commands to read all sectors, cylinders and heads on the replacement disk. Each one of the attempted reads will create a failure as the drive is a replacement and will not contain the information sought by the request. Control transfers to step 1108, wherein the local processor 122 calls the REGENERATE function for each failed read. Control transfers to step 1110 wherein the local processor 122 sets each of the failed read requests to a write command. Control transfers to step 1112 wherein the local processor 122 schedules the write commands to be operated upon by the disk array controller. Control transfers to step 1114 which terminates operation of the program.

8. Regenerate

Figure 14:
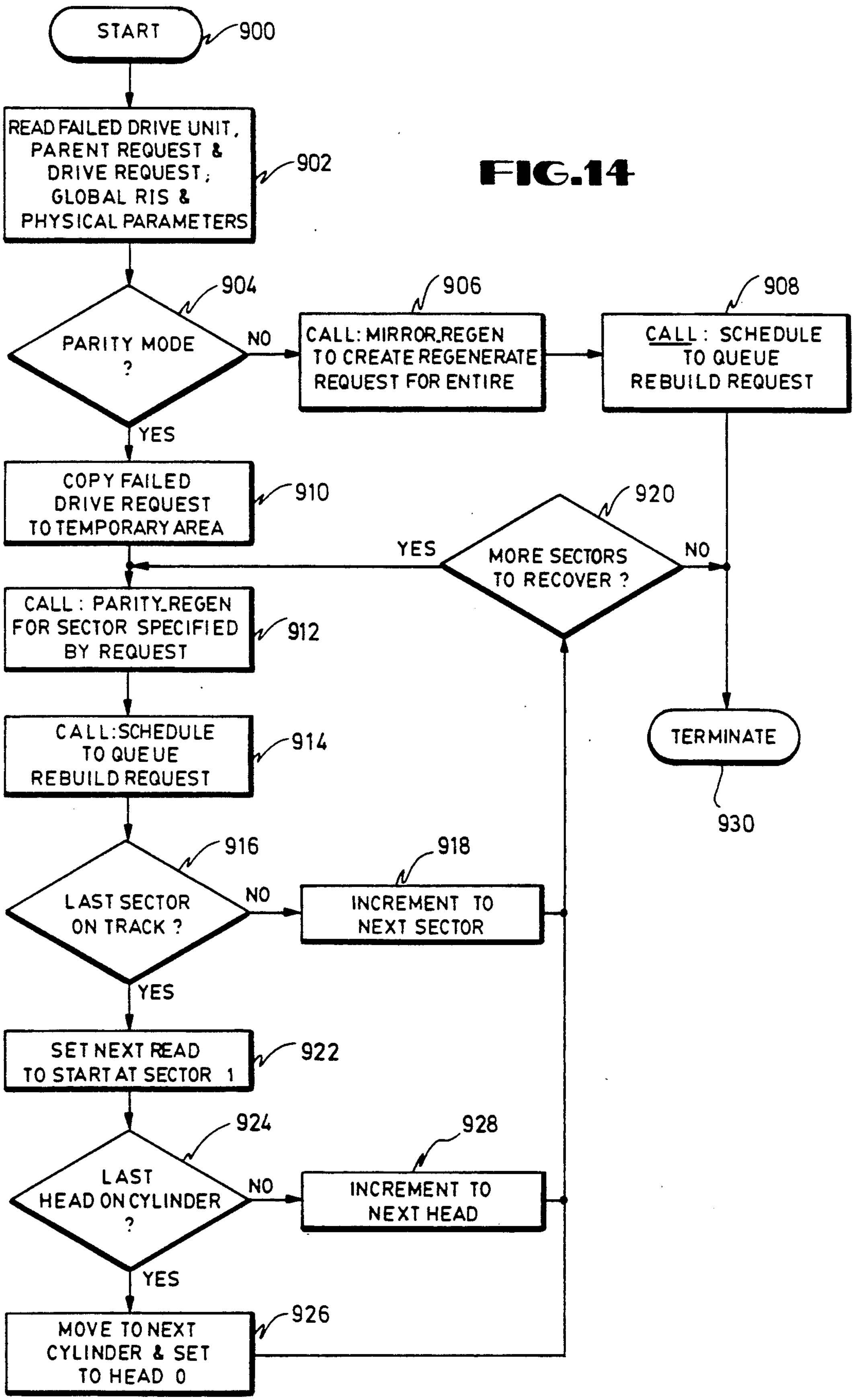
FIG. 14 is a flow diagram of the REGENERATE function used to correct either a disk drive fault or to rebuild a replacement drive according to the present invention.

FIG. 14 is a flow diagram of the REGENERATE function used to regenerate the data from a failed drive using data from other drives in the logical unit when either mirror or parity mode is active. Operation of this function begins at step 900. As REGENERATE is called by BUILD_DRIVE and, ultimately, RECONSTRUCT, it will only operate if there is a mirror or parity fault tolerance mode active. Further, the failed request must have been a read request. This information will be transferred with a drive request which has failed. Control transfers to step 902 wherein the local processor 122 reads the failed drive unit RIS sectors, drive request and parent request. Further, the local processor 122 obtains physical parameters of the disk from the GLOBAL RIS information from an image maintained in local memory 128. Control transfers to step 904 wherein the local processor 122 determines whether the drive group is in a PARITY_FAULT mode. If yes, control transfers to step 910 wherein the local processor 122 copies the failed drive request to a temporary area. Control transfers to step 912 wherein the local processor 122 calls function PARITY_REGEN for the first disk sector specified in the request. Control transfers to step 914 wherein the local processor 122 places the rebuild request in a low level queue designed to ignore prohibitions on I/O operations to replacement drives which has returned from the PARITY_REGEN function. Control transfers to step 916 wherein the local processor 122 determines whether the sector associated with the particular request is the last sector on the track of the disk. If not the last sector on the track, control transfers to step 918 wherein the local processor 122 increments to the next sector on the track. Control transfers to step 920 wherein the local processor 122 determines whether there are additional sectors associated with the failed request to be recovered. If not, control transfers to step 930 which terminates operation of the REGENERATE function. If yes, control transfers to step 912.

If in step 916 it is determined that the sector associated with the particular request is the last sector on the disk track, control transfers to step 922 wherein the local processor 122 sets the next read to start at sector 1. Control transfers to step 924 wherein the local processor 122 determines whether the current head is the last head on the cylinder. If the current head is the last head on the cylinder, control transfers to step 926 wherein the local processor 122 sets the pointers to the next cylinder and sets the selected head to 0 (the first head for that cylinder). Control transfers to step 920. If it is determined in step 924 that the current head is not the last head on the cylinder, control transfers to step 928, wherein the local processor 122 increments the current head value to the next head on the cylinder. Control transfers to step 920.

If in step 904 it is determined that the PARITY_FAULT mode is not active, control transfers to step 906 wherein the local processor 122 calls the function MIRROR_REGEN to create a regenerate request for the entire failed request as opposed to a sector by sector request as carried out in the PARITY_FAULT mode. Control transfers to step 908 wherein the local processor 122 places the requests in a low level queue designed to ignore drive state prohibitions against I/O operations to replacement disks. Control transfers to step 930 which terminates the operation of the regenerate function.

9. Parity Regenerate

Figure 15:
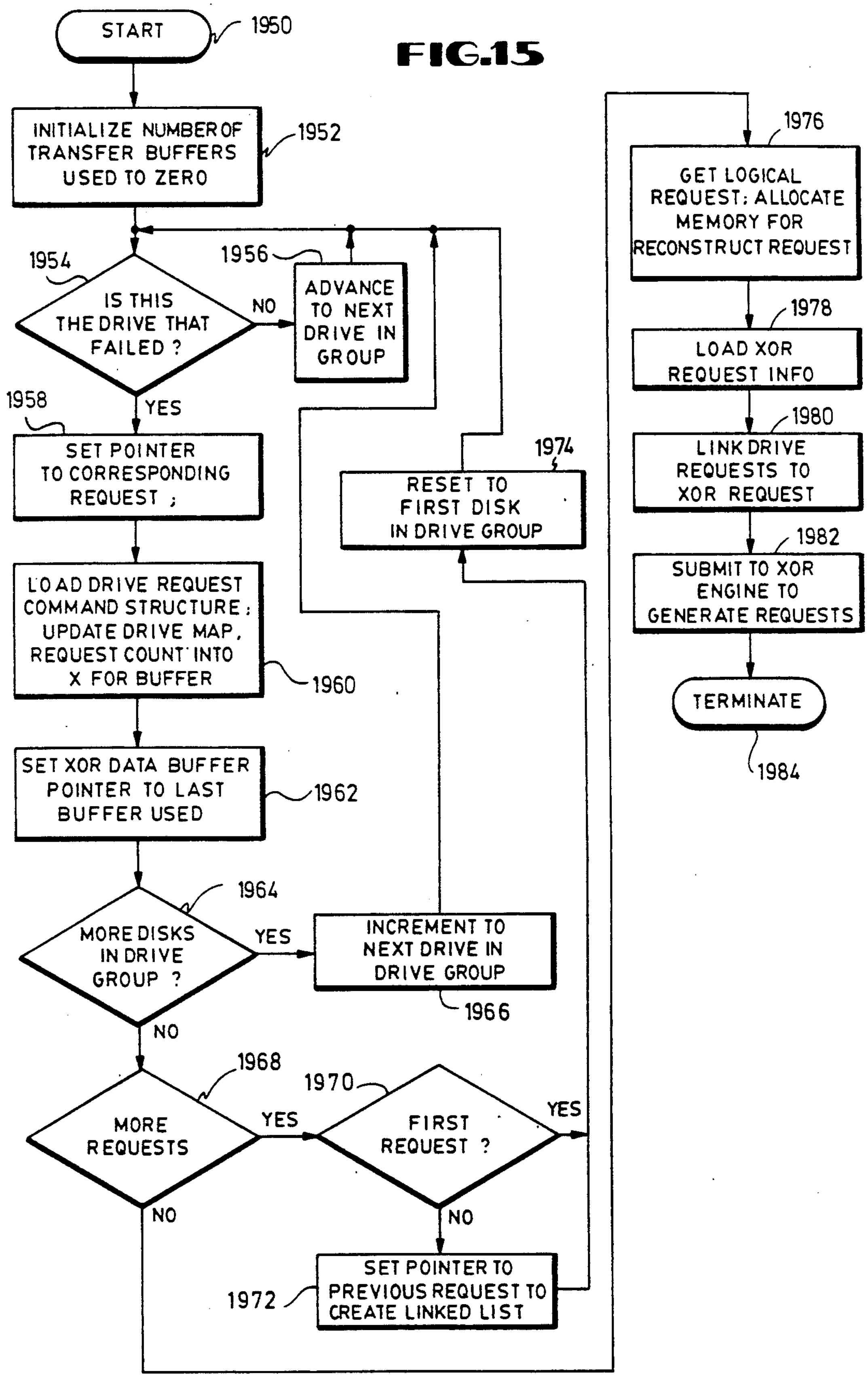
FIG. 15 is a flow diagram of the PARITY_REGEN function called by the REGENERATE function of FIG. 14.

FIG. 15 is a flow diagram of the PARITY_REGEN function which builds the rebuild commands for a parity fault tolerant array. Operation begins at step 1950. Control transfers to step 1952 which initializes the number of transfer buffers utilized to 0. Control transfers to step 1954 wherein the local processor 122 reads the drive map and determines whether the current drive is the drive which has failed. If it is determined that the current drive is not the drive which has failed, control transfers to step 1956 wherein the local processor advances the drive index to the next drive within the drive group and control transfers to step 1954. If it is determined in step 1954 that the current drive is the drive which has failed, control transfers to step 1958 wherein the local processor 122 sets a pointer to the corresponding request which has failed. Control transfers to step 1960 wherein the local processor 122 loads the drive request command structure with the parent logical request, position in drive map and command type. The local processor 122 also loads the request into the transfer buffer and updates the global RIS drive map in the local processor memory 128. Control transfers to step 1962 wherein XOR data buffer pointer is set to the last buffer utilized. Control transfers to step 1964, wherein the local processor 122 determines whether there are additional disks in the drive group. If yes, control transfers to step 1966 wherein the local processor 122 advances the drive map index to the next drive in the drive group. If there are no further disks in the drive group, control transfers to step 1968 in which the local processor 122 determines whether there are additional requests associated with the current drive request. If yes, control transfers to step 1970. In step 1970 the local processor 122 determines whether the current request is the first drive request associated with the failed read request. If yes, control transfers to step 1974. If not, control transfers to step 1972 wherein the local processor 122 sets the current request pointer is set to the previous request to create a linked list of requests and control transfers to step 1974. In step 1974 the local processor 122 resets the drive map index to the first disk in the drive group. Control transfers to step 1954. If in step 1968 it is determined there are no further requests associated with the failed drive request, control transfers to step 1976 wherein the local processor 122 obtains logical request information and allocates memory for the XOR request. Control transfers to step 1978 wherein the local processor 122 loads the XOR request information into the data structure. Control transfers to step 1980 wherein the linked drive requests are linked to the XOR request. Control transfers to step 1982 which submits the XOR request header followed by the linked list of drive request to the parity XOR engine to generate individual requests. Control transfers to step 1984 which returns all of the requests to the calling program.

10. Mirror Regenerate

Figure 16:
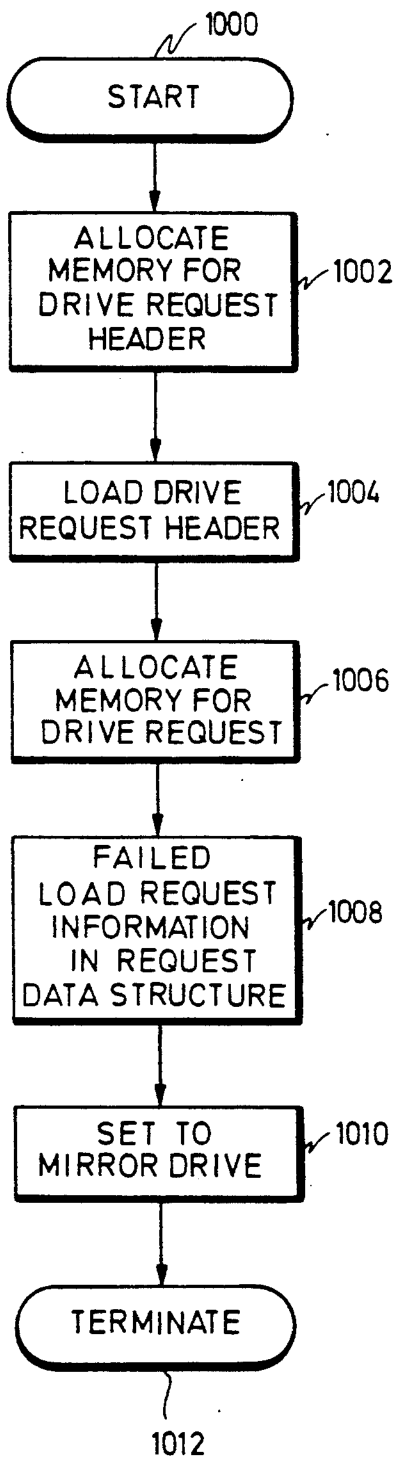
FIG. 16 is a flow diagram of the MIRROR_REGEN function called by the REGENERATE function of FIG. 14.

FIG. 16 is a flow diagram of the MIRROR_REGEN function which generates rebuild commands for a disk array in mirror fault tolerance mode. Operation begins at step 1000. Control transfers to step 1002 wherein the local processor 122 allocates memory for the drive request header. Control transfers to step 1004 wherein the local processor 122 loads the drive request header from information in the logical request and the failed request. Control transfers to step 1006 which allocates memory for the individual drive request. Control transfers to step 1008, wherein the local processor 122 loads the failed request information into the request data structure. Control transfers to step 1010, wherein the local processor 122 sets the request to read from the mirror drive and write to the failed drive. Control transfers to step 1012 which returns to the calling program.

V. Conclusion

The present invention provides for a means of reconstructing a replacement drive within a fault tolerant, intelligent disk array system. The present invention is capable of detecting a new disk in an array and creating and scheduling commands necessary to rebuild the data for the replacement disk in background mode without intervention by the system processor or suspension of normal system operations. Thus, the reconstruction of a disk is virtually transparent to the user.

The foregoing disclosure and description of the invention are illustrative and explanatory thereof, and various changes in the size, shape, materials, components, circuit elements, wiring connections and contacts, as well as in the details of the illustrated circuitry, construction and method of operation may be made without departing from the spirit of the invention.

EXTENDED INDUSTRY STANDARD ARCHITECTURE
CONFIDENTIAL INFORMATION OF BCPR SERVICES, INC.

2.6 Data Bus Translations 79
2.6.1 32-bit EISA Bus Master to 16-bit EISA Slave Transactions 79
2.6.2 16-bit EISA Bus Master to 32-bit EISA Slave Transactions 83
2.6.3 32-bit EISA Bus Master to 16-bit ISA Slave Transactions 83
2.6.4 32-/16-bit EISA Bus Master to 8-bit ISA Slave Transactions 85
2.6.5 16-bit ISA Bus Master to EISA Slaves Transactions 86
2.6.6 32-bit DMA Device to 16-bit EISA Memory Transactions 92
2.6.7 16-bit DMA Device to 32-bit EISA Memory Transactions 93
2.6.8 8-bit DMA Device to 16- or 32-bit EISA Memory Transactions 93
2.6.9 16- or 32-bit DMA Device to 8- or 16-bit ISA Memory Transactions 94
2.7 Locked Cycles 95
2.8 EISA Devices 97
2.8.1 Memory Slaves 97
2.8.2 I/O Slaves 103
2.8.3 Bus Masters 104
2.8.4 Burst Bus Masters 110
2.8.5 Downshift Burst Bus Masters 113
2.8.6 DMA Devices 115
2.8.6.1 Non-Burst EISA DMA Devices 119
2.8.6.2 Burst EISA DMA Devices 122
2.8.6.3 Misaligned DMA Transfers 131
2.8.7 System Board 131
2.8.7.1 Main Memory Access 131
2.8.7.2 Back-to-Back I/O Delay 132
2.8.7.3 Slot-specific I/O 132
2.8.7.4 I/O Address Decoding 134
2.9 Bus Arbitration 135
2.9.1 System Arbitration Priorities 139
2.9.2 Subsystem Priorities and Latencies 142
2.9.3 EISA Bus Master Arbitration Cycle Descriptions 147
2.10 Memory Refresh 149
2.11 Electrical Specifications 151
2.11.1 Power Consumption 151
2.11.2 DC Characteristics 151
2.11.3 Signal Routing and Capacitive Loading Requirements 154
2.11.4 AC Characteristics 155
2.11.4.1 ISA-compatible Timing Parameters 156
2.11.4.2 EISA, DMA, and Refresh Timing Parameters 181
2.12 Mechanical Specifications 213
2.13 EISA Connector and Expansion Board Description 213
2.13.1 Physical Characteristics 214
2.13.2 Connector Specifications 215
2.13.3 Pin Description 226
3. System Board I/O Control Functions 228
3.1 DMA Description 235
3.1.1 DMA Controller Overview 235
3.1.2 DMA Controller Description 236
3.1.2.1 DMA Master Condition Operation 236
3.1.2.2 DMA Slave Condition Operation 237

APPENDIX 1

Extended Industry Standard Architecture
(EISA) Specification 3.1

EXTENDED INDUSTRY STANDARD ARCHITECTURE
CONFIDENTIAL INFORMATION OF BCPR SERVICES, INC.

TABLE OF CONTENTS

Foreword ix
Notational Conventions x
Units of Measure xi
1. EISA Overview 1
 1.1 Compatibility with ISA 1
 1.2 Memory Capacity 1
 1.3 Synchronous Data Transfer Protocol 2
 1.4 Enhanced DMA Functions 2
  1.4.1 32-bit Address Support for DMA Transfers 2
  1.4.2 8-, 16- or 32-bit Data Transfers from DMA Devices 3
 1.5 Bus Master Capabilities 4
 1.6 Data Size Translation 4
 1.7 Bus Arbitration 4
 1.8 Edge/Level Triggered Interrupts 4
 1.9 Automatic System Configuration 5
 1.10 EISA Feature/Benefit Summary 6
2. EISA Bus Specification 8
 2.1 Signal Descriptions 8
  2.1.1 Address and Data Bus Signal Group 8
  2.1.2 Data Transfer Control Signal Group 11
  2.1.3 Bus Arbitration Signal Group 16
  2.1.4 Utility Signal Group 18
  2.1.5 Summary of Signals 19
  2.1.6 Signal Usage by System, Masters and Slaves 19
 2.2 ISA Cycles 23
  2.2.1 CPU CYCLES 23
  2.2.2 MEMORY SLAVES 25
  2.2.3 I/O SLAVES 25
  2.2.4 BUS MASTERS 25
 2.3 ISA CPU and Bus Master Cycles 27
  2.3.1 8-bit Memory Cycles 27
  2.3.2 8-bit I/O Cycles 31
  2.3.3 16-bit Memory Cycles 35
  2.3.4 16-bit I/O Cycles 39
 2.4 EISA CPU and Bus Master Cycles 42
  2.4.1 Standard Memory and I/O Cycles 42
  2.4.2 COMPRESSED Cycles 48
  2.4.3 Burst Cycles 50
 2.5 DMA Cycles 55
  2.5.1 ISA Compatible DMA Cycles: ISA Compatible 55
  2.5.2 Type "A" DMA Cycles 63
  2.5.3 Type "B" DMA Cycles 68
  2.5.4 Burst DMA (Type "C") Cycles 73

3.1.3 DMA Transfer Modes 237
3.1.3.1 Single Transfer Mode 237
3.1.3.2 Block Transfer Mode 237
3.1.3.3 Demand Transfer Mode 238
3.1.3.4 Cascade Mode 239
3.1.4 Transfer Types 239
3.1.5 Auto Initialize 239
3.1.6 Buffer Chaining 240
3.1.7 Ring Buffers 241
3.1.8 Software Commands 243
3.1.9 DMA Controller Register Descriptions 243
3.1.9.1 DMA Extended Mode Register 243
3.1.9.2 Chaining Mode Register 245
3.1.9.3 Chaining Mode Status Register 247
3.1.9.4 Channel Interrupt Status Register 247
3.1.9.5 Address and Word Count Registers 248
3.1.9.5.1 Base Word Count Register 248
3.1.9.5.2 Current Word Count Register 249
3.1.9.5.3 Base Address Register 250
3.1.9.5.4 Current Address Register 251
3.1.9.5.5 Address and Word Count Programming 252
3.1.9.6 DMA Command Register 256
3.1.9.7 Mode Register 257
3.1.9.8 Request Register 258
3.1.9.9 Mask Registers 258
3.1.9.10 DMA Status Register 260
3.1.10 Supported DMA Transfer Combinations 261
3.2 Interrupt Controller 265
3.2.1 Interrupt Controller I/O Address Map 265
3.2.2 Interrupt Sequence 265
3.2.3 Interrupt Controller Initialization 266
3.2.4 Initialization and Control Registers 268
3.2.4.1 Initialization Command Word 1 (ICW1) 268
3.2.4.2 Initialization Command Word 2 (ICW2) 269
3.2.4.3 Initialization Command Word 3 (ICW3) 270
3.2.4.4 Initialization Command Word 4 (ICW4) 271
3.2.4.5 Interrupt Mask Register (OCW1) 271
3.2.4.6 Operation Control Word 2 (OCW2) 272
3.2.4.7 Operation Control Word 3 (OCW3) 274
3.2.4.8 Edge/Level Control Register (ELCR) 275
3.2.4.9 Interrupt Request Register (IRR) 276
3.2.4.10 In-Service Register (ISR) 276
3.2.5 End-of-Interrupt 277
3.2.5.1 End of Interrupt (EOI) Command 277
3.2.5.2 Automatic End of Interrupt (AEOI) 277
3.2.6 Interrupt Controller Modes 277
3.2.6.1 Fully Nested Mode 277
3.2.6.2 Special Fully Nested Mode 278
3.2.6.3 Fixed Priority Mode 278
3.2.6.4 Rotating Priority Mode 278
3.2.6.5 Polled Mode 279
3.2.6.6 Special Mask Mode 280

3.3 Non-Maskable Interrupts (NMI) 281
3.4 Interval Timers 287
3.4.1 Programming the Interval Timers 289
3.4.1.1 Interval Timer Control Word Format 289
3.4.1.2 Counter Operating Modes 290
3.4.1.3 Counter Initial Count Value 291
3.4.2 Monitoring Timer Status 291
3.4.2.1 Counter Read Operation 291
3.4.2.2 Counter Latch Command 292
3.4.2.3 Counter Read-Back Command 292
4. EISA System Configuration 294
4.1 Devices Supported by Automatic Configuration 295
4.1.1 Expansion Boards 295
4.1.1.1 EISA Expansion Boards 295
4.1.1.2 ISA Expansion Boards 295
4.1.2 System Board 295
4.1.2.1 System Board Peripherals That Use Slot-Specific I/O Space 296
4.1.2.2 System Board Peripherals That Use System Board I/O Space 296
4.1.3 Software Drivers That Require System Resources 296
4.2 Configuration Utility 297
4.3 Configuration Files 298
4.3.1 Configuration File Extensions 298
4.3.2 Expansion Board Identifier (Product ID) 299
4.3.3 I/O Port Initialization Information 299
4.3.4 System Resource Requests 299
4.4 Configuration File Filenames 300
4.5 The Configuration Procedure 301
4.5.1 Configuration File Syntax 301
4.5.2 Symbol Conventions 302
4.5.3 Numerical Value Conventions 303
4.5.4 Keyword and Field Specification Conventions 303
4.6 Configuration File Format 305
4.6.1 Board Identification Block 305
4.6.2 Initialization Information Block 311
4.6.2.1 I/O Port Initialization Statement Block 311
4.6.2.2 Switch Configuration Statement Block 313
4.6.2.3 Jumper Configuration Statement Block 317
4.6.2.4 SOFTWARE(Initialization) Statement Block (Optional) 321
4.6.3 FUNCTION Statement Block 322
4.6.3.1 CHOICE Statement Block 325
4.6.3.2 SUBCHOICE Statement Block 327
4.6.3.3 GROUP Statement Block 331
4.6.4 Resource Description Block 334
4.6.4.1 DMA Channel Description Block 335
4.6.4.2 Interrupt Description Block 338
4.6.4.3 I/O Port Description Block 339
4.6.4.4 Memory Description Block 341
4.6.4.5 INIT Statements 345

4.6.5 Resource Group 348
4.6.5.1 LINK Groups 348
4.6.5.2 COMBINE Groups 349
4.6.5.3 Free Groups 351
4.6.6 PORTVAR(j) Variable 352
4.7 System Board Configuration File 353
4.7.1 Board Identification Block 353
4.7.2 System Description Block 353
4.7.3 SLOT Statement Block (Optional) 355
4.8 EISA System ROM Operations 356
4.8.1 EISA System ROM BIOS Routine Calls 356
4.8.1.1 Identify System Board Type 357
4.8.1.2 Read Slot Configuration Information, INT 15h, AH=D8h, AL=00h (or 80h) 358
4.8.1.3 Read Function Configuration Information, INT 15h, AH=0D8h, AL=01h (or 81h) 359
4.8.1.4 Clear Nonvolatile Memory, INT 15h, AH=D8h, AL=02h (or 82h) 368
4.8.1.5 Write Nonvolatile Memory INT 15h, AH=D8h, AL=03h (or 83h) 368
4.8.2 Initializing Nonvolatile Memory 379
4.8.3 Power-up Initialization of EISA Systems 379
4.8.4 Slot Initialization Sequence 380
4.8.5 Error Handling During Slot Initialization 382
4.8.6 Noncacheable Memory Map Initialization 383
4.8.7 Writable Memory Map Initialization 383
4.9 EISA System I/O Address Map 384
4.9.1 Expansion Board Address Decoding 385
4.9.2 Embedded Slot Address Decoding 387
4.9.3 System Board Address Decoding 387
4.10 EISA Product Identifier (ID) 389
4.10.1 EISA System Board ID 390
4.10.2 EISA Expansion Board Product ID 392
4.10.3 EISA Embedded Devices 394
4.11 Expansion Board Control Bits 395
4.12 System Software Use of Configuration Information 397
4.12.1 Slot Search by Product Independent Device Driver 397
4.12.2 Slot Search by a Product Dependent Device Driver 398
4.12.3 Device Driver Initialization for EISA Expansion Boards 399
4.13 Creating TYPEs and SUBTYPEs for Devices 400
4.13.1 TYPE Strings 400
4.13.2 SUBTYPE Strings 401
4.13.3 Standard TYPE Table 402
4.14 Configuration Example 404
4.14.1 Configuration File 404
4.14.2 Read Slot Configuration Information BIOS Routine 408
4.14.3 Read Function Configuration Information BIOS Routine Call 408
4.14.4 Write Nonvolatile Memory BIOS Routine CALL 416
5. Glossary 420

LIST OF FIGURES

| Figure | | Page |
|---|---|---|
| 1 | CHRDY "Sample Window" | 24 |
| 2 | Memory Access to 8-bit ISA Slave - Standard Cycle (6 BCLK) | 28 |
| 3 | Memory Access to 8-bit ISA Slave (7 BCLK) | 29 |
| 4 | Memory Access to 8-bit ISA Slave (3 BCLK) | 30 |
| 5 | I/O Access to 8-bit ISA Slave - Standard Cycle (6 BCLK) | 32 |
| 6 | I/O Access to 8-bit ISA Slave (7 BCLK) | 33 |
| 7 | I/O Access to 8-bit ISA Slave (3 BCLK) | 34 |
| 8 | Memory Access to 16-bit ISA Slave - Standard Cycle (3 BCLK) | 36 |
| 9 | Memory Access to 16-bit ISA Slave (6 BCLK) | 37 |
| 10 | Memory Access to 16-bit ISA Slave (2 BCLK) | 38 |
| 11 | I/O Access to 16-bit ISA Slave - Standard Cycle (3 BCLK) | 40 |
| 12 | I/O Access to 16-bit ISA Slave (6 BCLK) | 41 |
| 13 | 32-bit Master to 32-bit Slave Memory Read Accesses | 45 |
| 14 | 32-bit Master to 32-bit Slave Memory Write Accesses | 46 |
| 15 | Access to EISA Slave - 3 BCLK and Standard (2 BCLK) Cycles | 47 |
| 16 | Access to EISA Slave - COMPRESSED Cycle (1.5 BCLK) | 49 |
| 17 | 32-bit Master to 32-bit Slave Burst Read Transfers | 52 |
| 18 | 32-bit Master to 32-bit Slave Burst Write Transfers | 53 |
| 19 | Access to EISA Slave - Burst Cycles (With and Without Wait States) | 54 |
| 20 | 32-bit DMA Read Transfer from 32-bit Memory - Type "A," "B," and Burst Cycles (No Wait States) | 57 |
| 21 | 32-bit DMA Read Transfer from 32-bit Memory - Compatible Cycle (No Wait States) | 58 |
| 22 | 32-bit DMA Write Transfer to 32-bit Memory - Type "A," "B," and Burst Cycles (No Wait States) | 59 |
| 23 | 32-bit DMA Write Transfer to 32-bit Memory - Compatible Cycle (No Wait States) | 60 |
| 24 | DMA Transfer from Memory Without Conversion - Compatible Cycle: Demand Read | 61 |
| 25 | DMA Transfer to Memory Without Conversion - Compatible Cycle: Demand Write | 62 |
| 26 | DMA Transfer from Memory Without Conversion - Type "A" Cycle: Demand Read | 64 |
| 27 | 32-bit DMA Transfer from 16-bit EISA Memory with Conversion - Type "A" Cycle: Read | 65 |
| 28 | DMA Transfer to Memory Without Conversion - Type "A" Cycle Demand: Write | 66 |
| 29 | 32-bit DMA Transfer to 16-bit EISA Memory with Conversion - Type "A" Cycle: Write | 67 |
| 30 | DMA Transfer from Memory Without Conversion - Type "B" Cycle Demand Read | 69 |
| 31 | 32-bit DMA Transfer from 16-bit EISA Memory with Conversion - Type "B" Cycle: Read | 70 |
| 32 | DMA Transfer to Memory Without Conversion - Type "B" Cycle: Demand Write | 71 |
| 33 | 32-bit DMA Transfer to 16-bit EISA Memory with Conversion - Type "B" Cycle Write | 72 |

LIST OF FIGURES (continued)

| Figure | | Page |
|---|---|---|
| 34 | DMA Transfer from Memory Without Conversion - Burst DMA Cycle: Demand Read | 75 |
| 35 | 32-bit DMA Transfer from 16-bit EISA Memory with Conversion - Burst DMA Cycle: Read | 76 |
| 36 | DMA Transfer to Memory Without Conversion - Burst DMA Cycle: Demand Write | 77 |
| 37 | 32-bit DMA Transfer to 16-bit EISA Memory with Conversion - Burst DMA Cycle: Write | 78 |
| 38 | 32-bit EISA Master to 16-bit EISA Slave Dword Access | 82 |
| 39 | 16-bit ISA Master Read from EISA Slave | 88 |
| 40 | 16-bit ISA Master Write to EISA Slave | 89 |
| 41 | 16-bit ISA Master I/O Read from 16- or 32-bit EISA I/O Slave | 90 |
| 42 | 16-bit ISA Master I/O Write to 16- or 32-bit EISA I/O Slave | 91 |
| 43 | LOCK Timing Example | 96 |
| 44 | Memory Slave with Wait States | 99 |
| 45 | BURST EISA Memory Slave with Wait States | 100 |
| 46 | EISA Memory Slave (Burst Cycle) Page Boundary Condition | 101 |
| 47 | EISA Memory Slave (Standard Cycle) NOWS* Asserted | 102 |
| 48 | EISA Bus Master Write Cycle with Data Translation | 106 |
| 49 | EISA Bus Master Preempt During Normal Cycle | 107 |
| 50 | Bus Transfer from Master Control to Float - EISA Cycle (with Wait States) | 108 |
| 51 | Bus Transfer from EISA Control to Float - Translated ISA Cycle | 109 |
| 52 | EISA Bus Master Preempt During Burst Cycle | 111 |
| 53 | Bus Transfer from Master Control to Float - EISA Burst Cycle | 112 |
| 54 | "Downshift" Bus Master Operations | 114 |
| 55 | EISA DMA Device Compatible Write Transfer | 116 |
| 56 | Type "B" EISA DMA Device (Block Memory Write) Transfer Interrupted by DAK*<x> | 117 |
| 57 | BURST EISA DMA Device: Demand Memory Write Negation of DAK*<x> and DRQ<x> in Same Cycle | 118 |
| 58 | Type "B" EISA DMA Device (Demand Memory Read) | 120 |
| 59 | Type "B" EISA DMA Device (Block Memory Write) T-C Asserted by DMA Device | 121 |
| 60 | Burst EISA DMA Device (Demand Memory Write) Wait States on Last Cycle | 123 |
| 61 | Burst EISA DMA Device (Block Memory Read) Page Boundary Condition | 124 |
| 62 | Burst EISA DMA Device (Demand Memory Write) | 126 |
| 63 | Burst EISA DMA Device (Memory Read) Transfer Terminated by Assertion of T-C | 127 |
| 64 | Burst EISA DMA Device T-C Asserted by DMA Device | 128 |
| 65 | Burst EISA DMA Device (Demand Memory Write) DRQ<x> Negated at Wait State | 129 |
| 66 | Burst EISA DMA Device (Block Memory Read) Preemption by Negation of DAK*<x> | 130 |
| 67 | Bus Master: Starting a Normal Cycle Without a Bus Timeout | 136 |
| 68 | Bus Master: Continuing a Burst Cycle Without a Bus Timeout | 136 |

LIST OF FIGURES (continued)

| Figure | | Page |
|---|---|---|
| 69 | Bus Master Continuing a Downshift Burst Cycle Without a Bus Timeout | 137 |
| 70 | Centralized Arbitration | 138 |
| 71 | Fixed DMA Priority Arbitration Sequence | 140 |
| 72 | Rotating DMA Priority Arbitration Sequence | 141 |
| 73 | Bus Arbitration Between Two Bus Masters | 148 |
| 74 | Refresh Cycles (Standard and One Wait State) | 150 |
| 75 | ISA Bus Timing, System Timing | 158-159 |
| 76 | ISA Bus Timing, Bus Master Cycles | 168 |
| 77 | ISA Bus Timing, CPU Cycles (Device Perspective) | 171-172 |
| 78 | 16- or 32-bit EISA Master and System Timing | 183 |
| 79 | 16- or 32-bit EISA Master Assembly/Disassembly Timing | 184 |
| 80 | System Timing (Assembly Cycles) | 190 |
| 81 | 16- or 32-bit EISA Slave Timing | 191 |
| 82 | System Timing (COMPRESSED Cycles) | 194 |
| 83 | 16- or 32-bit EISA COMPRESSED Cycle - Slave Timing | 196 |
| 84 | Refresh Cycle - Slave Timing | 198 |
| 85 | 16- or 32-bit EISA Master Timing, Burst | 200 |
| 86 | 16- or 32-bit EISA Slave Timing, Burst | 202 |
| 87 | System DMA Timing | 204 |
| 88 | DMA Device Timing Compatible, Type "A", and Type "B" Memory Read Cycles | 205 |
| 89 | DMA Device Timing Compatible, Type "A", and Type "B" Memory Write Cycles | 206 |
| 90 | DMA Device Timing Burst Memory Read Cycle | 210 |
| 91 | DMA Device Timing Burst Memory Write Cycle | 211 |
| 92 | EISA Connector and Card-edges | 216 |
| 93 | EISA Expansion Board Dimensions | 217 |
| 94 | EISA Expansion Board Card-edge Detail | 218 |
| 95 | 16-bit ISA Expansion Board Dimensions | 219 |
| 96 | 16-bit ISA Expansion Board Card-edge Detail | 220 |
| 97 | 8-bit ISA Expansion Board Dimensions | 221 |
| 98 | 8-bit ISA Expansion Board Card-edge Detail | 222 |
| 99 | EISA Expansion Board Mounting Bracket | 223 |
| 100 | EISA Connector Dimensions | 224 |
| 101 | EISA Connector System Board Drill Pattern | 225 |
| 102 | EISA Pinout | 227 |
| 103 | Power-Up Slot Initialization | 380-381 |

EXTENDED INDUSTRY STANDARD ARCHITECTURE
CONFIDENTIAL INFORMATION OF BCPR SERVICES, INC.

Foreword

Since its inception seven years ago, the growth of the personal computer market has been driven by the emergence of a de-facto industry standard. The industry standard started with the original IBM PC system architecture and has evolved to the 80386 architecture in use today.

The industry-standard architecture (ISA) provides enormous benefits to the PC user community. It is a stable platform for software and hardware development that gives customers the largest selection of products in the history of computing. ISA compatibility across a wide range of products enables users to adopt new technologies quickly and efficiently, while protecting their investment in expansion boards and software. Availability of a variety of ISA compatible products has freed PC users from a single-vendor, proprietary architecture and given them real freedom of choice to select the best computers, software and peripherals to meet their needs. Over the last seven years, ISA has evolved to a customer-controlled standard rather than a vendor-controlled standard.

Between 10 and 15 million personal computers based on the industry standard architecture are in use today. There are tens of thousands of software products and thousands of expansion boards and peripherals available for ISA compatible PCs. Hundreds of personal computer models are available from dozens of manufacturers that take advantage of the huge base of hardware and software. U.S. business has invested nearly $100 billion in ISA personal computers, software, expansion boards, peripherals and user training.

A steady progression of advances has resulted in performance and function enhancements to the industry standard, while maintaining full compatibility with PC hardware and software products. Microprocessors progressed from the 8088 and 8086 to the 80286 and then to the 80386. DOS has evolved to support over a gigabyte of fixed disk storage space and expanded memory manager software has been developed to allow DOS applications access to expanded memory. MS-Windows, OS/2, UNIX, and XENIX and now provide multi-tasking capabilities on the 80286. Expansion bus I/O and memory addressing were increased with the addition of a 16-bit data bus and a 24-bit (16 megabyte) address bus. Each advance was carefully engineered for full compatibility with industry standard hardware and software.

Upon this firmly established foundation, the industry standard will continue to strengthen and evolve. The future will bring even faster 80386 microprocessors and eventually a compatible 80486 microprocessor. It will bring new, compatible versions of operating systems, including advanced versions of DOS and an 80386 version of OS/2.

The combination of the 386 architecture and advanced operating systems will stimulate the development of a new generation of PC applications traditionally associated with departmental computer systems: like advanced networking, communications gateways, database access by multiple users and transaction processing. These multi-user applications require the transfer of large volumes of data and will create the need to extend the ISA data and address bus to 32-bits.

This EISA specification is a joint effort by computer industry leaders to develop the 32-bit extension for industry standard computers. It defines a high-performance, open-architecture bus available to PC manufacturers, expansion board vendors, software developers and semiconductor suppliers without financial or technical constraints.

Notational Conventions

The following notational conventions are used throughout this specification.

Register Notation and Usage

The standard Intel naming conventions are used for the 80386 registers. AX, BX, CX, and DX are the names of the general registers when used as word-length (16-bit). AH, AL, BH, BL, CH, CL, DH, and DL are the names for the general registers when they are used as byte-length registers (8-bit). When addresses are handled, BX usually contains the offset. However, SI (source index) or BP (base pointer) may also be used with the ES (extra segment) register.

Bit Notation

Bit fields within a byte or word are shown as a range of decimal numbers separated by two dots and enclosed in angle brackets, as name <x:y>.

Signal Names

A bus is shown as the bus signal name followed by a range of decimal numbers separated by two dots and enclosed in angle brachets, for example, SA<19:0>.

A slot-specific signal is shown as the signal name followed by a lower case x, for example, AEXx.

Negative true logic is indicated by an asterisk (*) following the signal name, for example, START*.

Radix Notation

Hexadecimal numbers are indicated by a lower case "h" following the digits, for example, 100h.

Bytes, Words, Double Words

A byte is 8 bits. A word is 16 bits. A dword is 32 bits.

Units of Measure

The following units of measure are used throughout this specification.

| | | |
|---|---|---|
| A | amp | |
| cm | centimeter | $10^{-2}$ meters |
| GB | gigabyte | $2^{30}$ bytes |
| K | kilo-ohm | $10^{3}$ ohms |
| KB | kilobyte | $2^{10}$ bytes |
| KHz | kilohertz | $10^{3}$ hertz |
| MB | megabyte | $2^{20}$ bytes |
| MHz | megahertz | $10^{6}$ hertz |
| m | meter | |
| $\mu$s | microsecond | $10^{-6}$ sec |
| mA | milliampere | $10^{-3}$ amps |
| mm | millimeter | $10^{-3}$ meters |
| ms | millisecond | $10^{-3}$ sec |
| ns | nanosecond | $10^{-9}$ sec |
| pF | picofarad | $10^{-12}$ farads |
| s | second | |
| $\mu$A | microamps | $10^{-6}$ amps |
| V | volt | |
| W | watt | |

1. EISA Overview

The Extended Industry Standard Architecture (EISA) is a superset of the ISA 8- and 16-bit architecture. It extends the capabilities of that standard while maintaining compatibility with ISA expansion boards.

EISA introduces the following major advances:

- 32-bit memory addressing for CPU, Direct Memory Access (DMA) devices and bus masters
- 16- or 32-bit data transfers for CPU, DMA and bus master devices
- An efficient synchronous data transfer protocol that allows for normal single transfers as well as high-speed Burst transfers
- Automatic translation of bus cycles between EISA and ISA masters and slaves
- Support of intelligent bus master peripheral controllers
- Enhanced DMA arbitration and transfer rates
- 33 MB/s data transfer rate for bus masters and DMA devices
- Shareable interrupts, programmable for edge or level triggering
- Automatic configuration of system and expansion boards

1.1 Compatibility with ISA

EISA systems maintain full compatibility with the existing industry standard. EISA connectors are a superset of the 16-bit connectors on ISA system boards. ISA 8- and 16-bit expansion boards can be installed in EISA slots. All EISA performance and function enhancements are, similarly, superset features that maintain full compatibility with ISA expansion boards and software.

1.2 Memory Capacity

EISA systems support a 32-bit address path. The main CPU, bus masters and DMA devices can access the entire 80386 memory space. ISA memory cards can be used in the lower 16 megabytes without modification. EISA memory cards can add as much memory as needed for the application. The total memory supported is limited only by the packaging constraints of the individual product, rather than the system architecture.

1.3 Synchronous Data Transfer Protocol

The EISA bus achieves its speed and flexibility through the use of a synchronous transfer protocol. Bus masters and multiple processors can synchronize their bus cycles to a common clock to achieve maximum performance. The synchronous transfer protocol also provides the cycle control necessary to execute Burst cycles with up to 33 MB/s data transfer rate.

On the EISA synchronous bus, control signals, address lines and data bus use a bus clock generated by the system board as the reference for a transfer. Unlike many systems, however, the bus clock is not a fixed frequency. Since the system board is the source of most bus cycles, the system board adjusts the bus clock frequency and phase to achieve the maximum performance of the CPU and memory.

EISA provides a variety of cycle types to cover the range of speed and the complexity requirements for different applications. The standard transfer cycle requires 2 clock cycles, but CPUs are permitted to generate a 1.5 clock COMPRESSED cycle for slaves that request it. At the high end of the performance spectrum are Burst cycles which require 1 clock per transfer.

1.4 Enhanced DMA Functions

EISA systems provide a number of DMA enhancements, including: 32-bit addressability, 8-, 16-, and 32-bit data transfers and higher performance arbitration and data transfer cycles. EISA DMA provides ISA compatible modes, with ISA timing and function as the default.

DMA offers a lower cost alternative to an intelligent bus master. The EISA DMA functions are intended for I/O peripherals that do not require local intelligence on the peripheral interface.

1.4.1 32-bit Address Support for DMA Transfers

EISA 32-bit address support enables ISA, as well as EISA DMA devices to transfer data to any 32-bit memory address. The default DMA supports ISA compatible 24-bit address with no software or hardware modifications. DMA software can be modified to support the 32-bit memory space, without modifications to the DMA hardware.

1.4.2 8-, 16- or 32-bit Data Transfers from DMA Devices

Any DMA channel can be programmed for 8-, 16- or 32-bit data transfers. An 8-bit DMA device uses the low 8 bits of the data bus, a 16-bit device uses the low 16 bits, and a 32-bit device uses the full 32-bit data bus.

A 32-bit DMA device can perform up to 33 MB/s data transfers using Burst cycles.

Performance Gains for DMA Devices

EISA DMA devices can be programmed for high-performance data transfers using one of four DMA cycle types. The default cycle type, Compatible cycles, delivers a higher data transfer rate than ISA compatible computers. The improvement is the result of EISA's faster bus arbitration and requires no hardware or software modifications to ISA compatible DMA devices. Type "A" and Type "B" cycles are EISA modes that, with special programming, allow some ISA compatible DMA devices to achieve even higher performance. The Burst DMA (Type "C") cycle type is the highest performance DMA cycle and is only available to DMA devices designed specifically for Burst.

The following table indicates peak data transfer rates for each DMA cycle type and the DMA devices that are compatible with the cycle type.

DMA Cycle Types

| DMA Cycle Type | Transfer Rate (MB/s) | Compatibility |
|---|---|---|
| Compatible | | |
| 8-bit | 1.0 | All ISA |
| 16-bit | 2.0 | All ISA |
| Type "A" | | |
| 8-bit | 1.3 | Most ISA |
| 16-bit | 2.6 | Most ISA |
| 32-bit | 5.3 | EISA Only |
| Type "B" | | |
| 8-bit | 2.0 | Some ISA |
| 16-bit | 4.0 | Some ISA |
| 32-bit | 8.0 | EISA Only |
| Burst DMA (Type "C") | | |
| 8-bit | 8.2 | EISA Only |
| 16-bit | 16.5 | EISA Only |
| 32-bit | 33.0 | EISA Only |

1.5 Bus Master Capabilities

EISA based computers support a bus master architecture for intelligent peripherals. The bus master architecture provides a high-speed data channel with data rates up to 33 MB/s using EISA Burst cycles. The bus master provides local intelligence by including a dedicated I/O processor and local memory. It can relieve the burden on the main CPU by performing sophisticated memory access functions, such as non-ordered scatter-gather data transfers. Examples of applications that might benefit from a bus master implementation include communication gateways, disk controllers, LAN interfaces, data acquisition systems, and certain classes of graphics controllers.

1.6 Data Size Translation

The EISA bus system provides a mechanism for EISA expansion boards to communicate with ISA compatible devices. The EISA bus master or slave generates EISA data and control signals, letting the system board copy the data to the appropriate byte lanes and translate the control signals as necessary.

The system board provides the automatic translation for 16-bit ISA bus masters, 8- or 16-bit memory and I/O slaves, and DMA devices. The system board also provides automatic translation for transactions between 16- and 32-bit EISA devices.

1.7 Bus Arbitration

EISA systems also provide a centralized arbitration scheme that allows efficient bus sharing among multiple EISA bus masters and DMA devices. The centralized arbitration supports preemption of an active bus master or DMA device and can reset a device that does not release the bus after preemption.

The EISA arbitration method grants the bus to DMA devices, DRAM refresh, bus masters and CPU functions on a fair, rotational basis. The rotational scheme provides a short latency for DMA devices to assure compatibility with ISA DMA devices. Bus masters and the CPU, which typically have buffering available, have longer, but deterministic latencies.

1.8 Edge/Level Triggered Interrupts

EISA systems provide level-triggered, shareable interrupts. Any EISA interrupt can be individually configured for level- or edge-triggered operation. Edge-triggered operation provides full compatibility with existing, interrupt-driven, ISA devices. Level-triggered operation facilitates the sharing of a single system interrupt by a number of devices. Level-triggered interrupts might be used, for example, to share a single interrupt between a number of serial ports.

1.9 Automatic System Configuration

EISA provides the capabilities for automatic configuration of system and expansion boards. EISA expansion board manufacturers include configuration files with expansion board products. The configuration files can be included with either new, fully programmable EISA boards or switch-configured ISA products. The configuration files are used at system configuration time to assign system resources (such as DMA channels, interrupt levels) and thus prevent conflicts between the installed expansion boards. For switch-configurable boards, the configuration files can be used to outline the proper assignment of resources and instruct the user about the proper selection of switch settings.

To accomplish the automatic system and expansion board configuration, EISA provides a method for accessing I/O port ranges that are slot specific. This means that a board using these ranges can be plugged into any slot in the system without the risk of I/O range conflicts. These I/O ranges can be used for expansion board initialization or for normal I/O port assignments that are guaranteed not to conflict with any other expansion board installed in the system.

EISA also includes a product identification mechanism for systems and expansion board products. The product identifier allows products to be identified during the configuration and initialization sequences for the system and expansion boards. EISA includes guidelines for selection of a product identifier. The identifier of each product is selected by the product manufacturer and does not need the approval of any other party in the industry.

1.10 EISA Feature/Benefit Summary

The following is a summary of the key features and benefits of the extended industry standard architecture.

| Feature | Benefit |
|---|---|
| Full support of industry standard expansion boards | Preserves customer and industry investment. Provides maximum flexibility in product selection. |
| ISA expansion board size | 63 square inches of board space for complex peripherals and ease of implementation. |
| Maximum +5 V power per slot of approximately 4.5 A | Ample power available for complex, intelligent peripherals. |
| Full-function 32-bit address and data buses | 33 MB/s bus master and DMA data transfer rates for high-performance peripherals. |
| | Support for greater than 16 MB of memory. |
| | Programmable level- or edge-triggered interrupts |
| | Facilitates interrupt sharing by multiple devices. |

EXTENDED INDUSTRY STANDARD ARCHITECTURE
CONFIDENTIAL INFORMATION OF BCPR SERVICES, INC.

| Feature | Benefit |
|---|---|
| **Enhanced DMA functions** | |
| • Efficient arbitration cycles | Improved performance and memory addressing for ISA and EISA DMA devices. |
| • Support of demand and block DMA transfers | Improved efficiency of DMA data block transfers up to rates of 33 MB/s for 32-bit DMA transfers. |
| • Fast DMA cycle times | |
| • Support of 32-bit address and data size | |
| **Bus master support** | |
| • Support for multiple bus master peripherals | Provides high performance and local intelligence for sophisticated peripherals. Data transfer rate up to 33 MB/s for 32-bit bus master peripheral. |
| • Efficient arbitration cycles | |
| • Automatic 32-, 16- or 8-bit data path translation | Enhanced ease of configuration for new EISA boards and existing ISA expansion boards. |
| • Support of 32-bit transfers | |
| • Support of fast Burst cycles | |
| Automatic expansion board configuration | |

2. EISA Bus Specification

2.1 Signal Descriptions

This section describes signals from each connector of the EISA bus.

2.1.1 Address and Data Bus Signal Group

This section describes the bus signals used for memory and I/O addressing and bus signals used for the transfer of data.

**BE*<3:0> - (EISA Connector)**

BE*<3:0> are the byte enable signals that identify the specific bytes addressed in a dword. BE*<3:0> are pipelined from one cycle to the next and must be latched by the addressed slave if required for the whole cycle. The timing of these signals varies depending on the cycle type. During normal cycles, they go valid before BALE goes active and remain valid as long as the LA<31:2> lines remain valid. During DMA or 16-bit ISA bus master cycles, they go valid at least 1/2 BCLK before the CMD* or ISA command signals go active.

It is permissible for a 32-bit bus master to drive both of the high bytes of the data bus on write cycles even if it only places valid data (as indicated by BE*<3:0> lines) on one of the high bytes.

The following table shows the allowable combinations.

| Byte enables at bus | Bytes driven during write | | | Bytes driven by slave on read | | |
|---|---|---|---|---|---|---|
| | 32-bit master | 16-bit master | downshift master | 32-bit | 16-bit | 8-bit |
| BE* 3 2 1 0 | lane 3 2 1 0 | lane 1 0 | lane 3 2 1 0 | lane 3 2 1 0 | lane 1 0 | lane 0 |
| 0 0 0 0 | 3 2 1 0 | === | 3 2 1 0 | 3 2 1 0 | 1 0 | 0 |
| 0 0 0 1 | 3 2 1 | === | 3 2 1 | 3 2 1 | 1 | 1 |
| 0 0 1 0 | ======= | === | ======= | - - - - | - - | - |
| 0 0 1 1 | 3 2 | 3 2 | 3 2 3 2 | 3 2 | 3 2 | 2 |
| 0 1 0 0 | ======= | === | ======= | - - - - | - - | - |
| 0 1 0 1 | ======= | === | ======= | - - - - | - - | - |
| 0 1 1 0 | ======= | === | ======= | - - - - | - - | - |
| 0 1 1 1 | 3 ? | 3 | 3 ? 3 | 3 ? | 3 | 3 |
| 1 0 0 0 | ? 2 1 0 | === | ? 2 1 0 | ? 2 1 0 | 1 0 | 0 |
| 1 0 0 1 | ? 2 1 | === | ? 2 1 | ? 2 1 | 1 | 1 |
| 1 0 1 0 | ======= | === | ======= | - - - - | - - | - |
| 1 0 1 1 | ? 2 | 2 | ? 2 2 | ? 2 | 2 | 2 |
| 1 1 0 0 | 1 0 | 1 0 | 1 0 | 1 0 | 1 0 | 0 |
| 1 1 0 1 | 1 | 1 | 1 | 1 | 1 | 1 |
| 1 1 1 0 | 0 | 0 | 0 | 0 | 0 | 0 |
| 1 1 1 1 | ======= | === | ======= | - - - - | - - | - |

The character "=" means that the BE* <3:1> code should never be generated. The character "?" means that the data bus byte may be driven, but will be ignored.

D<31:24> - (EISA Connector)

D<31:24> are the highest-order 8 bits of the 32-bit EISA data bus. A 32-bit device uses D<31:24> to transfer the fourth (highest) byte of a dword when the address line BE*<3> is asserted.

D<23:16> - (EISA Connector)

D<23:16> are the second highest-order 8 bits of the 32-bit EISA data bus. A 32-bit device uses D<23:16> to transfer the third (second highest) byte of a dword when the address line BE*<2> is asserted.

D<15:8> - (ISA Connector)

D<15:8> are the high 8 bits of the 16-bit data bus. Sixteen-bit devices use these lines to transfer the high half of a data word when SBHE*, BE*<3> or BE*<1> is asserted. thirty-two-bit devices use D<15:8> to transfer the second (third highest) byte of a dword when the address line BE*<1> is asserted.

D<7:0> - (ISA Connector)

D<7:0> are the low 8 bits of the data bus. Eight-bit devices use these lines to transfer data. A sixteen-bit device uses these lines to transfer the low half of a data word when the address line SA<0> is low or when BE* <2> or BE* <0> is asserted. Thirty-two-bit devices use D<7:0> to transfer the first (lowest) byte of a dword when the address line BE* <0> is asserted.

LA<16:2> - (EISA Connector)

The <16:2> are a part of the latchable address bus. The latchable address lines (LA<31:2>) are pipelined from one cycle to the next and must be latched by the addressed slave if required for the whole cycle. LA<31:2> are presented early enough in the cycle decode to support 1.5 or 2 BCLK memory accesses. During standard cycles, they go valid before START* is asserted and remain valid at least 1/2 BCLK after CMD* or the ISA command signals are asserted. During DMA or 16-bit ISA bus master cycles, LA<31:2> are valid at least one BCLK before the CMD* or ISA command signals are asserted. LA<31:2> can be driven by an expansion board acting as a bus master. An EISA slave may latch the entire address (LA<31:2> and BE*<3:0>) and status signals (M-IO and W-R) on the trailing edge of START* or leading edge of CMD*.

LA<23:17> - (ISA Connector)

LA<23:17> are a part of the 32-bit latchable address bus. They have the same characteristics as LA<16:2>, except that they are wired to the 16-bit portion of the ISA connector. An ISA slave can latch LA<23:17> with the trailing edge of BALE.

**LA*<31:24> - (EISA Connector)**

LA*<31:24> are the highest byte of the 32-bit latchable address bus. They have the same characteristics as LA<16:2>, except that they use inverted logic. A high on a LA*<31:24> address bit must be interpreted as an address bit of "0". A low must be interpreted as an address bit of "1". (When the notation LA*<31:2> is used, only LA<31:24> are active low, the next are active high.

SA<19:0> - (ISA Connector)

The SA<19:0> lines address memory or I/O devices within the system. They form the low-order 20 bits of the 32-bit address. On normal cycles SA<19:0> are driven onto the bus while BALE is high and are latched by the system board on the trailing edge of BALE. SA<19:0> are valid throughout the bus command cycle. On DMA or 16-bit ISA bus master cycles SA<19:0> are valid nominally one BCLK before the command signals and remain valid nominally one BCLK after the command signals go away.

**SBHE* - (ISA Connector)**

SBHE* (System Bus High Enable) indicates (when low) that expansion boards that support 16-bit data transfers should drive data on the high half of the D<15:0> data bus. On normal cycles, SBHE* becomes valid on the bus when BALE is asserted and remains valid until after the command (MRDC*, MWTC*, IORC*, IOWC* or CMD*) is negated. On DMA or 16-bit ISA bus master cycles, SBHE* is valid nominally one BCLK before the command signals and remains valid nominally one BCLK after the command signals go away.

AENx - (ISA Connector)

This slot-specific (the "x" refers to the slot number) signal, when negated (low), indicates that an I/O slave may respond to addresses and I/O commands on the bus. AENx is asserted (high) during DMA cycles to prevent I/O slaves from mis-interpreting DMA cycles as valid I/O cycles. The system board must negate AENx when START* is asserted for an I/O access, and AENx must remain negated until after CMD* is asserted. AENx is also used to disable I/O accesses to all other option slots during accesses to a particular slot's slot-specific I/O address range.

2.1.2 Data Transfer Control Signal Group

This section describes the signals used to control data transfer cycles on the 8-, 16- and 32-bit bus.

BCLK - (ISA Connector)

BCLK is provided to synchronize events with the main system clock. BCLK operates at a frequency between 8.333 MHz and 6 MHz, with a normal duty cycle of 50 percent. BCLK is driven only by the system board. The BCLK period is sometimes extended for synchronization to the main CPU or other system board devices. For example, the COMPRESSED cycle type extends each BCLK period by holding BCLK low for half a cycle beyond the normal transition to high. The BCLK extension facilitates synchronization during the 1.5 BCLK COMPRESSED cycle. During bus master accesses, the system board extends BCLK only when required to synchronize with main memory. Events must be synchronized to BCLK edges without regard to frequency or duty cycle. BCLK is always synchronous with the trailing edge of START* and the leading edge of CMD*. BCLK may not be synchronous with the leading edge of START* or the trailing edge of CMD*.

**MSBURST* - (EISA Connector)**

An EISA CPU or bus master asserts MSBURST* to indicate to the slave (typically, main memory) that the CPU or bus master can provide Burst cycles. MSBURST* is asserted with the LA<31:2> address lines for the second and all subsequent cycles of the Burst and is sampled on the rising edge of BCLK by the slave.

**SLBURST* - (EISA Connector)**

A slave (typically, main memory) indicates its support of Burst cycles by asserting SLBURST*. The slave develops SLBURST* from the LA<31:10> address lines and M-IO and produces SLBURST* regardless of the state of MSBURST*. SLBURST* is sampled on the rising edge of BCLK by the main CPU, DMA controller or bus master.

M-IO - (EISA Connector)

The main CPU or an EISA bus master asserts M-IO to indicate the type cycle in progress as a memory cycle (high) or I/O cycle (low). M-IO is pipelined from one cycle to the next and is latched by the addressed slave if needed for the whole cycle. M-IO should be included in all decodes by EISA slaves. M-IO must not be used in decoding the signals M16* or IO16*.

**LOCK* - (EISA Connector)**

The main CPU or a bus master may assert LOCK* to guarantee exclusive memory access during the time LOCK* is asserted. A bus master may also assert LOCK* to guarantee exclusive I/O access during the time LOCK* is asserted. Assertion of LOCK* allows bit test-and-set operations (as used for semaphores) to be executed as a unit, with the bus lock preventing multiple devices from simultaneously modifying the semaphore bit.

**EX32* - (EISA Connector)**

A memory or I/O slave asserts EX32* to indicate that it supports 32-bit (dword) transfers. A two BCLK cycle is executed when a slave asserts EX32* during a memory access. The slave asserts EX32* after decoding a valid address on the LA<31:2> address lines and M-IO. EX32* should not be latched by the slave. Both 16- and 32-bit EISA bus masters must monitor EX32* at the trailing edge of START* to determine if the slave supports 32- (and 16-) bit EISA transfers (asserted), or if the system board is performing data size translation (negated). If data size translation is being done and the master is a 32-bit master, then the system board asserts EX32* to indicate completion of the translation.

**EX16* - (EISA Connector)**

An EISA memory or I/O slave asserts EX16* to indicate that it supports 16-bit (word) transfers. A 16-bit EISA bus master samples EX16* asserted to confirm a 16-bit EISA slave. An EISA cycle (two BCLK) is executed when a slave asserts EX16* during a memory access by the system board or a 16-bit EISA bus master. The slave asserts EX16* after decoding a valid address on the LA<31:2> address lines and M-IO. EX16* should not be latched by the slave. 16-bit EISA bus masters must monitor EX16* to determine if the slave supports 16-bit EISA transfers (asserted), or if the system board is performing data size translation (negated). If data size translation is being done (ISA cycles) and the master is a 16-bit master (indicated by the master asserting MASTER16*), then the system board asserts EX16* to indicate completion of the translation.

EXRDY - (EISA Connector)

EISA I/O and memory slaves negate EXRDY to request wait state timing (each wait state is one BCLK). The system board samples EXRDY on each falling edge of BCLK after it asserts CMD*. The system board holds CMD* asserted during the entire period EXRDY is negated, and at least one half BCLK after sampling EXRDY asserted. EXRDY must be driven with an open-collector type buffer (a system board pull up resistor provides the asserting drive current). The EISA slave should negate EXRDY during START* or on the rising edge of BCLK at the end of START* if wait states are to be added. The slave *must* allow EXRDY to float high (asserted) synchronously with BCLK falling edge and must not hold EXRDY asserted longer than 2.5 $\mu$s EXRDY should *never* be driven high.

**START* - (EISA Connector)**

The START* signal provides timing control at the start of a cycle. The CPU or bus master asserts START* after LA<31:2> and M-IO become valid and negates START* on a rising edge of BCLK after one BCLK cycle time. BE*<3:0> and W-R may not be valid at the leading edge of START*.

**CMD* - (EISA Connector)**

CMD* provides timing control within the cycle. The system board asserts CMD* on the rising edge of BCLK, simultaneously with negation of START*. The system board holds CMD* asserted until the end of the cycle. The end of the cycle normally is synchronized with the rising edge of BCLK, but in certain cases is asynchronous. A bus master does not drive CMD*.

W-R - (EISA Connector)

The status signal, W-R, identifies the cycle as a write (high) or read (low). W-R becomes valid after assertion of START* and before assertion of CMD*. W-R remains valid as long as address lines LA<31:2> are valid. W-R is driven from the same edge of BCLK that activates the START* signal.

BALE - (ISA Connector)

BALE (when high) indicates that a valid address is present on the LA<31:2> address lines. The LA<31:2> address lines or any decodes developed from them by ISA devices are latched (with transparent latches) on the trailing edge of BALE if the address is needed for the whole cycle. BALE is always high during a DMA or 16-bit ISA bus master operation. EISA devices should not use BALE to latch addresses; the trailing edge of START* or leading edge of CMD* should be used.

MRDC* - (ISA Connector)

The system board or ISA bus master asserts MRDC* to indicate that the addressed ISA memory slave should drive its data onto the memory bus. MRDC* is asserted for read accesses to memory, except when inhibited by assertion of EX32* or EX16* (an EISA device responded). During ISA Compatible DMA cycles, MRDC* is asserted for read accesses to memory addresses between 00000000h to 00FFFFFFh, regardless of the type of memory responding. A DMA device should not use MRDC* to decode its I/O address. MRDC* is also asserted for refresh cycles. MRDC* can be driven by an expansion board acting as an ISA 16-bit bus master.

MWTC* - (ISA Connector)

The system board or ISA bus master asserts MWTC* to indicate that the addressed ISA memory slave may latch data from the memory bus. MWTC* is asserted for write accesses to memory, except when inhibited by assertion of EX32* or EX16* (an EISA device responded). During Compatible DMA cycles, MWTC* is asserted for write accesses to memory addresses between 00000000h to 00FFFFFFh, regardless of the type of memory responding. A DMA device should not use MWTC* to decode its I/O address. MWTC* can be driven by an expansion board acting as an ISA 16-bit bus master.

SMWTC* - (ISA Connector)

The system board asserts SMWTC* to indicate that the addressed memory slave may latch data from the memory bus. SMWTC* is only asserted for ISA write accesses to memory addresses between 00000000h to 000FFFFFh. SMWTC* is derived from MWTC* and has similar timing.

SMRDC* - (ISA Connector)

The system board asserts SMRDC* to indicate that the addressed memory slave should drive its data onto the memory bus. SMRDC* is only asserted for ISA read accesses to memory addresses between 00000000h to 000FFFFFh or refresh cycles. SMRDC* is derived from MRDC* and has similar timing.

IOWC* - (ISA Connector)

A DMA device can latch data from the data bus when IOWC* is asserted. An ISA I/O slave latches data from the data bus when IOWC* asserted and AENx is negated. The main CPU or bus master must drive valid data on the bus before asserting IOWC*.

IORC* - (ISA Connector)

A DMA device can drive data on the data bus after sampling IORC* asserted. An ISA I/O slave drives data onto the bus while IORC* is asserted and AENx is negated (low). The device must hold the data valid until sampling IORC* negated.

CHRDY - (ISA Connector)

An ISA memory or I/O slave can negate CHRDY to lengthen a bus cycle from the default time. The slave negates CHRDY after decoding a valid address and sampling the command signal (MRDC*, MWTC*, SMRDC*, SMWTC*, IORC* or IOWC*) asserted. When the slave's access has completed, CHRDY should be allowed to float high (asserted). Bus cycles are lengthened by an integral number of BCLK cycles. The ISA command signals remain active at least one BCLK after the slave asserts CHRDY. CHRDY should be driven with an open collector type of driver, and should *never* be driven high. CHRDY may not be held low for more than 2.1 $\mu$s. EISA slaves should never negate CHRDY.

NOWS* - (ISA Connector)

An ISA memory slave asserts NOWS* (No Wait State) after its address and a command have been decoded to indicate that the remaining clock cycles are not required. NOWS* must be asserted before the falling edge of BCLK to be recognized during ISA cycles. During EISA cycles, an addressed EISA slave may assert NOWS* before the main CPU negates START* to generate COMPRESSED cycles (1.5 BCLKs/cycle). A slave should not assert NOWS* and negate EXRDY or CHRDY during the same cycle.

M16* - (ISA Connector)

M16* signals the system that the addressed ISA memory is capable of transferring 16 bits of data at once. When M16* is asserted, during a memory read or write and is not superceded by EX32* or EX16*, the ISA compatible three BCLK memory cycle is run. M16* is decoded from LA<23:17>. M-IO is not included in the decode and M16* should not be latched by the ISA slave. Only ISA memory slaves need to generate M16*; the system board generates M16* from EX32* or EX16* for EISA memory slaves. M16* should only be driven with an open-collector type of driver.

IO16* - (ISA Connector)

A 16-bit ISA I/O slave asserts IO16* (after decoding a valid address on SA<15:1>) to indicate its 16-bit data size. The system board defaults to a three BCLK I/O cycle when it samples IO16* asserted by an ISA I/O slave (EX32* and EX16* negated). IO16* should only be driven with an open-collector type of driver.

The system board does not automatically assert IO16* when a 16-bit ISA bus master accesses an EISA I/O slave. EISA slaves that support 16-bit ISA bus masters must assert IO16* as well as EX32* (or EX16*) when addressed. The EISA I/O slave asserts IO16* on decoding a valid address on LA<15:2>. EISA I/O slaves that do not support 16-bit ISA bus masters need not assert IO16*.

2.1.3 Bus Arbitration Signal Group

This section describes signals used to arbitrate for bus control. These signals are a combination of new EISA signals and existing ISA signals.

**MREQx* - (EISA Connector)**

MREQx* is a slot-specific signal used by EISA bus masters to request bus access. The "x" refers to the slot number. Bus masters requiring use of the bus must assert MREQx* until the system board grants bus access by asserting MAKx*. The requesting device must hold MREQx* asserted until the system board asserts the appropriate MAKx* signal. The system board samples MREQx* on the rising edge of BCLK. If MREQx* is sampled asserted, the arbitration controller performs the arbitration and the system board asserts MAKx* when the bus becomes available. The bus master can begin driving the bus with address and other signals on the falling edge of BCLK when MAKx* is sampled asserted.

When a bus master completes a transfer, it can release the bus by negating MREQx* on the falling edge of BCLK. If no bus cycle is in progress when MREQx* is negated, the bus master must float LA<31:2>, BE*<3:0>, MSBURST*, LOCK*, D<31:0>, START*, M-IO, and W-R on or before the rising edge of BCLK after MREQx* is negated. If a cycle is in progress when MREQx* is negated, then the LA<31:2>, BE*<3:0>, MSBURST*, LOCK*, START*, M-IO, and W-R signals must be floated by the rising edge of BCLK at the end of the cycle. The data signals D<31:0> must be floated on (EXRDY termination) or before (EX32* or EX16* termination) the falling edge of BCLK after the end of the cycle. Cycle completion is indicated by the memory or I/O slave asserting EXRDY or the system board asserting EX16* or EX32* after completing bus conversions. A bus master must wait at least two BCLKs after releasing the bus before re-asserting its MREQx*. The trailing edge of MREQx* must meet the setup and hold time to the sampling point for proper system operation.

**MAKx* - (EISA Connector)**

MAKx* is a slot-specific signal that is asserted by the system board to grant bus access to an EISA bus master. The "x" refers to the slot number. MAKx* is asserted from the rising edge of BCLK and the bus master can begin driving LA<31:2>, BE*<3:0>, MSBURST*, START*, M-IO, and W-R on the next falling edge of BCLK. The system board negates MAKx* on the rising edge of BCLK after sampling MREQx* negated. The system board can also negate MAKx* to indicate to an active bus master that another device has requested the bus. The bus master must negate MREQx* to release the bus within 64 BCLKs (8 $\mu$s) of sampling MAKx* negated.

DRQ<7:5>, DRQ<3:0> - (ISA Connector)

The DRQ<x> lines are used to request a DMA service from the DMA subsystem or for a 16-bit ISA bus master to request access to the system bus. The request is made when DRQ<x> is asserted. The system board allows DRQ<x> to be asserted asynchronously. The requesting device must hold DRQ<x> asserted until the system board asserts the appropriate DAK*<x> signal. For demand mode DMA memory-read I/O-write cycles, DRQ<x> is sampled on the rising edge of BCLK, one BCLK from the end of the cycle (the rising edge of IOWC*). For demand mode DMA memory-write I/O-read cycles, DRQ<x> is sampled on the rising edge of BCLK, 1.5 BCLKs from the end of the cycle (the rising edge of IORC*). For demand mode Burst DMA, DRQ<x> is sampled each cycle on the rising edge of BCLK. For 16-bit ISA bus masters, DRQ<x> is sampled on the rising edge of BCLK, two BCLKs before the system board negates DAK*<x>. The trailing edge of DRQ<x> must meet the setup and hold time to the sampling point for proper system operation.

**DAK*<7:5>, DAK*<3:0> - (ISA Connector)**

The system board asserts a DMA channel's DAK*<x> to indicate that the channel has been granted the bus. A DMA device is selected if it decodes DAK*<x> with IORC* or IOWC* asserted. DAK*<x> can also be used to acknowledge grant of bus access to a 16-bit ISA bus master. The bus master must assert MASTER16* after sampling DAK*<x> asserted. Address and cycle control signals must be floated and MASTER16* must be negated before the system board negates DAK*<x>. For EISA block or demand mode DMA transfers, DAK*<x> remains asserted until the transfer completes or until the centralized arbitration controller preempts the DMA process. The preemption occurs after another device requests the bus and 4 $\mu$s elapse.

T-C - (ISA Connector)

This signal is bidirectional, acting in one of two modes, depending on the programming of the channel. In the output mode, the system board asserts T-C to indicate that a DMA channel's word count has reached terminal count. Terminal count is indicated when the decrementing word count "rolls over" from zero to FFFFFFh. The system board asserts T-C only while asserting the channel's DAK*<x>. A DMA device decodes T-C with the appropriate DAK*<x> asserted to determine when the transfer has completed.

In the input mode, T-C can be used by a DMA slave to stop a DMA transfer. During ISA Compatible, Type "A", or Type "B", transfers, T-C is sampled by the system while IORC* or IOWC* is asserted. During Burst cycles, T-C is sampled at the same time as the DRQ<x> input, on the rising edge of BCLK. If it is sampled asserted the transfer is terminated, and if auto-initialize is programmed, the transfer restarts at the beginning.

**MASTER16* - (ISA Connector)**

A bus master asserts MASTER16* to indicate 16-bit data size. A bus master can assert MASTER16* after the system board asserts DAK*<x> or MAKx*. The 16-bit EISA bus master negates MASTER16* after completing the last transfer. An ISA master negates MASTER16*, immediately when the system board negates DAK*<x>. A 32-bit bus master can assert MASTER16* during START* to disable automatic 32-to-16-bit data size translation for 16-bit EISA memory Burst slaves. It canthen perform 16-bit Burst cycles to a 16-bit EISA slave.

**REFRESH* - (ISA Connector)**

REFRESH* is used to indicate (when low) a refresh cycle in progress. REFRESH* causes SA<15:0> (or LA<15:2>) to drive the row address inputs of all DRAM banks so that when MRDC* (or CMD*) is asserted, the entire system memory is refreshed at one time.

2.1.4 Utility Signal Group

This section describes a variety of general utility signals. These signals are all on the ISA connector.

OSC - (ISA Connector)

OSC is a clock for use in timing applications. Its frequency is 14.31818 MHz with a 50 percent duty cycle.

RESDRV - (ISA Connector)

Assertion of RESDRV causes a hardware reset of ISA and EISA expansion boards. RESDRV is asserted by the reset controller during power up or after a bus timeout. Software can cause assertion of RESDRV by setting I/O port 0461h bit 0 to a "1". RESDRV is negated when the software resets this bit to a zero. RESDRV has a minimum pulse width equivalent to 9 BCLK periods (the minimum time between two ISA I/O write cycles). All devices that can prevent operation of the CPU, memory or system board I/O must use RESDRV for hardware reset. Slaves that insert wait states based on internal state machines, devices that require software initialization, and DMA devices are examples of hardware that reset after sampling RESDRV asserted.

IRQ<15:14>, IRQ<12:9>, IRQ<7:3> - (ISA Connector)

The IRQx lines are used to interrupt the CPU to request some service. In compatible mode, the interrupt is recognized when IRQx goes from a low to a high and remains there until the appropriate interrupt service routine is executed. If programmed to level-sensitive mode, the interrupt is recognized when the IRQx signal is asserted (low). Another interrupt is generated at the end of the interrupt service routine if the IRQx signal is still held low, allowing a single line to be shared by more than one device. IRQ<15:3> are pulled up by the system board. A floated interrupt line is guaranteed to stabilize at a TTL "high" after 500 ns. Interrupt service routines must reset the interrupt latch (which floats the interrupt line), then wait at least 500 ns before issuing the end-of-interrupt command and enabling interrupts.

**IOCHK* - (ISA Connector)**

An EISA or ISA expansion board can assert IOCHK* to signal the main CPU that a serious error has occurred. Assertion of IOCHK* causes an NMI if Port 061h bit 3 is set to "1" and NMIs are enabled. Parity errors and uncorrectable system errors exemplify problems that might cause an expansion board to assert IOCHK*.

2.1.5 Summary of Signals

The following tabulation shows the EISA bus connector signals added for EISA support:

| Bus Pins | Signal Name | Description |
|---|---|---|
| 16 | D<31:16> | data lines |
| 8 | LA*<31:24> | address lines |
| 15 | LA<16:2> | address lines |
| 4 | BE*<3:0> | byte enables |
| 1 | LOCK* | bus lock |
| 1 | EX32* | 32-bit EISA slave indicator |
| 1 | EX16* | 16-bit EISA slave indicator |
| 1 | START* | EISA start of cycle control |
| 1 | CMD* | EISA end of cycle control |
| 1 | M-IO | EISA memory or I/O indicator |
| 1 | W-R | EISA write or read indicator |
| 1 | EXRDY | EISA ready indicator |
| 1 | MREQx* | slot specific bus request |
| 1 | MAKx* | slot specific bus grant |
| 1 | SLBURST* | Burst cycle indicator from slave |
| 1 | MSBURST* | Burst cycle control from master |
| 55 | | Total new pins on EISA connector |

2.1.6 Signal Usage by System, Masters and Slaves

The following three tables indicate typical signal usage by an EISA system board, ISA bus masters, ISA slaves, EISA bus masters and EISA slaves.

Table Legend:

| | | |
|---|---|---|
| I/O | = | Input and Output |
| I | = | Input |
| O | = | Output |
| - | = | Signal Not Needed |

Subscript "$_m$" indicates that one or more of the signals in the group may be implemented.

An I/O shown in parentheses () indicates that the signal is optional for this device.

The following notes are referenced in one signal usage tables:

1. SLBURST and MSBURST are implemented together or both are omitted.
2. Only DMA devices that implement Burst cycles use EXRDY.
3. EISA DMA devices can be 8-, 16-, or 32-bits wide.

4. ISA DMA device can be either 8- or 16-bits wide.

5. DMA devices need not monitor BE* <3:0> unless they support partial-width data transfers.

6. Only EISA slaves that support COMPRESSED cycles assert NOWS*.

7. EISA I/O slaves that need to be accessed by 16-bit ISA bus master must assert IO16* when addressed.

8. An 8-bit memory slave is assumed to only decode the SA<19:0> address lines (1 megabyte maximum address). If a full decode is done, LA<23:17>, MRDC*, IORC*, and BALE are also used.

9. BCLK is only required if the slave device supports Burst cycles or uses EXRDY.

10. A 16-bit EISA bus master thatdoes not drive the full 32-bit address will be limited to 16 megabyte addressing.

11. A 32-bit EISA bus Burst master thatcan "downshift" to a 16-bit EISA Burst memory slave asserts MASTER16* during START*.

EISA/ISA Signal Usage - System Board +

| Signal Name | System Board | Signal Name | System Board |
|---|---|---|---|
| AENx | O | M-IO | I/O |
| BALE | O | M16* | I/O |
| BCLK | O | MAKx* | O |
| BE*<3:0> | I/O | MASTER16* | I |
| CHRDY | I/O | MRDC* | I/O |
| CMD* | O | MREQx* | I |
| D<31:0> | I/O | MSBURST* | I/O |
| DAK*<7:0> | O | MWTC* | I/O |
| DRQ<7:0> | I | NOWS* | I |
| EX16* | I/O | OSC | O |
| EX32* | I/O | REFRESH* | I/O |
| EXRDY | I/O | RESDRV | O |
| IO16* | I | SA<19:0> | I/O |
| IOCHK* | I | SBHE* | I/O |
| IORC* | I/O | SLBURST* | I |
| IOWC* | I/O | SMRDC* | O |
| IRQ<15:3> | I | SMWTC* | O |
| LA*<31:24> | I/O | START* | I/O |
| LA<23:2> | I/O | T-C | I/O |
| LOCK* | O | W-R | I/O |

+ The signals listed are required to support EISA functions. Additional signals are required if the system board also contains EISA or ISA slaves.

ISA Signal Usage - ISA Expansion Boards

| Signal Name | ISA Bus Master | ISA 16-bit Mem Slave | ISA 16-bit I/O Slave | ISA 8-bit Mem Slave | ISA 8-bit I/O Slave | ISA DMA Device | Notes |
|---|---|---|---|---|---|---|---|
| AENx | - | - | I | - | I | - | |
| BALE | - | I | - | (I) | - | - | 8 |
| BCLK | (I) | (I) | (I) | (I) | (I) | (I) | |
| CHRDY | I | (O) | (O) | (O) | (O) | - | |
| D<7:0> | I/O | I/O | I/O | I/O | I/O | I/O | 4 |
| D<15:8> | I/O | I/O | I/O | - | - | (I/O) | 4 |
| DAK*<7:0> | $I_m$ | - | - | - | - | $I_m$ | |
| DRQ<7:0> | $O_m$ | - | - | - | - | $O_m$ | |
| IO16* | I | - | O | - | - | - | |
| IOCHK* | (O) | (O) | (O) | (O) | (O) | (O) | |
| IORC* | O | - | I | - | I | I | |
| IOWC* | O | - | I | - | I | I | |
| IRQ<15:3> | $(O_m)$ | $(O_m)$ | $(O_m)$ | $(O_m)$ | $(O_m)$ | $(O_m)$ | |
| LA<23:17> | O | I | - | (I) | - | - | 8 |
| M16* | I | O | - | - | - | - | |
| MASTER16* | O | - | - | - | - | - | |
| MRDC* | O | I | - | (I) | - | - | 8 |
| MWTC* | O | I | - | (I) | - | - | 8 |
| NOWS* | - | (O) | - | (O) | (O) | - | |
| OSC | (I) | (I) | (I) | (I) | (I) | (I) | |
| REFRESH* | (O) | I | - | I | - | - | |
| RESDRV | I | I | I | I | I | I | |
| SA<16:0> | O | I | I | I | I | - | |
| SA<19:17> | - | (I) | - | (I) | - | - | 8 |
| SBHE* | O | I | I | - | - | - | |
| SMRDC* | - | - | - | I | - | - | |
| SMWTC* | - | - | - | I | - | - | |
| T-C | - | - | - | - | - | (I) | |

EISA connector signals are not used by ISA expansion boards and are not included in the preceding table.

EISA/ISA Signal Usage - EISA Expansion Boards

| Signal Name | 32-bit EISA Bus Master | 32-bit EISA Mem Slave | 32-bit EISA I/O Slave | 16-bit EISA Bus Master | 16-bit EISA Mem Slave | 16-bit EISA I/O Slave | EISA DMA Device | Notes |
|---|---|---|---|---|---|---|---|---|
| AENx | - | - | I | - | - | I | - | |
| BCLK | I | (I) | (I) | I | (I) | (I) | (I) | 9 |
| BE*<3:0> | O | I | I | O | I | I | (I) | 5 |
| CMD* | - | I | I | - | I | I | - | |
| D<7:0> | I/O | I/O | I/O | I/O | I/O | I/O | I/O | |
| D<15:8> | I/O | I/O | I/O | I/O | I/O | I/O | (I/O) | 3 |
| D<31:16> | I/O | I/O | I/O | - | - | - | (I/O) | 3 |
| DAK*<7:0> | - | - | - | - | - | - | $I_m$ | |
| DRQ<7:0> | - | - | - | - | - | - | $O_m$ | |
| EX16* | - | - | - | I | O | O | - | |
| EX32* | I | O | O | I | - | - | - | |
| EXRDY | I | (O) | (O) | I | (O) | (O) | I | 2 |
| IO16* | - | - | (O) | - | - | (O) | - | 7 |
| IOCHK* | (O) | (O) | (O) | (O) | (O) | (O) | (O) | |
| IORC* | - | - | - | - | - | - | I | |
| IOWC* | - | - | - | - | - | - | I | |
| IRQ<15:3> | ($O_m$) | ($O_m$) | ($O_m$) | ($O_m$) | ($O_m$) | ($O_m$) | ($O_m$) | |
| LA<15:2> | O | I | I | O | I | I | - | |
| LA<23:16> | O | I | - | O | I | - | - | |
| LA*<31:24> | O | I | - | (O) | I | - | - | 10 |
| LOCK* | (O) | (I) | (I) | (O) | (I) | (I) | - | |
| M-IO | O | I | I | O | I | I | - | |
| MAKx* | I | - | - | I | - | - | - | |
| MASTER16* | (O) | - | - | O | - | - | - | 11 |
| MREQx* | O | - | - | O | - | - | - | |
| MSBURST* | (O) | (I) | - | (O) | (I) | - | - | 1 |
| NOWS* | - | (O) | (O) | - | (O) | (O) | - | 6 |
| OSC | (I) | (I) | (I) | (I) | (I) | (I) | (I) | |
| REFRESH* | - | I | - | - | I | - | - | |
| RESDRV | I | I | I | I | I | I | I | |
| SLBURST* | (I) | (O) | - | (I) | (O) | - | - | 1 |
| START* | O | I | I | O | I | I | - | |
| T-C | - | - | - | - | - | - | (I/O) | |
| W-R | O | I | I | O | I | I | - | |

Many ISA signals are not used by EISA expansion boards and are not included in the preceding table.

2.2 ISA Cycles

2.2.1 CPU CYCLES

ISA systems provide different timing for cycles to and from 8- and 16-bit memory and I/O slaves. ISA systems generate a default 6 BCLK memory or I/O cycle for 8-bit slaves and a default 3 BCLK memory or I/O cycle for 16-bit slaves. All cycles can be extended by the slave by negating CHRDY. Additionally, memory or I/O slaves can shorten most cycles (except 16-bit I/O cycles) by asserting NOWS*. If both CHRDY is negated and NOWS* is asserted, then wait states will be added.

ISA cycles begin with the system presenting a valid address on LA<23:17>, and one BCLK period later, asserting BALE and presenting a valid SA<19:0> address.

For 16-bit memory accesses, the system asserts MRDC*, MWTC*, SMRDC*, or SMWTC* on the first rising BCLK edge after SA<19:0> become valid. For 8-bit memory accesses, and for all I/O accesses, the system delays an extra one-half BCLK period before asserting the ISA command signal to allow extra time for address decode.

During write cycles, the system presents valid data on the first rising BCLK edge after SA<19:0> become valid. The slave can latch the data after the specified data valid delay or on the trailing edge of the ISA command signal. During read cycles, a slave presenting valid data, drives the data bus after receiving the ISA command signal. The system latches the read data on the edge of BCLK on which the ISA command signal is negated.

NOWS* is sampled on each falling edge of BCLK during the time that the ISA command signal is asserted. This allows 8-bit slaves to shorten a standard 6 BCLK cycle to a 3, 4 or 5 BCLK cycle. A 16-bit memory slave can shorten a standard 3 BCLK cycle to a 2 BCLK cycle. A 16-bit I/O slave cannot shorten cycles, since the ISA command signal is delayed one-half BCLK period; therefore, NOWS* cannot be generated early enough to shorten the cycle.

Systems built according to the EISA specification implement a sampling window for CHRDY, instead of a distinct sample point. To guarantee the insertion of one wait state, CHRDY must be held negated for a minimum time period while BCLK is high. If CHRDY is negated before the rising edge of BCLK, it must be held for the specified hold time past the rising edge. If CHRDY is negated after the rising edge of BCLK, then it must be held negated for a specified pulse width. In either case, CHRDY may then be re-asserted with setup to the next rising BCLK edge. Negation and assertion of CHRDY must meet the pulse width, setup and hold time requirements specified in the ISA signal timing parameter table.

Figure 1 - CHRDY "Sample Window"

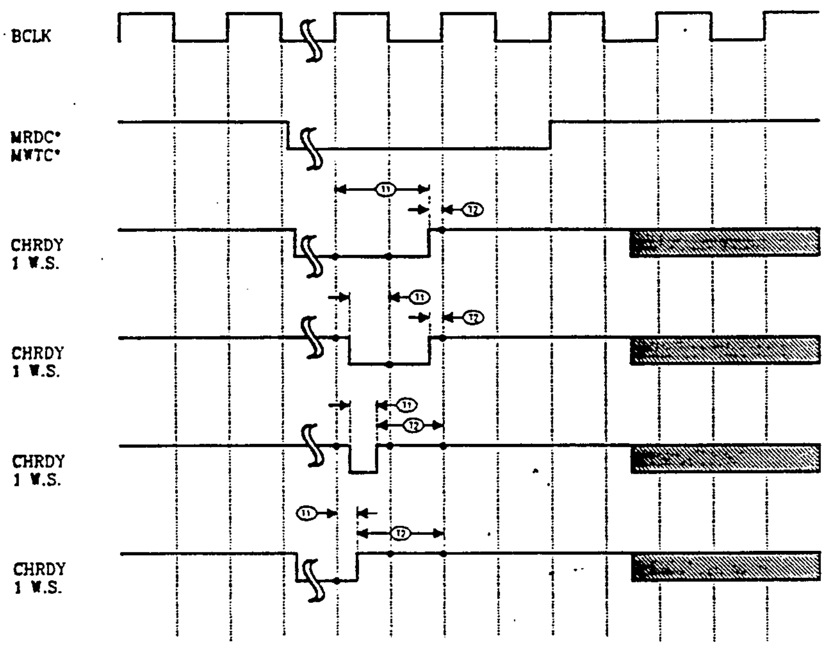

NOTES:

1. T1 = CHRDY negated hold time.
2. T2 = CHRDY asserted setup to BCLK rising edge.
3. See ISA Bus Timing Parameters for specific timing values.

The CPU or master can extend the length of the cycle beyond the minimum requirements indicated by the slave by keeping the ISA command signals asserted. Both memory and I/O slaves are required to extend the end of the cycle until the ISA command signals are negated.

The system indicates the size of a memory or I/O transfer being attempted by using SBHE* and SA<0>. The following table shows the size of transfer for each combination and which byte lane contains the data. Byte lanes not included in this table must not be driven by the slaves during read cycles, and must be left unmodified during write cycles.

| SBHE* | SA0 | SIZE | BYTE LANES |
|---|---|---|---|
| 0 | 0 | 2 | D<15:8>, D<7:0> |
| 0 | 1 | 1 | D<15:8> |
| 1 | 0 | 1 | D<7:0> |
| 1 | 1 | 0 | |

2.2.2 MEMORY SLAVES

Memory slaves can be either 8- or 16-bits wide. An 8-bit memory slave can use either 20 address bits (SA<19:0>) or 24 address bits (LA<23:17>, SA<19:0>). When using 20 address bits, the 8-bit slave must use SMRDC* and SMWTC* to guarantee that only cycles to the first 1 MB of memory will be performed. A 16-bit memory slave must use 24 address bits and normally uses MRDC* and MWTC*.

A 16-bit memory slave asserts M16* after decoding LA<23:17>. The decode for M16* must not include SA<19:0>, SBHE*, or any other control signals, since the timing requirements for M16* cannot be assured if control signals are included.

Memory slaves can shorten default cycles by asserting NOWS*, or extend them by negating CHRDY. However, the slave cannot control the maximum length of any cycle, and is required to extend the length of write cycles and to hold read data valid on the bus until the ISA command signals are negated.

2.2.3 I/O SLAVES

I/O slaves can be either 8- or 16-bit wide. I/O slaves decode addresses SA<9:0> and AENx. A 16-bit I/O slave asserts IO16* when it decodes a valid address with AENx low. The decode for IO16* should not include any control signals.

I/O slaves can shorten default 8-bit cycles by asserting NOWS*, or extend 8- or 16-bit cycles by negating CHRDY. However, the slave cannot control the maximum length of any cycle, and is required to extend the length of write cycles and to hold read data valid on the bus until the ISA command signals are negated.

2.2.4 BUS MASTERS

The ISA bus master device driver programs a DMA channel for cascade mode. The ISA bus master asserts DRQ<x> for that channel to request control of the bus. The system board performs the bus arbitration and asserts DAK*<x>, granting control of the bus to the 16-bit ISA bus master and disabling the system board address, data, and control lines. The system board does not assert AENx during DAK*<x> to disable I/O accesses. Consequently, an ISA bus master can perform normal I/O and slot-specific I/O accesses. BALE is asserted with DAK*<x> to indicate valid address on the LA<31:2> bus.

An ISA bus master asserts MASTER16*, but this line is ignored in EISA systems. The ISA bus master then waits at least one BCLK before driving address, data, and control lines to allow the system board to float its drivers. An ISA bus master presents LA<23:17> and SA<19:0>, driving the same address on LA<19:17> and SA<19:17>. ISA bus masters cannot pipeline addresses since the system board holds BALE asserted while the ISA bus master drives the bus.

EISA does not assume that ISA masters are synchronized to BCLK. The EISA system board assumes that they are asynchronous. However, ISA masters should synchronize control signals to BCLK if they are required to be compatible with ISA slaves designed prior to the EISA specification which generate wait states synchronous with BCLK.

EISA requires that all ISA masters monitor CHRDY and add wait states when CHRDY is negated. An ISA master may optionally use NOWS* to shorten default cycles. If both NOWS* is asserted and CHRDY is negated, then the ISA master must insert wait states.

If an ISA master must run refresh cycles without releasing the bus, then it floats the address buses and command lines and asserts REFRESH* with an open collector type driver. The master must then wait for 1 BCLK period after MRDC* has been asserted and negated before floating REFRESH* and driving the address and command buses. EISA systems require ISA masters to wait for the end of MRDC* before regaining the bus during refresh cycles, if proper operation is to be assured.

An ISA bus master releases the bus by floating its address, data, and control signals, negating DRQ<x> and floating MASTER16*. The system board samples DRQ<x> negated on the rising edge of BCLK. The system board negates DAK*<x> on the third rising edge of BCLK after sampling DRQ<x> negated. The ISA bus master negates (floats) MASTER16* (if still asserted) when it samples DAK*<x> negated. On the next BCLK the system board asserts the bus grant signal for the device that wins the bus arbitration.

ISA bus masters use the same combinations of SBHE* and SA<0> as indicated for CPU cycles to indicate the size of the transfer and the location of the data. It is the bus master's responsibility to convert 16-bit transfers into two 8-bit transfers if a 16-bit slave does not respond. However, the system board will provide data copying from D<7:0> to D<15:8> for odd-address reads from a byte slave, and from D<15:8> to D<7:0> for odd-address writes to a byte slave.

2.3 ISA CPU and Bus Master Cycles

The following comments apply to all ISA cycle description diagrams:

Note 1: Heavy black lines indicate the transfer of control from one bus master to another.

Note 2: Shaded areas indicate a "don't care" signal state.

Note 3: Black dots indicate signal sampling points.

2.3.1 8-bit Memory Cycles

Figures 2, 3, and 4 show the relevant signals for standard cycle (6 BCLK), one wait state ISA Cycle (7 BCLK), and no wait state cycle (3 BCLK) memory accesses to 8-bit ISA slaves.

Figure 2 - Memory Access to 8-bit ISA Slave - Standard Cycle (6 BCLK)
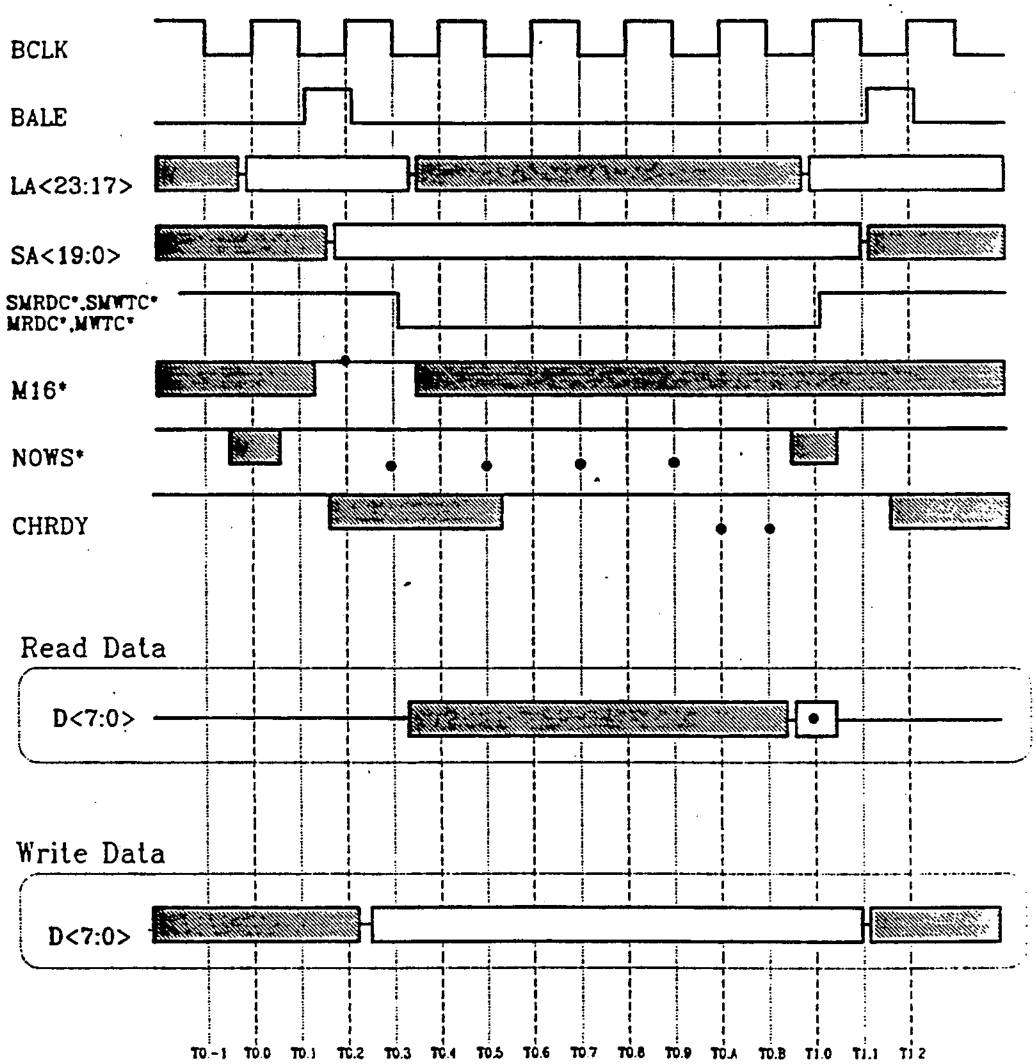

EXTENDED INDUSTRY STANDARD ARCHITECTURE
CONFIDENTIAL INFORMATION OF BCPR SERVICES, INC.
Figure 3 - Memory Access to 8-bit ISA Slave (7 BCLK)
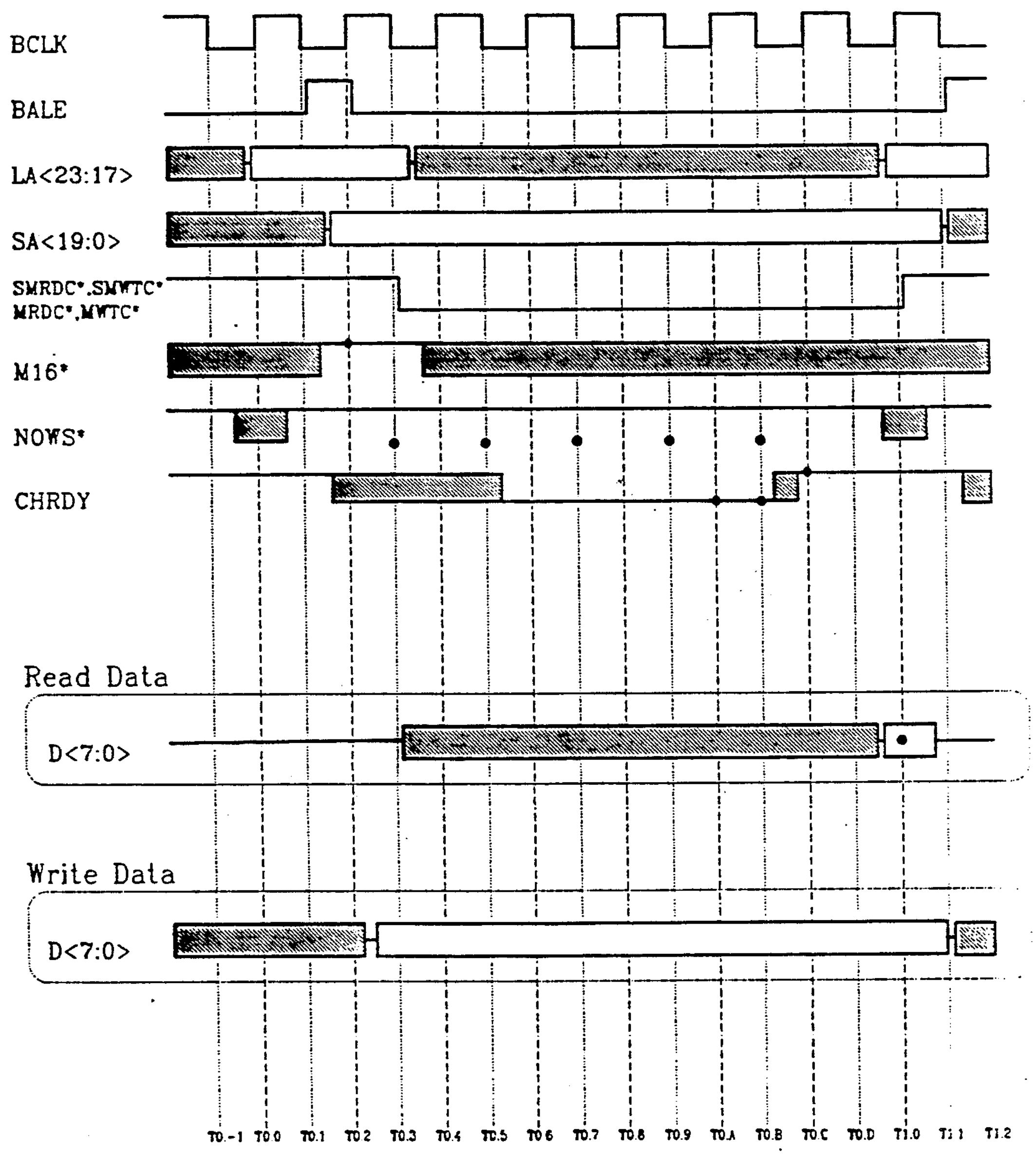

Figure 4 - Memory Access to 8-bit ISA Slave (3 BCLK)
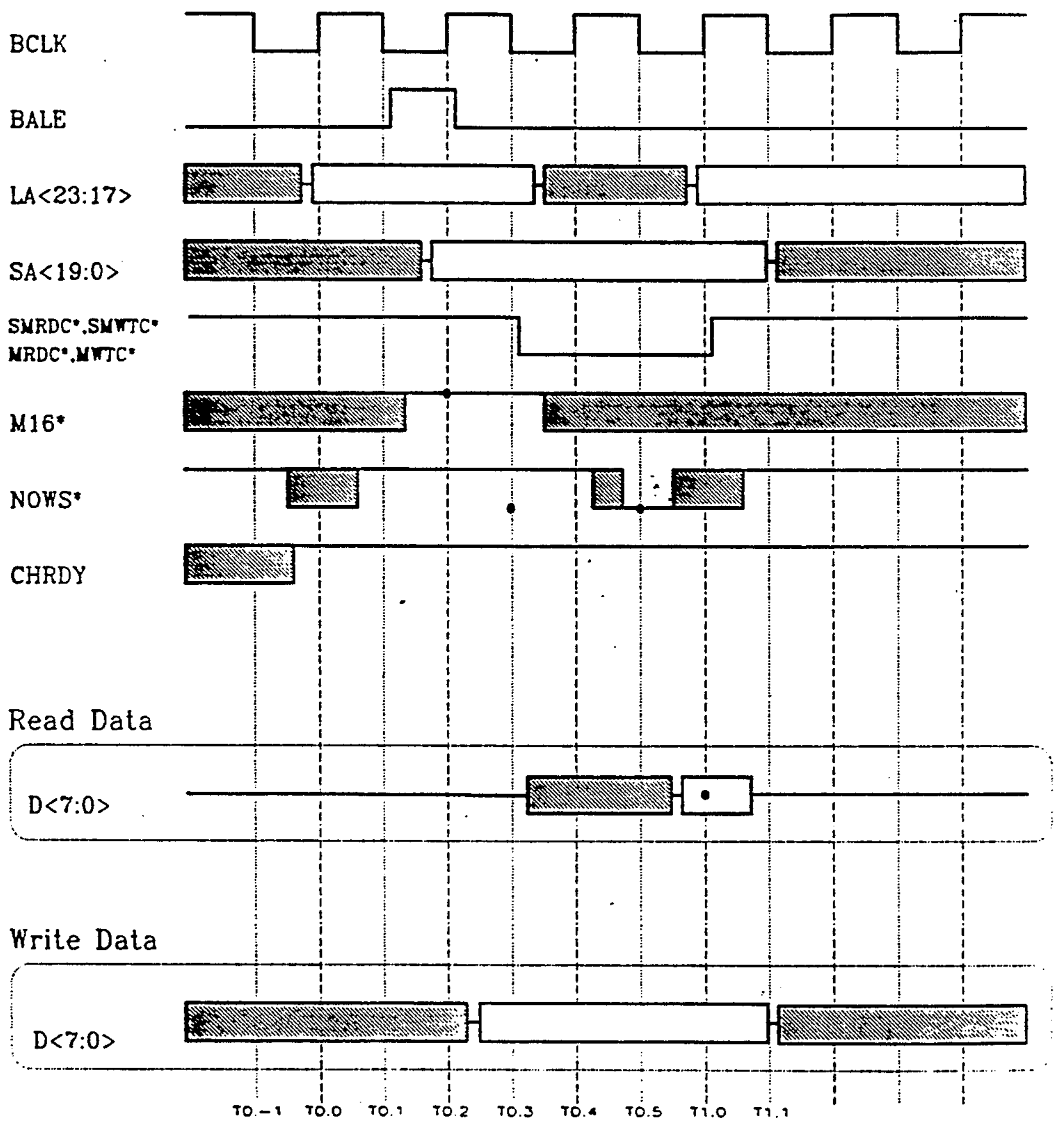

2.3.2 8-bit I/O Cycles

Figures 5, 6, and 7 show the relevant signals for standard cycle (6 BCLK), one wait state ISA cycle (7 BCLK), and no wait state cycle (3 BCLK) I/O, byte accesses to 8-bit ISA slaves.

Figure 5 - I/O Access to 8-bit ISA Slave - Standard Cycle (6 BCLK)
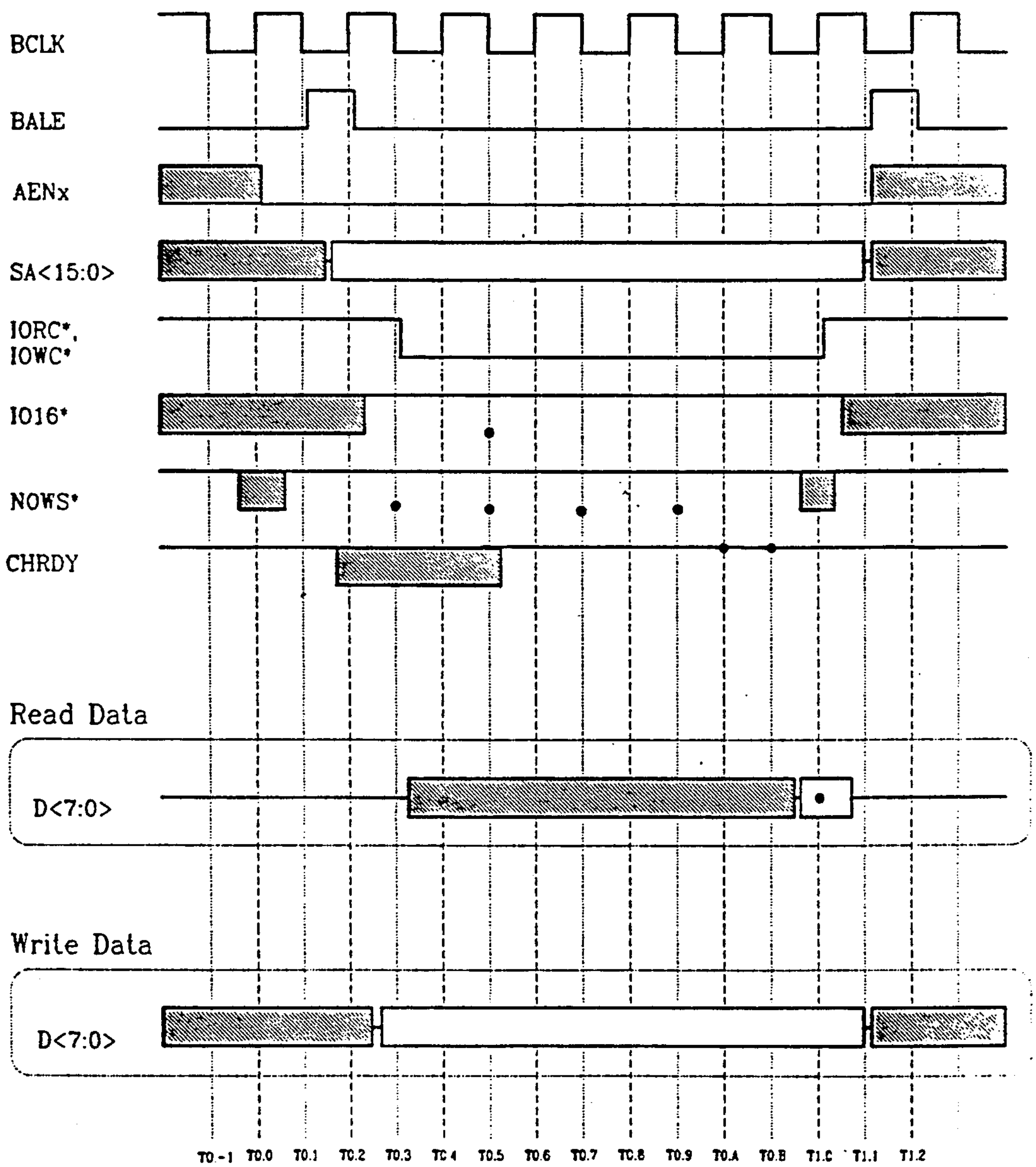

Figure 6 - I/O Access to 8-bit ISA Slave (7 BCLK)
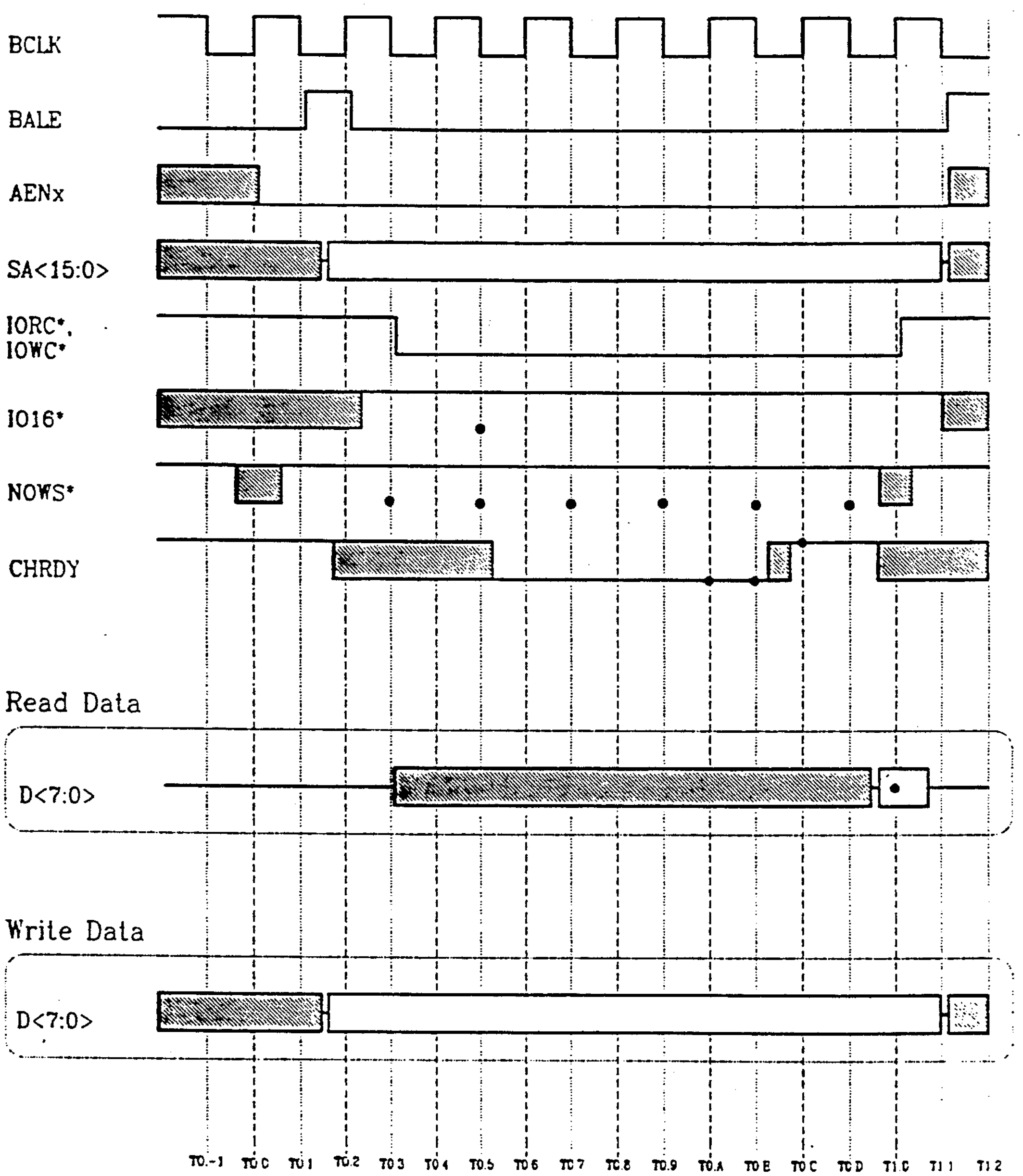

Figure 7 - I/O Access to 8-bit ISA Slave (3 BCLK)
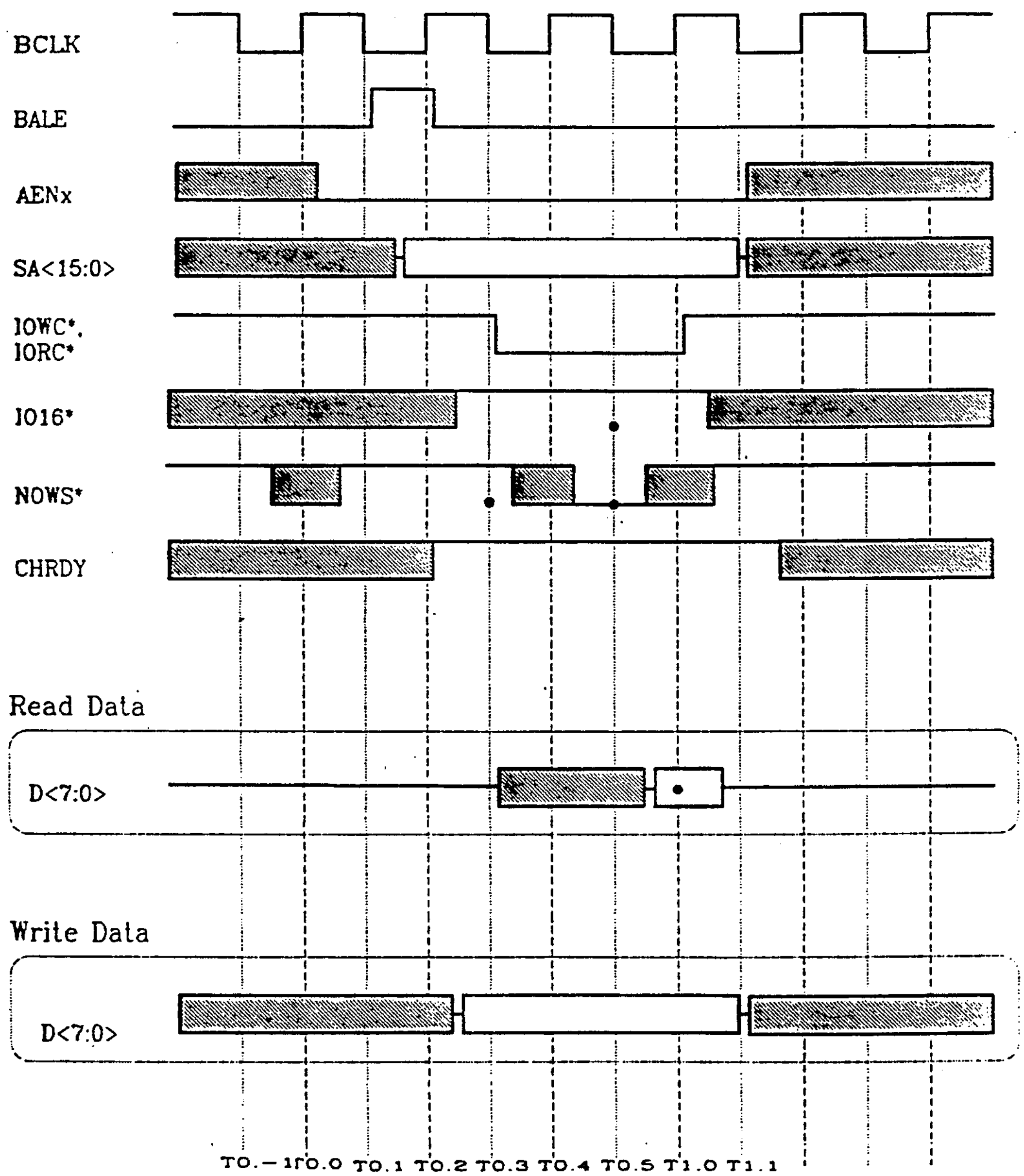

2.3.3 16-bit Memory Cycles

Figures 8, 9, and 10 show the relevant signals for standard cycle (3 BCLK), three wait state ISA cycle (6 BCLK) , and no wait state cycle (2 BCLK) memory, word accesses to 16-bit slaves.

Figure 8 - Memory Access to 16-bit ISA Slave - Standard Cycle (3 BCLK)
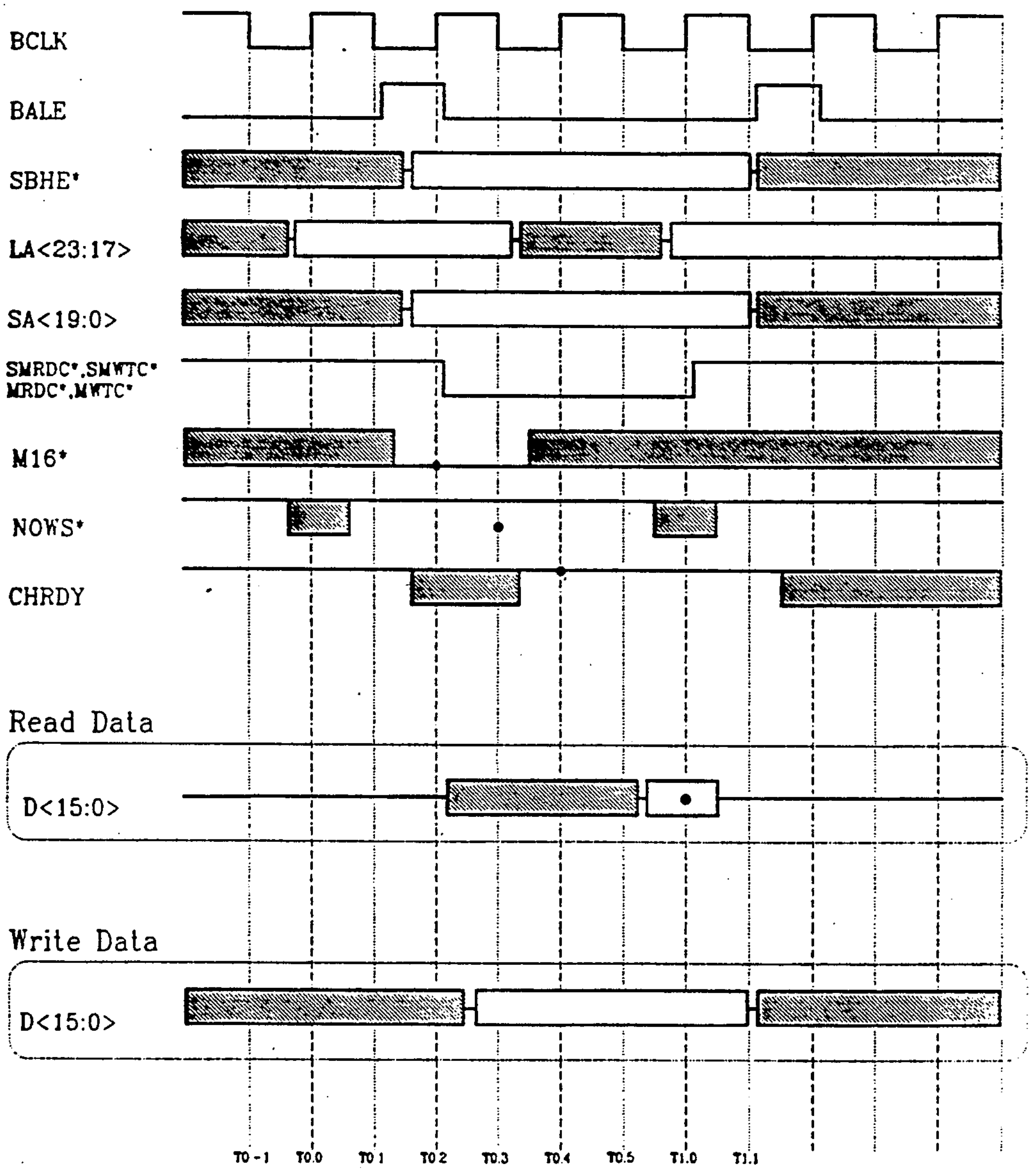

Figure 9 - Memory Access to 16-bit ISA Slave (6 BCLK)
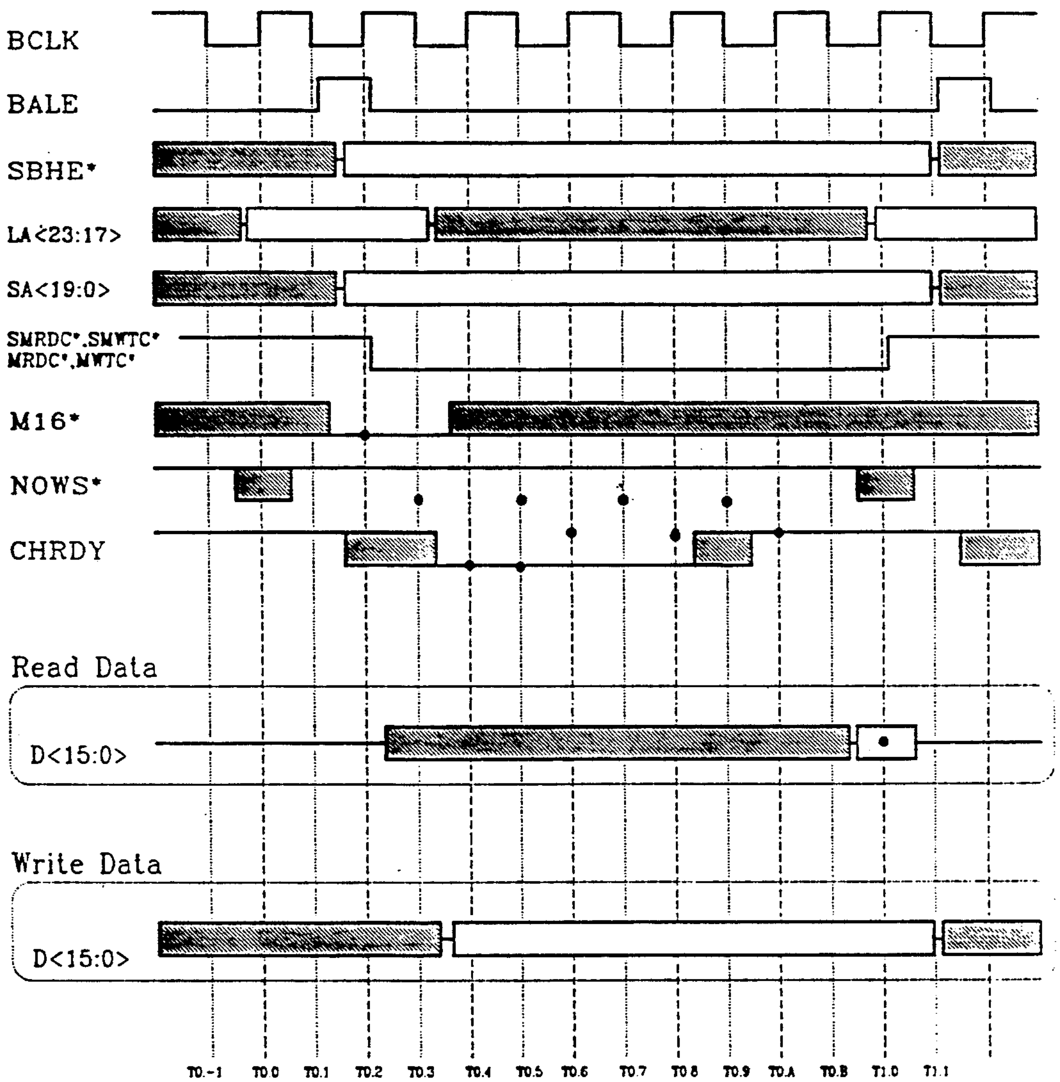

Figure 10 - Memory Access to 16-bit ISA Slave (2 BCLK)
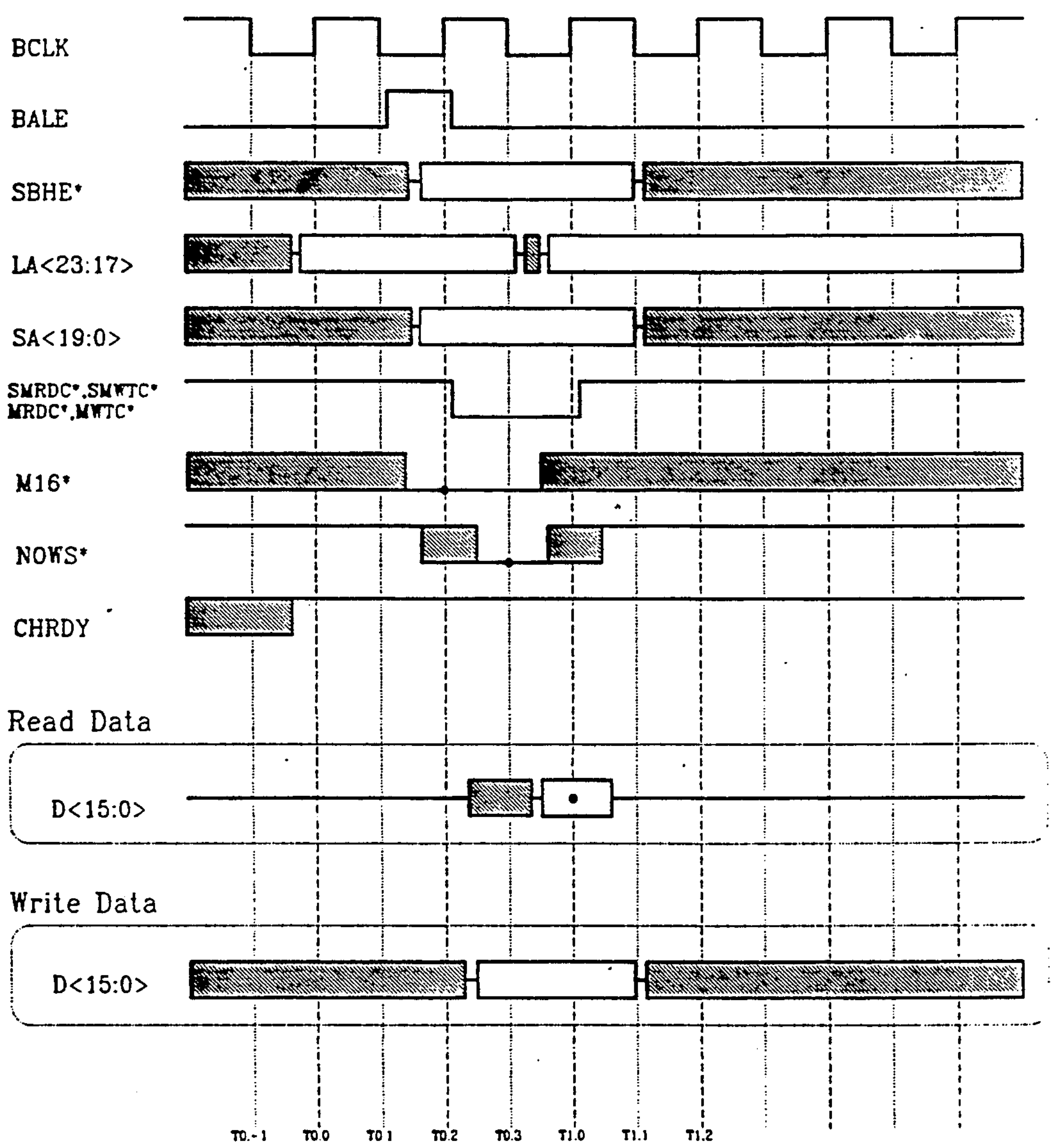

2.3.4 16-bit I/O Cycles

Figures 11 and 12 show the relevant signals for standard cycle (3 BCLK) and three wait state ISA cycle (6 BCLK) I/O word accesses to 16-bit ISA slaves.

Figure 11 - I/O Access to 16-bit ISA Slave - Standard Cycle (3 BCLK)
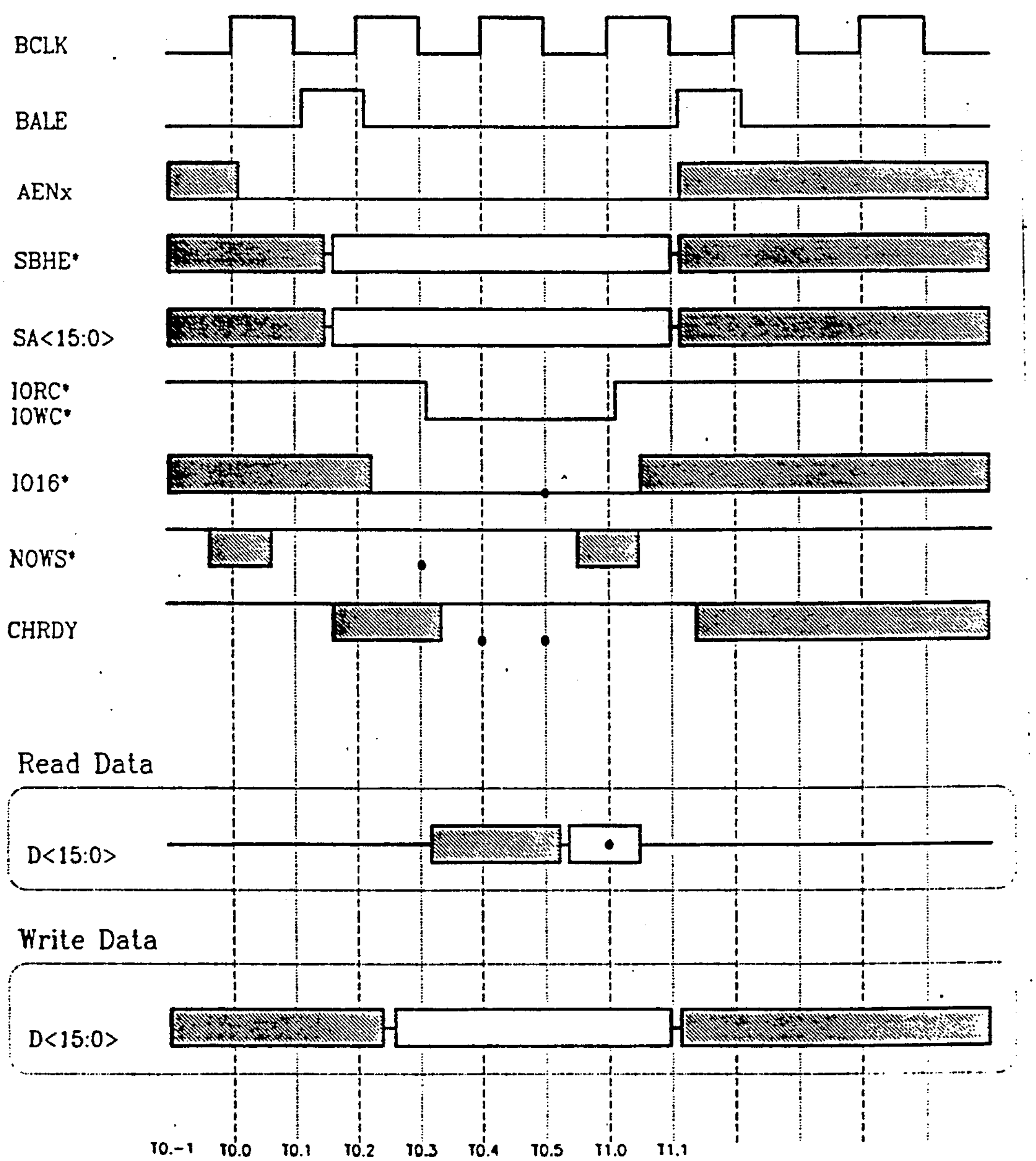

EXTENDED INDUSTRY STANDARD ARCHITECTURE
CONFIDENTIAL INFORMATION OF BCPR SERVICES, INC.
Figure 12 - I/O Access to 16-bit ISA Slave (6 BCLK)
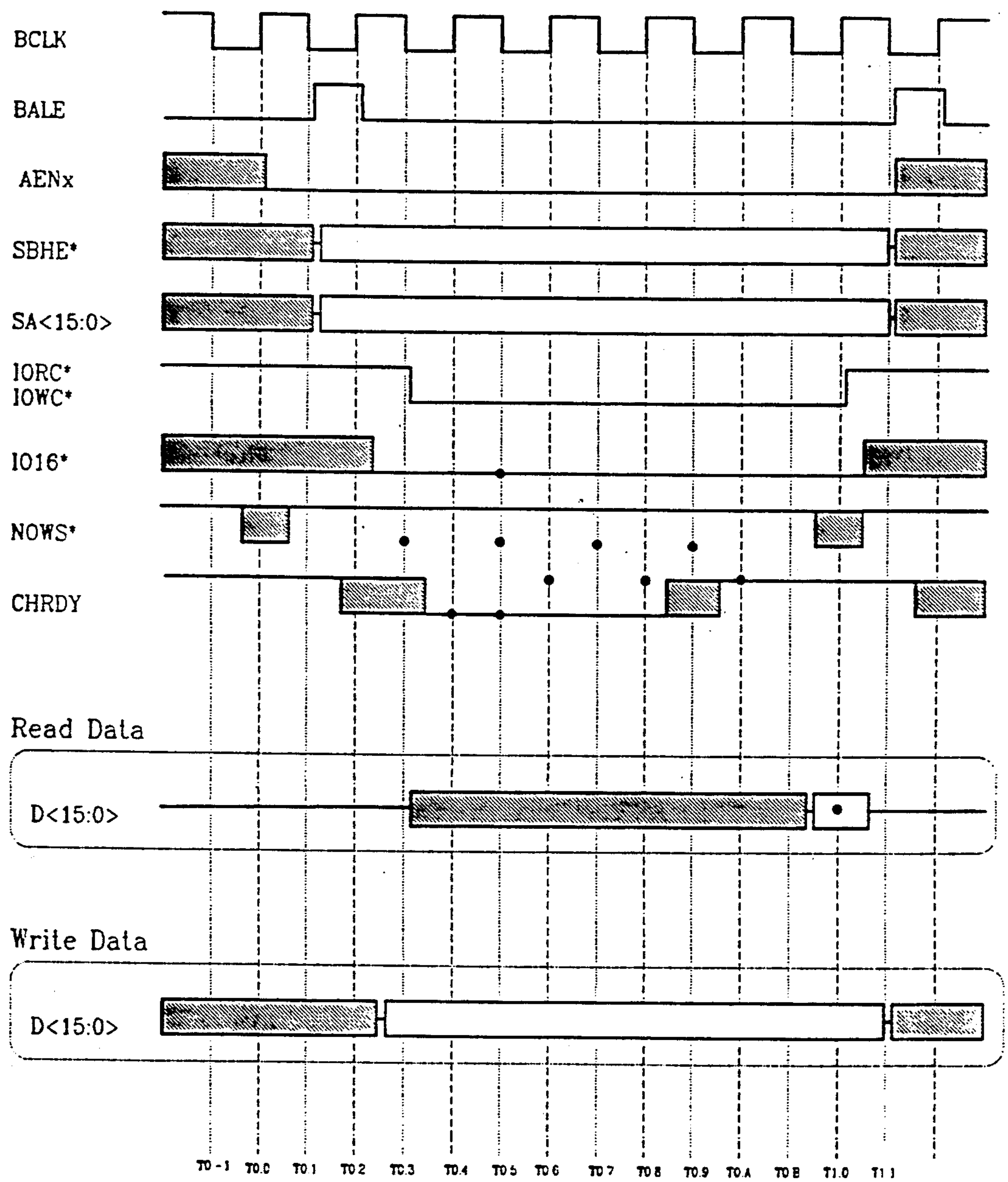

2.4 EISA CPU and Bus Master Cycles

EISA systems provide standard, COMPRESSED and Burst cycle types for data transfers between the main CPU and memory or I/O slaves. EISA bus masters may use standard and Burst cycles, but may not use COMPRESSED cycles.

The following notes apply to the EISA cycle description diagrams:

Note 1: Heavy black lines indicate the transfer of control from one bus master to another.

Note 2: Shaded areas indicate a "don't care" signal state.

Note 3: Black dots indicate signal sampling points.

2.4.1 Standard Memory and I/O Cycles

The standard EISA cycle type completes one transfer each two BCLK periods (zero-wait-state). It can be used to transfer data to or from an EISA memory or I/O slave. Each wait state adds one BCLK period. The total transfer time can be calculated with the following formula:

Total Transfer = $N^*(2+T_W)^*$(1 BCLK period)

Where:

$T_W$ = number wait states in each bus cycle
N = number of bus cycles for transfer For example, an uninterrupted standard transfer of 256 bytes (64 dwords) completes in 15.4 $\mu$s for a 32-bit transfer and an 8.33 MHz BCLK. A 16-bit transfer completes in 30.8 $\mu$s. This example assumes that no preempts occur during the transfer.

Standard EISA cycles begin with the CPU or bus master presenting a valid address on LA<31:2> and asserting M-IO to indicate a memory or I/O cycle. The address can become valid before the end of the previous cycle to allow address pipelining. The memory or I/O slave decodes the address and asserts the appropriate signals to indicate the type of slave and whether or not it can perform any special timings. The memory or I/O slave asserts EX32* or EX16* to indicate support of EISA cycles. An I/O slave must also decode AENx negated (low) to determine a valid address.

The CPU or bus master asserts START* to indicate the end of the previous cycle and to indicate that the new cycle is now on the bus. The master also asserts W-R to indicate a read or write cycle and BE*<3:0> to indicate the bytes being transferred and their location on the EISA bus. 16-bit transfers use BE*<3:2> (address A1=1) as well as BE*<1:0> (address A1=0) to indicate the bytes to be transferred even though only the low 16-bits of the data bus are used. LA<31:2> and BE*<3:0> remain valid until after negation of START*. A slave that needs to latch the address does so on the trailing edge of START*.

The system board asserts CMD* simultaneously with negation of START* to control the data transfer to or from the slave. If a read cycle is being performed, the slave presents the requested data when CMD* is asserted and holds it valid until CMD* is negated by the system board. For a write cycle, the CPU or bus master presents the data prior to assertion of CMD* and the slave latches it on or before the trailing edge of CMD*. The duration of START* and CMD* may vary, depending on the type and speed of the devices performing the transfer.

Wait states can be added to the cycle by slow EISA memory or I/O devices. The slave negates EXRDY after it decodes a valid address and samples START* asserted. The slave may hold EXRDY negated for a maximum of 2.5 μs to complete the transfer, but must release EXRDY synchronous to the falling edge of BCLK to allow the cycle to complete.

The slave *must* allow EXRDY to float high (asserted) synchronously with the BCLK falling edge and must not hold EXRDY negated longer than 2.5 μs.

An EISA I/O slave must assert IO16* as well as EX32* (or EX16*) when addressed if 16-bit ISA bus master compatibility is necessary. IO16* is asserted after decoding a valid address on the LA<31:2> address bus and is latched while CMD* is asserted. M-IO is not included in the address decode for IO16*. EISA I/O slaves that do not need 16-bit ISA bus master compatibility may assert EX32* (or EX16*) only.

The system board develops M16* from EX32* (or EX16*) to assure compatibility with ISA bus masters. An EISA memory slave should not drive M16*.

EISA standard memory and I/O cycles are illustrated in flow diagrams. The flow diagram is a hybrid diagram combining aspects of flow charts and timing diagrams. The flow diagram is intended to demonstrate the basic concepts for various cycles performed on the EISA bus. At least one sample of every possible "action" (such as wait states and Burst termination) is provided, although, of course, every possible combination of bus cycle is not shown.

The flow diagrams consist of flow-chart-like blocks and arrows, with board-specific actions enclosed in the blocks. Line types (solid, dotted, bold) are used to differentiate between the parts of the system involved (such as system board, slave, and bus controller). The flow diagram is divided into horizontal sections, each section representing the BCLK edge or level during which the enclosed action occurs. Note that at the beginning of many cycle types BCLK may not be active. In this case the BCLK states are drawn with dotted lines.

Flow diagrams do not follow the conventions of normal flow charts in that there is no "decision" block. In essence, the flow diagrams answer a question such as "To design a 32-bit one-wait-state EISA memory board, what signals apply during an access to the board." The designer would then follow the flow diagrams for accesses to 32-bit memory, and when a branch labeled "Wait states needed," appeared that branch would be followed to add the desired number wait states.

Flow diagrams should be used to gain an initial understanding of the EISA bus cycles. They also provide a means of following the sequence of signals when reading the timing diagrams. Once the designer understands the basic cycle types, specific information on timing and special cases should be obtained from the timing diagrams themselves. In the event of a conflict of information, the timing diagrams should be assumed to be correct.

Figure 13:
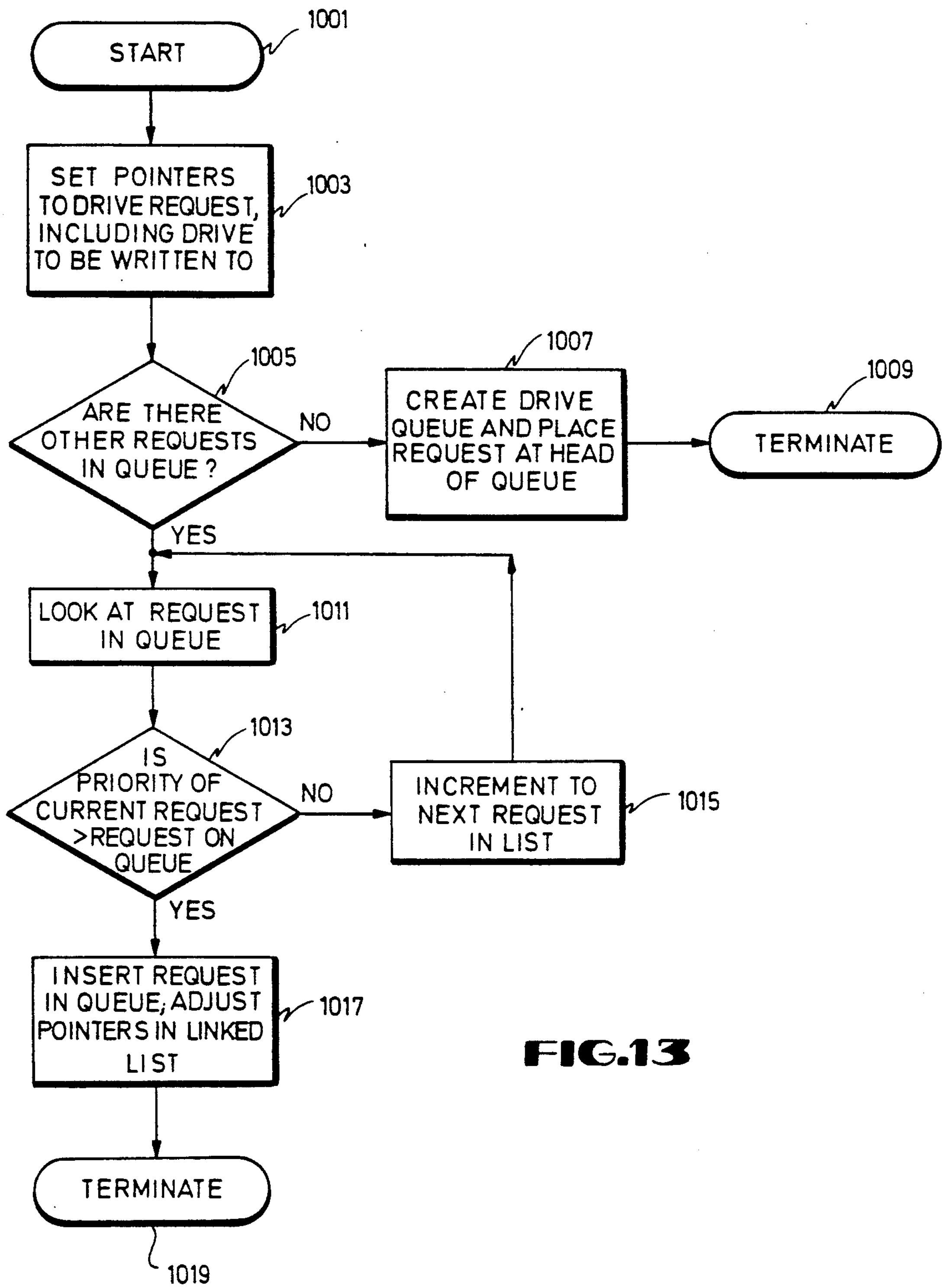
FIG. 13 is a flow diagram depicting the manner in which I/O requests are submitted to the disk array controller of the present invention.

Figures 13 and 14 illustrate the flow of a data transfer from a 32-bit master to 32-bit slave memory (read and write cycles). The figures include standard and COMPRESSED cycles. Data transfers from a 16-bit master to a 16-bit slave are the same except for the use of EX16* instead of EX32*.

Figure 15 shows the relevant signals for 2 and 3 BCLK EISA slave accesses.

Figure 13 - 32-bit Master to 32-bit Slave Memory Read Accesses
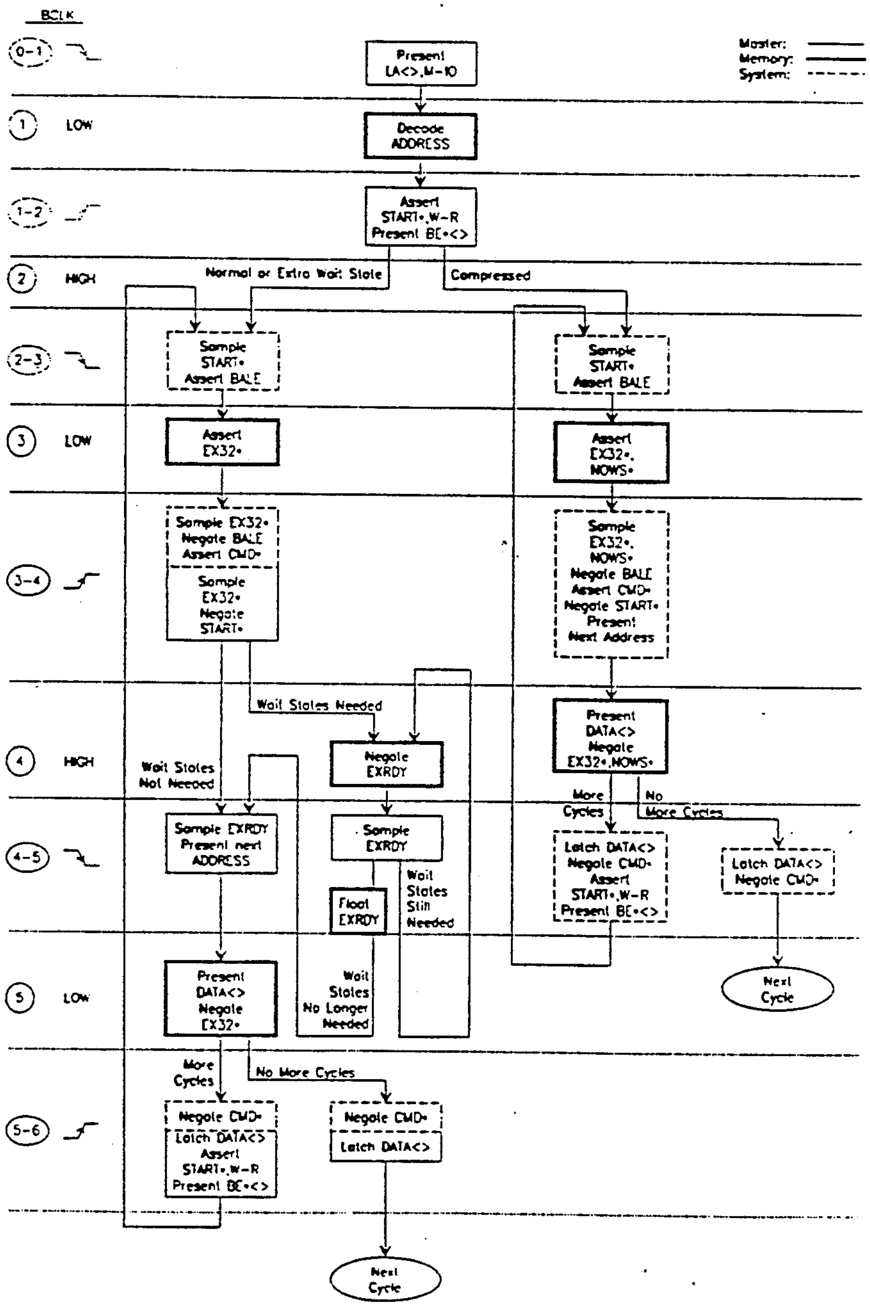

Figure 14 - 32-bit Master to 32-bit Slave Memory Write Accesses
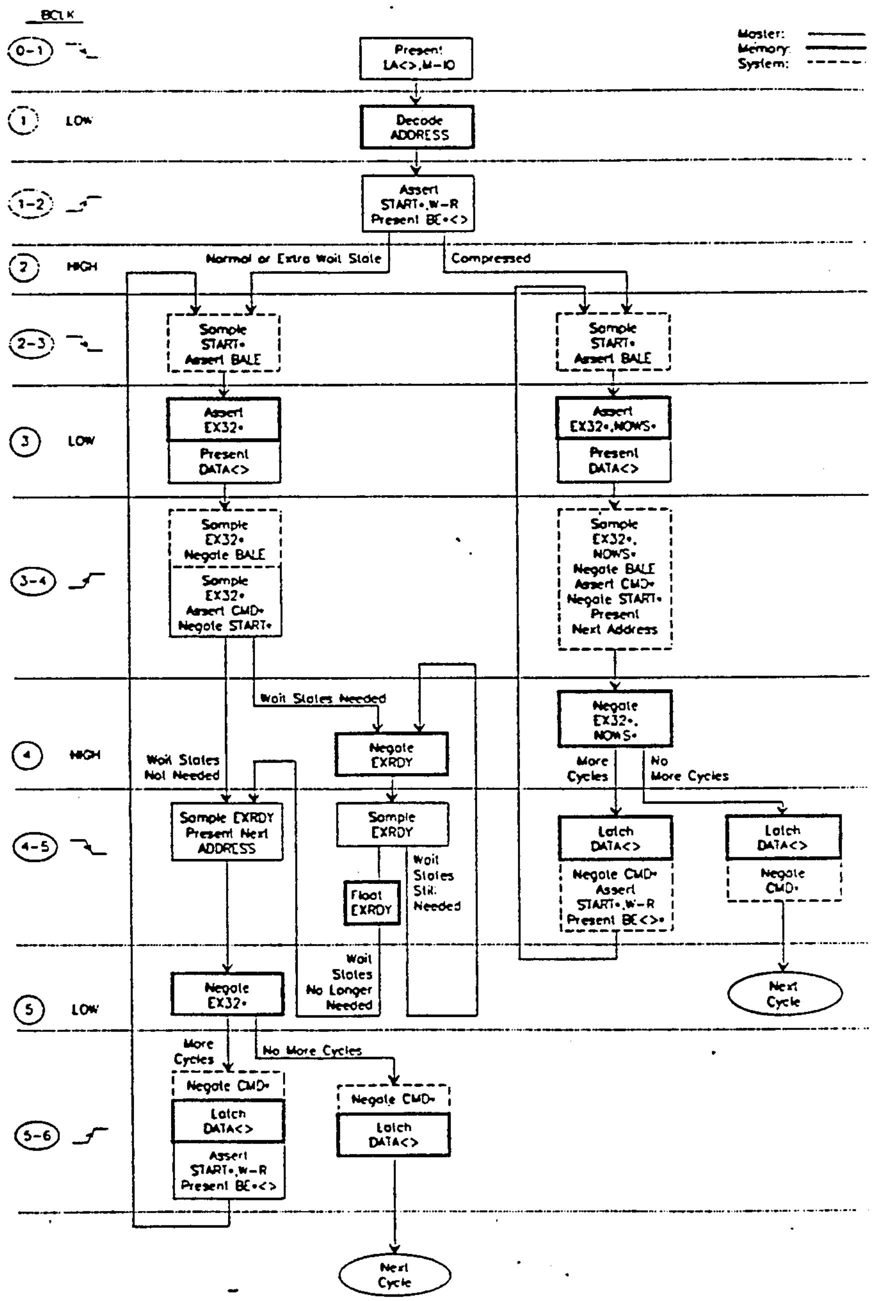

Figure 15 - Access to EISA Slave - 3 BCLK and Standard (2 BCLK) Cycles
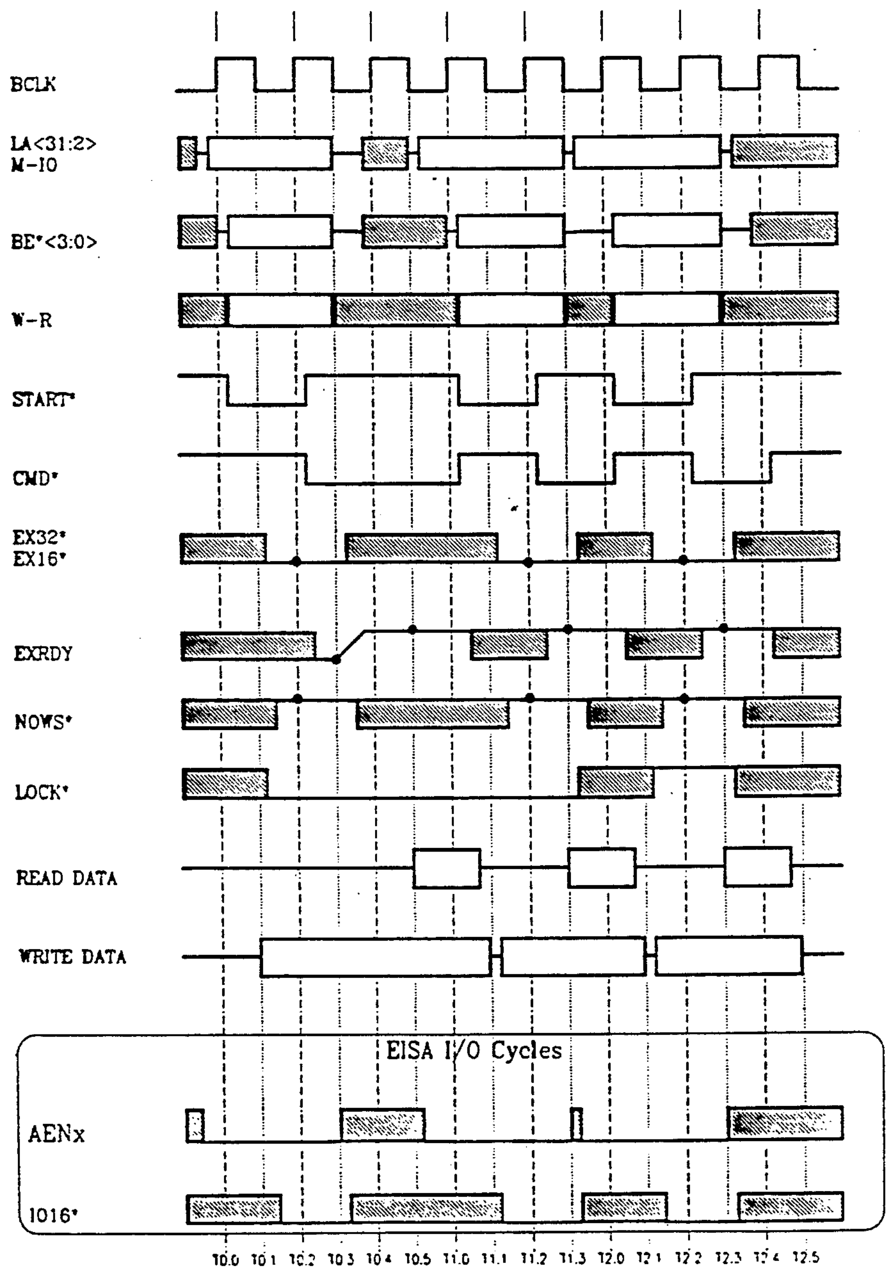

2.4.2 COMPRESSED Cycles

The COMPRESSED cycle type completes one transfer each 1.5 BCLK period. It can be used by the main CPU to transfer data to or from fast EISA memory or I/O slaves. The total transfer time can be calculated with the following formula:

Total Transfer = N*(1.5 BCLK period) $\mu$s

Where: N = number of bus cycles for transfer

For example, an uninterrupted 32-bit COMPRESSED transfer of 256 bytes (64 dwords) completes in 11.5 $\mu$s with an 8.33 MHz BCLK. A 16-bit transfer completes in 23 $\mu$s. This example assumes that no preempts occur during the transfer.

COMPRESSED cycles are a special case of Standard cycles in which the main CPU presents a new address each 1.5 BCLK period and the system board reduces the duration of CMD* to 0.5 BCLK. The timing requirements for the generation of COMPRESSED cycles are more strict than for normal EISA cycles, and, as such, special design methods are required for both the systems and slaves that support these cycles. A slave indicates support of COMPRESSED cycles by asserting NOWS* in time for the system board to sample on the rising edge of BCLK at the leading edge of CMD*. The slave must not negate EXRDY after asserting NOWS*. The CMD* pulse width is 1/2 BCLK for COMPRESSED cycles, but the slave must be prepared to accept a CMD* pulse of 1 BCLK or longer. The longer CMD* occurs when a bus master or other device initiates the cycle instead of the main CPU.

Figure 16 shows the relevant signals for COMPRESSED read and write cycles between a 32-bit master and a 32-bit slave. Observe the half-cycle extension of BCLK for synchronization. Data transfers from a 16-bit CPU to a 16-bit slave are the same except for the use of EX16* instead of EX32*.

Figure 16 - Access to EISA Slave - COMPRESSED Cycle
(1.5 BCLK)
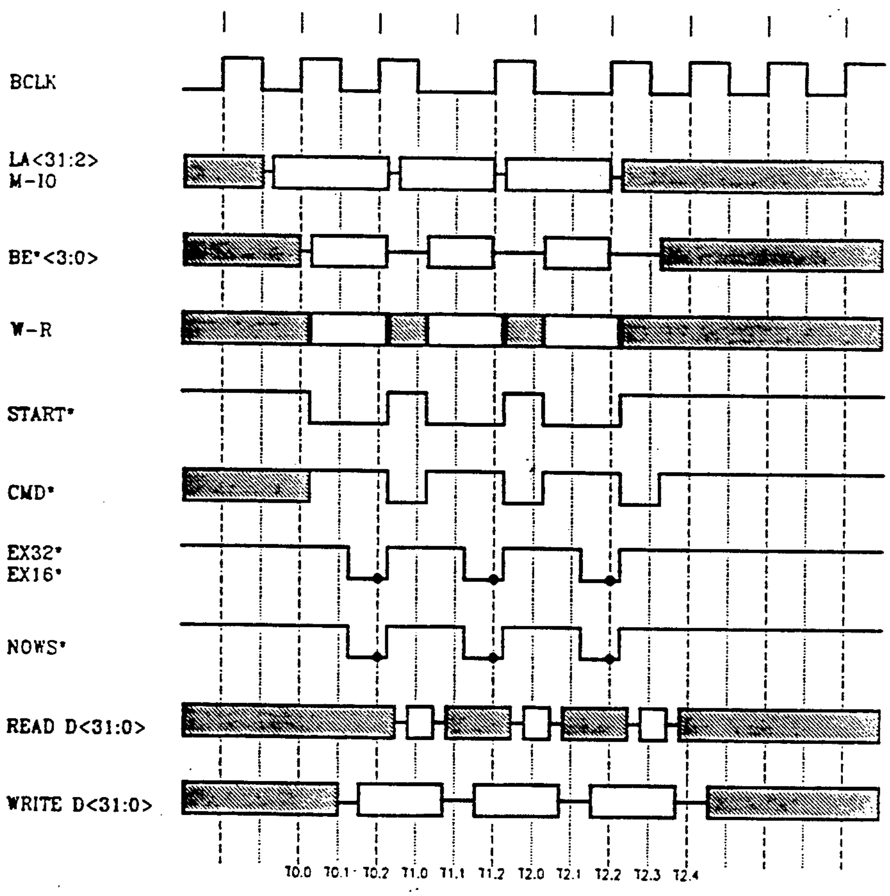

2.4.3 Burst Cycles

The Burst cycle type provides a continuous sequence of 1 BCLK read or write cycles. Burst cycles are zero-wait-state transfers to or from EISA memory. Burst cycles cannot be used with I/O devices or ISA memory devices (slaves or masters). The total time for a Burst transfer can be calculated with the following formula:

Total transfer = $(1+T_{wi}+N)^{*}(1\ \text{BCLK period})\ \mu s$

Where:

$T_{wi}$ = number wait states in initial bus cycle
N = number of bus cycles for transfer For example, an uninterrupted 32-bit Burst of 256 bytes (64 dwords) completes in 7.8 $\mu$s with an 8.33 MHz BCLK. A 16-bit transfer completes in 15.6 $\mu$s. This example assumes that no preempts occur during the transfer.

The first cycle in a Burst transfer begins like a standard cycle. The CPU or bus master presents a valid address, and the memory slave, after decoding the address and M-IO, indicates that it can perform Burst cycles by asserting SLBURST*. The CPU or bus master samples SLBURST* on the rising edge of BCLK at the trailing edge of START*. The CPU or bus master indicates its ability to do Burst cycles by asserting MSBURST* on the falling edge of BCLK and presenting the second address to the slave. If the CPU or bus master found SLBURST* asserted, it performs the transfer using Burst cycles, and the system board, instead of negating CMD* keeps it asserted while the CPU or bus master performs the Burst. The CPU or bus master reverts to a standard cycle and leaves MSBURST* negated if the memory slave does not assert SLBURST* or if the slave type does not support the Burst.

If the Burst cycle is a read, the Burst addresses are presented on the falling edge of every BCLK, and the slave presents the data for that address for sampling 1.5 BCLK periods later. If the Burst cycle is a write the CPU or bus master presents the data on the rising edge of BCLK 1/2 cycle after presenting the address. This differs from standard cycles in which the data is presented on the falling edge of BCLK. The CPU or bus master terminates the Burst cycle by negating MSBURST* at the address change and completing the last transfer.

A Burst transfer must be all reads or all writes. Mixed cycles are not allowed. The byte enables may change within the block. Although a Burst transfer normally performs zero-wait-state cycles, a slave can add wait states during a Burst sequence by negating EXRDY before the falling edge of BCLK (with CMD* asserted). The master samples EXRDY on the falling edge of BCLK and extends the cycle until EXRDY is asserted. The master can still change to the next address even though EXRDY is negated. Note that it is not possible to decode a valid address in time to negate EXRDY. The slave must know in advance that wait states are needed. An intelligent slave can use the wait states to interrupt the Burst sequence while it accesses local shared memory. A memory slave cannot terminate a Burst.

Addresses asserted during a Burst sequence to DRAM memory must be within a 1024 byte DRAM memory page (address lines LA<31:10> cannot change during the Burst). To cross a DRAM page boundary, the Burst sequence must be terminated by the CPU or bus master by negating the MSBURST* signal on the last cycle in the page. The Burst sequence can be restarted on a new page.

Figure 17 shows a Burst read cycle from a 32-bit master to a 32-bit slave. Figure 18 shows the relevant signals for reads and writes between a 32-bit master and a 32-bit slave. Data transfers from a 16-bit master to a 16-bit slave are the same except for the use of EX16* instead of EX32*.

Figure 17 - 32-bit Master to 32-bit Slave Burst Read Transfers
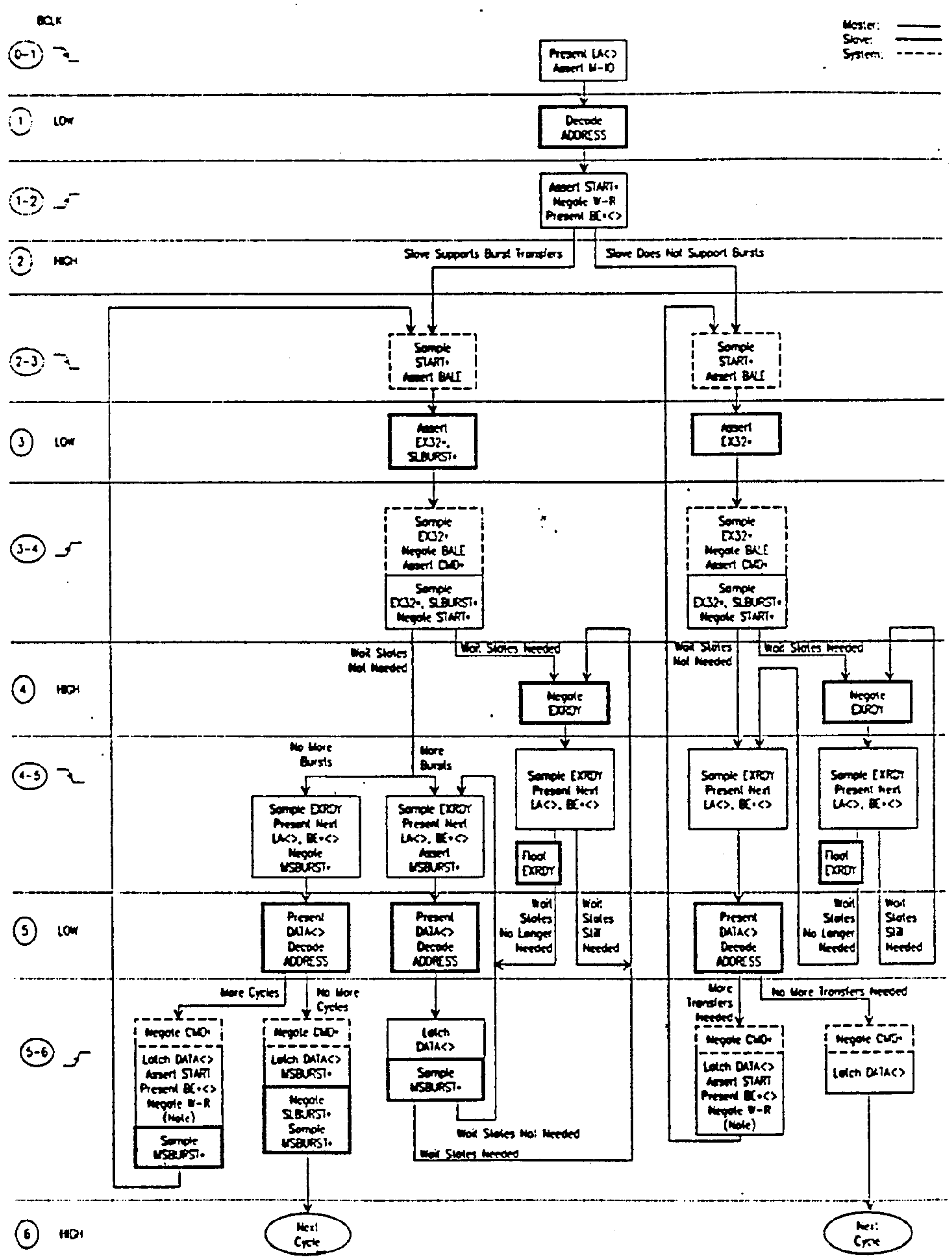
Note: If next cycle is a write, assert W-R and go to corresponding state in write diagram.

Figure 18 - 32-bit Master to 32-bit Slave Burst Write Transfers
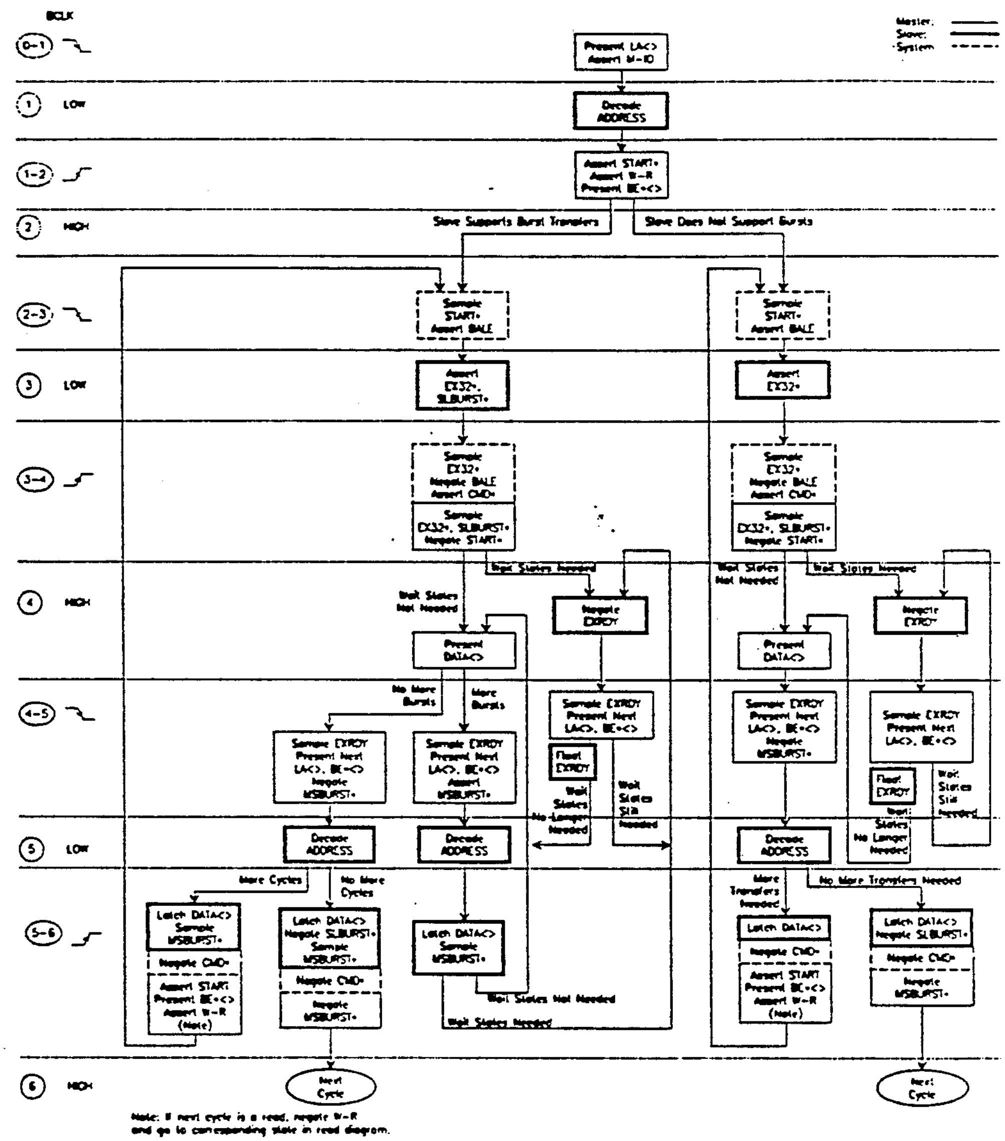

Figure 19 - Access to EISA Slave - Burst Cycles
(With and Without Wait States)
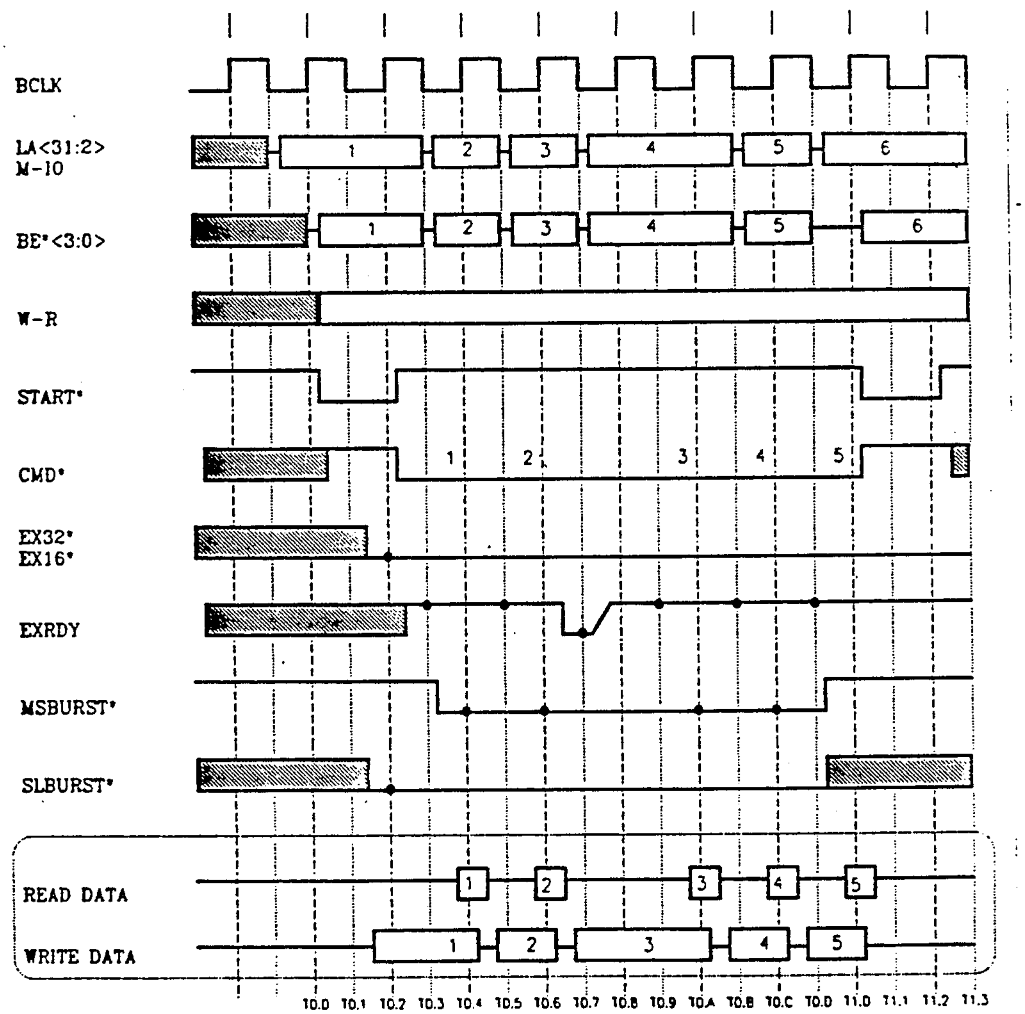
1) EISA Standard Access (Start of Burst)
2) EISA Burst Access
3) EISA Burst Access with One Wait State
4,5) EISA Burst Access
6) EISA Standard Access

2.5 DMA Cycles

DMA devices can use one of four cycle control sequences to transfer data between the DMA device and memory: ISA compatible cycles, Type "A" cycles, Type "B" cycles, or Burst DMA cycles. Each cycle type can be run as a single cycle transfer (Single mode), or as a continuous sequence of cycles (Block or Demand mode). See the DMA controller section for more information on Single, Block and Demand DMA controller modes. The DMA controller supports 8-, 16- and 32-bit data transfer sizes. The DMA device reads or writes the appropriate bytes on the bus for its data size.

DMA devices use IORC* and IOWC* for I/O reads and writes. The system board asserts the appropriate I/O command signal (IORC* or IOWC*) with DAK*<x> and negates the command signal when the data lines are valid (for a write) or when the system board latches the data (for a read). The I/O command signal remains asserted during memory wait states or data size translation. The DMA device cannot add wait states.

2.5.1 ISA Compatible DMA Cycles: ISA Compatible

The ISA compatible DMA cycle type executes one transfer cycle in 8 BCLK periods. Each wait state adds two BCLK periods. ISA DMA devices can use this cycle type to transfer data between the DMA device and 32-, 16- or 8-bit memory. The total transfer time can be calculated with the following formula:

$$\text{Total Transfer} = (1+N*(8+2*Tw))*(1\ \text{BCLK period})$$

Where:

Tw = number wait states in each bus cycle
N = number of bus cycles for transfer

For example, an uninterrupted zero-wait-state 16-bit transfer of 256 bytes (128 words) completes in 123.2 $\mu$s (2.07 MB/s) with an 8.33 MHz BCLK.

The first cycle of a DMA transfer begins with the system board presenting LA<31:2>, BE*<3:0>, M-IO, and W-R on the falling edge of BCLK. For memory reads, the system board asserts START* on the next rising edge of BCLK. The system board asserts CMD* and IOWC* on the next rising edge of BCLK. The system board holds IOWC* asserted while the memory slave presents the data, then negates IOWC*. The DMA device samples DAK*<x> and IOWC* asserted, then latches the data on the rising edge of IOWC*. The system board holds IOWC* active for 3 BCLK periods and holds CMD* asserted until 1/2 BCLK after negating IOWC*.

If the DMA cycle is an I/O read (memory write), the system board asserts IORC* on the rising edge of BCLK after presenting the address. The system board then asserts START* on the rising edge of BCLK, two BCLKs later. On the next rising edge of BCLK the system board asserts CMD*. The DMA device must present the data when it samples DAK*<x> and IORC* asserted, and must hold the data valid until the system board negates IORC*. The system board holds CMD* asserted for 3 BCLK periods and holds IORC* asserted until 1/2 BCLK after negating CMD*. A DMA device cannot add wait states to a DMA cycle. It must conform to the system board cycle control.

The ISA-compatible DMA cycle is the same for all types of memory. The MRDC* or MWTC* signals are activated to allow ISA memory to be accessed unless the address is greater than 16 megabytes and an EISA memory device responds. The MRDC* signal is asserted at the same time as IOWC* is asserted and is negated at the same time that CMD* is negated for I/O write (memory read) cycles. MWTC* has the same timing as CMD* during I/O read (memory write) cycles.

"Verify" transfers have the same address, DAK*<x>, and T-C timing as other compatible transfers but do not assert any command signals. This means that DMA devices do not see an IORC* or IOWC* asserted and memory does not respond to memory accesses.

Figure 20 show Type "A," Type "B," and Type "C" (Burst) DMA reads. Figure 21 shows an ISA-compatible DMA read.

Figure 22 shows Type "A," Type "B," and Type "C" (Burst) DMA writes. Figure 23 shows an ISA-compatible DMA write.

Figures 24 and 25 show the signals used in ISA-compatible DMA cycles.

Figure 20 - 32-bit DMA Read Transfer from 32-bit Memory - Type "A," "B," and Burst Cycles (No Wait States)
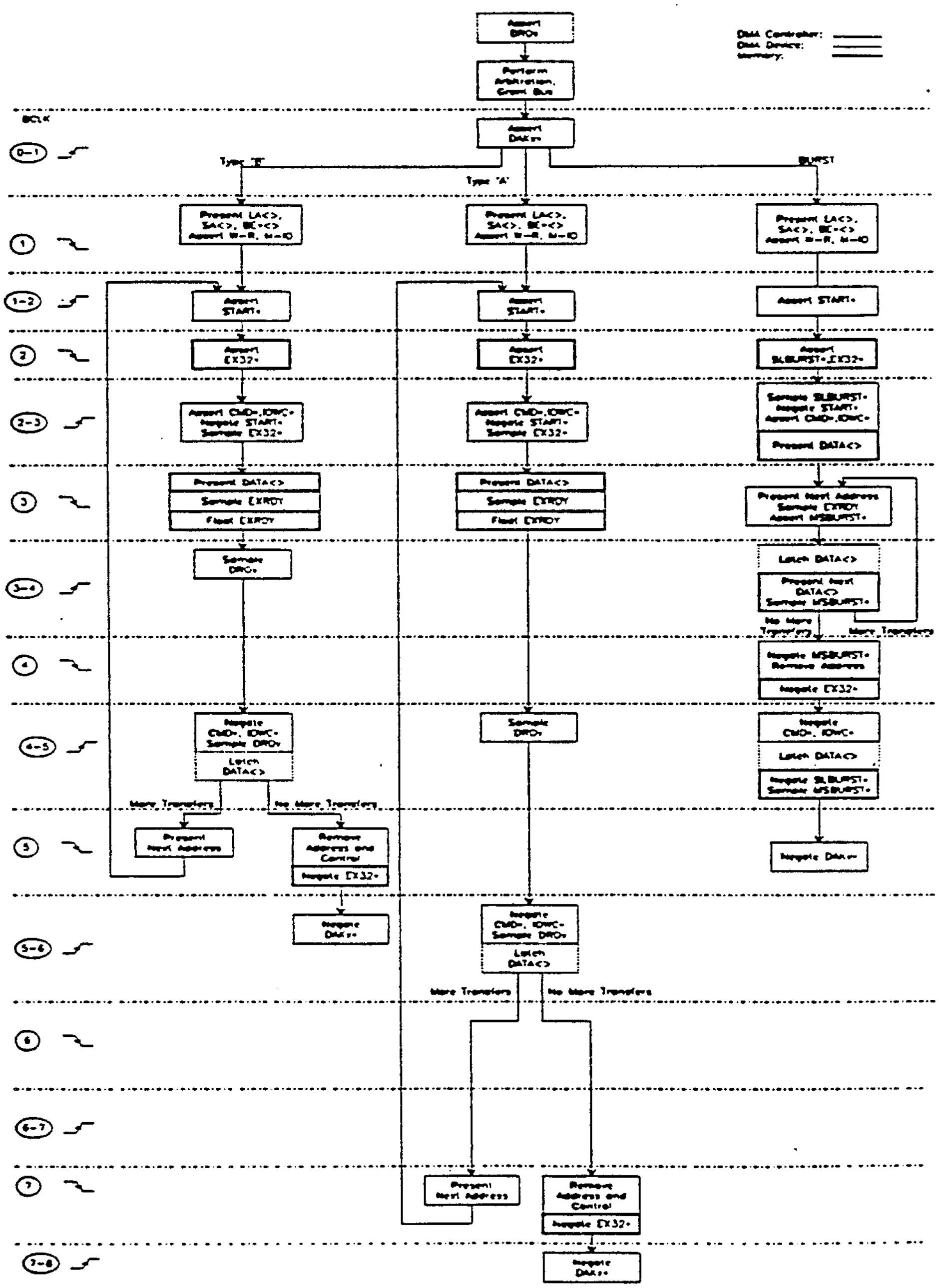

Figure 21 - 32-bit DMA Read Transfer from 32-bit Memory - Compatible Cycle (No Wait States)
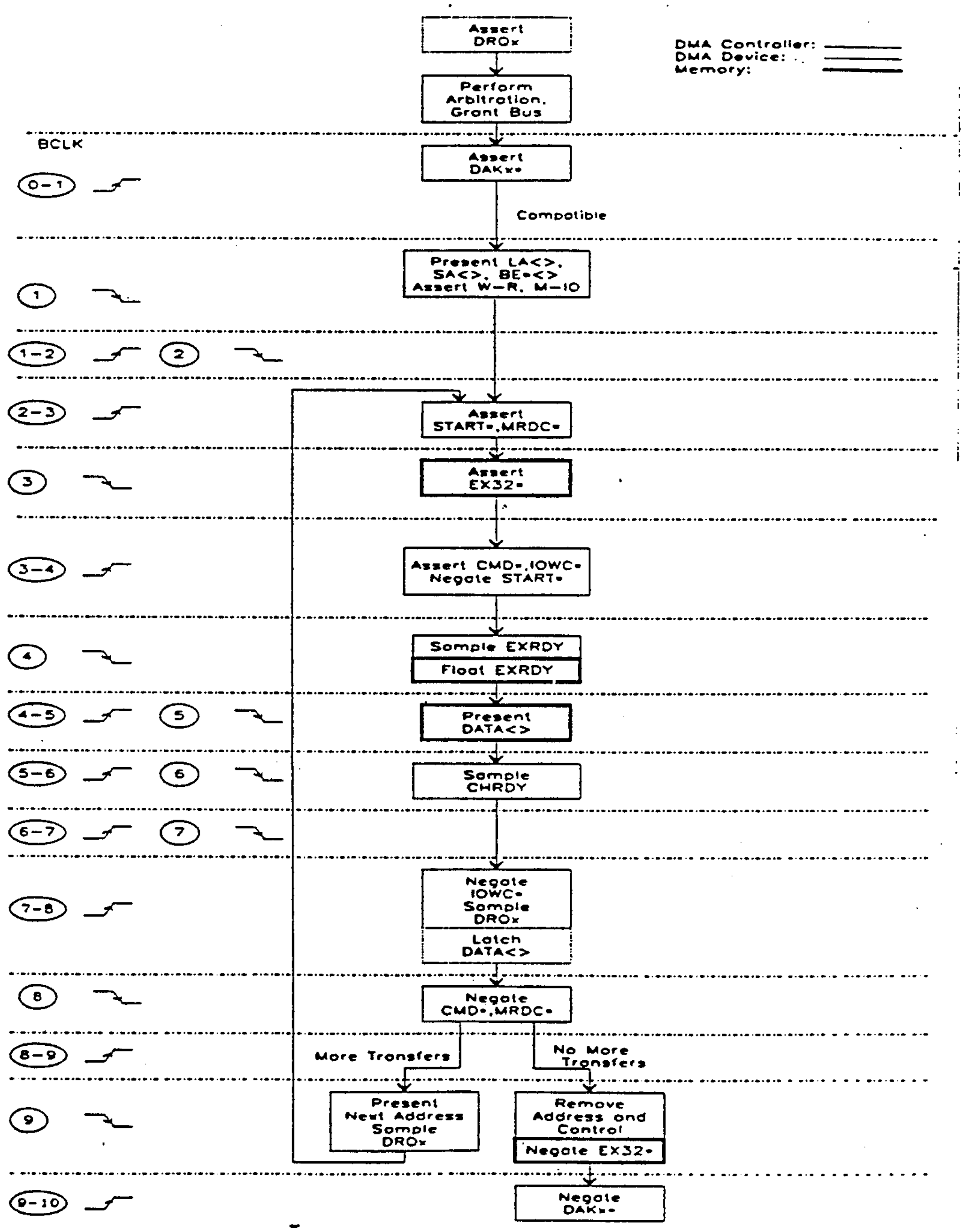

Figure 22 - 32-bit DMA Write Transfer to 32-bit Memory - Type "A," "B," and Burst Cycles (No Wait States)
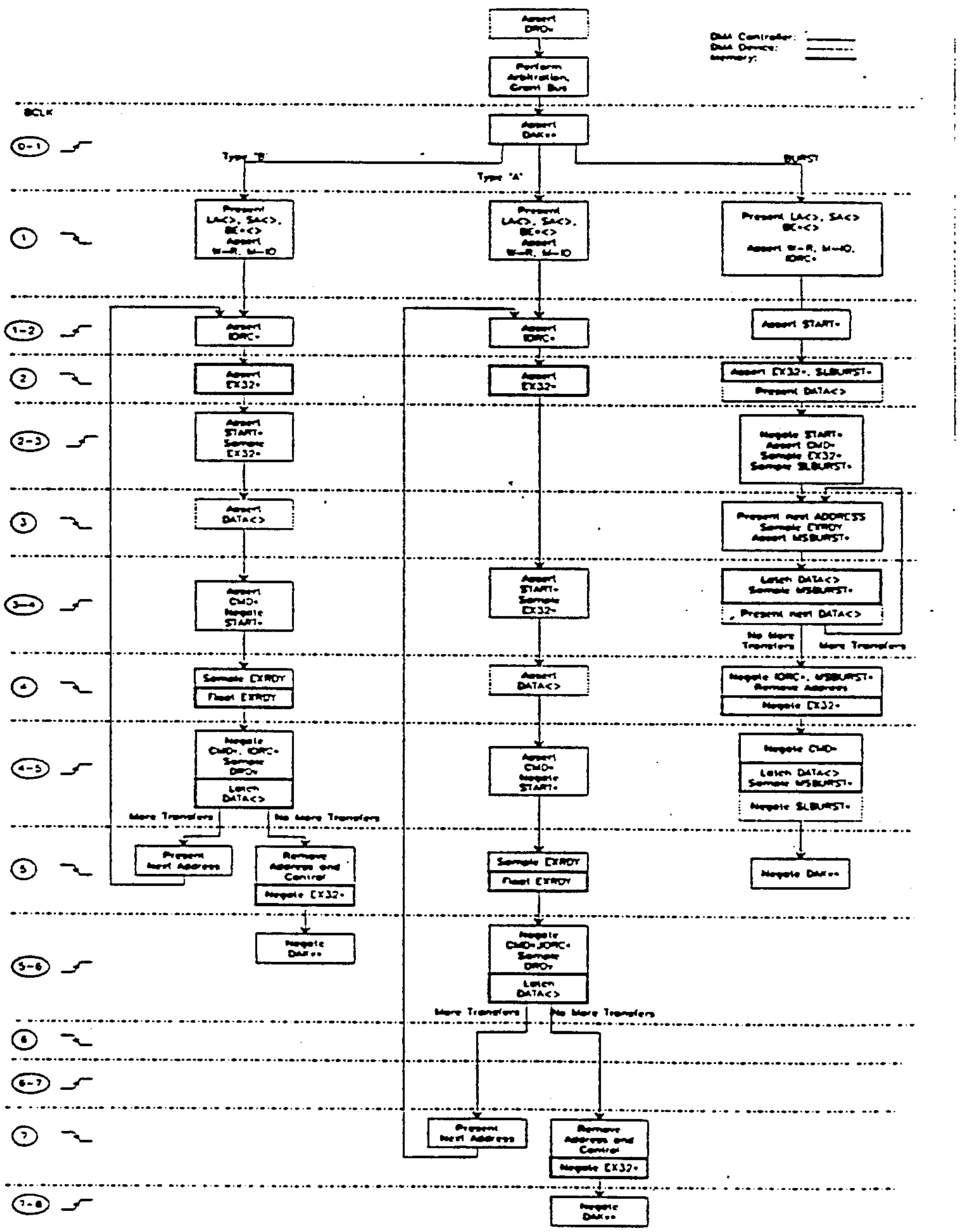

Figure 23 - 32-bit DMA Write Transfer to 32-bit Memory - Compatible Cycle (No Wait States)
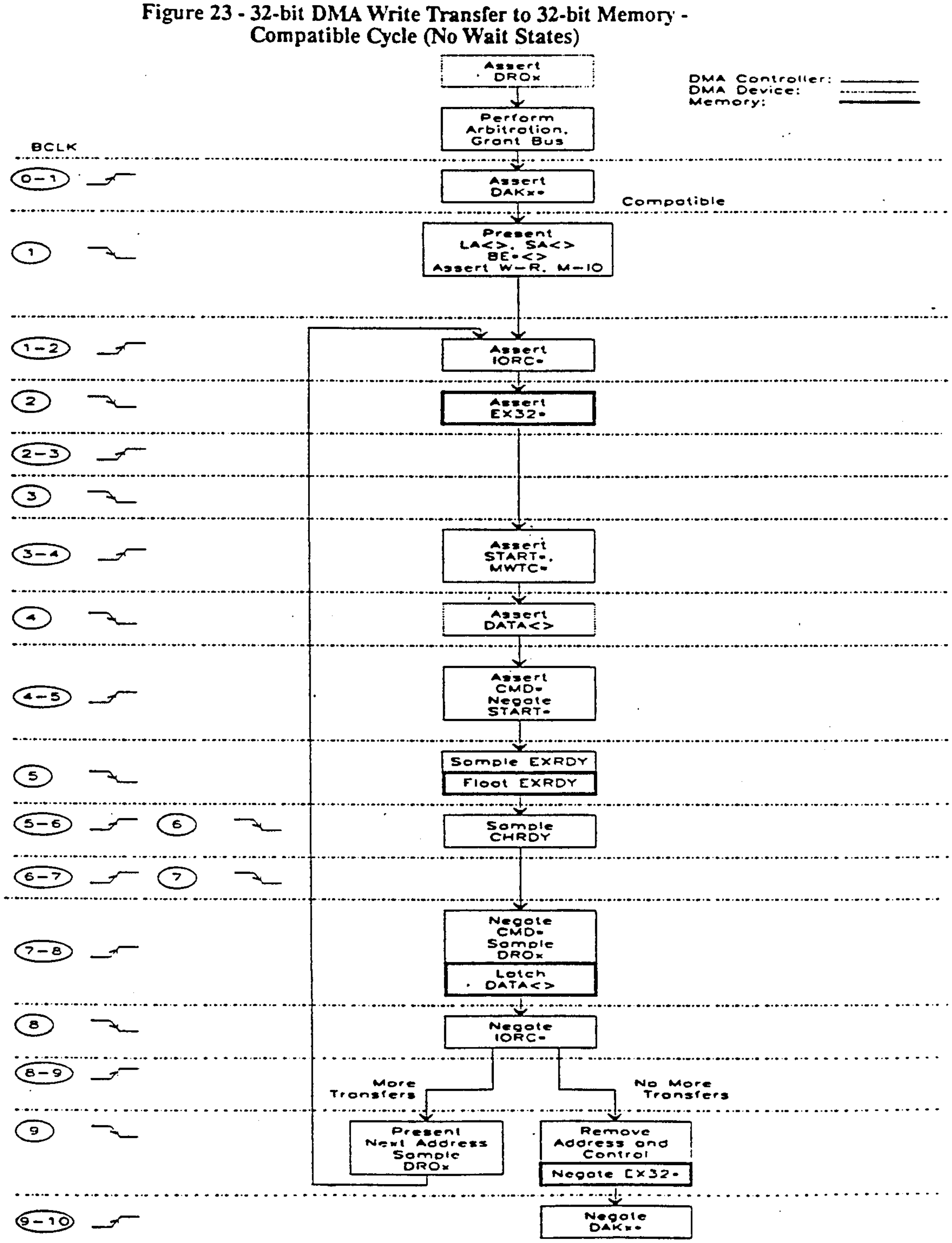

EXTENDED INDUSTRY STANDARD ARCHITECTURE
CONFIDENTIAL INFORMATION OF BCPR SERVICES, INC.
Figure 25 -DMA Transfer to Memory Without Conversion - Compatible Cycle: Demand Write
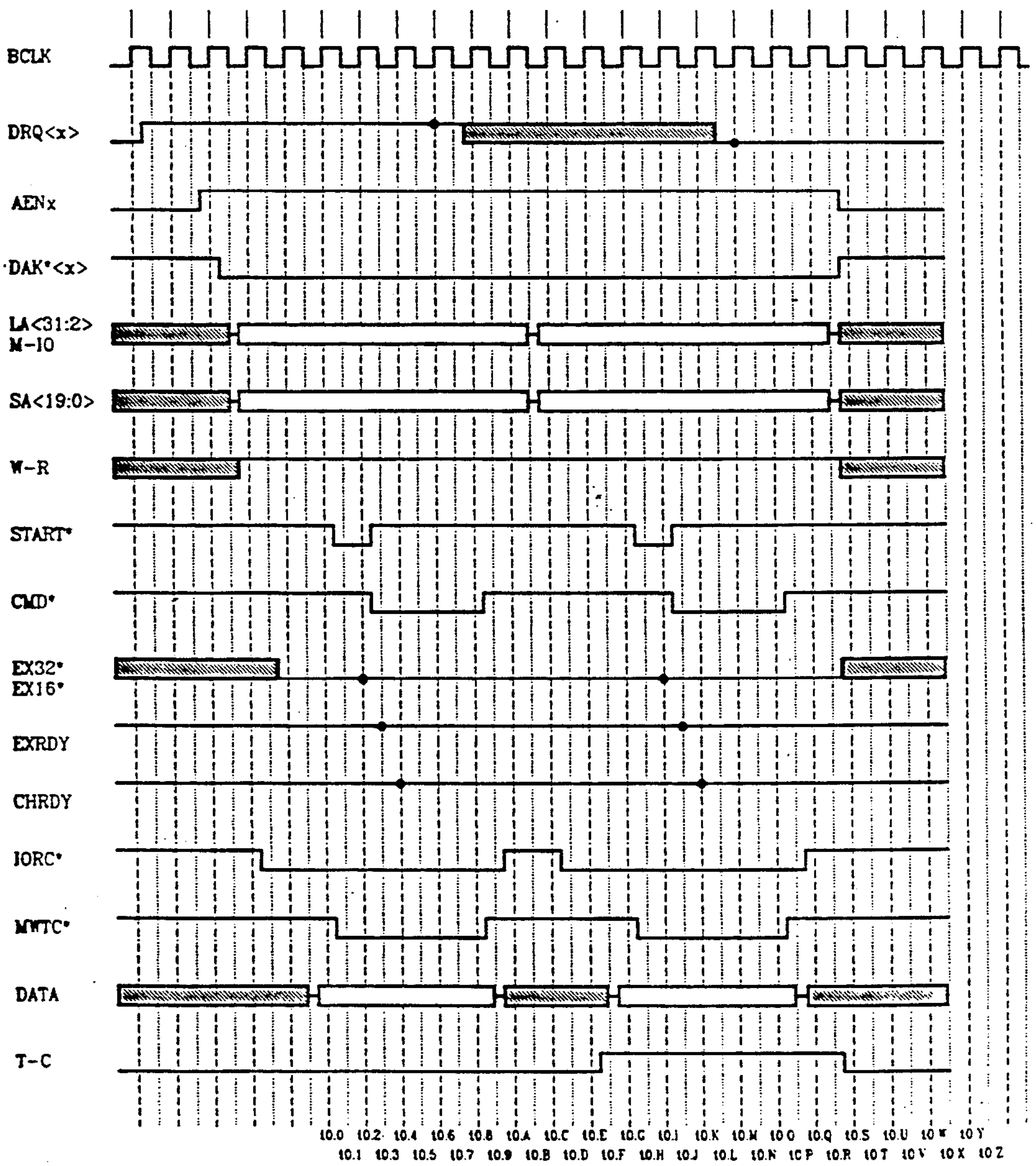

2.5.2 Type "A" DMA Cycles

The Type "A" DMA cycle supports 8-, 16- or 32-bit DMA devices. Transfers that do not require data size translation execute one cycle every 6 BCLK periods. The system board automatically performs data size translation for transfers to mismatched memory. The total transfer time can be calculated with the following formula:

Total Transfer = $(7+(N-1)*(6+T_w))*(1 \text{ BCLK period})$

Where:

$T_w$ = number wait states in each bus cycle
N = number of bus cycles for transfer For example, an uninterrupted zero-wait-state 32-bit transfer of 256 bytes (64 DWORDs) completes in 46.2 $\mu$s (5.54 MB/s) with an 8.33 MHz BCLK. A 16-bit transfer (128 words) completes in 92.3 $\mu$s (2.78 MB/s). This example assumes that no preempts occur during the transfer.

Most ISA compatible DMA devices can transfer data 1.3 times faster by programming the EISA controller to Type "A" transfers instead of ISA compatible timing (the default). Type "A" transfers provide the performance improvement by reducing the time required for the memory read or write operation and by reducing the duration of the I/O command strobe (IORC* or IOWC*). No hardware modification is normally required. This cycle type works as described only with fast, EISA memory. With non-EISA memory or if data size translation is required, the cycle reverts to memory timing similar to that used with bus masters. The I/O portion of the cycle (data setup time for writes, and I/O read access time for reads) is the same as ISA compatible cycles. The MRDC* and MWTC* signals are not asserted unless the system must do a data size translation for ISA memory.

Figures 26 through 29 show relevant signals for Type "A" DMA read and write cycles between a DMA device and 32- or 16-bit memory.

Figure 26 - DMA Transfer from Memory Without Conversion - Type 'A' Cycle: Demand Read
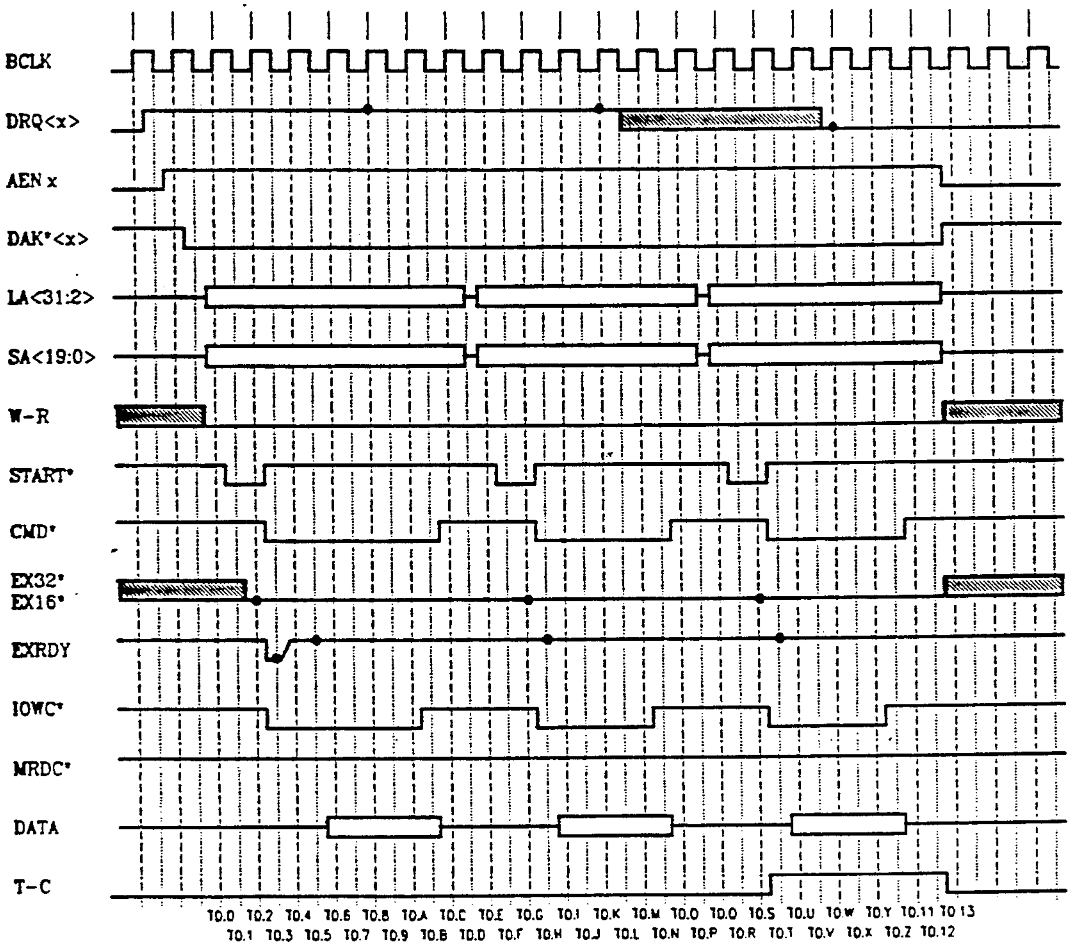
Note: The first memory cycle is shown with an extra wait state added by the memory slave.

Figure 27 - 32-bit DMA Transfer from 16-bit EISA Memory with Conversion - Type "A" Cycle: Read
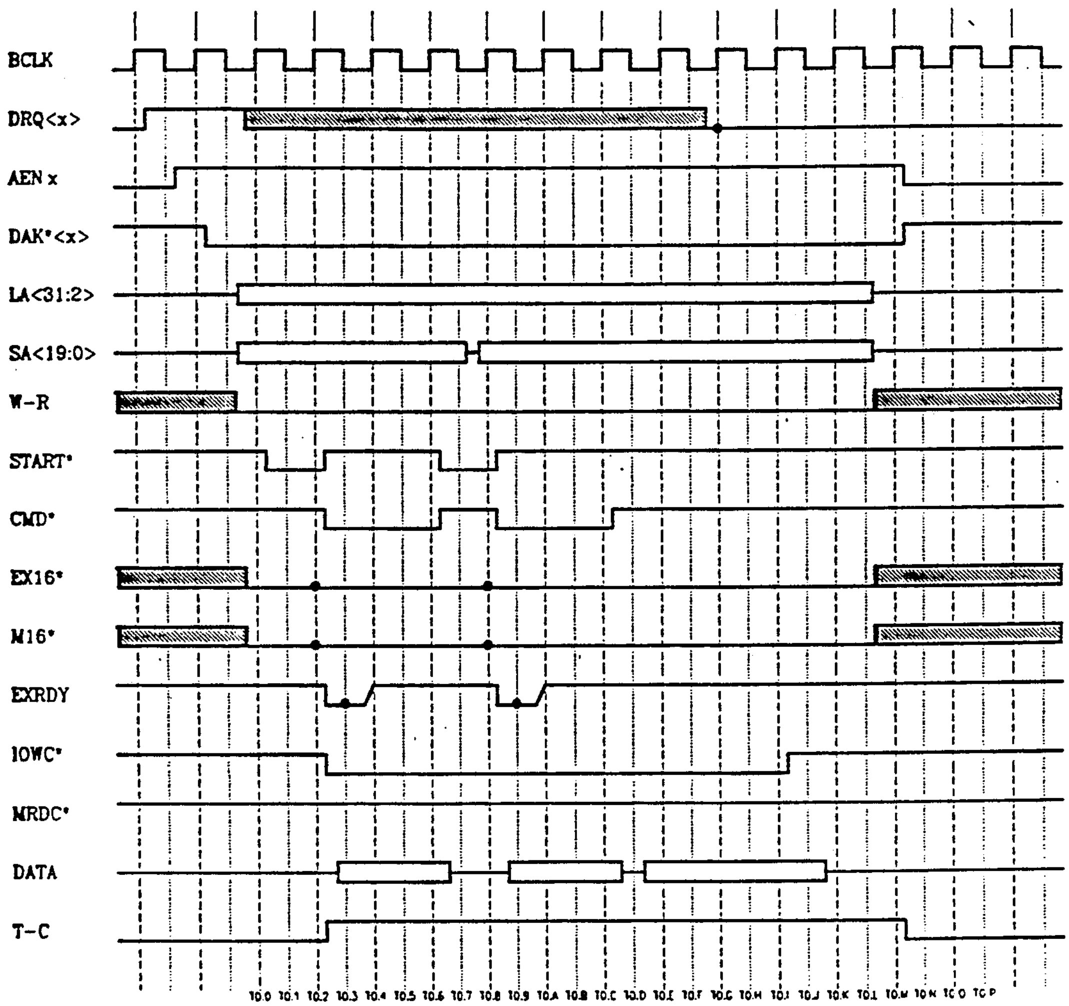
Note: The memory cycles are shown with wait states added by the 16-bit EISA memory slave.

Figure 28 - DMA Transfer to Memory Without Conversion - Type "A" Cycle: Demand Write
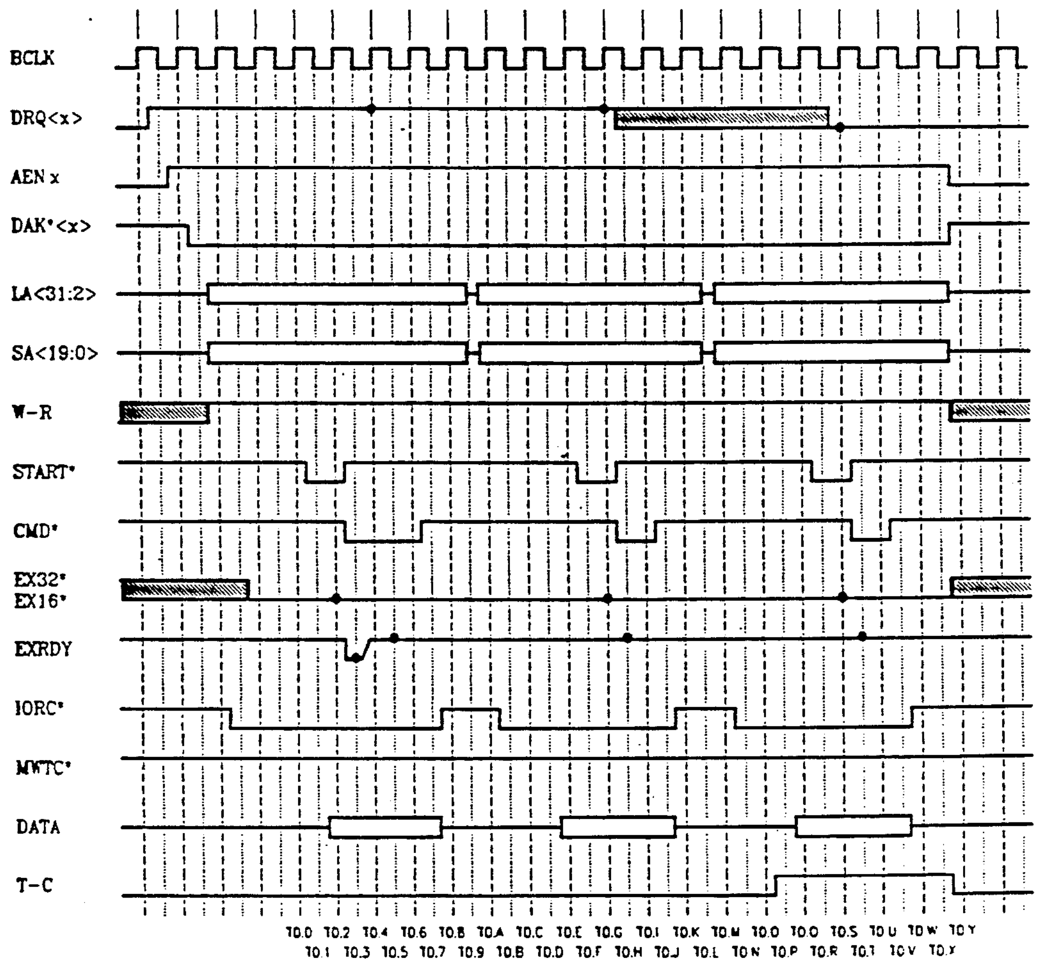
Note: The first memory cycle is shown with a wait state added by the memory slave.

Figure 29 - 32-bit DMA Transfer to 16-bit EISA Memory with Conversion - Type "A" Cycle: Write
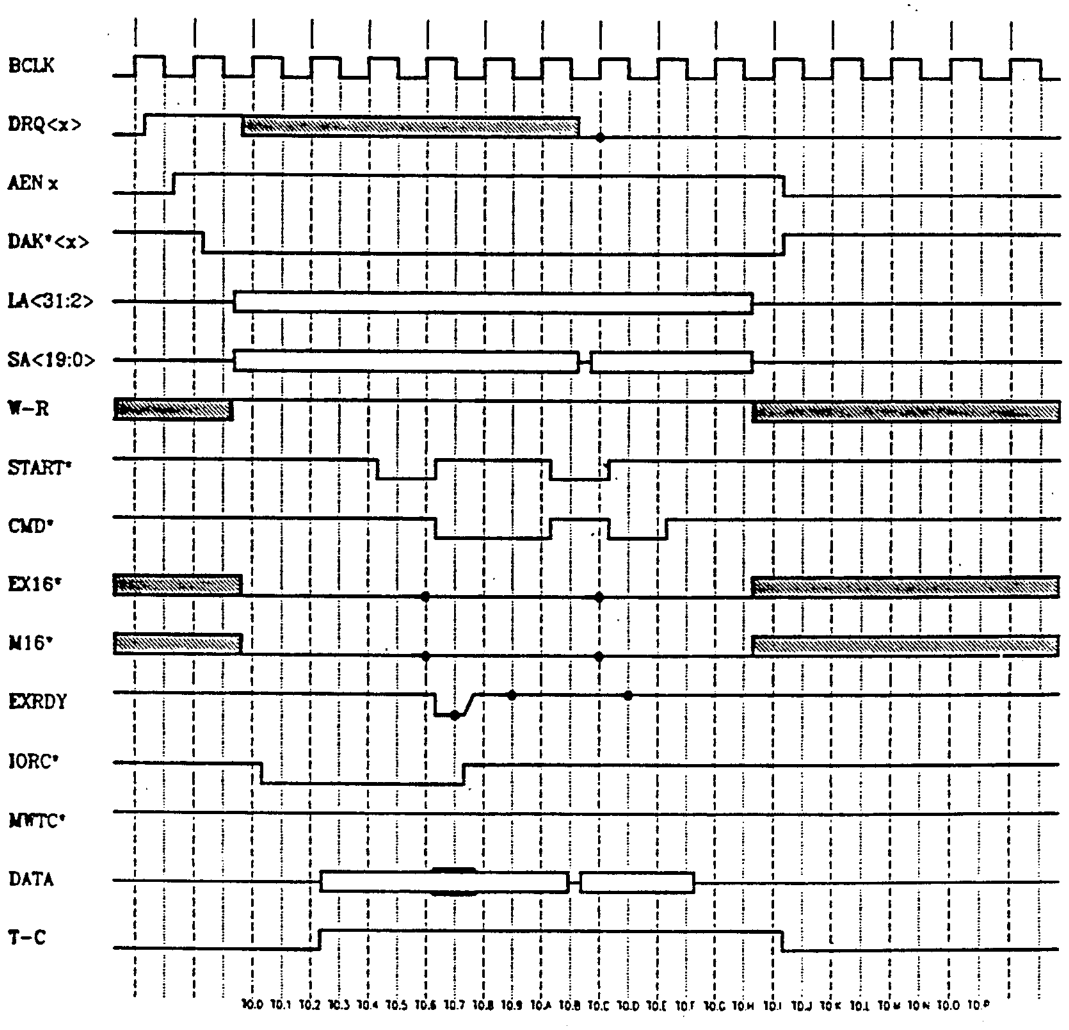
Note: The first memory cycle is shown with a wait state added by the memory slave.

2.5.3 Type "B" DMA Cycles

The Type "B" DMA cycle supports 8-, 16- or 32-bit DMA devices. Transfers that do not require data size translation execute one cycle every 4 BCLK periods. The system board automatically performs data size translation for transfers to mismatched memory. The total transfer time can be calculated with the following formula:

Total Transfer = $(2+N^*(4+T_W))^*(1 \text{ BCLK period})$

Where:

$T_W$ = number wait states in each bus cycle
N = number of bus cycles for transfer For example, an uninterrupted zero-wait-state 32-bit transfer of 256 bytes (64 DWORDs) completes in 31 $\mu$s (8.26 MB/s) with an 8.33 MHz BCLK. A 16-bit transfer (128 words) completes in 61.7 $\mu$s (4.15 MB/s). This example assumes that no preempts occur during the transfer.

Some ISA compatible DMA devices can transfer data two times faster by programming the EISA controller to Type "B" transfers instead of ISA compatible timing (the default). Type "B" transfers provide the performance improvement by reducing the time required for the memory read or write operation and by reducing the data setup time for I/O writes, and read access time for I/O reads. ISA compatible DMA devices using relatively fast technology can use Type "B" cycles without hardware modification. This cycle type works as described only with fast, EISA memory. With non-EISA memory or if data size translation is required, the cycle reverts to memory timing similar to that used with bus masters. The MRDC* and MWTC* signals are not asserted unless the system must do a data size translation for ISA memory.

Figures 30 through 33 show the relevant signals for a Type "B" DMA write cycle between a DMA device and 32-bit or 16-bit memory.

EXTENDED INDUSTRY STANDARD ARCHITECTURE
CONFIDENTIAL INFORMATION OF BCPR SERVICES, INC.
Figure 30 - DMA Transfer from Memory Without Conversion - Type "B" Cycle: Demand Read
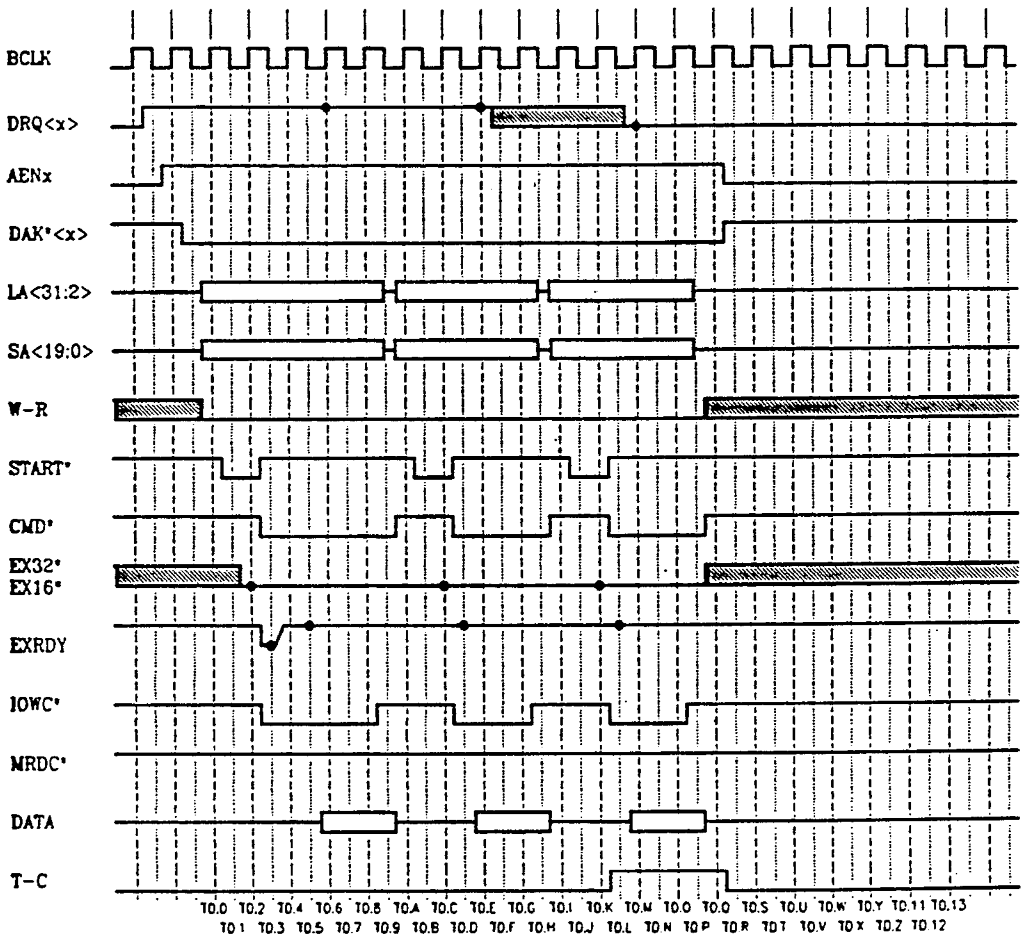
Note: The first memory cycle is shown with a wait state added by the memory slave.

Figure 31 - 32-bit DMA Transfer from 16-bit EISA Memory with Conversion - Type "B" Cycle: Read
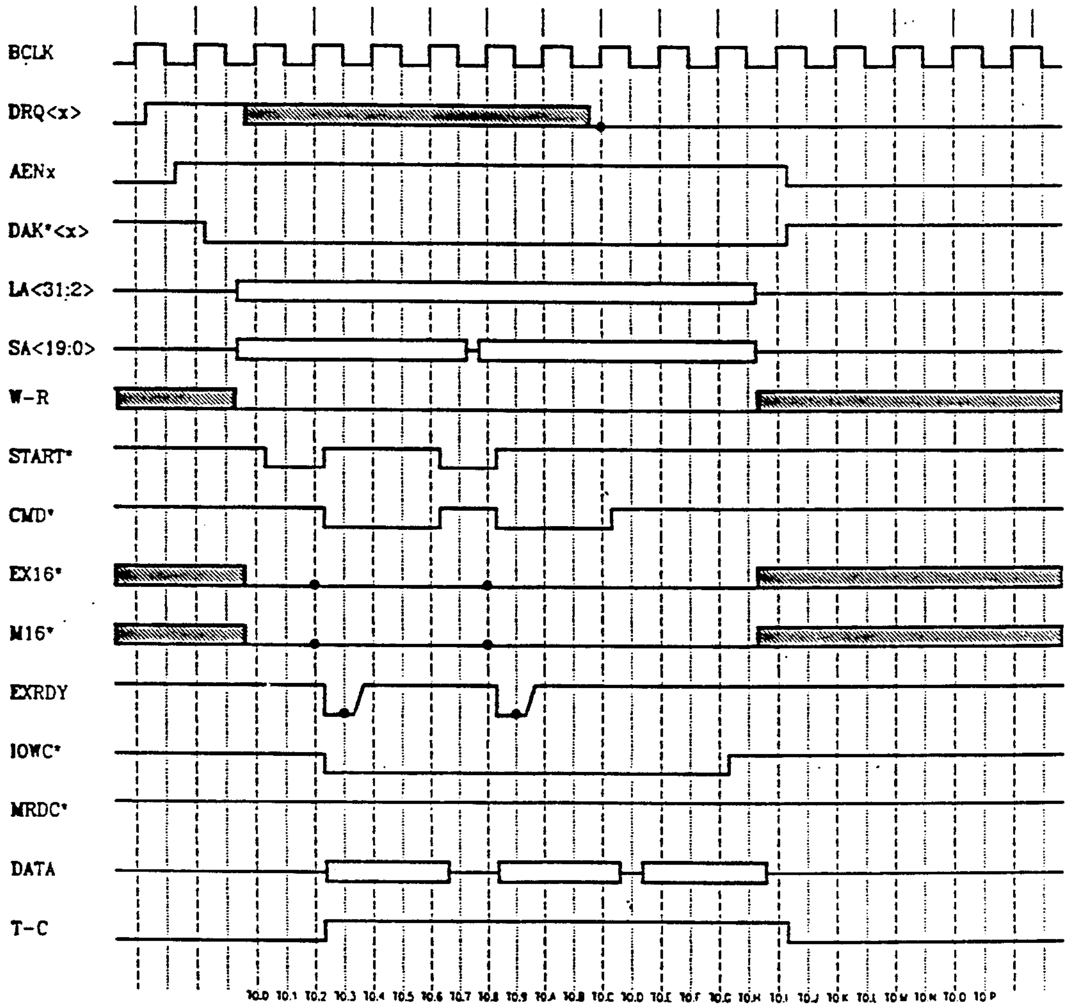
Note: The memory cycles are shown with wait states added by the memory slave.

EXTENDED INDUSTRY STANDARD ARCHITECTURE
CONFIDENTIAL INFORMATION OF BCPR SERVICES, INC.
Figure 32 - DMA Transfer to Memory Without Conversion - Type "B" Cycle: Demand Write
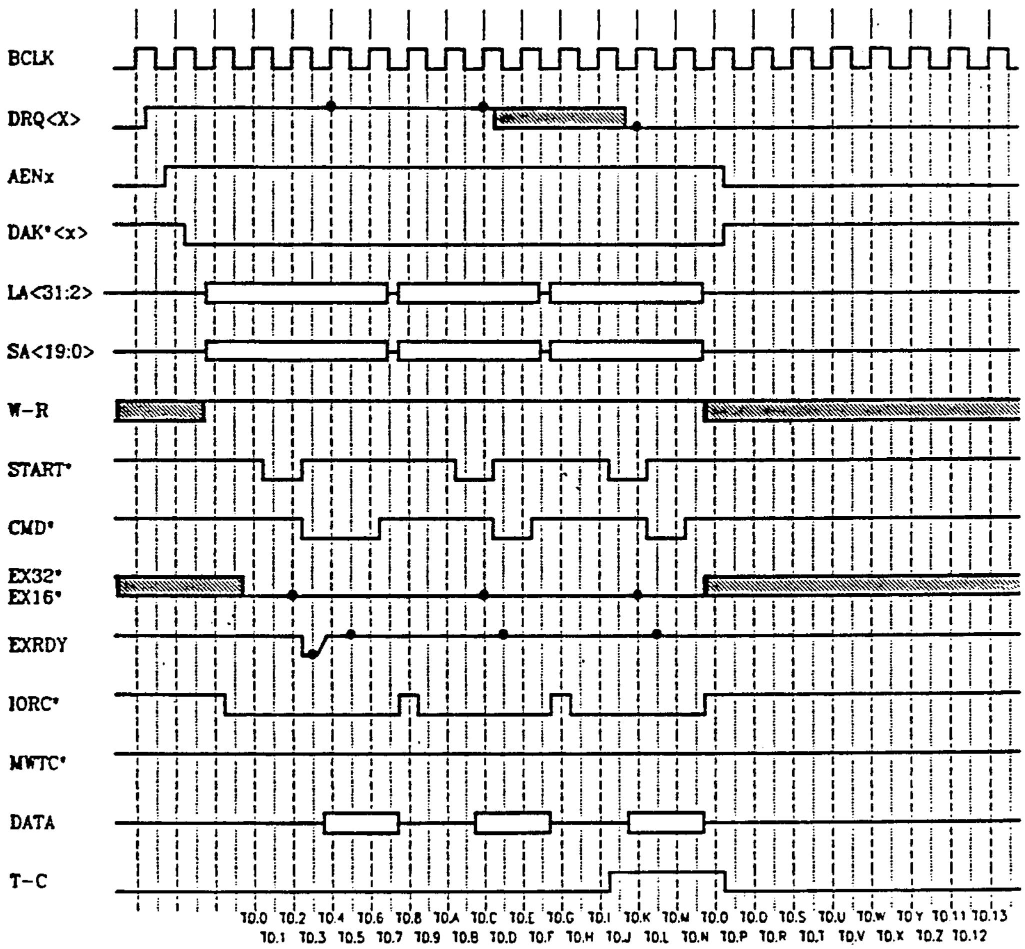
Note: The first memory cycle is shown with a wait state added by the memory slave.

Figure 33 - 32-bit DMA Transfer to 16-bit EISA Memory with Conversion - Type "B" Cycle: Write
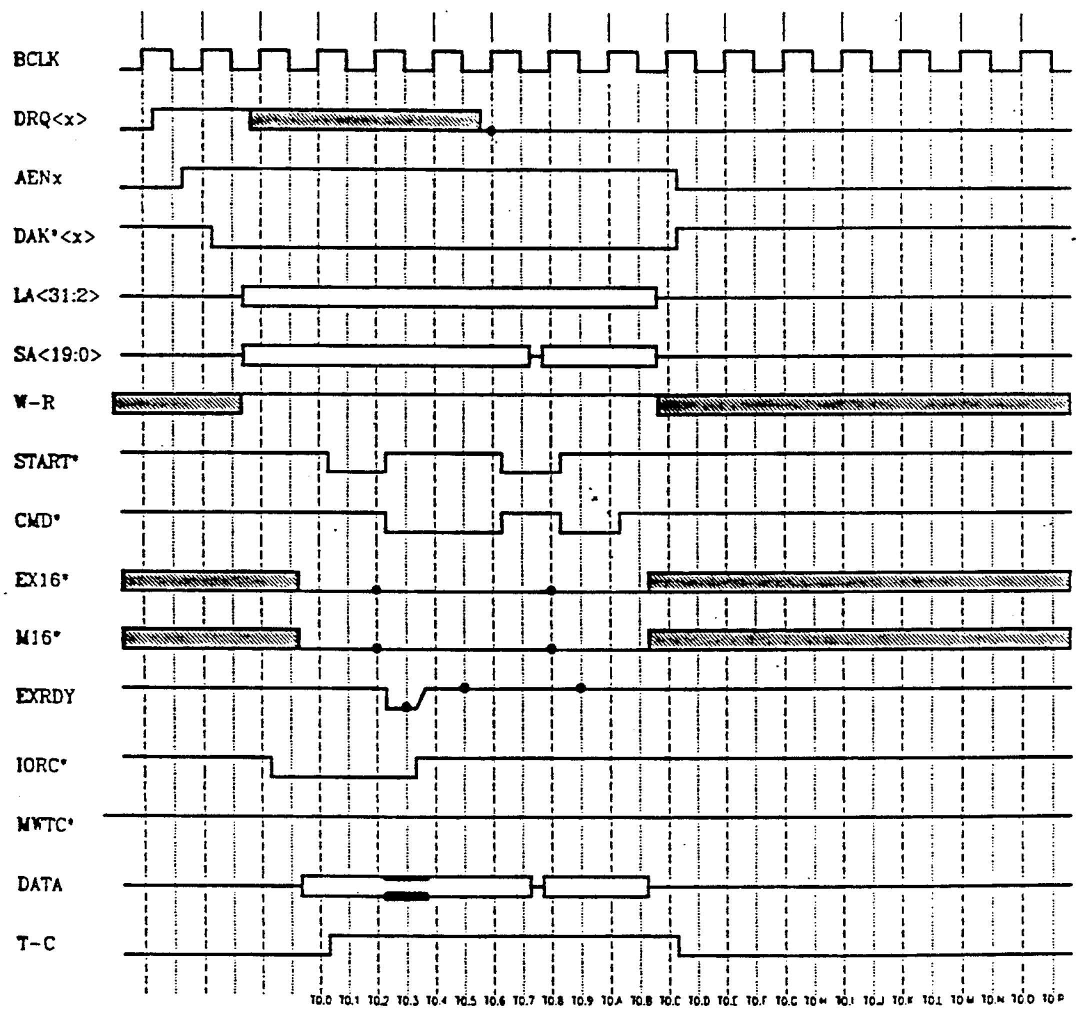
Note: The first memory cycle is shown with a wait state added by the memory slave.

2.5.4 Burst DMA (Type "C") Cycles

Burst DMA (Type "C") cycles have characteristics similar to Burst cycles. Burst DMA cycles can perform a sequence of 8-, 16- or 32-bit transfers between EISA Burst memory and the DMA device in 1 BCLK each.

The total time for a zero-wait-state transfer can be calculated with the following formula:

Total transfer = $(3+T_{wi}+N)*(1 \text{ BCLK period})\ \mu s$

Where:

$T_{wi}$ = number wait states in initial bus cycle
N = number of bus cycles for transfer For example, an uninterrupted transfer of 256 bytes (64 dwords) completes in 8.1 $\mu$s (31.6 MB/s) with an 8.33 MHz BCLK.

The DMA Device requests the bus by asserting its DRQ<x>. The system board performs the arbitration, and asserts the appropriate DAK*<x> on the rising edge of BCLK. On a later falling edge of BCLK the system board presents LA<31:2>, BE*<3:0>, W-R and M-IO, with M-IO indicating memory (high). The system board asserts MSBURST* to indicate its ability to support Burst cycles. The memory slave decodes a valid address on LA<31:2> and asserts SLBURST*. When this is detected, the system board asserts MSBURST* to indicated its ability to support Burst cycles. On the next rising edge of BCLK, the system board asserts START* and samples SLBURST* asserted. If the system board samples SLBURST* negated the cycle reverts to memory timing similar to the standard memory cycle generated by EISA bus masters.

If the system board samples SLBURST* asserted, the system board continues the transfer using Burst cycles. On the next rising edge of BCLK, the system board negates START* and asserts CMD* and IOWC*. The DMA device decodes IOWC* with its DAK*<x> asserted and samples the data bus on the rising edge of BCLK.

While the Burst cycles continue, the system board presents the pipelined address (on LA<31:2>, BE*<3:0>) and MSBURST* on each falling edge of BCLK. The system board presents the address 1/2 BCLK before the beginning of the next Burst cycle (pipelined). Burst cycles continue until the system board negates MSBURST*. The memory slave samples MSBURST* on each rising edge of BCLK.

On each rising edge of BCLK, the DMA device samples the data. The memory slave drives new data on rising edges of BCLK coincident with the DMA device sampling the data. The system board samples DRQ<x> on rising edges of BCLK at the beginning of each cycle (on the same BCLK edge that the DMA device is supposed to drive the data). If the DMA device negates DRQ<x>, then, on the next falling edge of BCLK, the system board tristates the address and negates MSBURST*. On the next rising edge of BCLK the system board negates CMD* and IOWC*. The DMA device stops sampling the data when IOWC* is negated. The memory slave floats the D<31:0> after the trailing edge of CMD*. The system board negates DAK*<x> on or after the same BCLK rising edge where CMD* is negated.

A slave can add wait states during a Burst sequence by negating EXRDY before the falling edge of BCLK (with CMD* asserted). The system board samples EXRDY on the falling edge of BCLK and extends the cycle until EXRDY is floated (asserted). The DMA device is also sampling EXRDY and waiting to sample the data. The system board can still change to the next address even though EXRDY is negated. Note that it is not possible to decode a valid address in time to negate EXRDY. The slave must know in advance that wait states are needed. An intelligent slave can use the wait states to interrupt the Burst sequence while it accesses local shared memory.

Addresses asserted during Burst DMA cycles to DRAM memory must be within a 1024 byte DRAM memory page (address line LA<31:10> cannot change during the transfer). To cross a DRAM page boundary, the system board terminates the Burst DMA sequence by negating the MSBURST* signal on the last cycle in the page. The system board then restarts the sequence on the new page.

The system board generates the memory addresses and assures the sequence is within a DRAM page. The system board supplies the transfer control and signal translation. The DMA device must monitor its DAK*<x>, BCLK, EXRDY, and IORC* or IOWC* signals to determine when to drive the data (on writes) or latch the data (on reads).

The system board automatically reverts to normal cycles if the addressed memory does not support Burst DMA cycles. If ISA memory devices are addressed, the system does the appropriate signal and data size translations.

Figure 34 shows the relevant signals for a Burst (Type "C") DMA read cycle between a 32-bit DMA device and 32-bit memory. Figure 35 shows the relevant signals for a Type "C" read cycle between a 32-bit DMA device and 16-bit EISA memory. Figures 36 and 37 show the write cycle.

Figure 34 - DMA Transfer from Memory Without Conversion - Burst DMA Cycle: Demand Read
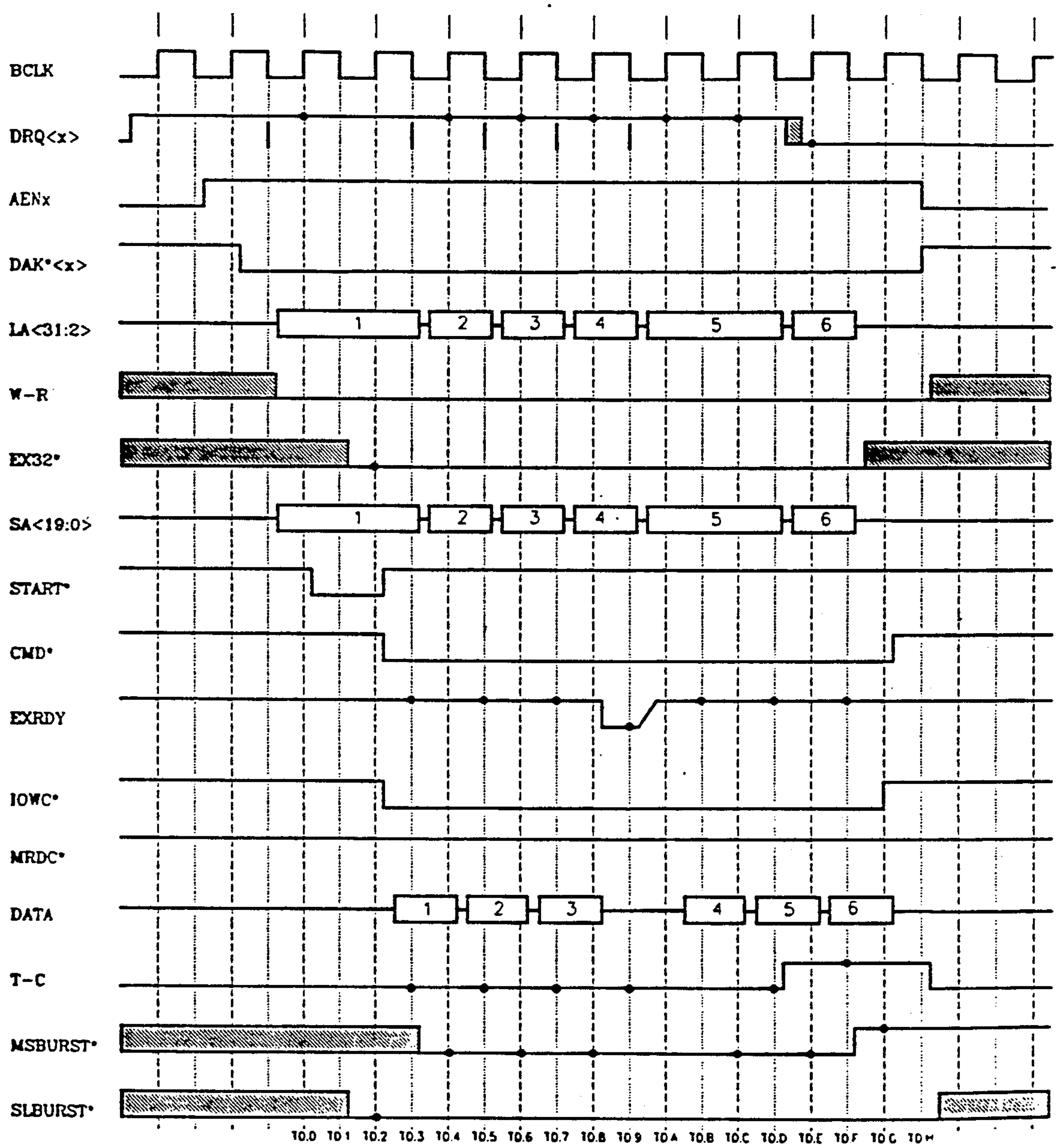
1) 32-bit DMA to 32-bit Memory, 1st Burst Cycle
2) 2nd cycle
3) 3rd cycle
4) 4th cycle with one wait state
5) 5th cycle
6) Last cycle (DRQ<x>)
Note: Vertical marks indicate possible times to negate DRQ<x>.

Figure 35 - 32-bit DMA Transfer from 16-bit EISA Memory with Conversion - Burst DMA Cycle: Read
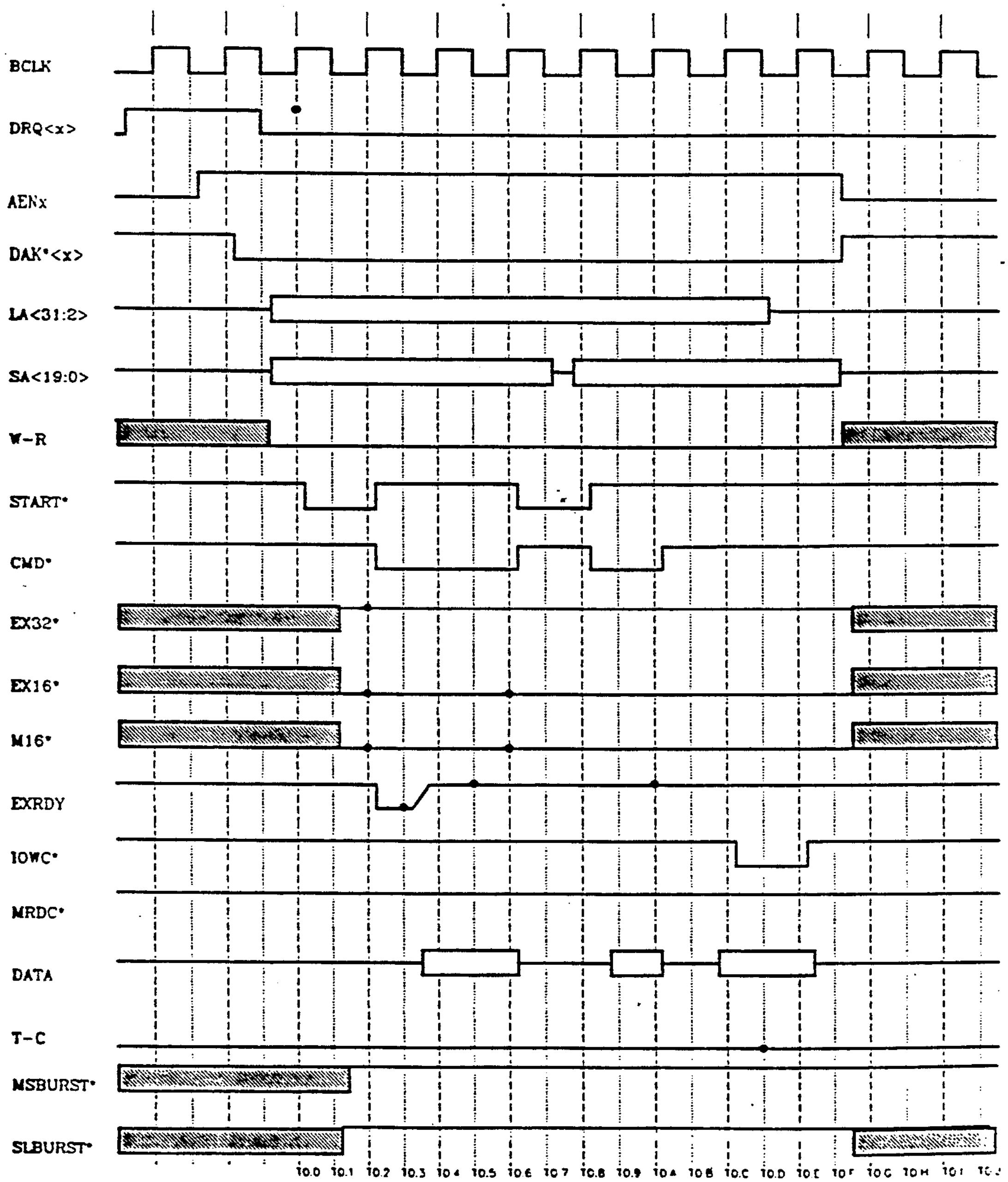
Note: The first memory cycle is shown with a wait state added by the memory slave

Figure 36 - DMA Transfer to Memory Without Conversion - Burst DMA Cycle: Demand Write
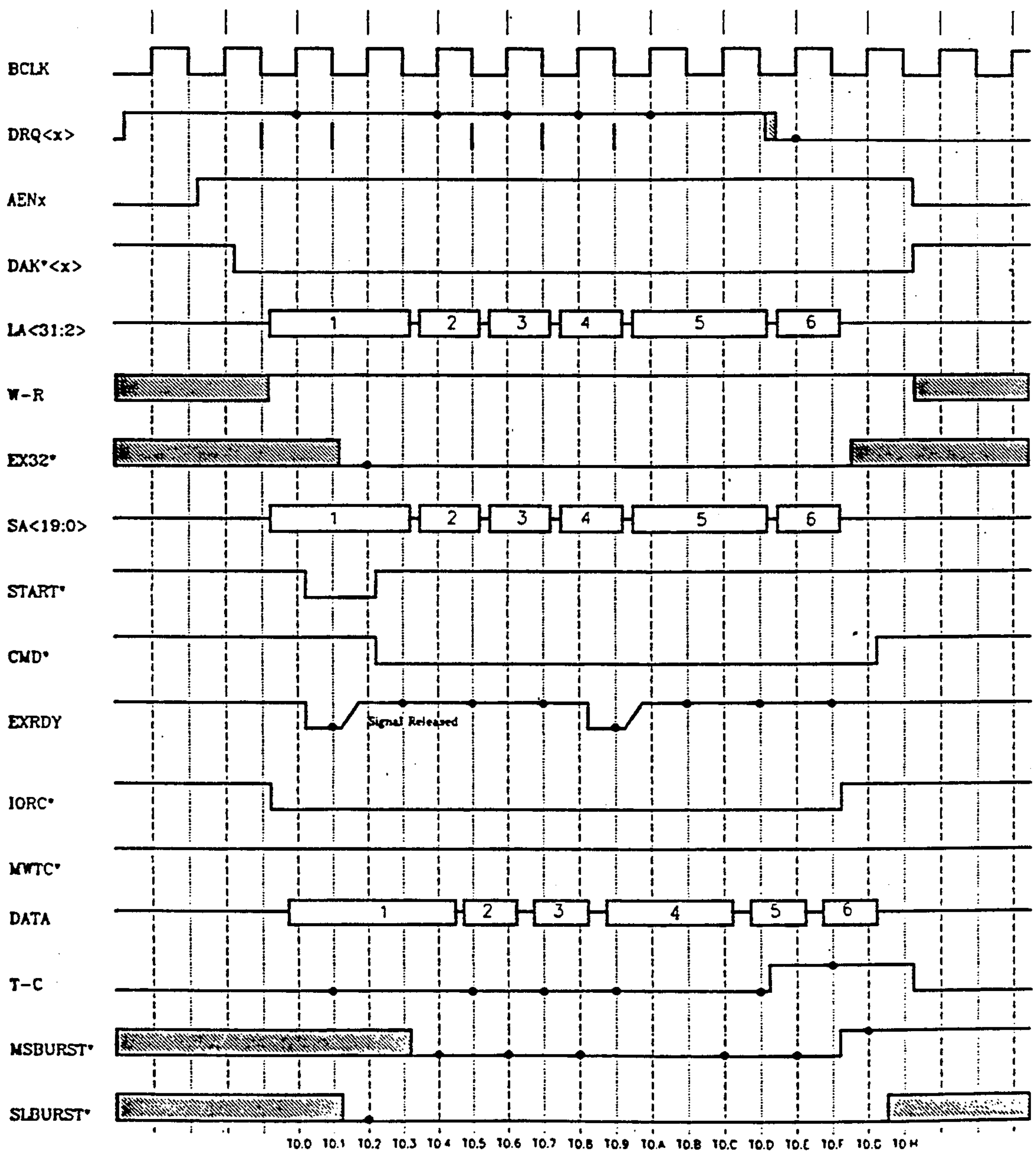
1) 32-bit DMA to 32-bit Memory, 1st Type "C" Cycle
2) 2nd cycle
3) 3rd cycle
4) 4th cycle with one wait state
5) 5th cycle
6) Last cycle (DRX<x> Dropped)
Note: Vertical marks indicate possible times to negate DRQ<x>.

Figure 37 - 32-bit DMA Transfer to 16-bit EISA Memory with Conversion - Burst DMA Cycle: Write
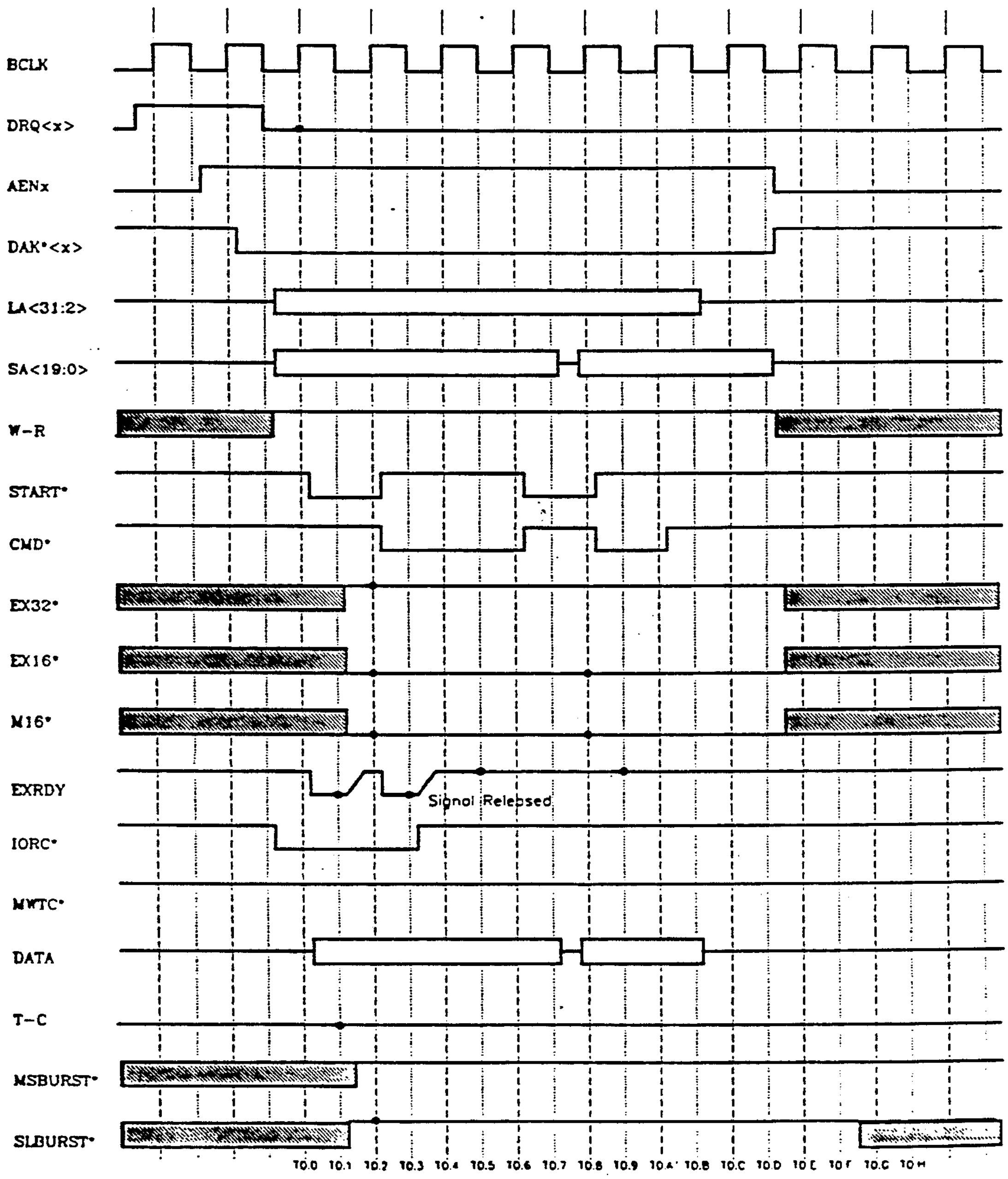
Note. The first memory cycle is shown with a wait state added by the memory slave

2.6 Data Bus Translations

EISA systems provide a mechanism for EISA expansion boards to communicate with ISA compatible devices. The EISA expansion board always communicates using EISA cycles, since the system board automatically translates EISA cycles for ISA compatible slaves.

The EISA bus provides a set of EISA data transfer cycle types that are optimized for speed. EISA cycle control signals facilitate the fast cycles. ISA devices use ISA control signals and need not recognize the EISA signals. Consequently, EISA cycles offer optimum performance, while maintaining full compatibility with ISA devices.

The EISA cycles use many of the same signals as ISA data transfers. Portions of the address and data bus, and some cycle control signals are common for all data sizes. The new signals extend the address and data size to 32 bits and provide the fast cycle timing.

An EISA bus master can communicate with an ISA slave simply by generating the EISA data and control signal, and letting the system board copy the data and translate the control signals as necessary. Similarly, a 16-bit ISA bus master can communicate with an EISA slave by generating the ISA data and control signals and letting the system board copy the data and translate the control signals as necessary.

The following transactions are automatically translated:

- Transactions between 32-bit EISA bus masters and 16-bit EISA slaves
- Transactions between 16-bit EISA bus masters and 32-bit EISA slaves
- Transactions between 16- or 32-bit EISA bus masters and 8- or 16-bit ISA slaves
- Transactions between 16-bit ISA bus masters and 16- or 32-bit EISA slaves
- Transactions between 32-bit DMA devices and 16-bit EISA slaves
- Transactions between 16-bit DMA devices and 32-bit EISA slaves
- Transactions between 16- or 32-bit DMA devices and 8- or 16-bit ISA memory
- Transactions between 8- or 16-bit DMA devices and 16- or 32-bit EISA memory

2.6.1 32-bit EISA Bus Master to 16-bit EISA Slave Transactions

The system board automatically provides data size translations for data transfers between 32-bit bus masters and 16-bit EISA slaves. A 32-bit bus master executing Burst cycles to a 16-bit EISA slave may achieve higher performance by performing its own data size translation.

The 16-bit EISA slave must develop SA<1> and the low and high byte enable signals from BE*<3:0> if it cannot wait for the system to generate SA<1> and SBHE*. However, if the slave samples BE*<3> or BE*<2> asserted at the same time as BE*<1> and BE*<0>, it uses BE*<1> and BE*<0>. This special case can occur during accesses by a 32-bit bus master. The following table illustrates the correspondence between BE*<3:0>, SA<1> and SBHE*.

| BE*<3> | BE*<2> | BE*<1> | BE*<0> | SA<1> | SA<0> | SBHE* |
|---|---|---|---|---|---|---|
| 1 | 1 | 1 | 0 | 0 | 0 | 1 |
| 1 | 1 | 0 | 1 | 0 | 1 | 0 |
| 1 | 0 | 1 | 1 | 1 | 0 | 1 |
| 0 | 1 | 1 | 1 | 1 | 1 | 0 |
| 1 | 1 | 0 | 0 | 0 | 0 | 0 |
| 1 | 0 | 0 | 1 | 0 | 1 | 0 |
| 0 | 0 | 1 | 1 | 1 | 0 | 0 |
| 1 | 0 | 0 | 0 | 0 | 0 | 0 |
| 0 | 0 | 0 | 1 | 0 | 1 | 0 |
| 0 | 0 | 0 | 0 | 0 | 0 | 0 |

32-bit EISA Bus Master to 16-bit EISA Slave Read Cycles

A 32-bit bus master is granted bus control, then presents LA<31:2>. The 16-bit EISA slave decodes a valid address from LA<31:2> and asserts EX16*. The bus master asserts START*, W-R, M-IO and BE*<3:0>. The system board samples EX32* and EX16* on the rising edge of BCLK following the assertion of START*, and asserts CMD*. At the same time, the bus master negates START* and samples EX32* . When EX32* is sampled negated, the bus master holds LA<31:2> valid while it floats START* and BE*<3:0> so the system board can perform the data size translation.

The system board negates CMD* after one BCLK period unless the slave negates EXRDY to add wait states. The system latches D<15:0> on the trailing edge of CMD*. It then asserts START*, and presents BE*<3:0> (with the high word enabled). The system board negates START* and asserts CMD*. The slave latches the address on the trailing edge of START*, and presents D<15:0>. The system board negates CMD* after one BCLK period unless the slave negates EXRDY to add wait states. The system board latches D<15:0> on the trailing edge of CMD*, copies D<15:0> to D<31:16> and asserts EX32*. The system board then presents D<31:0> and floats BE*<3:0> and START*.

The bus master regains bus control after sampling EX32* asserted on the rising edge of BCLK, then presents a new address on LA<31:2> and BE*<3:0> on the falling edge of BCLK. On the next rising edge of BCLK the bus master latches D<31:0> and asserts START* for the next cycle.

32-bit EISA Bus Master to 16-bit EISA Slave Write Cycles

A 32-bit bus master is granted bus control, then presents LA<31:2>. The 16-bit EISA slave decodes a valid address from LA<31:2> and asserts EX16*. The bus master asserts START*, W-R, M-IO, BE*<3:0>, and D<31:0>. The system board samples EX32*, EX16* and D<31:0> on the rising edge of BCLK following the assertion of START* and asserts CMD*. At the same time the bus master negates START* and samples EX32*. When EX32* is sampled negated, the bus master holds LA<31:2> valid while it floats START*, BE*<3:0>, and D<31:0> so the system board can perform the data size translation.

The system board drives D<31:0> and asserts CMD* after sampling EX32* negated. The slave may sample D<15:0> while CMD* is asserted. The system board negates CMD* after one BCLK period unless the slave negates EXRDY to add wait states. The system board presents BE*<3:0> (with the high word enabled) and asserts START*. The system board copies the latched data from D<31:16> to D<15:0>, negates START* and asserts CMD*. The system board negates CMD* after one BCLK period unless the slave negates EXRDY to add wait states. The slave latches the address on the trailing edge of START* and samples D<15:0> on the trailing edge of CMD*.

The system board returns control to the 32-bit bus master by floating BE*<3:0>, START* and D<31:0>, then asserting EX32*. The bus master samples EX32* asserted on the rising edge of BCLK and, on the next falling edge of BCLK, presents a new address. The bus master may assert START* for the next cycle on the next rising edge of BCLK.

Figure 40 shows the timing for a 32-bit EISA bus master access to a 16-bit EISA slave.

Figure 38 - 32-bit EISA Master to 16-bit EISA Slave Dword Access
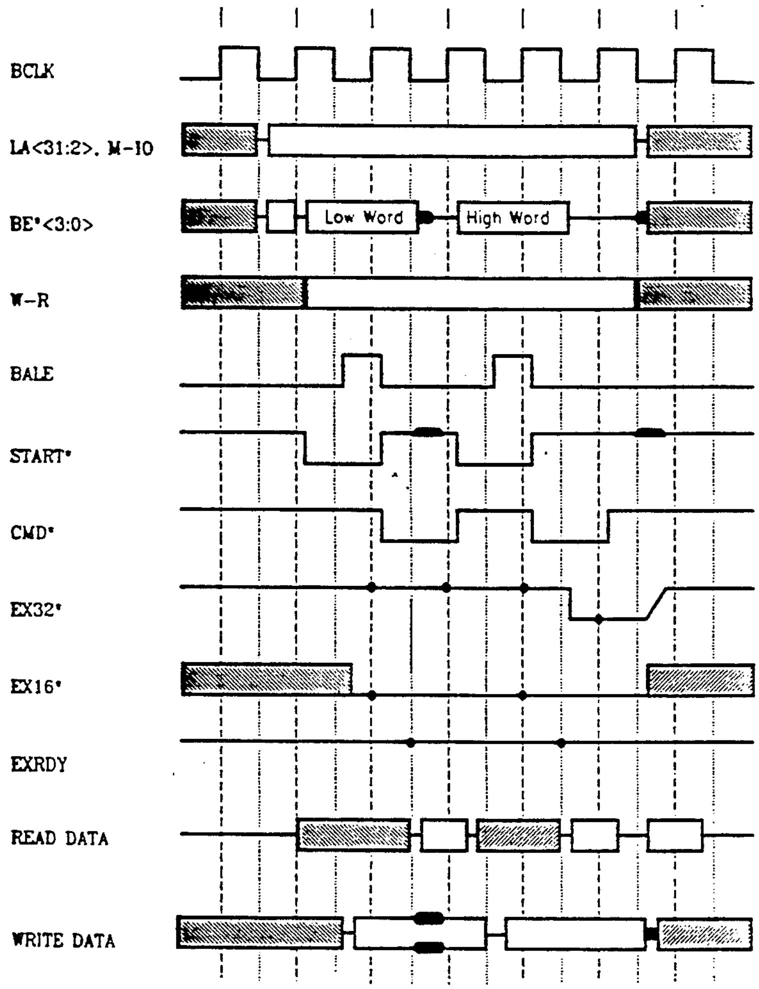
Note: Thick lines indicate where control transfers from Master to System or from System to Master.

2.6.2 16-bit EISA Bus Master to 32-bit EISA Slave Transactions

The system board automatically provides data size translations for data transfers between 16-bit EISA bus masters and 32-bit EISA slaves. This section provides an overview of the translation cycle. The following paragraph describes both read and write cycles.

A 16-bit bus master is granted control of the bus and presents LA<31:2>. The 32-bit EISA slave decodes a valid address from LA<31:2> and asserts EX32*. The bus master asserts START*, W-R, M-IO, and BE*<3:0>. The system board samples EX32* on the rising edge of BCLK following the assertion of START*, and asserts CMD*. At the same time, the bus master negates START* and samples EX16* and EX32*. The bus master performs a normal 16-bit cycle whenever it samples either EX32* or EX16* asserted. The system board copies the data from the low word D<15:0> to the high word D<31:16> during writes to odd word addresses, and copies from high to low during reads from odd word addresses. No additional BCLKs are required for this data size translation. The timing calculations for masters and slaves include the time to copy D<31:16> to D<15:0>.

2.6.3 32-bit EISA Bus Master to 16-bit ISA Slave Transactions

This section provides an overview of the translation cycle.

The system board automatically performs the following signal translations so 32-bit bus masters can use the 32-bit interface and timing when accessing ISA memory or I/O slaves:

- EISA command signals (START*, CMD*, M-IO, and W-R) are converted to ISA command signals (SMRDC*, SMWTC*, MRDC*, MWTC*, IORC*, IOWC*, and BALE).
- ISA signals NOWS* and CHRDY are converted to EISA signal EX32*.
- The timing is ISA compatible (3 BCLK standard for 16-bit).
- Data copying between D<31:16> and D<15:0> (D<7:0> for 8-bit transfers) is performed.

The following table shows the system board translation of the bus master's BE* <3:0> lines to the 16-bit slaves SA<1:0> and SBHE* lines. p

| BE*<3> | BE*<2> | BE*<1> | BE*<0> | SA<1> | SA<0> | SBHE* |
|---|---|---|---|---|---|---|
| 1 | 1 | 1 | 0 | 0 | 0 | 1 |
| 1 | 1 | 0 | 1 | 0 | 1 | 0 |
| 1 | 0 | 1 | 1 | 1 | 0 | 1 |
| 0 | 1 | 1 | 1 | 1 | 1 | 0 |
| 1 | 1 | 0 | 0 | 0 | 0 | 0 |
| 1 | 0 | 0 | 1 | 0 | 1 | 0 |
| 0 | 0 | 1 | 1 | 1 | 0 | 0 |
| 1 | 0 | 0 | 0 | 0 | 0 | 0 |
| 0 | 0 | 0 | 1 | 0 | 1 | 0 |
| 0 | 0 | 0 | 0 | 0 | 0 | 0 |

32-bit EISA Bus Master to 16-bit ISA Slave Read Cycles

A 32-bit bus master is granted bus control, then presents LA<31:2>. The ISA slave decodes a valid address from LA<23:17> and asserts M16*. The bus master asserts START* and presents W-R, M-IO and BE*<3:0>. The system board converts BE*<3:0> into SA<0>, and SBHE* and generates BALE. The system board samples EX32* and EX16* negated and M16* asserted on the rising edge of BCLK following the assertion of START*, and asserts CMD* and MRDC*. At the same time, the bus master negates START* and samples EX32*. When EX32* is negated, the bus master holds LA<31:2> valid while it floats START* and BE*<3:0> so the system board can perform the data size translation.

The system board negates MRDC* and CMD* and latches D<15:0> on the trailing edge of MRDC* and CMD*. It asserts START* and presents BE*<3:0>, SA<1>, SA<0>, and SBHE* (with the high word enabled). The conversion from EISA to ISA signals is performed again as the system board negates START* and asserts MRDC* and CMD*. The system board latches D<15:0> on the trailing edge of MRDC* and CMD*, copies D<15:0> to D<31:16>, and asserts EX32*. The system board presents D<31:0> and floats BE*<3:0> and START*.

The bus master regains bus control after sampling EX32* asserted on the trailing edge of MRDC* and CMD*, then presents a new address on LA<31:2> and BE*<3:0>. On the next rising edge of BCLK the bus master latches D<31:0> and asserts START* for the next cycle.

32-bit EISA Bus Master to 16-bit ISA Slave Write Cycles

A 32-bit bus master is granted control of the bus and presents LA<31:2>. The 16-bit ISA slave decodes a valid address from LA<23:17> and asserts M16*. The bus master asserts START*, W-R, M-IO, BE*<3:0>, and D<31:0>. The system board converts BE*<3:0> into SA<1>, SA<0>, and SBHE* and generates BALE. The system board samples EX32* negated and M16* asserted on the rising edge of BCLK following the assertion of START* and asserts CMD* and MWTC*. At the same time, the bus master negates START* and samples EX32*. Since EX32* is negated, the bus master holds LA<31:2> valid while it floats START*, BE*<3:0>, and D<31:0> so the system board can perform the data size translation.

The system board latches D<31:0> on the trailing edge of START*, then immediately drives D<31:0> and asserts CMD* and MWTC*. The system holds MWTC* and CMD* asserted for 2 BCLKs (unless modified by NOWS* or CHRDY). The slave latches D<15:0> while MWTC* is asserted. The system board asserts START*, and presents BE*<3:0>, SA<1>, SA<0>, and SBHE* (with the high word enabled). The system board copies the latched data from D<31:16> to D<15:0>, negates START* and asserts CMD* and MWTC*. The slave latches D<15:0> while MWTC* is asserted. The system holds MWTC* and CMD* asserted for 2 BCLKs (unless modified by NOWS* or CHRDY).

The system board returns control to the 32-bit bus master by floating BE*<3:0>, START* and D<31:0>, then asserting EX32*. The bus master samples EX32* asserted and, on the next falling edge of BCLK, presents a new address. The bus master may assert START* for the next cycle on the next rising edge of BCLK.

2.6.4 32-/16-bit EISA Bus Master to 8-bit ISA Slave Transactions

Transactions between 32- or 16-bit EISA bus masters and 8-bit ISA slaves use cycle control similar to transactions between 32-bit bus masters and 16-bit ISA slaves (as discussed above). The main difference is that M16* (or IO16*) is not generated by the 8-bit slave and transfers are broken into 8-bit cycles instead of 16-bit cycles. The system board provides ISA compatible 8-bit cycle timing for the slave (6 BCLK for 8-bit cycles).

2.6.5 16-bit ISA Bus Master to EISA Slaves Transactions

The system board performs the following signal translations so EISA slaves can use the EISA interface and timing when accessed by 16-bit ISA bus masters:

- Address lines SA<1:0> are converted to BE*<3:0> lines
- The ISA command signals (MRDC*, MWTC*, IORC*, IOWC*) are converted to EISA command signals (START*, CMD*, M-IO, and W-R)
- The EISA signal EXRDY is converted to the ISA signal CHRDY
- Data copying between D<31:16> and D<15:0> is performed
- M16* is asserted for EISA memory cycles
- IO16* is NOT asserted for EISA I/O accesses
- Address lines LA*<31:24> are pulled-up by resistors to logical zero. LA<16:2> are driven from SA<16:2>

A 16-bit ISA master is granted bus control, then presents LA<23:17> and SA<19:0>. Since the ISA master does not drive LA<31:24>*, this part of the address bus is pulled up by resistors to logical zero. The system board copies SA<16:2> to LA<16:2> and converts SA<1:0> and SBHE* to BE*<3:0> as illustrated in the following table.

| SA<1> | SA<0> | SBHE* | BE*<3> | BE*<2> | BE*<1> | BE*<0> |
|---|---|---|---|---|---|---|
| 0 | 0 | 0 | 1 | 1 | 0 | 0 |
| 0 | 0 | 1 | 1 | 1 | 1 | 0 |
| 0 | 1 | 0 | 1 | 1 | 0 | 1 |
| 0 | 1 | 1 | reserved | reserved | reserved | reserved |
| 1 | 0 | 0 | 0 | 0 | 1 | 1 |
| 1 | 0 | 1 | 1 | 0 | 1 | 1 |
| 1 | 1 | 0 | 0 | 1 | 1 | 1 |
| 1 | 1 | 1 | reserved | reserved | reserved | reserved |

The system board asserts M-IO and negates W-R to indicate a memory read cycle until the ISA master indicates that a different cycle is required.

The system board does not participate further in transactions between ISA masters and ISA memory slaves. However, all ISA master I/O cycles are translated to EISA cycles to provide proper operation with 8-bit EISA I/O slaves.

The EISA slave decodes a valid address from LA<31:2> and asserts EX32* or EX16*, unless it is an 8-bit EISA I/O slave. The system board asserts M16* if either EX32* or EX16* is asserted. EISA I/O slaves that must respond to 16-bit cycles from ISA bus masters must assert IO16* directly.

If the ISA master asserts IORC* or IOWC*, or if EX32* or EX16* is asserted when the ISA master asserts MRDC* or MWTC*, the system board will negate CHRDY and perform the translation to an EISA cycle. M-IO and W-R are changed if necessary to indicate the appropriate cycle. START* is asserted on the next rising edge of BCLK and data are copied between D<15:0> and D<31:16> (or D<15:8> and D<7:0> for 8-bit IO slaves) if required by BE*<3:0>. CMD* is then asserted on the next rising edge of BCLK. The EISA slave latches write data and drives read data just as it would for any other EISA cycle.

For all EISA slaves, except 8-bit EISA I/O slaves, EXRDY is then sampled on the next falling edge of BCLK. For 8-bit EISA I/O slaves; EXRDY is not sampled until the fifth falling BCLK after CMD* is asserted. When EXRDY is sampled asserted, the system board asserts CHRDY immediately. The ISA master samples CHDRY asserted, latches read data after the appropriate delay, and negates the ISA command (MRDC*, MWTC*, IORC* or IOWC*). The system board then negates CMD* on the next rising edge of BCLK for write cycles, and when the ISA command (MRDC* or IORC*) is negated for read cycles.

Figures 39 and 40 show 16-bit ISA bus master accesses to an EISA memory slave. Figures 41 and 42 show 16-bit ISA bus master access to a 16- or 32-bit EISA I/O slave.

Figure 39 - 16-bit ISA Master Read from EISA Slave
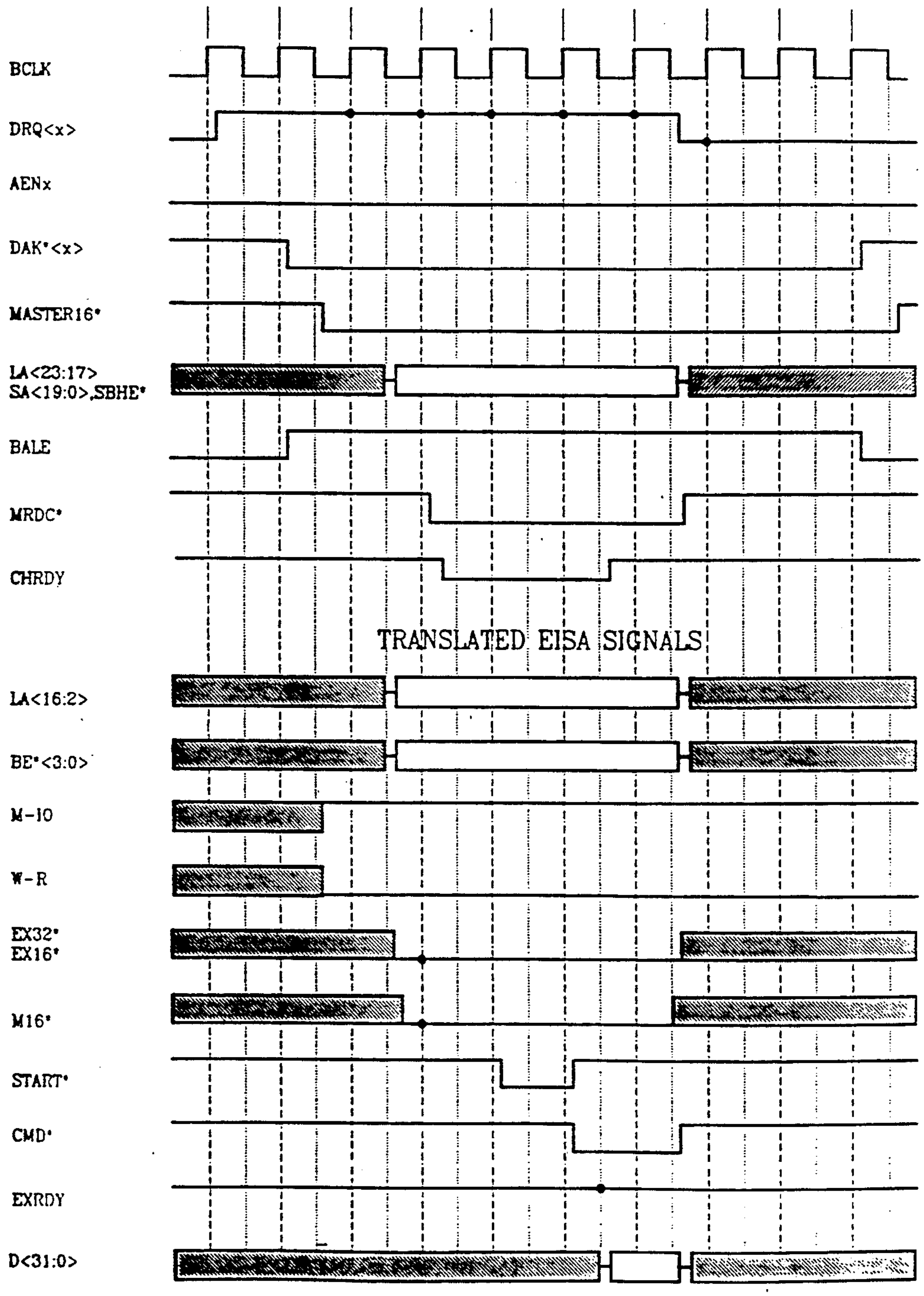

Figure 40 - 16-bit ISA Master Write to EISA Slave
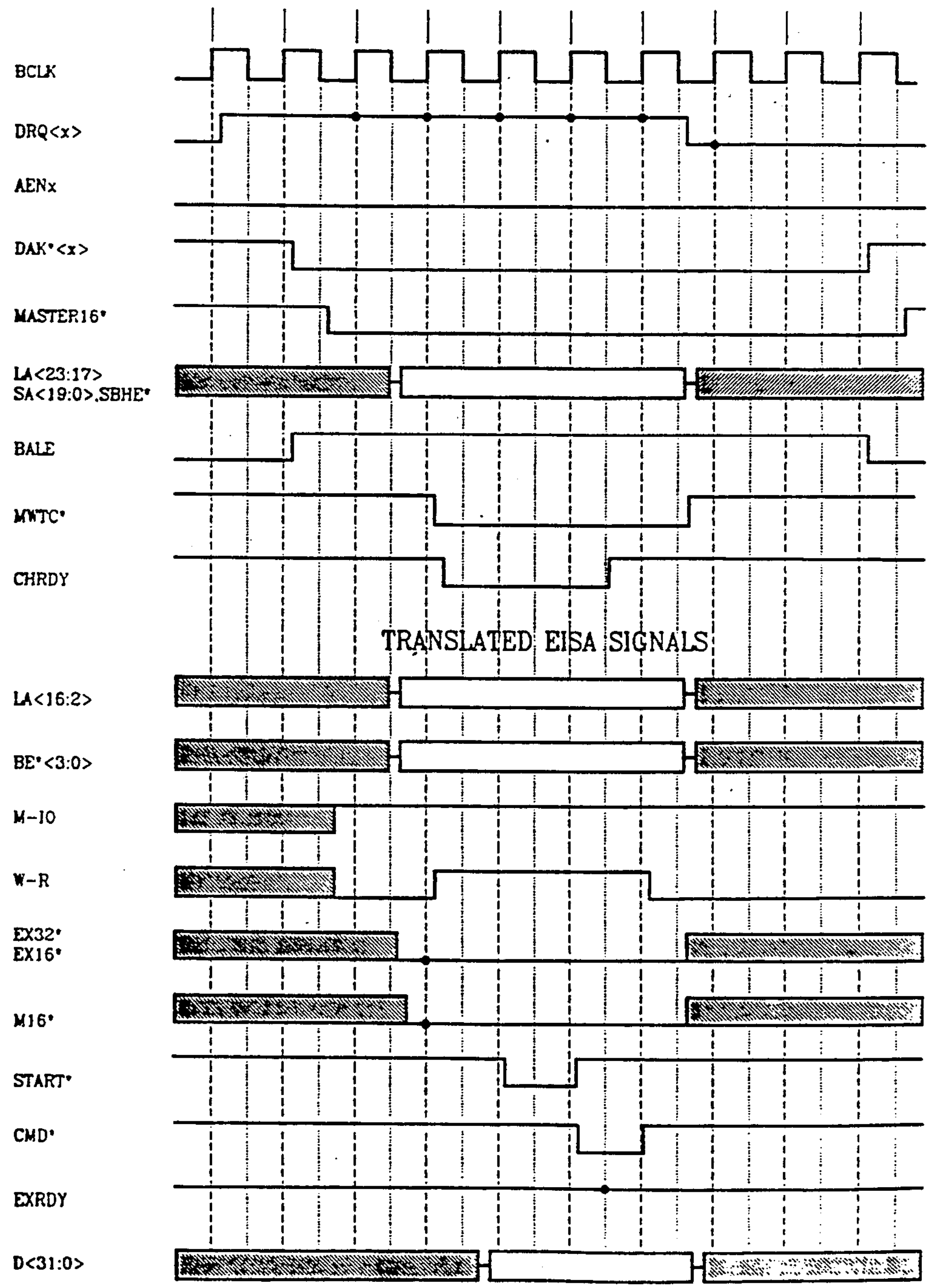

Figure 41 - 16-bit ISA Master I/O Read from 16- or 32-bit EISA I/O Slave
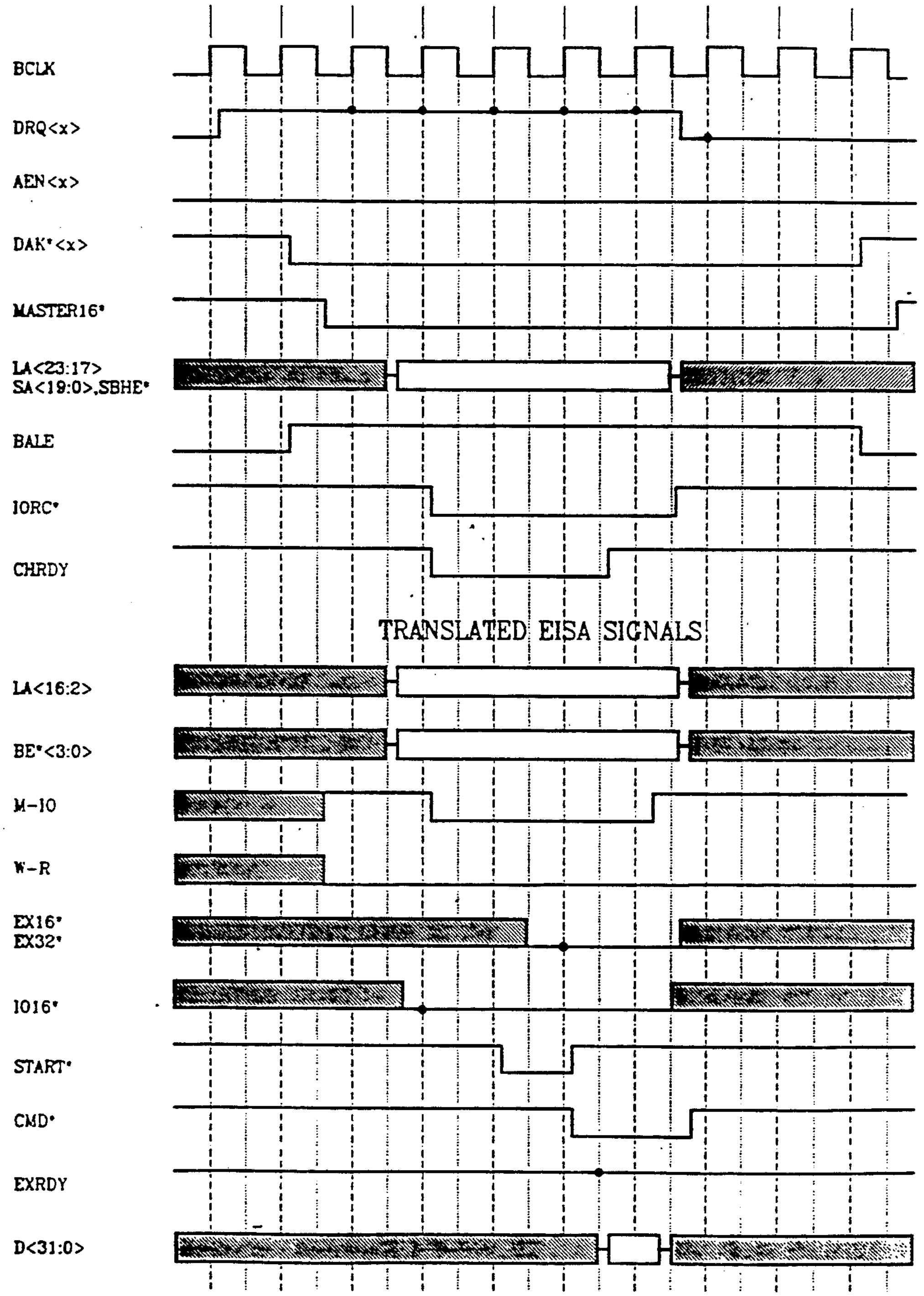

Figure 42 - 16-bit ISA Master I/O Write to 16- or 32-bit EISA I/O Slave
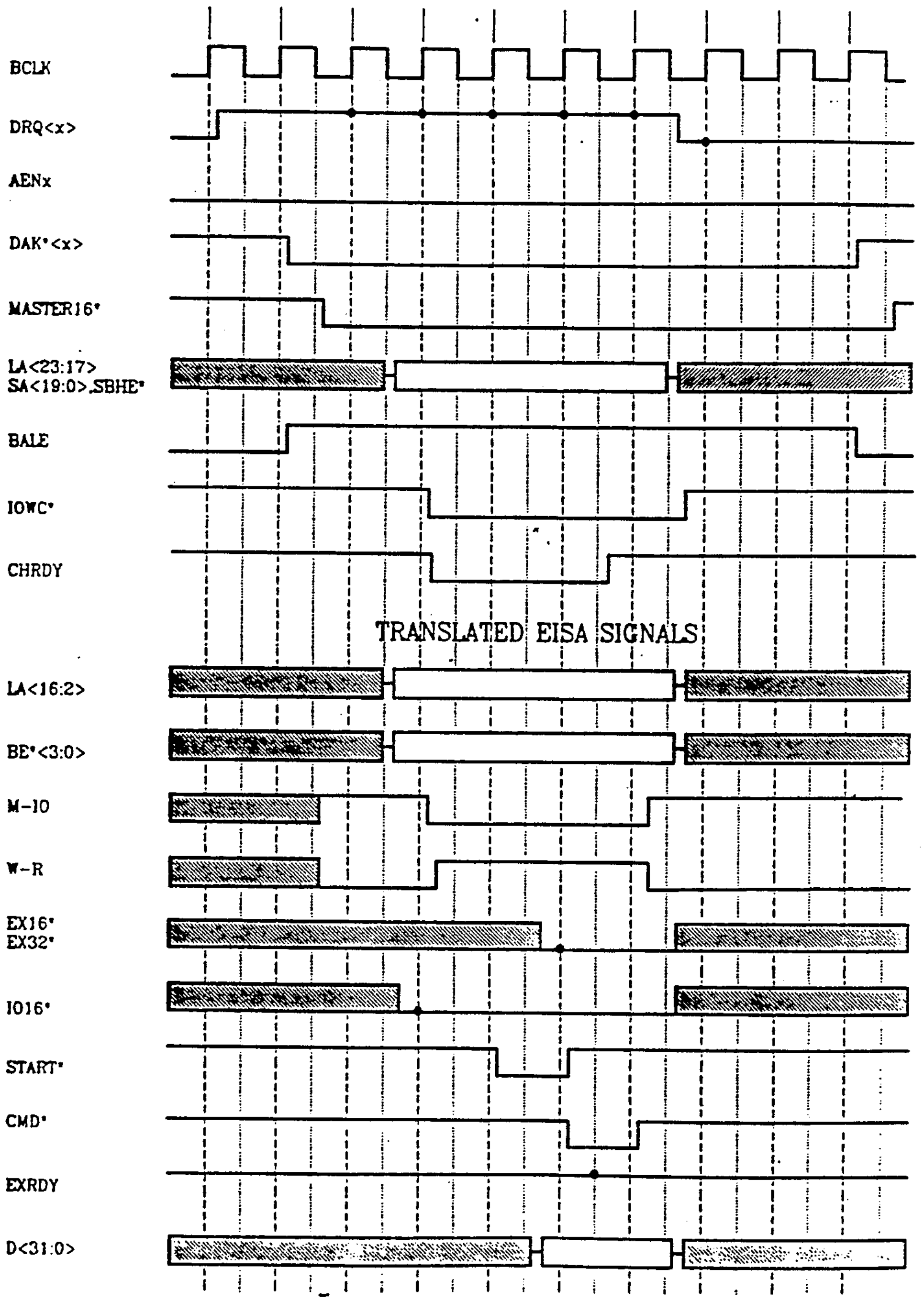

2.6.6 32-bit DMA Device to 16-bit EISA Memory Transactions

The system board automatically performs data size translation between the 32-bit DMA device and 16-bit EISA memory.

Memory Read (I/O Write)

The following paragraphs describe a single DMA read transfer between a 32-bit EISA DMA device and 16-bit EISA memory.

The EISA DMA device requests a DMA transfer by asserting DRQ<x>. The system board samples DRQ<x> asserted on the rising edge of BCLK and requests control of the bus. The arbitration controller arbitrates the request and grants control of the bus to the DMA controller. The system board then asserts DAK*<x>.

The system board presents LA<31:2> when DAK*<x> is asserted. The 16-bit EISA memory decodes the address and asserts EX16*. The system board asserts START*, W-R, M-IO, and BE*<3:0>. The system board samples EX32* and EX16* on the rising edge of BCLK following the assertion of START*, and asserts CMD*. IOWC* is also asserted and held until the word assembly completes.

If the DMA was programmed as a Burst, the MSBURST* signal remains negated.

On the next rising edge of BCLK the system board latches D<15:0> and the system board negates CMD*, asserts START* and presents BE*<3:0> (with the high word enabled). The system board then, on the next BCLK rising edge, negates START* and asserts CMD*. The 16-bit EISA memory decodes the address and presents D<15:0>. On the next rising edge of BCLK the system board latches D<15:0>, negates CMD* and copies the data from D<15:0> to D<31:16>. The system board presents the assembled 32-bit data on D<31:0> and negates IOWC*. The 32-bit EISA DMA device latches the data on the trailing edge of IOWC*.

The 16-bit EISA memory may request wait states by asserting EXRDY, as in Standard cycles.

In the case of a single transfer DMA cycle, the system board negates DAK*<x> and releases the bus. If Block or Demand mode DMA is programmed, the DMA transfer repeats the above block until preempted or completion.

Memory Write (I/O Read)

The following paragraphs describe a single DMA write transfer between a 32-bit EISA DMA device and 16-bit EISA memory.

The EISA DMA device requests a DMA transfer by asserting DRQ<x>. The system board samples DRQ<x> asserted on the rising edge of BCLK and requests control of the bus. The system board arbitrates the request and grants control of the bus to the DMA controller. The system board then asserts DAK*<x>.

The system board presents LA<31:2> when DAK*<x> is asserted. The 16-bit EISA memory decodes the address and asserts EX16*. The system board also asserts IORC*, and the EISA DMA device, sampling both IORC* and DAK*<x> asserted, presents its data on D<31:0> The system board asserts START*, W-R, M-IO, and BE*<3:0>. The system board samples EX32*, EX16*, and M16* on the rising edge of BCLK following the assertion of START*, and asserts CMD*. When EX32* is sampled negated and EX16* asserted the system board latches the 32-bit data and negates IORC*. The EISA DMA device ceases driving the data bus when IORC* is negated, allowing the system board to continue driving D<15:0>.

If the DMA was programmed as a Burst, the MSBURST* signal remains negated.

The 16-bit EISA memory can latch the data while CMD* is asserted. On the next BCLK rising edge, the system board negates CMD*, asserts START*, and copies the upper 16 bits of the data to D<15:0>. On the next BCLK rising edge, the system board negates START* and the system board asserts CMD*. The ISA memory latches the data while CMD* is active. One BCLK later, the system board negates CMD*, ending the transfer.

The DMA controller continues executing cycles until preemption or reaching terminal count (for Block or Demand DMA modes). The DMA controller suspends DMA processes executed in single transfer mode after each cycle by negating DAK*<x> and releasing the bus.

2.6.7 16-bit DMA Device to 32-bit EISA Memory Transactions

The system board automatically performs data copying between D<31:16> and D<15:0> so a 16-bit DMA device can communicate with a 32-bit EISA memory slave. The following paragraphs describes both DMA read and write transfers from 16-bit DMA devices to 32-bit EISA memory:

A 16-bit DMA device requests a transfer by asserting DRQ<x>. The system board samples DRQ<x> asserted on the rising edge of BCLK and requests control of the bus. The system board arbitrates the request and grants control of the bus to the DMA controller. The system board then asserts DAK*<x>.

The DMA controller performs a 16-bit DMA read or write according to the programmed timing. Accesses to the 32-bit EISA memory do not affect the DMA transfer timing since only data copying is required. The data is copied from the D<31:16> to D<15:0> on reads and D<15:0> to D<31:16> on writes. Therefore, a normal 16-bit DMA transfer is performed, and a normal 16-bit memory access to the EISA memory occurs, without any special cycles or timing needed. No additional BCLKs are required; the timing calculations for the DMA device include copy time.

2.6.8 8-bit DMA Device to 16- or 32-bit EISA Memory Transactions

The system board automatically performs data copying so an 8-bit DMA device can communicate with a 16- or 32-bit EISA memory slave.

The system board performs the translation in a manner similar to the translation between 16-bit DMA devices and 32-bit EISA memory discussed previously, except that the system board copies data to the appropriate byte lane for the 16- or 32-bit memory.

2.6.9 16- or 32-bit DMA Device to 8- or 16-bit ISA Memory Transactions

The system board automatically performs data size translation so a 16- or 32-bit DMA device can communicate with an 8- or 16-bit ISA memory slave.

The system board performs the translation in a manner similar to the 32-bit DMA translation to 16-bit EISA memory discussed previously, with the following differences:

- A 16-bit ISA memory asserts M16* instead of EX16* (8-bit memory does not assert anything).
- The ISA memory uses CHRDY and NOWS* to control cycle timing instead of EXRDY.
- The signals MRDC* or MWTC* (as appropriate) are asserted.
- The timing is ISA compatible (3 BCLK standard for 16-bit, 6 BCLK for 8-bit cycles).

2.7 Locked Cycles

The main CPU or a bus master can assert LOCK* to guarantee exclusive memory access during the time LOCK* is asserted. A bus master can also assert LOCK* to guarantee exclusive I/O access during the time LOCK* is asserted. Assertion of LOCK* allows bit test-and-set operations (as used for semaphores) to be executed as a unit, with the bus lock preventing multiple devices from simultaneously modifying the semaphore bit.

The main CPU asserts LOCK* during the execution of certain instructions that follow a LOCK instruction prefix and while executing an XCHG instruction.

A bus master can perform locked bus cycles by asserting LOCK* in the first cycle of a locked access before the end of CMD*. LOCK* is negated on or after the BCLK edge at the trailing edge of CMD* on the last cycle of the locked access. The bus master must negate LOCK* before releasing the bus. The LOCK* signal should be floated with the other control signals (START*, MSBURST*, etc.) at the end of the bus access.

The bus master must not initiate a sequence of locked cycles after the system board negates MAKx* for a bus preemption. A locked sequence started with MAKx* asserted has at least 64 BCLK periods to complete. A locked sequence started after the system board negates MAKx* causes a bus timeout if it starts too late to complete before the 64 BCLK timeout.

The bus master must not initiate a sequence of locked cycles that cannot complete before the 64 BCLK bus preemption timeout. For example, the bus master should avoid executing any locked sequence to a dword located in slow 8-bit memory. An 8-bit memory with 2.5 $\mu$s cycle time (maximum wait states) requires 10 $\mu$s to do a 32-bit read operation. A locked read-modify-write that starts just before the system board negates MAKx* causes a bus timeout to occur on the BCLK after the read portion of the locked sequence.

A bus master can access shared memory and I/O on successive controllers, leaving them all locked until the bus master negates LOCK*.

An intelligent controller with shared local memory or I/O must monitor LOCK* at the rising edge of BCLK. If a valid address within its local memory or I/O address range is decoded with LOCK* and CMD* asserted, the controller must inhibit shared memory or I/O access until it samples LOCK* negated. LOCK* is asserted (if at all) during the first BCLK of CMD*. LOCK* remains asserted at least until the end of CMD* of the last cycle to be locked. The slave, once addressed with LOCK* asserted, must wait until LOCK* is sampled negated before allowing shared access by the local device, even if intervening cycles to other addresses or idle cycles are noted.

If a slave supports Burst, then it must lock together those cycles that have LOCK* asserted at the end of each subcycle (sampling at rising edge of BCLK).

Figure 43 - LOCK Timing Example
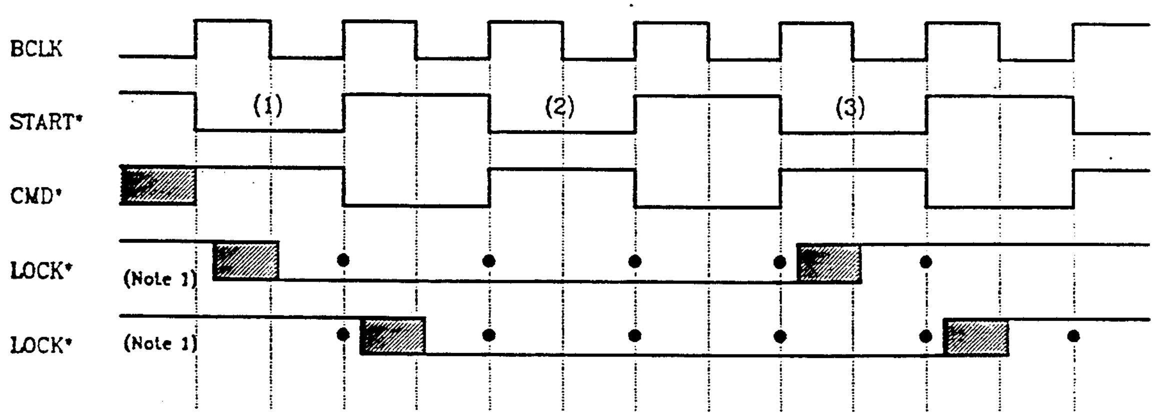
Cycle 1 and 2 are locked together, cycle 3 is not expected to be locked by the master.
Note 1: LOCK* timing may be either way (or a combination of the two), the slave must lock cycle 1 and 2 together, cycle 3 is not expected to be locked with the others by the master, but may be at the option of the slave.

2.8 EISA Devices

2.8.1 Memory Slaves

A memory slave monitors LA<31:2>, and, after decoding a valid memory address, asserts EX32* (32-bit slaves) or EX16* (16-bit slaves) to indicate its data size. The slave can begin processing the cycle when START* is asserted. The slave can lengthen the cycle by negating EXRDY during START*. The slave can hold EXRDY negated for a maximum cycle time of 2.5 $\mu$s, and must float EXRDY synchronously with the falling edge of BCLK. Setup and hold time to BCLK specifications must be met on EXRDY assertion for proper system operation. On memory reads, a slave drives only the data bytes indicated by BE*<3:0>. On memory writes, the slave samples only the data bytes indicated by BE*<3:0>. (See table of allowable BE*<3:0> combinations under BE*<3:0> signal description.)

A memory slave that requires refresh must monitor REFRESH*. If the slave samples REFRESH* asserted on the leading edge of START*, then it should use LA<15:2> to generate the refresh address (LA<31:16> should be ignored). The bits driven on LA<15:2> contain a scrambled refresh address. LA<15:10> contain the high order refresh bits, LA<7:0> contain the low order refresh bits, LA<9> is refresh<1>, and LA<8> is refresh<0>. The refresh cycle is two BCLKs long (from leading edge of START* to the trailing edge of CMD*) unless the slave extends the cycle by negating EXRDY. For best system performance, a slave should not extend the refresh cycles.

Memory slaves that support Burst cycles must also support standard memory cycles as described above. Burst memory slaves must also be able to transfer 32 bits of data (or 16 bits for a 16-bit memory slave) each BCLK after the initial cycle. The actual amount of data transferred in a given cycle depends on the state of the BE*<3:0> lines. During the Burst sequence, the address changes on each falling edge of BCLK and the data should be driven or latched on each rising edge of BCLK.

During a Burst read, the memory slave must not begin to enable the data onto the bus until the specified time after the rising edge of BCLK. Only those bytes of data specified by the BE*<3:0> lines should be driven and the data buffers that are not enabled for the next cycle must be floated within the specified float time. These requirements allow the system to copy the data for 16-bit masters without bus conflict.

The Burst sequence provided to a Burst slave never crosses a 1024 byte address boundary (LA<31:10> does not change during a Burst). A master or system terminates a Burst sequence and restarts it with a new initial cycle if the Burst transfer does cross the 1024 byte boundary. Note that the address provided by the master is not required to be sequential, only within the 1024 byte address boundary. Also, fewer than 32 bits of data may be transferred, with the BE*<3:0> lines indicating the proper amount. The Burst sequence is defined such that it must be all reads or all writes. The W-R line does not change during a Burst. (See Figure 46.)

The Burst slave generates SLBURST* to indicate that it can accept a Burst, and samples MSBURST* to determine if Burst cycles will be used by the master or system. SLBURST* is decoded from the address and M-IO signals (the same decode logic as EX32* can be used but the signal must be driven by a separate open collector type driver). MSBURST* is sampled on the rising edge of BCLK at the end of each subcycle to determine if another subcycle is to be run.

A memory slave can negate EXRDY to lengthen Burst subcycles (add wait states) in one BCLK increments. The memory slave controls the number of wait states by asserting (and floating) EXRDY from falling edges of BCLK (to meet the setup and hold requirements). When wait states are added to the last subcycle of a Burst, the bus master holds MSBURST* asserted until it samples EXRDY asserted. Figure 44 and 45 show the relevant signals for an EISA memory slave with wait states added.

Memory slaves can use COMPRESSED Cycles to improve data transfer rates. The slave asserts NOWS* after sampling START* asserted. The system board samples NOWS* on the trailing edge of START* and compresses the length of CMD* to 1/2 BCLK. Bus masters cannot execute COMPRESSED cycles. The slave must be able to accept normal CMD* timing, even if it asserts NOWS*. (See Figure 47 for an illustration of the signals relevant to this operation.) A slave must not assert EXRDY and NOWS* during the same cycle. The bus timing parameter tables provide minimum timing specifications for address setup, START* and CMD*. The maximum time limits depend on the device generating the cycle. A memory slave must be able to accept whatever timing is generated.

A memory slave must latch the address (including M-IO and W-R) if it requires a valid address after assertion of CMD*. The address may be latched with the trailing edge of START* or the leading edge of CMD*. A slave that supports compressed cycles can use the rising edge of BCLK after assertion of START*.

EISA is a 32-bit standard, with a bus and connector that provide a 32-bit data and address bus. Sixteen-bit EISA expansion boards must support the 32-bit address bus and connectors. Sixteen-bit EISA memory slaves must decode the entire 32-bit address to maintain compatibility with all EISA systems. An EISA bus master can perform transfers to any 32-bit memory address, even in systems with a 16-bit main CPU.

EISA memory slaves can have multiple noncontiguous memory segments at addresses above 16 MB. Memory mapped at addresses between 0 KB and 640 KB must be contiguous starting at zero. Memory mapped at addresses between 1 MB and 16 MB must be contiguous starting at 1 MB.

Memory mapped I/O slaves that decode the full 32-bit address should be mapped at an address above 2 GB.

Figure 44 - Memory Slave with Wait States
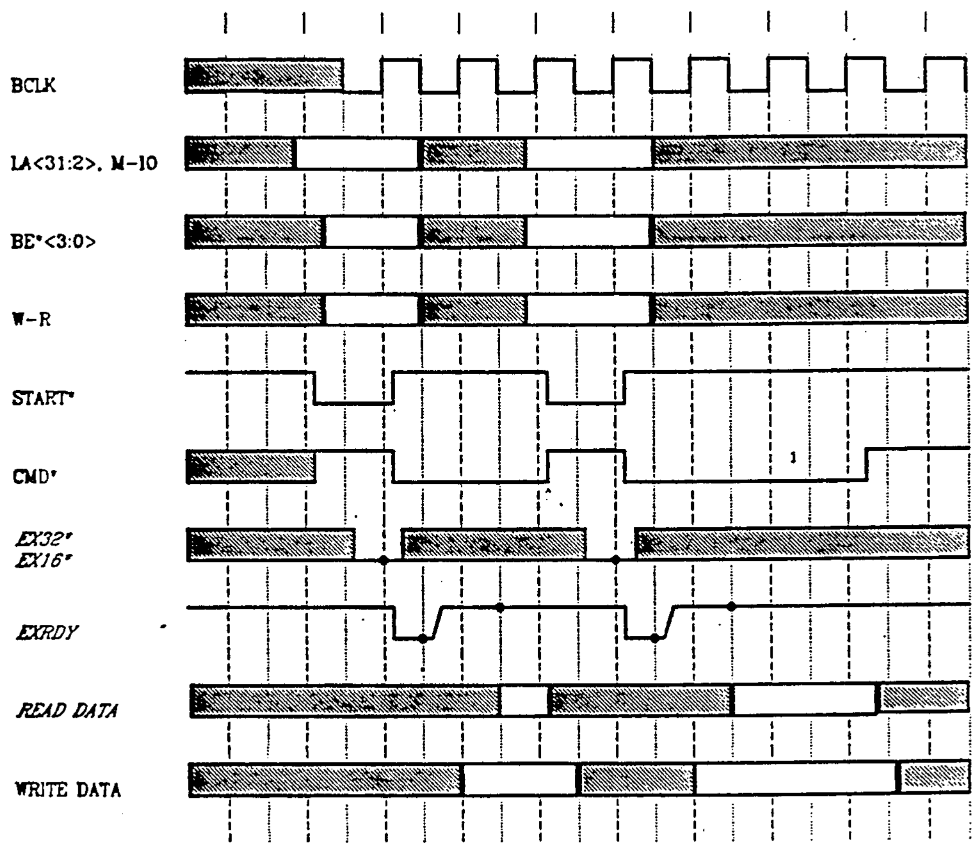
Note: Italicized signals indicate output of slave.
1) CMD* extended by master or system.

Figure 45 - BURST EISA Memory Slave with Wait States
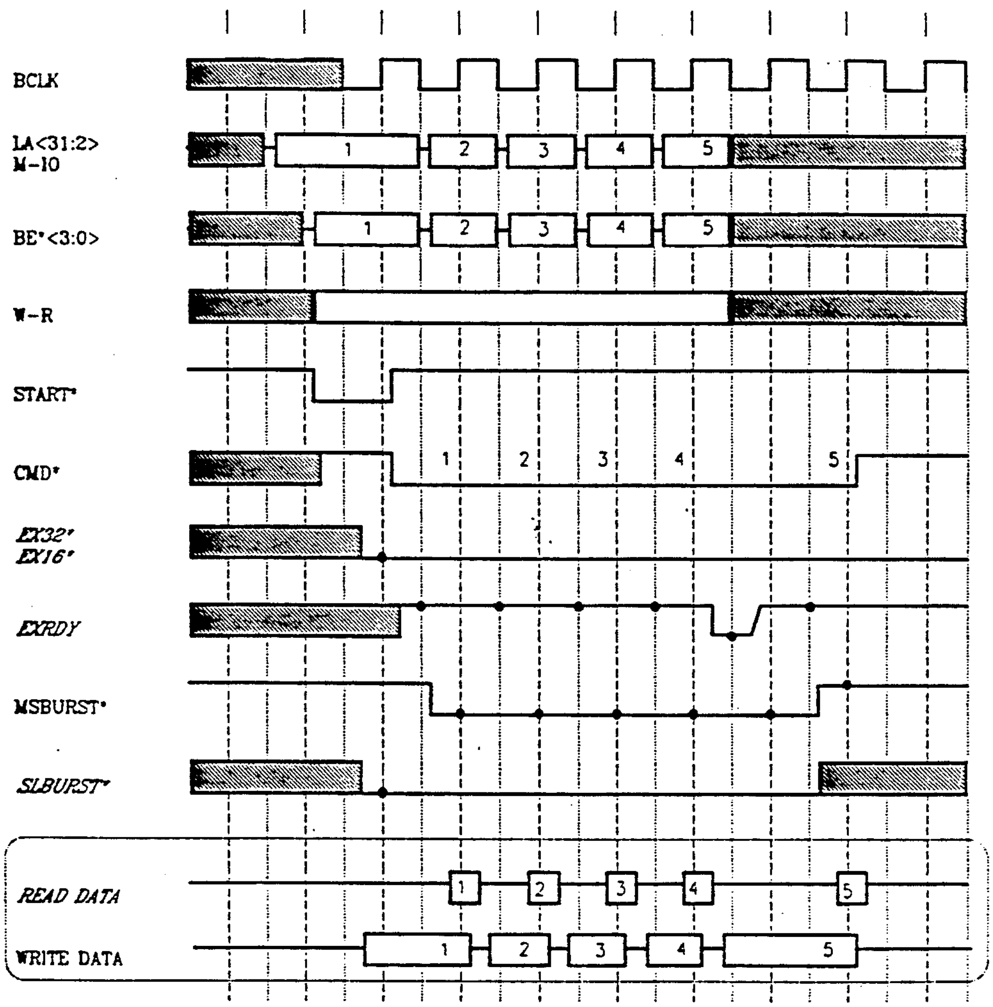
1) EISA Standard Access (Start of Burst)
2) EISA Burst Access
3) EISA Burst Access
4) EISA Standard Access
5) EISA Burst Access with One Wait State
Note: Italicized signals indicate output of slave.

EXTENDED INDUSTRY STANDARD ARCHITECTURE
CONFIDENTIAL INFORMATION OF BCPR SERVICES, INC.
Figure 46 - EISA Memory Slave (Burst Cycle)
Page Boundary Condition
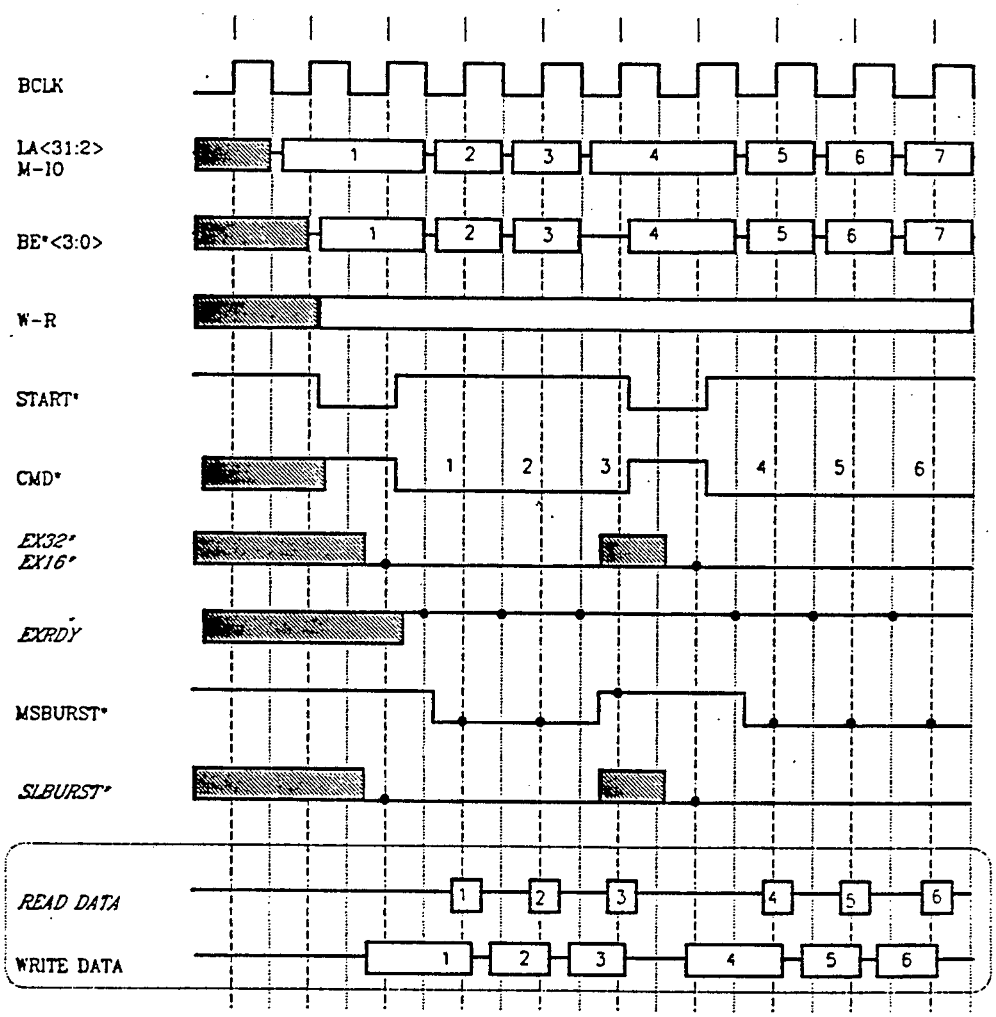
1) EISA Standard Access (Start of Burst)
2) EISA Burst Access
3) EISA Burst Access (last burst of page)
4) EISA Standard Access (start of new page)
5,6,7) EISA Burst Access
Note: Italicized signals indicate output of slave device.

**Figure 47 - EISA Memory Slave (Standard Cycle) NOWS* Asserted**
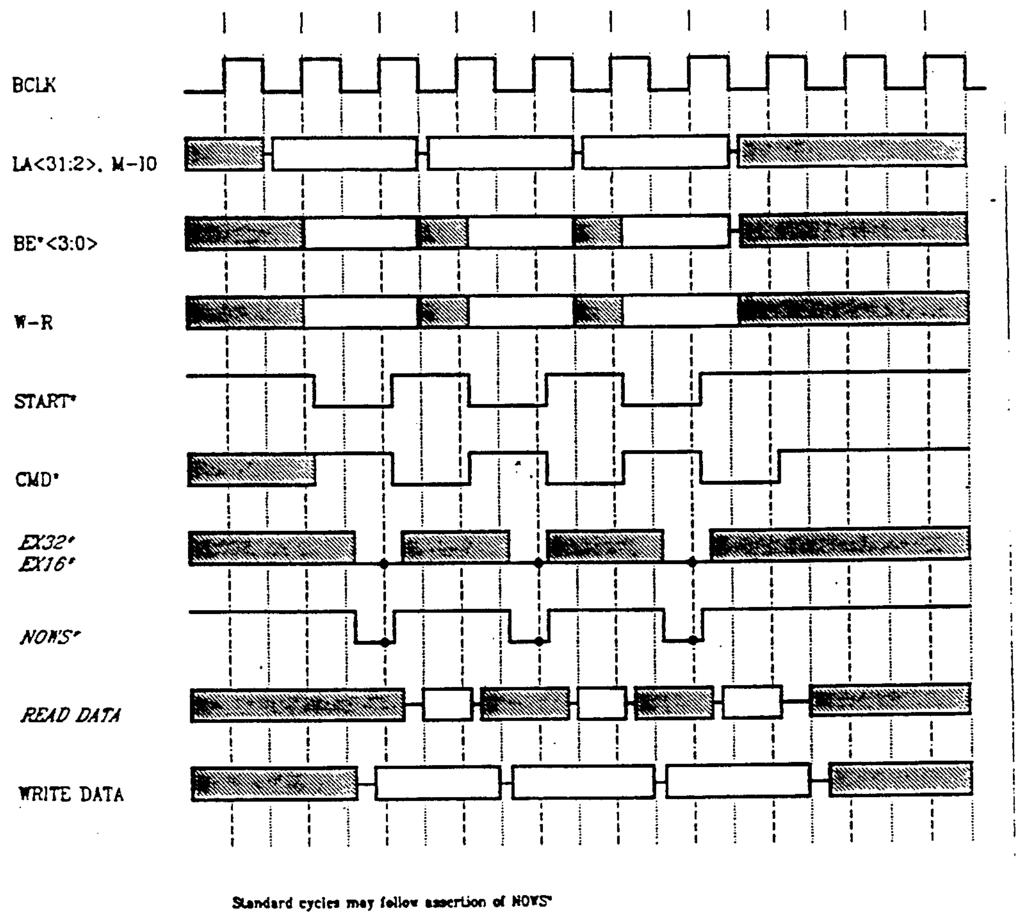
Note: Italicized signals indicate output of slave device.

2.8.2 I/O Slaves

An I/O slave asserts EX32* (or EX16* for a 16-bit I/O slave) when and as long as a valid I/O address is decoded on LA<15:2> with M-IO and AENx low. EX32* should not be latched.

The system board does not automatically assert IO16* when a 16-bit ISA bus master accesses an EISA I/O slave. EISA slaves that support 16-bit ISA bus masters must assert IO16* as well as EX32* (or EX16*) when addressed. IO16* is asserted on decoding a valid address on the LA<15:2> address bus. I/O slaves that do not support 16-bit ISA bus masters need not assert IO16*.

The slave can begin processing the cycle when START* is asserted. The slave may lengthen the cycle by negating EXRDY during the time that START* is asserted. Assertion of EXRDY must meet the setup and hold time specification to BCLK for proper system operation. Therefore, the falling edge of BCLK should be used to float EXRDY. For read cycles the slave drives only the data bytes indicated by BE*<3:0> when IORC* is asserted. For write cycles, only the data bytes indicated by BE*<3:0> are written when IOWC* is asserted. (See table of allowable BE*<3:0> combinations under BE*<3:0> signal description.)

I/O slaves can use COMPRESSED Cycles to improve data transfer rates. The slave asserts NOWS* after sampling START* asserted. The system board samples NOWS* on the trailing edge of START* and compresses the length of CMD* to 1/2 BCLK. Bus masters cannot execute COMPRESSED cycles. The slave must be able to accept normal CMD* timing, even if it asserts NOWS*. A slave must not assert EXRDY and NOWS* during the same cycle. The bus timing parameter tables provide minimum timing specifications for address setup, START* and CMD*. The maximum time limits depend on the device generating the cycle. An I/O slave must be able to accept whatever timing is generated.

A slave canextend cycle timing by negating then asserting EXRDY on BCLK edges. The system board and EISA bus masters maintain the relationship of BCLK to the trailing edge of START* and the leading edge of CMD*. BCLK toggles during all cycles, but its period may be extended on some cycles. The BCLK high or low time always meets the minimum specified in the bus timing parameter table.

An I/O slave must latch the address (including M-IO, W-R, and AENx) if it requires a valid address after assertion of CMD*. The address can be latched with the trailing edge of START* or the leading edge of CMD*. A slave that supports COMPRESSED cycles must use the rising edge of BCLK after assertion of START*.

An EISA device (such as a bus master) can be designed to respond as an 8-bit I/O slave as well as a 16- or 32-bit I/O slave. In this case, the slave need not drive EX32*, EX16*, or IO16*. The slave uses LA<15:2>, AENx, M-IO, and BE*<3:0> for addressing. It uses START*, CMD*, NOWS*, and EXRDY for timing control. It uses D<7:0> to transfer the data. The default timing for these cycles is 1 BCLK for START*, and 5 BCLKs for CMD*. Wait states can be added by negating EXRDY, and the default timing can be shortened by asserting NOWS* (in the same fashion as for ISA 8-bit slaves).

The 8-bit slave should not assert NOWS* during START* or the first clock of CMD*. NOWS* can be asserted during the 2nd, 3rd, or 4th BCLK when CMD* is asserted to shorten the standard 6 BCLK cycle to 3, or 5 BCLKs. If EXRDY is negated by the 8-bit slave, it has no effect until the fifth BCLK of CMD*. If EXRDY is sampled negated on the falling edge of BCLK in the 5th BCLK of CMD* asserted, then the system board lengthens CMD* in BCLK increments until EXRDY is floated and sampled asserted. EXRDY should not be negated if NOWS* is asserted.

2.8.3 Bus Masters

EISA bus masters are fully synchronous with BCLK. An EISA master drives LA<31:2>, BE*<3:0>, M-IO, W-R, D<31:0>, START*, MREQx*, and MSBURST* (if necessary) from BCLK edges. The 32-bit master monitors EX32* (a 16-bit bus master monitors both EX16* and EX32* and treats them as equivalent), EXRDY, and MAKx*. These signals are also synchronous to BCLK.

A bus master requests control of the bus by asserting MREQx* and receives control when it samples MAKx* asserted on the rising edge of BCLK. The bus master drives LA<31:2> and M-IO valid on the next falling edge of BCLK. On the next rising edge of BCLK, W-R and BE*<3:0> are presented and START* is asserted. On write cycles, the bus master presents valid data on the next falling edge of BCLK.

On the next rising edge of BCLK, the master negates START*, and the system board asserts CMD*. The bus master samples EX32* (32-bit bus masters) and EX16* (16-bit bus masters) on the same rising edge of BCLK to determine if the slave being accessed is an EISA slave with equal or greater data size. If the appropriate signal (EX32* or EX16*) is sampled asserted, the bus master can present the next address on the falling edge of BCLK to begin the next cycle. The bus master must wait for EXRDY to be asserted before completing the cycle and asserting the next START*. On read cycles, the data is sampled on the rising edge of BCLK after the slave asserts EXRDY. On write cycles the bus master must hold the data valid until the falling edge of BCLK after the slave asserts EXRDY.

If the bus master sampled EX32* negated (or both EX16* and EX32* negated for 16-bit bus masters), then the system board performs data size translation. The bus master floats D<31:0> (on write cycles), BE*<3:0>, START* (for all cycles), and MSBURST* (for Burst cycles) on the falling edge of BCLK (after negation of START*) and the system board performs the data size translation. The bus master regains control of the cycle after sampling EX32* (or EX16* for 16-bit bus masters) asserted on the rising edge of BCLK. When the appropriate signal (EX32* or EX16*) is sampled asserted the bus master can present the next address on the falling edge of BCLK to begin the next cycle. (See Figure 48.)

When the bus master no longer requires control of the bus it negates MREQx* on the falling edge of BCLK. The bus master, on the falling edge of BCLK before the cycle is finished, floats LA<31:2>, BE*<3:0>, M-IO, and W-R. On the next rising edge, START* and MSBURST* (for Burst cycles) must be floated. On the next falling edge of BCLK, the bus master floats D<31:0> (on writes). The system board negates MAKx* when it samples MREQx* negated.

A bus master may be preempted by the system board or another bus master. The system board negates MAKx*, indicating to the bus master that it must finish the current bus cycle and relinquish control of the bus (by negating MREQx*) within 64 BCLK periods (8 μs). It is suggested that masters complete operations within a shorter time (such as 32 BCLK periods) to reduce bus latency for other masters or the CPU. Figure 49 illustrates the relevant signals of an EISA bus master preempted during a normal cycle.

Any 16-bit bus masters must drive MASTER16* asserted from MAKx* and keep it asserted until the bus is released. On bus "release", the MASTER16* line is floated. For standard EISA cycles, "release" is the same time as START* is floated. For cycles where bus assembly occurs the release is on the rising edge of BCLK after EX16* is sampled asserted.

EXTENDED INDUSTRY STANDARD ARCHITECTURE
CONFIDENTIAL INFORMATION OF BCPR SERVICES, INC.
Figure 48 - EISA Bus Master Write Cycle with Data Translation
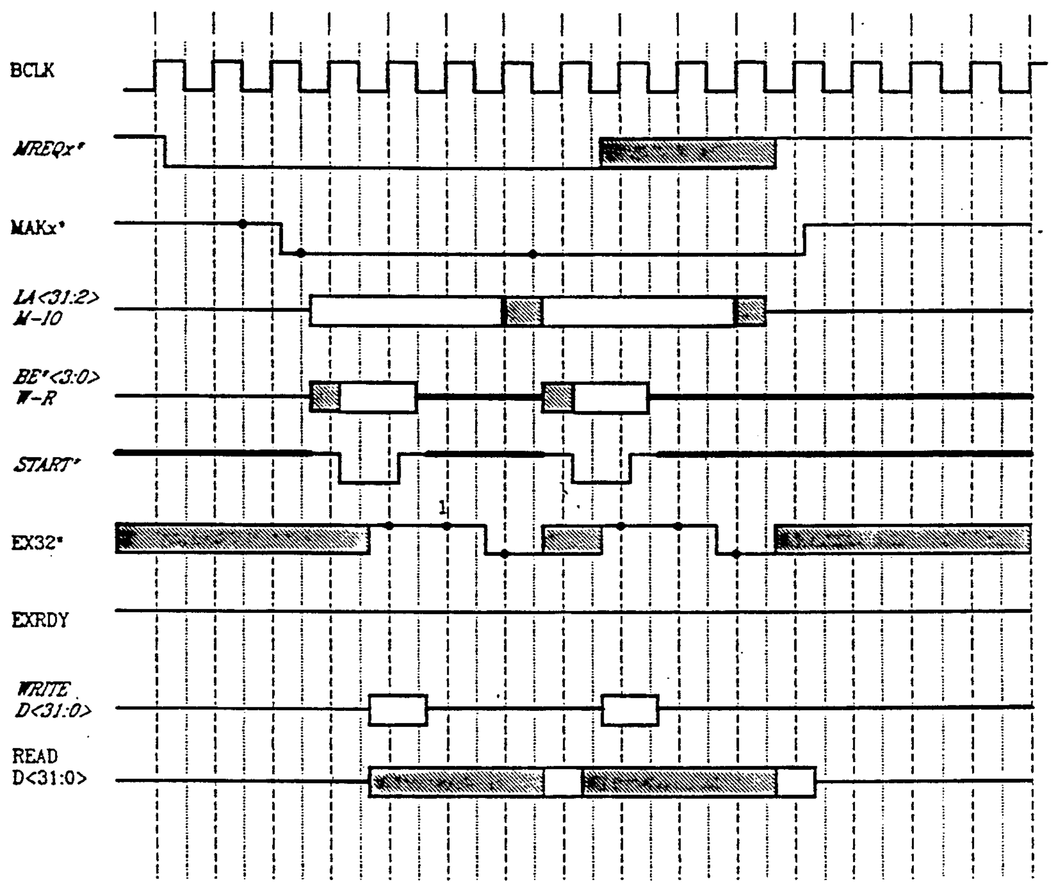
Notes: Heavy lines indicate float by master device.
Italicized signals indicate output of master device.
1) EX32* may also be sampled on the falling edges of BCLK.

Figure 49 - EISA Bus Master
Preempt During Normal Cycle
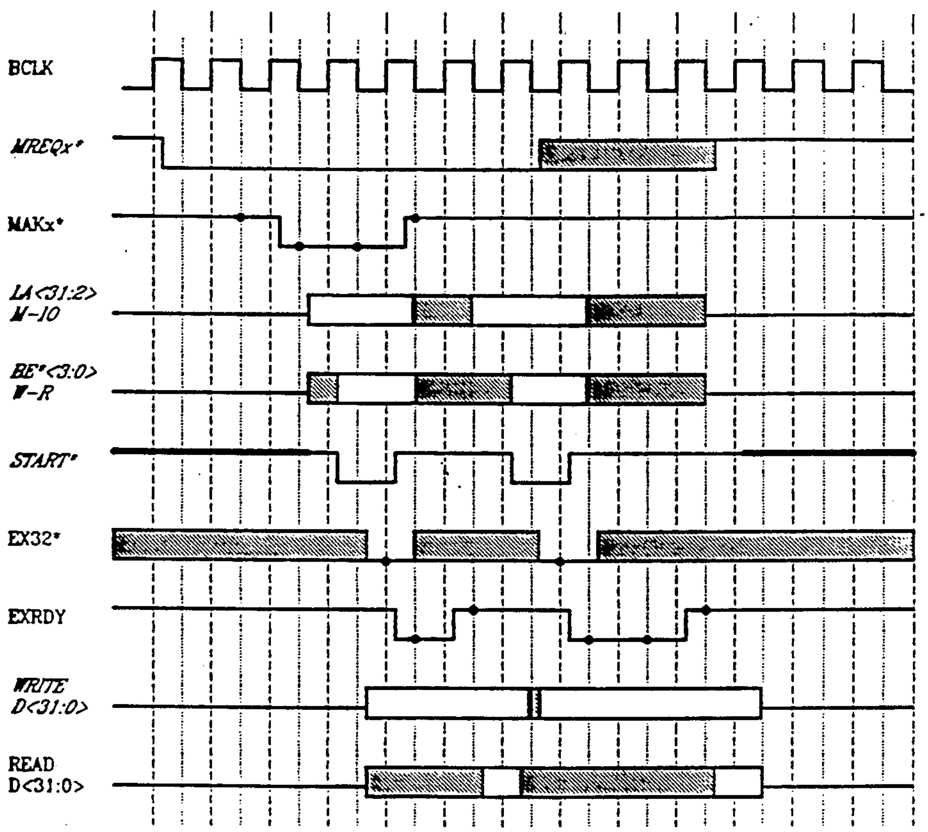
Notes: Heavy lines indicate float by master device.
Italicized signals indicate output of master device.

EXTENDED INDUSTRY STANDARD ARCHITECTURE
CONFIDENTIAL INFORMATION OF BCPR SERVICES, INC.

Figure 50 - Bus Transfer from Master Control to Float - EISA Cycle (with Wait States)

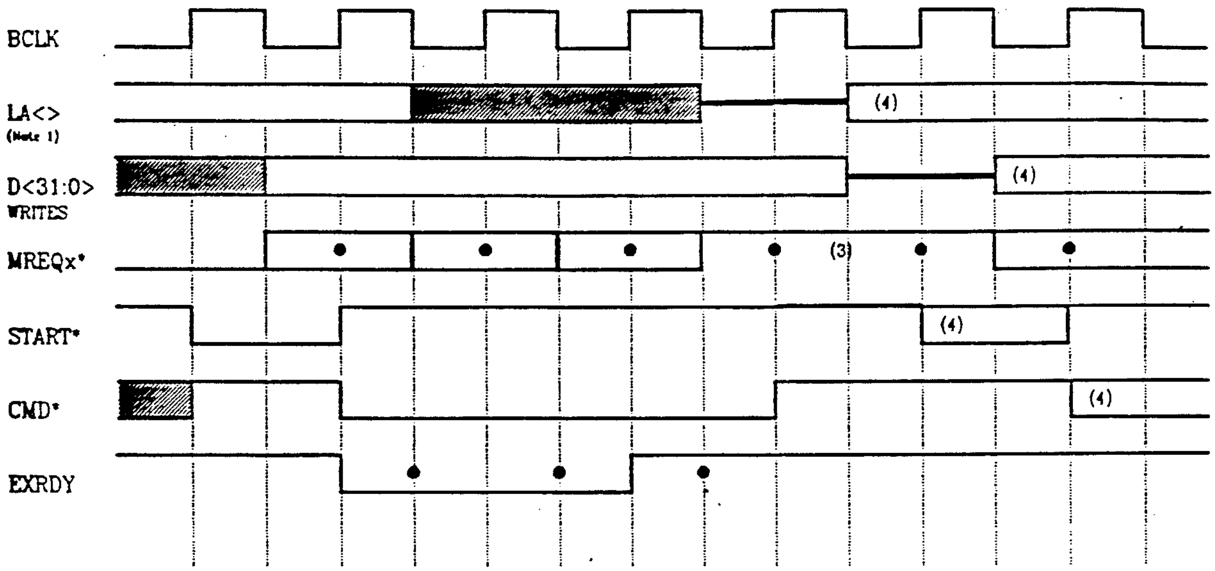

Latest possible time for release of START*, data, and address is shown.

Note 1: The LA<> includes LA<31:2>, BE*<3:0>, M-IO, W-R, LOCK*, and MSBURST*.

Note 2: The heavy lines indicate float.

Note 3: MREQx* must remain high for two BCLKs minimum as shown.

Note 4: Earliest possible control by next device.

EXTENDED INDUSTRY STANDARD ARCHITECTURE
CONFIDENTIAL INFORMATION OF BCPR SERVICES, INC.

Figure 51 - Bus Transfer from EISA Control to Float - Translated ISA Cycle

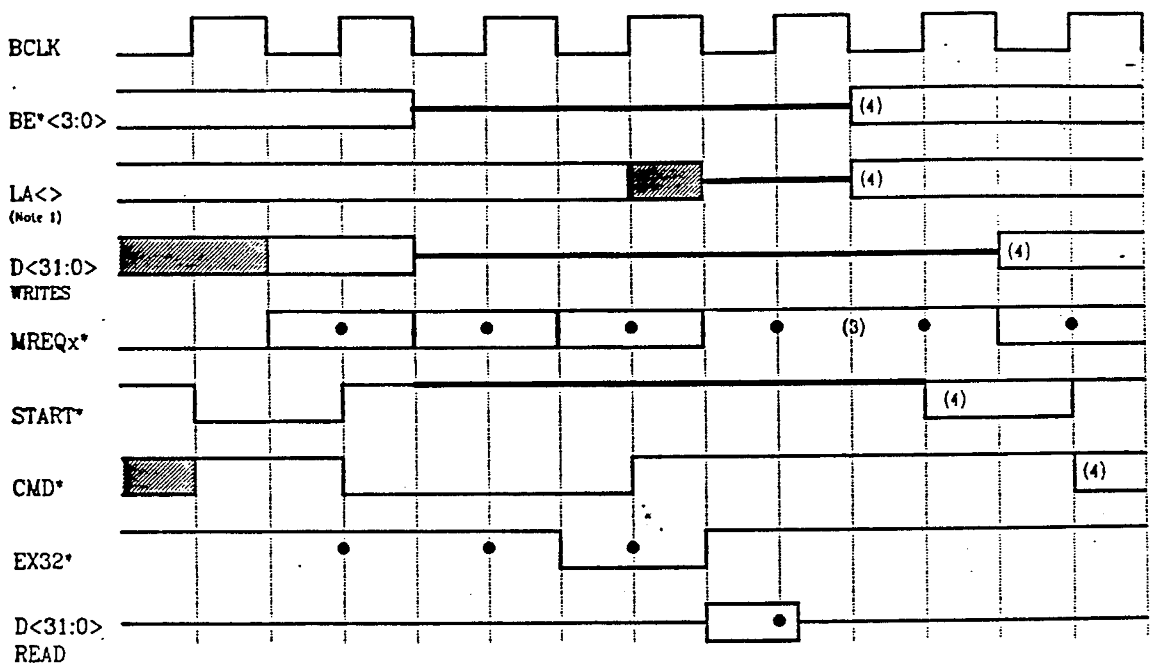

Latest possible time for release of START*, data, and address is shown.

Note 1: The LA < > includes LA <31:2>, BE*<3:0>, M-IO, W-R, LOCK*, and MSBURST*.

Note 2: The heavy lines indicate float.

Note 3: MREQx* must remain high for two BCLKs minimum as shown.

Note 4: Earliest possible control by next device.

2.8.4 Burst Bus Masters

Burst bus masters must do everything defined for standard bus masters. In addition, they support the use of the MSBURST* and SLBURST* lines and Burst cycles.

A bus master begins a set of Burst cycles by executing a Standard cycle and sampling SLBURST* asserted on the rising edge of BCLK when START* is negated. The bus master asserts MSBURST* with the next pipelined address (on the falling edge of BCLK). MSBURST* must not be asserted if SLBURST* is sampled negated or if the bus master samples EX32* negated (32-bit bus masters). In this case, the bus master completes the cycle as a non-Burst master.

For read Burst cycles, the bus master presents a new address on each falling edge of BCLK and samples the data for that address on the BCLK rising edge 1-1/2 BCLKs later. On the last cycle of the Burst transfer, the bus master negates MSBURST* (on the falling edge of BCLK). The bus master completes the cycle on the next rising edge of BCLK.

For write Burst cycles, the bus master presents a new address on each falling edge of BCLK and presents valid data 1/2 BCLK later.

Burst cycles must be all read accesses or write accesses. Mixed read and write cycles can not use Burst. The bus master completes the Burst transfer by negating MSBURST* during the last cycle of the transfer. All Bursts must occur within the 1024-byte page boundary, and only address bits LA<9:2> or BE*<3:0> will change. The Burst transfer must be split up into two or more separate transfers if the transfer crosses a page boundary.

If a bus master samples EXRDY on the falling edge of BCLK, it extends the cycle until sampling EXRDY asserted. The master *may* still change to the next address even though EXRDY is negated. (The master must then hold the address until EXRDY is sampled active.) If a bus master samples EXRDY on the falling edge of BCLK on the last cycle of a Burst transfer, it extends the assertion of MSBURST* until sampling EXRDY asserted.

A Burst bus master may be preempted by the system board or another bus master. The system board negates MAKx*, indicating to the bus master that it must finish the current bus cycle and relinquish control of the bus (by negating MREQx* and MSBURST*) within 64 BCLK periods (8 μs). It is suggested that masters complete operations within a shorter time (such as 32 BCLK periods) to reduce bus latency for other masters or the CPU. Figure 52 illustrates the relevant signals of an EISA bus master preempted during a Burst cycle.

Figure 52 - EISA Bus Master Preempt During Burst Cycle
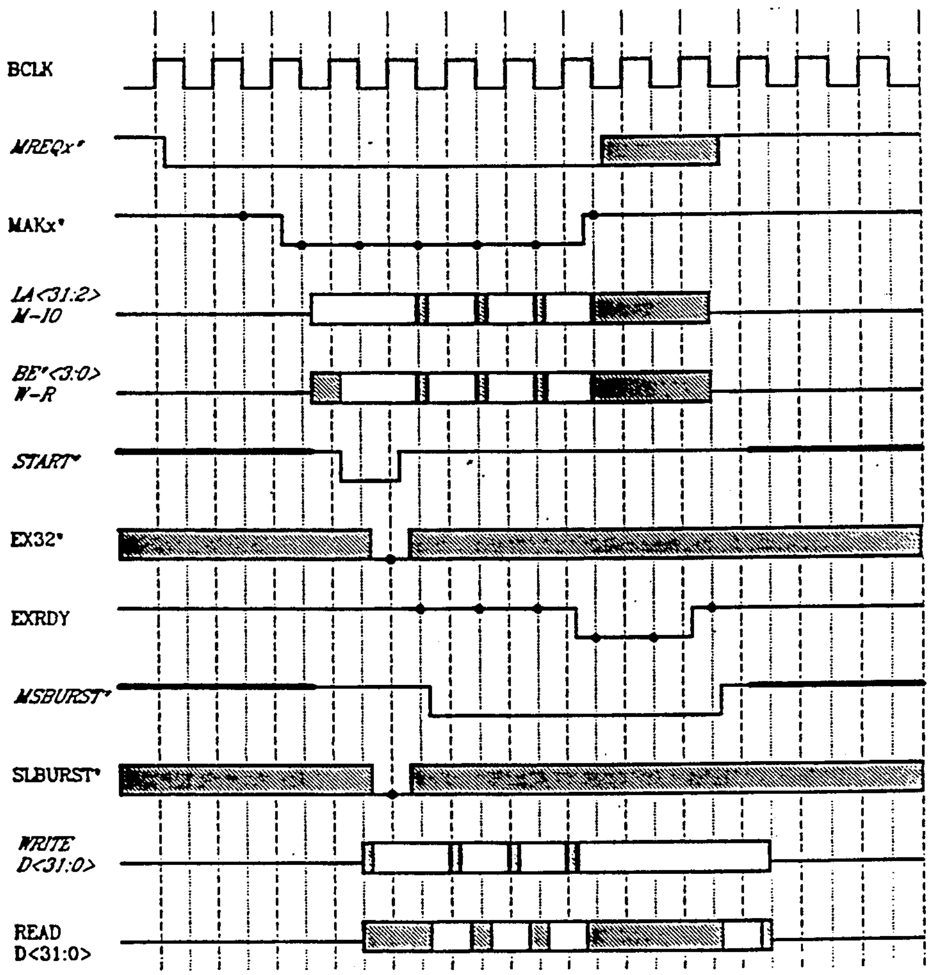
Notes: Heavy lines indicate float by master device.
Italicized signals indicate output of master device.

Figure 53 - Bus Transfer from Master Control to Float - EISA Burst Cycle
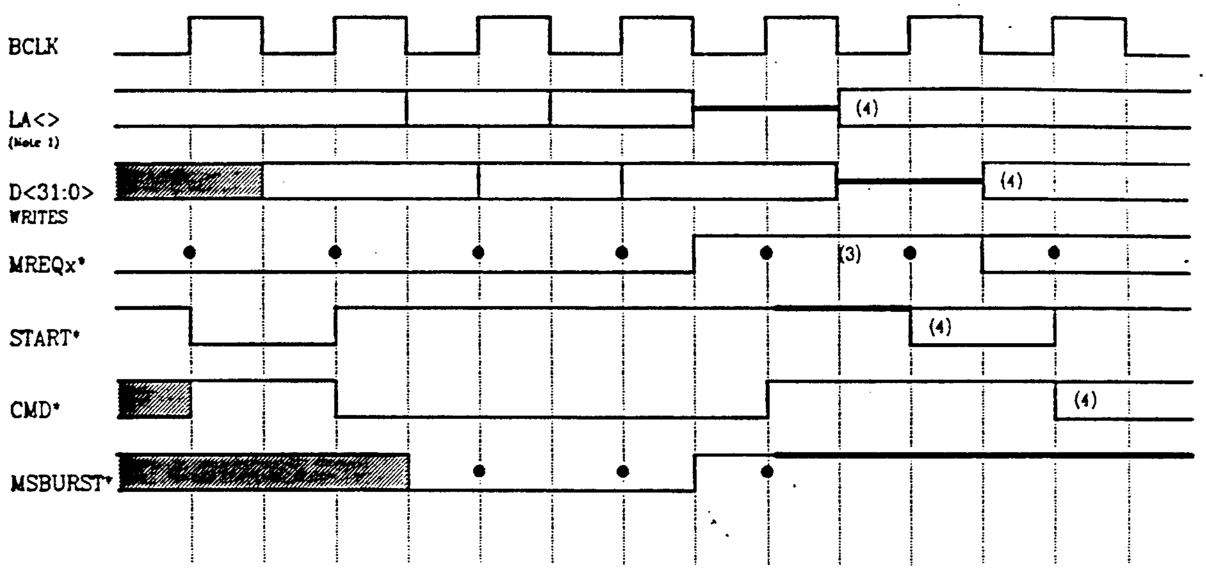
Latest possible time for release of START*, data, and address is shown.
Note 1: The LA <> includes LA <31:2>, BE*<3:0>, M-IO, W-R, LOCK*, and MSBURST*.
Note 2: The heavy lines indicate float.
Note 3: MREQ* must remain high for two BCLKs minimum as shown.
Note 4: Earliest possible control by next device.

2.8.5 Downshift Burst Bus Masters

A "Downshift" master is a 32-bit Burst bus master that can convert to a 16-bit Burst bus master "on the fly."

A downshift bus master that intends to perform a Burst transfer must drive MASTER16* on each START* that it generates. This allows the system to tell the difference between the downshift master and a 32- or 16-bit master. The timing should be the same as for START*.

This type of master must monitor both EX32* and SLBURST* at the rising edge of BCLK at the end of START* to determine the correct action for the remainder of the cycle. The following table shows the system and master response to the slave for downshift masters.

| EX32* | SLBURST* | |
|---|---|---|
| 0 | X | 32-bit cycles: the system will not participate in the cycle. The master completes the cycle with EX32* as a normal 32-bit master. |
| 1 | 0 | 16-bit Burst cycles: After START*, the system does not participate in the cycle. In this case, the master is required to do its own assembly or disassembly, including the data copying. If at START* and the first CMD* cycle the master has all BE*<3:0> lines asserted, then at the next CMD* the master should only have BE*<2> and BE*<3> asserted. For the second cycle, the master needs to copy the data to the low word of the bus for writes (or deal with it on the low word for reads). For write cycles the master may drive the high word of the data bus as long as BE*<3:2> require it even though the slave is only 16-bit. If at START* BE*<1> and BE*<0> are both negated, then, at the end of START*, the master also enables its low word data buffers with the same write data as on the high word. One-half clock later, the system stops driving all of its buffers and remains inactive until the end of the Burst. |
| 1 | 1 | 16-bit non-Burst or ISA cycles: the system assumes the master is a 32-bit master and performs the assembly as expected. In this case, the master holds its write data buffers active until the falling edge of BCLK after START*, then floats them and waits for EX32* to be returned. |

The following table shows the combinations of byte enables that require the additional copying operation:
| BE3* | BE2* | BE1* | BE0* | Copy Bytes 3:2 -> 1:0 |
|---|---|---|---|---|
| 1 | 1 | 1 | 0 | |
| 1 | 1 | 0 | 1 | |
| 1 | 0 | 1 | 1 | * |
| 0 | 1 | 1 | 1 | * |
| 1 | 1 | 0 | 0 | |
| 1 | 0 | 0 | 1 | |
| 0 | 0 | 1 | 1 | * |
| 0 | 0 | 0 | 1 | |
| 1 | 0 | 0 | 0 | |
| 0 | 0 | 0 | 0 | |
Figure 54 illustrates an example of the "downshift" master in operation.
Figure 54 - "Downshift" Bus Master Operations
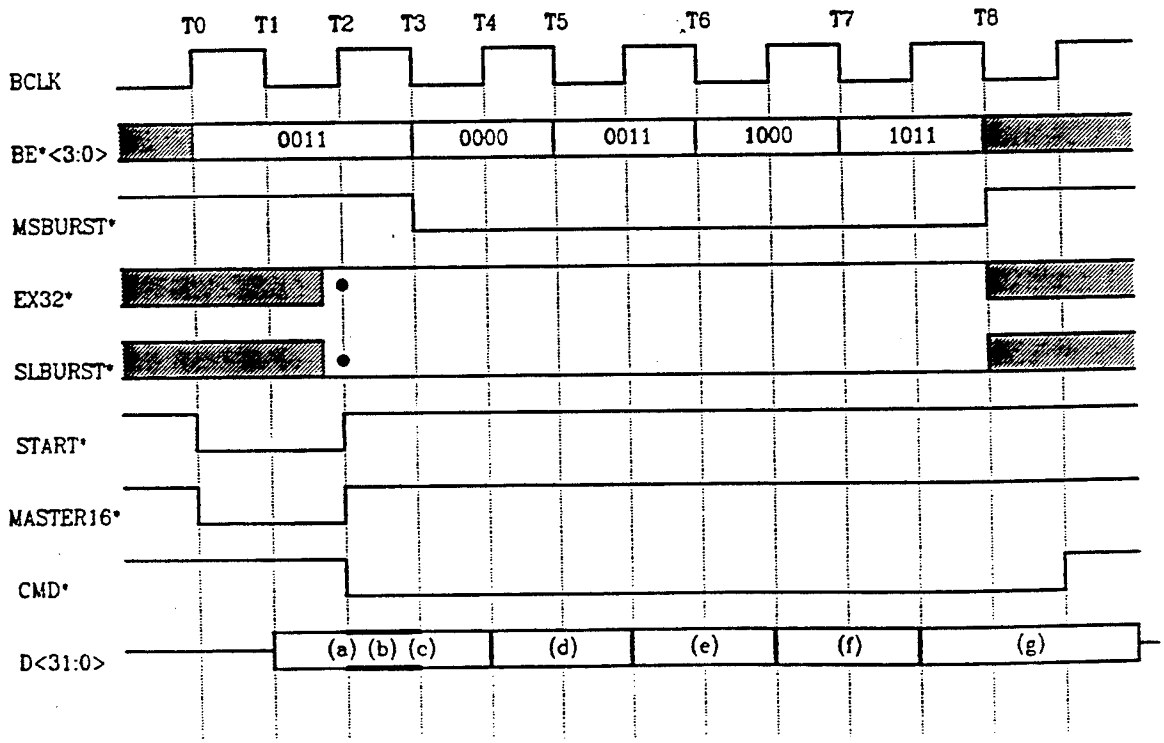
Note: The heavy lines indicate that both the system and the master are driving together.

In the above diagram, the master transfers nine bytes of data beginning on an odd word boundary. At T1 the master asserts BE* <3:2> and puts the data (a) on the two high byte lanes of the data bus. The system copies the data down to the two low byte lanes as for all 32-bit masters. At time T2, the master senses that a 16-bit Burst memory slave is present and begins to copy the high bytes of data to the low bytes (b), (duplicating the effect of the system). At time T3, the system stops copying the data leaving only the master on the data bus (c). At (d) the data is changed to that required for the next set of byte enables. The whole bus can be driven if desired. At (e) the data on the low word is changed again to a copy of the high word of data present at (d). This process is continued until the transfer is complete.

Note that the master should only assert MASTER16* if it intends to do Burst cycles. If MASTER16* is asserted for a non-Burst transfer and a 16-bit EISA Burst slave responds, the master is responsible for copying data through to the end of the cycle since the system will stop copying at the end of T3.

2.8.6 DMA Devices

A DMA device requests service by asserting DRQ<x>. DRQ<x> can be driven asserted asyncronously. The system board samples DRQ<x> asserted and eventually grants bus control to the DMA channel by asserting DAK* <x>. A DMA device decodes I/O accesses with IORC* (or IOWC*) and DAK* <x> asserted.

The DMA device cannot add wait states to a cycle and must accept the cycle type executed by the DMA controller. (Wait states are added by the system or the memory slave.) Figure 55 illustrates the relevant signals for and EISA DMA device during a compatible write transfer.

In certain cases, the system may preempt an EISA DMA device indicating to the DMA device that it must finish the current bus cycle and relinquish control of the bus by negating DRQ<x>. Figures 56 and 57 illustrate preempted DMA cycles.

Figure 55 - EISA DMA Device Compatible Write Transfer
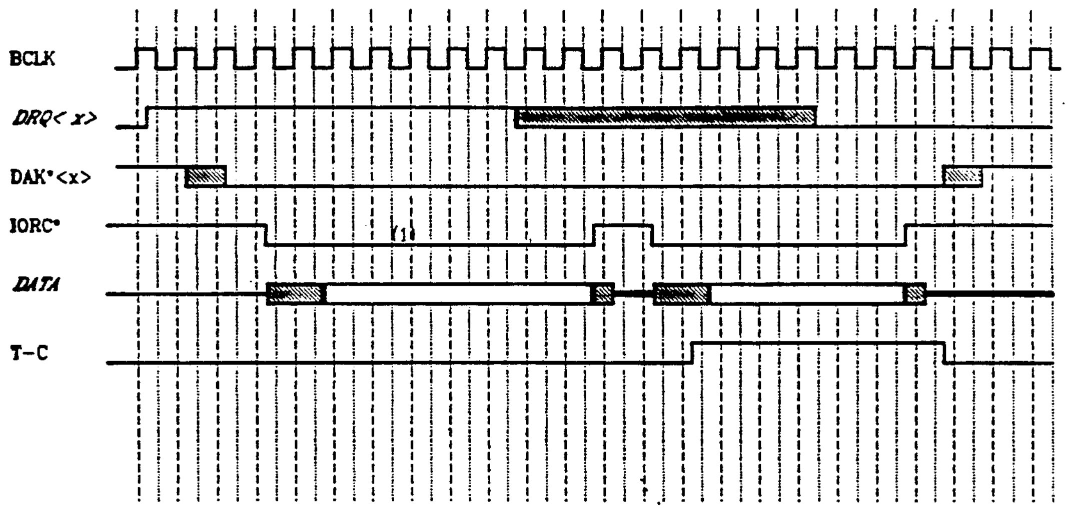
Note: Italicized signals indicate output of DMA device.
Heavy lines indicate float by DMA device.
1) Length of cycle is extended due to the negation of CHRDY by the slave.

**Figure 56 - Type "B" EISA DMA Device (Block Memory Write) Transfer Interrupted by DAK* <x>**
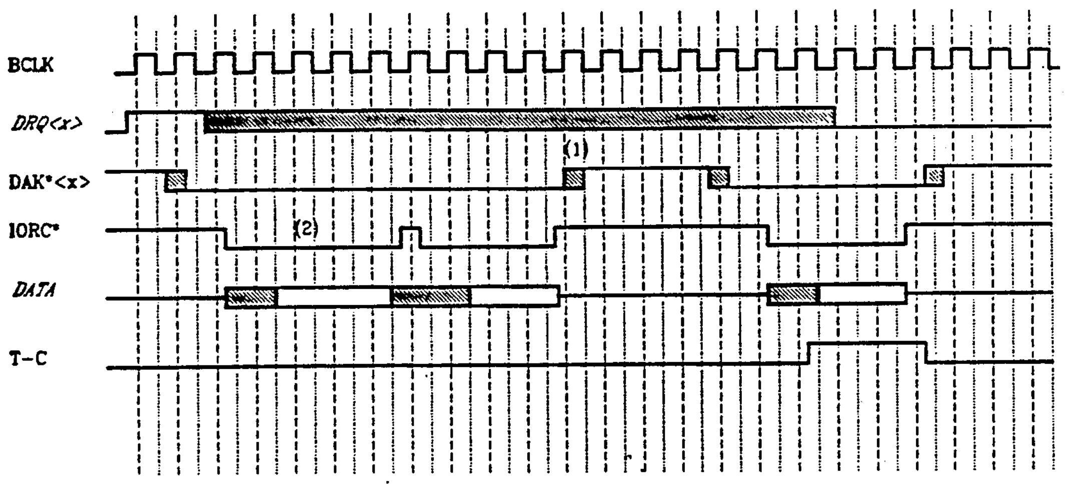
Type A cycles add one clock of IORC* to the beginning of each cycle and one clock of hold time to the end of each cycle.
Note: Italicized signals indicate output of DMA device.
1) Transfer interrupted by negation of DAK*<x>.
2) Cycle is longer due to a wait state requested by the slave.

2.8.6.1 Non-Burst EISA DMA Devices

The system board asserts a DMA channel's DAK*<x> and asserts IOWC* to indicate a memory read (I/O write) DMA cycle. The system board holds IOWC* asserted until it presents valid data. If the memory slave requires wait states, or data size translation is required, the system board holds IOWC* asserted until finished. The DMA device is not allowed to add wait states on its own; it must conform to the timing programmed into the DMA controller. (See Figure 58 for an illustration of the relevant signals.) An exception to this is ISA Compatible memory read (I/O write) cycles. For these cycles, DMA devices can add wait states by negating CHRDY.

The DMA device doing memory write (I/O read) cycles will see its DAK*<x> go active and the IORC* signal go active. The IORC* signal remains active until the data is latched by the EISA memory or the system board (if the memory needs 8 or 16-bit disassembly). The slave is not allowed to add wait states on its own; it must conform to the timing programmed into the DMA controller.

Normal demand and block modes of the DMA device are similar to single-cycle mode except that DMA does not release the bus between cycles. For demand mode, the DRQ<x> line is monitored to determine when to release the bus and stop cycling; for block mode, the entire programmed block is transferred from one DRQ<x>.

The DRQ<x> signal is sampled for negation by the system on rising edges of BCLK, one BCLK before the end of the IORC* or IOWC* asserted time. If wait states are added by the memory slave, then this may be later than usual. For Type "A" and "ISA compatible" timing modes, the system provides synchronization of DRQ<x>. For Type "B" timing, DRQ<x> *must* meet the setup and hold time specifications for proper operation.

In single cycle mode, DAK*<x> can be negated for a minimum of one BCLK period between cycles in timing modes "A" or "B".

In "compatible" mode, the minimum time between DRQ<x> asserted and the system responding with DAK*<x> is 1.0 $\mu$s (8 BCLKs).

The T-C signal (Terminal Count), when being driven by the system, should be decoded with DAK*<x> and IORC* or IOWC*.

If T-C is being driven by the DMA device, to terminate or restart a DMA transfer (see DMA programming), then the DMA device must go from floating the T-C line to driving it low (negated) when DAK*<x> is asserted. When the transfer is to be terminated, T-C should be asserted with the IORC* or IOWC* of the last cycle. T-C should be negated when IORC* or IOWC* is negated. When DAK*<x> is negated, T-C must be floated. (See Figure 59 for an illustration of the relevant signals.)

Figure 58 - Type "B" EISA DMA Device (Demand Memory Read)
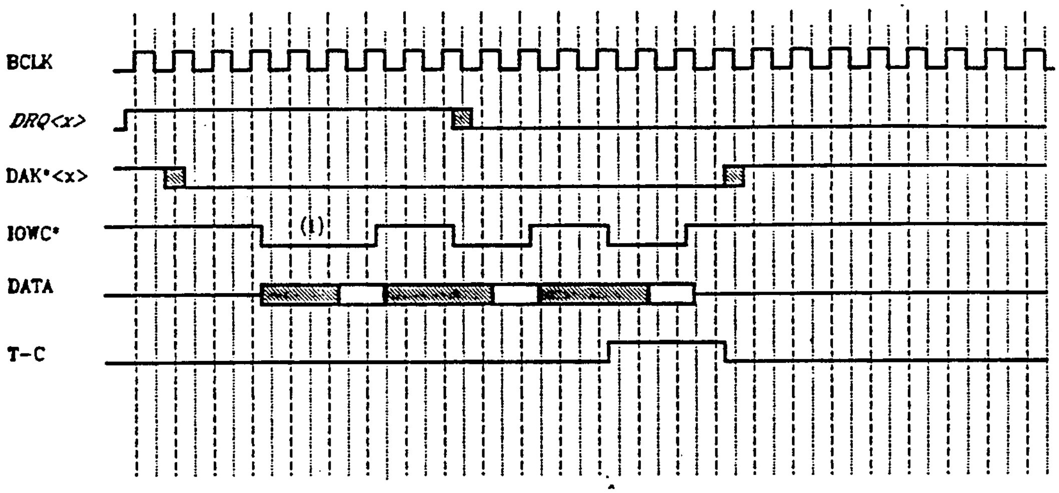
Type A cycles add one clock of IOWC* to the beginning of each cycle and one clock of hold time to the end of each cycle.
Note: Italicized signals indicate output of DMA device.
1) Cycle is longer due to a wait state requested by the slave.

Figure 59 - Type "B" EISA DMA Device (Block Memory Write)
T-C Asserted by DMA Device
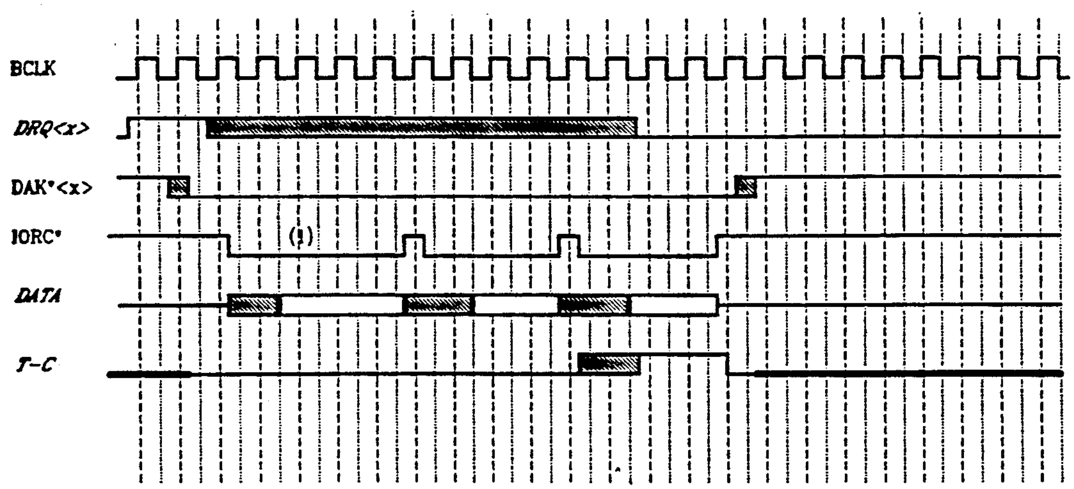
Type A cycles add one clock of IORC* to the beginning of each cycle and one clock of hold time to the end of each cycle.
Notes: Heavy lines indicate float by DMA device.
Italicized signals indicate output of DMA device.
1) Cycle is longer due to a wait state requested by the slave.

2.8.6.2 Burst EISA DMA Devices

Burst mode of EISA DMA transfer is only useful (and allowable) for demand or block mode. The Burst DMA device must monitor the signals BCLK, EXRDY, DAK*<x>, and IORC* or IOWC* (depending on whether reading or writing). After the first transfer cycle (used to "prime" the memory and determine if the memory supports Burst) transfers occur once per BCLK.

A Burst DMA device doing I/O write (memory read) cycles monitors BCLK, EXRDY, DAK*<x>, and IOWC*. The DMA controller asserts DAK*<x>, and, later, asserts IOWC* on the rising edge of BCLK. DAK*<x> is held asserted for the duration of the Burst transfer and IOWC* is held asserted until a cycle translation occurs or, for Burst compatible memory, until the Burst transfer completes. The Burst DMA device must sample the data by the rising edge of BCLK. The DMA device samples EXRDY on each falling edge of BCLK while IOWC* is asserted. If the DMA device samples EXRDY negated, indicating addition of wait states by the memory system, then data must be latched after EXRDY is asserted, by the next rising edge of BCLK. When wait states are added to the last subcycle of a Burst, the system board holds IOWC* asserted until it samples EXRDY asserted. The DMA device is not allowed to add wait states on its own; it must conform to the timing provided by the system.

The system board automatically performs cycle translation for a Burst DMA transfer from memory that does not support Burst. The DMA device monitors IOWC* and samples it negated while the system board performs the translation, then samples IOWC* asserted when the the DMA controller restarts the Burst transfer after the translation completes.

A Burst DMA device doing I/O read (memory write) cycles monitors BCLK, EXRDY, DAK*<x>, and IORC*. The DMA controller asserts DAK*<x> and, later, IORC* on the falling edge of BCLK. The DMA device must drive new data on the bus on the next rising edge of BCLK and hold it until the following rising edge of BCLK. The DMA device samples EXRDY on each falling edge of BCLK while IORC* is asserted. If the DMA device samples EXRDY negated, indicating addition of wait states by the memory system or the initial cycle of the Burst, then data must be held stable until the next rising edge of BCLK after EXRDY is asserted. When wait states are added to the last subcycle of a Burst, the system board holds IORC* asserted until it samples EXRDY asserted. The DMA device is not allowed to add wait states on its own; it must conform to the timing provided by the system. (See Figure 60.)

Addresses asserted during Burst DMA cycles to DRAM memory must be within a 1024 byte DRAM memory page (address line LA<31:10> cannot change during the transfer). To cross a DRAM page boundary, the system board terminates the Burst DMA sequence by negating the MSBURST* signal on the last cycle in the page. The system board then restarts the sequence on the new page. Figure 61 illustrates a page boundary condition from a Burst DMA device perspective.

The system board automatically performs cycle translation for a Burst DMA transfer to memory that does not support Burst. When the system board determines that cycle translation is needed, it latches the data for the current cycle in a temporary register and negates IORC* to indicate that the data is latched and the DMA device must float its drivers. The DMA device floats its drivers while the system board performs the translation and monitors IORC* to detect the DMA controller restarting the Burst transfer after the translation completes.

**Figure 60 - Burst EISA DMA Device (Demand Memory Write)
Wait States on Last Cycle**
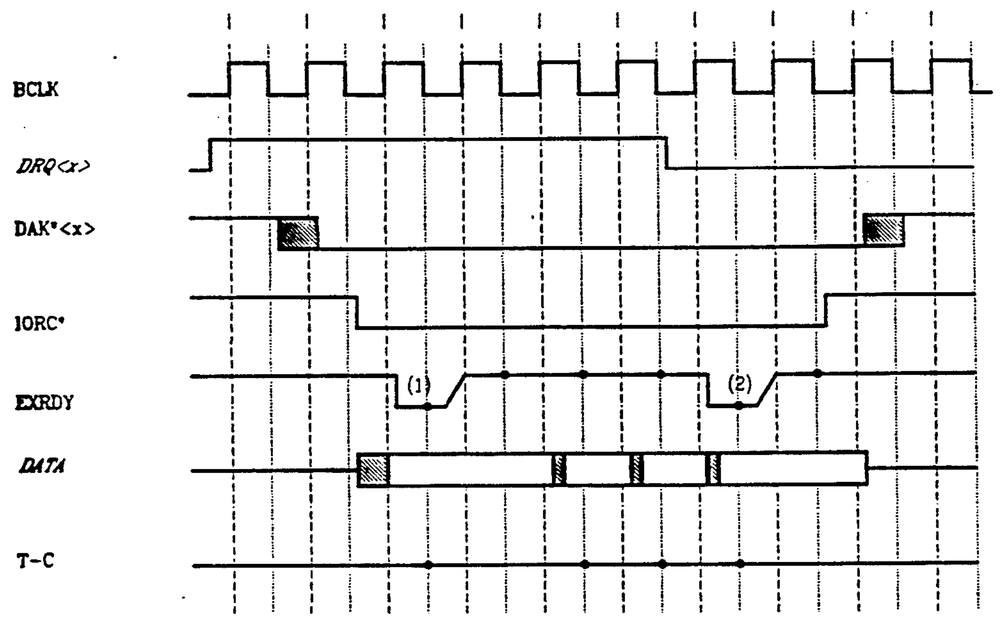
Note: Italicized signals indicate output of the DMA device.
All others are inputs.
1) Wait state added by system
2) Wait state added by memory slave

Figure 61 - Burst EISA DMA Device (Block Memory Read) Page Boundary Condition
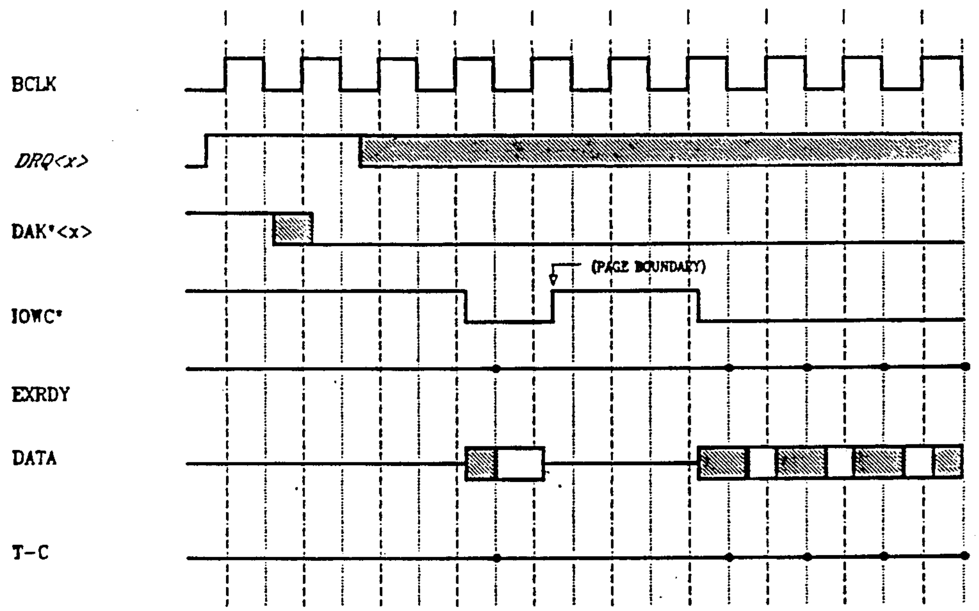
Note: Italicized signals indicate output of the DMA device.
All others are inputs.

The DMA device monitors IORC* and samples IORC* asserted when the DMA controller restarts the Burst transfer after the translation completes.

For both Burst modes the system samples DRQ<x> on rising edges of BCLK. For Block mode, DRQ<x> is ignored until the transfer has been completed. For Demand mode the DMA device can negate DRQ<x> at the falling edge of BCLK during asserted IORC* or IOWC*. If EXRDY is negated in a previous cycle, the DMA device must wait one BCLK after EXRDY is sampled asserted (the current cycle) to negate DRQ<x>. Note that one full transfer cycle follows the negation of DRQ<x>. (See Figure 62.) The DMA device can also negate DRQ<x> on the first falling edge of BCLK after DAK*<x> is asserted if only one cycle is desired.

In the normal case, T-C is an output and is asserted at the end of a transfer on the falling edge of BCLK. This corresponds with the assertion of IORC* for the last cycle or leads the assertion of IOWC* by 1/2 BCLK. If the memory adds wait states, then T-C occurs earlier. T-C is negated on the rising edge of BCLK at (for IOWC*), or after (for IORC*), the end of the cycle. The DMA device should sample T-C at the first falling edge of BCLK during asserted IORC* or IOWC* for the cycle. If EXRDY is negated for a cycle, T-C should not be sampled again until the BCLK after EXRDY is sampled asserted. (See Figure 63.)

If T-C is being driven by the DMA device to terminate or restart a DMA transfer (see DMA programming), then the DMA device must go from floating the T-C line to driving it low (negated) when DAK*<x> is asserted. When the transfer is to be terminated, T-C should be asserted on the falling edge of BCLK with the IORC* or IOWC* of the next to last cycle and held asserted for one BCLK. (See Figure 64.) If EXRDY is negated in a previous cycle, the DMA device must wait one BCLK after EXRDY is sampled asserted (the current cycle) to assert T-C. Note that one full transfer cycle follows the assertion of T-C. When DAK*<x> is negated, T-C must be floated. The system waits one BCLK after DAK*<x> is negated before driving T-C negated (low).

Figure 65 illustrates the special case where DRQ<x> is negated at a wait state. Figure 66 illustrates the preemption of a Burst DMA Device.

Figure 62 - Burst EISA DMA Device (Demand Memory Write)
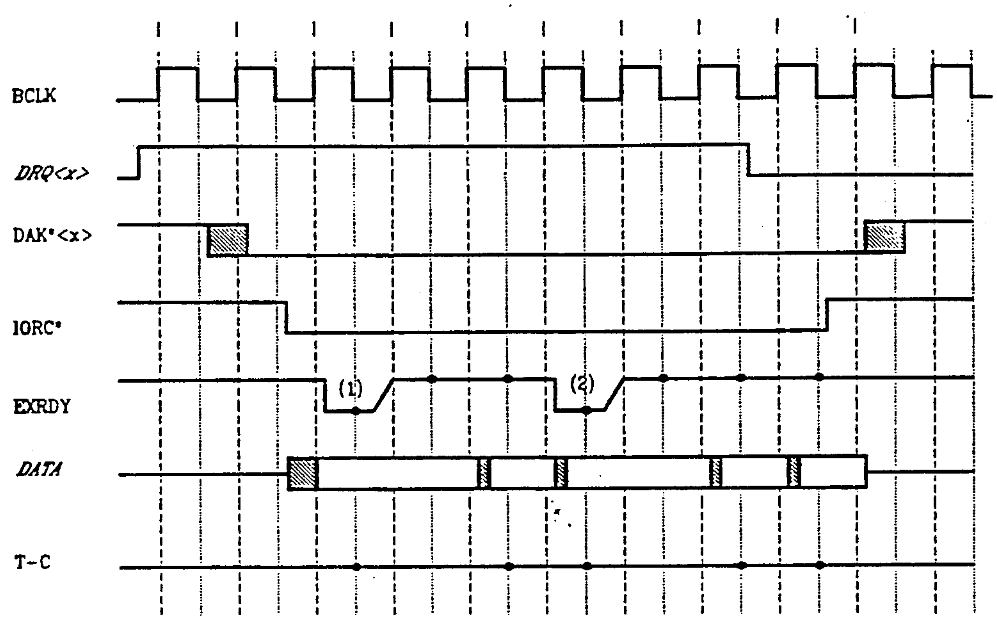
Note: Italicized signals indicate output of the DMA device.
All others are inputs.
1) Wait state added by system
2) Wait state added by memory slave

Figure 63 - Burst EISA DMA Device (Memory Read) Transfer Terminated by Assertion of T-C
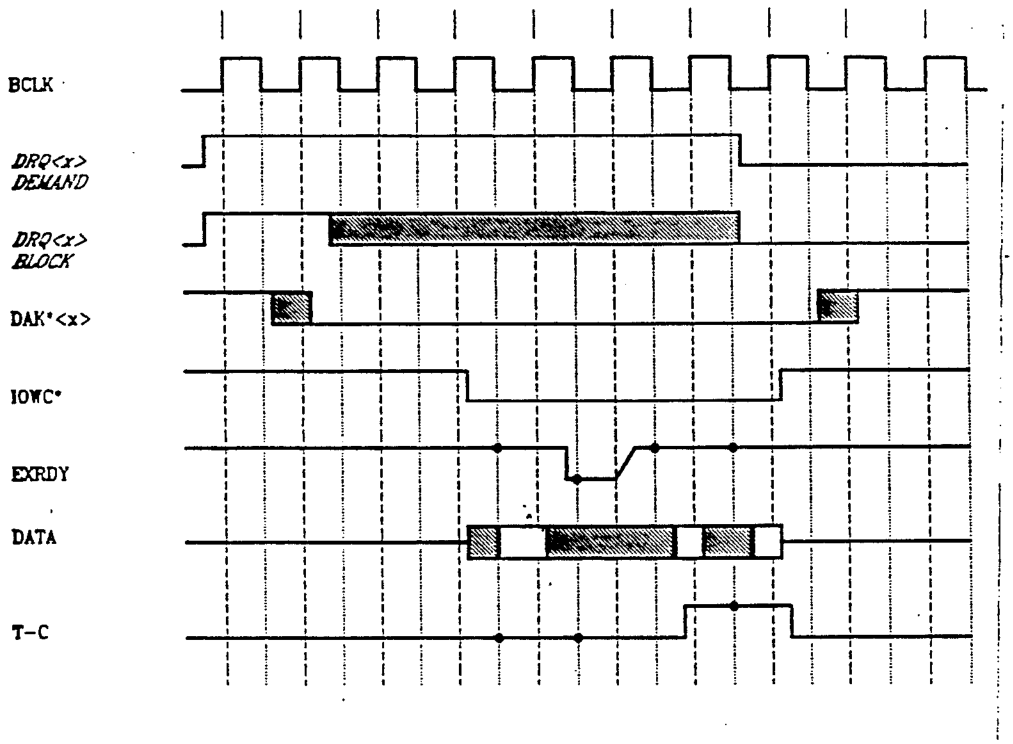
Note: Italicized signals indicate output of the DMA device.
All others are inputs.

Figure 64 - Burst EISA DMA Device
T-C Asserted by DMA Device
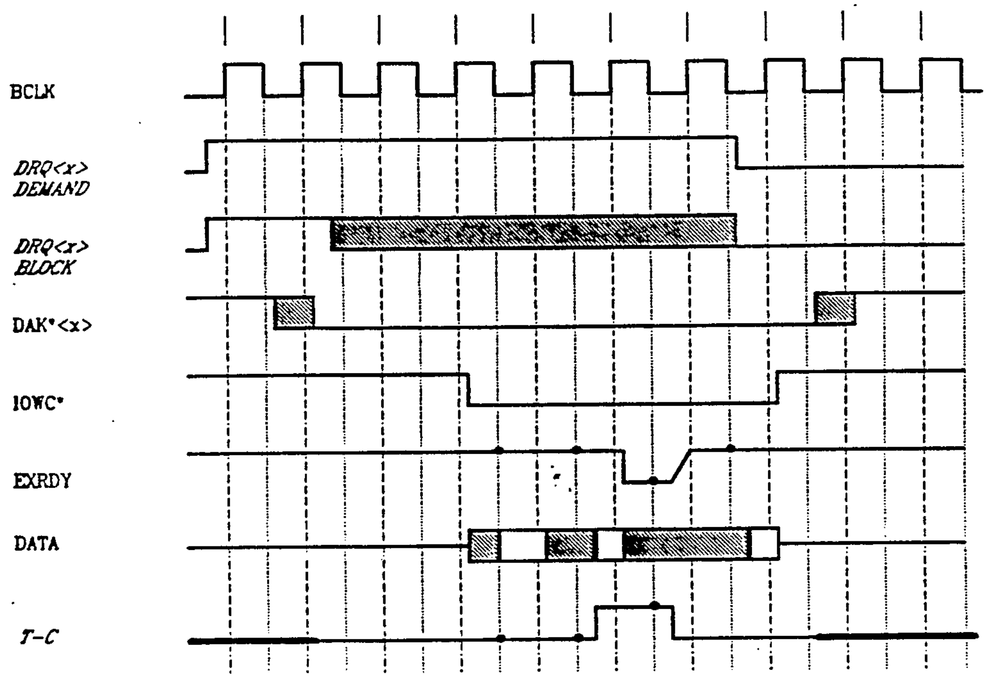
Note: Italicized signals indicate output of the DMA device.
All others are inputs.
Heavy lines indicate float by device

Figure 65 - Burst EISA DMA Device (Demand Memory Write)
DRQ<x> Negated at Wait State
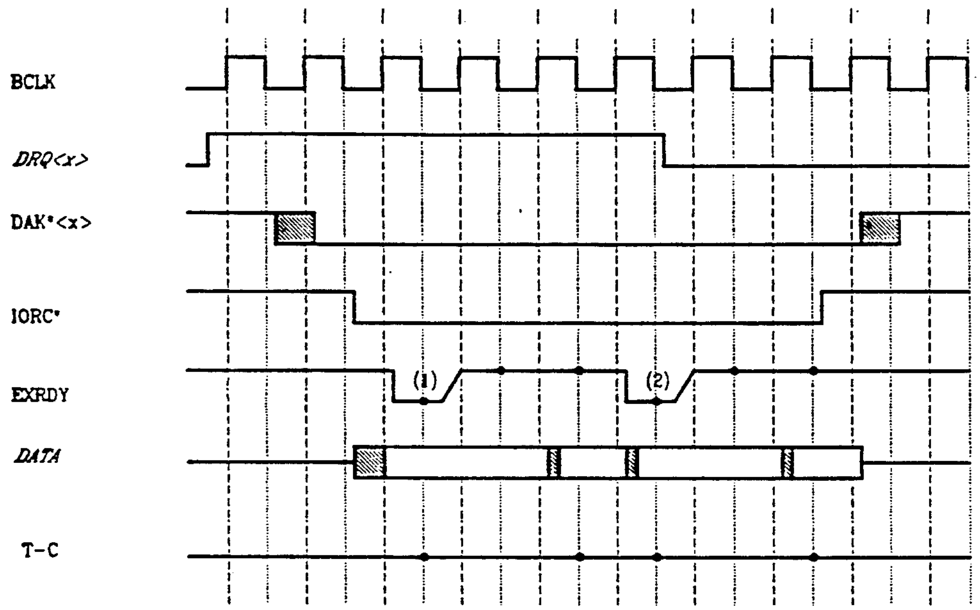
Note: Italicized signals indicate output of the DMA device.
All others are inputs.
1) Wait state added by system
2) Wait state added by memory slave

Figure 66 - Burst EISA DMA Device (Block Memory Read) Preemption by Negation of DAK*
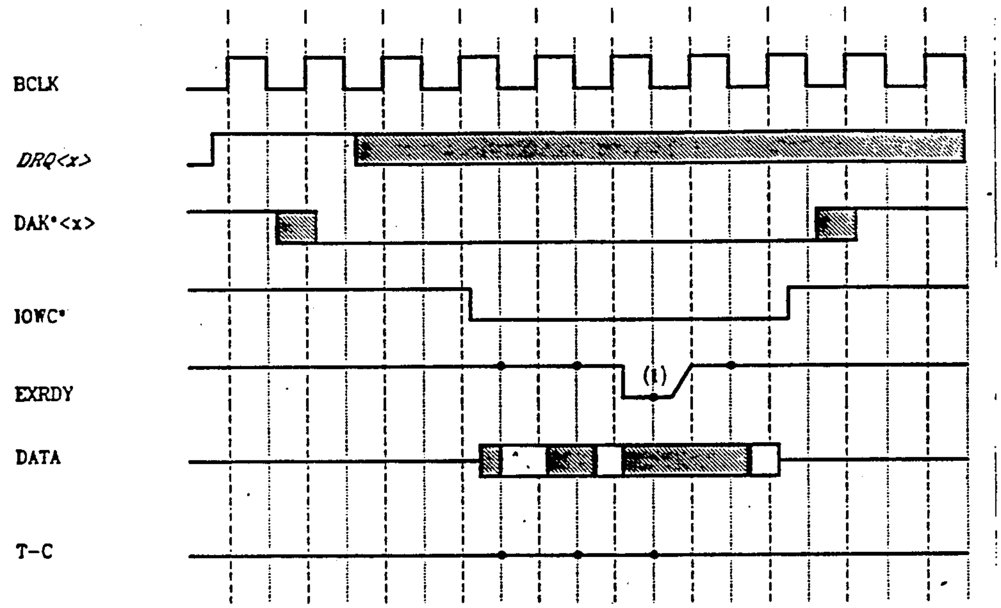
Note: Italicized signals indicate output of the DMA device.
All others are inputs.
1) Wait state added by memory slave

2.8.6.3 Misaligned DMA Transfers

A DMA device *may* handle misaligned DMA transfers by performing data alignment during the transfer. The DMA controller requests a misaligned transfer by indicating a partial word or dword with BE*<3:0> during the first and last cycle. The DMA device determines the number of bytes to transfer and appropriate byte lanes to use for the first transfer by decoding BE*<3:0>. The DMA device performs the byte alignment for the first transfer and continues the same byte alignment until BE*<3:0> indicates another partial transfer (or until sampling the terminal count signal (T-C) asserted).

For Type "A" and Type "B" transfers, the BE*<3:0> signals may be sampled with the leading edge of IOWC* or with the rising edge of BCLK following the assertion of IORC*. In either case the signals are set up to the edge by 100 ns and held from the edge by at least 30 ns.

For Type "C" transfers, the BE*<3:0> signals may be sampled with the falling edge of BCLK during the first BCLK of each subcycle (there is only one BCLK per subcycle unless wait states are added). To this edge there is 60 ns of setup and 2 ns of hold time. Alternatively, the BE*<3:0> signals may be sampled with the rising edge of BCLK that starts each subcycle (or IOWC* falling edge for the first subcycle). To this edge there is 5 ns of setup and at least 55 ns of hold time.

Misaligned DMA Memory Writes (I/O Reads)

On the first transfer, the DMA device copies the addressed bytes from its DMA source register to the appropriate data bus byte lanes (indicated by BE*<3:0>) and stores the unused source register bytes in a holding register. On subsequent transfers, the DMA device copies the addressed bytes from the DMA source register and the contents of the holding register to the appropriate data bus byte lanes (as indicated on the first cycle by BE*<3:0>). For each transfer, the DMA device stores the unused DMA source register bytes, then supplies them on the following cycle.

Misaligned DMA Memory Reads (I/O Writes)

On the first transfer, the DMA device stores the bytes indicated by BE*<3:0> in a holding register. On subsequent transfers, the DMA device copies the contents of the holding register and the appropriate bytes from the data bus (as indicated on the first cycle by BE*<3:0>) to the DMA destination register. For each transfer, the DMA device replaces the contents of the holding register with the unused bytes from the data bus.

2.8.7 System Board

2.8.7.1 Main Memory Access

The EISA architecture does not require all memory (or I/O) access cycles to reflect on the EISA bus. The main CPU (and other devices) can access the main memory system without presenting address or timing control on the EISA bus.

2.8.7.2 Back-to-Back I/O Delay

The EISA system board automatically forces a minimum 2-1/2 BCLK (300 ns) delay between back-to-back ISA I/O accesses caused by separate CPU cycles. The delay is measured from the trailing edge of an I/O command (IORC* or IOWC*) to the leading edge of the next I/O command (IORC* or IOWC*). The delay provides recovery time for ISA compatible I/O slaves.

The system board prevents the CPU from asserting START* for the next I/O cycle until at least 1 BCLK after the trailing edge of IORC* or IOWC*. START* for a memory cycle is asserted without the one BCLK delay. No delay is added to the data size translation part of the I/O cycle (the delay is added to the beginning of the next cycle). No delay is added for 16-bit ISA bus master I/O cycles, which execute at a speed determined by the I/O slave's use of CHRDY. No delay is added for 32- and 16-bit EISA I/O cycles, which execute at a speed determined by the I/O slave's use of EXRDY.

2.8.7.3 Slot-specific I/O

EISA systems reserve I/O spaces at 0z000h-0z0FFh, 0z400h-0z4FFh, 0z800h-0z8FFh, and 0zC00h-0zCFFh (where 'z' is the slot number from 1-F) for slot-specific I/O slaves on ISA and EISA expansion boards. These address ranges alias ISA system board I/O address space. EISA system boards must fully decode I/O accesses to assure they don't alias with slot-specific I/O slaves. The system board uses the slot-specific I/O range where 'z' is zero for all system board I/O devices.

The system board disables the slot-specific I/O ranges by asserting the bus signal AENx (high) if the address 'z' does not match the slot number and the least significant 12 address bits address a slot-specific range (0z000h-0z0FFh, 0z400-0z4FFh, 0z800-0z8FFh, or 0zC00-0zCFFh). Expansion boards that take advantage of the slot-specific I/O ranges must, at a minimum, decode LA<8> and LA<9> (SA<8> and SA<9> for ISA I/O slaves) address bits (decode to "0") with AENx negated (low) to assure they don't alias with ISA expansion board I/O.

EXTENDED INDUSTRY STANDARD ARCHITECTURE
CONFIDENTIAL INFORMATION OF BCPR SERVICES, INC.

The following truth table shows an example of a system board AENx decode; the AENx signals listed are low for the given combinations. Note that the signal AEN is included which is high for DMA activity.

System Board AENx Decode

| | AEN | MIO | LA<9> | LA<8> | LA<15> | LA<14> | LA<13> | LA<12> |
|---|---|---|---|---|---|---|---|---|
| AEN15 | 0 | 0 | 0 | 0 | 1 | 1 | 1 | 1 |
| AEN14 | 0 | 0 | 0 | 0 | 1 | 1 | 1 | 0 |
| AEN13 | 0 | 0 | 0 | 0 | 1 | 1 | 0 | 1 |
| AEN12 | 0 | 0 | 0 | 0 | 1 | 1 | 0 | 0 |
| AEN11 | 0 | 0 | 0 | 0 | 1 | 0 | 1 | 1 |
| AEN10 | 0 | 0 | 0 | 0 | 1 | 0 | 1 | 0 |
| AEN9 | 0 | 0 | 0 | 0 | 1 | 0 | 0 | 1 |
| AEN8 | 0 | 0 | 0 | 0 | 1 | 0 | 0 | 0 |
| AEN7 | 0 | 0 | 0 | 0 | 0 | 1 | 1 | 1 |
| AEN6 | 0 | 0 | 0 | 0 | 0 | 1 | 1 | 0 |
| AEN5 | 0 | 0 | 0 | 0 | 0 | 1 | 0 | 1 |
| AEN4 | 0 | 0 | 0 | 0 | 0 | 1 | 0 | 0 |
| AEN3 | 0 | 0 | 0 | 0 | 0 | 0 | 1 | 1 |
| AEN2 | 0 | 0 | 0 | 0 | 0 | 0 | 1 | 0 |
| AEN1 | 0 | 0 | 0 | 0 | 0 | 0 | 0 | 1 |

The following table specifies the expansion board AENx decode:

Expansion Board AENx Decode

| Signal | Decode |
|---|---|
| AENx | 0 |
| MIO | 0 |
| LA<9> | 0 |
| LA<8> | 0 |
| LA<11> | x |
| LA<10> | x |
| LA<7> | x |
| LA<6> | x |
| LA<5> | x |
| LA<4> | x |
| LA<3> | x |
| LA<2> | x |
| LA<1> | x |
| LA<0> | x |

Note: x depends on the address being decoded.

The system board negates (low) AENx for slot-specific I/O cycles a short time after asserting START*. For ISA I/O cycles, the system board holds AENx negated until at least 1/2 BCLK after the trailing edge of IORC* or IOWC* to assure compatibility with ISA I/O slaves. For EISA I/O cycles, the system board holds AENx negated while it holds LA<15:2> valid.

A bus master need not add a delay between back-to-back I/O cycles to ISA I/O slaves. The BCLK added to the end of a cycle during the system board's data size translation satisfies the AENx hold requirement.

2.8.7.4 I/O Address Decoding

I/O addresses between 0400h and 04FFh are reserved for current and future EISA system board peripherals defined by this specification. System board manufacturers can use system board addresses 0800-08FFh and 0C00-0CFFh for manufacturer specific I/O devices.

2.9 Bus Arbitration

EISA provides centralized arbitration control to allow bus sharing among the CPU, DMA controller, refresh controller and bus masters. A device asserts a bus request signal to arbitrate for bus access. The centralized arbitration controller arbitrates the request and the system board asserts a bus grant signal when the bus is available. The arbitration period does not affect execution of bus cycles by the active device. If other arbiters preempt the active device by asserting a bus request (MREQx* or DRQ<x>) while the bus is busy, the system board negates the bus grant signal (DAK*<x> or MAKx*) to indicate to the active device that it must release the bus, and the central arbitration controller performs the arbitration.[1] After the active device releases the bus (indicated by negation of the bus request signal), the system board asserts the appropriate bus grant signal for the winning device.

An EISA bus master or DMA device may be preempted by another device that requests use of the bus. A bus master must release the bus within 64 BCLK periods (8 μs) after sampling its MAKx* negated to prevent a bus timeout NMI. The DMA controller stops the DMA transfer and releases the bus within 32 BCLK periods (4 μs) of a preemption. The arbitration controller measures the bus timeout from the rising edge of BCLK after negation of MAKx*. The arbitration controller counts 64 BCLK periods for a bus master, then samples MREQx*. If MREQx* is still asserted, an NMI is generated and the reset controller asserts RESDRV to reset the offending bus master.

Following the negation of MREQx*, the system allows the completion of the last bus cycle before actually transferring control of the bus. This allows a bus cycle to be started (START*) before the timeout, and actual bus transfer to occur on the BCLK following the end of the cycle. This is true for cycles terminated by EXRDY or by EX32* (or EX16*). For Burst transfers, MSBURST* must be negated with the negation of MREQx*. For downshift Burst transfers, MSBURST* must be negated one transfer cycle after the negation of MREQx*.

1. Only DMA devices that take advantage of EISA enhancements can be preempted.

Figure 67 - Bus Master: Starting a Normal Cycle Without a Bus Timeout
(The figure shows the latest possible time to start without a bus timeout)
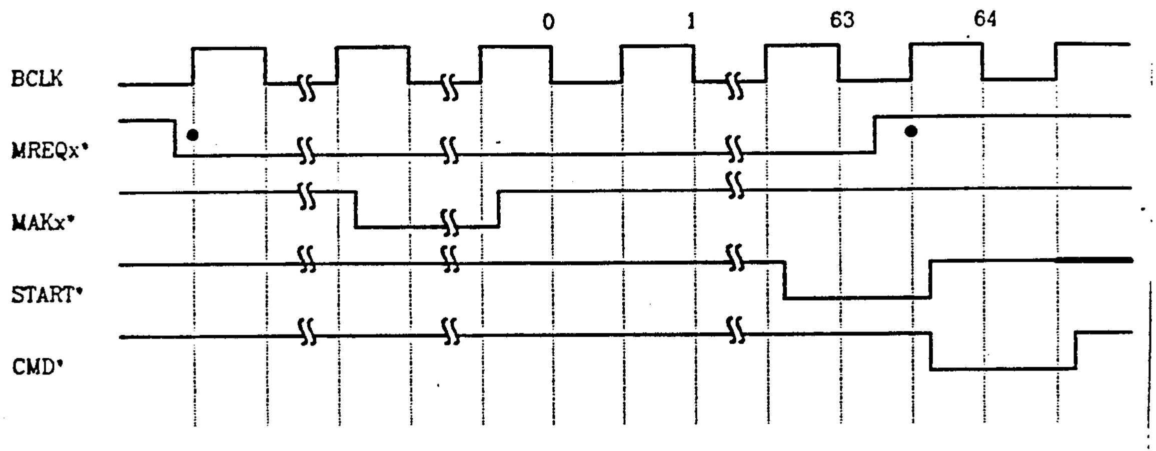
Figure 68 - Bus Master: Continuing a Burst Cycle Without a Bus Timeout
(The figure shows the latest possible time to start without a bus timeout)
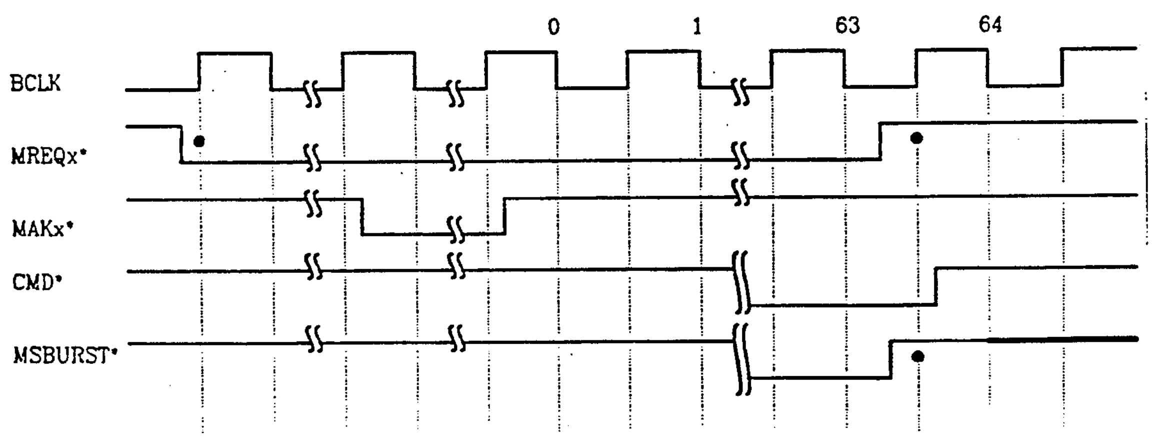

Figure 69 - Bus Master: Continuing a Downshift Burst Cycle Without a Bus Timeout

(The figure shows the latest possible time to start without a bus timeout)

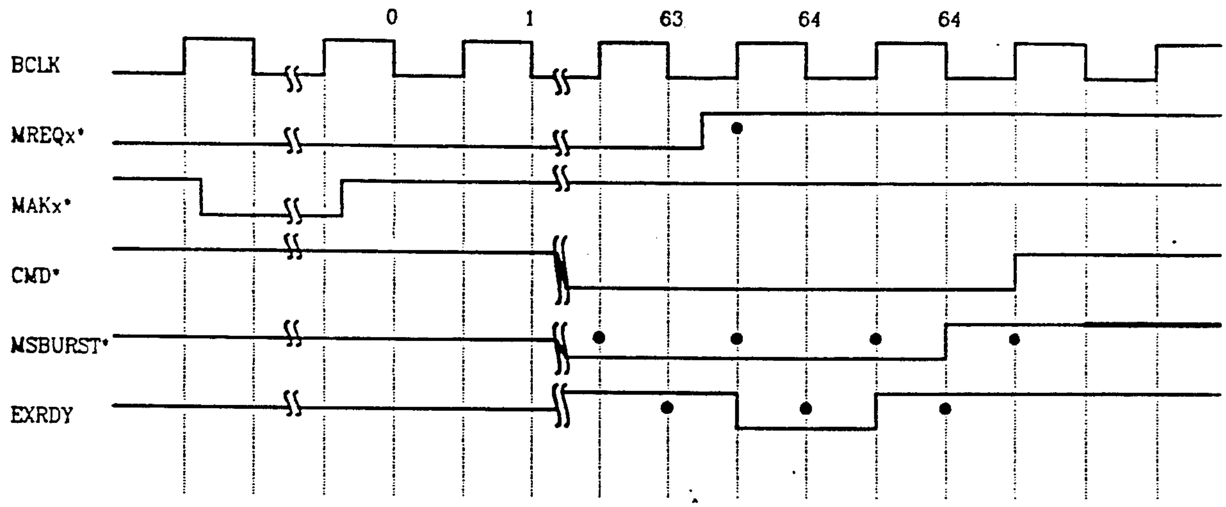

Note: A wait state is shown to illustrate an allowable extension.

The main CPU is given bus access when no other device is requesting use of the bus. In addition, the CPU system should request bus access when it has a cycle to execute. In cache-based systems, the request typically results from a cache miss. In noncached systems, the CPU is always requesting the bus.

In some systems, depending on the characteristics of the CPU and associated systems, it may be desirable for the arbitration system to allow the CPU to continue to hold the bus for a period of time after preemption by another device (or as long as the CPU continues to require the bus). This allows more time for the CPU to execute under heavily loaded conditions. To limit system latency, bus hold time from preemption to CPU hold request, should be kept to a maximum of 32 BCLKs. If this is done, then the maximum time the CPU could keep the bus becomes the maximum CPU hold request time, plus 32 BCLKs. The CPU hold request maximum typically occurs during a sequence of LOCKED cycles. Therefore, to keep arbitration time to a minimum, LOCKED cycles should only be performed to high-speed memory.

Figure 70 illustrates the control signals that each arbiter uses for bus arbitration. The preemptable arbiters include the main CPU, the DMA controller and any EISA bus master.

Figure 70 - Centralized Arbitration
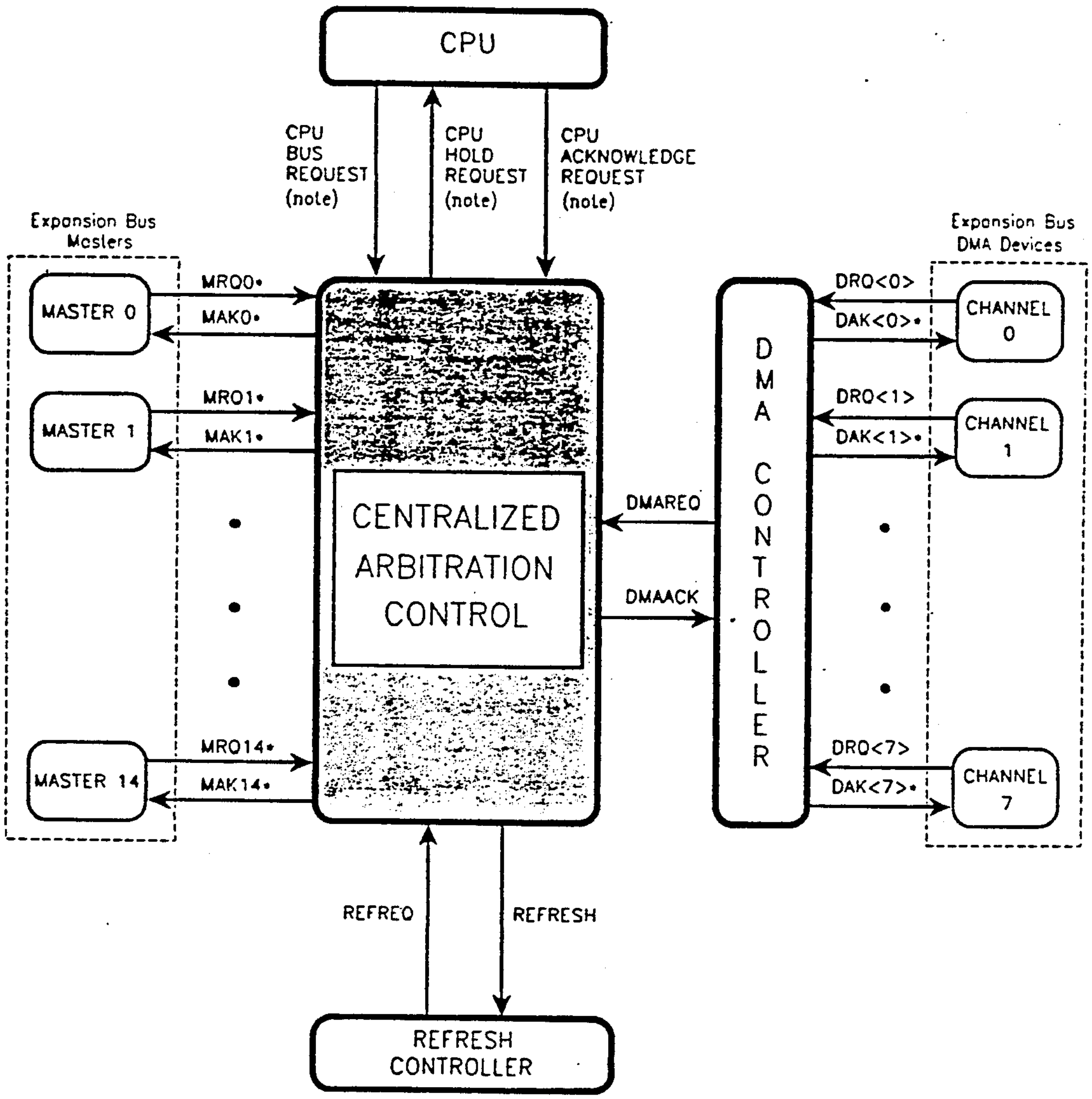
Note: "CPU Bus Request", "CPU Hold Request" and "CPU Acknowledge Request" are implementation-specific signals.

2.9.1 System Arbitration Priorities

The EISA system board uses a multilevel rotating priority arbitration method. On a fully loaded bus, the order in which devices are granted bus access is independent of the order in which they assert a bus request, since devices are serviced based on their position in the rotation. The arbitration scheme assures that DMA channels access the bus with minimal latency. The DMA controller is given a high level of priority to assure compatibility with traditional ISA expansion boards that require short bus latency. The EISA bus masters have a low priority and their design must provide for longer latency.

DMA priorities can be modified by programming the DMA controller command registers to rotating priority.

Figure 71 illustrates arbitration priorities with both DMA controllers programmed for fixed priority, and Figure 72 illustrates arbitration priorities with both DMA controllers programmed for rotating priority.

Figure 71 - Fixed DMA Priority Arbitration Sequence
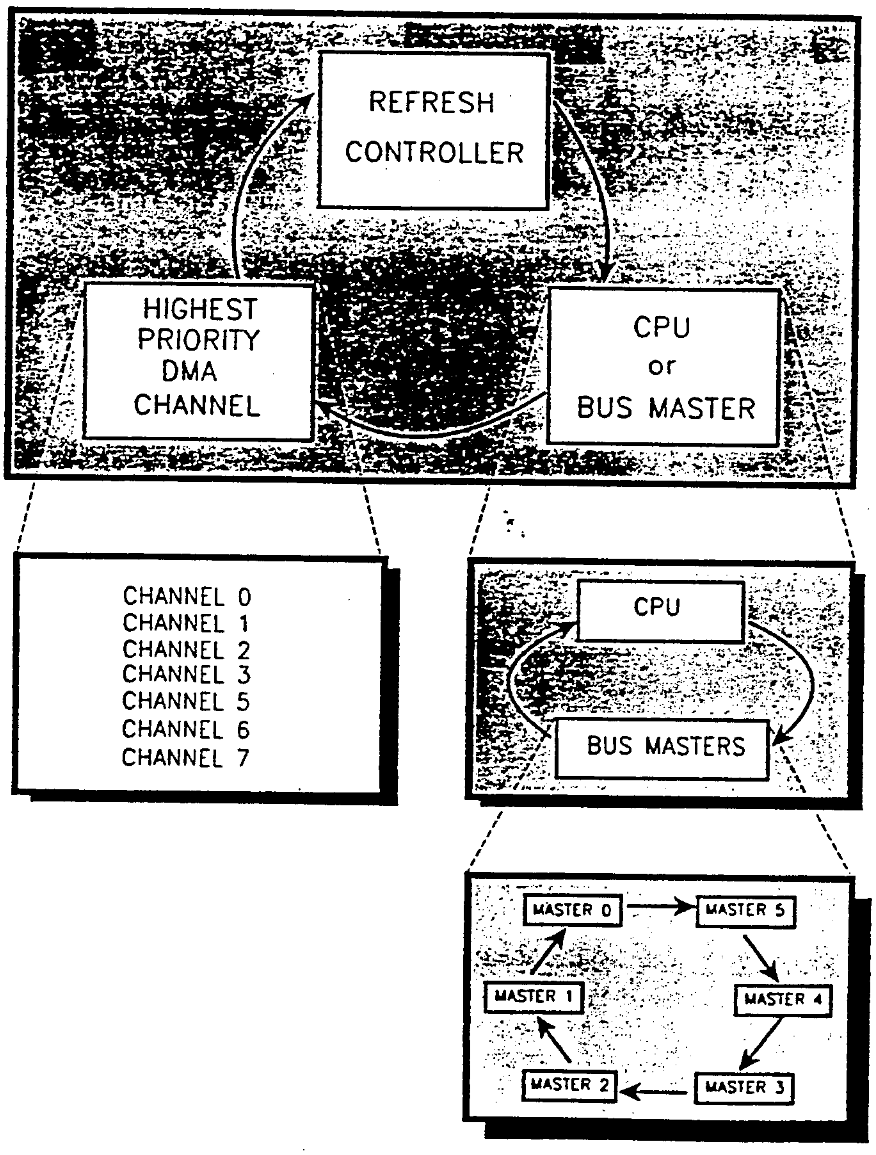

Figure 72 - Rotating DMA Priority Arbitration Sequence
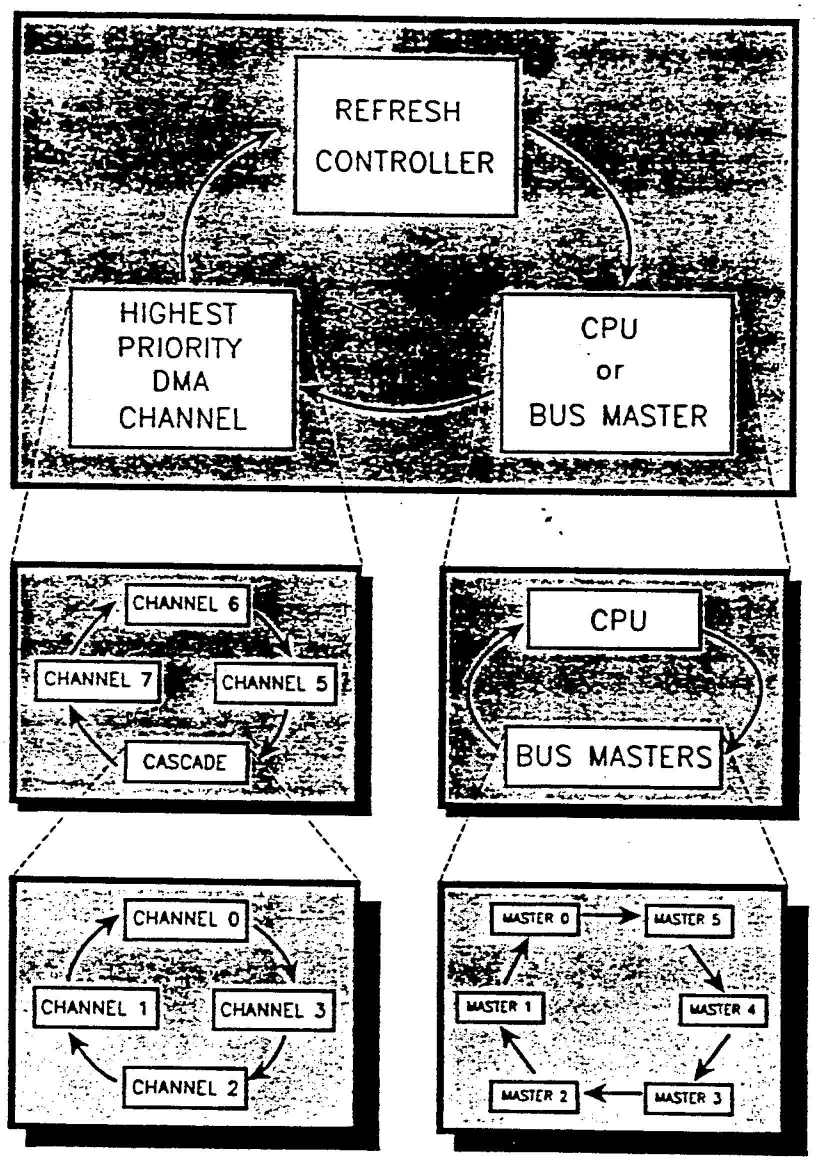

The top priority level uses a 3-way rotation to grant bus access sequentially to a DMA channel, the refresh controller, and a device from the 2-way rotation (CPU or a bus master). A DMA channel, the refresh controller, and a device from the 2-way rotation each gain access to the bus at least one of every three arbitration cycles (depending on what devices are requesting service). A device that does not request the bus is skipped in the rotation.

NMI interrupts are given special priority. If an NMI interrupt occurs, the arbitration mechanism is modified so that the bus masters and the DMA controller are bypassed each time they come up for rotation. This gives the CPU complete control of the bus to perform the NMI service.

2.9.2 Subsystem Priorities and Latencies

This section illustrates the bus grant latency for a variety of system configurations. The estimates are intended to illustrate latencies in practical system configurations. The bus grant latency tabulations are based on the following assumptions:

- An 8 MHz EISA bus.
- The CPU releases the bus within 9 $\mu$s (32 BCLK periods plus 5 $\mu$s completion time for a locked cycle) after a preemption occurs.
- Bus masters release the bus within 10.6 $\mu$s (64 BCLK periods plus completion time for the final cycle) after a preemption occurs.
- The DMA controller (programmed for block or demand mode) releases the bus within 5.8 $\mu$s (32 BCLK periods plus completion time for the final cycle).
- Single cycle DMA completes in 1.1 $\mu$s.
- The DMA controller is programmed for fixed priority.
- A refresh cycle takes 1.3 $\mu$s.
- The CPU, DMA channels, and bus masters re-assert their bus request signal immediately after relinquishing the bus after a preempt.

The latency assumptions noted above are not valid for all configurations, so the actual latency may be different for any specific case. Some of the configuration specifics that affect latency include:

- DMA devices programmed for ISA compatible BLOCK mode or ISA compatible demand mode.
- Another special case occurs when the main CPU operates directly from EISA expansion bus memory, continuously requesting the bus. A device with a new bus grant gets an immediate preempt because of the CPU request. The device must release the bus within the 8 μs time limit.
- Slow memory affects latency, particularly when used by the CPU or bus masters to do LOCKED cycles or 32-bit operations. An 8-bit ISA memory accessed with 32-bit accesses can cause much longer latencies than usual, particularly if accessed with read-modify-write type instructions with a LOCK prefix.

The following bus grant latency tables include a separate table for each device type that arbitrates for the bus (the main CPU, the DMA controller, the refresh controller and bus masters). The device grant latency total (at the end of each table) indicates the device's worst case latency for the configuration. Each table includes four cases to illustrate the bus grant latency for a variety of configurations.

The following table illustrates the latency calculation for a variety of DMA configurations:

| DMA Latency Examples | Case 1 | Case 2 | Case 3 | Case 4 |
|---|---|---|---|---|
| Bus Load Assumptions: | Qty | Qty | Qty | Qty |
| DMA Channels (Blk) | 0 | 1 | 1 | 2 |
| DMA Channels (Sgl Cyc) | 2 | 1 | 2 | 1 |
| Bus Masters | 2 | 2 | 2 | 2 |
| Bus Grant Sequence: | (μs) | (μs) | (μs) | (μs) |
| DMA Channel 0 | 1.1 | 5.0 | 5.0 | 5.0 |
| Refresh | 1.3 | 1.3 | 1.3 | 1.3 |
| CPU | 9.0 | 9.0 | 9.0 | 9.0 |
| DMA Channel 1 | Grant | Grant | 1.1 | 5.0 |
| Bus Master | na | na | 10.6 | 10.6 |
| DMA Channel 2 | na | na | Grant | Grant |
| DMA Grant Latency | 11.4 | 15.3 | 27.0 | 30.9 |

The following table illustrates the latency calculation for the refresh controller. The calculations show that distributed refresh occurs:

| Refresh Latency Examples | Case 1 | Case 2 | Case 3 | Case 4 |
|---|---|---|---|---|
| Bus Load Assumptions: | Qty | Qty | Qty | Qty |
| DMA Channels (Blk) | 0 | 1 | 2 | 1 |
| DMA Channels (Sgl Cyc) | 2 | 1 | 1 | 1 |
| Bus Masters | 0 | 1 | 6 | 1 |
| Bus Grant Sequence: | (μs) | (μs) | (μs) | (μs) |
| Refresh | na | na | na | 1.3 |
| Bus Master | na | na | na | 10.6 |
| DMA Channel | na | na | na | 1.1 |
| Refresh | na | na | na | Skip |
| CPU | na | na | na | 9.0 |
| DMA Channel | na | na | na | 5.0 |
| Refresh | na | na | na | Grant |
| Bus Master | 10.6 | 10.6 | 10.6 | na |
| DMA Channel | 1.1 | 5.0 | 5.0 | na |
| Refresh | Grant | Grant | Grant | na |
| Refresh Grant Latency | 11.7 | 15.6 | 15.6 | 27.0 |

The following table illustrates the latency calculation for the main CPU. Case 3 shows that the CPU latency does not increase when large numbers of bus masters are added.

| CPU Latency Examples | Case 1 | Case 2 | Case 3 | Case 4 |
|---|---|---|---|---|
| Bus Load Assumptions: | Qty | Qty | Qty | Qty |
| DMA Channels (Blk) | 0 | 1 | 1 | 2 |
| DMA Channels (Sgl Cyc) | 2 | 1 | 1 | 1 |
| Bus Masters | 1 | 1 | 2 | 6 |
| Bus Grant Sequence: | (μs) | (μs) | (μs) | (μs) |
| DMA Channel 1 | 1.1 | 5.0 | 5.0 | 5.0 |
| Refresh | 1.3 | 1.3 | 1.3 | 1.3 |
| Bus Master | 10.6 | 10.6 | 10.6 | 10.6 |
| DMA Channel 2 | 1.1 | 1.1 | 1.1 | 5.0 |
| CPU | Grant | Grant | Grant | Grant |
| CPU Grant Latency | 14.1 | 18.0 | 18.0 | 21.9 |

The following table illustrates the latency calculation for a CPU bus grant to service an NMI. Case 1 shows the grant sequence without an NMI. Case 2 shows the grant sequence if a block mode DMA channel has the bus when the NMI is asserted, and a bus master is next in the rotation. Case 3 shows the grant sequence if a DMA channel has the bus when the NMI is asserted and the CPU is next in the rotation. Case 4 shows the grant sequence if a bus master has the bus when the NMI is asserted.

| NMI Latency Examples | Case 1 | Case 2 | Case 3 | Case 4 |
|---|---|---|---|---|
| Bus Load Assumptions: | Qty | Qty | Qty | Qty |
| DMA Channels (Blk) | 2 | 2 | 2 | 2 |
| DMA Channels (Sgl Cyc) | 0 | 0 | 0 | 0 |
| Bus Masters | 3 | 3 | 3 | 3 |
| NMI asserted | no | yes | yes | yes |
| Bus Grant Sequence: | (μs) | (μs) | (μs) | (μs) |
| DMA Channel 0 | 5.0 | 5.0 | na | na |
| Refresh | 1.3 | 1.3 | na | na |
| Bus Master | 10.6 | Skip | na | 10.6 |
| DMA Channel 1 | 5.0 | Skip | 5.0 | Skip |
| Refresh | 1.3 | Skip | 1.3 | 1.3 |
| CPU | Grant | Grant | Grant | Grant |
| NMI Service Latency | na | 7.9 | 7.9 | 11.9 |

EXTENDED INDUSTRY STANDARD ARCHITECTURE
CONFIDENTIAL INFORMATION OF BCPR SERVICES, INC.

The following table illustrates the latency calculation for an EISA bus master:

| Bus Master Latency | Case 1 | Case 2 | Case 3 | Case 4 |
|---|---|---|---|---|
| Bus Load Assumptions: | Qty | Qty | Qty | Qty |
| DMA Channels (Blk) | 0 | 1 | 1 | 1 |
| DMA Channels (Sgl Cyc) | 2 | 1 | 1 | 1 |
| Bus Masters | 1 | 1 | 2 | 6 |
| Bus Grant Sequence: | (μs) | (μs) | (μs) | (μs) |
| DMA Channel 1 | 1.1 | 5.0 | 5.0 | 5.0 |
| Refresh | 1.3 | 1.3 | 1.3 | 1.3 |
| CPU | 9.0 | 9.0 | 9.0 | 9.0 |
| DMA Channel 2 | 1.1 | 1.1 | 1.1 | 1.1 |
| Bus Master 1 | Grant | Grant | 10.6 | 10.6 |
| DMA Channel 1 | na | na | 5.0 | 5.0 |
| Refresh | na | na | 1.3 | 1.3 |
| CPU | na | na | 9.0 | 9.0 |
| DMA Channel 2 | na | na | 1.1 | 1.1 |
| Refresh | na | na | 1.3 | 1.3 |
| Bus Master 2 | na | na | Grant | 10.6 |
| DMA Channel 1 | na | na | na | 5.0 |
| Refresh | na | na | na | 1.3 |
| CPU | na | na | na | 9.0 |
| DMA Channel 2 | na | na | na | 5.0 |
| Refresh | na | na | na | 1.3 |
| Bus Master 3 | na | na | na | 10.6 |
| DMA Channel 1 | na | na | na | 5.0 |
| Refresh | na | na | na | 1.3 |
| CPU | na | na | na | 9.0 |
| DMA Channel 2 | na | na | na | 5.0 |
| Refresh | na | na | na | 1.3 |
| Bus Master 4 | na | na | na | 10.6 |
| DMA Channel 1 | na | na | na | 5.0 |
| Refresh | na | na | na | 1.3 |
| CPU | na | na | na | 9.0 |
| DMA Channel 2 | na | na | na | 5.0 |
| Refresh | na | na | na | 1.3 |
| Bus Master 5.0 | na | na | na | 10.6 |
| DMA Channel 1 | na | na | na | 5.0 |
| Refresh | na | na | na | 1.3 |
| CPU | na | na | na | 9.0 |
| DMA Channel 2 | na | na | na | 5.0 |
| Refresh | na | na | na | 1.3 |
| Bus Master 6 | na | na | na | Grant |
| Bus Master Grant Latency | 12.5 | 16.4 | 46.3 | 173.5 |

2.9.3 EISA Bus Master Arbitration Cycle Descriptions

EISA bus masters use the slot-specific signals, MREQx* and MAKx* for bus arbitration. The EISA bus master asserts MREQx* to request bus access. If the system board samples MREQx* asserted, the centralized arbitration controller performs the arbitration and the system board asserts MAKx* to acknowledge that the bus master may access the bus. The centralized system board can negate MAKx* while the bus master is accessing the bus. The bus master must release the bus within 64 BCLKs (8 $\mu$s) after negation of MAKx*. The centralized arbitration controller causes an NMI if a bus master fails to release the bus within the 8 $\mu$s time limit.

Figure 73 illustrates an arbitration sequence in which the slot 2 bus master preempts the slot 1 bus master. The following procedure describes the arbitration sequence:

A. Master 1 requests control of the bus by asserting MREQ1*.

B. The system board samples MREQ1* asserted and arbitrates among all other requests, eventually granting control of the bus to Master 1 by asserting MAK1* on the rising edge of BCLK.

C. Master 2 requests control of the bus by asserting MREQ2*.

D. The system board preempts Master 1 by negating MAK1* on the rising edge of BCLK. Master 1 now has 64 BCLKs (8 $\mu$s) to relinquish control of the bus.

E. Master 1 stops driving the address bus, data bus and the control signals, and negates MREQ1*.

F. Master 1 still requires the bus, however, so it waits two BCLKs and asserts MREQ1* again.

G. Master 2 is granted control of the bus by the system board, and begins driving the bus signals and executing cycles.

H. Master 2 voluntarily relinquishes control of the bus by negating MREQ2*.

I. The system board samples MREQ2* negated and begins bus arbitration.

J. The system board gives Master 1 control of the bus again.

Note: There is typically a one BCLK delay between the time MREQx* is sampled by the system and the time the system responds.

Figure 73 - Bus Arbitration Between Two Bus Masters
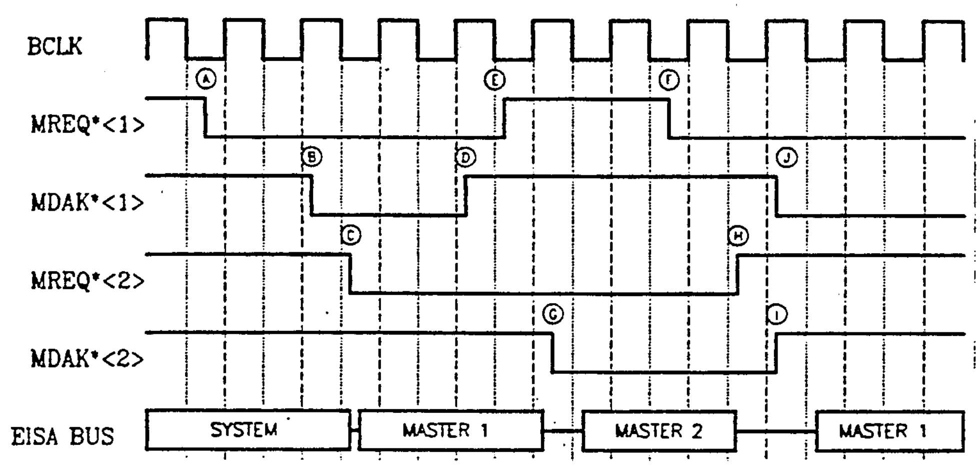

2.10 Memory Refresh

The EISA system board performs memory refresh. EISA bus masters need not supply refresh cycles since the refresh controller can preempt the bus master and perform the necessary refresh cycles. sixteen-bit ISA bus masters that hold the bus longer than 15 μs must supply memory refresh cycles.

A memory slave must monitor REFRESH* to detect a refresh address. If REFRESH* is asserted before assertion of START*, the address on the bus is a refresh address. The refresh cycle lasts from the leading edge of START* through the trailing edge of CMD* (2 BCLK periods) unless wait states are added by the memory slave negating EXRDY (EISA slaves) or CHRDY (ISA slaves). Memory slaves must not drive data on the bus during refresh. To achieve maximum performance, memory slaves should not add wait states to refresh cycles.

The refresh controller drives the refresh address onto the LA<15:2> address lines (14 bits of refresh counter) and also enables the BE*<3:0> lines so that they can be translated to SA<1:0> lines. The state of LA<31:16> is indeterminate. The refresh address bit order on the LA<15:2> and SA<15:0> bus is as follows:

| | | | | | | | | | | | | | | | | |
|---|---|---|---|---|---|---|---|---|---|---|---|---|---|---|---|---|
| 13 | 12 | 11 | 10 | 9 | 8 | 1 | 0 | 7 | 6 | 5 | 4 | 3 | 2 | 1 | 0 | Refresh |
| 15 | 14 | 13 | 12 | 11 | 10 | 9 | 8 | 7 | 6 | 5 | 4 | 3 | 2 | 1 | 0 | LA<>,SA<> |

Refresh requests are generated by two sources: system timer 1 counter 1, and 16-bit bus masters that assert REFRESH* when they are in control of the bus. The system timer is programmed to request a refresh about every 15 microseconds.

The refresh controller performs distributed refresh and increments a counter each time a refresh request is not serviced within the normal 15 μs interval. The counter counts up to four incomplete refresh requests. The refresh controller executes one refresh cycle when it gains control of the bus, and decrements the pending refresh count. If more refreshes are queued up, the refresh controller immediately requests the bus again, without waiting the normal 15 μs interval. In this case, if no other device requires use of the bus, then the REFRESH* negated time can be as short as 1 BCLK.

The incomplete refresh counter allows refresh to be held off for a maximum of 75 μs without refresh loss. The counter helps prevent 16-bit ISA bus masters and ISA compatible block or demand mode DMA devices from causing refresh loss when they do not release the bus.

Figure 74 shows a standard and a one-wait state EISA refresh cycle.

Figure 74 - Refresh Cycles (Standard and One Wait State)
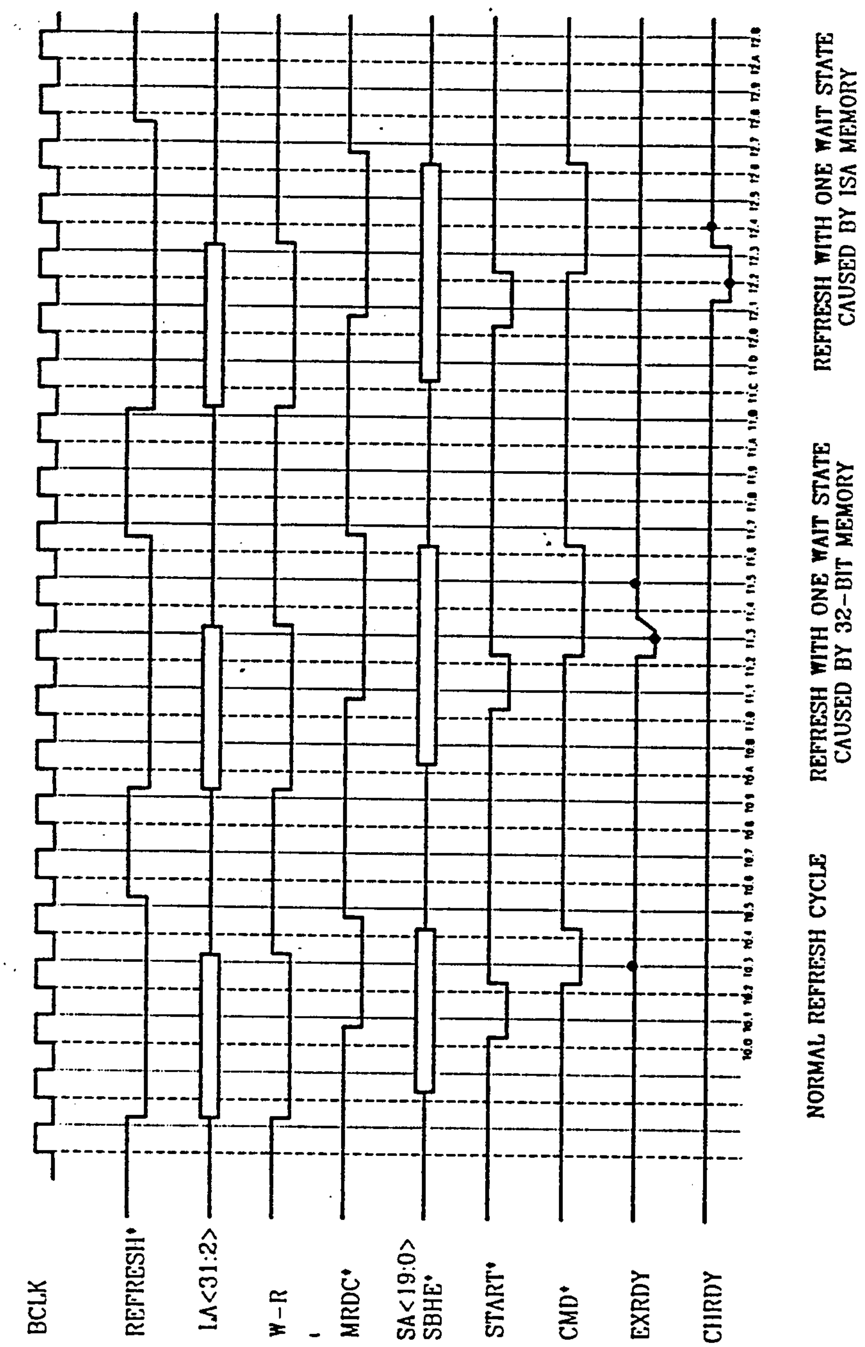

2.11 Electrical Specifications

The electrical drive characteristics listed elsewhere in this specification assume a maximum of 8 bus slots. Slot-specific elements of the EISA architecture logically support up to 15 slots. Although an EISA system can logically support up to 15 slots, a practical system configuration would be unlikely to have more than 8 slots.

2.11.1 Power Consumption

The following table describes the power specification for each slot. Total supply current and thermal dissipation are product specific and beyond the scope of this specification.

| Supply Voltage | Supply Current | Guaranteed Current |
|---|---|---|
| +5 Volts ± 5% | 4.5 amps | 2.0 amps |
| -5 Volts ± 10% | .2 amps | -- |
| +12 Volts ± 5% | 1.5 amps | -- |
| -12 Volts ± 10% | .3 amps | -- |

NOTE: Current on any pin cannot exceed 0.5 amps for EISA pins and 1.5 amps for ISA pins.

2.11.2 DC Characteristics

Six drive types are used in the EISA bus. They are as follows:

| | | |
|---|---|---|
| 3SL | 3-state | light drive |
| TPL | Totem Pole | light drive |
| OCL | Open Collector | light drive |
| 3SH | 3-state | heavy drive |
| 3TPH | Totem Pole | heavy drive |
| OCH | Open Collector | heavy drive |

The following table shows the DC output characteristics for each of the output types.

Output DC Characteristics by Driver Type

| | 3SL | | TPL | | OCL | | 3SH | | TPH | | OCH | |
|---|---|---|---|---|---|---|---|---|---|---|---|---|
| | min | max | min | max | min | max | min | max | min | max | min | max |
| $V_{OH}$ (V) | 2.4 | | 2.4 | | | | 2.4 | | 2.4 | | | |
| $V_{OL}$ (V) | | 0.5 | | 0.5 | | 0.5 | | 0.5 | | 0.5 | | 0.5 |
| $I_{OH}$ (mA) | | -.4 | | -.4 | | | | -3 | | -3 | | |
| $I_{OL}$ (mA) | | 5.0 | | 5.0 | | 5.0 | | 24 | | 24 | | 24 |

The following table defines the DC characteristics of an input.

Input DC Characteristics

| | min | max | units |
|---|---|---|---|
| $V_{IH}$ | 2.0 | | V |
| $V_{IL}$ | | 0.8 | V |

The following table shows drive types required for each signal on the bus, signals that may have expansion-slot loads, and system-board pull up or down resistors required.

Drive, Load, and Pull-up/Pull-down Requirements by Bus Signal

| Signal Name | Drive Type | Input Load Per Slot (μA) | | Pull-up | Pull-down | Notes |
|---|---|---|---|---|---|---|
| | | $I_L$ | $I_H$ | (ohms) | (ohms) | |
| AENx | TPL | 800 | -80 | | | |
| BALE | TPH | 800 | -80 | | | |
| BCLK | TPH | 800 | -80 | | | |
| BE*<3:0> | 3SH | 800 | -80 | | | |
| CHRDY | OCH | 800 | -80 | 1.0K | | 1 |
| CMD* | TPH | 800 | -80 | | | |
| D<31:0> | 3SH | 800 | -80 | 8.2K | | 1 |
| DAK*<7:0> | TPL | 800 | -80 | | | 2 |
| DRQ<7:0> | 3SL | 20 | -20 | | 5.6K | 1,3 |
| EX16* | OCH | 800 | -80 | 300 | | 1 |
| EX32* | OCH | 800 | -80 | 300 | | 1 |
| EXRDY | OCH | 800 | -80 | 300 | | 1 |
| IO16* | OCH | 800 | -80 | 300 | | 1 |
| IOCHK* | OCH | 800 | -80 | 4.7K | | 1 |
| IORC* | 3SH | 800 | -80 | 8.2K | | 1 |
| IOWC* | 3SH | 800 | -80 | 8.2K | | 1 |
| IRQ<15:3> | OCL | 20 | -20 | 8.2K | | 1,4 |
| LA*<31:24> | 3SH | 800 | -80 | 1.0K | | 1 |
| LA<23:2> | 3SH | 800 | -80 | | | |
| LOCK* | 3SH | 800 | -80 | 1.0K | | 1 |
| M-IO | 3SH | 800 | -80 | | | |
| M16* | OCH | 800 | -80 | 300 | | 1 |
| MAKx* | TPL | 800 | -80 | | | |
| MASTER16* | OCH | 800 | -80 | 300 | | 1 |
| MRDC* | 3SH | 800 | -80 | 8.2K | | 1 |
| MREQx* | TPL | | | 8.2K | | 1 |
| MSBURST* | 3SH | 800 | -80 | 8.2K | | 1 |
| MWTC* | 3SH | 800 | -80 | 8.2K | | 1 |
| NOWS* | OCH | 800 | -80 | 300 | | 1 |
| OSC | TPH | 800 | -80 | | | |
| REFRESH* | OCH | 800 | -80 | 300 | | 1 |
| RESDRV | TPH | 800 | -80 | | | |
| SA<19:0> | 3SH | 800 | -80 | | | |
| SBHE* | 3SH | 800 | -80 | | | |
| SLBURST* | OCH | 800 | -80 | 300 | | 1 |
| SMRDC* | TPH | 800 | -80 | | | |
| SMWTC* | TPH | 800 | -80 | | | |
| START* | 3SH | 800 | -80 | 8.2K | | 1 |
| T-C | 3SH | 800 | -80 | | | |
| W-R | 3SH | 800 | -80 | | | |

NOTES:

1. These pull-up and pull-down resistors are required on system boards only.
2. A maximum of 6 slots at a time may be filled with adapters connected to any one of the individual DAK* <7:0> signals.
3. Low-level input leakage current on the DRQ<7:0> inputs is such that the pull down resistors guarantee a logic low when no device is driving the signals. To protect drivers from damage due to incorrect system configuration (totem-pole and open-collector outputs sharing the same line) all DRQ outputs must include a up to a 47 ohm series resistor between the driver output and the bus. This is unnecessary if the driver can stand to be continuously driven to any voltage between Vcc and ground without damage.
4. ISA compatible devices may drive the IRQ<15:3> signals with a totem pole output and as such cannot share interrupts. To protect drivers from damage due to incorrect system configuration (totem-pole and open-collector outputs sharing the same line), IRQ<x> outputs must include up to a 47 ohm series resistor between the driver output and the bus. This is unnecessary if the driver can stand to be continuously driven to any voltage between Vcc and ground without damage.

2.11.3 Signal Routing and Capacitive Loading Requirements

Signal run lengths between the bus connector and the drivers and receivers on expansion boards should be limited to 2.5 inches.

The following table shows the maximum allowable loading capacitance for expansion boards, including wiring capacitance, and the total load capacitance an expansion board must drive. Total load capacitance for signals driven only by the system board is product specific and beyond the scope of this specification.

Load Capacitance

| Signal Name | Input Load Per Slot (pf) | Capacitance Total (pf) |
|---|---|---|
| AENx | 20 | - |
| BALE | 20 | - |
| BCLK | 20 | - |
| BE* <3:0> | 20 | 240 |
| CHRDY | 20 | 240 |
| CMD* | 20 | - |
| D<31:0> | 20 | 240 |
| DAK* <7:0> | 20 | - |
| DRQ<7:0> | - | 120 |
| EX16* | 20 | 240 |
| EX32* | 20 | 240 |
| EXRDY | 20 | 240 |
| IO16* | 20 | 240 |
| IOCHK* | 20 | 240 |
| IORC* | 20 | 240 |
| IOWC* | 20 | 240 |
| IRQ<15:3> | 20 | 120 |
| LA* <31:24> | 20 | 240 |
| LA<23:2> | 20 | 240 |
| LOCK* | 20 | 240 |
| M-IO | 20 | 240 |
| M16* | 20 | 240 |
| MAKx* | 20 | - |
| MASTER16* | 20 | 240 |
| MRDC* | 20 | 240 |
| MREQx* | - | 120 |
| MSBURST* | 20 | 240 |
| MWTC* | 20 | 240 |
| NOWS* | 20 | 240 |
| OSC | 20 | - |
| REFRESH* | 20 | 240 |
| RESDRV | 20 | - |
| SA<19:0> | 20 | 240 |
| SBHE* | 20 | 240 |
| SLBURST* | 20 | 240 |
| SMRDC* | 20 | - |
| SMWTC* | 20 | - |
| START* | 20 | 240 |
| T-C | 20 | 240 |
| W-R | 20 | 240 |

2.11.4 AC Characteristics

The following bus timing specifications identify the minimum or maximum timing parameters for EISA signals. To meet the bus timing specifications, an output signal's timing must provide margin for the signal to propagate from the driver output to any receiver input, and for transients caused by transmission line reflections to settle at a stable TTL logic level.

The following definitions apply to all of the AC characteristics:

SETUP - applicable to inputs, the time preceding a sampling event during which the state (high or low) of the incoming signal must not change.

HOLD - applicable to inputs, the time following a sampling event during which the state (high or low) of the incoming signal must not change.

DELAY (min) - applicable to outputs, the minimum time following a timing event before which the state (high or low) of the outgoing signal can change.

DELAY (max) - applicable to outputs, the time following a timing event after which the state (high or low) of the outgoing signal must not change.

2.11.4.1 ISA-compatible Timing Parameters

This section specifies the timing requirements for all ISA compatible devices. The ISA bus timing is divided into two main groups, CPU cycles and bus master cycles. ISA bus masters which do not synchronize their signals to BCLK must use the bus master cycle specifications. ISA bus masters which synchronize their signals to BCLK have the option of using CPU cycle specifications where the parameters are equivalent, and must use the CPU cycle specifications for NOWS*.

The following assumptions are included in the calculations which were used to create these specifications:

1) A device which generates a signal can meet the timing specs into the specified AC and DC load.

2) CPU cycle timing numbers are measured at the system board drivers and receivers. Master timing numbers are measured at the master's drivers and receivers.

3) Bus propagation delay has not been included in the ISA timing calculations. It is the responsibility of the slave designer to guarantee that there is sufficient margin in the design to allow for bus propagation delay.

4) Each driver for a signal must drive the signal such that it can settle to within the TTL input DC spec (less than 0.8 volts or greater than 2.0 volts) at the specified location on the bus within the specified delay time.

5) For drivers with open-collector type of outputs, the "valid" delay must include the rise time of the pullup resistor and the bus capacitance, to guarantee that the input is above a valid logic-high level (2.0 volts) if the input is negating during the time in question.

The ISA timing specifications are based on the timing for an IBM(R) PC-AT Model 339. Three classes of timing parameters are shown, delays from one system or bus master output to another, slave input-to-output delays, and system input setup.

Asynchronous slaves which do not use BCLK are required only to meet the input-to-output delays specified. When a slave's outputs are a function of more than one input from the system, the slave's design must guarantee that all of the delay specifications indicated here are satisfied. However, for any one bus cycle the actual switching time of the output will be determined by the latest specification to be satisfied.

NOWS* is a synchronous signal and masters and slaves which use it are required to meet setup and delay times from BCLK.

Figure 75 shows the timing parameters for the ISA-compatible portion of the EISA bus. Please note that Figure 75 is two pages long.

Figure 76 shows timing paramters for the ISA-compatible portion of the EISA bus for bus master cycles.

Figure 77 is similar to figure 75, with the exception that the signals are illustrated from the perspective of the device.

Figure 75 - ISA Bus Timing, System Timing
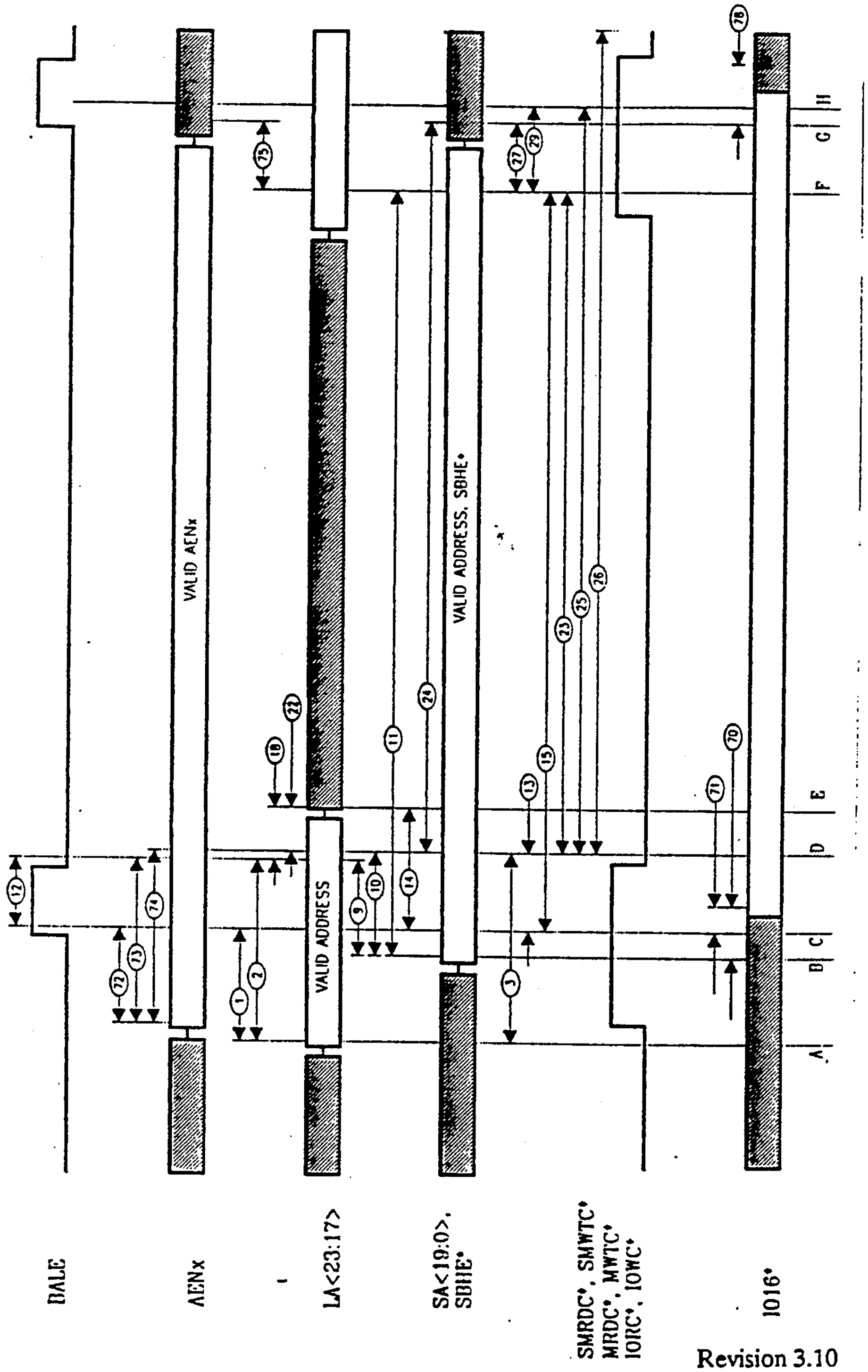

Figure 75 - ISA Bus Timing, System Timing
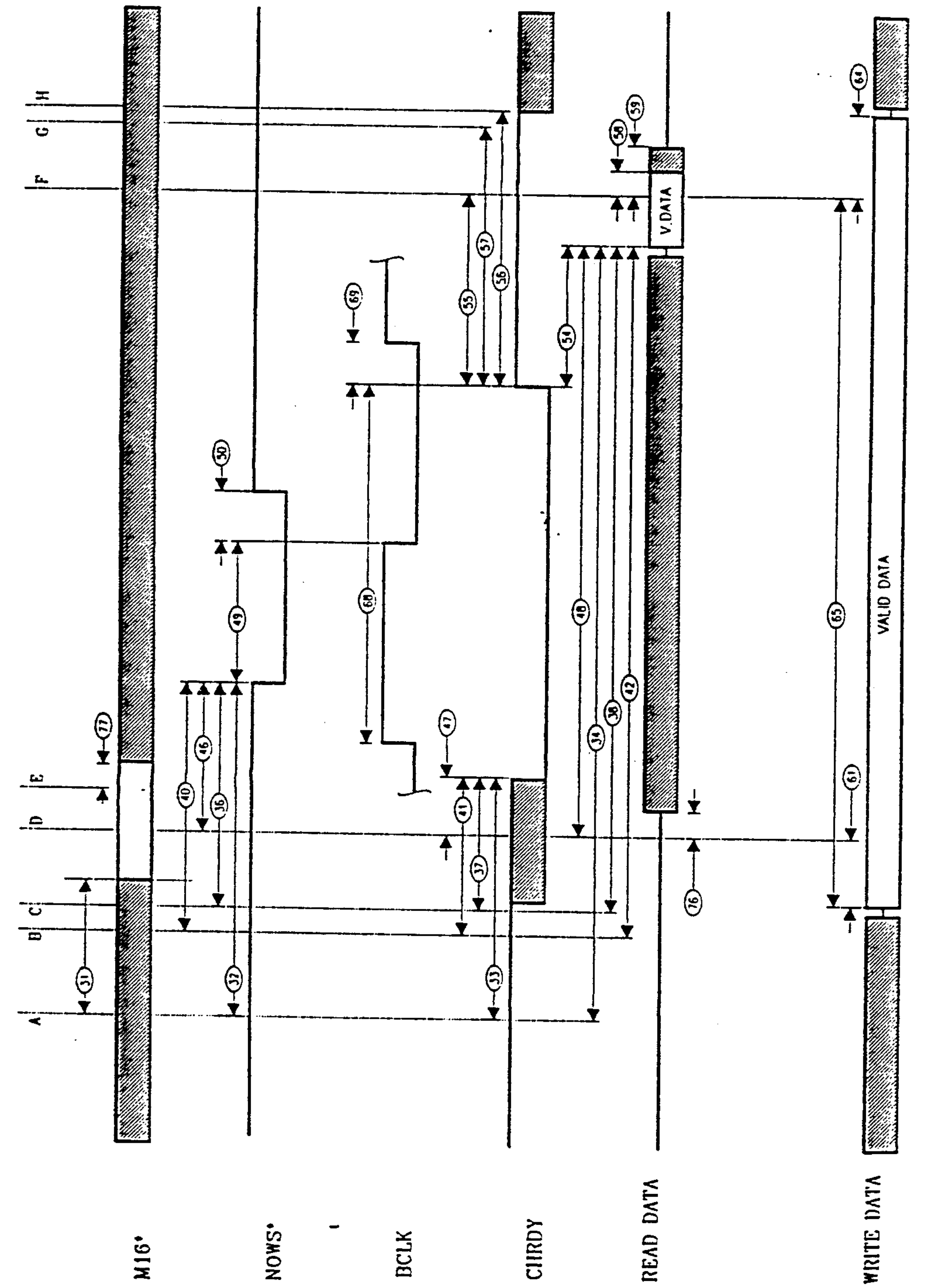

EXTENDED INDUSTRY STANDARD ARCHITECTURE
CONFIDENTIAL INFORMATION OF BCPR SERVICES, INC.

Parameter Table for Figure 75

| Ref # | ISA COMPATIBLE SIGNAL TIMING PARAMETERS DESCRIPTION | Timing (ns) Min | Max | Note |
|---|---|---|---|---|
| 1 | LA<23:17> valid before BALE asserted | 56 | | |
| | | | | |
| 2 | LA<23:17> valid before BALE negated | 116 | | |
| | | | | |
| 3 | LA<23:17> valid before MRDC*,MWTC* asserted | | | |
| 3a | Memory Access to 16-bit ISA Slave | 112 | | |
| 3b | Memory Access to 8-bit ISA Slave | 176 | | |
| | | | | |
| 9 | SA<19:0> & SBHE* valid before BALE negated | 28 | | |
| | | | | |
| 10 | SA<19:0> & SBHE* valid before MRDC*,MWTC* asserted | | | |
| 10a | Memory Access to 16-bit ISA Slave | 24 | | |
| 10b | Memory Access to 8-bit ISA Slave | 88 | | |
| 10 | SA<19:0> & SBHE* valid before SMRDC*,SMWTC* asserted | | | |
| 10c | Memory Access to 16-bit ISA Slave | 28 | | |
| 10d | Memory Access to 8-bit ISA Slave | 88 | | |
| 10e | SA<19:0> & SBHE* valid before IORC*,IOWC* asserted | 88 | | |
| | | | | |
| 11 | SA<19:0> & SBHE* valid before MRDC*,MWTC* negated | | | |
| 11a | Memory Access to 16-bit ISA Slave - 2 BCLK | 150 | | |
| 11b | Memory Access to 16-bit ISA Slave - Standard Cycle (3 BCLK) | 270 | | |
| 11c | Memory Access to 16-bit ISA Slave - 4 BCLK | 390 | | |
| 11d | Memory Access to 8-bit ISA Slave - 3 BCLK | 270 | | |
| 11e | Memory Access to 8-bit ISA Slave - Standard Cycle (6 BCLK) | 630 | | |
| 11f | Memory Access to 8-bit ISA Slave - 7 BCLK | 750 | | |
| | | | | |
| 12 | BALE asserted before BALE negated | 30 | | |
| | | | | |
| 13 | BALE asserted before MRDC*,MWTC* asserted | | | |
| 13a | Memory Access to 16-bit ISA Slave | 30 | | |
| 13b | Memory Access to 8-bit ISA Slave | 90 | | |
| 13 | BALE asserted before SMRDC*,SMWTC* asserted | | | |
| 13c | Memory Access to 16-bit ISA Slave | 30 | | |
| 13d | Memory Access to 8-bit ISA Slave | 90 | | |
| 13e | BALE asserted before IORC*,IOWC* asserted | 90 | | |
| | | | | |
| 14 | BALE asserted before LA<23:17> invalid | 90 | | |
| | | | | |

Parameter Table for Figure 75 (continued)

| Ref | ISA COMPATIBLE SIGNAL TIMING PARAMETERS DESCRIPTION | Timing (ns) Min | Max | Note |
|---|---|---|---|---|
| 15 | BALE asserted before MRDC*,MWTC*, SMRDC*, SMWTC* negated | | | |
| 15a | Memory Access to 16-bit ISA Slave - 2 BCLK | 154 | | |
| 15b | Memory Access to 16-bit ISA Slave - Standard Cycle (3 BCLK) | 274 | | |
| 15c | Memory Access to 16-bit ISA Slave - 4 BCLK | 394 | | |
| 15d | Memory Access to 8-bit ISA Slave - 3 BCLK | 274 | | |
| 15e | Memory Access to 8-bit ISA Slave - Standard Cycle (6 BCLK) | 634 | | |
| 15f | Memory Access to 8-bit ISA Slave - 7 BCLK | 754 | | |
| | | | | |
| 18 | BALE negated before LA<23:17> invalid | 22 | | |
| | | | | |
| 22 | MRDC*,MWTC* asserted before LA<23:17> invalid | | | |
| 22a | Memory Access to 16-bit ISA Slave | 25 | | |
| 22b | Memory Access to 8-bit ISA Slave | -30 | | |
| | | | | |
| 23 | MRDC*,MWTC* asserted before MRDC*,MWTC* negated | | | |
| 23a | Memory Access to 16-bit ISA Slave - 2 BCLK | 104 | | |
| 23b | Memory Access to 16-bit ISA Slave - Standard Cycle (3 BCLK) | 230 | | |
| 23c | Memory Access to 16-bit ISA Slave - 4 BCLK | 350 | | |
| 23d | Memory Access to 8-bit ISA Slave - 3 BCLK | 166 | | |
| 23e | Memory Access to 8-bit ISA Slave - Standard Cycle (6 BCLK) | 530 | | |
| 23f | Memory Access to 8-bit ISA Slave - 7 BCLK | 650 | | |
| 23 | SMRDC*,SMWTC* asserted before SMRDC*,SMWTC* negated | | | |
| 23g | Memory Access to 16-bit ISA Slave - 2 BCLK | 98 | | |
| 23h | Memory Access to 16-bit ISA Slave - Standard Cycle (3 BCLK) | 222 | | |
| 23j | Memory Access to 16-bit ISA Slave - 4 BCLK | 350 | | |
| 23k | Memory Access to 8-bit ISA Slave - 3 BCLK | 160 | | |
| 23l | Memory Access to 8-bit ISA Slave - Standard Cycle (6 BCLK) | 530 | | |
| 23m | Memory Access to 8-bit ISA Slave - 7 BCLK | 650 | | |
| 23 | IORC*,IOWC* asserted before IORC*,IOWC* negated | | | |
| 23o | I/O Access to 16-bit ISA Slave - Standard Cycle (3 BCLK) | 166 | | |
| 23p | I/O Access to 16-bit ISA Slave - 4 BCLK | 290 | | |
| 23q | I/O Access to 8-bit ISA Slave - 3 BCLK | 166 | | |
| 23r | I/O Access to 8-bit ISA Slave - Standard Cycle (6 BCLK) | 530 | | |
| 23s | I/O Access to 8-bit ISA Slave - 7 BCLK | 650 | | |
| | | | | |
| 24 | MRDC*,MWTC* asserted before SA<19:0> invalid | | | |
| 24a | Memory Access to 16-bit ISA Slave - 2 BCLK | 152 | | |
| 24b | Memory Access to 16-bit ISA Slave - Standard Cycle (3 BCLK) | 272 | | |
| 24c | Memory Access to 16-bit ISA Slave - 4 BCLK | 392 | | |
| 24d | Memory Access to 8-bit ISA Slave - 3 BCLK | 212 | | |

Parameter Table for Figure 75 (continued)

| Ref No. | ISA COMPATIBLE SIGNAL TIMING PARAMETERS DESCRIPTION | Timing (ns) | | Note |
|---|---|---|---|---|
| | | Min | Max | |
| 24e | Memory Access to 8-bit ISA Slave - Standard Cycle (6 BCLK) | 572 | | |
| 24f | Memory Access to 8-bit ISA Slave - 7 BCLK | 692 | | |
| 24 | SMRDC*,SMWTC* asserted before SA<19:0> invalid | | | |
| 24g | Memory Access to 16-bit ISA Slave - 2 BCLK | 152 | | |
| 24h | Memory Access to 16-bit ISA Slave - Standard Cycle (3 BCLK) | 272 | | |
| 24j | Memory Access to 16-bit ISA Slave - 4 BCLK | 392 | | |
| 24k | Memory Access to 8-bit ISA Slave - 3 BCLK | 212 | | |
| 24l | Memory Access to 8-bit ISA Slave - Standard Cycle (6 BCLK) | 572 | | |
| 24m | Memory Access to 8-bit ISA Slave - 7 BCLK | 692 | | |
| 24 | IORC*,IOWC* asserted before SA<19:0> invalid | | | |
| 24o | I/O Access to 16-bit ISA Slave - Standard Cycle (3 BCLK) | 212 | | |
| 24p | I/O Access to 16-bit ISA Slave - 4 BCLK | 332 | | |
| 24q | I/O Access to 8-bit ISA Slave - 3 BCLK | 212 | | |
| 24r | I/O Access to 8-bit ISA Slave - Standard Cycle (6 BCLK) | 572 | | |
| 24s | I/O Access to 8-bit ISA Slave - 7 BCLK | 692 | | |
| | | | | |
| 25 | MRDC*,MWTC* asserted before next BALE asserted | | | |
| 25a | Memory Access to 16-bit ISA Slave - 2 BCLK | 160 | | |
| 25b | Memory Access to 16-bit ISA Slave - Standard Cycle (3 BCLK) | 280 | | |
| 25c | Memory Access to 8-bit ISA Slave - 3 BCLK | 220 | | |
| 25d | Memory Access to 8-bit ISA Slave - Standard Cycle (6 BCLK) | 580 | | |
| 25 | SMRDC*,SMWTC* asserted before next BALE asserted | | | |
| 25e | Memory Access to 16-bit ISA Slave - 2 BCLK | 160 | | |
| 25f | Memory Access to 16-bit ISA Slave - Standard Cycle (3 BCLK) | 280 | | |
| 25g | Memory Access to 8-bit ISA Slave - 3 BCLK | 220 | | |
| 25h | Memory Access to 8-bit ISA Slave - Standard Cycle (6 BCLK) | 580 | | |
| 25 | IORC*,IOWC* asserted before next BALE asserted | | | a |
| 25i | I/O Access to 16-bit ISA Slave - Standard Cycle (3 BCLK) | 220 | | a |
| 25j | I/O Access to 8-bit ISA Slave - 3 BCLK | 220 | | a |
| 25k | I/O Access to 8-bit ISA Slave - Standard Cycle (6 BCLK) | 580 | | a |
| | | | | |
| 26 | MRDC*,MWTC* asserted before next MRDC*,MWTC* asserted | | | |
| 26a | Memory Access to 16-bit ISA Slave - 2 BCLK | 228 | | |
| 26b | Memory Access to 16-bit ISA Slave - Standard Cycle (3 BCLK) | 350 | | |
| 26c | Memory Access to 8-bit ISA Slave - 3 BCLK | 290 | | |
| 26d | Memory Access to 8-bit ISA Slave - Standard Cycle (6 BCLK) | 650 | | |
| 26 | SMRDC*,SMWTC* asserted before next SMRDC*,SMWTC* asserted | | | |
| 26e | Memory Access to 16-bit ISA Slave - 2 BCLK | 98 | | |
| 26f | Memory Access to 16-bit ISA Slave - Standard Cycle (3 BCLK) | 222 | | |
| 26g | Memory Access to 8-bit ISA Slave - 3 BCLK | 160 | | |

Parameter Table for Figure 75 (continued)

| Ref. No. | ISA COMPATIBLE SIGNAL TIMING PARAMETERS DESCRIPTION | Timing (ns) Min | Max | Note |
|---|---|---|---|---|
| 26h | Memory Access to 8-bit ISA Slave - Standard Cycle (6 BCLK) | 530 | | |
| 26 | IORC*,IOWC* asserted before next IORC*,IOWC* asserted | | | a |
| 26i | I/O Access to 16-bit ISA Slave - Standard Cycle (3 BCLK) | 350 | | a |
| 26j | I/O Access to 8-bit ISA Slave - 3 BCLK | 290 | | a |
| 26k | I/O Access to 8-bit ISA Slave - Standard Cycle (6 BCLK) | 710 | | a |
| | | | | |
| 27a | MRDC*,MWTC* negated before SA<19:0> invalid | 32 | | |
| 27b | SMRDC*,SMWTC* negated before SA<19:0> invalid | 32 | | |
| 27c | IORC*,IOWC* negated before SA<19:0> invalid | 32 | | |
| | | | | |
| 29a | MRDC*,MWTC* negated before next BALE asserted | 36 | | |
| 29b | SMRDC*,SMWTC* negated before next BALE asserted | 36 | | |
| 29c | IORC*,IOWC* negated before next BALE asserted | 36 | | a |
| | | | | |
| 31 | LA<23:17> valid to M16* valid | | 96 | |
| | | | | |
| 32 | LA<23:17> valid to NOWS* asserted | | | |
| 32a | Memory Access to 16-bit ISA Slave - 2 BCLK | | 156 | |
| 32b | Memory Access to 8-bit ISA Slave - 3 BCLK | | 280 | |
| | | | | |
| 33 | LA<23:17> valid to CHRDY negated | | | |
| 33a | Memory Access to 16-bit ISA Slave - 4 BCLKs | | 284 | |
| 33b | Memory Access to 8-bit ISA Slave - 7 BCLKs | | 654 | |
| | | | | |
| 34 | LA<23:17> valid to read data valid | | | |
| 34a | Memory Access to 16-bit ISA Slave - 2 BCLK | | 204 | |
| 34b | Memory Access to 16-bit ISA Slave - Standard Cycle (3 BCLK) | | 330 | |
| 34c | Memory Access to 16-bit ISA Slave - 4 BCLK | | 456 | |
| 34d | Memory Access to 8-bit ISA Slave - 3 BCLK | | 320 | |
| 34e | Memory Access to 8-bit ISA Slave - Standard Cycle (6 BCLK) | | 694 | |
| 34f | Memory Access to 8-bit ISA Slave - 7 BCLK | | 820 | |
| | | | | |
| 36 | BALE asserted to NOWS* asserted | | | |
| 36a | Memory Access to 16-bit ISA Slave | | 70 | |
| 36b | Memory Access to 8-bit ISA Slave | | 195 | |
| | | | | |

Parameter Table for Figure 75 (continued)

| Ref | ISA COMPATIBLE SIGNAL TIMING PARAMETERS DESCRIPTION | Timing (ns) Min | Max | Note |
|---|---|---|---|---|
| 37 | BALE asserted to CHRDY negated | | | |
| 37a | Memory Access to 16-bit ISA Slave - 4 BCLKs | | 200 | |
| 37b | Memory Access to 8-bit ISA Slave - 7 BCLKs | | 560 | |
| 37c | I/O Access to 16-bit ISA Slave - 4 BCLKs | | 200 | |
| 37d | I/O Access to 8-bit ISA Slave - 7 BCLKs | | 560 | |
| | | | | |
| 38 | BALE asserted to read data valid | | | |
| 38a | Memory Access to 16-bit ISA Slave - 2 BCLK | | 120 | |
| 38b | Memory Access to 16-bit ISA Slave - Standard Cycle (3 BCLK) | | 246 | |
| 38c | Memory Access to 16-bit ISA Slave - 4 BCLK | | 370 | |
| 38d | Memory Access to 8-bit ISA Slave - 3 BCLK | | 236 | |
| 38e | Memory Access to 8-bit ISA Slave - Standard Cycle (6 BCLK) | | 610 | |
| 38f | Memory Access to 8-bit ISA Slave - 7 BCLK | | 730 | |
| 38h | I/O Access to 16-bit ISA Slave - Standard Cycle (3 BCLK) | | 246 | |
| 38j | I/O Access to 16-bit ISA Slave - 4 BCLK | | 370 | |
| 38k | I/O Access to 8-bit ISA Slave - 3 BCLK | | 236 | |
| 38l | I/O Access to 8-bit ISA Slave - Standard Cycle (6 BCLK) | | 610 | |
| 38m | I/O Access to 8-bit ISA Slave - 7 BCLK | | 730 | |
| | | | | |
| 40 | SA<19:0>, SBHE valid to NOWS* asserted | | | |
| 40a | Memory Access to 16-bit ISA Slave - 2 BCLK | | 68 | |
| 40b | Memory Access to 8-bit ISA Slave - 3 BCLK | | 192 | |
| 40d | I/O Access to 8-bit ISA Slave - 3 BCLK | | 192 | |
| | | | | |
| 41 | SA<19:0>, SBHE valid to CHRDY negated | | | |
| 41a | Memory Access to 16-bit ISA Slave | | 196 | |
| 41b | Memory Access to 8-bit ISA Slave | | 560 | |
| 41c | I/O Access to 16-bit ISA Slave | | 196 | |
| 41d | I/O Access to 8-bit ISA Slave | | 560 | |
| | | | | |
| 42 | SA<19:0>, SBHE valid to read data valid | | | |
| 42a | Memory Access to 16-bit ISA Slave - 2 BCLK | | 116 | |
| 42b | Memory Access to 16-bit ISA Slave - Standard Cycle (3 BCLK) | | 242 | |
| 42c | Memory Access to 16-bit ISA Slave - 4 BCLK | | 366 | |
| 42d | Memory Access to 8-bit ISA Slave - 3 BCLK | | 232 | |
| 42e | Memory Access to 8-bit ISA Slave - Standard Cycle (6 BCLK) | | 606 | |
| 42f | Memory Access to 8-bit ISA Slave - 7 BCLK | | 726 | |
| 42h | I/O Access to 16-bit ISA Slave - Standard Cycle (3 BCLK) | | 242 | |
| 42j | I/O Access to 16-bit ISA Slave - 4 BCLK | | 366 | |
| 42k | I/O Access to 8-bit ISA Slave - 3 BCLK | | 232 | |

EXTENDED INDUSTRY STANDARD ARCHITECTURE
CONFIDENTIAL INFORMATION OF BCPR SERVICES, INC.

Parameter Table for Figure 75 (continued)

| Ref. No. | ISA COMPATIBLE SIGNAL TIMING PARAMETERS DESCRIPTION | Timing (ns) Min | Max | Note |
|---|---|---|---|---|
| 42l | I/O Access to 8-bit ISA Slave - Standard Cycle (6 BCLK) | | 606 | |
| 42m | I/O Access to 8-bit ISA Slave - 7 BCLK | | 726 | |
| | | | | |
| 46 | MRDC*, MWTC*, SMRDC*, SMWTC*, IORC*, IOWC* | | | |
| | asserted to NOWS* Asserted | | | |
| 46a | Memory Access to 16-bit ISA Slave - 2 BCLK | | 15 | |
| 46b | Memory Access to 8-bit ISA Slave - 3 BCLK | | 80 | |
| 46d | I/O Access to 8-bit ISA Slave - 3 BCLK | | 80 | |
| | | | | |
| 47 | MRDC*, MWTC*, SMRDC*, SMWTC*, IORC*, IOWC* | | | |
| | asserted to CHRDY negated | | | |
| 47a | Memory Access to 16-bit ISA Slave - 4 BCLKs | | 86 | |
| 47b | Memory Access to 8-bit ISA Slave - 7 BCLKs | | 398 | |
| 47c | I/O Access to 16-bit ISA Slave - 4 BCLKs | | 80 | b |
| 47d | I/O Access to 8-bit ISA Slave - 7 BCLKs | | 398 | |
| | | | | |
| 48 | MRDC*, SMRDC*, IORC* asserted to read data valid | | | |
| 48a | Memory Access to 16-bit ISA Slave - 2 BCLK | | 70 | |
| 48b | Memory Access to 16-bit ISA Slave - Standard Cycle (3 BCLK) | | 194 | |
| 48c | Memory Access to 16-bit ISA Slave - 4 BCLK | | 314 | |
| 48d | Memory Access to 8-bit ISA Slave - 3 BCLK | | 122 | |
| 48e | Memory Access to 8-bit ISA Slave - Standard Cycle (6 BCLK) | | 490 | |
| 48f | Memory Access to 8-bit ISA Slave - 7 BCLK | | 610 | |
| 48h | I/O Access to 16-bit ISA Slave - Standard Cycle (3 BCLK) | | 130 | |
| 48j | I/O Access to 16-bit ISA Slave - 4 BCLK | | 250 | |
| 48k | I/O Access to 8-bit ISA Slave - 3 BCLK | | 122 | |
| 48l | I/O Access to 8-bit ISA Slave - Standard Cycle (6 BCLK) | | 490 | |
| 48m | I/O Access to 8-bit ISA Slave - 7 BCLK | | 610 | |
| | | | | |
| 49 | NOWS* setup to BCLK falling edge | 10 | | |
| | | | | |
| 50 | NOWS* hold from BCLK falling edge | 20 | | |
| | | | | |

Parameter Table for Figure 75 (continued)

| Ref No. | ISA COMPATIBLE SIGNAL TIMING PARAMETERS DESCRIPTION | Timing (ns) Min | Max | Note |
|---|---|---|---|---|
| 54 | CHRDY asserted to read data valid | | | |
| 54a | Memory Access to 16-bit ISA Slave - 4 BCLKs | | 80 | |
| 54b | Memory Access to 8-bit ISA Slave - 7 BCLKs | | 70 | |
| 54c | I/O Access to 16-bit ISA Slave - 6 BCLKs | | 80 | |
| 54d | I/O Access to 8-bit ISA Slave - 7 BCLKs | | 70 | |
| | | | | |
| 55 | CHRDY asserted to MRDC*, MWTC*, SMRDC*, SMWTC*, IORC*, IOWC* negated | 116 | | |
| | | | | |
| 56 | CHRDY asserted to next BALE asserted | 164 | | |
| | | | | |
| 57 | CHRDY asserted to SA<19:0>, SBHE invalid | 164 | | |
| | | | | |
| 58 | MRDC*, IORC*, SMRDC* negated to read data invalid | 0 | | |
| | | | | |
| 59 | MRDC*, IORC*, SMRDC* negated to data bus float | | 30 | |
| | | | | |
| 61 | Write Data valid before MWTC* asserted | | | |
| 61a | Memory Access to 16-bit ISA Slave | -40 | | |
| 61b | Memory Access to 8-bit ISA Slave (byte copy at end of START) | 22 | | |
| 61 | Write Data valid before SMWTC* asserted | | | |
| 61c | Memory Access to 16-bit ISA Slave | -38 | | |
| 61d | Memory Access to 8-bit ISA Slave (byte copy at end of START) | 24 | | |
| 61 | Write Data valid before IOWC* asserted | | | |
| 61e | I/O Access to 16-bit ISA Slave | 22 | | |
| 61f | I/O Access to 8-bit ISA Slave (byte copy at end of START*) | 22 | | |
| | | | | |
| 64 | MWTC*, SMWTC*, IOWC*, negated to WRITE DATA invalid | | | |
| 64a | MWTC* negated to WRITE DATA invalid – 16-bit | 25 | | |
| 64b | MWTC* negated to WRITE DATA invalid – 8-bit | 9 | | |
| 64c | SMWTC* negated to WRITE DATA invalid – 16-bit | 25 | | |
| 64d | SMWTC* negated to WRITE DATA invalid – 8-bit | 9 | | |
| 64e | IOWC* negated to WRITE DATA invalid | 25 | | |
| | | | | |
| 65 | Write data valid to MWTC*, SMWTC*, IOWC* negated | | | |
| 65a | Memory Access to 16-bit ISA Slave - 2 BCLK | 86 | | |
| 65b | Memory Access to 16-bit ISA Slave - Standard Cycle (3 BCLK) | 212 | | |
| 65c | Memory Access to 16-bit ISA Slave - 4 BCLK | 586 | | |
| 65d | Memory Access to 8-bit ISA Slave - 3 BCLK | 208 | | |
| 65e | Memory Access to 8-bit ISA Slave - Standard Cycle (6 BCLK) | 564 | | |

Parameter Table for Figure 75 (conclusion)

| Ref. No. | ISA COMPATIBLE SIGNAL TIMING PARAMETERS DESCRIPTION | Timing (ns) Min | Max | Note |
|---|---|---|---|---|
| 65f | Memory Access to 8-bit ISA Slave - 7 BCLK | 684 | | |
| | | | | |
| 68 | CHRDY negated hold time | 40 | | c |
| | | | | |
| 69 | CHRDY asserted setup time to BCLK rising | 34 | | |
| | | | | |
| 70 | SA<19:0> & SBHE* valid before IO16* valid | | 160 | |
| | | | | |
| 71 | BALE asserted before IO16* valid | | 160 | |
| | | | | |
| 72 | AEN valid before BALE asserted | 45 | | |
| | | | | |
| 73 | AEN valid before BALE negated | 100 | | |
| | | | | |
| 74 | AEN valid before IORC* asserted | | | |
| 74a | AEN valid before IORC* asserted | 100 | | |
| 74b | AEN valid before IOWC* asserted | 100 | | |
| | | | | |
| 75 | IORC*, IOWC* negated before AEN invalid | 30 | | |
| | | | | |
| 76 | MRDC*, IORC*, SMRDC* asserted to read data enable | 0 | | |
| | | | | |
| 77 | LA invalid to M16* float delay | 0 | | |
| | | | | |
| 78 | SA invalid to IO16* float delay | 0 | | |
| | | | | |

Note (a) Assumes no back-to-back I/O delay. Back-to-back I/O delay adds integral number of BCLK periods to this parameter.

Note (b) Systems designed prior to the EISA specification, which sample CHRDY on the rising edge of BCLK require parameter 47c max = 24 ns.

Note (c) CHRDY negated (low) hold time is measured from the rising edge of BCLK or the negating (falling) edge of CHRDY, whichever is later. Devices designed prior to the EISA specification may require hold time to be measured exclusively from the rising edge of BCLK.

Figure 76 - ISA Bus Timing, Bus Master Cycles
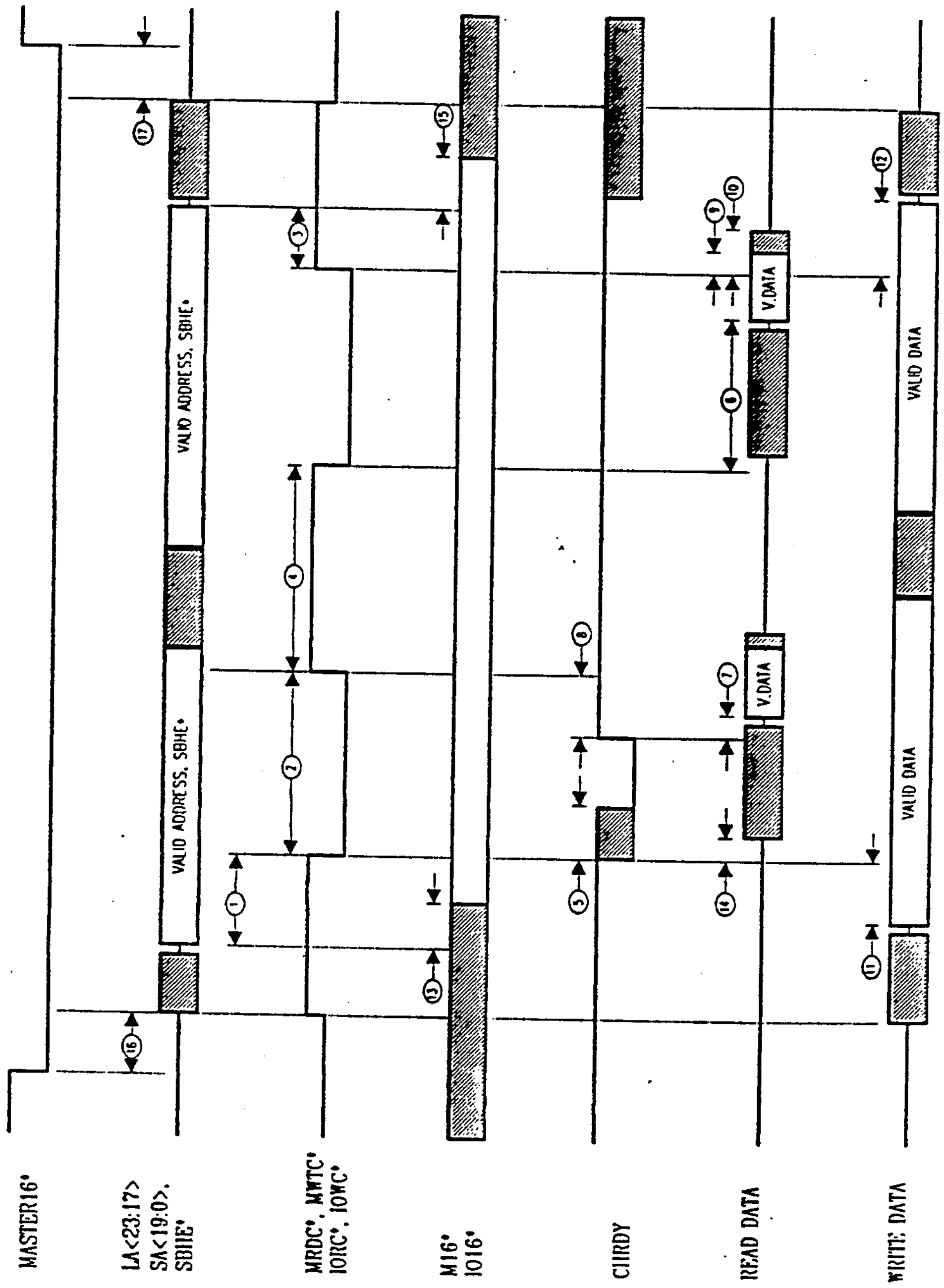

Parameter Table for Figure 76

| | 16- or 32-bit EISA master timing: | | |
|---|---|---|---|
| | Description | min | max |
| 1 | MREQ* delay from BCLK falling | 2.0 | 33.0 |
| 2 | MAK* setup to BCLK falling | 10.0 | |
| 3 | MAK* held from BCLK falling | 25.0 | |
| 4 | LA addr, M-IO delay from BCLK falling | 2.0 | 50.0 |
| 5 | BE*< >,W-R delay from BCLK falling | 2.0 | 85.0 |
| | BE*< >,W-R delay from BCLK rising ** see Note (a) ** | | 25.0 |
| 6 | LA addr, M-IO, BE*, W-R, MSBURST float delay | 2.0 | 50.0 |
| 7 | LA addr,M-IO setup to START* asserted | 10.0 | |
| 8 | START* delay from BCLK rising | 2.0 | 25.0 |
| 9 | EX32* (or EX16*) setup to BCLK rising (at CMD) | 25.0 | |
| 10 | EX32* (or EX16*) held from BCLK rising (at CMD) | 55.0 | |
| 11 | EX32* (or EX16*) setup to BCLK rising (assembly finish) | 15.0 | |
| 12 | EX32* (or EX16*) held from BCLK rising (assembly finish) | 50.0 | |
| 13 | EX32* (or EX16*) setup to BCLK falling (assembly finish) | 80.0 | |
| 14 | EX32* (or EX16*) held from BCLK falling (assembly finish) | 5.0 | |
| 15 | EXRDY setup to BCLK falling | 15.0 | |

Parameter Table for Figure 76 (conclusion)

| | 16- or 32-bit EISA master timing: | | |
|---|---|---|---|
| | Description | min | max |
| 16 | EXRDY held from BCLK falling | 5.0 | |
| | | | |
| 17 | LOCK* delay from BCLK rising | 2.0 | 60.0 |
| | | | |
| 18 | Data delay from BCLK falling (write) | 2.0 | 40.0 |
| | | | |
| 19 | Data flt.del.from BCLK falling (write) ** see Note (b) ** | 2.0 | 50.0 |
| | | | |
| 20 | Data held after BCLK rising (read) | 4.0 | |
| | (for compressed cycle, from BCLK falling) | | |
| 21 | Data setup to BCLK rising (read) | 15.0 | |
| | (for compressed cycle, to BCLK falling) | | |
| 22 | MASTER16* asserted delay from BCLK falling (16-bit master) | 2.0 | 30.0 |
| | | | |
| 23 | MASTER16* asserted delay from MAK*<x> asserted (16-bit master) | | 40.0 |
| | | | |
| 24 | MASTER16* float delay from BCLK falling (16-bit master) | 2.0 | 50.0 |

Note (a): BE< >* bits are allowed to change as early as the falling BCLK when the LA< > bits change.

Note (b): Parameter applies after any write cycle not followed by another write cycle, or followed by write cycle with some BE< >* bits negated.

Figure 77 - ISA Bus Timing, CPU Cycles (Device Perspective)
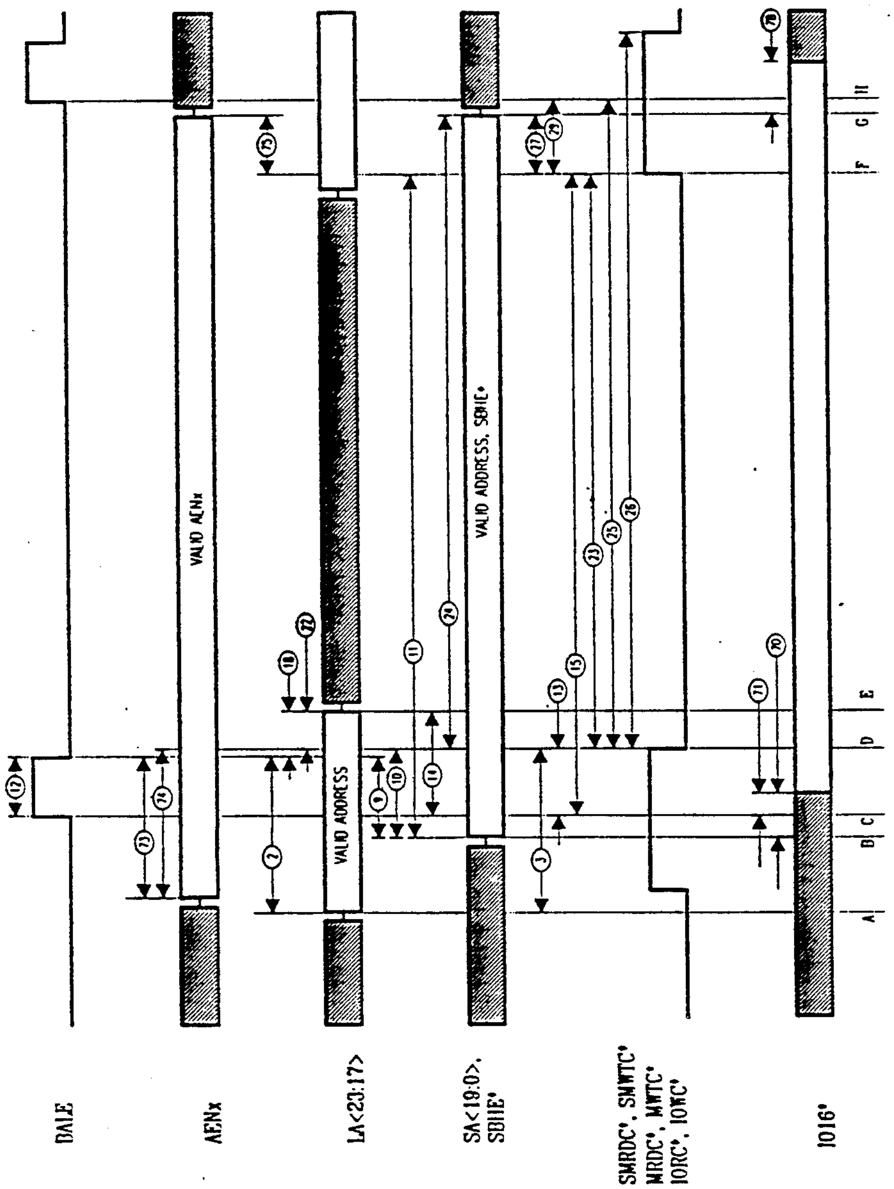

Figure 77 - ISA Bus Timing, CPU Cycles (Device Perspective)
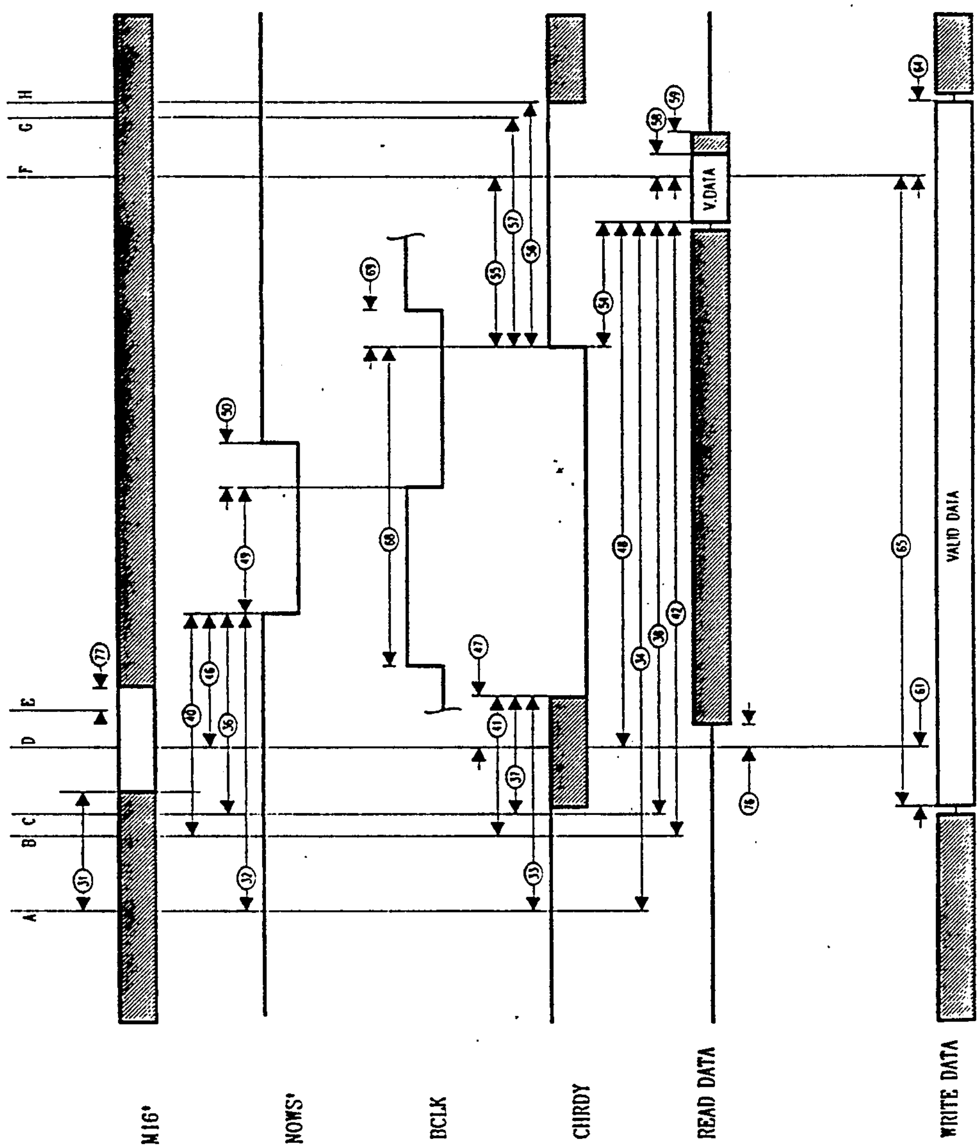

2.11.4.2 EISA, DMA, and Refresh Timing Parameters

This section specifies the timing requirements for all EISA devices. The specification is divided into three main groups corresponding to the main types of EISA devices: masters, slaves and DMA devices. Figures 78 through 91, and the associated parameter tables, at the end of this section show the relevant signals and parameters for the various cycle types.

The timing specifications for EISA are calculated to assist the system or option board designer to verify his system. The following assumptions are included in the calculations that were used to create these specifications.

1) A device that generates a signal can meet the timing specs into the specified AC and DC load.

2) All timing parameters are measured at the receiver and driver of the device being specified.

3) Each signal is allowed 5 ns to propagate to the farthest load and to reflect back to the source (one time). The propagation time is approximately 2 1/2 ns, based on 16 inches of trace. A worst case propagation path is: 2 1/2 inches from driver to connector, 6 inches from connector across backplane, and up to 7 1/2 inches from connector to receiver on the system board. This delay (transmission line delay) is built into the calculations for the system.

4) Each driver for a signal must drive the signal so that it can settle to within the TTL input DC spec (less than 0.8 volts or greater than 2.0 volts) within the specified output delay plus the 5 ns.

5) For drivers with open collector type of outputs, the delay caused by the rise time of the pullup resistor and the bus capacitance is included in the calculations for signals going from low to high. This is used instead of the 5 ns transmission line delay. The equation used is as follows:

$$-\ln(1-(2.0v-0.25v)/(4.75v-0.25v))*R_{PULLUP}*C_{SIGNAL\ CAPACITANCE}$$

This corresponds to a minimum Vcc level of 4.75v, a steady state logic low level of 0.25v, and the high level input voltage spec of 2.0v. If a driver's steady state logic low value is lower than this, then additional time must be allowed for the RC rise delay by reducing the specified signal output delay.

Note that the delay in generating the falling edge of the open collector outputs is allowed to be slower than the EISA spec indicates. The extra delay allowed is equal to the RC delay for the signal (as calculated above) minus 5 ns. Only the float delay must actually meet the published spec.

For many logic families, notes 1 to 4 allow a designer to verify a design directly at the output of the driver or input of the receiving logic. The 5 ns transmission and settling time eliminates the need to check the system under various types of loading and with the adapter in various slots.

If a logic driver is used that has a very short rise and/or fall time (less than 4 or 5 ns), then the designer may have to plan for additional settling time or use series damping resistors. The designer should check these types of drivers in both large, fully loaded systems and small lightly loaded systems.

As an alternative to using the specified delay values and AC loads for drivers, the designer may instead guarantee timing at the destination receivers rather than at the source driver. In this case the designer must insure, through testing, that all possible *receivers* are within the TTL input specs within the EISA spec time *plus* 5 ns. This testing should be done in both large fully loaded systems and small lightly loaded systems.

A large fully loaded system consists of maximum AC and DC loads on all eight cards and the system board with the maximum wire lengths allowed between all points. Small lightly loaded systems consist of a single card with the minimum AC and DC load and a system board with minimum reasonable wire lengths between all points.

Figure 78 - 16- or 32-bit EISA Master and System Timing
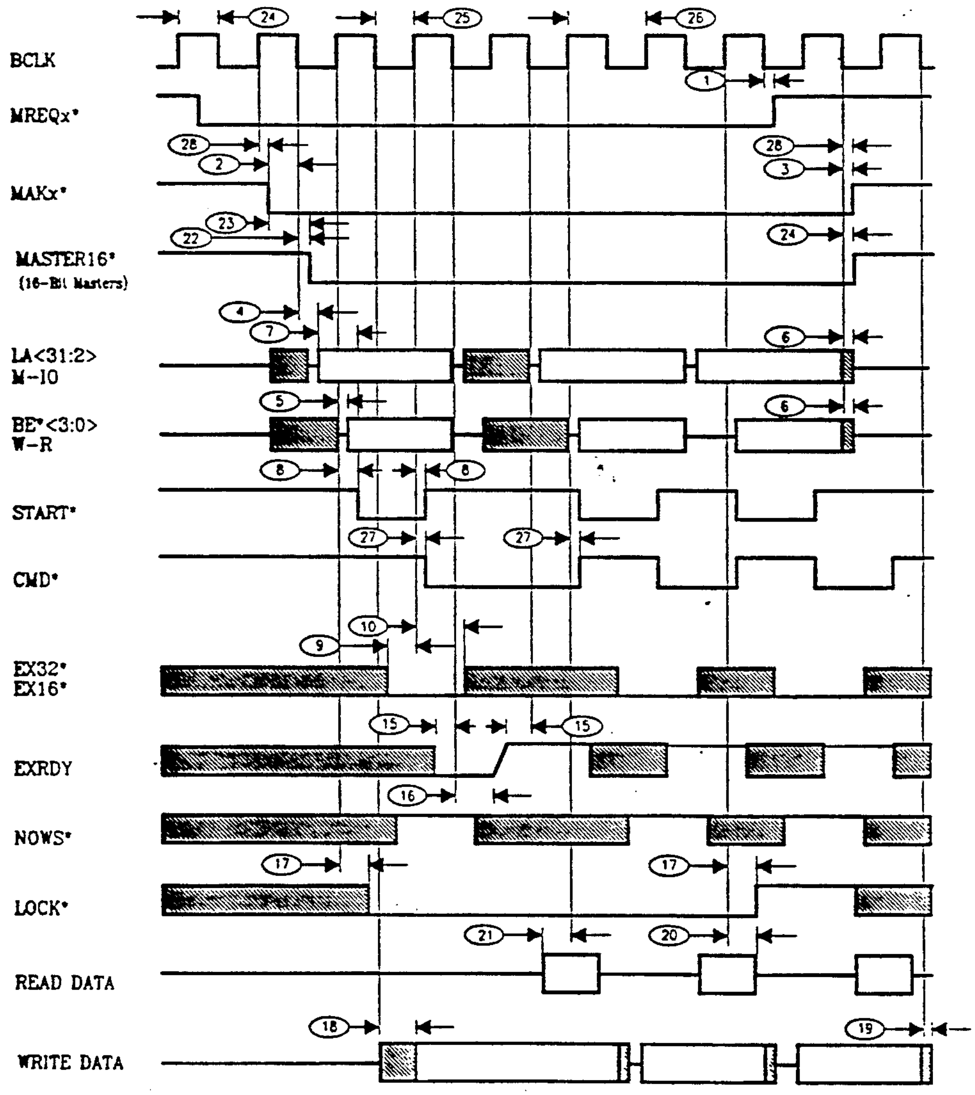

Figure 79 - 16- or 32-bit EISA Master Assembly/Disassembly Timing
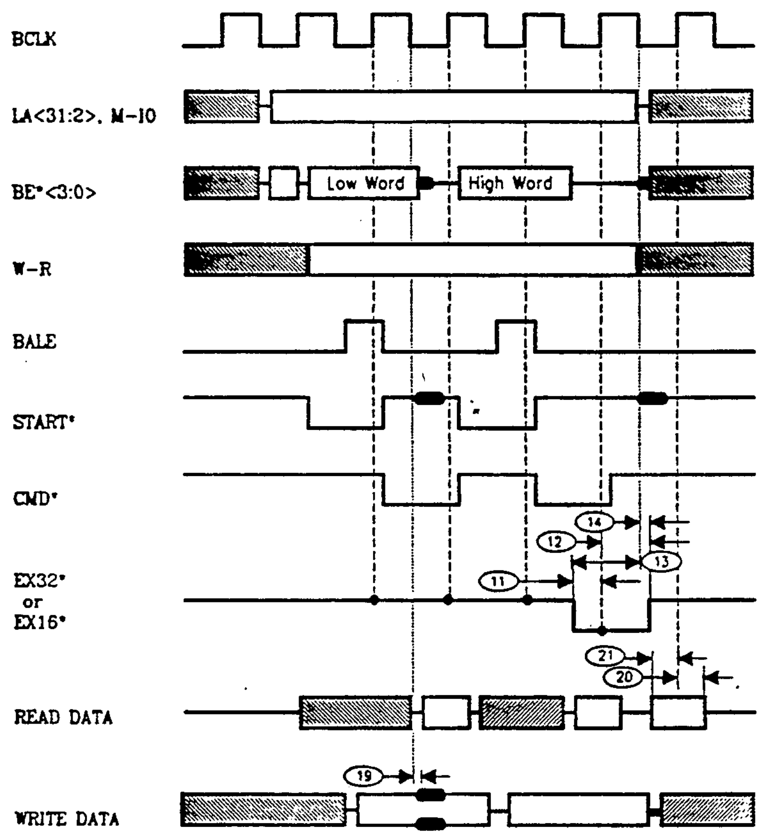
Note: Thick lines indicate where control transfers from Master to System or from System to Master.

Parameter Table for Figures 78 - 79

| | 16- or 32-bit EISA master timing: | | |
|---|---|---|---|
| # | Description | min | max |
| 1 | MREQ* delay from BCLK falling | 2.0 | 33.0 |
| 2 | MAK* setup to BCLK falling | 10.0 | |
| 3 | MAK* held from BCLK falling | 25.0 | |
| 4 | LA addr, M-IO delay from BCLK falling | 2.0 | 50.0 |
| 5 | BE* < >,W-R delay from BCLK falling | 2.0 | 85.0 |
| | BE* < >,W-R delay from BCLK rising ** see Note (a) ** | | 25.0 |
| 6 | LA addr, M-IO, BE*, W-R, MSBURST float delay | 2.0 | 50.0 |
| 7 | LA addr,M-IO setup to START* asserted | 10.0 | |
| 8 | START* delay from BCLK rising | 2.0 | 25.0 |
| 9 | EX32* (or EX16*) setup to BCLK rising (at CMD) | 25.0 | |
| 10 | EX32* (or EX16*) held from BCLK rising (at CMD) | 55.0 | |
| 11 | EX32* (or EX16*) setup to BCLK rising (assembly finish) | 15.0 | |
| 12 | EX32* (or EX16*) held from BCLK rising (assembly finish) | 50.0 | |
| 13 | EX32* (or EX16*) setup to BCLK falling (assembly finish) | 80.0 | |
| 14 | EX32* (or EX16*) held from BCLK falling (assembly finish) | 5.0 | |
| 15 | EXRDY setup to BCLK falling | 15.0 | |

Parameter Table for Figures 78 - 79

| | 16- or 32-bit EISA master timing: | | |
|---|---|---|---|
| | Description | min | max |
| 16 | EXRDY held from BCLK falling | 5.0 | |
| | | | |
| 17 | LOCK* delay from BCLK rising | 2.0 | 60.0 |
| | | | |
| 18 | Data delay from BCLK falling (write) | 2.0 | 40.0 |
| | | | |
| 19 | Data flt.del.from BCLK falling (write) ** see Note (b) ** | 2.0 | 50.0 |
| | | | |
| 20 | Data held after BCLK rising (read) | 4.0 | |
| | (for compressed cycle, from BCLK falling) | | |
| 21 | Data setup to BCLK rising (read) | 15.0 | |
| | (for compressed cycle, to BCLK falling) | | |
| 22 | MASTER16* asserted delay from BCLK falling (16-bit master) | 2.0 | 30.0 |
| | | | |
| 23 | MASTER16* asserted delay from MAK*<x> asserted (16-bit master) | | 40.0 |
| | | | |
| 24 | MASTER16* float delay from BCLK falling (16-bit master) | 2.0 | 50.0 |

Note (a): BE< >* bits are allowed to change as early as the falling BCLK when the LA< > bits change.

Note (b): Parameter applies after any write cycle not followed by another write cycle, or followed by write cycle with some BE< >* bits negated.

Parameter Table for Figures 78 - 79

| | System timing (misc): | | |
|---|---|---|---|
| | Description | min | max |
| | Note: The following timing specifications supplement or | | |
| | supercede the master and master burst timing specifications. | | |
| | | | |
| 24 | BCLK high time | 55.0 | |
| | | | |
| 25 | BCLK low time | 55.0 | |
| | | | |
| 26 | BCLK period (when free running) | 120.0 | 250.0 |
| | Max value can be longer when being stretched | | |
| 27 | CMD* delay from BCLK rising | 2.0 | 25.0 |
| | | | |
| | ISA commands delay from BCLK | 2.0 | 30.0 |
| | MRDC, MWTC, IORC, and IOWC | | |
| | | | |
| | BALE delay from BCLK edge | 2.0 | 25.0 |
| | | | |
| | SA<>, BHE* delay from BCLK edge | 2.0 | 30.0 |
| | | | |
| 28 | MAK* delay from BCLK rising | 2.0 | 40.0 |
| | | | |
| | AENx high from BCLK falling delay (DMA, etc starts) | 2.0 | 60.0 |
| | | | |
| | AENx low from BCLK falling (DMA, etc ends) | 5.0 | 60.0 |
| | | | |
| | AENx valid delay from LA<> addr (I/O cycle) | 0.0 | 15.0 |
| | | | |
| | Data copy buffer float from BCLK | 2.0 | 35.0 |
| | | | |
| | Data copy buffer delay (for bus to bus copies) | 0.0 | 15.0 |
| | | | |
| | Data copy buffer enable from BCLK | 2.0 | 35.0 |
| | | | |
| | MREQ* setup to BCLK rising | 15.0 | |
| | | | |
| | MREQ* setup to BCLK falling | 80.0 | |
| | | | |
| | MREQ* held from BCLK falling | 2.0 | |
| | | | |
| | BE*,W-R setup to BCLK falling (for SA1,0,BHE xlat) | 25.0 | |
| | | | |
| | BE*,W-R hold from BCLK falling (for SA1,0,BHE xlat) | 55.0 | |
| | | | |
| | START* setup to BCLK falling (Master drives START*) | 25.0 | |

Parameter Table for Figures 78 - 79

System timing (misc):

| [illegible] | Description | min | max |
|---|---|---|---|
| | START* hold from BCLK falling (Master drives START*) | 45.0 | |
| | MASTER16* setup to BCLK rising | 20.0 | |
| | MASTER16* held from BCLK rising | 5.0 | |
| | M16* setup to BCLK rising | 18.0 | |
| | M16* hold from BCLK rising | 25.0 | |
| | NOWS* setup to BCLK rising (ISA cycles) | 10.0 | |
| | NOWS* hold (ISA cycles) | 20.0 | |
| | CHRDY negated setup to BCLK falling | 15.0 | |
| | CHRDY negated hold from BCLK rising (preset PW) | 20.0 | |
| | CHRDY asserted setup to BCLK rising | 10.0 | |
| | CHRDY asserted hold from BCLK rising | 20.0 | |
| | IO16* setup to BCLK falling | 20.0 | |
| | IO16* hold from BCLK falling | 20.0 | |
| | Note: The following system board setup and delay timing specifications include time for copy buffer input or output and routing to the correct byte lanes. | | |
| | ISA read data setup to BCLK rising (latch setup) | 15.0 | |
| | ISA read data hold from BCLK rising (latch hold) | 2.0 | |
| | ISA Write data delay from BCLK falling (assembly cycles) | 2.0 | 55.0 |
| | ISA write data delay from BCLK rising (8-bit) | 2.0 | 35.0 |
| | EISA Data delay from BCLK falling (write) | 2.0 | 55.0 |
| | EISA Data setup to BCLK rising (read) | 30.0 | |

Parameter Table for Figures 78 - 79

| | System timing (misc): | | |
|---|---|---|---|
| | Description | min | max |
| | REFRESH* asserted delay from BCLK falling | 2.0 | 60.0 |
| | | | |
| | REFRESH* negated delay from BCLK falling | 2.0 | 40.0 |
| | | | |
| | BE* delay from BCLK rising (assembly cycles) | 0.0 | 35.0 |
| | | | |
| | SA addr to LA addr delay (ISA master translate) | 0.0 | 15.0 |
| | | | |

Figure 80 - System Timing (Assembly Cycles)

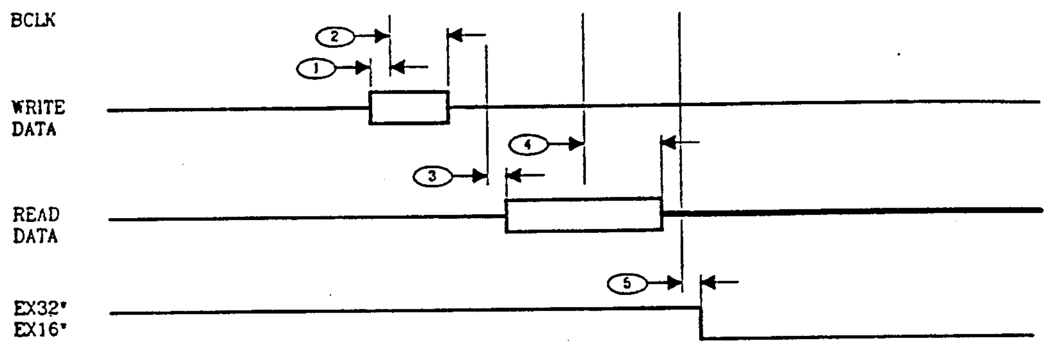

Parameter Table for Figure 80

| | ISA COMPATIBLE SIGNAL TIMING PARAMETERS DESCRIPTION SYSTEM TIMING (ASSEMBLY CYCLES) | Timing (ns) | |
|---|---|---|---|
| | | MIN | MAX |
| 1 | Data setup to BCLK rising (grab data, write assemble) | 10 | |
| | | | |
| 2 | Data held from BCLK rising (grab data, write assemble) | 30 | |
| | | | |
| 3 | Data delay from BCLK falling (redrive data,read assem) | 5 | 30 |
| | | | |
| 4 | Data float after BCLK rising (redrive data,read assem) | | 50 |
| | | | |
| 5 | EX32* (or EX16*) delay from BCLK falling (assembly finish) | 2 | 35 |
| | | | |

Figure 81 - 16- or 32-bit EISA Slave Timing
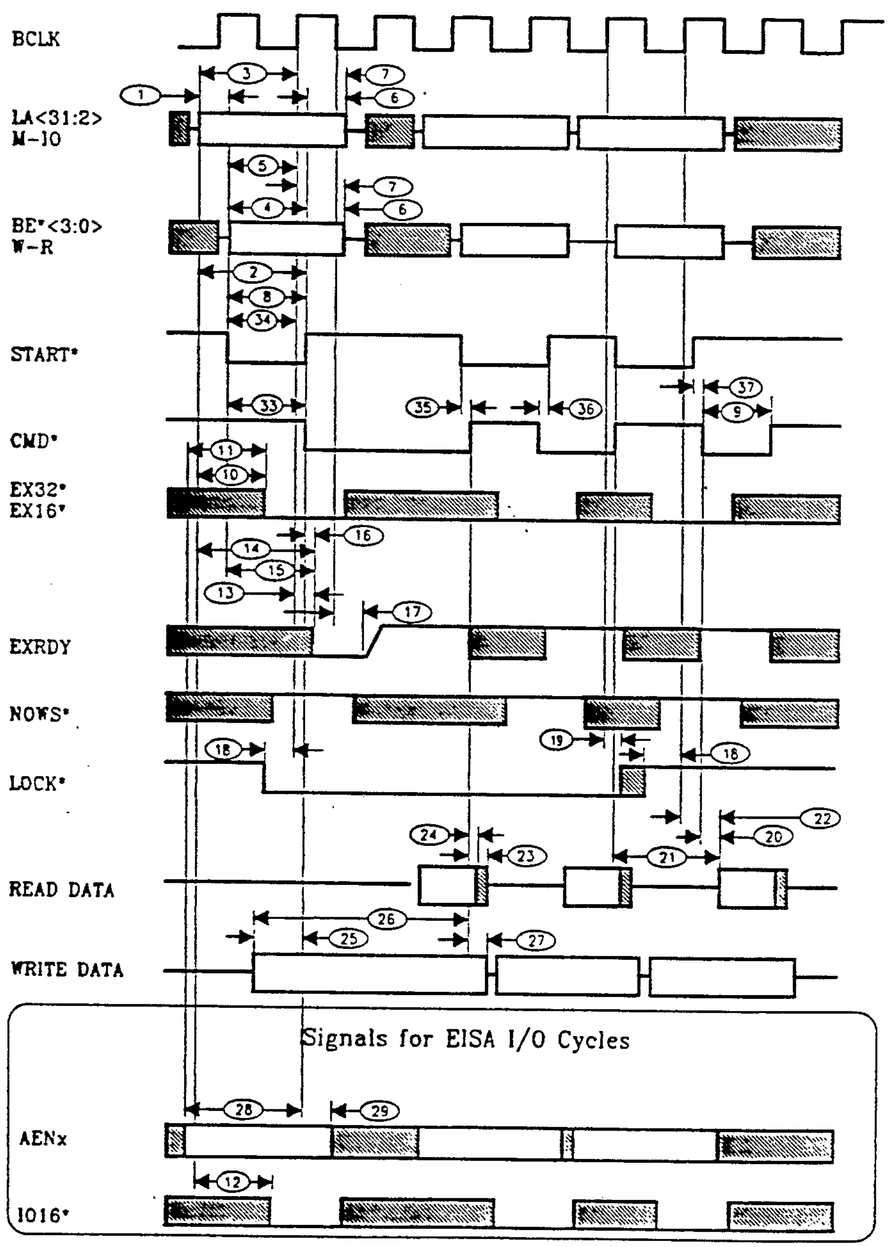

Parameter Table for Figure 81

| | 8, 16 or 32-bit EISA slave timing: | | |
|---|---|---|---|
| Prm # | Description | min | max |
| 1 | LA addr,M-IO setup to START* asserted | 10.0 | |
| 2 | LA addr,M-IO setup to CMD* asserted or START* negated | 120.0 | |
| 3 | LA addr,M-IO setup to BCLK rising (at CMD) | 120.0 | |
| 4 | BE*<>,W-R setup to CMD* asserted or START* negated | 80.0 | |
| 5 | BE*<>,W-R setup to BCLK rising (at CMD) | 80.0 | |
| 6 | LA addr M-IO,W-R,BE* held from CMD* asserted and START* negated | 15.0 | |
| 7 | LA addr M-IO,W-R,BE* held from BCLK rising(normal) | 20.0 | |
| 8 | START* pulse width | 115.0 | |
| 9 | CMD* pulse width (standard) | 115.0 | 5000 |
| 10 | EX32* (or EX16*) float delay from LA addr, M-IO | 2.0 | 54.0 |
| 11 | EX32* (or EX16*) float delay from AEN (I/O cycles) | 2.0 | 34.0 |
| 12 | IO16* delay from LA addr (I/O cycles) | 2.0 | 54.0 |
| 13 | EXRDY negated delay from BCLK rising (at CMD) | | 35.0 |
| 14 | EXRDY negated delay from LA<>,M-IO,AEN | | 145.0 |
| 15 | EXRDY negated delay from START* asserted | 2.0 | 125.0 |
| 16 | EXRDY negated delay from CMD* asserted or START* negated | | 5.0 |
| 17 | EXRDY float delay from BCLK falling | 2.0 | 40.0 |
| 18 | LOCK* setup to BCLK rising | 55.0 | |
| 19 | LOCK* held from BCLK rising | 2.0 | |
| 20 | Data delay from CMD* assert.(read, 16 or 32-bit, 2 BCLK) | | 50.0 |
| | 8-bit slave (6 BCLK) | | 530.0 |

EXTENDED INDUSTRY STANDARD ARCHITECTURE
CONFIDENTIAL INFORMATION OF BCPR SERVICES, INC.

Parameter Table for Figure 81

| | 8, 16 or 32-bit EISA slave timing: | | |
|---|---|---|---|
| Prm | Description | min | max |
| 21 | Data delay from START* assert (read, 16 or 32-bit, 2 BCLK) | | 170.0 |
| | 8-bit slave (6 BCLK) | | 650.0 |
| | | | |
| 22 | Data delay from BCLK rising (read, 16 or 32-bit) | 0.0 | 80.0 |
| | 8-bit slave (6 BCLK) | | 560.0 |
| | | | |
| 23 | Data float delay from CMD* negated (read) | | 30.0 |
| | | | |
| 24 | Data delay (hold) from CMD* negated (read) | 2.0 | |
| | | | |
| 25 | Data setup to CMD* asserted (write, 16 or 32-bit) | -10.0 | |
| | 8-bit slave (6 BCLK) | -35.0 | |
| | | | |
| 26 | Data setup to CMD* negated (write, 16 or 32-bit) | 110.0 | |
| | 8-bit slave (6 BCLK) | 564.0 | |
| | | | |
| 27 | Data held after CMD* negated (write) | 25.0 | |
| | | | |
| 28 | AEN setup to CMD* asserted or START* negated (I/O cycles) | 95.0 | |
| | | | |
| 29 | AEN held from CMD* asserted or START* negated (I/O cycles) | 25.0 | |
| | | | |
| 33 | START* asserted to CMD* asserted setup | 90.0 | |
| | | | |
| 34 | START* asserted to BCLK rising (at cmd) | 90.0 | |
| | | | |
| 35 | START* asserted to CMD* negated (overlap) | | 30.0 |
| | | | |
| 36 | CMD* asserted to START* negated (overlap) | | 25.0 |
| | | | |
| 37 | START* negated to CMD* asserted (gap) | | 25.0 |

Figure 82 - System Timing (COMPRESSED Cycles)
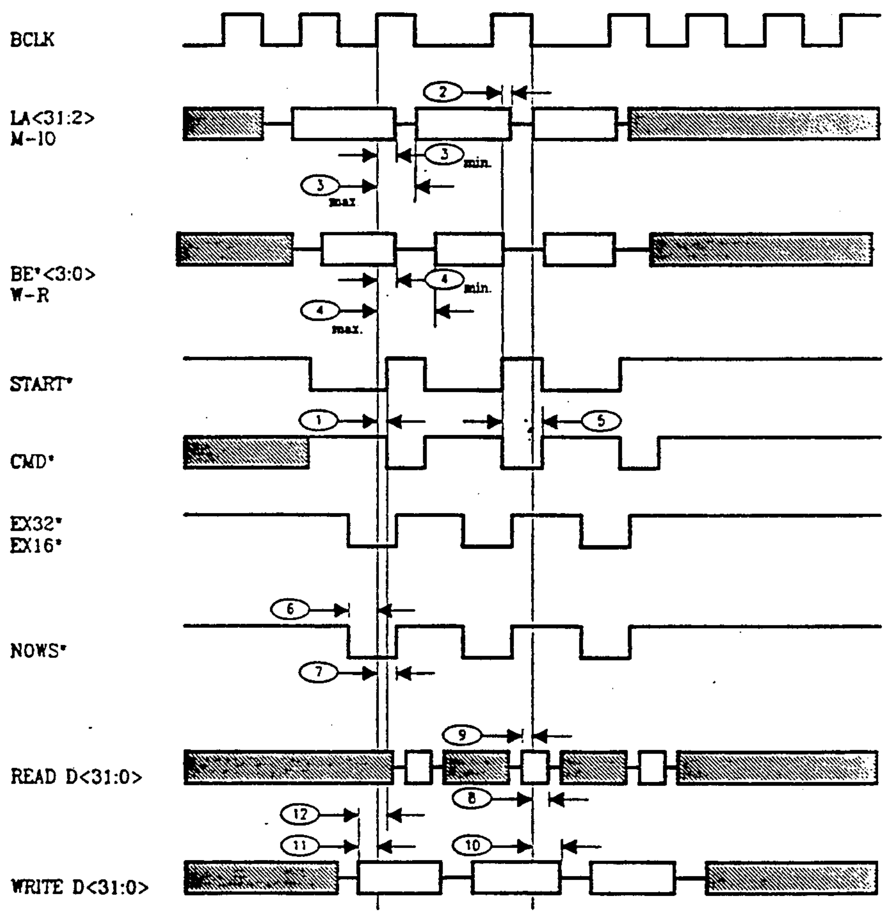

EXTENDED INDUSTRY STANDARD ARCHITECTURE
CONFIDENTIAL INFORMATION OF BCPR SERVICES, INC.

Parameter Table for Figure 82

| | SYSTEM TIMING PARAMETERS DESCRIPTION (COMPRESSED CYCLES) | Timing (ns) MIN | MAX | Note |
|---|---|---|---|---|
| 1 | START* negated or CMD* asserted delay from BCLK rising | 2 | 25 | |
| 2 | LA Address, M-IO,W-R, BE*< > delay from START* negated or | 15 | | |
| | or CMD* asserted | | | |
| 3 | LA addr, M-IO delay from BCLK rising (at CMD* asserted), burst not supported | 20 | 50 | |
| | burst supported | 20 | 45 | |
| 4 | BE*< >,W-R delay from BCLK rising (at CMD* asserted) | 20 | 85 | |
| 5 | CMD* asserted pulse width | 50 | | |
| 6 | NOWS* setup to BCLK rising (compressed cycles) | 15 | | |
| 7 | NOWS* held from BCLK rising (compressed cycles) | 5 | | |
| 8 | Data held after BCLK falling (read) | 4 | | |
| 9 | Data setup to BCLK falling (read) | 15 | | |
| 10 | Data delay from BCLK falling (write)(BCLK at START* asserted) | 57 | | |
| 11 | Data valid before BCLK rising at CMD* asserted (write) | 15 | | |
| 12 | Data valid before START* negated or CMD* asserted (write) | 20 | | |

Note: The Master or Normal System timing numbers apply except where the above numbers add to or supercede them.

Figure 83 - 16- or 32-bit EISA COMPRESSED Cycle - Slave Timing
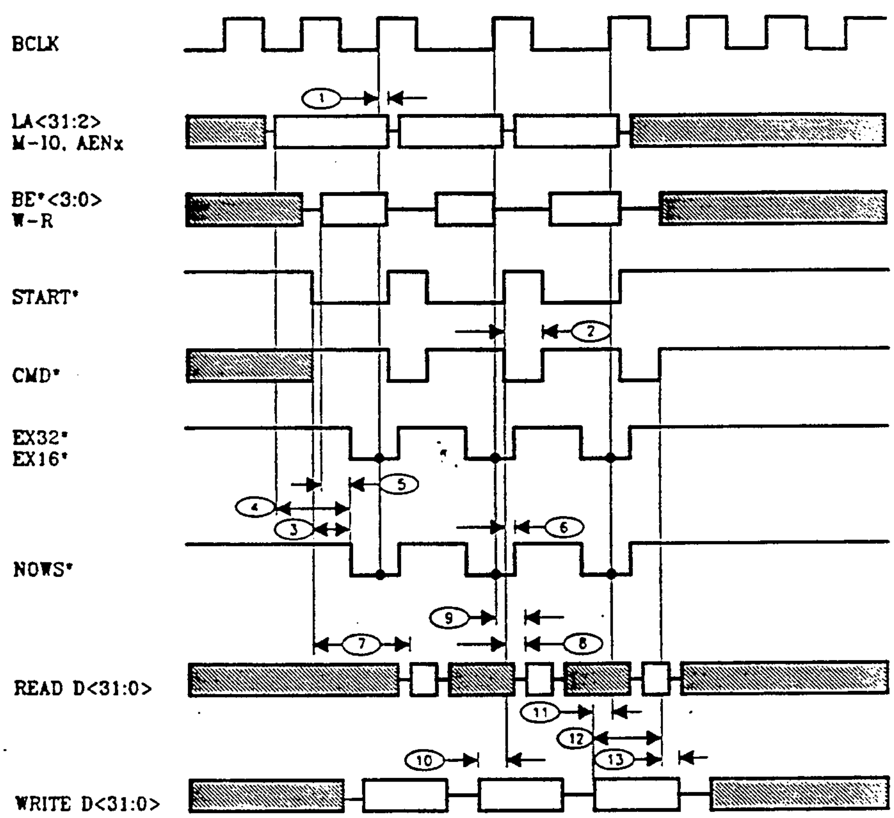

Parameter Table for Figure 83

| | 16- or 32-bit EISA compressed cycle slave timing: | | |
|---|---|---|---|
| | Description | min | max |
| 1 | LA<31:2> M-IO,W-R,BE* held from BCLK rising(compr) | 20.0 | |
| | | | |
| 2 | CMD* pulse width (compressed) | 50.0 | |
| | | | |
| 3 | NOWS* asserted delay from START* asserted (compressed) | 0.0 | 70.0 |
| | | | |
| 4 | NOWS* asserted delay from LA< >,M-IO,AEN (compressed) | | 80.0 |
| | | | |
| 5 | NOWS* asserted delay from BE*, W-R (compressed) | | 65.0 |
| | | | |
| 6 | NOWS* float delay from START* negated (compressed) | 0.0 | 30.0 |
| | | | |
| 7 | Data delay from START* assert.(read compressed) | | 150.0 |
| | | | |
| 8 | Data delay from CMD* assert.(read compressed) | | 5.0 |
| | | | |
| 9 | Data delay from BCLK rising (read compressed) | 0.0 | 30 |
| | | | |
| 10 | Data setup to CMD* asserted and START* negated (write compressed) | 20.0 | |
| | | | |
| 11 | Data setup to BCLK rising (write compressed) | 15.0 | |
| | | | |
| 12 | Data setup to CMD* negated (write compressed) | 85.0 | |
| | | | |
| 13 | Data held after CMD* negated (write compressed) | 25.0 | |

Figure 84 - Refresh Cycle - Slave Timing
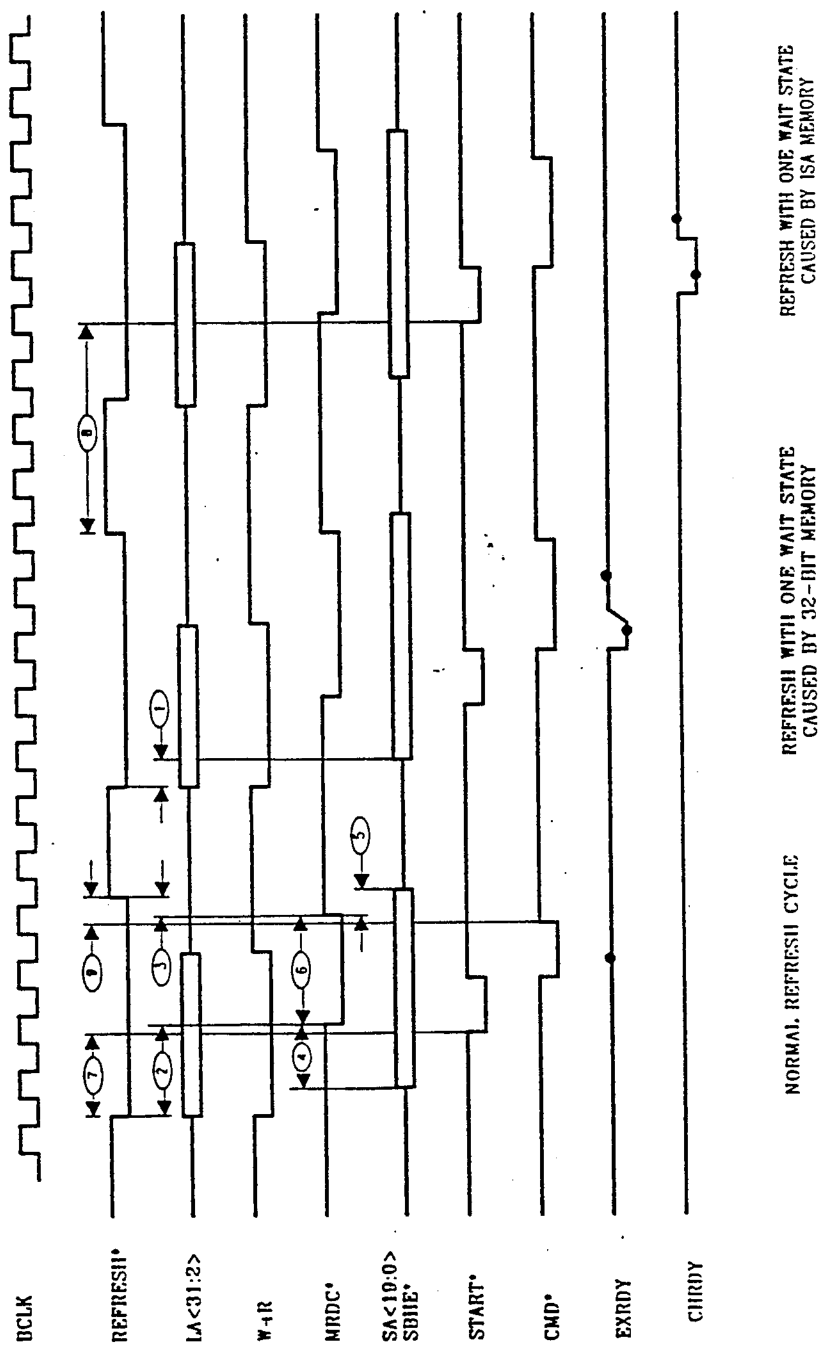

Parameter Table for Figure 84

| | Refresh cycle slave timing: | | |
|---|---|---|---|
| [illegible] | Description | min | max |
| 1 | REFRESH* valid setup to SA< > address | 0.0 | |
| | | | |
| 2 | REFRESH* valid setup to MRDC* asserted | 120.0 | |
| | | | |
| 3 | REFRESH* valid hold from MRDC* negated | 20.0 | |
| | | | |
| 4 | SA< > address setup to MRDC* asserted (refresh) | 70.0 | |
| | | | |
| 5 | SA< > address hold from MRDC* negated (refresh) | 25.0 | |
| | | | |
| 6 | MRDC* pulse width (refresh) | 235.0 | |
| | | | |
| 7 | REFRESH* asserted setup to START* asserted | 55.0 | |
| | | | |
| 8 | REFRESH* negated setup to START* asserted | 10.0 | |
| | | | |
| 9 | REFRESH* held from CMD* negated | 20.0 | |
| | | | |

Figure 85 - 16- or 32-bit EISA Master Timing, Burst
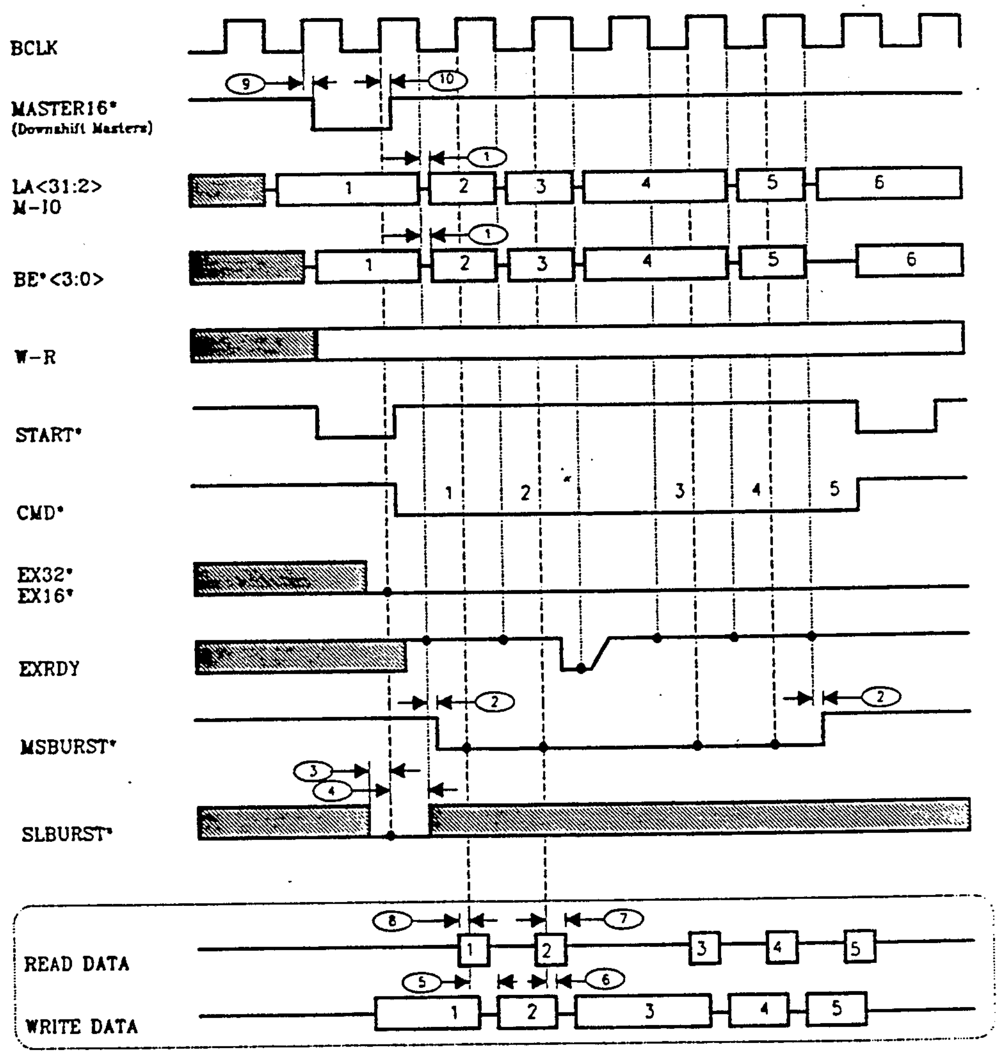
1) EISA Standard Access (Start of Burst)
2) EISA Burst Access
3) EISA Burst Access with One Wait State
4,5) EISA Burst Access
6) EISA Standard Access

Parameter Table for Figure 85

| | 16- or 32-bit EISA master timing, Burst: | | |
|---|---|---|---|
| | Description | min | max |
| 1 | LA<31:2>, BE*<3:0> delay from BCLK falling | 2.0 | 45.0 |
| 2 | MSBURST* delay from BCLK falling | 2.0 | 35.0 |
| 3 | SLBURST* setup to BCLK rising | 15.0 | |
| 4 | SLBURST* held from BCLK rising | 25.0 | |
| 5 | Data delay from BCLK rising (write) | 5.0 | 40.0 |
| 6 | Data hold from BCLK rising (write) | 5.0 | |
| 7 | Data held after BCLK rising (read) | 5.0 | |
| 8 | Data setup to BCLK rising (read) | 15.0 | |
| 9 | MASTER16* asserted delay from BCLK rising (downshift) | 2.0 | 50.0 |
| 10 | MASTER16* float delay from BCLK rising (downshift) | 2.0 | 40.0 |

Figure 86 - 16- or 32-bit EISA Slave Timing, Burst
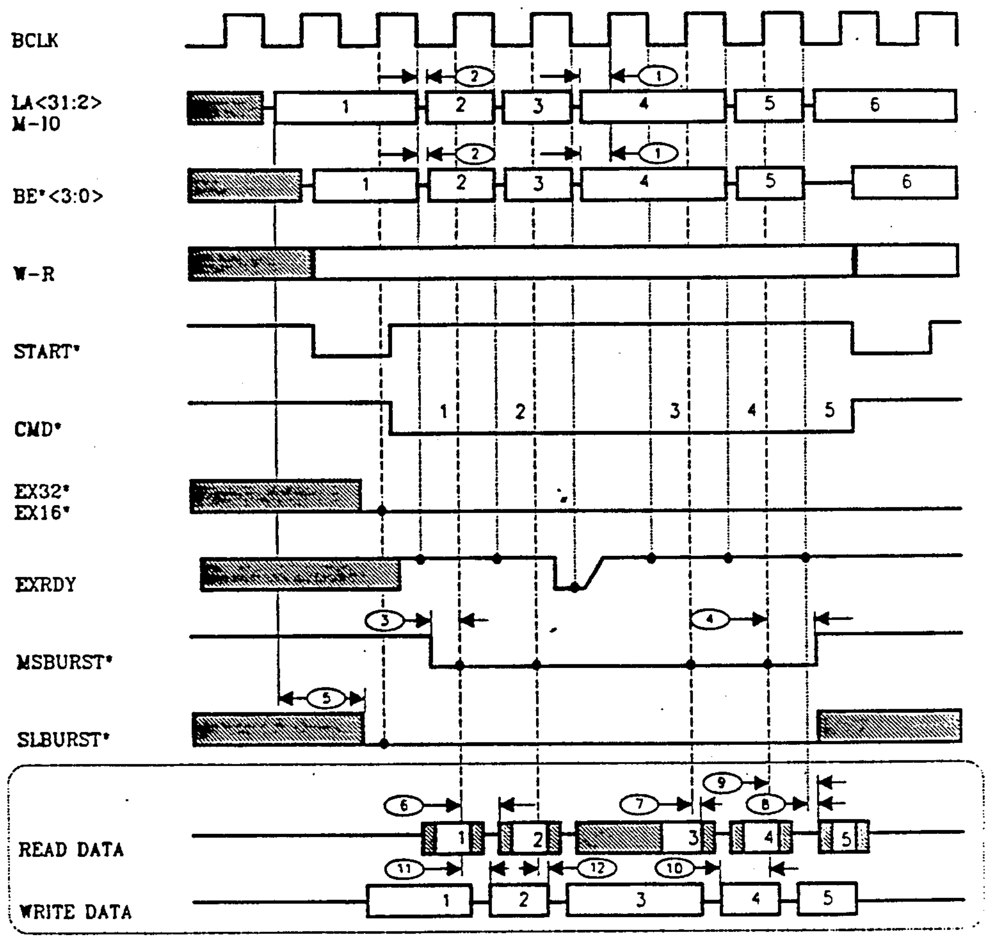
1) EISA Standard Access (Start of Burst)
2) EISA Burst Access
3) EISA Burst Access with One Wait State
4,5) EISA Burst Access
6) EISA Standard Access Parameter Table for Figure 86

| | 16- or 32-bit EISA slave timing, Burst | | |
|---|---|---|---|
| | Description | min | max |
| 1 | LA addr,BE< >* setup to BCLK rising | 5.0 | |
| 2 | LA addr,BE< >* held from BCLK falling | 2.0 | |
| 3 | MSBURST* setup to BCLK rising | 15.0 | |
| 4 | MSBURST* held from BCLK rising | 45.0 | |
| 5 | LA address to SLBURST* delay | 2.0 | 55.0 |
| 6 | Data delay from BCLK rising (read) | 35.0 | 80.0 |
| 7 | Data float delay from BCLK rising (read) | 2.0 | 50.0 |
| 8 | Data enable delay from BCLK falling (read) ** see Note (a) ** | 0.0 | 15.0 |
| 9 | Data enable delay from BCLK rising (read) ** see Note (a) ** | 35.0 | 80 |
| 10 | Data setup to BCLK rising (write) | 55.0 | |
| 11 | Data delay from BCLK rising (write) | 5.0 | 65.0 |
| 12 | Data held from BCLK rising (write) | 5.0 | |

Note (a): USE EITHER PARAMETER 8 OR 9

Figure 87 - System DMA Timing

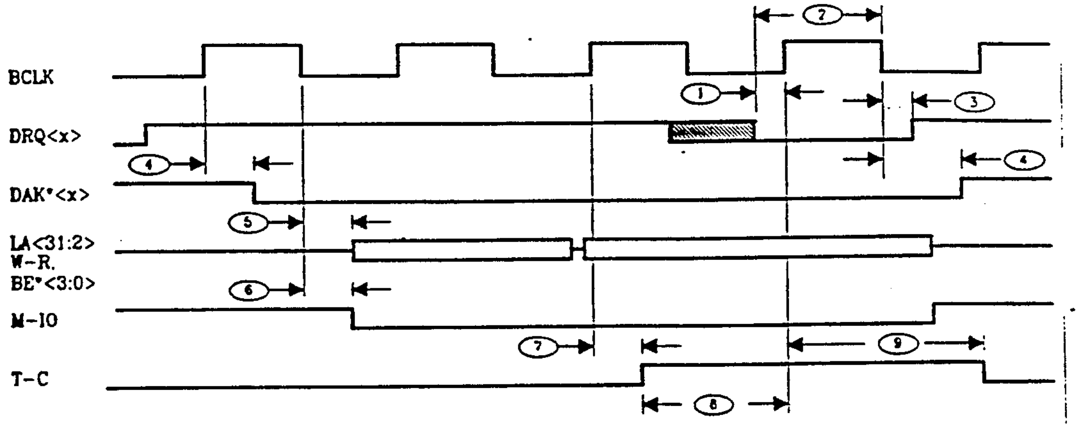

Note: DAK* may be asserted from either the falling or rising edge of BCLK

Parameter Table for Figure 87

| | ISA COMPATIBLE SIGNAL TIMING PARAMETERS DESCRIPTION | Timing (ns) | |
|---|---|---|---|
| | SYSTEM DMA TIMING | MIN | MAX |
| 1 | DRQx negated setup to BCLK rising | 15 | |
| | | | |
| 2 | DRQx negated setup to BCLK falling | 80 | |
| | | | |
| 3 | DRQx negated held from BCLK falling | 2 | |
| | | | |
| 4 | DACKx delay from BCLK | 10 | 50 |
| | | | |
| 5 | LA< >,BE< >,W-R, delay from BCLK falling | 2 | 50 |
| | | | |
| 6 | M-IO, delay from BCLK falling | 2 | 50 |
| | | | |
| 7 | T-C delay from BCLK (DMA system output mode) | 5 | 35 |
| | | | |
| 8 | T-C setup to BCLK rising (DMA system input mode) | 15 | |
| | | | |
| 9 | T-C held from BCLK rising (DMA system input mode) | 25 | |
| | | | |

Note: The System timing numbers apply except where the above numbers add to or supercede them.

Figure 88 - DMA Device Timing
Compatible, Type "A", and Type "B" Memory Read Cycles
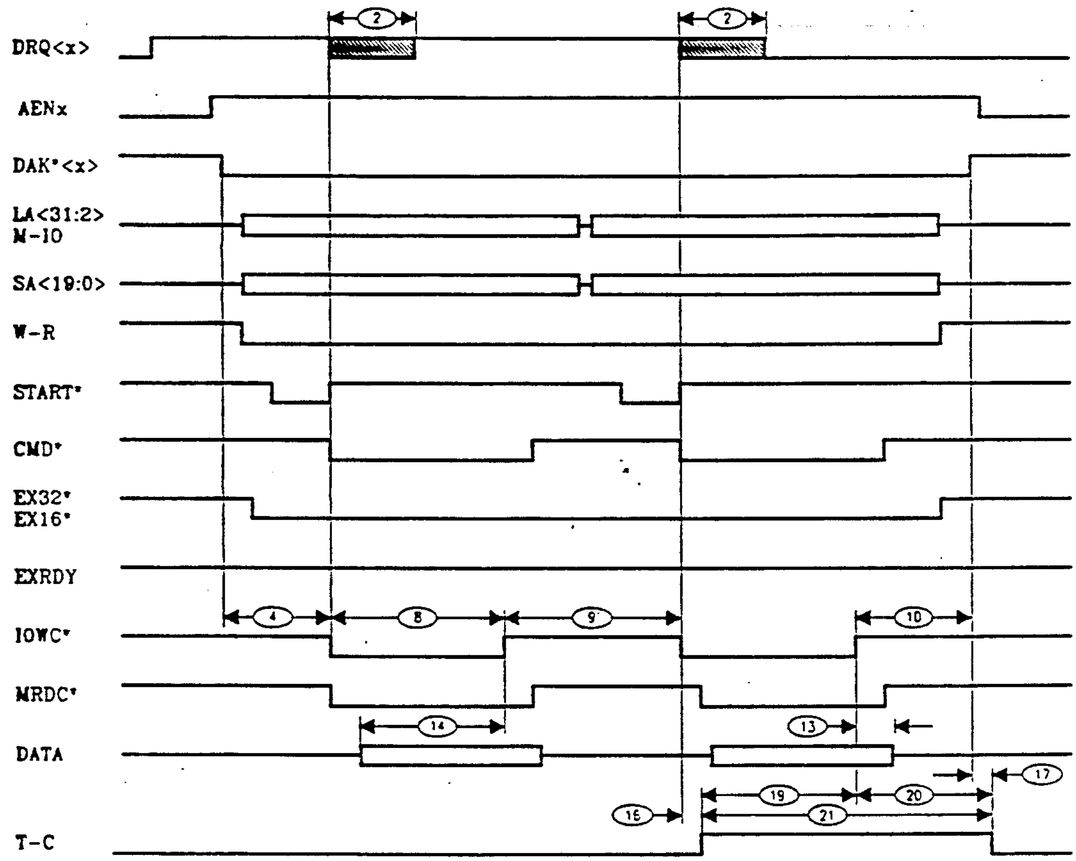

Figure 89 - DMA Device Timing
Compatible, Type "A", and Type "B" Memory Write Cycles
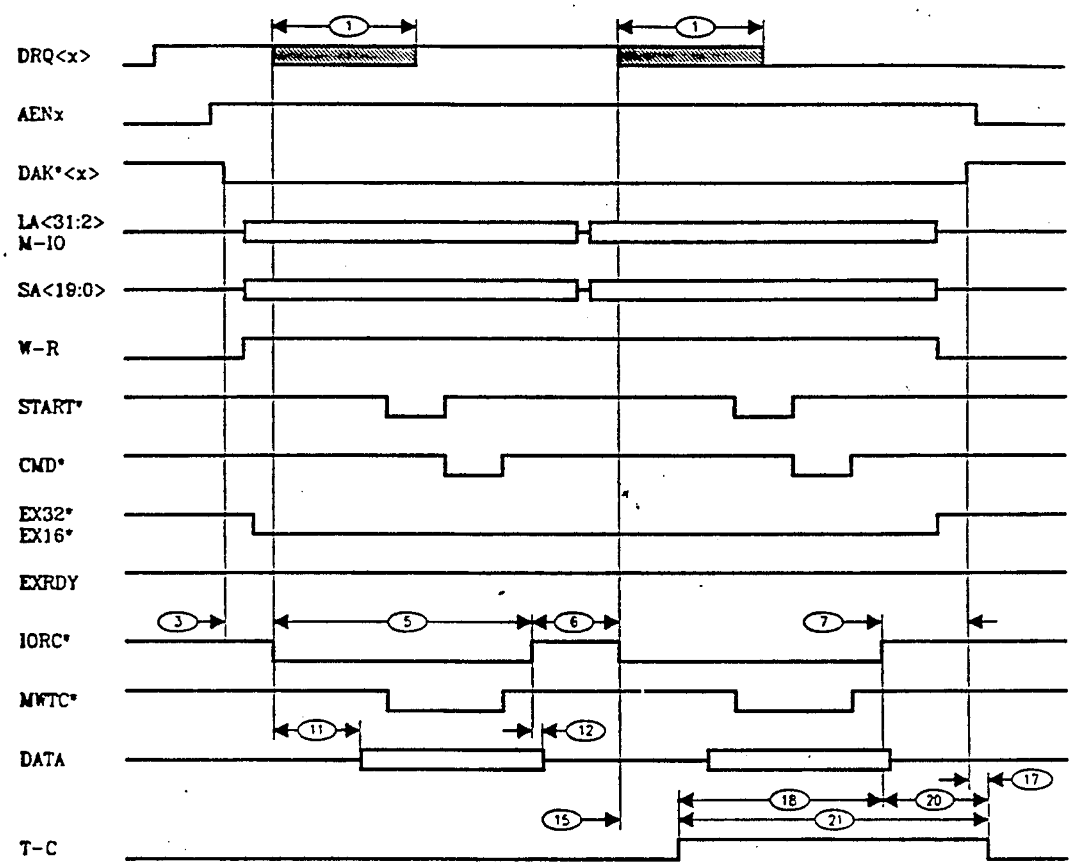

Parameter Table for Figures 88-89 (Compatible Cycles)

| | DMA device timing (Compatible) | | |
|---|---|---|---|
| | Description | min | max |
| 1 | DRQx valid delay from IORC* asserted | 2.0 | 540.0 |
| 2 | DRQx valid delay from IOWC* asserted | 2.0 | 300.0 |
| 3 | DAKx* asserted to IORC* asserted | 70.0 | |
| 4 | DAKx* asserted to IOWC* asserted | 310.0 | |
| 5 | IORC* asserted pulse width | 755.0 | |
| 6 | IORC* negated pulse width (continuous) | 165.0 | |
| 7 | IORC* negated to DAKx* negated | 100.0 | |
| 8 | IOWC* asserted pulse width | 455.0 | |
| 9 | IOWC* negated pulse width (continuous) | 455.0 | |
| 10 | IOWC* negated to DAKx* negated | 155.0 | |
| 11 | Data delay from IORC* asserted | 0.0 | 280.0 |
| 12 | Data float from IORC* negated | 2.0 | 50.0 |
| 13 | Data held from IOWC* negated | 20.0 | |
| 14 | Data setup to IOWC* negated | 240.0 | |
| 15 | T-C asserted delay from IORC* (system input mode) | | 560.0 |
| 16 | T-C asserted delay from IOWC* (system input mode) | | 320.0 |
| 16a | T-C negated delay from IORC* (input mode) | | 90.0 |
| 16b | T-C negated delay from IOWC* (input mode) | | 90.0 |
| 17 | T-C enable/disable delay from DAKx* (input mode) | | 40.0 |
| 18 | T-C setup to IORC* negated (system output mode) | 500.0 | |
| 19 | T-C setup to IOWC* negated (system output mode) | 500.0 | |
| 20 | T-C held from IORC*/IOWC* negated (output mode) | 60.0 | |
| 21 | T-C pulse width (output mode) | 700.0 | |

Parameter Table for Figures 88-89 (Type "A" Cycles)

| | DMA device timing (Type "A") | | |
|---|---|---|---|
| | Description | min | max |
| 1 | DRQx valid delay from IORC* asserted | 2.0 | 300 |
| 2 | DRQx valid delay from IOWC* asserted | 2.0 | 180.0 |
| 3 | DAKx* asserted to IORC* asserted | 70.0 | |
| 4 | DAKx* asserted to IOWC* asserted | 190.0 | |
| 5 | IORC* asserted pulse width | 395.0 | |
| 6 | IORC* negated pulse width (continuous) | 165.0 | |
| 7 | IORC* negated to DAKx* negated | 100.0 | |
| 8 | IOWC* asserted pulse width | 335.0 | |
| 9 | IOWC* negated pulse width (continuous) | 335.0 | |
| 10 | IOWC* negated to DAKx* negated | 155.0 | |
| 11 | Data delay from IORC* asserted | 0.0 | 280.0 |
| 12 | Data float from IORC* negated | 2.0 | 50.0 |
| 13 | Data held from IOWC* negated | 20.0 | |
| 14 | Data setup to IOWC* negated | 240.0 | |
| 15 | T-C asserted delay from IORC* (system input mode) | | 320.0 |
| 16 | T-C asserted delay from IOWC* (system input mode) | | 200.0 |
| | T-C negated delay from IORC* (input mode) | | 90.0 |
| | T-C negated delay from IOWC* (input mode) | | 90.0 |
| 17 | T-C enable/disable delay from DAKx* (input mode) | | 40.0 |
| 18 | T-C setup to IORC* negated (system output mode) | 300.0 | |
| 19 | T-C setup to IOWC* negated (system output mode) | 240.0 | |
| 20 | T-C held from IORC*/IOWC* negated (output mode) | 60.0 | |
| 21 | T-C pulse width (output mode) | 480.0 | |

Parameter Table for Figures 88-89 (Type "B" Cycles)

| | DMA device timing (Type "B") | | |
|---|---|---|---|
| | Description | min | max |
| 1 | DRQx valid delay from IORC* asserted | 2.0 | 180.0 |
| 2 | DRQx valid delay from IOWC* asserted | 2.0 | 60.0 |
| 3 | DAKx* asserted to IORC* asserted | 70.0 | |
| 4 | DAKx* asserted to IOWC* asserted | 190.0 | |
| 5 | IORC* asserted pulse width | 275.0 | |
| 6 | IORC* negated pulse width (continuous) | 50.0 | |
| 7 | IORC* negated to DAKx* negated | 35.0 | |
| 8 | IOWC* asserted pulse width | 215.0 | |
| 9 | IOWC* negated pulse width (continuous) | 215.0 | |
| 10 | IOWC* negated to DAKx* negated | 100.0 | |
| 11 | Data delay from IORC* asserted | 0.0 | 160.0 |
| 12 | Data float from IORC* negated | 2.0 | 50.0 |
| 13 | Data held from IOWC* negated | 20.0 | |
| 14 | Data setup to IOWC* negated | 130.0 | |
| 15 | T-C asserted delay from IORC* (input mode) | | 190.0 |
| 16 | T-C asserted delay from IOWC* (input mode) | | 70.0 |
| | T-C negated delay from IORC* (input mode) | | 30.0 |
| | T-C negated delay from IOWC* (input mode) | | 90.0 |
| 17 | T-C enable/disable delay from DAKx* (input mode) | | 40.0 |
| 18 | T-C setup to IORC* negated (output mode) | 200.0 | |
| 19 | T-C setup to IOWC* negated (output mode) | 180.0 | |
| 20 | T-C held from IORC*/IOWC* negated (output mode) | -30.0 | |
| 21 | T-C pulse width (output mode) | 240.0 | |

Figure 90 - DMA Device Timing
Burst Memory Read Cycle
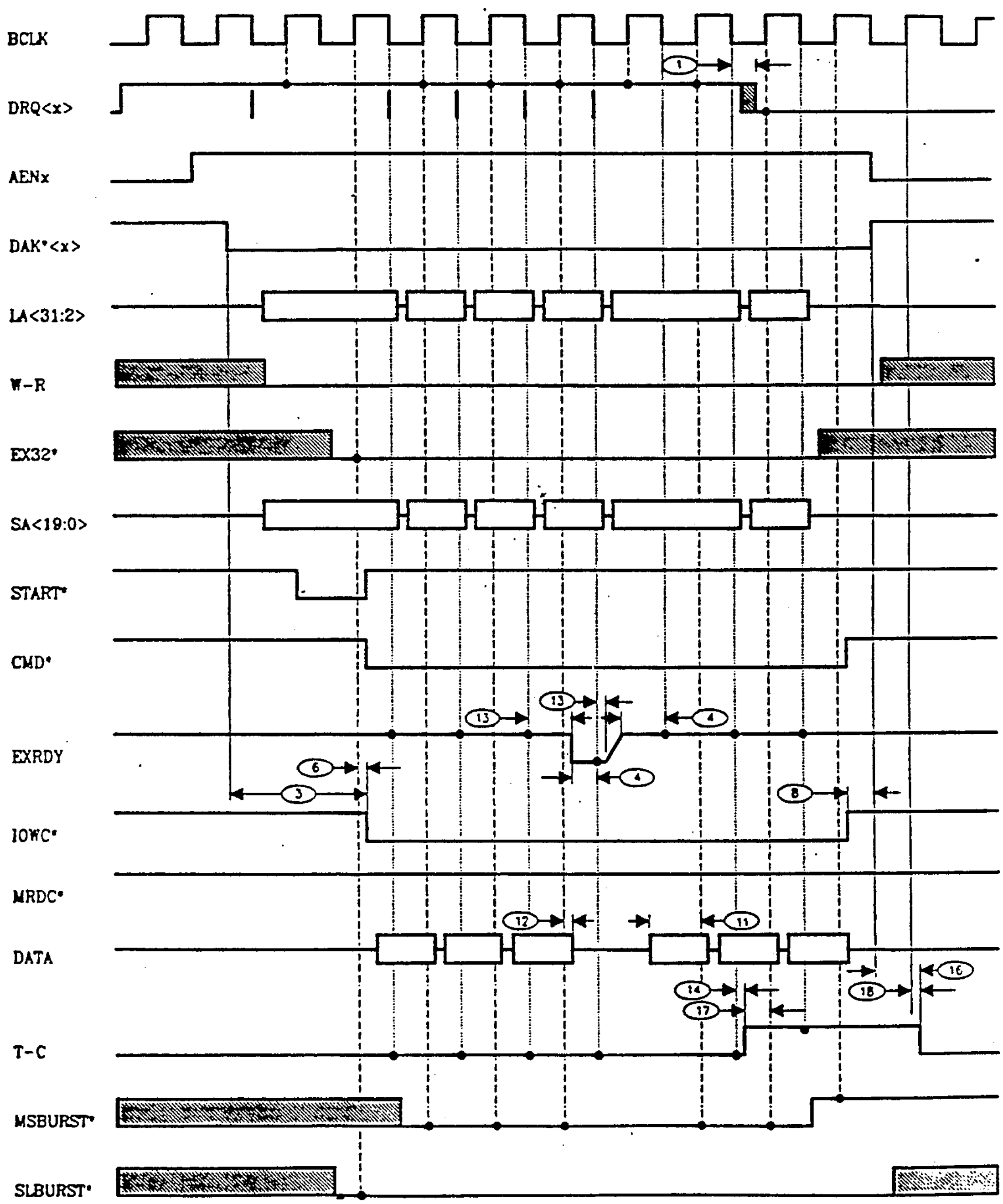
Note: Vertical marks indicate possible times to negate DRQ<>.

Figure 91 - DMA Device Timing
Burst Memory Write Cycle
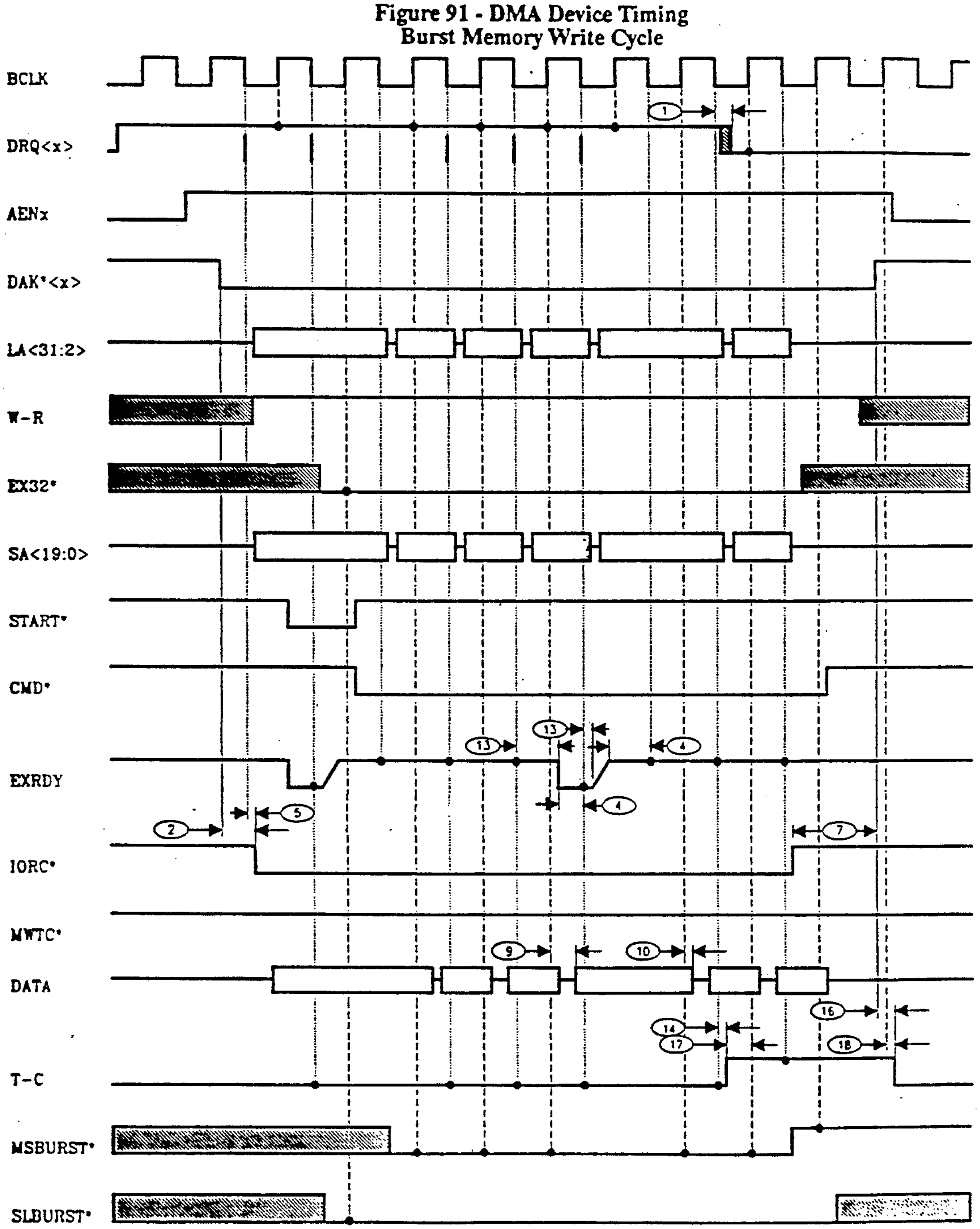
Note: Vertical marks indicate possible times to negate DRQ<x>.

Parameter Table for Figures 90-91

| | DMA device timing (burst) | | |
|---|---|---|---|
| [illegible] | Description | min | max |
| 1 | DRQx negated delay from BCLK falling | 2.0 | 35.0 |
| | | | |
| 2 | DAKx* asserted to IORC* asserted | 70.0 | |
| | | | |
| 3 | DAKx* asserted to IOWC* asserted | 190.0 | |
| | | | |
| 4 | EXRDY setup to BCLK falling | 15.0 | |
| | | | |
| 5 | IORC* delay from BCLK falling | 2.0 | 30.0 |
| | | | |
| 6 | IOWC* delay from BCLK rising | 2.0 | 30.0 |
| | | | |
| 7 | IORC* negated to DAKx* negated | 100.0 | |
| | | | |
| 8 | IOWC* negated to DAKx* negated | 35.0 | |
| | | | |
| 9 | data delay from BCLK rising (device read) | 0.0 | 40.0 |
| | | | |
| 10 | data hold from BCLK rising (device read) | 5.0 | |
| | | | |
| 11 | data setup to BCLK rising (device write) | 15.0 | |
| | | | |
| 12 | data held from BCLK rising (device write) | 5.0 | |
| | | | |
| 13 | EXRDY held from BCLK falling | 2.0 | |
| | | | |
| 14 | T-C delay from BCLK falling (system input mode) | 2.0 | 35.0 |
| | | | |
| 16 | T-C enable/disable delay from DAKx* (input mode) | 40.0 | |
| | | | |
| 17 | T-C setup to BCLK rising (system output mode) | 15.0 | |
| | | | |
| 18 | T-C held from BCLK rising (system output mode) | 55.0 | |

2.12 Mechanical Specifications

This section provides the mechanical specifications of EISA expansion boards and the EISA connector. Mechanical specifications for ISA expansion boards are also provided.

Electrical characteristics, including minimum power requirements of EISA expansion boards, are specified in the Electrical Specifications section of this document.

2.13 EISA Connector and Expansion Board Description

The EISA connector is the same height and length as a 16-bit ISA expansion board connector. The connector can accommodate current ISA expansion boards as well as EISA expansion boards. The EISA connector does not take up any more space on the system board than a standard ISA connector, and because of the stacked two-level arrangement of the connector contacts, does not increase insertion force required.

The following table shows EISA connector compatibility.

EISA Connector Compatibility

| | | Expansion Board Type | | |
|---|---|---|---|---|
| | | 8-bit | 16-bit | 32-bit |
| Connector Type | 8-bit (PC/XT) | YES | * | NO |
| | 16-bit (AT) | YES | YES | NO |
| | 32-bit (EISA) | YES | YES | YES |

* There is no mechanical restriction, but most 16-bit expansion boards will not function properly in an 8-bit slot.

2.13.1 Physical Characteristics

The EISA connector is a single unit, and in appearance, resembles the existing ISA connector. The difference between the EISA connector and the ISA connector is a second level of contacts in the EISA connector.

As illustrated in the following figure, ISA expansion boards can only be inserted into the EISA connector far enough to make contact with the upper row of contacts (ISA contacts). Stops, or "access keys," are molded into the EISA connector to prevent an ISA card edge from making contact with the EISA contacts. An EISA expansion board's card edge connection goes deeper into the connector and makes contact with the second row of contacts (EISA contacts). EISA expansion boards are notched to allow the card edge to be pushed further into the connector and use the additional contacts.

The connector housing is made of a high-quality, glass-filled thermoplastic to provide the durability required of surface mount manufacturing technologies.

As with a typical 16-bit ISA connector, the EISA connector is rated for 100 insertion cycles; the connector contacts maintain a minimum of 75 grams of contact force throughout the connector's rated life.

Insertion force is maintained at a level consistent with current ISA connector implementations. A typical ISA expansion board installed in an EISA connctor requires an insertion force of approximately 28 pounds. Because the EISA connector uses a two-level contact design, the insertion force for a typical EISA expansion board requires only a maximum of 35 pounds.

Expansion board layout has not been compromised. The contact pin solder tails maintain a standard 0.1 inch spacing. This, in addition to a large number of ground pins, assures that EMI characteristics are consistent with current ISA implementations. In addition to providing ample ground pins in the EISA extension, contact length is optimized to assure capacitance between contacts is less than two picofarads to minimize "crosstalk."

Two "locator pins" on the EISA connector simplify mounting the connector on the system board. The locator pins allow the manufacturing process to be automated and assure perfect alignment. Alignment of an EISA expansion board within the connector is assured by referencing all dimensions to the datum located near the middle of the connector. The connector manufacturer sizes this datum to insure that no additional friction increases insertion force.

All EISA connector tolerances are specified within current manufacturing standards and technologies; no special tooling or equipment is required to meet EISA hardware specifications. In addition, the EISA specification includes an optional retention device (mounting bracket) to ensure that EISA expansion boards maintain proper positioning.

Compatibililty with current manufacturing technologies, including surface mount technologies, is maintained by designing the connector with an open bottom area to allow washing of processing agents.

2.13.2 Connector Specifications

Characteristics of the EISA Connector

| | |
|---|---|
| Insertion Force: | 28 lbs. typical for upper contacts (ISA)<br>35 lbs. maximum for both levels combined<br>(Measured with a .062 steel gauge) |
| Durability: | 100 cycles (minimum) |
| Contact Force: | .167 lbs. (75 grams) (minimum) |
| Contact Resistance: | Initial: 30 milliohms (maximum)<br>End-of-life: 40 milliohms (maximum) |
| Current Carrying Capacity: | 1 amp per contact on lower (EISA) contacts<br>3 amps per contact on upper (ISA) contacts<br>This assures electrical compatibility with existing ISA expansion boards; a high level of current-carrying capacity on GND and +5V contacts may be required. |

Environmental Performance of the EISA Connector

| | |
|---|---|
| Thermal: | Contacts and housing will withstand vapor phase and surface mount process |
| Steady-state Humidity: | 90-95% RH at 40 degrees C |
| Industrial Mixed Flowing Gas: | 10 days, Class H |
| Vibration: | 10 Gs, 10-500 Hz, 3 hours |
| Physical Shock: | 100 Gs, 6 ms sawtooth, 18 shocks |

Connector Materials

| | |
|---|---|
| Housing: | Glass-filled thermoplastic UL 94 V-O |
| Contact: | Copper alloy |
| Contact Plating: | Gold flash over 40 microinches precious metal minimum over 50 microinches nickel minimum in the contact area; tin lead on the tails. |

Figure 92 - EISA Connector and Card-edges
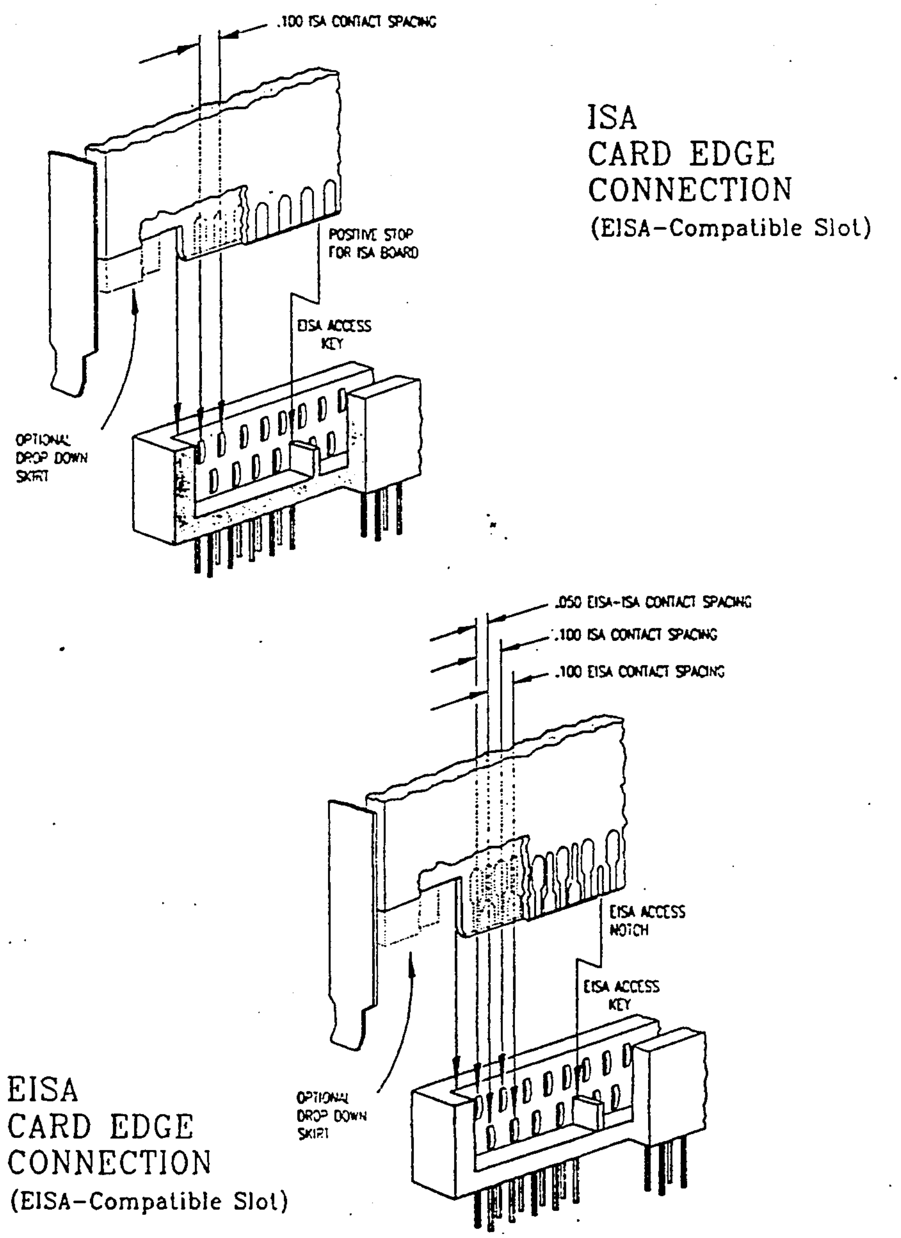

Figure 93 - EISA Expansion Board Dimensions
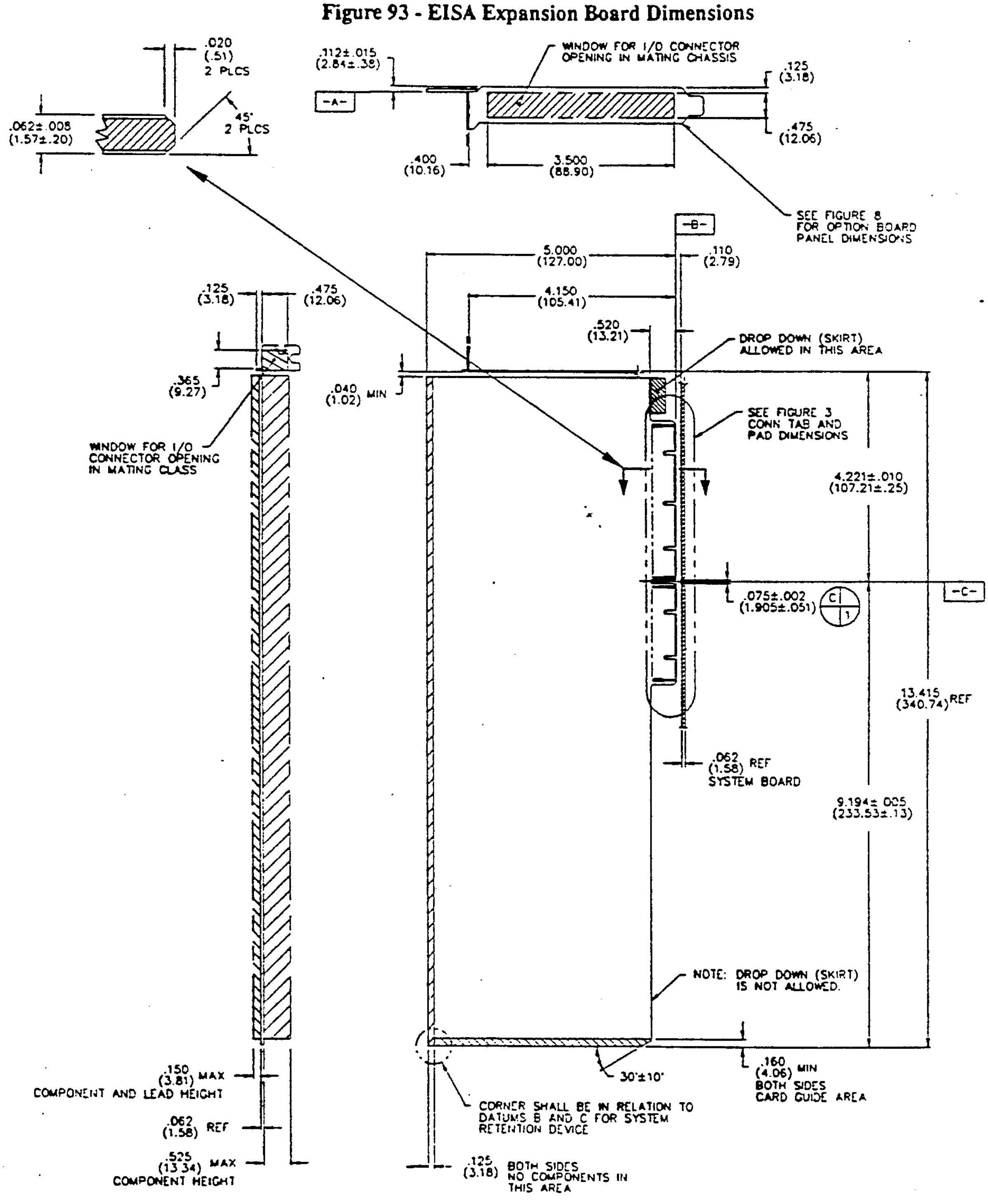

EXTENDED INDUSTRY STANDARD ARCHITECTURE
CONFIDENTIAL INFORMATION OF BCPR SERVICES, INC.
Figure 94 - EISA Expansion Board Card-edge Detail
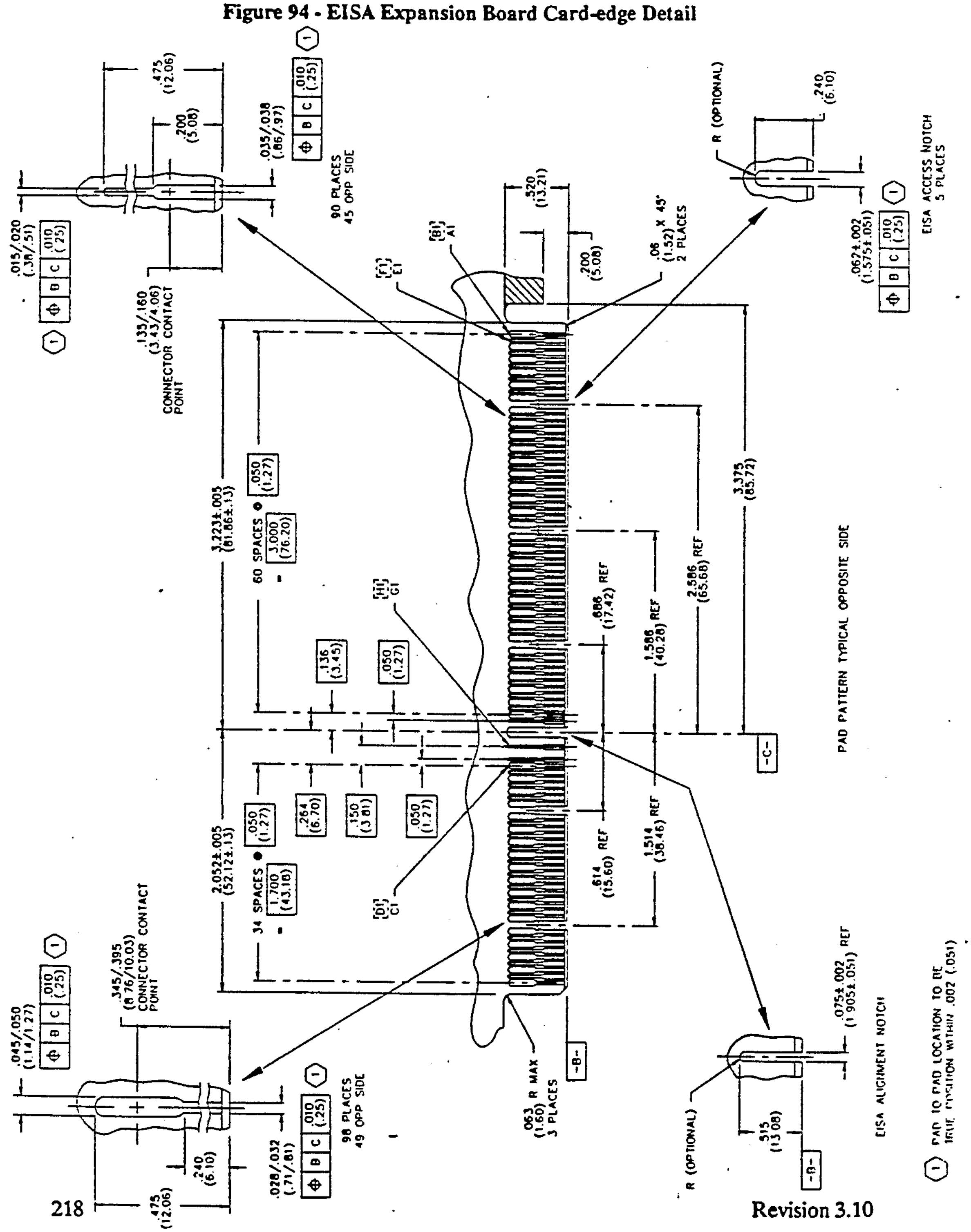

Figure 95 - 16-bit ISA Expansion Board Dimensions
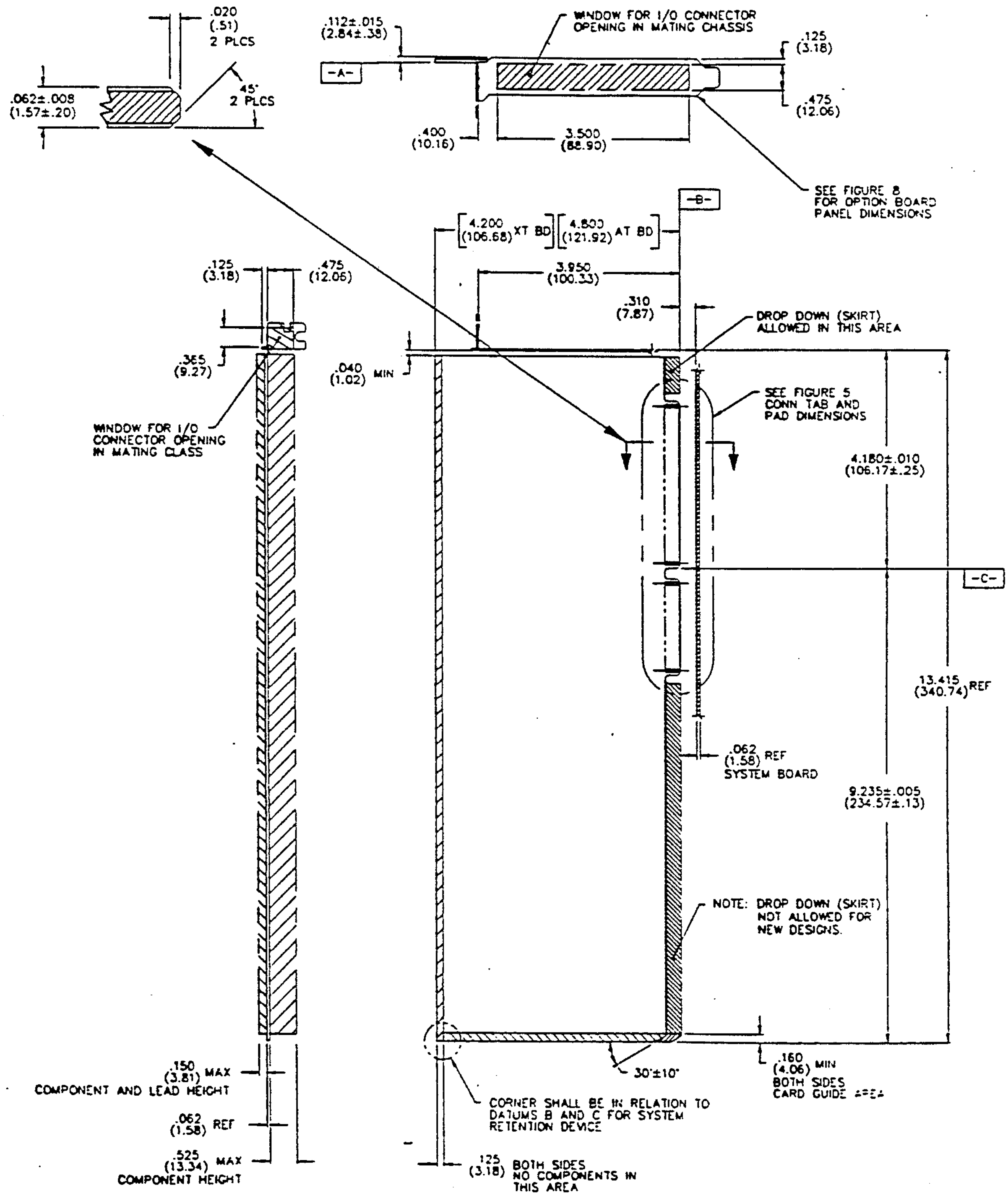

Figure 96 - 16-bit ISA Expansion Board Card-edge Detail
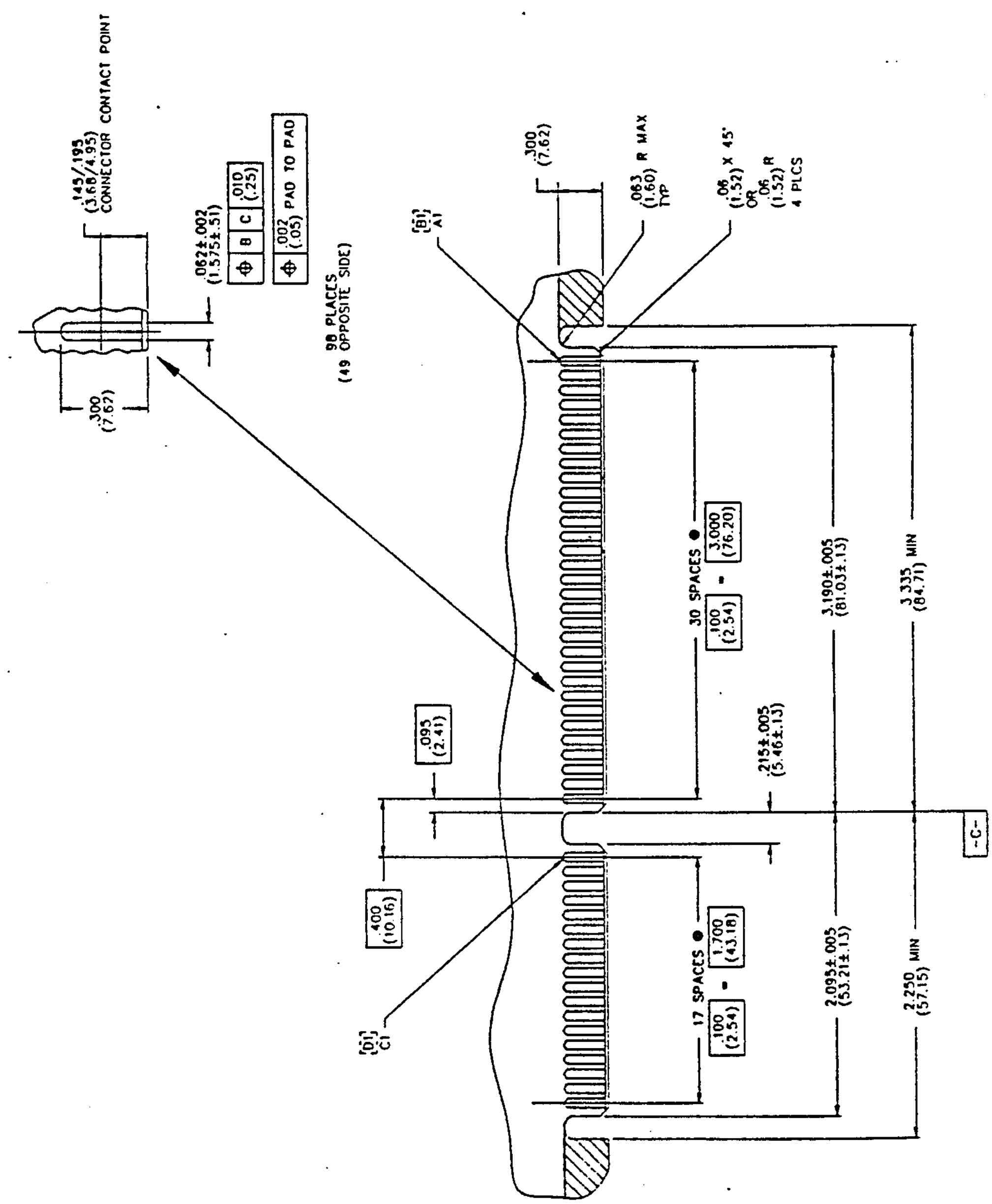

Figure 97 - 8-bit ISA Expansion Board Dimensions
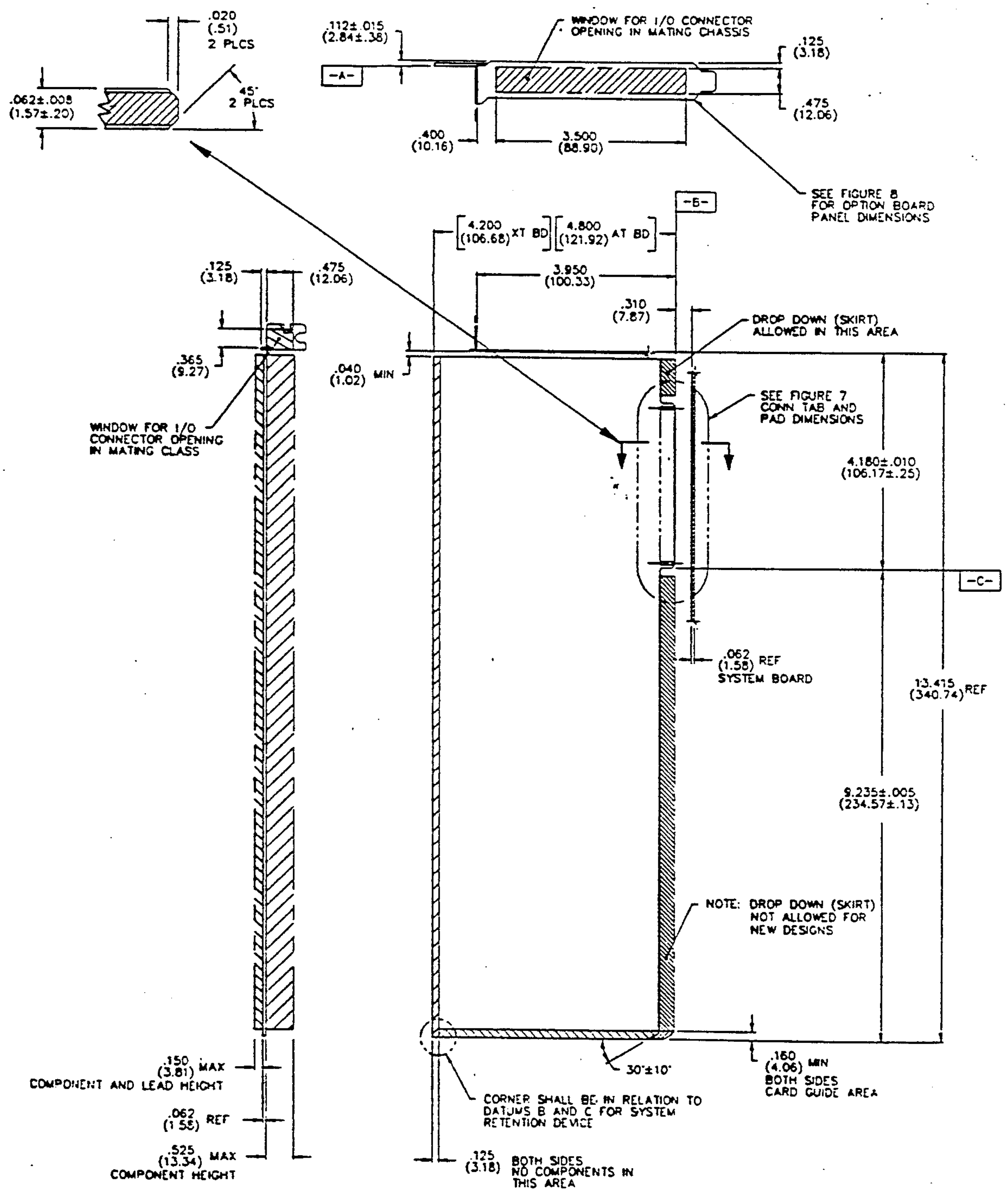

Figure 98 - 8-bit ISA Expansion Board Card-edge Detail
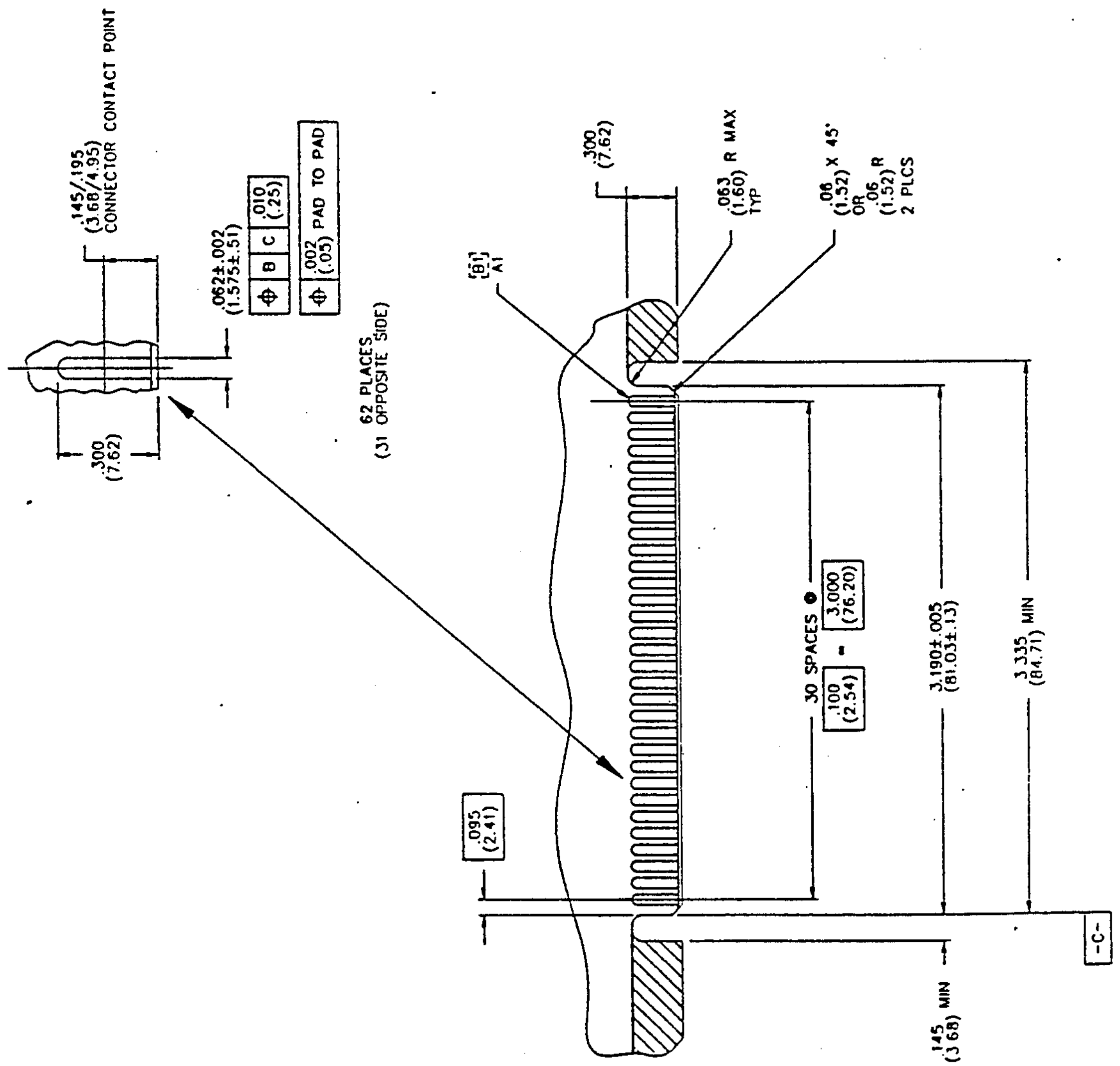

Figure 99 - EISA Expansion Board Mounting Bracket
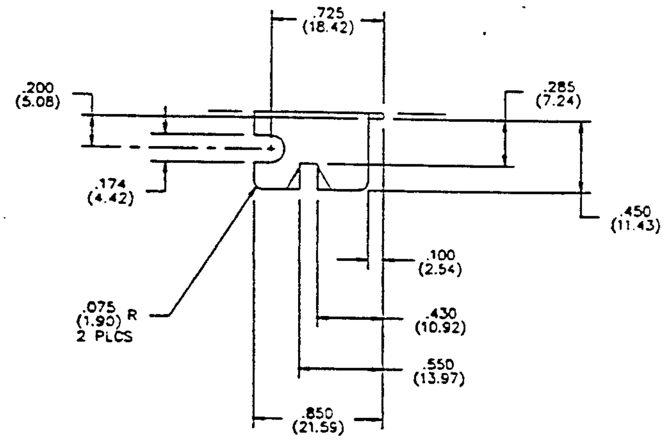
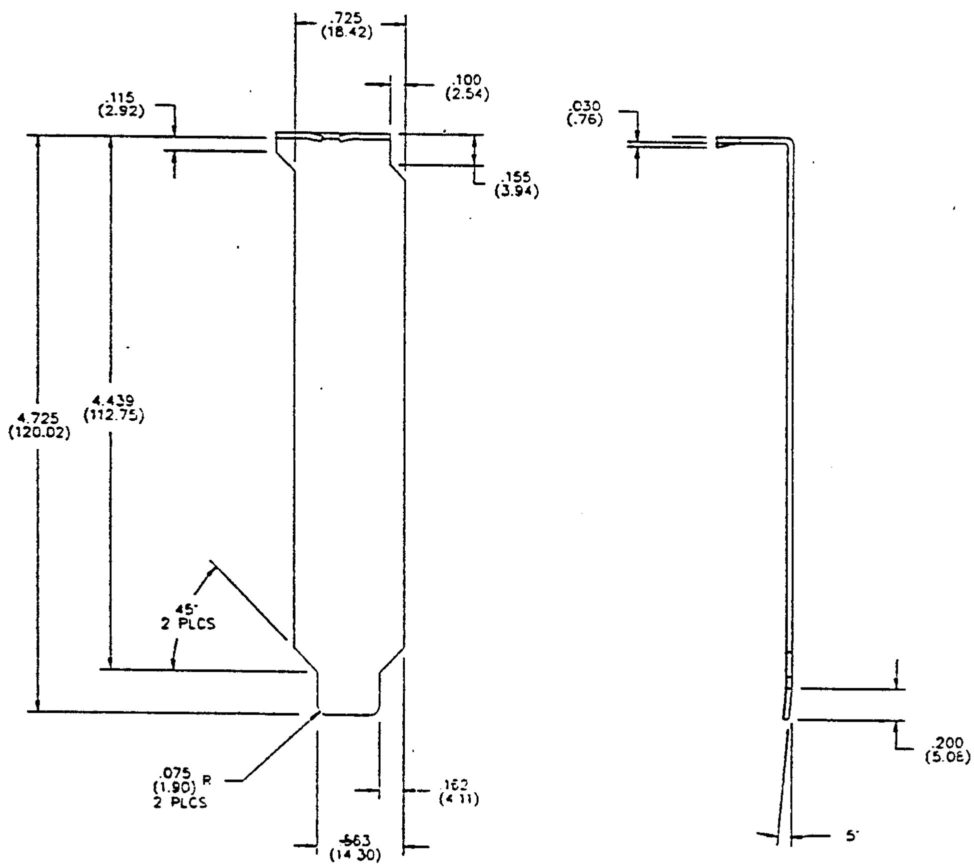

Figure 100 - EISA Connector Dimensions
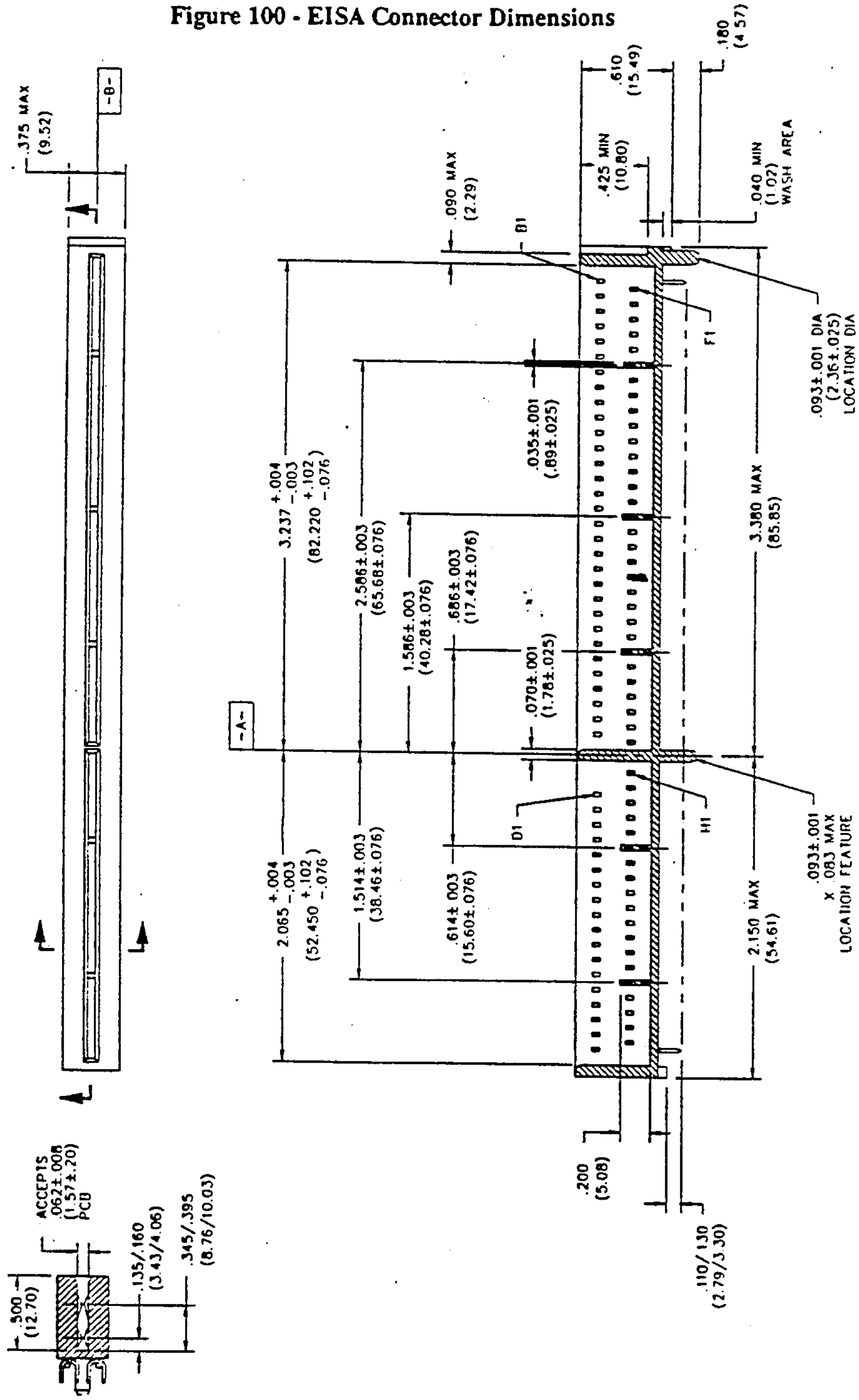

Figure 101 - EISA Connector System Board Drill Pattern
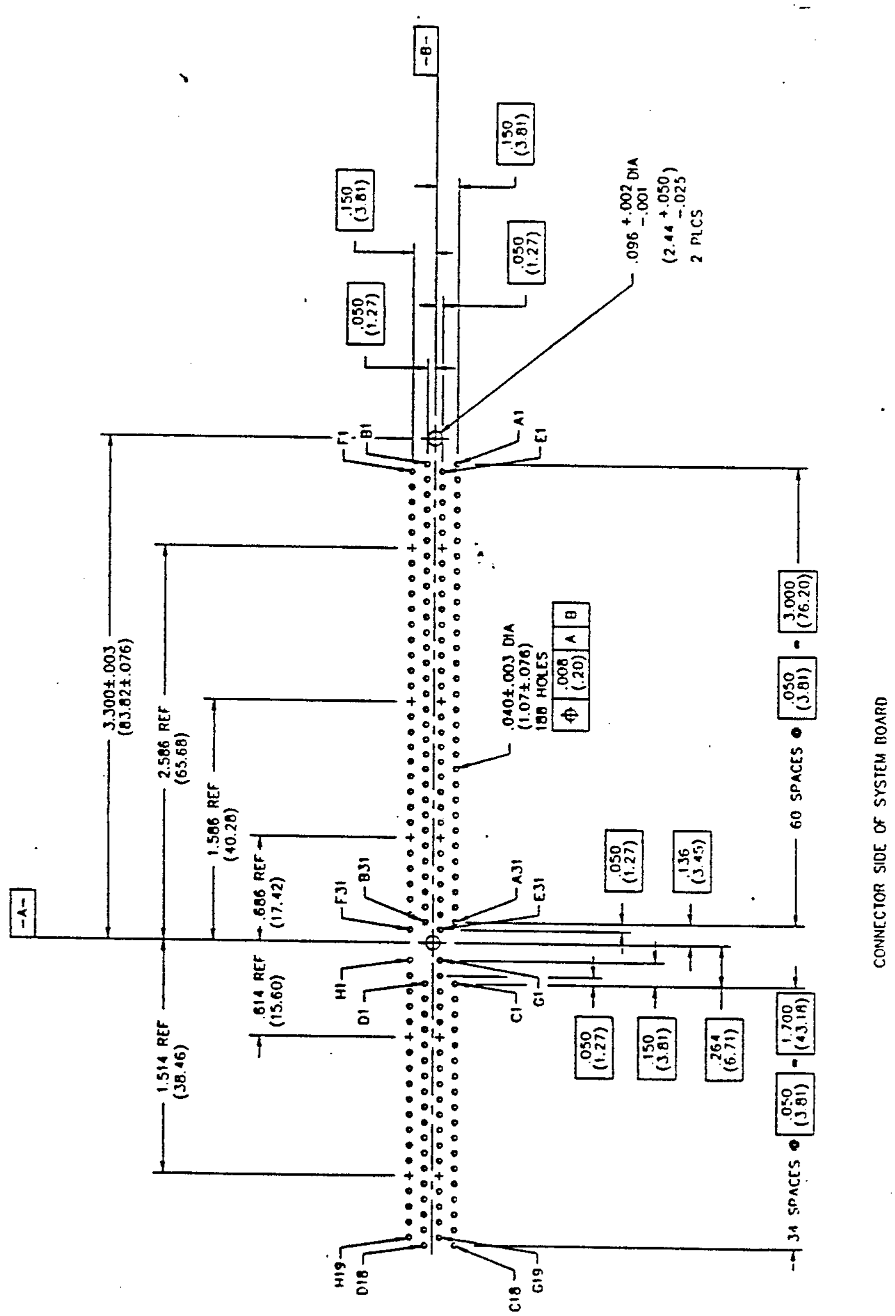

2.13.3 Pin Description

This section provides a pin-out of the EISA connector. All 8- and 16-bit signals are included. Figure 102 on the following page illustrates a top view of the connector to show the pinout.

Note:

1. Reserved pins are for future use and will be assigned in the following order: E12, E13, E14, F12, F14.
2. XXXXXX pins are strictly for system manufacturer-specific use. Generally, these signals should not be connected and should be used to isolate signals on the bus from adjacent power pins.

EISA expansion boards should NOT connect to XXXXXX pins.

Figure 102 - EISA Pinout

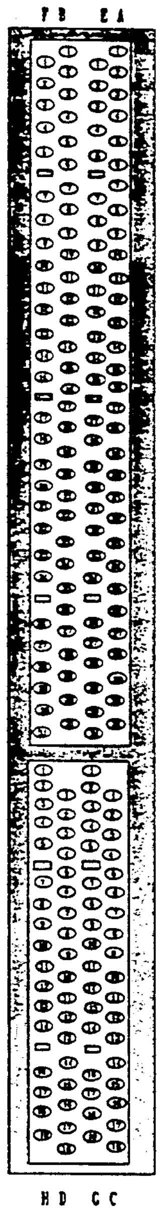

ROW F

| | |
|---|---|
| 1 | GND |
| 2 | +5V |
| 3 | +5V |
| 4 | XXXXXX |
| 5 | XXXXXX |
| ACCESS KEY | |
| 7 | XXXXXX |
| 8 | XXXXXX |
| 9 | +12V |
| 10 | M-IO |
| 11 | LOCK* |
| 12 | RESERVED |
| 13 | GND |
| 14 | RESERVED |
| 15 | BE*<3> |
| ACCESS KEY | |
| 17 | BE*<2> |
| 18 | BE*<0> |
| 19 | GND |
| 20 | +5V |
| 21 | LA*<29> |
| 22 | GND |
| 23 | LA*<26> |
| 24 | LA*<24> |
| ACCESS KEY | |
| 26 | LA<16> |
| 27 | LA<14> |
| 28 | +5V |
| 29 | +5V |
| 30 | GND |
| 31 | LA<10> |

ROW B

| | |
|---|---|
| 1 | GND |
| 2 | RESDRV |
| 3 | +5V |
| 4 | IRQ<9> |
| 5 | -5V |
| 6 | DRQ<2> |
| 7 | -12V |
| 8 | NOWS* |
| 9 | +12V |
| 10 | GND |
| 11 | SMWTC* |
| 12 | SMRDC* |
| 13 | IOWC* |
| 14 | IORC* |
| 15 | DAK*<3> |
| 16 | DRQ<3> |
| 17 | DAK*<1> |
| 18 | DRQ<1> |
| 19 | REFRESH* |
| 20 | BCLK |
| 21 | IRQ<7> |
| 22 | IRQ<6> |
| 23 | IRQ<5> |
| 24 | IRQ<4> |
| 25 | IRQ<3> |
| 26 | DAK*<2> |
| 27 | T-C |
| 28 | BALE |
| 29 | +5V |
| 30 | OSC |
| 31 | GND |

ROW E

| | |
|---|---|
| 1 | CMD* |
| 2 | START* |
| 3 | EXRDY |
| 4 | EX32* |
| 5 | GND |
| ACCESS KEY | |
| 7 | EX16* |
| 8 | SLBURST* |
| 9 | MSBURST* |
| 10 | W-R |
| 11 | GND |
| 12 | RESERVED |
| 13 | RESERVED |
| 14 | RESERVED |
| 15 | GND |
| ACCESS KEY | |
| 17 | BE*<1> |
| 18 | LA*<31> |
| 19 | GND |
| 20 | LA*<30> |
| 21 | LA*<28> |
| 22 | LA*<27> |
| 23 | LA*<25> |
| 24 | GND |
| ACCESS KEY | |
| 26 | LA<15> |
| 27 | LA<13> |
| 28 | LA<12> |
| 29 | LA<11> |
| 30 | GND |
| 31 | LA<9> |

ROW A

| | |
|---|---|
| 1 | IOCHK* |
| 2 | D<7> |
| 3 | D<6> |
| 4 | D<5> |
| 5 | D<4> |
| 6 | D<3> |
| 7 | D<2> |
| 8 | D<1> |
| 9 | D<0> |
| 10 | CHRDY |
| 11 | AENx |
| 12 | SA<19> |
| 13 | SA<18> |
| 14 | SA<17> |
| 15 | SA<16> |
| 16 | SA<15> |
| 17 | SA<14> |
| 18 | SA<13> |
| 19 | SA<12> |
| 20 | SA<11> |
| 21 | SA<10> |
| 22 | SA<9> |
| 23 | SA<8> |
| 24 | SA<7> |
| 25 | SA<6> |
| 26 | SA<5> |
| 27 | SA<4> |
| 28 | SA<3> |
| 29 | SA<2> |
| 30 | SA<1> |
| 31 | SA<0> |

ROW H

| | |
|---|---|
| 1 | LA<8> |
| 2 | LA<6> |
| 3 | LA<5> |
| 4 | +5V |
| 5 | LA<2> |
| ACCESS KEY | |
| 7 | D<16> |
| 8 | D<18> |
| 9 | GND |
| 10 | D<21> |
| 11 | D<23> |
| 12 | D<24> |
| 13 | GND |
| 14 | D<27> |
| ACCESS KEY | |
| 16 | D<29> |
| 17 | +5V |
| 18 | +5V |
| 19 | MAKx* |

ROW D

| | |
|---|---|
| 1 | M16* |
| 2 | IO16* |
| 3 | IRQ<10> |
| 4 | IRQ<11> |
| 5 | IRQ<12> |
| 6 | IRQ<15> |
| 7 | IRQ<14> |
| 8 | DAK*<0> |
| 9 | DRQ<0> |
| 10 | DAK*<5> |
| 11 | DRQ<5> |
| 12 | DAK*<6> |
| 13 | DRQ<6> |
| 14 | DAK*<7> |
| 15 | DRQ<7> |
| 16 | +5V |
| 17 | MASTER16* |
| 18 | GND |

ROW G

| | |
|---|---|
| 1 | LA<7> |
| 2 | GND |
| 3 | LA<4> |
| 4 | LA<3> |
| 5 | GND |
| ACCESS KEY | |
| 7 | D<17> |
| 8 | D<19> |
| 9 | D<20> |
| 10 | D<22> |
| 11 | GND |
| 12 | D<25> |
| 13 | D<26> |
| 14 | D<28> |
| ACCESS KEY | |
| 16 | GND |
| 17 | D<30> |
| 18 | D<31> |
| 19 | MREQx* |

ROW C

| | |
|---|---|
| 1 | SBHE* |
| 2 | LA<23> |
| 3 | LA<22> |
| 4 | LA<21> |
| 5 | LA<20> |
| 6 | LA<19> |
| 7 | LA<18> |
| 8 | LA<17> |
| 9 | MRDC* |
| 10 | MWTC* |
| 11 | D<8> |
| 12 | D<9> |
| 13 | D<10> |
| 14 | D<11> |
| 15 | D<12> |
| 16 | D<13> |
| 17 | D<14> |
| 18 | D<15> |

Rows A, C, F and H are upper (ISA) contacts
Rows B, D, E and G are lower (EISA) contacts

3. System Board I/O Control Functions

The EISA system board includes I/O control circuitry for DMA data transfers, interrupt handling, system timers and other miscellaneous functions. The registers and control ports for these functions are decoded using a 16-bit address.

The following table provides an overview of the EISA system I/O address map and indicates the system board I/O ranges.

Note: I/O addresses between 1000h and FFFFh that are not identified as "Alias of 100h-3FFh" are reserved for slot-specific addressing of expansion boards. The most significant digit in the address represents the slot number (indicated in the table by "Slot 'z'", where 'z' can be any value from 1 to 15). The system board I/O range resides at I/O addresses between 0000h and 0FFFh ('z' = 0).

I/O addresses between 0400h and 04FFh are reserved for current and future EISA system board peripherals defined by this specification. System board manufacturers may use system board addresses 0800-08FFh and 0C00-0CFFh for manufacturer specific I/O devices.

System I/O Address Map

| I/O address Range (hex): | I/O Range Reserved for: |
|---|---|
| 0000-00FF | ISA System board peripherals |
| 0100-03FF | ISA expansion boards |
| 0400-04FF | Reserved - System board controllers |
| 0500-07FF | Alias of 100h-3FFh |
| 0800-08FF | System board |
| 0900-0BFF | Alias of 100h-3FFh |
| 0C00-0CFF | System board |
| 0D00-0FFF | Alias of 100h-3FFh |
| 1000-10FF | Slot 1 |
| 1100-13FF | Alias of 100h-3FFh |
| 1400-14FF | Slot 1 |
| 1500-17FF | Alias of 100h-3FFh |
| 1800-18FF | Slot 1 |
| 1900-1BFF | Alias of 100h-3FFh |
| 1C00-1CFF | Slot 1 |
| 1D00-1FFF | Alias of 100h-3FFh |
| : | : |
| 0z000-0z0FF | Slot 'z' |
| 0z100-0z3FF | Alias of 100h-3FFh |
| 0z400-0z4FF | Slot 'z' |
| 0z500-0z7FF | Alias of 100h-3FFh |
| 0z800-0z8FF | Slot 'z' |
| 0z900-0zBFF | Alias of 100h-3FFh |
| 0zC00-0zCFF | Slot 'z' |
| 0zD00-0zFFF | Alias of 100h-3FFh |

The following table lists a partial set of system board I/O ports. A system board must decode the 16-bit address, except the "don't care" bits. "Don't care" bits are indicated by an "x" in the binary I/O port address. Those I/O ports, which are "ro" (read only) or "wo" (write only), and do not have the corresponding read/write port listed, as well as any ports marked as "reserved," are reserved for future EISA expansion. The value read from "wo" ports or reserved bits in "ro" or "rw" ports are undefined and may change in various implementations. Write operations to reserved ports may cause system failure.

| I/O Port Address | I/O Port Address (binary) MSB LSB | | Register Description |
|---|---|---|---|
| 0000h | 0000 0000 000x 0000 | rw | DMA Ch-0 Base & Current Address register |
| 0001h | 0000 0000 000x 0001 | rw | DMA Ch-0 Base & Current Count register |
| 0002h | 0000 0000 000x 0010 | rw | DMA Ch-1 Base & Current Address register |
| 0003h | 0000 0000 000x 0011 | rw | DMA Ch-1 Base & Current Count register |
| 0004h | 0000 0000 000x 0100 | rw | DMA Ch-2 Base & Current Address register |
| 0005h | 0000 0000 000x 0101 | rw | DMA Ch-2 Base & Current Count register |
| 0006h | 0000 0000 000x 0110 | rw | DMA Ch-3 Base & Current Address register |
| 0007h | 0000 0000 000x 0111 | rw | DMA Ch-3 Base & Current Count register |
| 0008h | 0000 0000 000x 1000 | ro | DMA(0-3) Status register |
| 0008h | 0000 0000 000x 1000 | wo | DMA(0-3) Command register |
| 0009h | 0000 0000 000x 1001 | wo | DMA(0-3) Request register |
| 000Ah | 0000 0000 000x 1010 | wo | DMA(0-3) Write single mask bit |
| 000Bh | 0000 0000 000x 1011 | wo | DMA(0-3) Mode register |
| 000Ch | 0000 0000 000x 1100 | wo | DMA(0-3) Clear byte pointer |
| 000Dh | 0000 0000 000x 1101 | wo | DMA(0-3) Master Clear |
| 000Eh | 0000 0000 000x 1110 | wo | DMA(0-3) Clear Mask register |
| 000Fh | 0000 0000 000x 1111 | wo | DMA(0-3) Write all mask bits |
| 000Fh | 0000 0000 000x 1111 | ro | DMA(0-3) Mask Status register |
| 0020h | 0000 0000 001x xx00 | rw | INT-1 base address |
| 0021h | 0000 0000 001x xx01 | rw | INT-1 mask register |
| 0040h | 0000 0000 010x 0000 | rw | Programmable Interval Timer 1, System Clock (Counter 0) |
| 0041h | 0000 0000 010x 0001 | rw | Refresh Request (Counter 1) |
| 0042h | 0000 0000 010x 0010 | rw | Speaker Tone (Counter 2) |
| 0043h | 0000 0000 010x 0011 | rw | Control Word register |
| 0048h | 0000 0000 010x 1000 | rw | Programmable Interval Timer 2, Fail-safe Timer (Counter 0) |
| 0049h | 0000 0000 010x 1001 | | Not implemented (Counter 1) |
| 004Ah | 0000 0000 010x 1010 | rw | Reserved for System (Counter 2) |
| 004Bh | 0000 0000 010x 1011 | rw | Control Word register |

| I/O Port Address | I/O Port Address (binary) MSB LSB | | Register Description |
|---|---|---|---|
| 0061h | 0000 0000 0110 0001 | rw | NMI Status register |
| 0070h | 0000 0000 0111 0xx0 | wo | NMI Enable register |
| 0080h | 0000 0000 1000 0000 | | Reserved |
| 0081h | 0000 0000 1000 0001 | rw | DMA Ch 2 Low Page register |
| 0082h | 0000 0000 1000 0010 | rw | DMA Ch 3 Low Page register |
| 0083h | 0000 0000 1000 0011 | rw | DMA Ch 1 Low Page register |
| 0084h | 0000 0000 1000 0100 | | Reserved |
| 0085h | 0000 0000 1000 0101 | | Reserved |
| 0086h | 0000 0000 1000 0110 | | Reserved |
| 0087h | 0000 0000 1000 0111 | rw | DMA Ch 0 Low Page register |
| 0088h | 0000 0000 1000 1000 | | Reserved |
| 0089h | 0000 0000 1000 1001 | rw | DMA Ch 6 Low Page register |
| 008Ah | 0000 0000 1000 1010 | rw | DMA Ch 7 Low Page register |
| 008Bh | 0000 0000 1000 1011 | rw | DMA Ch 5 Low Page register |
| 008Ch | 0000 0000 1000 1100 | | Reserved |
| 008Dh | 0000 0000 1000 1101 | | Reserved |
| 008Eh | 0000 0000 1000 1110 | | Reserved |
| 008Fh | 0000 0000 1000 1111 | rw | Refresh Low Page register |
| 00A0h | 0000 0000 101x xx00 | rw | INT-2 base address register |
| 00A1h | 0000 0000 101x xx01 | rw | INT-2 mask register |
| 00C0h | 0000 0000 1100 000x | rw | DMA Ch-4 Base & Current Address register |
| 00C2h | 0000 0000 1100 001x | rw | DMA Ch-4 Base & Current Count register |
| 00C4h | 0000 0000 1100 010x | rw | DMA Ch-5 Base & Current Address register |
| 00C6h | 0000 0000 1100 011x | rw | DMA Ch-5 Base & Current Count register |
| 00C8h | 0000 0000 1100 100x | rw | DMA Ch-6 Base & Current Address register |
| 00CAh | 0000 0000 1100 101x | rw | DMA Ch-6 Base & Current Count register |
| 00CCh | 0000 0000 1100 110x | rw | DMA Ch-7 Base & Current Address register |
| 00CEh | 0000 0000 1100 111x | rw | DMA Ch-7 Base & Current Count register |
| 00D0h | 0000 0000 1101 000x | ro | DMA(4-7) Status register |
| 00D0h | 0000 0000 1101 000x | wo | DMA(4-7) Command register |
| 00D2h | 0000 0000 1101 001x | wo | DMA(4-7) Request register |
| 00D4h | 0000 0000 1101 010x | wo | DMA(4-7) Write single mask bit register |
| 00D6h | 0000 0000 1101 011x | wo | DMA(4-7) Mode register |
| 00D8h | 0000 0000 1101 100x | wo | DMA(4-7) Clear byte pointer |
| 00DAh | 0000 0000 1101 101x | wo | DMA(4-7) Master Clear |
| 00DCh | 0000 0000 1101 110x | wo | DMA(4-7) Clear Mask register |
| 00DEh | 0000 0000 1101 111x | wo | DMA(4-7) Write all mask bits register |
| 00DEh | 0000 0000 1101 111x | ro | DMA(4-7) Mask Status register |

| I/O Port Address | I/O Port Address (binary) MSB LSB | | Register Description |
|---|---|---|---|
| 0400h | 0000 0100 0000 0000 | | Reserved |
| 0401h | 0000 0100 0000 0001 | rw | DMA Ch-0 High Base & Current Count |
| 0402h | 0000 0100 0000 0010 | | Reserved |
| 0403h | 0000 0100 0000 0011 | rw | DMA Ch-1 High Base & Current Count |
| 0404h | 0000 0100 0000 0100 | | Reserved |
| 0405h | 0000 0100 0000 0101 | rw | DMA Ch-2 High Base & Current Count |
| 0406h | 0000 0100 0000 0110 | | Reserved |
| 0407h | 0000 0100 0000 0111 | rw | DMA Ch-3 High Base & Current Count |
| 0408h | 0000 0100 0000 1000 | | Reserved |
| 0409h | 0000 0100 0000 1001 | | Reserved |
| 040Ah | 0000 0100 0000 1010 | ro | DMA Interrupt pending register |
| 040Ah | 0000 0100 0000 1010 | wo | DMA(0-3) Chaining Mode register |
| 040Bh | 0000 0100 0000 1011 | wo | DMA(0-3) Extended Mode register |
| 040Ch | 0000 0100 0000 1100 | ro | Host CPU/EISA Master |
| 040Dh | 0000 0100 0000 1101 | | Reserved |
| 040Eh | 0000 0100 0000 1110 | | Reserved |
| 040Fh | 0000 0100 0000 1111 | | Reserved |
| 0461h | 0000 0100 0110 0001 | rw | Extended NMI and reset control register |
| 0462h | 0000 0100 0110 0010 | wo | Software NMI register |
| 0464h | 0000 0100 0110 0100 | ro | Last EISA Bus Master granted (L) |
| 0465h | 0000 0100 0110 0101 | ro | Last EISA Bus Master granted (H) |
| 0480h | 0000 0100 1000 0000 | | Reserved |
| 0481h | 0000 0100 1000 0001 | rw | DMA Ch 2 High Page register |
| 0482h | 0000 0100 1000 0010 | rw | DMA Ch 3 High Page register |
| 0483h | 0000 0100 1000 0011 | rw | DMA Ch 1 High Page register |
| 0484h | 0000 0100 1000 0100 | | Reserved |
| 0485h | 0000 0100 1000 0101 | | Reserved |
| 0486h | 0000 0100 1000 0110 | | Reserved |
| 0487h | 0000 0100 1000 0111 | rw | DMA Ch 0 High Page register |
| 0488h | 0000 0100 1000 1000 | | Reserved |
| 0489h | 0000 0100 1000 1001 | rw | DMA Ch 6 High Page register |
| 048Ah | 0000 0100 1000 1010 | rw | DMA Ch 7 High Page register |
| 048Bh | 0000 0100 1000 1011 | rw | DMA Ch 5 High Page register |
| 048Ch | 0000 0100 1000 1100 | | Reserved |
| 048Dh | 0000 0100 1000 1101 | | Reserved |
| 048Eh | 0000 0100 1000 1110 | | Reserved |
| 048Fh | 0000 0100 1000 1111 | | Reserved |
| 04C2h | 0000 0100 1100 0010 | | Reserved |
| 04C6h | 0000 0100 1100 0110 | rw | DMA Ch-5 High Base & Current Count |
| 04CAh | 0000 0100 1100 1100 | rw | DMA Ch-6 High Base & Current Count |
| 04CEh | 0000 0100 1100 1110 | rw | DMA Ch-7 High Base & Current Count |

| I/O Port Address | I/O Port Address (binary) MSB LSB | | Register Description |
|---|---|---|---|
| 04D0h | 0000 0100 1101 0000 | rw | INT-1 edge/level control register |
| 04D1h | 0000 0100 1101 0001 | rw | INT-2 edge/level control register |
| 04D2h | 0000 0100 1101 0010 | | Reserved |
| 04D3h | 0000 0100 1101 0011 | | Reserved |
| 04D4h | 0000 0100 1101 0100 | wo | DMA(4-7) Chaining Mode register |
| 04D4h | 0000 0100 1101 0100 | ro | DMA Chaining Mode Status register |
| 04D5h | 0000 0100 1101 0101 | | Reserved |
| 04D6h | 0000 0100 1101 0110 | wo | DMA(4-7) Extended Mode register |
| 04D7h | 0000 0100 1101 0111 | | Reserved |
| 04D8h | 0000 0100 1101 1000 | | Reserved |
| 04D9h | 0000 0100 1101 1001 | | Reserved |
| 04DAh | 0000 0100 1101 1010 | | Reserved |
| 04DBh | 0000 0100 1101 1011 | | Reserved |
| 04DCh | 0000 0100 1101 1100 | | Reserved |
| 04DDh | 0000 0100 1101 1101 | | Reserved |
| 04DEh | 0000 0100 1101 1110 | | Reserved |
| 04DFh | 0000 0100 1101 1111 | | Reserved |
| 04E0h | 0000 0100 1110 0000 | rw | DMA CH0 Stop register bits <7:2> |
| 04E1h | 0000 0100 1110 0001 | rw | DMA CH0 Stop register bits <15:8> |
| 04E2h | 0000 0100 1110 0010 | rw | DMA CH0 Stop register bits <23:16> |
| 04E3h | 0000 0100 1110 0011 | | Reserved |
| 04E4h | 0000 0100 1110 0100 | rw | DMA CH1 Stop register bits <7:2> |
| 04E5h | 0000 0100 1110 0101 | rw | DMA CH1 Stop register bits <15:8> |
| 04E6h | 0000 0100 1110 0110 | rw | DMA CH1 Stop register bits <23:16> |
| 04E7h | 0000 0100 1110 0111 | | Reserved |
| 04E8h | 0000 0100 1110 1000 | rw | DMA CH2 Stop register bits <7:2> |
| 04E9h | 0000 0100 1110 1001 | rw | DMA CH2 Stop register bits <15:8> |
| 04EAh | 0000 0100 1110 1010 | rw | DMA CH2 Stop register bits <23:16> |
| 04EBh | 0000 0100 1110 1011 | | Reserved |
| 04ECh | 0000 0100 1110 1100 | rw | DMA CH3 Stop register bits <7:2> |
| 04EDh | 0000 0100 1110 1101 | rw | DMA CH3 Stop register bits <15:8> |
| 04EEh | 0000 0100 1110 1110 | rw | DMA CH3 Stop register bits <23:16> |
| 04EFh | 0000 0100 1110 1111 | | Reserved |
| 04F0h | 0000 0100 1111 0000 | | Reserved |
| 04F1h | 0000 0100 1111 0001 | | Reserved |
| 04F2h | 0000 0100 1111 0010 | | Reserved |
| 04F3h | 0000 0100 1111 0011 | | Reserved |

| I/O Port Address | I/O Port Address (binary) MSB LSB | | Register Description |
|---|---|---|---|
| 04F4h | 0000 0100 1111 0100 | rw | DMA CH5 Stop register bits <7:2> |
| 04F5h | 0000 0100 1111 0101 | rw | DMA CH5 Stop register bits <15:8> |
| 04F6h | 0000 0100 1111 0110 | rw | DMA CH5 Stop register bits <23:16> |
| 04F7h | 0000 0100 1111 0111 | | Reserved |
| 04F8h | 0000 0100 1111 1000 | rw | DMA CH6 Stop register bits <7:2> |
| 04F9h | 0000 0100 1111 1001 | rw | DMA CH6 Stop register bits <15:8> |
| 04FAh | 0000 0100 1111 1010 | rw | DMA CH6 Stop register bits <23:16> |
| 04FBh | 0000 0100 1111 1011 | | Reserved |
| 04FCh | 0000 0100 1111 1100 | rw | DMA CH7 Stop register bits <7:2> |
| 04FDh | 0000 0100 1111 1101 | rw | DMA CH7 Stop register bits <15:8> |
| 04FEh | 0000 0100 1111 1110 | rw | DMA CH7 Stop register bits <23:16> |
| 04FFh | 0000 0100 1111 1111 | | Reserved |
| 0C80h | 0000 1100 1000 0000 | ro | System Board ID Byte 1 |
| 0C81h | 0000 1100 1000 0001 | ro | System Board ID Byte 2 |
| 0C82h | 0000 1100 1000 0010 | ro | System Board ID Byte 3 |
| 0C83h | 0000 1100 1000 0011 | ro | System Board ID Byte 4 |
| 0C84h | 0000 1100 1000 0100 | ro | System Board Enable |

3.1 DMA Description

EISA systems provide seven ISA compatible DMA channels. Any channel can be programmed to provide EISA performance and addressing benefits to existing 8- and 16-bit DMA devices while maintaining full ISA compatibility. The EISA DMA controller also supports DEMAND and BLOCK mode DMA transfers that enable DMA channels to perform multiple continuous transfers and high-speed bus cycles that achieve data transfer rates up to 33 MB/s. In BLOCK mode the DMA channel performs a continuous transfer of the data block. DEMAND mode also performs an uninterrupted transfer of the data block, but the DMA device can temporarily suspend the transfer and release the bus before the end of the block. BLOCK or DEMAND mode transfers can be preempted by other devices requesting the bus.

All DMA channels support an extended addressing mode. In this mode, the EISA address register counts sequentially like a 32-bit up/down counter, so devices can sequentially address a 32-bit address range without programmatically incrementing the address extension registers each time the DMA address crosses a 64K segment boundary (as in traditional ISA).

Any DMA channel can be programmed for 8-, 16- or 32-bit DMA device size and ISA Compatible, Type "A", Type "B", or Burst DMA (Type "C") timing modes. The system board performs data size translations necessary for DMA transfers between all DMA device sizes and any 8-, 16- or 32-bit memory.

The following table lists the variations of data transfer timing for each DMA device size supported.

| DMA Cycle Type | Transfer rate (MB/s) | Compatibility |
|---|---|---|
| Compatible | | |
| 8-bit | 1.0 | All ISA |
| 16-bit | 2.0 | All ISA |
| Type "A" | | |
| 8-bit | 1.3 | Most ISA |
| 16-bit | 2.6 | Most ISA |
| 32-bit | 5.3 | EISA Only |
| Type "B" | | |
| 8-bit | 2.0 | Some ISA |
| 16-bit | 4.0 | Some ISA |
| 32-bit | 8.0 | EISA Only |
| Burst DMA (Type "C") | | |
| 8-bit | 8.2 | EISA Only |
| 16-bit | 16.5 | EISA Only |
| 32-bit | 33.0 | EISA Only |

3.1.1 DMA Controller Overview

The DMA circuitry incorporates the functionality of two 8237 DMA controllers, plus the EISA enhancements. The address and data busses support a full 32-bit system. The DMA controller provides timing control for the enhanced EISA DMA cycle types and maintains compatibility with ISA DMA devices.

The memory addressing circuitry supports the full 32-bit address for DMA devices. Each channel includes a 16-bit ISA compatible current address register, an 8-bit ISA compatible page register for address lines LA<23:16> (low page registers) and an 8-bit EISA page register for address lines LA* <31:24> (high page registers).

The DMA controller does not have to include the counter functions and DMA state machine for DMA channel 4 (which is used in 8237-based ISA products for cascading the second DMA controller). The channel 4 read/write registers are included to guarantee compatibility with existing software. The channel 4 counter functions and state machine are not needed for compatibility.

The system board uses DRQ<x> and DAK* <x> with IORC* and IOWC* for read and write operations to the DMA device. The DMA device transfers data directly to the memory slave unless data size translations are required. DMA read and write operations to memory use the normal memory interface.

In ISA compatible timing mode, the 16-bit command signals, MRDC* and MWTC*, are generated during DMA access to EISA memory slaves for addresses less than 16 Mbytes. MRDC* and MWTC* are generated for addresses greater than 16 Mbytes if an EISA memory slave does not respond by asserting EX32* or EX16*.

3.1.2 DMA Controller Description

The DMA controller operates in either of two operating conditions.

The DMA controller operates in Master Condition while controlling DMA data transfers and supporting a 16-bit ISA bus master's use of a channel's DRQ<x>, DAK* <x> arbitration signals.

The DMA controller operates in Slave Condition while monitoring the bus and decoding read or write I/O cycles that the main CPU and bus masters use to program or examine the DMA registers. The DMA controller only accepts read or write accesses to its registers while in Slave Condition.

3.1.2.1 DMA Master Condition Operation

The DMA controller generates the cycle control for DMA data transfers while operating in the Master Condition. The DMA controller supplies the address and read/write indication, then controls the cycle execution.

The DMA controller also operates in the Master Condition when a 16-bit ISA bus master uses a DMA channel for bus requests. No DMA transfers occur, but the active state of the DMA controller's Master Condition precludes use of the channel for normal transfers or the programming of the DMA controller.

The DMA controller is in the Master Condition when any channel's DAK* <x> is asserted.

3.1.2.2 DMA Slave Condition Operation

The main CPU can perform read or write accesses to the DMA controller's 8-bit I/O ports when in the Slave Condition. The DMA controller accepts read and write accesses while no DMA data transfers are in progress, until the system board asserts any channel's DAK*<x>. If a transfer is in progress, the main CPU or a bus master can request the bus, and, after winning the arbitration, can access the DMA registers. The DMA controller operates in the Slave Condition while a non-device has a bus grant.

3.1.3 DMA Transfer Modes

A DMA channel operates in one of the following four transfer modes: Single transfer, Block transfer, Demand transfer, or Cascade mode.

3.1.3.1 Single Transfer Mode

A DMA channel programmed for Single Transfer Mode performs one transfer for each arbitration cycle. The DMA software programs the channel's Base Word Count register for the appropriate number of transfers to perform. The DMA controller decrements the channel's Current Word Count register and increments its Current Address register after each transfer. The transfer completes when the Current Word Count register reaches terminal count (the word count "rolls over" from zero to FFFFFFh) or when an external end of process is received. Terminal Count or EOP causes the current registers to be reloaded from the base registers if the channel is programmed for autoinitialize. If the channel is programmed and ready for chaining, the next chain buffer is enabled.

A DMA device requests a Single Transfer Mode DMA transfer by asserting DRQ<x> and holding it until sampling DAK*<x> asserted. The DMA device may hold DRQ<x> asserted throughout the single transfer. The system board negates DAK*<x> and the DMA channel releases the bus after the single transfer. If DRQ<x> remains asserted, the DMA controller immediately requests the bus again. The arbitration controller performs the arbitration, and asserts the winning channel's DAK*<x> to signal the bus grant. The DMA channel then performs another single transfer. The current registers hold the intermediate address and word count values between arbitration cycles.

3.1.3.2 Block Transfer Mode

A DMA channel programmed for Block Transfer Mode performs a block of transfers for each arbitration cycle. The DMA software programs the channel's Base Word Count register for the appropriate number of transfers to perform. The DMA controller decrements the channel's Current Word Count register and increments its Current Address register after each transfer. The transfer completes when the Current Word Count register reaches terminal count (the word count "rolls over" from zero to FFFFFFh) or when an external EOP is received. Terminal Count or EOP causes the current registers to be reloaded from the base registers if the channel is programmed for autoinitialize. If the channel is programmed and ready for chaining, the next chain buffer is enabled.

A DMA device requests a Block Mode DMA transfer by asserting DRQ<x> and holding it until sampling DAK*<x> asserted. The DMA device may hold DRQ<x> asserted throughout the block transfer or may release DRQ<x> after sampling DAK*<x> asserted. The transfer can be interrupted (except when programmed in ISA compatible timing mode) if another device requests the bus. In this case, the system board negates the DMA channel's DAK*<x> and the DMA channel immediately requests the bus again. The arbitration controller performs the arbitration, and asserts the winning channel's DAK*<x> to signal the bus grant. The DMA channel then continues the block transfer. The DMA device does not have to re-assert DRQ<x> if the transfer is interrupted by another device. The current registers hold the intermediate address and word count values between arbitration cycles.

A DMA device that uses ISA compatible timing should not be programmed for block mode. It is possible to lock out other devices (including refresh) if the transfer count is programmed to a large number. Block mode can effectively be used with Type "A", Type "B" or Burst DMA timing since the channel can be interrupted while other devices use the bus.

3.1.3.3 Demand Transfer Mode

A DMA channel programmed for Demand Transfer Mode performs a group of transfers for each arbitration cycle. The DMA software programs the channel's Base Word Count register for the appropriate number of transfers to perform. The DMA controller decrements the channel's Current Word Count register and increments its Current Address register after each transfer. The transfer continues until the device negates DRQ<x>, the Current Word Count register reaches terminal count (the word count "rolls over" from zero to FFFFFFh) or an external EOP is received. Terminal Count or EOP causes the current registers to be reloaded from the base registers if the channel is programmed for autoinitialize. The negation of DRQ<x> interrupts the transfer until the DMA device is ready for more data, but does not terminate the transfer.

A DMA device requests a Demand Mode DMA transfer by asserting DRQ<x> and holding it until sampling DAK*<x> asserted. The DMA device holds DRQ<x> asserted until it runs out of data or until the transfer terminates. The transfer can be interrupted (except when programmed for ISA compatible timing) if another device requests the bus. The system board then negates the DMA channel's DAK*<x>. The DMA channel requests the bus again by asserting or continuing to assert DRQ<x>. The arbitration controller performs the arbitration, and asserts the winning channel's DAK*<x> to signal the bus grant. The DMA channel may then continues the block of transfers. The current registers hold the intermediate address and word count values between arbitration cycles.

A DMA device that uses ISA compatible timing should not be programmed for demand mode unless the device releases the bus periodically to allow other devices to use the bus. It is possible to lock out other devices (including refresh) if the transfer count is programmed to a large number. Demand mode can effectively be used with Type "A", Type "B", or Burst DMA timing since the channel can be interrupted while other devices use the bus.

3.1.3.4 Cascade Mode

A DMA channel programmed for Cascade Mode enables a 16-bit bus master to use the DMA arbitration signals. DMA channel 4 uses cascade mode, to expand the number of DMA channels available.

DMA channel 4 is the DMA expansion channel used to cascade the DMA channel 0-3 controller block to the DMA Channel 4-7 controller block. DMA Channel 4 is always programmed for cascade mode. DMA requests and grants for channels 0-3 propagate through the priority network at channel 4. For fixed priority arbitration, channels 0-3 are higher priority than channels 5-7. For rotating priority, channels 0-3 can only win the arbitration when channel 4 wins in the rotation of channels 4-7. Channel 4 is used only for cascading the additional channels. It cannot service DMA transfer requests.

A 16-bit ISA bus master must use a DMA channel programmed to Cascade Mode for bus arbitration. The 16-bit ISA bus master asserts the DMA channel's DRQ<x> to request the bus, and monitors DAK*<x> for acknowledgement of bus grant to the bus master. Setting a DMA channel to cascade mode floats the address and command signals (MRDC*, MWTC*, IORC*, IOWC*), leaving the 16-bit ISA bus master free to drive the address and control signals. The system board pull-up resistors hold LA*<31:24) at a logic "0".

3.1.4 Transfer Types

Each of the three DMA transfer modes (Single, Block and Demand) can perform Read, Write and Verify types of transfers. Write transfers move data from an I/O device to memory by activating memory write and IORC* (enabled by DAK*<x> asserted and AENx high). Read transfers move data from memory to an I/O device by activating memory read and IOWC* (enabled by DAK*<x> asserted and AENx high). Verify transfers cause the DMA controller to perform pseudo read and write cycles. It generates addresses, and produces DAK*<x> and terminal count, but the memory and I/O control lines remain inactive. Verify transfers are only allowed in ISA compatible timing mode and have the address, DAK*<x>, and T-C timing associated with that mode.

3.1.5 Auto Initialize

An Autoinitialize channel automatically loads the Current Page, Current Address and Current Word Count registers from the Base Page, Base Address, and Base Word Count registers each time the DMA controller reaches terminal count or an external EOP is received. By programming a bit in the Mode register, a channel can be set up for Auto-initialization. The mask bit is not set at the end of a transfer when the channel is in autoinitialize mode. Following autoinitialize, the channel is ready to perform another DMA service without CPU intervention as soon as the DMA device requests and wins the bus again.

3.1.6 Buffer Chaining

The buffer chaining mode of a channel is useful for transferring data from a peripheral to several different areas of memory within one transfer operation (from the DMA device's viewpoint). This is accomplished by causing the DMA controller to interrupt the CPU for more programming information while the previously programmed transfer is still in progress. The DMA controller then loads the new transfer information automatically when the previous transfer completes. In this way, the entire transfer can complete without interrupting the operation of the DMA device. This mode is most useful for single cycle or demand modes of the controller where the transfer process allows time for the CPU to execute the interrupt routine.

A channel can be initialized for buffer chaining by programming the DMA base registers with the appropriate initial values, then programming the Chaining Mode register to "enable chaining mode." The DMA controller automatically loads the base register values into the current registers. The base registers must then be programmed with the appropriate values for the next group of DMA cycles.

The DMA transfer starts after the DRQ<x>, DAK*<x> bus arbitration. When the Current Word Count register reaches terminal count, the DMA controller loads the Current registers from the Base registers, sets the appropriate bit in the "Channel Interrupt Status register," then asserts IRQ13. The pending IRQ13 indicates that the Base registers are empty and chaining mode is enabled. A T-C is not generated for the DMA device.

The Base registers must be updated and the Chaining Mode register must be set to "base register update complete" before the Current Word Count register reaches zero (terminal count), or the DMA controller abnormally terminates the data transfer by setting the channel's bit in the "Channel Interrupt Status register," and setting the channel's "mask bit" in the "Mask register." Abnormal termination of the DMA transfer causes the DMA channel to become unstable and is likely to cause an overrun. Software can determine that chaining mode has abnormally terminated by inspecting the Mask Status register (after having set the Chaining Mode register to "base register update complete"). If the Mask Status register indicates the channel is disabled, then the DMA channel is in an unstable state. The recovery procedure should reinitialize the DMA channel and restart the DMA device.

The IRQ13 interrupt handler reads the Channel Interrupt Status register to determine that the DMA controller asserted IRQ13 and to identify the channel requesting service. The interrupt handler updates the channel's base registers, then programs the Chaining Mode register for "base register update complete."

The I/O write that signals "base register update complete" also resets the DMA channel's assertion of IRQ13 and the channel's bit in the Channel Interrupt Status register. The interrupt handler must then restore normal IRQ13 processing to assure service to other devices (like the 387 coprocessor) that might also have a pending IRQ13.

The DMA controller asserts IRQ13 only after reaching terminal count or external EOP (with chaining mode enabled). It does not assert IRQ13 during the initial programming sequence that loads the DMA base registers twice.

When chaining mode is enabled, only the Base registers are loaded by the CPU. The Current registers load automatically after the Current Word Count register reaches terminal count. The processor can read the Current registers, but not load them.

3.1.7 Ring Buffers

The EISA DMA controller includes a set of Stop registers that may be used to implement a ring buffer. The ring buffer data structure reserves a fixed portion of memory, on doubleword boundaries, to be used for a DMA channel. Consecutive reception frames or other data structures are stored in adjacent portions of the ring buffer memory.

The beginning and end of the ring buffer area are defined in the Base Address register and the Base Address register plus the Base Word Count. The incoming frames (data) are deposited in sequential locations of the ring buffer. When the DMA reaches the end of the ring buffer (the word count has expired), it autoinitializes, taking it back to the start of the ring buffer. The DMA then begins depositing the incoming bytes in the ring buffers sequential locations–providing that the host CPU has read the data that was previously placed in those locations. The DMA determines that the CPU has read certain data by the value that the CPU writes into the Stop register.

Once the data of a frame is read by the CPU, the memory location it occupies becomes available for other incoming frames. The Stop register prevents the DMA from over-writing data that has not yet been read by the CPU. After the CPU has read a frame from memory it must update the Stop register to point to the location that was last read. The DMA does not deposit data into any location beyond that pointed to by the Stop register.

Once the DMA detects that it has reached the address pointed to by the Stop register, the DMA channel is masked off and an overrun is likely to occur.

The CPU can only program the Stop registers with doubleword addresses; the two least significant bits of address are not stored. Also, the stop registers store values to compare against A<23:2> only, so the size of the ring buffer is limited to 16 megabytes.
Diagram of a Ring Buffer Data Structure
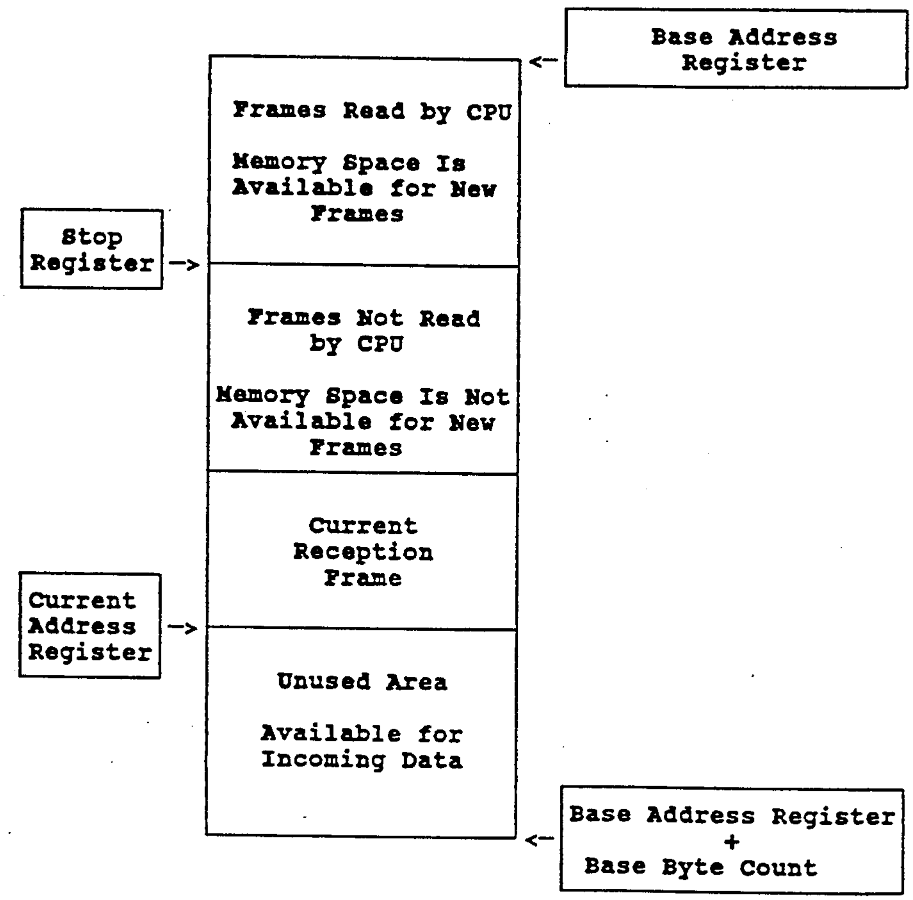

3.1.8 Software Commands

The following three software commands can be executed while the DMA controller is in Slave Condition. The commands are executed by performing an I/O write to the command's I/O port address. The value written is ignored. The software commands are:

Clear Byte Pointer-Write Only
Channels 0-3 - Port 000Ch
Channels 4-7 - Port 00D8h

The Clear Byte Pointer command clears the internal latch used to address the upper or lower byte of the 16-bit address and Word Count registers. The latch is also cleared at power-on and by a DMA controller Master Clear command. The CPU may read or write a 16-bit DMA controller register by performing two consecutive accesses. The Clear Byte Pointer command precedes the first access. The first I/O write to a register port loads the least significant byte, and the second access automatically accesses the most significant byte.

Master Clear-Write Only
Channels 0-3 - Port 000Dh
Channels 4-7 - Port 00DAh

The Master Clear instruction clears the Command, Status, and Request registers, sets the Mask register to disable DMA requests, and executes a Clear Byte Pointer command. Any operation in progress in the affected channels is aborted.

Clear Mask Register-Write Only
Channels 0-3 - Port 000Eh
Channels 4-7 - Port 00DCh

The Clear Mask register command enables all four DMA channels by clearing the mask bits.

3.1.9 DMA Controller Register Descriptions

3.1.9.1 DMA Extended Mode Register

The Extended Mode register is used to program the DMA device data size and timing mode. The register assumes default value after power-on reset. The DMA master clear command does not reset this register.

The DMA controller can be programmed for 8-, 16- or 32-BIT DMA device data size. Channels 0-3 default to the ISA compatible mode, "8-bit I/O, count by bytes" and channels 5-7 default to the ISA compatible mode, "16-bit I/O, count by words (address shifted)."

The following table lists each of the DMA device transfer sizes. The column labeled "Word Count register" indicates that the register contents represents either the number of bytes to transfer (bytes) or the number of 16-bit words to transfer (words). The column labeled "Current Address Register Increment" indicates the number added to the Current Address register after each DMA transfer cycle.

In "16-bit I/O, Count by Words (address shifted)" mode, the address bus, which contains a byte address, increments by two for each DMA transfer. The Current Address register contains a word address, consequently it increments by one.

| DMA Device Data Size Count by Byte/Word | Word Count Register | Current Address Register Increment |
|---|---|---|
| 8-bit I/O, count by bytes | bytes | 1 |
| 16-bit I/O, count by words (address shifted) | words | 1 |
| 16-bit I/O, count by bytes | bytes | 2 |
| 32-bit I/O, count by bytes | bytes | 4 |

The DMA controller can be programmed for one of four cycle timing modes to transfer data between the DMA device and memory: ISA compatible cycles, Type "A" cycles, Type "B" cycles, or Burst DMA cycles.

The DMA timing mode defaults to ISA Compatible timing. The device driver for an expansion board that supports Type "A," Type "B," or Burst DMA timing should initialize the DMA controller for the fastest timing mode supported by the DMA device, without regard to the memory slave being accessed. The system board automatically determines the transfer rate supported by the memory slave and adjusts the cycle control appropriately.

A DMA device that uses ISA compatible timing should not be programmed for BLOCK mode and should not be programmed for DEMAND mode unless the device releases the bus periodically to allow other devices to use the bus. It is possible to lock out other devices (including refresh) if the transfer count is programmed to a large number. BLOCK and DEMAND mode can effectively be used with Type "A," Type "B" or Burst DMA (Type "C") timing since the channel can be interrupted while other devices use the bus.

The T-C line is programmable for two purposes. In the (default) output mode, T-C signals terminal count from the DMA channel. In the input mode, T-C is used by the DMA device to terminate a transfer (EOP or End of Process).

The last function programmable through the DMA Extended Mode register is the "Stop register enable." This bit is used to control the Stop register function and defaults to disabled.

DMA Extended Mode Register - Write Only
Channels 0-3 - Port 040Bh
Channels 4-7 - Port 04D6h

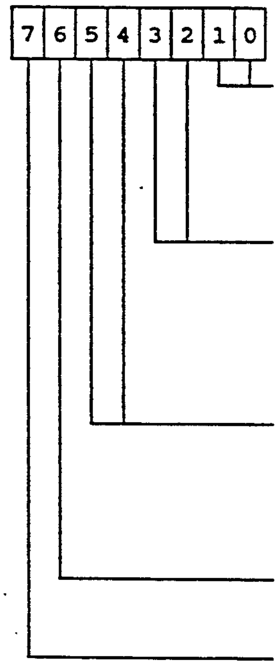

DMA Channel Select
- 00 Channel 0 (4) select
- 01 Channel 1 (5) select
- 10 Channel 2 (6) select
- 11 Channel 3 (7) select Addressing Mode
- 00 8-bit I/O, count by bytes
- 01 16-bit I/O, count by words (address shifted)
- 10 32-bit I/O, count by bytes
- 11 16-bit I/O, count by bytes DMA Cycle Timing Mode
- 00 ISA Compatible timing
- 01 Type "A" timing mode
- 10 Type "B" timing mode
- 11 Burst DMA (Type "C") timing mode

- 0 T-C is an output for this channel
- 1 T-C is an input for this channel

- 0 Stop register enabled
- 1 Stop register disabled

3.1.9.2 Chaining Mode Register

The Chaining Mode register pair can be used to enable or disable DMA buffer chaining and indicate when the DMA Base registers are being programmed.

Software initializes the DMA controller for buffer chaining by writing the first buffer address to the Base registers, then setting the chaining mode to "enable." (The DMA channel must not be in Auto initialize mode.) The DMA controller then loads the Current registers. Software then loads the second buffer address into the Base registers and sets the chaining mode to "programming complete, begin chaining" to start the actual DMA transfer.

Software can set the Chaining mode to "Disable" to terminate chaining mode and return to the "normal" mode. The DMA controller may also disable Chaining after abnormally terminating a chaining operation. The default values for channels 0-7 are Disable Chaining mode. Chaining mode must be explicitly disabled by software, it is not cleared except by a reset or master clear.

See the "Buffer Chaining" section for more information about the use of this register.

Chaining Mode Register - Read/Write
Channels 0-3 - Port 040Ah
Channels 4-7 - Port 04D4h

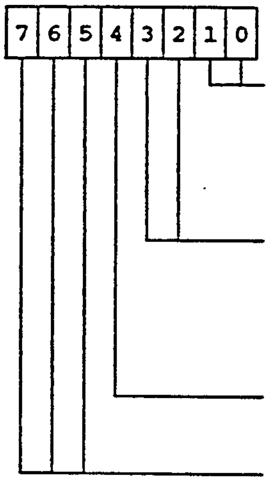

DMA Channel Select
00 Channel 0 (4) select
01 Channel 1 (5) select
10 Channel 2 (6) select
11 Channel 3 (7) select Enable/Disable Buffer Chaining Mode
00 Disable chaining mode
01 Enable chaining mode for programming
10 Illegal
11 Programming complete, begin chaining 0 IRQ 13
1 Generate T-C Reserved (set to 0)

The following sequence illustrates use of the Chaining Mode register:

1. The Base Address and Base Word Count register are loaded with the address and count for the first buffer to be transferred.

2. The enable chaining mode bits for the appropriate channel are set to "01," causing the Base Address and Base Count registers to load into the Current Address and Current Word Count registers.

3. The second buffer's address and word count are loaded into the Base Address and Base Count registers.

4. The enable chaining mode bits for the appropriate channel (bits 2, 3) are set to "11" to begin the chaining sequence.

5. When a chaining mode interrupt occurs, indicating completion of a buffer transfer, the Base Address and Base Word Count registers are loaded with the address and count for the next buffer to be transferred.

6. The "enable chaining mode" bits for the appropriate channel are set to "11" to prepare for the next transfer and to clear the interrupt.

3.1.9.3 Chaining Mode Status Register

Software can determine if chaining mode is enabled or disabled by reading the Chaining Mode Status register. The bit is set if the channel is enabled for chaining mode. The bit is clear if the channel is not enabled for chaining mode. The register is cleared by a power-on reset.

Chaining Mode Status Register - Read Only
Port 04D4h

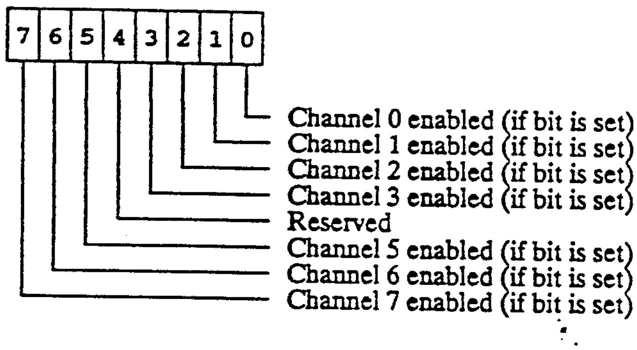

3.1.9.4 Channel Interrupt Status Register

The "Channel Interrupt Status" register indicates a pending IRQ13 caused by the DMA controller. The DMA controller asserts IRQ13 after reaching terminal count, with chaining mode enabled. It does not assert IRQ13 during the initial programming sequence that loads the base registers twice. The default value for all channels is no interrupt pending.

The appropriate bit in the interrupt latch is automatically cleared when the "chaining mode enabled" bits are set to "11" or when cleared to "00."

Channel Interrupt Status Register - Read Only
Port 040Ah

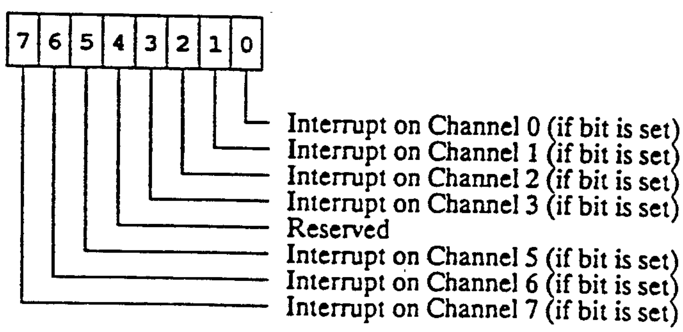

3.1.9.5 Address and Word Count Registers

3.1.9.5.1 Base Word Count Register

Each DMA channel has a write-only, 24-bit Base Word Count register that stores the programmed word count value. The DMA controller performs one transfer in addition to the programmed number of transfers.

The Base Word Count register consists of two parts, the 16-bit 8237 compatible segment, and the 8-bit high word count segment. The two segments are mapped at different I/O addresses and must be programmed separately. The main CPU programs the 8237 compatible segment by executing the Clear Byte Pointer command, then performing two consecutive 8-bit I/O writes to the appropriate address. The main CPU programs the high word count segment by performing an 8-bit I/O write to the appropriate address.

The Base High Word Count Segment must be programmed after the Base Word Count 8237 Compatible Segment. Any I/O write to the Base Word Count 8237 Compatible Segment sets the Base High Word Count Segment (and Current High Word Count Segment) to zero.

Base Word Count Register Segments (Write Only)

| DMA Channel | I/O address 8237 Compatible Segment 16-bits | I/O address High Word Count Segment 8-bits |
|---|---|---|
| 0 | 0001h | 0401h |
| 1 | 0003h | 0403h |
| 2 | 0005h | 0405h |
| 3 | 0007h | 0407h |
| 5 | 00C6h | 04C6h |
| 6 | 00CAh | 04CAh |
| 7 | 00CEh | 04CEh |

3.1.9.5.2 Current Word Count Register

Each DMA channel has a read-only, 24-bit Current Word Count register. The DMA controller decrements the word count after each transfer. The intermediate value of the word count is stored in the Current Word Count register during the transfer. The DMA controller generates terminal count and stops decrementing when the Current Word Count register "rolls over" (decrements from FFFFFFh). The Current Word Count register then contains FFFFFFh until reloaded.

The Current Word Count register consists of two parts, the 16-bit 8237 compatible segment, and the 8-bit high word count segment. The two segments are mapped at different I/O addresses and must be read separately. The main CPU reads the 8237 compatible segment by executing the Clear Byte Pointer command, then performing two consecutive 8-bit I/O reads from the appropriate address. The main CPU reads the high word count segment by performing an 8-bit I/O read from the appropriate address.

Each Current Word Count register segment is automatically loaded simultaneously with the respective Base Word Count register when not in Chaining mode.

Autoinitialize causes both Current Word Count register segments to load from the respective Base Word Count register segments.

Current Word Count Register Segments (Read Only)

| DMA Channel | I/O Address 8237 Compatible Segment 16-bits | I/O Address High Word Count Segment 8-bits |
|---|---|---|
| 0 | 0001h | 0401h |
| 1 | 0003h | 0403h |
| 2 | 0005h | 0405h |
| 3 | 0007h | 0407h |
| 5 | 00C6h | 04C6h |
| 6 | 00CAh | 04CAh |
| 7 | 00CEh | 04CEh |

3.1.9.5.3 Base Address Register

Each DMA channel has a 32-bit write-only Base Address register that is programmed with the base address for DMA transfers. The Base Address register does not increment or decrement. The 32-bit Base Address register consists of a 16-bit register (low address word), an 8-bit low page register (second highest address byte) and an 8-bit high page register (high address byte). Each register segment is mapped at a different I/O address and must be programmed separately.

Base Address (8237 Compatible Segment)

The Base Address register includes a 16-bit 8237 compatible segment. The 8237 compatible segment combines with the low page segment and high page segment to provide the low address word of the 24-bit ISA compatible DMA address or the 32-bit EISA DMA address.

The main CPU programs the 8237 compatible segment by executing the Clear Byte Pointer command, then performing two consecutive 8-bit I/O writes to the appropriate address.

Base Address (Low Page Segment)

The 8-bit low page segment of the Base Address register combines with the 8237 compatible segment to provide the high byte of the 24-bit ISA compatible DMA address space. The low page segment combines with the high page segment to provide the second-most-significant-byte of the 32-bit EISA DMA address.

The main CPU programs the low page segment by performing an 8-bit I/O write to the appropriate address.

Base Address (High Page Segment)

The 8-bit high page segment of the Base Address register combines with the ISA compatible segments to provide the high byte of the 32-bit EISA DMA address.

The main CPU programs the high page segment by performing an 8-bit I/O write to the appropriate address. The high page segment must be programmed after the low page segment and 8237 compatible segment. Any write to the low page segment or 8237 compatible segment clears the high page segment.

Base Address Register Segments (Write Only)

| DMA Channel | I/O address 8237 Compatible Segment 16 bits | I/O address Low Page Segment 8 bits | I/O address High Page Segment 8 bits |
|---|---|---|---|
| 0 | 0000h | 0087h | 0487h |
| 1 | 0004h | 0083h | 0483h |
| 2 | 0008h | 0081h | 0481h |
| 3 | 000Ch | 0082h | 0482h |
| 5 | 00C4h | 008Bh | 048Bh |
| 6 | 00C8h | 0089h | 0489h |
| 7 | 00CCh | 008Ah | 048Ah |

3.1.9.5.4 Current Address Register

Each DMA channel has a 32-bit read-only Current Address register. The DMA controller automatically increments or decrements the address after each transfer; the intermediate values of the address are stored in the Current Address register during the transfer. The 32-bit Current Address register consists of a 16-bit register (low address word), an 8-bit low page register (second highest address byte) and an 8-bit high page register (high address byte). Each register segment is mapped at a different I/O address and must be read separately.

Each Current Address register segment is automatically loaded simultaneously with the respective Base Address register segment (unless chaining mode is enabled).

Auto initialize causes all current address register segments to load from the respective base address register segments.

Current Address (8237 Compatible Segment)

The Current Address register includes a 16-bit 8237 compatible segment. The 8237 compatible segment combines with the low page segment and high page segment to provide the low address word of the 24-bit ISA compatible DMA address or the 32-bit EISA DMA address.

The main CPU reads the 8237 compatible segment by executing the Clear Byte Pointer command, then performing two consecutive 8-bit I/O reads from the appropriate address.

Current Address (Low Page Segment)

The 8-bit low page segment of the Current Address register combines with the 8237 compatible segment to provide the high byte of the 24-bit ISA compatible DMA address space. The low page segment combines with the high page segment to provide the second-most-significant-byte of the 32-bit EISA DMA address.

The main CPU reads the low page segment by performing an 8-bit I/O read from the appropriate address.

Current Address (High Page Segment)

The 8-bit high page segment of the Current Address register combines with the ISA compatible segments to provide the high byte of the 32-bit EISA DMA address.

The main CPU reads the high page segment by performing an 8-bit I/O read from the appropriate address.

Current Address Register Segments (Read Only)

| DMA Channel | I/O address 8237 Compatible Segment 16 bits | I/O address Low Page Segment 8 bits | I/O address High Page Segment 8 bits |
|---|---|---|---|
| 0 | 0000h | 0087h | 0487h |
| 1 | 0004h | 0083h | 0483h |
| 2 | 0008h | 0081h | 0481h |
| 3 | 000Ch | 0082h | 0482h |
| 5 | 00C4h | 008Bh | 048Bh |
| 6 | 00C8h | 0089h | 0489h |
| 7 | 00CCh | 008Ah | 048Ah |

3.1.9.5.5 Address and Word Count Programming

ISA Compatible Addressing and Word Count

Any I/O write to the Base Address low page segment or 8237 Compatible Segment sets the Base Address high page segment to address zero and causes that DMA channel to use ISA compatible addressing.

Any I/O write to the Base Word Count 8237 compatible segment sets the Base Word Count high segment (and Current Word Count high segment ) to zero for ISA compatibility.

32-bit Addressing and Word Count

An I/O write to the Base Address high page segment puts the DMA channel into enhanced addressing mode and causes the Current Address register to function as a 32-bit up/down counter. The high and low page registers increment (or decrement) automatically, without software assistance. The Base Address high page segment must be programmed last to cause 32-bit addressing. Any I/O write to the Base Address low page segment or 8237 compatible segment causes the DMA channel to use ISA compatible DMA addressing.

The Base Word Count high segment must be programmed after the Base Word Count 8237 Compatible segment. Any I/O write to the Base Word Count 8237 compatible segment sets the Base Word Count high segment (and Current Word Count high segment) to zero.

"8-bit I/O, Count By Byte" Mode
(ISA Compatible)

The Base Address register can be programmed to any byte address if the Extended Mode register is set for "8-bit I/O, Count by Byte" mode. The low and high page segments act like direct extensions of the address counter. The high page segment should be programmed with address bits corresponding to LA<31:24> (not inverted). The low page segment should be programmed with address bits corresponding to LA<23:16>. The 8237 compatible segment should be programmed with address bits corresponding to SA<15:0>. The Base Word Count register should be programmed with the number of bytes to transfer minus one. For example:

Physical memory address for transfer: 12345678h
- Bytes to transfer: 80h
- High Page segment contents = 12h
- Low Page segment contents = 34h
- Base Address register = 5678h
  - (perform two sequential writes: 78h, then 56h)
- Base Word Count register = 7Fh

"16-bit I/O, Count By Word (Address Shifted)" Mode
(ISA Compatible)

The Base Address register must be programmed to an even address if the Extended Mode register is set for "16-bit I/O, Count by Word (address shifted)" mode. The 17 low-order address bits must be shifted right by one bit (the LSB is ignored) before loading into the Base Address 8237 compatible segment. The high page segment should be programmed with address bits corresponding to LA<31:24> (not inverted). The most significant seven bits of the low page segment should be programmed with address bits corresponding to LA<23:17> and the LSB of the low page segment should be programmed with a "0". The 8237 compatible segment should be programmed with address bits corresponding to SA<16:1>. SA<0> is not used since the address bus increments by two and the transfer is always to or from an even address. The Base Word Count register should be programmed with the number of 16-bit words to transfer minus one. For example:

Physical memory address for transfer: 87654320h
Bytes to transfer: 80h
16-bit words to transfer: 40h
High Page segment contents = 87h
Low Page segment contents = 64h
Base Address register = A190h
(perform two sequential writes: 90h, then A1h)
Base Word Count register = 3Fh

"16-bit I/O, Count By Byte" Mode

The Base Address register can be programmed to any byte address if the Extended Mode register is set for "16-bit I/O, Count by Byte" mode. The high page segment should be programmed with address bits corresponding to LA<31:24> (not inverted). The low page segment should be programmed with address bits corresponding to LA<23:16>. The 8237 compatible segment should be programmed with address bits corresponding to SA<15:0>. The Base Word Count register should be programmed with the number of 16-bit bytes to transfer minus one.

Note that most DMA devices require the address to be aligned on a dword boundary. If programmed to a misaligned address, the DMA controller transfers a partial dword only on the first and last transfer. For example:

Physical memory address for transfer: 12345678h
Bytes to transfer: 80h
High Page segment contents = 12h
Low Page segment contents = 34h
Base Address register = 5678h
(perform two sequential writes: 78h, then 56h)
Base Word Count register = 7Fh

"32-bit I/O, Count By Byte" Mode

The Base Address register can be programmed to any byte address if the Extended Mode register is set for "32-bit I/O, Count by Byte" mode. (Note that most DMA devices require the address to be aligned on a dword boundary.) The high page segment should be programmed with address bits corresponding to LA<31:24> (not inverted). The low page segment should be programmed with address bits corresponding to LA<23:16>. The 8237 compatible segment should be programmed with address bits corresponding to SA<15:0>. The Base Word Count register should be programmed with the number of bytes to transfer minus one.

Note that most DMA devices require the address to be aligned on a dword boundary. If programmed to a misaligned address, the DMA controller transfers a partial dword only on the first and last transfers. For example:

Physical memory address for transfer: 12345678h
  Bytes to transfer: 80h
  High Page segment Contents = 12h
  Low Page segment Contents = 34h
  Base Address register = 5678h
    (perform two sequential writes: 78h, then 56h)
  Base Word Count register = 7Fh

3.1.9.6 DMA Command Register

The DMA Command register can be programmed by software to initialize the DRQ<x> and DAK*<x> logic levels to active high or low, and initialize the channel group arbitration priority scheme for fixed or rotating. Software can also enable or disable the DMA channel group by setting or clearing bit 2 of the Command register. Disabling channels 4-7 also disables channels 0-3, since channels 0-3 are cascaded into channel 4. The Command Registers can be cleared by power-on reset and by the Master Clear instruction.

DMA Command Register - Write Only
Channels 0-3 - Port 0008h
Channels 4-7 - Port 00D0h

| 7 | 6 | 5 | 4 | 3 | 2 | 1 | 0 |
|---|---|---|---|---|---|---|---|

- Bit 0: Reserved (0)
- Bit 1: Reserved (0)
- Bit 2: DMA Channel Select
  - 0 Channels 0-3 (4-7) enable
  - 1 Channels 0-3 (4-7) disable
- Bit 3: Reserved (0)
- Bit 4: Arbitration Priority
  - 0 Fixed priority
  - 1 Rotating priority
- Bit 5: Reserved (0)
- Bit 6: DRQ Sense Assert Level
  - 0 DRQ<3:0> (<7:5>) sense asserted high
  - 1 DRQ<3:0> (<7:5>) sense asserted low
- Bit 7: DAK* Assert Level
  - 0 DAK*<3:0> (<7:5>) assert low
  - 1 DAK*<3:0> (<7:5>) assert high

3.1.9.7 Mode Register

Each DMA channel has a 6-bit Mode register. The Mode registers are programmed by setting bits 0 and 1 for the appropriate channel, then writing to the Mode register port address. The channel's Mode register latches the six mode bits (based on the value of bits 0 and 1).

Mode Register - Write Only
Channels 0-3 - Port 000Bh
Channels 4-7 - Port 00D6h

| 7 | 6 | 5 | 4 | 3 | 2 | 1 | 0 |
|---|---|---|---|---|---|---|---|

Bits 1-0: DMA Channel Select
- 00 Channel 0 select
- 01 Channel 1 select
- 10 Channel 2 select
- 11 Channel 3 select Bits 3-2: Data Transfer Type
- 00 Verify transfer
- 01 Write transfer
- 10 Read transfer
- 11 Illegal Bit 4:
- 0 Disable Auto initialization
- 1 Enable Auto initialization Bit 5:
- 0 Address increment select
- 1 Address decrement select Bits 7-6: DMA Channel Mode Select
- 00 Demand mode select
- 01 Single mode select
- 10 Block mode select
- 11 Cascade mode select Note: Channel 4 must be programmed for cascade mode. All other modes are disallowed.

Note: The address decrement mode only applies to "8-bit I/O, Count by Byte" mode and "16-bit I/O, Count by Word (address shifted)" mode. Results in other modes are undefined.

3.1.9.8 Request Register

Software can initiate a DMA service request by setting any DMA channel's Request register bit. The DMA controller responds to the software request as though DRQ<x> is asserted. The request bits are not maskable. Any channel's request bit can be set or cleared under software control. The DMA controller automatically clears a channel's request bit after the channel's Current Word Count register reaches terminal count or an external EOP is received. A DMA channel must be in Block Mode before a service request can be initiated by software. The Request register is cleared by power-on reset.

Request Register - Write Only
Channels 0-3 - Port 0009h
Channels 4-7 - Port 00D2h

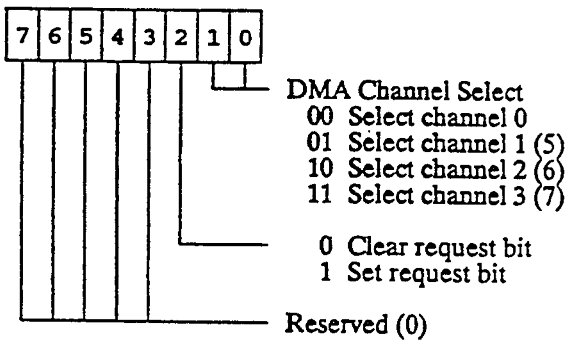

3.1.9.9 Mask Registers

Each channel has a mask bit that, when set, disables a DMA service request caused by an asserted DRQ<x>. A channel's mask bit is automatically set when the Current Word Count register reaches terminal count (unless the channel is programmed for auto initialization or chaining mode). Any channel's mask bit can be set or cleared under software control. Power-on reset disables all DMA channels by setting the Mask register bits. A Clear Mask register command enables the four DMA channels.

Note: If channel 4 mask bit is set, then channels 0-3 are masked off. This is because channels 0-3 are cascaded into channel 4.

Write Single Mask Bit

This register can be used to set or clear any mask register bit.

Write Single Mask Bit - Write Only
Channels 0-3 - Port 000Ah
Channels 4-7 - Port 00D4h

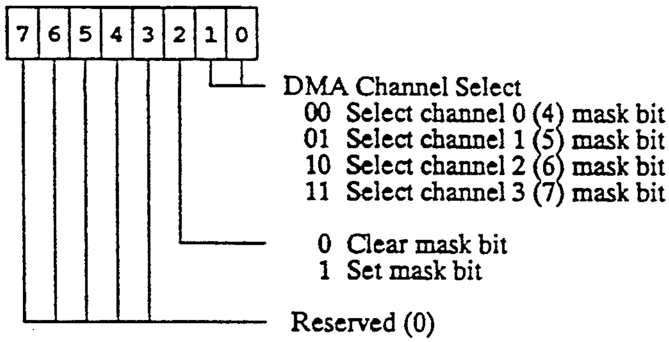

Write All Mask Bits/Mask Status Register

This register can be used to write or read all four bits of the Mask register with a single command.

Write All Mask Bits/Mask Status Register - Read/Write
Channels 0-3 - Port 000Fh
Channels 4-7 - Port 00DEh

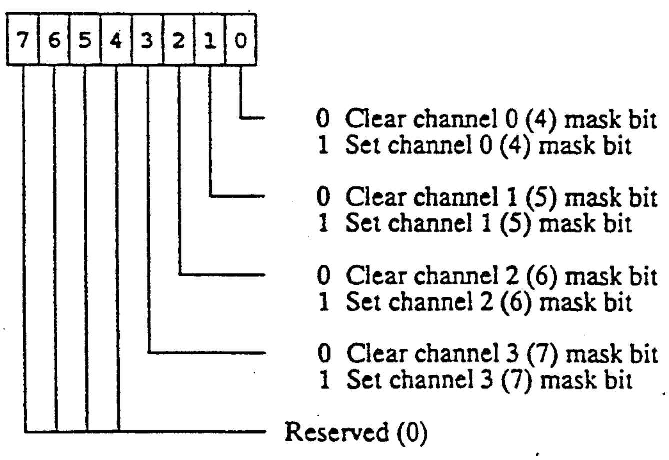

3.1.9.10 DMA Status Register

The DMA Status register contains status information about the DMA channels that can be read by the CPU. This information identifies channels that reached a terminal count and channels that have pending DMA requests. Bits 0-3 are set every time terminal count is reached by the corresponding channel. These bits are cleared upon power-on and on each Status Read. Bits 4-7 are set whenever their corresponding channel is requesting service.

DMA Status Register - Read Only
Channels 0-3 - Port 0008h
Channels 4-7 - Port 00D0h

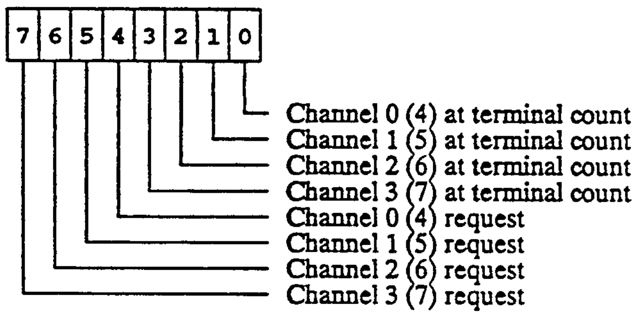

The following table shows the results of reaching DMA terminal count or an external EOP (End of Process). If the Stop register limit is reached, the mask is set and other conditions are unchanged.

| Program Mode | Status Terminal Count | DMA Mask bit | Software Request bit | Current Registers |
|---|---|---|---|---|
| Normal | set | set | clear | no change |
| Autoinit | set | clear | clear | reload |
| Chaining (normal) | clear | clear | clear | reload |
| Chaining (over-run) | ???? | set | clear | ???? |

3.1.10 Supported DMA Transfer Combinations

The following tables indicate the legal DMA transfer modes. The notes apply to all the tables.

Note 1: The system board does not perform data size translation for any DMA transfers that use ISA compatible DMA timing, including when performing 16-bit transfers to 8-bit memory.

Note 2: The system board performs data size translation for Type "A" and Type "B" DMA cycles. The system board can use direct transfer or byte lane copying for DMA operations between the DMA device and memory with a word width equal to or larger than the DMA device. Transfers between a DMA device and memory with a smaller width than the DMA device require data size translation by the system board. For memory writes (I/O reads), the system board causes the DMA device to float its data lines by negating IORC*. For memory reads (I/O writes), the system board holds IOWC* asserted until the translation completes, then negates IOWC* so the DMA device can sample the data on the trailing edge.

Note 3: The system board performs data size translation for Burst DMA cycles. The system board can use direct transfer or byte lane copying for DMA operations between the DMA device and burst memory with a word width equal to or larger than the DMA device. Transfers between a DMA device and memory with a smaller width than the DMA device require data size translation by the system board. For memory writes (I/O reads), the system board causes the DMA device to float its data lines by negating IORC*. For memory reads (I/O writes), the system board holds IOWC* only at the end of the translation. Transfers between a DMA device and memory that does not support Burst DMA cycles reverts to Standard EISA memory cycles.

General Note: 16sh indicates an ISA compatible addressing type with a 16-bit data size and shifted address. The DMA address register is shifted left one bit and executed as a word address (ISA compatible), consequently, misaligned transfers cannot be performed. EISA 16-bit data size does not require the address shift, and can support misaligned transfers if the DMA device performs the byte alignment.

DMA Transfer Combinations

| Transfer Type | DMA Mode | Timing Type | Data Size | Mem Bus | Notes |
|---|---|---|---|---|---|
| na | Cascade | na | na | ISA | |
| Verify | Single | Compatible | 8 | ISA | Note 1 |
| Verify | Single | Compatible | 16sh | ISA | Note 1 |
| Verify | Single | Type 'A' | 8 | EISA | Note 2 |
| Verify | Single | Type 'A' | 16sh | EISA | Note 2 |
| Verify | Single | Type 'B' | 8 | EISA | Note 2 |
| Verify | Single | Type 'B' | 16sh | EISA | Note 2 |
| Verify | Demand | Compatible | 8 | ISA | Note 1 |
| Verify | Demand | Compatible | 16sh | ISA | Note 1 |
| Verify | Demand | Type 'A' | 8 | EISA | Note 2 |
| Verify | Demand | Type 'A' | 16sh | EISA | Note 2 |
| Verify | Demand | Type 'B' | 8 | EISA | Note 2 |
| Verify | Demand | Type 'B' | 16sh | EISA | Note 2 |
| Verify | Block | Compatible | 8 | ISA | Note 1 |
| Verify | Block | Compatible | 16sh | ISA | Note 1 |
| Verify | Block | Type 'A' | 8 | EISA | Note 2 |
| Verify | Block | Type 'A' | 16sh | EISA | Note 2 |
| Verify | Block | Type 'B' | 8 | EISA | Note 2 |
| Verify | Block | Type 'B' | 16sh | EISA | Note 2 |

DMA Transfer Combinations (Read)

| Transfer Type | DMA Mode | Timing Type | Data Size | Mem Bus | Notes |
|---|---|---|---|---|---|
| Read | Single | Compatible | 8 | ISA | Note 1 |
| Read | Single | Compatible | 16sh | ISA | Note 1 |
| Read | Single | Type 'A' | 8 | EISA | Note 2 |
| Read | Single | Type 'A' | 16sh | EISA | Note 2 |
| Read | Single | Type 'A' | 32 | EISA | Note 2 |
| Read | Single | Type 'A' | 16 | EISA | Note 2 |
| Read | Single | Type 'B' | 8 | EISA | Note 2 |
| Read | Single | Type 'B' | 16sh | EISA | Note 2 |
| Read | Single | Type 'B' | 32 | EISA | Note 2 |
| Read | Single | Type 'B' | 16 | EISA | Note 2 |
| Read | Demand | Compatible | 8 | ISA | Note 1 |
| Read | Demand | Compatible | 16sh | ISA | Note 1 |
| Read | Demand | Type 'A' | 8 | EISA | Note 2 |
| Read | Demand | Type 'A' | 16sh | EISA | Note 2 |
| Read | Demand | Type 'A' | 32 | EISA | Note 2 |
| Read | Demand | Type 'A' | 16 | EISA | Note 2 |
| Read | Demand | Type 'B' | 8 | EISA | Note 2 |
| Read | Demand | Type 'B' | 16sh | EISA | Note 2 |
| Read | Demand | Type 'B' | 32 | EISA | Note 2 |
| Read | Demand | Type 'B' | 16 | EISA | Note 2 |
| Read | Demand | Burst DMA | 8 | EISA | Note 3 |
| Read | Demand | Burst DMA | 16 | EISA | Note 3 |
| Read | Demand | Burst DMA | 32 | EISA | Note 3 |
| Read | Block | Compatible | 8 | ISA | Note 1 |
| Read | Block | Compatible | 16sh | ISA | Note 1 |
| Read | Block | Type 'A' | 8 | EISA | Note 2 |
| Read | Block | Type 'A' | 16sh | EISA | Note 2 |
| Read | Block | Type 'A' | 32 | EISA | Note 2 |
| Read | Block | Type 'A' | 16 | EISA | Note 2 |
| Read | Block | Type 'B' | 8 | EISA | Note 2 |
| Read | Block | Type 'B' | 16sh | EISA | Note 2 |
| Read | Block | Type 'B' | 32 | EISA | Note 2 |
| Read | Block | Type 'B' | 16 | EISA | Note 2 |
| Read | Block | Burst DMA | 8 | EISA | Note 3 |
| Read | Block | Burst DMA | 16 | EISA | Note 3 |
| Read | Block | Burst DMA | 32 | EISA | Note 3 |

DMA Transfer Combinations (Write)

| Transfer Type | DMA Mode | Timing Type | Data Size | Mem Bus | Notes |
|---|---|---|---|---|---|
| Write | Single | Compatible | 8 | ISA | Note 1 |
| Write | Single | Compatible | 16sh | ISA | Note 1 |
| Write | Single | Type 'A' | 8 | EISA | Note 2 |
| Write | Single | Type 'A' | 16sh | EISA | Note 2 |
| Write | Single | Type 'A' | 32 | EISA | Note 2 |
| Write | Single | Type 'A' | 16 | EISA | Note 2 |
| Write | Single | Type 'B' | 8 | EISA | Note 2 |
| Write | Single | Type 'B' | 16sh | EISA | Note 2 |
| Write | Single | Type 'B' | 32 | EISA | Note 2 |
| Write | Single | Type 'B' | 16 | EISA | Note 2 |
| Write | Demand | Compatible | 8 | ISA | Note 1 |
| Write | Demand | Compatible | 16sh | ISA | Note 1 |
| Write | Demand | Type 'A' | 8 | EISA | Note 2 |
| Write | Demand | Type 'A' | 16sh | EISA | Note 2 |
| Write | Demand | Type 'A' | 32 | EISA | Note 2 |
| Write | Demand | Type 'A' | 16 | EISA | Note 2 |
| Write | Demand | Type 'B' | 8 | EISA | Note 2 |
| Write | Demand | Type 'B' | 16sh | EISA | Note 2 |
| Write | Demand | Type 'B' | 32 | EISA | Note 2 |
| Write | Demand | Type 'B' | 16 | EISA | Note 2 |
| Write | Demand | Burst DMA | 8 | EISA | Note 3 |
| Write | Demand | Burst DMA | 16sh | EISA | Note 3 |
| Write | Demand | Burst DMA | 32 | EISA | Note 3 |
| Write | Block | Compatible | 8 | ISA | Note 1 |
| Write | Block | Compatible | 16sh | ISA | Note 1 |
| Write | Block | Type 'A' | 8 | EISA | Note 1 |
| Write | Block | Type 'A' | 16sh | EISA | Note 1 |
| Write | Block | Type 'A' | 32 | EISA | Note 2 |
| Write | Block | Type 'A' | 16 | EISA | Note 2 |
| Write | Block | Type 'B' | 8 | EISA | Note 1 |
| Write | Block | Type 'B' | 16sh | EISA | Note 1 |
| Write | Block | Type 'B' | 32 | EISA | Note 2 |
| Write | Block | Type 'B' | 16 | EISA | Note 2 |
| Write | Block | Burst DMA | 8 | EISA | Note 3 |
| Write | Block | Burst DMA | 16sh | EISA | Note 3 |
| Write | Block | Burst DMA | 32 | EISA | Note 3 |

3.2 Interrupt Controller

EISA systems provide an ISA compatible interrupt controller with the EISA enhancement. Interrupts can be set as edge sensitive or level sensitive. The EISA interrupt controller incorporates the functionality of two 8259 interrupt controllers. A total of 15 interrupts are available, not including IRQ2 (on the master interrupt controller), which is used to cascade interrupts from the slave interrupt controller.

The EISA master interrupt controller (INT-1) provides IRQ<7:0> and the slave interrupt controller (INT-2) provides IRQ<15:8>. The INT-2 interrupt output is connected to IRQ2 of INT-1 . The interrupts have the following priority arrangement (highest priority to lowest): IRQ0, IRQ1, IRQ8, IRQ9, IRQ10, IRQ11, IRQ12, IRQ13, IRQ14, IRQ15, IRQ3, IRQ4, IRQ5, IRQ6, IRQ7.

3.2.1 Interrupt Controller I/O Address Map

The following table shows the I/O port address map for interrupt registers:

| Interrupt Block | I/O Address | # of Bits | Interrupt Controller Register |
|---|---|---|---|
| IRQ<7:0> | 0020h | 8 | INT-1 Base Address |
| IRQ<7:0> | 0021h | 8 | INT-1 Mask register |
| IRQ<7:0> | 04D0h | 8 | INT-1 Edge/Level register |
| IRQ<15:8> | 00A0h | 8 | INT-2 Base Address |
| IRQ<15:8> | 00A1h | 8 | INT-2 Mask register |
| IRQ<15:8> | 04D1h | 8 | INT-2 Edge/Level register |

3.2.2 Interrupt Sequence

The following shows the interrupt sequence for an 80x86-type system. (An EISA interrupt controller must never be programmed to the 8259's 8080 mode.)

1. One or more IRQ<15:0> lines are asserted, setting the corresponding Interrupt Request register bit.
2. The interrupt controller evaluates the requests and interrupts the CPU.
3. The CPU acknowledges the interrupt and responds with an interrupt acknowledge cycle (see the CPU data sheet for a description of the CPU's interrupt acknowledge cycle).
4. During the interrupt acknowledge cycle, the interrupt controller sets the highest priority In-Service register bit and clears the corresponding Interrupt Request register bit. INT-1 presents the ID of the interrupt controller requesting service (the highest priority In-Service interrupt code) to INT-2 at the end of the interrupt acknowledge cycle. Neither interrupt controller drives the data bus during this cycle.

5. The CPU initiates a second interrupt acknowledge cycle to read the interrupt vector. During this cycle, INT-1 or INT-2 presents the 8-bit interrupt vector on D<7:0>. The interrupt vector consists of the interrupt code, presented on D<2:0> and the interrupt controller vector address (INT-1 vector address is 00001b, INT-2 vector address is 01110b), presented on D<7:3>. An interrupt from the cascaded interrupt controller causes INT-2 to present the vector. Any other interrupt causes INT-1 to present the vector.

6. This completes the interrupt cycle. In the AEOI mode, the In-Service register bit is cleared at the end of the second interrupt acknowledge. Otherwise, the In-Service register bit remains set until an appropriate EOI command is issued at the end of the interrupt service routine.

The IRQx inputs must remain asserted until after the leading edge of the first interrupt acknowledge. If an IRQx input is negated before the interrupt acknowledge, the interrupt controller drives the vector for IRQ7 (IRQ15 on the cascaded interrupt controller) during the second interrupt acknowledge cycle.

3.2.3 Interrupt Controller Initialization

There are two types of command words that the CPU can use to program the EISA interrupt controller:

- Initialization Command Words
  INT-1 and INT-2 must be initialized before normal operation. Initialization is performed by programming ICW1, ICW2 and ICW3 to INT-1 and INT-2. Some configurations also require ICW4 be programmed.

- Operation Command Words
  The interrupt controller can be commanded to operate in various modes. The modes are as follows:

- Fully Nested Mode
  - Special Fully Nested Mode
  - Fixed Priority Mode
  - Rotating Priority Mode
  - Special Mask Mode
  - Polled Mode INT-1 and INT-2 are initialized separately, and can be programmed to operate in different modes. The typical power-up default settings (INT-1 INT-2) are as follows: 80x86 mode, Edge-sensitive (IRQ<15:0>), normal End-of-Interrupt, Non buffered mode, Special Fully Nested Mode disabled, fixed priority, cascade mode. INT-1 is connected as the master interrupt controller, its ICW3 = 4h, its vector address = 8h. INT-2 is connected as the slave interrupt controller, its ICW3 = 2h, its vector address = 70h.

The following table shows the typical BIOS initialization sequence for an EISA interrupt controller:

| Port | Value | Description of Operation |
|---|---|---|
| 020h | 11h | INT-1, ICW1 |
| 021h | 08h | INT-1, ICW2 vector address for 000020h |
| 021h | 04h | INT-1, ICW3 indicates slave connection |
| 021h | 01h | INT-1, ICW4 8086 mode |
| 021h | B8h | INT-1, Interrupt mask (may vary with option) |
| 04D0h | 00h | INT-1, Edge/Level Control register |
| 0A0h | 11h | INT-2, ICW1 |
| 0A1h | 70h | INT-2, ICW2 vector address for 0001C0h |
| 0A1h | 02h | INT-2, ICW3 indicates slave ID |
| 0A1h | 01h | INT-2, ICW4 8086 mode |
| 0A1h | BDh | INT-2, Interrupt mask (may vary with option) |
| 04D1h | 00h | INT-2, Edge/Level Control register |

An I/O write to the INT-1 or INT-2 base address with D<4> = "1", is interpreted as Initialization Command Word 1 (ICW1). For EISA systems, two I/O writes to "base address + 1" must follow the ICW1. The first write to "base address + 1" performs ICW2, the second write performs ICW3. A third write to "base address + 1" (if the IC4 bit is set on the ICW1) performs ICW4.

An I/O write that does not follow an ICW1 to the INT-1 or INT-2 "base address + 1" loads the Interrupt Mask register.

No Operation Command words can be written before the initialization sequence is complete.

The following flow chart illustrates the sequence software must follow to load the interrupt controller Initialization Command Words. The sequence must be executed for INT-1 and INT-2.

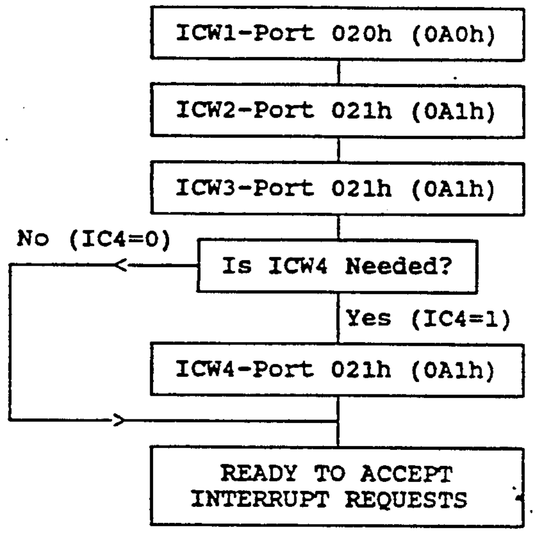

3.2.4 Initialization and Control Registers

3.2.4.1 Initialization Command Word 1 (ICW1)

An I/O write to the INT-1 or INT-2 base address with D<4> = "1", is interpreted as Initialization Command Word 1 (ICW1).

LTIM: This bit is disabled in EISA systems. Its function is replaced by the Edge/Level Control register, described elsewhere.

ADI: Ignored for EISA.

SNGL: This bit is set to "0" for EISA. It indicates that there is more than one interrupt controller in the system.

IC4: If this bit is set - ICW4 has to be read. IF ICW4 is not needed, set IC4=0.

Note that the bit description in the ICW1 diagram below applies only to ICW1. If D<4> indicates OCW2 or OCW3, the bit definitions are documented under the appropriate section.

Initialization Command Word 1
(ICW1, OCW2 and OCW3 are accessed through a common port)
INT-1 - Port 020h (program to 011h)
INT-2 - Port 0A0h (program to 011h)

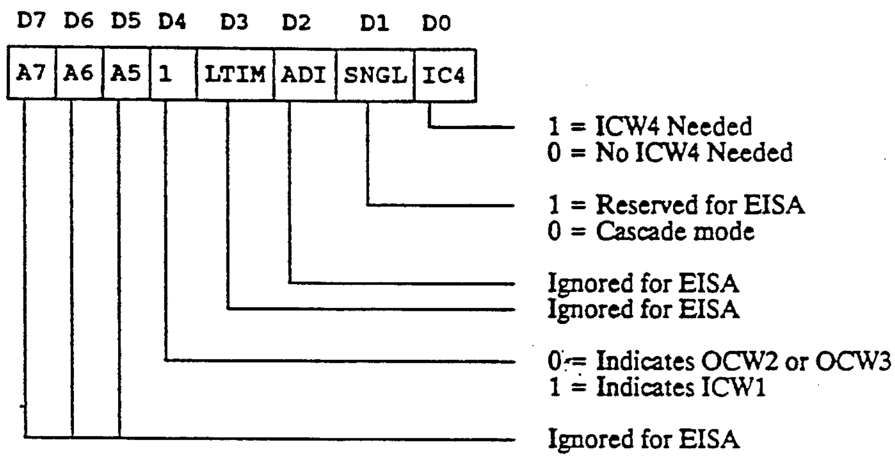

3.2.4.2 Initialization Command Word 2 (ICW2)

The first in a sequence of I/O writes (after an ICW1) to the INT-1 or INT-2 "base address + 1" is interpreted as Initialization Command Word 2 (ICW2).

ICW2 initializes the interrupt controller with the 5 most-significant bits of the interrupt vector address. INT-1 or INT-2 presents the 8-bit interrupt vector on D<7:0> during the second interrupt acknowledge cycle. The interrupt vector consists of the interrupt code, presented on D<2:0> and the interrupt vector address (INT-1 vector address is 08h, INT-2 vector address is 070h), presented on D<7:3>. An interrupt on IRQ-2 causes INT-2 to present the vector. Any other interrupt causes INT-1 to present the vector.

The CPU calculates the pointer address to the interrupt service routine by multiplying the vector by 4. The CPU then branches to and executes the interrupt service routine.

Initialization Command Word 2
INT-1 - Port 021h (program to 08h)
INT-2 - Port 0A1h (program to 070h)

| D7 | D6 | D5 | D4 | D3 | D2 | D1 | D0 |
|---|---|---|---|---|---|---|---|
| T7 | T6 | T5 | T4 | T3 | 0 | 0 | 0 |

D2–D0: Reserved for EISA (Set to 0)
D7–D3: Interrupt vector address

3.2.4.3 Initialization Command Word 3 (ICW3)

The second in a sequence of I/O writes (after an ICW1) to the INT-1 or INT-2 "base address + 1" is interpreted as Initialization Command Word 3 (ICW3). ICW3 must be programmed for INT-1 and INT-2 in EISA systems.

Initialization Command Word 3
Master Device - Port 021h (program to 04h)

For INT-1, the master interrupt controller, ICW3 is programmed to 04h. The bit corresponding to INT-2 must be set for EISA systems. An interrupt request on IRQ2 causes INT-1 to enable INT-2 to present the interrupt vector address during the second interrupt acknowledge cycle.

| D7 | D6 | D5 | D4 | D3 | D2 | D1 | D0 |
|---|---|---|---|---|---|---|---|
| 0 | 0 | 0 | 0 | 0 | 1 | 0 | 0 |

D7–D0:
1 = Interrupt Request Input has a slave
0 = Interrupt Request Input does not have a slave

Initialization Command Word 3
Slave Device - Port 0A1h (program to 02h)

For INT-2, the slave interrupt controller, ICW3 must be programmed to 02h. An interrupt request on IRQ2 causes INT-1 to enable INT-2 to present the interrupt vector address during the second interrupt acknowledge cycle.

| D7 | D6 | D5 | D4 | D3 | D2 | D1 | D0 |
|---|---|---|---|---|---|---|---|
| 0 | 0 | 0 | 0 | 0 | ID2 | ID1 | ID0 |

D2–D0: Slave ID (program to 02h)

3.2.4.4 Initialization Command Word 4 (ICW4)

The third in a sequence of I/O writes (after an ICW1) to the INT-1 or INT-2 "base address + 1" is interpreted as Initialization Command Word 4 (ICW4).

| | |
|---|---|
| SFNM: | If SFNM = 1 the special fully nested mode is programmed. |
| BUF: | Programmed to "0" for EISA. |
| M/S: | Ignored for EISA. |
| AEOI: | If AEOI=1 the automatic end-of-interrupt mode is programmed. |
| uPM: | Microprocessor mode: Programmed to "1" for EISA. |

Initialization Command Word 4
INT-1 - Port 021h = 01h
INT-2 - Port 0A1h = 01h

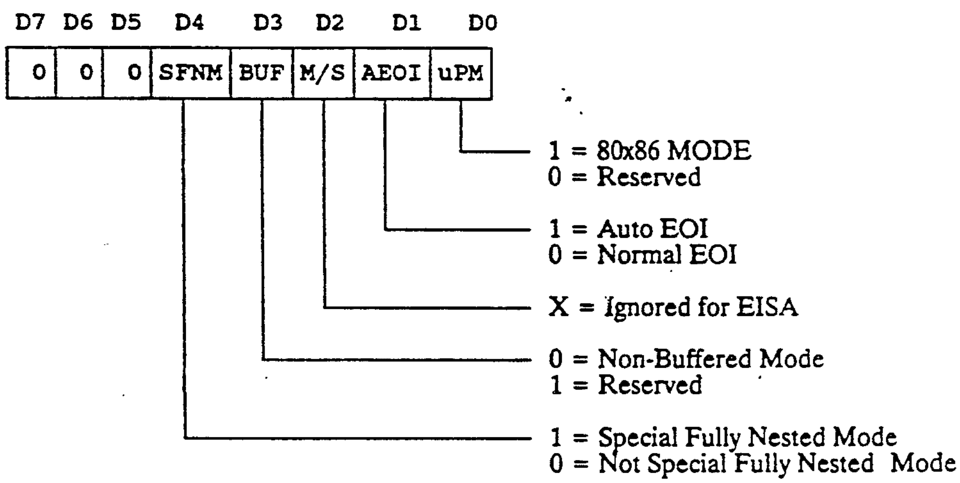

3.2.4.5 Interrupt Mask Register (OCW1)

An I/O write (that does not follow an ICW1) to the INT-1 port 021h or INT-2 port 0A1h loads the Interrupt Mask register. The register can be read at the same address.

Any interrupt can be masked by setting the appropriate Interrupt Mask register bit. All mask bits are loaded by writing a byte with the appropriate bit pattern to the Interrupt Mask register I/O port address. The register defaults to interrupts enabled (all bits cleared) after power-on reset. The Interrupt Mask register can be read at any time after the initialization sequence.

The register illustrated below indicates the eight mask bits. The interrupt is masked by setting the bit to "1". The interrupt is enabled by clearing the bit to "0".

Interrupt Mask Register (OCW1) - Read/Write
IRQ<7:0> - Port 021h
IRQ<15:8> - Port 0A1h

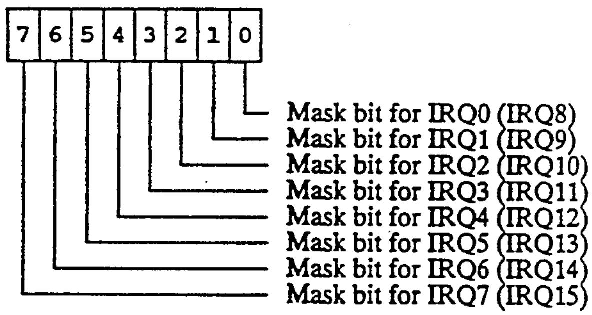

3.2.4.6 Operation Control Word 2 (OCW2)

End-of-Interrupt (EOI) commands and interrupt priority rotation commands can be executed by writing a byte with the appropriate bit pattern to the interrupt controller base address. D<4:3> = "00" to cause execution of OCW2 commands.

Bits 0-2 (L0-L2) determine the interrupt acted upon, and bits 5-7 (EOI, SL, R) select the command.

Note that the bit description in the OCW2 diagram below applies only to OCW2. If D<4:3> indicates ICW1 or OCW3, the bit definitions are documented under the appropriate section.

OCW2

(ICW1, OCW2 and OCW3 are accessed through a common port)
IRQ<7:0> - Port 020h
IRQ<15:8> - Port 0A0h

| D7 | D6 | D5 | D4 | D3 | D2 | D1 | D0 |
|---|---|---|---|---|---|---|---|
| R | SL | EOI | 0 | 0 | L2 | L1 | L0 |

D2–D0: Interrupt acted upon
000 = IRQ0 (IRQ8)
001 = IRQ1 (IRQ9)
010 = IRQ2 (IRQ10)
011 = IRQ3 (IRQ11)
100 = IRQ4 (IRQ12)
101 = IRQ5 (IRQ13)
110 = IRQ6 (IRQ14)
111 = IRQ7 (IRQ15)

D4–D3: ICW1/OCW2/OCW3 Select
00 = Execute OCW2 Command
01 = OCW3 (See OCW3 command)
10 = ICW1 (See ICW1 command)
11 = ICW1 (See ICW1 command)

D7–D5: OCW2 Commands:

End of Interrupt
001 = Non-Specific EOI
011 = Specific EOI

Automatic Rotation
101 = Rotate on Non-Specific EOI
100 = Set rotate in AEOI Mode
000 = Clear rotate in AEOI Mode Specific Rotation (uses L0-L2)
111 = Rotate on Specific EOI
110 = Set priority Command No Operation
010 = No Operation

3.2.4.7 Operation Control Word 3 (OCW3)

Special Mask Mode can be enabled or disabled, and a "Read Interrupt Request register" command or "read In-Service register" command can be executed by writing a byte with the appropriate bit pattern to the interrupt controller base address. D<4:3> = "01" to execute of OCW3 commands.

Special Mask Mode can be enabled by executing an OCW3 command with D<6:5> = "11". An OCW3 command with D<6:5> = "10" disables Special Mask Mode. An OCW3 command with D<6:5> = "00" or "01" also disables Special Mask Mode.

Note that the bit description in the OCW3 diagram below applies only to OCW3. If D<4:3> indicates ICW1 or OCW2, the bit definitions are documented under the appropriate section.

OCW3 - Read/Write
(ICW1, OCW2 and OCW3 are accessed through a common port)
IRQ<7:0> - Port 020h
IRQ<15:8> - Port 0A0h

| D7 | D6 | D5 | D4 | D3 | D2 | D1 | D0 |
|---|---|---|---|---|---|---|---|
| 0 | ESMM | SMM | 0 | 1 | P | RR | RIS |

Read Register Command
- 00 = No Action
- 01 = No Action
- 10 = Interrupt Request register
- 11 = In-Service register Poll Command
- 1 = Execute Poll Command
- 0 = No Poll Command OCW2/OCW3 Select
- 00 = OCW2 (See OCW2 commands)
- 01 = Execute OCW3 Command
- 10 = ICW1 (See ICW1 command)
- 11 = ICW1 (See ICW1 command)

Interrupt Mask Mode
- 00 = No action
- 01 = No action
- 10 = Normal mask mode
- 11 = Special mask mode

3.2.4.8 Edge/Level Control Register (ELCR)

The Edge/Level Control register provides a bit for each interrupt to program the interrupt to edge sensitive or level sensitive. Edge sensitive mode is the default and is fully compatible with ISA expansion boards. Expansion boards that use level sensitive interrupts can be used in shared interrupt configurations.

Interrupts programmed for edge sensitive (Bit = "0") are recognized by a low-to-high transition on the corresponding IRQx input. The IRQx input can remain high without generating another interrupt.

Interrupts programmed for level sensitive (Bit = "1") are recognized by a 'low' level on the corresponding IRQx input. There is no need for an edge detection. The interrupt request must be removed (by negating the IRQx input) before the interrupt service routine issues the EOI command or enables CPU interrupts (by executing STI instruction on 80386). Another interrupt occurs if the IRQx remains asserted after executing an EOI command.

In both the edge and level triggered modes the IRQx inputs must remain asserted until after the leading edge of the first interrupt acknowledge. If an IRQx input is negated before the interrupt acknowledge, the interrupt controller drives the vector for IRQ7 (IRQ15 for INT-2) during the interrupt acknowledge cycle.

A noise glitch on IRQ<7:0> can cause a spurious interrupt on IRQ7. A noise glitch on IRQ<15:8> can cause a spurious interrupt on IRQ15. An IRQ7 or IRQ15 interrupt service routine should read the In-Service register to determine the source of an IRQ7 (or IRQ15) interrupt. A valid interrupt's In-Service register bit is set during the interrupt acknowledge. A spurious interrupt does not set the In-Service register bit.

The IRQ7 and IRQ15 interrupt service routines should also detect a re-entrant execution, to recognize a spurious interrupt that occurs during a valid interrupt service (the In-Service register bit remains set from the valid interrupt). A re-entrant execution indicates the second execution resulted from a spurious interrupt.

IRQ0, IRQ1, IRQ2, IRQ8 or IRQ13 are always set for edge sensitive.

IRQ13 appears externally to be edge sensitive, even though it is shared internally with the chaining interrupt.

Edge/Level Triggered Control Register - Read/Write
IRQ<7:0> - Port 4D0h
IRQ<15:8> - Port 4D1h

| Bit | 4D0h | 4D1h |
|---|---|---|
| 0 | Reserved - 0 | (Reserved - 0) |
| 1 | Reserved - 0 | (IRQ9) |
| 2 | Reserved - 0 | (IRQ10) |
| 3 | IRQ3 | (IRQ11) |
| 4 | IRQ4 | (IRQ12) |
| 5 | IRQ5 | (Reserved - 0) |
| 6 | IRQ6 | (IRQ14) |
| 7 | IRQ7 | (IRQ15) |

3.2.4.9 Interrupt Request Register (IRR)

The Interrupt Request register is an 8-bit register that contains the status of each interrupt. Bits that are set indicate pending interrupts. Bits that are clear indicate interrupts that have not requested service. The interrupt controller clears the Interrupt Request register's highest priority interrupt bit during an interrupt acknowledge cycle, and sets the corresponding bit in the In-Service register. The Interrupt Request register is not affected by the Mask register.

The Interrupt Request register can be read by issuing an OCW3 with RR="1" and RIS="0", followed by an I/O read of the interrupt controller base address. The Interrupt Request register can only be read after the Initialization Control register programming sequence completes.

It is not necessary to issue an OCW3 each time the Interrupt Request register is read. An I/O read of the interrupt controller base address defaults to reading the Interrupt Request register after the initialization sequence and after issuing an OCW3 with RR="1" and RIS="0". Until OCW3 is issued with a different value for RR and RIS, or a Poll command is executed, subsequent reads of the interrupt controller base address continue to return the contents of the Interrupt Request register.

The Poll command overrides an Interrupt Request register read when OCW3 bit P="1".

3.2.4.10 In-Service Register (ISR)

The In-Service register is an 8-bit register that indicates which interrupts are being serviced. Bits that are set indicate interrupts that have been acknowledged and their interrupt service routine started. Bits that are cleared indicate interrupts that have not been acknowledged (or interrupts that are not pending). Only the highest priority interrupt service routine executes at any time, since the lower priority interrupt services are suspended while higher priority interrupts are serviced. The In-Service register is updated when an End of Interrupt Command is issued. The mask register disables a pending interrupt's In-Service bit from being set.

The In-Service register can be read by issuing an OCW3 with RR="1" and RIS="1", followed by an I/O read of the interrupt controller base address. The In-Service register can only be read after the Initialization Control register programming sequence completes.

It is not necessary to issue an OCW3 each time the In-Service register is read. An I/O read of the interrupt controller base address defaults to reading the In-Service register after issuing an OCW3 with RR="1" and RIS="1". Until OCW3 is issued with a different value for RR and RIS, or a Poll command is executed, subsequent reads of the interrupt controller base address continue to return the contents of the In-Service register.

The Poll command overrides an In-Service register read when OCW3 bit P="1".

3.2.5 End-of-Interrupt

3.2.5.1 End of Interrupt (EOI) Command

An interrupt service routine executes an EOI command to clear an interrupt's In-Service bit. The EOI command to a cascaded interrupt controller must be followed by an EOI to the primary interrupt controller.

EOI commands can be either Specific or Non-Specific. A Specific EOI command includes, as part of the command, the In-Service bit to clear. A Non-Specific EOI command clears the highest priority In-Service bit that is set.

The Non-Specific EOI command is executed for an interrupt controller programmed for Fully Nested Mode. The interrupt controller resets the In-Service bit of the highest priority interrupt (the last interrupt serviced). If the Interrupt Controller is in the Special Mask Mode, a Non-Specific EOI does not clear a masked interrupt's In-Service bit. A Non-Specific EOI is executed with OCW2 (EOI=1, SL=0, R=0).

The Specific EOI command is executed for an interrupt controller programmed for a mode that does not preserve the fully nested priority structure. A Non-Specific EOI cannot be used since the highest priority interrupt is not necessarily the last interrupt serviced. The Specific EOI command includes, as part of the command, the In-Service bit to reset. A specific EOI is executed with OCW2 (EOI=1, SL=1, R=0, and L0-L2 = In-Service bit to reset).

3.2.5.2 Automatic End of Interrupt (AEOI)

An interrupt controller programmed for AEOI mode automatically performs a Non-Specific EOI after the trailing edge of an interrupt acknowledge. AEOI mode is selected by executing an ICW4 with AEOI = "1".

AEOI mode should be used only when a nested multilevel interrupt structure is not required within a single Interrupt Controller. The AEOI mode can only be used in a primary Interrupt Controller and not a cascaded controller.

3.2.6 Interrupt Controller Modes

3.2.6.1 Fully Nested Mode

The interrupt controller enters Fully Nested Mode after initialization unless programmed to another mode. The interrupt requests are ordered in priority from IRQ0 (highest) through IRQ7 (lowest). Priorities can be changed by setting the interrupts to rotating priority mode.

When an interrupt is acknowledged, the highest priority request is determined and its vector placed on the bus. The interrupt's In-Service register bit is set during the acknowledge cycle. This bit remains set until the interrupt service routine issues an EOI command or AEOI clears the In-Service bit (on the trailing edge of the interrupt acknowledge cycle). The interrupt controller disables interrupts of the same or lower priority while the In-Service register bit is set. The interrupt controller acknowledges higher priority interrupts if the CPU has enabled interrupts (using an STI instruction on the 80386).

3.2.6.2 Special Fully Nested Mode

A slave interrupt controller can be programmed for Special Fully Nested Mode in systems that require the interrupt priorities to be conserved within each cascaded interrupt controller. The master interrupt controller must be programmed for Fully Nested Mode. Special Fully Nested Mode is similar to Fully Nested Mode, with the following exceptions:

INT-1 recognizes multiple interrupt requests from a slave interrupt controller. In the Fully Nested Mode an interrupt from a slave interrupt controller locks out further interrupts from the same controller until the first interrupt service completes.

An interrupt service routine must determine if the interrupt serviced was the only one from the slave interrupt controller. The routine executes a non-specific EOI command to the slave interrupt controller and then reads its In-Service register. If all bits of the In-Service register are "0", no interrupts are pending and a non-specific EOI can be executed for INT-1. If another interrupt is pending, no EOI should be sent.

3.2.6.3 Fixed Priority Mode

The interrupt controller defaults to fixed priority mode, with IRQ0 the highest priority and IRQ7 the lowest priority. The priorities can be changed by programming an interrupt as the lowest priority. Other interrupts assume fixed priorities in sequence above the lowest. For example, if IRQ5 is programmed as the lowest priority device, the priority order becomes (lowest to highest): IRQ6, IRQ7, IRQ0, IRQ1, IRQ2, IRQ3, IRQ4, IRQ5.

The Set Priority command is issued in OCW2 where: R=1, SL=1; L0-L2 is the binary priority level code of the lowest priority interrupt.

In Specific Rotation mode, internal status is updated by software control during OCW2. However, it is independent of the EOI command. Interrupt priorities can be changed during an EOI command by using the Rotate on Specific EOI command in OCW2 (R=1, SL=1, EOI=1 and L0-L2 = interrupt assigned lowest priority).

3.2.6.4 Rotating Priority Mode

The interrupt controller can be programmed to service pending interrupts sequentially based on an 8-way rotation. Each interrupt rotates to the highest priority, receives service, then becomes the lowest priority. In the case where all interrupts are constantly asserted, each interrupt receives one service out of eight interrupt acknowledge cycles. The following figure illustrates the rotation:

Before Rotation: IRQ4 the highest priority interrupt requesting service. Priority order (highest to lowest): IRQ0, IRQ1, IRQ2, IRQ3, IRQ4, IRQ5, IRQ6, IRQ7.

In-Service Register

| IRQ7 | IRQ6 | IRQ5 | IRQ4 | IRQ3 | IRQ2 | IRQ1 | IRQ0 |
|---|---|---|---|---|---|---|---|
| 0 | 1 | 0 | 1 | 0 | 0 | 0 | 0 |

IRQ0 — Highest Priority
IRQ7 — Lowest Priority

After Rotation: IRQ4 serviced and changed to lowest priority. IRQ5 changed to highest priority. Priority order (highest to lowest): IRQ5, IRQ6, IRQ7, IRQ0, IRQ1, IRQ2, IRQ3, IRQ4.

In-Service Register

| IRQ7 | IRQ6 | IRQ5 | IRQ4 | IRQ3 | IRQ2 | IRQ1 | IRQ0 |
|---|---|---|---|---|---|---|---|
| 0 | 1 | 0 | 0 | 0 | 0 | 0 | 0 |

IRQ4 — Lowest Priority
IRQ5 — Highest Priority

There are two ways to cause priority rotation using OCW2: the Rotation on Non-Specific EOI Command (R=1, SL=0, EOI=1) and the Rotate in Automatic EOI Mode which is set by (R=1, SL=0, EOI=0) and cleared by (R=0, SL=0, EOI=0).

3.2.6.5 Polled Mode

The Polled Mode can be used to conserve space in the interrupt vector table. Multiple interrupts that can be serviced by one interrupt service routine do not need separate vectors if the service routine uses the poll command.

The Polled Mode can also be used to expand the number of interrupts. The polling interrupt service routine can call the appropriate service routine, instead of providing the interrupt vectors in the vector table.

An interrupt service routine executes a "Clear Interrupts" instruction (CLI for 80386) before issuing a poll command. A poll command is issued by setting P="1" in OCW3. A poll command overrides an Interrupt Request or In-Service register read when OCW3 bits P="1" and RR="1".

An I/O read of the interrupt controller base address that follows a poll command is treated like an interrupt acknowledge. If an interrupt is pending, the interrupt controller sets the appropriate In-Service bit and, in response to the next I/O read of the interrupt controller base address, drives a byte with the interrupt code onto the bus. If no interrupt is pending, the interrupt controller sets the most significant bit to "0" and drives the byte onto the bus.

The interrupt controller freezes the contents of the In-Service register after the poll command, until the I/O read of the interrupt code.

The interrupt controller responds to an I/O read of the I/O controller base address (after a poll command) by driving D<7:0> with a byte that has the following format:

| D7 | D6 | D5 | D4 | D3 | D2 | D1 | D0 |
|---|---|---|---|---|---|---|---|
| I | -- | -- | -- | -- | W2 | W1 | W0 |

W0-W2: Binary code of the highest priority interrupt requesting service.

I = "1" if an interrupt is pending
"0" if no interrupt is pending.

3.2.6.6 Special Mask Mode

The Special Mask Mode enables all interrupts not masked by a bit set in the Mask register. Interrupt service routines that require dynamic alteration of interrupt priorities can take advantage of the Special Mask Mode. For example, a service routine can inhibit lower priority requests during a part of the interrupt service, then enable some of them during another part.

Without Special Mask Mode, if an interrupt service routine acknowledges an interrupt without issuing an EOI to clear the In-Service bit, the interrupt controller inhibits all lower priority requests. The Special Mask Mode provides an easy way for the interrupt service routine to selectively enable only the interrupts needed by loading the Mask register.

The Special Mask Mode is set by OCW3 where: SMM="1", and cleared with SMM="0".

3.3 Non-Maskable Interrupts (NMI)

EISA systems indicate an error condition by generating a non-maskable interrupt. A software mechanism is also provided to generate an NMI.

The following address map indicates the port addresses of registers used for NMI handling.

| NMI register | I/O Address | Read/# of Write Bits | |
|---|---|---|---|
| NMI Status register | 0061h | rw | 8 |
| NMI Enable register | 0070h | w | 8 |
| Extended NMI register | 0461h | rw | 8 |
| Software NMI register | 0462h | w | 8 |

Port 061h, bits <6> and <7> and port 0461h bits <5>, <6> and <7> indicate the source of an NMI interrupt. The following paragraphs describe the ports 061h and 0461h bits.

Parity Error from System Memory

Port 061h bit 7 is set (PARITY ERROR) if system memory detects a parity error. This interrupt is enabled by setting Port 061h bit 2 to "0". To reset the parity error set port 061h bit 2 to "1" (Disable Parity Interrupt) and then clear it to "0" (Enable Parity Interrupt).

Assertion of IOCHK*

Port 061h bit 6 is enabled (IOCHK* NMI) if an expansion board asserts IOCHK* on the ISA/EISA bus. This interrupt is set by setting port 061h bit 3 to "0". To reset the interrupt, set port 061h bit 3 to "1" (Disable IOCHK* NMI) and then clear it to "0" (Enable IOCHK* NMI).

Fail-Safe Timer Timeout

Port 0461h bit 7 is set (FAILSAFE NMI) if the fail-safe timer count has expired before being reset by a software routine. This interrupt is enabled by setting port 0461h bit 2 to "1". To reset the interrupt, set Port 0461h bit 2 to "0" (Disable Failsafe Interrupt) and then set it to "1" (Enable Failsafe Interrupt).

Bus Timeout

Port 0461h bit 6 is set (BUS TIMEOUT) if more than 64 BCLKs (8 æs) have elapsed from the rising edge of BCLK after MAKx* was negated until the master negates MREQx*. A bus timeout also occurs if a memory slave extends a cycle long enough that CMD* remains asserted more than 256 BCLKS (32 æs). The DMA controller does not cause a bus timeout. The bus timeout interrupt is enabled by setting port 0461h bit 3 to "1" or disabled by setting port 0461h bit 3 to "0". To clear the bus timeout interrupt, set Port 0461h bit 3 to "0" (Disable Bus Timeout Interrupt) and then set it to "1" (Enable Bus Timeout Interrupt). The system board asserts RESDRV when a bus timeout occurs. Clearing the bus timeout status bit causes the system board to negate RESDRV.

Software Generated NMI

Port 0461h bit 5 is set (NMI I/O PORT) if an I/O write access occurred to Port 0462h (the data value written to the port does not matter). This interrupt is enabled by setting port 0461h bit 1 to "1". To reset the interrupt, set port 0461h bit 1 to "0" (Disable NMI I/O port Interrupt) and then set it to "1" (Enable NMI I/O Port Interrupt).

Bus Reset

Port 0461h also supports bus reset. Bit 0 can be used to perform a system bus reset without resetting other devices in the system. To reset the system bus set Port 0461h bit 0 to "1" which asserts the RESDRV signal on the ISA/EISA bus. Bit 0 should be set long enough for the system bus devices to be properly reset, and then port 0461h bit 0 should be cleared to continue normal operation. When performing a system bus reset, standard system board devices such as timers, keyboard, etc. are not reset.

Speaker Control and Memory Refresh

Port 061h also supports speaker control and memory refresh status.

NMI Status and Control Ports

Port 061h provides NMI status and control, speaker control and memory refresh status. Port 0461h provides additional NMI status and control.

NMI Status and Control Port -
Port 061h

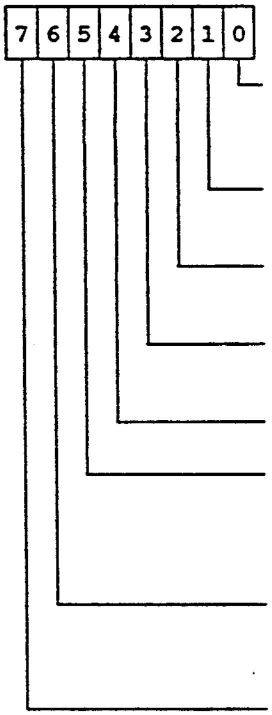

Gate signal for speaker timer (R/W)
0 = timer 1, counter 2 (speaker) disabled
1 = timer 1, counter 2 (speaker) enabled 0 = Speaker timer off (R/W)
1 = Speaker timer on 0 = System board parity error enabled
1 = Parity error disabled and cleared (R/W)

1 = IOCHK* NMI disabled and cleared
0 = IOCHK* NMI enabled (R/W)

Toggles after each refresh request

State of speaker timer (Read Only)
(Must be "0" for writes)
0 = Speaker off
1 = Speaker on 1 = IOCHK* asserted (IOCHK* NMI)
0 = IOCHK* negated (No IOCHK* NMI)
(Read only, must be "0" for writes)

0 = No parity error NMI from system board
1 = Parity error NMI requested
(Read only, must be "0" for writes)

Extended NMI Status and Control Port
Port 0461h

| 7 | 6 | 5 | 4 | 3 | 2 | 1 | 0 |
|---|---|---|---|---|---|---|---|

- Bit 0:
  - 0 = Normal Bus reset operation (R/W)
  - 1 = Bus reset asserted (RSTDRV)
- Bit 1:
  - 0 = NMI I/O port disabled
  - 1 = NMI I/O port enabled (R/W)
- Bit 2:
  - 0 = Fail-safe NMI disabled and cleared
  - 1 = Fail-safe NMI enabled (R/W)
- Bit 3: 32-bit Bus Timeout
  - 0 = with NMI disabled and cleared
  - 1 = with NMI enabled
- Bit 4: Reserved (Read Only)
  (Must be "0" for writes)
- Bit 5: NMI I/O Port status (Read Only)
  (Must be "0" for writes)
  - 0 = No NMI pending
  - 1 = NMI pending
- Bit 6: NMI from Bus Timeout (Read Only)
  (Must be "0" for writes)
  - 0 = No NMI pending
  - 1 = NMI pending
- Bit 7: NMI from fail-safe timer (Read Only)
  (Must be "0" for writes)
  - 0 = No NMI pending
  - 1 = Fail-safe timer active and NMI pending Note: If the NMI enable/disable bit (port 70h bit 7) is disabled, port 0461h bits 7, 6, and 5 read "0" even if an NMI from that source is pending.

Note: The interrupt service routine should examine NMI status bits and correct the NMI source one at a time. After an NMI source has been cleared and the corresponding bit reset, the NMI status bits should be checked again in case more than one source of NMI has occurred at one time. If another status bit is active then it should also be handled. It is possible that by doing this the routine may see an NMI interrupt immediately following another, with the second interrupt showing no active status bits. The second interrupt should then be ignored. This logic is required to insure that no NMI interrupts are lost, as the 8086 class CPUs do not allow NMI routines to be interrupted by another NMI, but store a second NMI edge for execution after the IRET.

Software NMI Generation Port

Port 0462h provides a software mechanism to cause an NMI. A write to any Port 0462h bit causes an NMI if interrupts are enabled.

Software NMI Generation Port - Write Only
Port 0462h

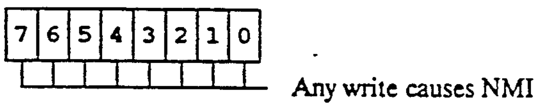

Port 70h provides a mask register for the NMI interrupt, as shown below. The most-significant bit (bit 7) enables or disables the NMI interrupt. NMIs are disabled from all sources if bit 7 is programmed to "1". Writing an 80h to port 70h masks the NMI.

NMI Enable/Disable and Real-time Clock Address Port

The NMI enable/disable bit shares port 70h with the real-time clock device. The real-time clock device uses port 70 bits 0 to 6 to address CMOS memory locations. Writing to port 70h sets both the NMI enable/disable bit and the CMOS memory address pointer. Accesses to CMOS must correctly initialize the CMOS address pointer, and must maintain the correct state of the NMI enable/disable bit.

NMI Enable/Disable and Real-time Clock Address Port - Write Only
Port 070h

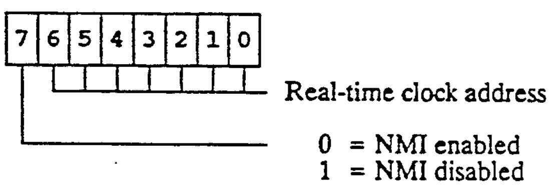

Last EISA Bus Master Granted

A CPU-readable latch identifies the EISA bus master that most recently had control of the bus. The latch is located at port address 0464h and is read only. A single bit is cleared to "0" after each arbitration cycle to indicate the slot that was most recently granted the bus. Port 0465h is reserved for an additional status latch for seven more bus masters.

An NMI service routine can read this latch to determine which bus master controlled the bus when a bus preempt timeout occurred. The NMI service routine can then display the bus master that caused the fault (although a slave may have caused the fault by hanging up the bus master), and reinitialize the system.

32-bit Bus Master Status Latch - Read Only
Slots 1-8 - Port 0464h
Slots 9-15 - Port 0465h
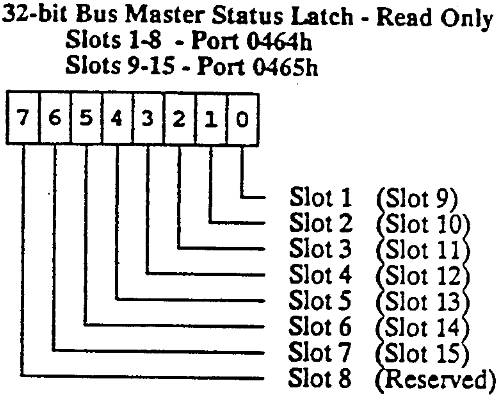

3.4 Interval Timers

EISA systems contain five counter/timers that are equivalent to those found in the Intel 8254 Programmable Interval Timer. The counter/timers are programmed by I/O accesses and are addressed as though they are packaged in two separate 8254 Interval Timers. Timer 1 contains three counters, timer 2 contains two counters (EISA systems do not implement the middle counter of timer 2). The counter clocks are developed from an external 14.31818 MHz crystal oscillator.

The timer 1 counter 0, OUT pin connects to IRQ0, and provides a system timer interrupt (IRQ0) for time-of-day, diskette time-out, and other system timing functions. The timer 1 counter 1 OUT signal generates DRAM refresh requests. The timer 1 counter 2, OUT signal generates the speaker tone.

Timer 2 counter 0, implements a fail-safe timer. The OUT pin is connected to the NMI interrupt to the CPU, allowing the timer to generate NMI interrupts at a regular interval, thus preventing the system from locking up. Timer 2 counter 1 is not implemented. Timer 2 counter 2 is designated as available for use by system board manufacturers and can implement any additional timing function needed.

The following tables lists the interval timer functions.

| | Interval Timer 1 Counter 0 | Interval Timer 2 Counter 0 |
|---|---|---|
| Function | System Timer | Fail-safe Timer |
| Gate | Always on | Always on |
| Clock In | 1.193 MHz | 298.3 KHz |
| Clock Out | IRQ0 | NMI Interrupt |

| | Interval Timer 1 Counter 1 | Interval Timer 2 Counter 1 |
|---|---|---|
| Function | Refresh Request | Not implemented |
| Gate | Always on | Not implemented |
| Clock In | 1.193 MHz | Not implemented |
| Clock Out | Request refresh | Not implemented |

| | Interval Timer 1 Counter 2 | Interval Timer 2 Counter 2 |
|---|---|---|
| Function | Speaker Tone | CPU speed control |
| Gate | Programmable (Port 61h) | Refresh Request |
| Clock In | 1.193 MHz | BCLK |
| Clock Out | Speaker input | CPU speed control |

The following table shows the I/O address map of the interval timer counters:

| I/O Port Address | I/O Port Address (binary) MSB LSB | | Register Description |
|---|---|---|---|
| 0040h | 0000 0000 010X 0000 | | Programmable Interval Timer 1, System Clock (Counter 0) |
| 0041h | 0000 0000 010X 0001 | | Refresh Request (Counter 1) |
| 0042h | 0000 0000 010X 0010 | | Speaker Tone (Counter 2) |
| 0043h | 0000 0000 010X 0011 | | Control Word register |
| 0048h | 0000 0000 010X 1000 | | Programmable Interval Timer 2, Fail-safe Timer (Counter 0) |
| 0049h | 0000 0000 010X 1001 | | Reserved |
| 004Ah | 0000 0000 010X 1010 | | Counter 2 |
| 004Bh | 0000 0000 010X 1011 | | Control Word register |

3.4.1 Programming the Interval Timers

The counters are programmed by the following procedure:

1. Write the Control Word to the control address
2. Write the initial count value for the counter

3.4.1.1 Interval Timer Control Word Format

The Control Word specifies the counter, the operating mode, the order and size of the count value, and whether it counts down in a 16-bit or binary-coded decimal (BCD) format. The control word is always written first, before count values can be loaded into a counter.

If a counter is programmed to read or write two-byte counts, the following precaution applies: A program must not transfer control between writing the first and second byte to another routine which also writes into that same counter. Otherwise, the counter will be loaded with an incorrect count. The count must always be completely loaded with both bytes.

Interval Timer Control Word Format
Timer 1: Port 0043h
Timer 2: Port 004Bh

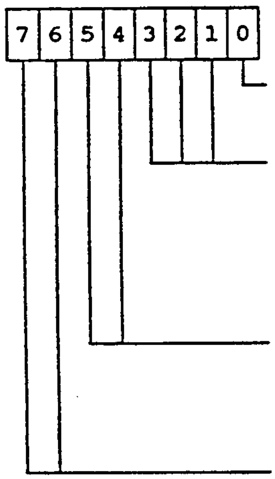

0 = Binary Countdown
1 = BCD Countdown

000 = Mode 0
001 = Mode 1
010 = Mode 2
011 = Mode 3
100 = Mode 4
101 = Mode 5

00 = Counter Latch command
01 = R/W least-significant byte
10 = R/W most-significant byte
11 = R/W least-, then most-significant byte 00 = Select counter 0
01 = Select counter 1
10 = Select counter 2
11 = Read Back command

3.4.1.2 Counter Operating Modes

The following table lists the six operating modes for the interval counters.

| Mode | Function |
|---|---|
| 0 | Asserts OUT signal at end-of-count |
| 1 | Hardware retriggerable one-shot |
| 2 | Rate generator (divide-by-n counter) |
| 3 | Square-wave output |
| 4 | Software-triggered strobe |
| 5 | Hardware-triggered strobe |

3.4.1.3 Counter Initial Count Value

Each counter is a 16-bit word. However, since the interface to the timer is 8 bits, the count value must be programmed in two I/O operations. The control word determines the protocol for programming the counter. It is possible to program the least significant byte only, the most significant byte only, or both, one after another (LSB then MSB). Note that the first two options require two I/O writes (the control word and then the value) while the third option requires three writes (the control word, LSB, then MSB).

3.4.2 Monitoring Timer Status

It is possible to determine the current status of each of the five counters, including the current count value, without disturbing the count in progress. There are three methods for reading the counters:

1. Simple I/O read from counter address
2. Counter Latch command
3. Read-back Command

3.4.2.1 Counter Read Operation

An I/O read access to the address of the desired counter returns the current value of the counter. However, the CLK input to the counter must be disabled when the read occurs to prevent the count changing during the read operation and returning an invalid value. Since the GATE controls for Timer 1 counter 0, Timer 1 counter 1, and Timer 2 counter 0 are always enabled, it is not possible to guarantee the results of an I/O read to these counters. One of the other two methods must be used to determine count value for these counters.

3.4.2.2 Counter Latch Command

The Counter Latch command is a control word that causes the current value of the selected counter to be latched at the time the Counter Latch command is written to the Control Word register. Once the latch command has been given, the value can be read by an I/O access to the appropriate address. The Counter Latch command format is given below:

Counter Latch Command Format

| Bits | Description |
|---|---|
| 3, 2, 1, 0 | Reserved (0) |
| 5, 4 | 00 = Designates this byte as a Counter Latch command |
| 7, 6 | Counter Select (or Read-Back Command)<br>00 = Latch Counter 0<br>01 = Latch Counter 1<br>10 = Latch Counter 2<br>11 = Select Counter Read-Back Command (See Read Back command) |

3.4.2.3 Counter Read-Back Command

The Read-back command is used to determine the count value, programmed mode, and current states of the OUT pin and Null Count flag of the selected counter or counters. The Read-back command is written to the Control Word register, which causes the current status of the above mentioned variables to be latched. The value of the counter and its status can then be read by I/O accesses to the counter address. The following tables show the format for the Read-back command and the Status Byte.

Counter Read-Back Command Format:

| Bits | Description |
|---|---|
| 0 | Reserved (0) |
| 1 | 1 = Select counter 0 |
| 2 | 1 = Select counter 1 |
| 3 | 1 = Select counter 2 |
| 4 | 0 = Latch status of selected counters |
| 5 | 0 = Latch count of selected counters |
| 7, 6 | 11 = Specifies counter read-back command |

The status byte can be read from the counter base address after the counter Read-Back command. The status byte has the following format:

Counter Status Byte Format:
Timer 1: Port 040h
Timer 2: Port 048h

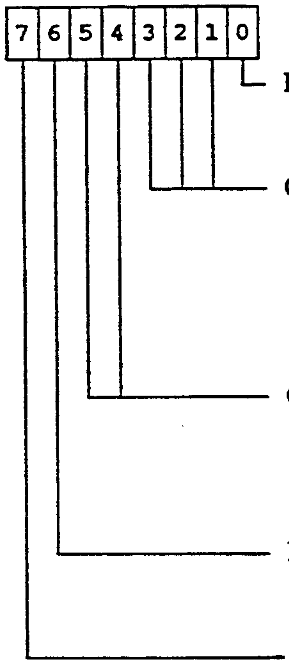

Binary/BCD Countdown Mode
0 = BINARY Countdown
1 = BCD Countdown

Counter Mode
000 = Mode 0
001 = Mode 1
010 = Mode 2
011 = Mode 3
100 = Mode 4
101 = Mode 5

Counter Latch Status
00 = Counter latch command
01 = R/W least-significant byte
10 = R/W most-significant byte
11 = R/W least, then most-significant byte Returned Status:
0 = Control register contents not moved into CE
1 = Control register contents are moved into CE OUT Pin Status
0 = OUT Pin is 0 (low)
1 = OUT Pin is 1 (high)

4. EISA System Configuration

EISA provides a mechanism for automatic configuration of expansion boards and the system board. The EISA configuration mechanism consists of the following components:

- A software utility to configure the system board and expansion boards
- A software interface to the configuration utility that Configuration File Extensions can use to control and customize the configuration process
- Configuration files that accompany the software utility
- Configuration files that accompany the system board and expansion boards
- Nonvolatile memory for storing configuration information
- A mechanism to save and restore a backup copy of the system configuration information
- BIOS routines to read and write contents of nonvolatile memory
- Automatic detection and initialization of expansion boards by the system ROM power-up routine
- 1024-byte I/O address space for each EISA expansion board (slot-specific)

Expansion board manufacturers include a configuration file (also referred to as a CFG file) with each EISA expansion board, and optionally, with switch-programmable ISA products. The configuration utility, which is provided by the system manufacturer, uses the information contained in the configuration files to determine a conflict-free configuration of the system resources. The configuration utility stores the configuration and initialization information into nonvolatile memory and saves a backup copy on diskette. The system ROM power-up routines use the initialization information to initialize the system during power-up, and device drivers use the configuration information to configure the expansion boards during operation.

4.1 Devices Supported by Automatic Configuration

EISA systems provide automatic configuration for expansion boards plugged into the expansion bus, peripheral devices built into the system board, and software drivers that use system resources, such as an expanded memory (LIM EMS) emulator. The following information provides an overview of the mechanism used for automatic configuration of the devices.

4.1.1 Expansion Boards

Expansion boards install into EISA and ISA bus connectors. Each bus connector is referred to as a slot. The bus connectors are numbered sequentially from 1 to "n" (with 15 as a maximum "n"). For example, an EISA system with 7 bus connectors has slots numbered from slot 1 to slot 7.

4.1.1.1 EISA Expansion Boards

Each EISA slot has I/O address decoding hardware that provides the installed expansion board with a unique, 1024 byte, slot-specific I/O address space. EISA expansion boards use the slot-specific I/O address space for I/O registers (i.e., configuration and operational registers). The EISA system ROM uses configuration information from nonvolatile memory to initialize the configuration registers during power-up.

Refer to the section entitled Expansion Board Address Decoding and the one entitled System Board Slot-Specific I/O, of this specification for detailed information on the slot-specific I/O ranges.

An EISA expansion board must contain a readable product ID and must support the expansion board control bits ENABLE and IOCHKERR. Refer to the section entitled Expansion Board Control Bits and the one entitled EISA Product Identifier of this specification for detailed information.

4.1.1.2 ISA Expansion Boards

The EISA configuration utility also aids in configuration of ISA expansion boards that provide a configuration file. The utility uses the information from the configuration file to determine the correct switch and jumper settings and I/O port initializations for ISA expansion boards. The configuration utility displays the proper switch and jumper settings to the user.

ISA initialization and operational registers must occupy the ISA compatible expansion board I/O space (100h-3FFh). ISA systems do not support the EISA slot-specific I/O ranges. The EISA system ROM power-up routines automatically initialize the ISA registers that are specified in the configuration file.

4.1.2 System Board

Peripherals integrated onto the system board require automatic configuration support similar to expansion board peripherals. System board peripherals can be designed to use EISA slot-specific I/O ranges and the ISA system board I/O range.

4.1.2.1 System Board Peripherals That Use Slot-Specific I/O Space

A system board peripheral that uses slot-specific I/O is functionally similar to an expansion bus peripheral, but it is integrated onto the system board rather than installed in a bus connector. EISA automatic configuration treats the system board peripheral as an expansion board peripheral, except that it is referenced as an "embedded device."

4.1.2.2 System Board Peripherals That Use System Board I/O Space

System board peripherals that use ISA expansion board I/O space (100h-3FFh) can be treated as "virtual devices." The configuration utility stores the configuration and initialization information for "virtual devices" in nonvolatile memory during configuration. The system ROM automatically initializes the virtual device during power-up.

4.1.3 Software Drivers That Require System Resources

Software drivers that require system resources (i.e., memory allocation) are also treated as "virtual devices." Twoexamples include, a software driver that emulates expanded memory (LIM EMS) requires memory allocation for the page frame, or a software driver that requires a buffer which memory allocation to store data during a data transfer.

4.2 Configuration Utility

The EISA system manufacturer is responsible for supplying a configuration utility. The configuration utility uses configuration files to resolve conflicts in assignment of system resources such as interrupt levels and DMA channels. The configuration utility also extracts initialization information that is used for system board and expansion board initialization. The information is stored in nonvolatile memory and a backup is saved on diskette.

The type of nonvolatile memory and method of writing the data is not included in the EISA standard and is determined by the system manufacturer. The system manufacturer also provides BIOS routines to initialize the expansion boards with the information stored in nonvolatile memory. The BIOS routines also read configuration information from nonvolatile memory for device drivers and other system software.

All references to the configuration utility included in this specification refer to the configuration utility available from Micro Computer Systems, Inc. of Irving, Texas.

The configuration utility is used to configure an EISA computer. The configuration process provides the following functions:

- Read and parse configuration files
- Automatically allocate resources to create a conflict-free system
- Saves, configuration to diskette, which allows a common configuration to be ported to other similarly-configured machines
- Write configuration information into nonvolatile memory System board and expansion board products can include CFG File Extensions that extend the capabilities of the configuration utility and customize the configuration process. For example, a CFG File Extension can be used to detect options installed on an expansion board, to accept and process user input (other than menu selections), or to write configuration information to non-EISA nonvolatile memory.

4.3 Configuration Files

The configuration files contain the expansion board ID, system resource requirements and initialization information for system board or expansion board devices.

The initialization information provides data for power-up initialization. The configuration utility stores the appropriate I/O port initialization information in nonvolatile memory. The system ROM reads the information from nonvolatile memory during power-up and initializes the I/O ports.

System resource requirements include memory, I/O ports, interrupts, and DMA channels. The configuration utility verifies that system resource selections do not conflict with resource allocations already selected for other devices. The configuration utility then stores the appropriate system resource information in nonvolatile memory. The system ROM reads the information from nonvolatile memory during power-up and initializes the devices and expansion boards.

A device driver can use a BIOS routine Call to determine the proper expansion board initialization and to determine the system resource configuration.

A software driver can use the BIOS routines to identify the functions of expansion devices and the resources allocated to the devices. The driver can determine the contents of each slot, its functions, the initialization information, and the system resources allocated for each function.

4.3.1 Configuration File Extensions

System board and expansion board products can include CFG File Extensions (also called overlay files,) that customize the configuration process. [2]

CFG File Extensions can be used to determine the installed hardware by reading from the hardware registers or other means. For example, the overlay may detect the presence of floating point coprocessors, disk drives (and determine drive type), or total amount of memory installed on a memory expansion board.

The overlay can control the configuration of a system board or expansion board. It can access the hardware, provide the user interface and process the user-specified configuration selections. Or the overlay can provide a limited set of configuration services and rely on the configuration utility to perform its normal functions.

Interaction between the configuration utility and the CFG File Extension is specific to the utility. Therefore, the CFG file extension must be written such that it uses the calling conventions and interface handling routines recognized by the utility.

---

2 A specification for CFG File Extensions is available from Micro Computer Systems, Inc. of Irving, TX. It describes overlays specific to the utility that allow system manufacturers to customize the configuration process.

4.3.2 Expansion Board Identifier (Product ID)

The expansion board identifier (product ID) is a unique product identification code that can be read by the system ROM or other software to identify or locate an expansion board. Information that can be combined in an expansion board ID includes the manufacturer's ID, product number and revision level. The exact method for selecting an expansion board ID is described in the section entitled, Product Identifier (ID).

EISA expansion boards must contain a readable product ID. The power-up routines use the ID to determine the slot in which the expansion board is installed. The expansion board is then programmed by the system ROM with the configuration parameters that are stored in nonvolatile memory.

ISA expansion boards should have a product ID provided in the configuration file. The product ID may or may not be readable. An expansion board ID is recommended for ISA expansion boards since it can be stored in nonvolatile memory with other manufacturer-specified information, such as the initialization information and resource requirements. The data stored in nonvolatile memory can then be accessed by software drivers to determine the expansion board configuration.

4.3.3 I/O Port Initialization Information

The configuration file contains I/O port initialization information necessary to configure an expansion board. The I/O port initialization information specifies the I/O port addresses and values for each alternative configuration.

4.3.4 System Resource Requests

Devices that require system resources include the resource request in the configuration file. The CFG file can contain requests for the following system resources:

- Memory--the amount of memory supported, starting address, whether it is writable or cacheable, and initialization parameters required
- I/O ports-port addresses and initialization parameters required
- Interrupts--interrupts supported, whether the interrupt can be shared, whether it is edge- or level-sensitive, and any initialization parameters required
- DMA channels--the choice of DMA channels, whether the channel can be shared, the channel's data size, the channel's cycle timing, and any initialization parameters required

4.4 Configuration File Filenames

The filename of an EISA or ISA configuration file consists of an exclamation point followed by the product ID and a filename extension, CFG. The exclamation point must be included as the initial character of all CFG filenames. Valid filenames have the following format:

!ACE1234.CFG !XYZ5678.CFG !ABC0000.CFG

The filename convention is the same for a system board, expansion board, embedded device or virtual device. For example, an expansion board with a product ID of ACE0101 has a configuration file named !ACE0101.CFG.

The expansion board manufacturer should ensure that the configuration file filename is updated to reflect revisions to the expansion device. For example, a product with an ID of ACE101 may have a configuration file named !ACE0101.CFG. A subsequent revision of the product would have an ID of ACE102. Therefore, the configuration file should be named !ACE0102.CFG. This ensures that the appropriate CFG file is loaded for the device.

The configuration utility includes a mechanism to manage duplicate IDs. For example, the configuration files for two expansion boards with ID ACE1234 installed in the same system could be renamed when copied to the configuration diskette: the first configuration file detected is copied to !ACE1234.CFG the second configuration file detected is copied and renamed from !ACE1234.CFG to 1ACE1234.CFG. The next one is renamed to 2ACE1234.CFG.

4.5 The Configuration Procedure

EISA system configuration requires the following hardware and software:

- An EISA computer system
- The EISA system board configuration file
- The configuration utility
- Optionally, EISA expansion boards and configuration files
- Optionally, ISA expansion boards and configuration files
- EISA or ISA Configuration File Extensions (where needed)

The following procedure describes an example configuration process for an EISA system with EISA and ISA expansion boards. This example configuration requires a bootable EISA computer with a display, keyboard and floppy diskette attached.

Start the procedure with the computer power switch "OFF."

Install EISA boards in the computer to allow "automatic detection" of the devices.

Insert the configuration utility diskette.

Turn the computer power switch "ON," booting from the configuration utility diskette.

Use the configuration utility commands to copy each configuration file and CFG File Extension to the configuration utility diskette. The configuration utility automatically renames the CFG files from expansion boards with duplicate IDs.

Let the configuration utility automatically select a conflict-free configuration. The user may override the automatic selections.

Set the switches on ISA expansion boards to the positions indicated by the configuration utility.

Turn the computer power switch "OFF" and install the ISA expansion boards in the expansion slots as indicated by the configuration utility.

Remove the configuration utility diskette.

Turn the computer power switch "ON" to the configured system, booting from the normal boot device (for example, the fixed disk).

Incorporate the software options into the operating system startup files as indicated by the configuration utility. The startup files can execute programs that require command line parameters (for example, /s, /g). The configuration utility indicates the proper parameters. For example, the configuration utility lists entries for the CONFIG.SYS and AUTOEXEC.BAT files of an MS-DOS operating system.

Reboot the system.

4.5.1 Configuration File Syntax

The following sections specify the syntax conventions used in this document and for configuration files.

4.5.2 Symbol Conventions

The configuration file syntax uses the following special symbols.

{} Empty braces indicate a null value.

\ The backslash within a text field identifies an embedded character. Embedded characters include the \t for up to an 8-space tab (or to the next tab stop), \n for a line feed, \" for quotation marks, and \\ for a backslash.

\t Embeds a tab within text.
Tab stops are: 1, 9, 17, 25, 33, ...

\n Replaces \n with a carriage return, line feed. The configuration utility automatically wraps text at the right margin to the next line (word wrap) for free-form text fields.

\" Embeds a quotation mark character within text that has quotation marks delimiting the entire field.

\\ Embeds a \ (backslash) character within text.

" " Information enclosed in quotation marks is free-form ASCII text. The text can contain embedded characters, including tabs and line feeds. Quotation marks can be used within a text field by entering a \".

- The dash (hyphen) separates the minimum and maximum values in a range.

| The vertical bar is equivalent to an OR statement. Items separated by a vertical bar (|) indicate that only one of the items is allowed.

space A blank space is equivalent to an AND statement. Information separated by a space indicates all items are included. The space serves to group items of an inclusive list. For example, the statement *(x and y) or (y and z)* is denoted:
x y | y z.

; The semicolon precedes comments in the configuration file. The configuration utility ignores text that follows the semicolon (up to the end of the line).

4.5.3 Numerical Value Conventions

Numerical values within a configuration file must adhere to the following conventions:

- All numerical values are assumed to be decimal unless otherwise indicated. Decimal values can include a trailing d or D.
- Binary port values must be written with the MSBit on the left and may include a trailing b or B. A "1" or "0" in a bit position indicates the bit value.
- Decimal fractions are not allowed.
- Address values may be expressed as megabyte (indicated by an M suffix), kilobyte (indicated by a K suffix), or byte (no suffix). Values for megabytes or kilobytes must be given in decimal units but cannot include a trailing d or D. For example, two kilobytes can be represented either by 2K or 2048d, but not by 2Kd.
- Hexadecimal values must include a trailing h or H. In the case of hexadecimal values that begin with an alpha character, such as C68h, the value must also have a leading 0 (zero). And when noting slot-specific EISA port addresses, the value must be preceded by a 0Z (zero Z). For example, slot-specific port C80h would be represented as 0ZC80h.
- An x in a binary value indicates the bit is not used or a don't care.
- An r in a binary value indicates the hardware register must be read and the actual bit value masked into the "r" bit position.
- An n in a binary value for a tripole jumper indicates the jumper is not installed.

4.5.4 Keyword and Field Specification Conventions

Within this document the following conventions are followed when describing the configuration file.

| | |
|---|---|
| *Value* | indicates that an ASCII string or number is required in this field; any numerical unit format can be entered for a value. |
| *{}* | may be selected to indicate that none of the resource selections are used. |
| *List* | indicates that a set of resource selections can be included in the field, each delimited vertical bar (\|, logical OR). |
| *Rangelist* | indicates that a set of resource address range selections or lists can be included in the field, each delimited by a vertical bar (\|, logical OR). |
| *Valuelist* | indicates that a set of values can be included in the field, each delimited by a vertical bar (\|, logical OR). |

| | |
|---|---|
| *textlist* | indicates that a set of ASCII values can be included in the field; the textlist must be contained within double quotes, with each string delimited by a space. |
| *Switchlist* | indicates that a set of switches can be included in the field, each delimited by a space. A switchlist can also comprise a range of switches. |
| *Jumperlist* | indicates that a set of jumpers can be included in the field, each delimited by a space. A jumperlist can also comprise a range of jumpers. |
| *Bitlist* | indicates that a set of bit positions can be included in the field. A bitlist can also comprise a range of bits. |
| *parameterlist* | indicates that a set of ASCII values can be included in the description field of a software statement; the parameterlist must be contained within double quotes, with each string delimited by a vertical bar (\|, logical OR). |
| [] | Items within square brackets are optional. |
| CAPS | Keywords are indicated by all capital letters. For example, BOARD, ID, NAME, and COMMENTS are keywords and are indicated by all capitals. |
| *italic* | Italic text used in the syntax provides descriptive information about the indicated field. For example, names, values, lists and ranges are indicated by italic text. |
| ASCII text | ASCII characters 20-255h are valid for fields that require ASCII text. Null strings are allowed. |
| (Optional) | When used within a statement title, indicates that the statement provides additional information, but is not required in the configuration file. |

4.6 Configuration File Format

A configuration file consists of a board identification block, one or more initialization information blocks, and one or more function statement blocks. The configuration file begins with a board identification block, which provides the name and ID of the board as well as slot information. The initialization information blocks include the values to initialize I/O ports and for ISA boards, information about jumper and switch settings. The function statement blocks specify the resource requirements of the functions of the board. Additionally, CFG files for system boards may include a system description block (following the board identification block), which icludes information specific to the system board.

Every configuration file must include the board identification block. The initialization information blocks and function statement blocks are optional, but must be included to utilize automatic configuration.

The configuration file has the following structure:

*Board Identification Block*
    *Board Identification and Slot Information*
[*System Description Block*]
[*Initialization Information Block*
    *I/0 port requests*
    *Switch and jumper settings*
    *Software initialization information*]
[*Function Statement Block*
    *Configuration Selections*
    [*Resource requirements*]]

.
.
.

[*Function Statement Block*
    *Configuration Selections*
    [*Resource requirements*]]

4.6.1 Board Identification Block

Each configuration file must begin with a board identification block. Four required fields must be included in the board identification block to provide the basic ID requirements of the board; optional fields can be included to provide additional board identification information.

System boards require special configuration files and are covered in the section entitled, System Board Configuration File.

The board identification block has the following format.

```
BOARD
    ID = "7-character ID"                          ;Product ID
    NAME = "descriptive name"
    MFR = "manufacturer name"
    CATEGORY = "3-character category"
    [SLOT = ISA8|ISA16|ISA8OR16|OTHER|EISA|VIR|EMB[(n)] [,"text"]...]
    [LENGTH = value]                               ;In millimeters
    [AMPERAGE = value]                             ;5V current used, in mA
    [SKIRT = YES | NO]
    [READID = YES | NO]                            ;Readable product ID
    [BUSMASTER = value]                            ;Maximum acceptable latency (in µs)
    [IOCHECK = VALID | INVALID]
    [DISABLE = SUPPORTED | UNSUPPORTED]
    [COMMENTS = "general information"]
    [HELP = "help information"]
```

BOARD Statement (Required)

Syntax:
BOARD

The BOARD statement identifies the beginning of the Board Identification Block.

ID Statement (Required)

Syntax:
ID = *"7-character ID"*

The ID statement contains the seven-character expansion board ID. The ID is the uncompressed, ASCII representation of the product ID (see the section entitled, EISA Product Identifier, for information on compressed IDs). The seven-character ID consists of a three-character manufacturer code, a three-character hexadecimal product identifier, and a one character hexadecimal revision number. For example, the second revision of an expansion board manufactured by the ACME board company might have an uncompressed ID such as ACE0102.

NAME Statement (Required)

Syntax:
NAME = *"descriptive name"*

The NAME statement contains text that identifies the product. Part numbers and other information may also be included. The NAME text field can contain up to 90 ASCII characters.

MFR Statement (Required)

Syntax:
MFR = "*manufacturer name*"

The MFR statement contains a text field that identifies the board manufacturer. The MFR text field can contain up to 30 ASCII characters.

CATEGORY Statement (Required)

Syntax:
CATEGORY = "*3-character category*"

The CATEGORY statement contains a 3-character text field (use uppercase for consistency) that identifies the board's functional category. The configuration utility displays the CATEGORY text field (in upper case) during system configuration.

The CATEGORY statement must use one of the following categories:

COM = communications device
KEY = keyboard
MEM = memory board
MFC = multifunction board
MSD = mass storage device
NET = network board
NPX = numeric coprocessor
OSE = operating system/environment
OTH = other
PAR = parallel port
PTR = pointing device
SYS = system board
VID = video board

SLOT Statement (Optional)

Syntax:
SLOT = *value* [,"text"]...

The SLOT statement identifies the type of slot in which the expansion board can be installed. Options that can be entered in the *value* field include: ISA8, ISA16, ISA8OR16, EISA, VIR, EMB(n), OTHER, and at a text string. If the SLOT statement is omitted, the default is ISA16. For expansion devices that occupy physical slots (ISA8, ISA16, ISA8OR16, EISA, and OTHER), the value entered in the SLOT field is the actual size of the board's card edge. For example, an expansion board with an 8-bit card edge is set to SLOT = ISA8, an expansion board with a 16-bit card edge is set to SLOT = ISA16, and so on. ISA8OR16 is provided for 16-bit expansion boards that can also operate in an 8-bit slot.

A text string can be included with the slot statement following the value field. More than one text string can be included. Each text string must be enclosed in double quotes. The text is typically used to describe the slot. For example: SLOT=EISA,"MEMORY" could be used to describe an EISA slot reserved for a memory expansion board.

ISA8

This entry specifies an 8-bit ISA expansion board (fits in any slot of correct length).

ISA16

This entry specifies a 16-bit ISA expansion board (fits in an EISA or 16-bit slot of correct length).

ISA8OR16

This entry specifies an ISA expansion board configurable as 8- or 16-bit (fits in any EISA or ISA slot of correct length).

EISA

This entry indicates an EISA expansion board that requires a correct length EISA slot (fits in EISA slot only).

EMB[(n)]

This entry indicates a system board peripheral that uses slot-specific I/O space (embedded device). The slot-specific I/O range used determines the "n." The configuration utility searches for the device by checking the embedded device IDs if the "n" is omitted. The embedded devices are numbered sequentially from "y+1" (y equals the number of expansion bus connectors) to 15.

The system board configuration registers use the slot-specific I/O space, slot number 0, and are addressed as embedded device 0, EMB(0).

VIR

This entry indicates a virtual device. Virtual devices do not have slot-specific I/O or a readable ID. This entry is included for virtual devices so the configuration utility can perform conflict resolution and drivers can obtain configuration information regarding the devices. Any peripheral, device or software that needs a configuration file and is not covered by the other device types can be specified as a virtual device. Virtual devices are assigned numbers from 16 to a maximum of 64.

OTHER

This entry identifies a vendor-specific expansion slot.

LENGTH Statement (Optional)

Syntax:
[LENGTH = *value*]

The LENGTH statement specifies the length of the board in millimeters (a decimal integer). The LENGTH statement does not apply to embedded devices or virtual devices.

Expansion boards should include a LENGTH statement. The configuration utility cannot optimize the slot allocation if expansion boards do not specify length. If the LENGTH statement is omitted the configuration utility defaults to 330.

AMPERAGE Statement (Optional)

Syntax:
[AMPERAGE = *value*]

The AMPERAGE statement, when included in the board identification block, specifies the maximum amount of continuous 5V current (in milliamps) required by the base configuration of the expansion board. Installable options can specify additional 5V current requirements with an AMPERAGE statement in the CHOICE Statement Block (described later in this specification). The AMPERAGE statement does not apply to embedded devices or virtual devices.

Devices that require +5 volt power should include an AMPERAGE statement. The configuration utility cannot perform an accurate power usage verification if expansion boards do not specify their power requirement. If the AMPERAGE statement is omitted, the configuration utility defaults to AMPERAGE = 0.

SKIRT Statement (Optional)

Syntax:
[SKIRT = YES | NO]

The SKIRT statement indicates the presence of a drop-down skirt. (A drop-down skirt is an extended lower portion of an 8-bit expansion board that prevents installation into a 16-bit slot.) The default is NO.

READID Statement (Optional)

Syntax:
[READID = YES | NO]

READID specifies whether or not the expansion board has an ID that can be read from the EISA ID registers. The default value is NO.

BUSMASTER Statement (Optional)

Syntax:
[BUSMASTER = *value*]

The board identification block may include a BUSMASTER statement to identify the expansion board as a bus master and to specify the maximum acceptable latency. The latency *value* is a specification of the worst case acceptable time (in microseconds ) from the bus master bus request to the bus grant. The configuration utility assumes an expansion board is not a bus master if the BUSMASTER statement is omitted.

IOCHECK Statement (Optional)

Syntax:
[IOCHECK = VALID | INVALID]

IOCHECK is an optional statement that indicates support of the EISA expansion board control register IOCHKERR bit. VALID indicates that the expansion board responds to reads of its IOCHKERR bit. INVALID indicates that the expansion board does not respond to reads of the IOCHKERR bit. The default is VALID.

DISABLE Statement (Optional)

Syntax:
[DISABLE = SUPPORTED | UNSUPPORTED]

DISABLE is an optional statement that indicates support of the EISA expansion board control register ENABLE bit. SUPPORTED indicates that the expansion board can be disabled by clearing the ENABLE bit. UNSUPPORTED indicates that the expansion board cannot be disabled by clearing the expansion board control register ENABLE bit. The default is SUPPORTED.

COMMENTS Statement (Optional)

Syntax:
[COMMENTS = "*general information*"]

The COMMENTS statement provides information about the expansion board. The configuration utility displays the contents of the COMMENTS text field in a window at least 40 characters wide. This COMMENTS text field can contain up to 600 ASCII characters.

HELP Statement (Optional)

Syntax:
[HELP = "*help information*"]

The HELP statement provides information about the expansion board if the user requests help during the configuration. The configuration utility displays the HELP information in a window at least 40 characters wide. The HELP text field can contain up to 600 ASCII characters.

Example Board Identification Block

The following example illustrates a board identification block for a multifunction board.

```
BOARD
    ID = "ACE0102"                          ;Revision 02
    NAME = "EISA Multifunction Board"
    MFR = "ACME Inc."
    CATEGORY = "MFC"                        ;Multifunction board
    SLOT = EISA                             ;Requires EISA slot
    LENGTH = 330                            ;Full length board
    AMPERAGE = 3000                         ;3000 mA max current draw
    SKIRT = NO
    READID = YES
    COMMENTS = "The EISA Multifunction Board provides
        an asynchronous communication port,
        a parallel port, a game port and
        4 megabytes of memory."
    HELP = "The EISA Multifunction Board supports
        full automatic configuration.
        You may want to select the expanded
        memory configuration instead of taking
        the default, which is extended memory."
```

The SKIRT and length statements could be omitted from this board identification block, since the specified values equal the default value.

4.6.2 Initialization Information Block

The initialization information block consists of one or more of the following statement blocks:

I/O port initialization statement block

Switch configuration statement block

Jumper configuration statement block

Software initialization statement block

All expansion boards that require configuration must provide an initialization information block (IIB) in the configuration file. (A shorthand method described in the I/O Port INIT statement discussion in the section entitled INIT Statements, can be substituted for certain IIBs.)

4.6.2.1 I/O Port Initialization Statement Block

The I/O Port Initialization statement block begins with the IOPORT(i) statement. The syntax of the I/O port initialization statement block is:

```
IOPORT(i) = address                         ;I/O port address
    [SIZE = BYTE | WORD | DWORD]            ;Number of bits in I/O port
    [INITVAL = [LOC(bitlist) ] valuelist]   ;Initialization value
```

*address*, *bitlist*, and *valuelist* are printed in italics.

IOPORT(i) Statement (Required)

Syntax:
IOPORT(i) = *address*

The IOPORT(i) statement specifies the address of an I/O port. Each I/O port must have a separate IOPORT(i) statement with a different identifier, "i". The "i" can be any positive integer value from 1 to 32767. Resource and initialization statements use the IOPORT(i) to specify I/O port addresses.

See the "PORTVAR(j) Variable" section for an alternative method of specifying the I/O port address.

SIZE Statement (Optional)

Syntax:
[SIZE = BYTE | WORD | DWORD]

The SIZE statement specifies the number of bits in the I/O port. The default is BYTE.

INITVAL Statement (Optional)

Syntax:
[INITVAL = [ LOC( *bitlist*) ] *valuelist*]

The INITVAL statement specifies the source of the values written to an initialization port.

The *valuelist* portion specifies the source of each bit of a binary value. An "r" in a bit position indicates the bit value must be read from the port. An "x" in a bit position indicates the configuration utility determines the bit value based on the selected configuration. A "1" or "0" in a bit position indicates the bit is reserved and must be initialized to the specified value. The *valuelist* must be in MSBit to LSBit order.

The INITVAL statement may include the LOC(*bitlist*) string to reference individual bits. The *bitlist* contains a list or range of bit positions. The elements of the *bitlist* must be in MSBit to LSBit order. The following example illustrates valid INITVAL syntax.

```
INITVAL = 0000111100001111b          ;WORD port
INITVAL = 00001111b                  ;BYTE port
INITVAL = LOC(7-0) 001100rr          ;Byte port with "r" bits
INITVAL = LOC(7-2) 001100            ;Byte port (range)
INITVAL = LOC(7 6 1 0) 0011          ;4 bits specified
```

Example I/O Port Initialization Statement Block

The following example illustrates an I/O port initialization statement block. The two most significant bits are read from the I/O port, the next two bits are "1" and "0" respectively, and the four least significant bits are determined by the configuration utility.

```
IOPORT(1) = 3F8h          ;I/O port address
    INITVAL = rr10xxxxb   ;Bit pattern
```

4.6.2.2 Switch Configuration Statement Block

The switch configuration statement block begins with the SWITCH(i) statement. The syntax of the switch configuration statement block is:

```
SWITCH(i) = value                                       ;Number switches in set
    NAME = "switch name or description"
    STYPE = DIP | ROTARY | SLIDE                        ;Type of switch
    [VERTICAL = YES | NO]                               ;Switch orientation
    [REVERSE = YES | NO]                                ;Switch numbering scheme
    [LABEL = LOC(switchlist) textlist]                  ;Switch labels
    [INITVAL = LOC(switchlist) valuelist]               ;Switch settings
    [FACTORY = LOC(switchlist) valuelist]               ;Factory setting
    [COMMENTS = "configuration comments"]
    [HELP = "configuration help information"]
```

SWITCH(i) Statement (Required)

Syntax:
SWITCH(i) = *value*

The SWITCH(i) statement specifies the number of switch positions in a set. Each set of switches must have a separate SWITCH(i) statement with a different identifier, "i". The "i" can be any positive integer value from 1 to 32767. The maximum number of switches is "16" for all switch types. *Value* indicates the number of switches in the switch block.

NAME Statement (Required)

Syntax:
NAME = "*switch name or description*"

The NAME statement contains the switch name as it is designated in the user documentation. The name can be up to 20 characters long.

STYPE Statement (Required)

Syntax:
STYPE = DIP | ROTARY | SLIDE

The STYPE statement designates the type of switch as DIP, ROTARY, or SLIDE. A DIP switch is a set of switches, each having an "ON" and "OFF" position. A ROTARY switch is a set of switches with a rotating selector that can be set to one switch position. A SLIDE switch is a set of switches arranged linearly with a slide mechanism that can be set to one switch position. All switches within the set are numbered beginning with 1.

VERTICAL Statement (Optional)

Syntax:
[VERTICAL = YES | NO]

The VERTICAL statement indicates the orientation of the switch on the expansion board. Refer to the figure below for an illustration of switch orientation. The VERTICAL statement defaults to "NO."

REVERSE Statement (Optional)

Syntax:
[REVERSE = YES | NO]

The REVERSE statement specifies the order that a DIP switch is numbered. REVERSE = YES indicates 1234..., REVERSE = NO indicates ...4321 order. Refer to the figure below for an illustration of switch numbering. The REVERSE statement defaults to "NO."

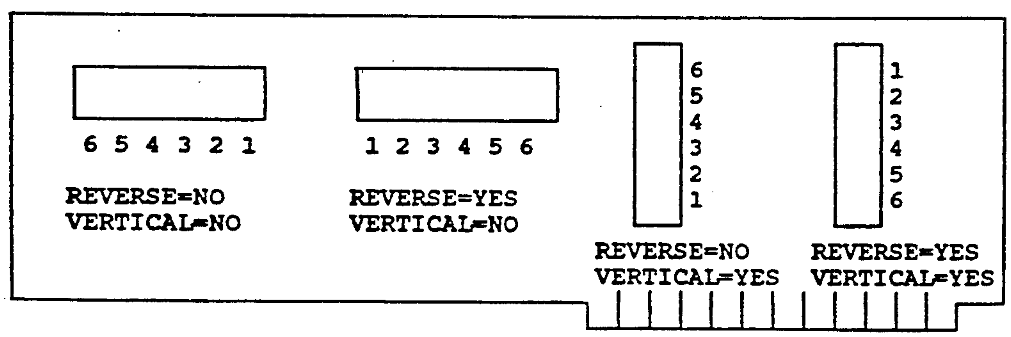

**LOC(*switchlist*) *valuelist***

The switch configuration statements LABEL, INITVAL and FACTORY include the LOC(*switchlist*) *valuelist* (or *textlist*) string to reference individual switches. The *switchlist* contains a list or range of switch numbers. The elements of the *switchlist* must be in ascending order if REVERSE=YES or descending order if REVERSE=NO. A space must be included between elements as a delimiter.

The *textlist* specifies the ASCII switch name and the *valuelist* specifies the switch setting for each switch position. The *valuelist* must use the same order as the *switchlist*. A DIP switch can be set for "1" to indicate "ON," "0" to indicate "OFF," or "x" to indicate "don't care." The dip switch settings are not delimited with a space. The *valuelist* for a rotary or slide switch includes a "1" in the position number of the selected position. Zeros fill the other positions.

The following examples illustrate valid LOC(*switchlist*) *valuelist* strings:

```
REVERSE=YES
INITVAL = LOC(1 2 3 4) 0011          ;List of DIP switches

REVERSE=NO
INITVAL = LOC(4 3 2 1) 1100          ;List of DIP switches

REVERSE=YES
INITVAL = LOC(1-4) 0011              ;Range of DIP switches

REVERSE=NO
INITVAL = LOC(4-1) 1100              ;Range of DIP switches

REVERSE=YES
INITVAL = LOC(1 2 3 4) 00x1          ;DIP switches with a don't care

REVERSE=YES
INITVAL = LOC(1-8) 00010000 ;8-position rotary or slide switch
```

LABEL Statement (Optional)

Syntax:
[LABEL = LOC(*switchlist*) *textlist*]

The LABEL statement specifies labels for individual switches. Each label can compose up to 10 characters. If the LABEL statement is omitted, the default label is the switch number (...4321 for normal switches and 1234... for reverse switches). The following example illustrates use of the LABEL statement:

```
LABEL = LOC(4-1) "SW1-4" "SW1-3" "SW1-2" "SW1-1"
```

INITVAL Statement (Optional)

Syntax:
[INITVAL = LOC(*switchlist*) *valuelist*]

The INITVAL statement specifies the settings for factory-set switches that must not be changed. If the INITVAL statement is omitted, switch settings are determined by the configuration program or are "don't care." This statement is particularly important for switches that control undocumented options. The following example illustrates use of the INITVAL statement:

```
INITVAL = LOC(4 3 2 1) xxx0       ;DIP switch 1 may not be changed
```

FACTORY Statement (Optional)

Syntax:
[FACTORY = LOC(*switchlist*) *valuelist*]

The FACTORY statement indicates the factory settings for the switches.

COMMENTS Statement (Optional)

Syntax:
[COMMENTS = "*configuration comments*"]

The COMMENTS statement contains information to assist the user in configuring a switch. The COMMENTS text field can contain a maximum of 600 characters. The configuration utility displays the text in a window at least 40 characters wide.

HELP Statement (Optional)

Syntax:
[HELP = "*configuration help information*"]

The HELP statement contains information that is displayed to the user if requested. The HELP text field can contain a maximum of 600 characters. The configuration utility displays the text in a window at least 40 characters wide.

Example Switch Configuration Statement Block

The following example illustrates a switch configuration statement block.

```
          ;INITIALIZATION INFORMATION BLOCK
SWITCH(1) = 8                           ;1st switch-8 positions
   NAME = "SWITCH BLOCK 1"
   STYPE = DIP                          ;DIP switch type
   VERTICAL = YES                       ;Vertical orientation
   FACTORY = LOC(8-1) 11110000          ;Factory setting = 11110000
   INITVAL = LOC(8-1) xxxxxxx0          ;One reserved switch
SWITCH(2) = 2                           ;2nd Switch-2 positions
   NAME = "SWITCH BLOCK 2"
   STYPE = SLIDE                        ;SLIDE switch type
   LABEL = LOC(2 1) "IRQ9" "IRQ8"       ;Position labels IRQ9, IRQ8
   FACTORY = LOC(2 1) 10  ;IRQ9 Setting
```

4.6.2.3 Jumper Configuration Statement Block

The jumper configuration statement block begins with the JUMPER(i) statement. The syntax of the jumper configuration statement block is:

```
JUMPER(i) = value                                   ;Number of jumpers in set
    NAME = "jumper name or description"
    JTYPE = INLINE | PAIRED | TRIPOLE               ;Type of jumper
    [VERTICAL = YES | NO]                           ;Jumper orientation
    [REVERSE = YES | NO]                            ;Jumper numbering scheme
    [LABEL = LOC(jumperlist) textlist]              ;ASCII Jumper labels
    [INITVAL = LOC(jumperlist) valuelist]           ;Jumper settings
    [FACTORY = LOC(jumperlist) valuelist]           ;Factory setting
    [COMMENTS = "configuration comments"]
    [HELP = "configuration help information"]
```

JUMPER(i) Statement (Required)

Syntax:
JUMPER(i) = *value*

The JUMPER(i) statement specifies the number of jumper positions in a set. Each set of jumpers must have a separate JUMPER(i) statement with a different identifier, i. The "i" can be any positive integer value from 1 to 32767. The value field has two meanings here depending on the type of jumper defined. For inline jumpers, value refers to the number of connections. For tripole and paired jumpers, value refers to the number of tripole or paired sets.

NAME Statement (Required)

Syntax:
NAME = "*jumper name or description*"

The NAME statement contains the jumper name as it is designated in the user documentation. The description can contain a maximum of 20 characters.

JTYPE Statement (Required)

Syntax:
JTYPE = INLINE | PAIRED | TRIPOLE

The JTYPE statement designates the type of jumper as INLINE, PAIRED, or TRIPOLE. INLINE jumpers are arranged in a straight line, such that each post can be connected to an adjacent post. PAIRED jumpers are arranged as a series of double posts, such that any single pair can be connected across the two posts. TRIPOLE jumpers are arranged as a series of triple posts, such that the middle post can be connected to either of the two adjacent posts.

The following figure illustrates each of the three JTYPEs.

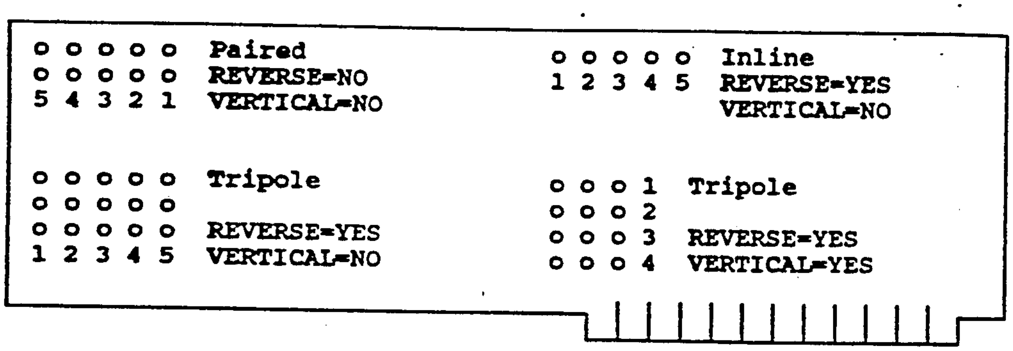

VERTICAL Statement (Optional)

Syntax:
[VERTICAL = YES | NO]

The VERTICAL statement indicates the orientation of the jumper on the expansion board. The VERTICAL statement defaults to "NO."

REVERSE Statement (Optional)

Syntax:
[REVERSE = YES | NO]

The REVERSE statement specifies the order that a jumper is numbered. REVERSE = YES indicates 1234..., REVERSE = NO indicates ...4321 order. The REVERSE statement defaults to "NO."

**LOC(*jumperlist*) *valuelist***

The jumper configuration statements LABEL, INITVAL and FACTORY include the LOC(*jumperlist*) *valuelist* string to reference individual jumper positions. The *jumperlist* contains a list of jumpers. The *valuelist* specifies the setting for each jumper. The *valuelist* must not be delimited with a space and must use the same order as the *jumperlist*.

A paired or tripole *jumperlist* can use a range to indicate the jumpers. The elements of the *jumperlist* must be in ascending order if REVERSE=YES, or descending order if REVERSE=NO. A space must be included between elements as a delimiter.

The *jumperlist* specifies inline jumpers by indicating the connection between two posts with a caret. For example, LOC(6^5 4^3 2^1) specifies the jumpers between posts 6 and 5, between posts 4 and 3, and between posts 2 and 1. The elements of the *jumperlist* must be in ascending order if REVERSE=YES, or descending order if REVERSE=NO. A space must be included between elements as a delimiter.

The paired and inline jumper *valuelist* settings can be indicated as "1" for "ON" (jumper installed), "0" for "OFF" (jumper not installed), or "x" for "don't care."

A tripole jumper *valuelist* settings can be indicated as "1" for "ON" (jumper installed in upper or right position), "0" for "OFF" (jumper installed in lower or left position unless otherwise marked), "n" for "NONE" (jumper not installed) or "x" for "don't care."

The following examples illustrate valid LOC(*jumperlist*) *valuelist* strings:

```
JTYPE=TRIPOLE
REVERSE=YES
INITVAL = LOC(1 2 3 4) 0011          ;List of tripole jumpers

JTYPE=PAIRED
REVERSE=NO
INITVAL = LOC(4 3 2 1) 1100          ;List of paired jumpers

JTYPE=PAIRED
REVERSE=YES
INITVAL = LOC(1-4) 0011              ;Range of paired jumpers

JTYPE=TRIPOLE
REVERSE=NO
INITVAL = LOC(4-1) 1100              ;Range of tripole jumpers

JTYPE=PAIRED
REVERSE=YES
INITVAL = LOC(1-4) x011              ;Range of paired jumpers with "x"

JTYPE=TRIPOLE
REVERSE=YES
INITVAL = LOC(1-4) x011              ;Range of tripole jumpers with "x"

JTYPE=TRIPOLE
REVERSE=YES
INITVAL = LOC(1-4) n011              ;Range of tripole jumpers with "n"

JTYPE=INLINE
REVERSE=NO
INITVAL = LOC(6^5 4^3 2^1) 101       ;List of inline jumpers
```

LABEL Statement (Optional)

Syntax:
[LABEL = LOC(*jumperlist*) *textlist*]

The LABEL statement specifies labels for individual jumpers. Each label can be composed of up s10 characters. If the LABEL statement is omitted, the default label is the switch number (...4321 for normal jumpers and 1234... for reverse jumpers). The following example illustrates use of the LABEL statement:

```
LABEL = LOC(4^3 2^1) "IRQ2" "IRQ3"         ;"IRQ2" (4^3), "IRQ3" (2^1)
```

INITVAL Statement (Optional)

Syntax:
[INITVAL = LOC(*jumperlist*) *valuelist*]

The INITVAL statement specifies the settings for factory-set jumpers that must not be changed. If the INITVAL statement is omitted, jumper settings are determined by the configuration program are "don't care." This statement is particularly important for jumpers that control undocumented options andrequire specific settings. The following example illustrates use of the INITVAL statement:

INITVAL = LOC(4 3 2 1) 0011 ;Paired (or tripole) jumper settings

FACTORY Statement (Optional)

Syntax:
[FACTORY = LOC(*jumperlist*) *valuelist*]

The FACTORY statement indicates the factory settings for the jumpers.

COMMENTS Statement (Optional)

Syntax:
[COMMENTS = "*configuration comments*"]

The COMMENTS statement contains information to assist the user in configuring a jumper. The COMMENTS text field can contain a maximum of 600 characters. The configuration utility displays the text in a window at least 40 characters wide.

HELP Statement (Optional)

Syntax:
[HELP = "*configuration help information*"]

The HELP statement contains information that is displayed to the user if requested. The HELP text field can contain a maximum of 600 characters. The configuration utility displays the text in a window at least 40 characters wide.

Example Jumper Configuration Statement Block

The following example illustrates a jumper configuration statement block.

```
            ;INITIALIZATION INFORMATION BLOCK
JUMPER(1) = 5                                          ;1st set-5 positions(6 posts )
   NAME = "J101"
   JTYPE = INLINE                                      ;Inline jumper type
   VERTICAL = YES                                      ;Vertical orientation
   LABEL = LOC(6^5 4^3 2^1) "Test" "IRQ8" "IRQ9"       ;Labels Test, IRQ8, IRQ9
   INITVAL = LOC(6^5 4^3 2^1) 0xx                      ;Reserved jumper
   FACTORY = LOC(6^5 4^3 2^1) 001                      ;Factory Setting = IRQ9
```

The configuration utility displays a diagram to illustrate the jumper settings. For example:

```
           o  6
Test
           o  5

           o  4
IRQ8
           o  3

           •  2
IRQ9       |
           •  1

           J101
```

4.6.2.4 SOFTWARE(Initialization) Statement Block (Optional)

Syntax:
SOFTWARE(i) = "*description*"

The software statement block begins with the SOFTWARE (i) statement. The syntax of the software configuration statement block is:

*Note: there are no other statements in the block.

The software initialization statement block provides user information and instructions about software drivers for display during system configuration. The instructions may, for example, indicate the software options to incorporate into the operating system startup files or a program that must be executed to initialize an expansion board. The software initialization statement block can include entries for the CONFIG.SYS and AUTOEXEC.BAT files of an MS-DOS operating system.

The startup files may execute programs that require command line parameters (for example, /s, /g).

Each software statement must have a separate SOFTWARE(i) statement with a different identifier, "i." The "i" can be any positive integer value from 1 to 32767. The *description* can be a maximum of 600 characters.

The configuration utility displays the software description with switch settings and other configuration information, during system configuration.

See the section on INIT Statements for more details about the software(i) statement.

4.6.3 FUNCTION Statement Block

A FUNCTION statement block consists of the following statements:

- FUNCTION Statement–identifies the name of the expansion board function (for example, "Asynchronous communications port").
- TYPE Statement–identifies the function type (for example: a communications port is type "COM").
- CHOICE Statements with resource description blocks–identify the configuration alternatives (i.e., initializations, I/O ports, interrupts, DMA channels and memory).

The FUNCTION statement block has the following format:

FUNCTION = "*function name*"<br>
    [TYPE = "*function type*"]<br>
    [COMMENTS = "*information*"]<br>
    [CONNECTION = "*connector orientation and description*"]<br>
    [HELP = "*information*"]<br>
    CHOICE = "*configuration name*"<br>
        [*Resource Description Block*]<br>
    [CHOICE = "*configuration name*"<br>
        *Resource Description Block*]<br>
        .<br>
        .<br>
        .<br>
    [CHOICE = "*configuration name*"<br>
        *Resource Description Block*]<br>
    [SUBFUNCTION STATEMENT BLOCK]

A separate function statement block must be supplied for each function of a multifunction expansion board. The following example illustrates the two function statement blocks for an expansion board with a communications port and a parallel port.

FUNCTION = "Asynchronous communications port"<br>
    CHOICE = "*configuration name*"<br>
        *Resource Description Block*<br>
FUNCTION = "Parallel port"<br>
    CHOICE = "*configuration name*"<br>
        *Resource Description Block*

FUNCTION Statement (Required)

Syntax:
FUNCTION = "*function name*"

Each function statement block begins with a function statement that specifies the function name. The function name consists of free-form ASCII text with a maximum of 100 characters. All function names within a single configuration file must be unique, but different configuration files can have common function names.

The configuration utility displays the function name during configuration, but does not store it in nonvolatile memory.

TYPE Statement (Optional)

Syntax:
[TYPE = "*function type*"]

A functions statement block is supplemented with a TYPE statement that identifies the function type with a three-character ASCII string. The following table identifies commonly used function types.

Commonly Used Function Types

| | |
|---|---|
| KEY–keyboard | PAR–parallel port |
| MEM–memory board | PTR–pointing device |
| MSD–mass storage device | COM–communications port |
| NET–network adapter | VID–video display adapter |
| NPX–numeric coprocessor | SYS–system board |
| OTH–other | OSE–operating system/environment |

The TYPE statement should use one of the listed types when applicable. A TYPE statement can contain a type not included in the "Commonly Used Function Types" table above, but all types must be three-character ASCII strings. The type is stored in nonvolatile memory as upper-case. It should be entered in the configuration file in upper-case for consistency.

The function type can be supplemented by appending multiple, comma-delimited, ASCII strings to the initial three-character type. The supplemental type ASCII strings are not limited to three characters. For example, an asynchronous communications port can have the following TYPE statement:

TYPE = "COM,ASY"

The configuration utility stores the TYPE statement's ASCII string in nonvolatile memory during configuration. EISA systems provide a total of 80 bytes of nonvolatile memory to store the TYPE statement's ASCII string and SUBTYPE statement's ASCII string. The 80 bytes include the comma and semicolon delimiters between the type and SUBTYPE string fragments.

A device driver can use the type string to determine the general class of functionality of a device. The device driver can use the subtype string to determine the configuration of a device.

The resource description block section SUBTYPES are dicussed later in this specification.

COMMENTS Statement (Optional)

Syntax:
[COMMENTS = "*information*"]

A function statement block can include a COMMENTS statement that provides relevant information about the function. The comment could identify an expansion board manufacturer and part number, configuration instructions or any other useful information. The comment consists of free-form ASCII text with a maximum of 600 characters. The configuration utility displays the text in a window at least 40 characters wide.

The configuration utility displays the comment during configuration when the function is selected. It does not store the comment in nonvolatile memory.

HELP Statement (Optional)

Syntax:
[HELP = "*help information*"]

The HELP statement contains information that is displayed to the user if requested. The help text field can contain a maximum of 600 characters. The configuration utility displays the text in a window at least 40 characters wide.

CONNECTION Statement (Optional)

Syntax:
CONNECTION = "*connector orientation and description*"

A configuration file can specify the orientation and description of connectors by including the CONNECTION statement in the FUNCTION statement block.

The connection string consists of an ASCII string with a maximum length of 40 characters. Typical connection strings include "top," "bottom," "upper," "lower," "middle," etc. The configuration utility includes a command that displays the connection string.

4.6.3.1 CHOICE Statement Block

Each function statement block is accompanied by at least one choice statement block that specifies the initializations and system resource requirements of a possible configuration. The configuration utility uses the first choice statement block as the default. Multiple choice statement blocks are sequentially arranged in the order of preference. The choice statement block begins with a choice statement that specifies the "name" of the configuration. A choice statement block has the following syntax:

CHOICE = "*configuration name*"
[SUBTYPE = "*device description*"]
[DISABLE = YES | NO"]
[AMPERAGE = *value*]
[TOTALMEM = *rangelist* [STEP = *value*]]
*Resource Description Block*

A communications port, for example, can have the following function statement block and associated choice statement blocks:

FUNCTION = "Asynchronous Communications Port"
CHOICE = "COM1"
*Resource Description Block*
CHOICE = "COM2"
*Resource Description Block*

The system resource requirements (described in the "Resource Description Block" section) for the named configuration follow the CHOICE statement.

CHOICE Statement (Optional)

Syntax:
CHOICE = "*configuration name*"

The choice statement block begins with a CHOICE statement that specifies the "name" of the configuration. The "name" is an ASCII string with a maximum of 90 characters.

During configuration, the configuration utility displays all CHOICE statement configuration names for the selected function. The configuration utility does not store the name in nonvolatile memory.

DISABLE Statement (Optional)

Syntax:
[DISABLE = YES | NO]

A CHOICE statement can be used to disable the expansion board function. Each function to be disabled requires a separate DISABLE = YES statement. The default is DISABLE = NO. The following example illustrates use of the DISABLE = YES statement.

```
FUNCTION = "Communications Port"
    CHOICE = "COM1"
        Resource Description Block
    CHOICE = "COM2"
        Resource Description Block
    CHOICE = "Disable Communications Port"
        DISABLE = YES
```

SUBTYPE Statement (Optional)

Syntax:
[SUBTYPE = "*device description*"]

Each choice statement block can contain a subtype statement that names the configuration (with a short mnemonic) associated with the choice. The subtype can be supplemented by appending multiple, semicolon-delimited, ASCII strings to the initial subtype.

A device driver can use the SUBTYPE string to determine the configuration of a device. The device driver may use the type string to determine the general class of functionality of a device.

A communications port may have SUBTYPE statements as follows:

```
FUNCTION = "Internal Modem"
    TYPE = "COM,ASY,MDM"
    CHOICE = "Modem assigned to COM1"
        SUBTYPE = "COM1"
        Resource Description Block
    CHOICE = "Modem assigned to COM2"
        SUBTYPE = "COM2"
        Resource Description Block
```

The SUBTYPE should be a short ASCII string. The SUBTYPE string supplements the type string by identifying the selected configuration (the type string identifies the type of device). The configuration utility stores the concatenated type and SUBTYPE ASCII strings, with a semicolon delimiter, in nonvolatile memory during configuration. EISA systems provide a total of 80 bytes of nonvolatile memory to store the type statement's ASCII string and SUBTYPE statement's ASCII string. The 80 bytes include the comma and semicolon delimiters between type and SUBTYPE string fragments.

AMPERAGE Statement (Optional)

Syntax:
[AMPERAGE = *value*]

The AMPERAGE statement, when included in the choice statement block, specifies the maximum amount of continuous 5V current (in milliamps) required by the option specified by the choice statement block. The total 5V current includes the amount specified in the board identification block plus the amount specified for the selected options. The AMPERAGE statement does not apply to virtual devices.

TOTALMEM Statement (Optional)

Syntax:
TOTALMEM = *rangelist* [STEP = *value*]

A choice statement block can contain a TOTALMEM statement that indicates the total amount of memory specified by the choice. The TOTALMEM statement is required for a memory block that can have its allocation split between system memory (SYS) and expanded memory (EXP).

See the TOTALMEM statement and example in the section entitled, Memory Description Block, for more detailed information.

4.6.3.2 SUBCHOICE Statement Block

The purpose of the subchoice statement block is to handle resource statement alternatives that are too complex for individual CHOICE statements (for example, memory configurations of some memory boards).

A choice statement block can include statements that specify alternative configurations. A subchoice statement block can use any statement that is valid for a choice statement block. The subchoice alternatives must be automatically selectable by the configuration utility with information available from the configuration files. The configuration utility does not present subchoice alternatives for selection by a user, although the user can scroll through the resources specified in subchoice statement blocks.

The syntax for the SUBCHOICE statement is shown below:

SUBCHOICE
*Resource Description Block*

A choice statement block can have as many subchoice statement blocks as needed. The configuration utility sequentially checks each subchoice resource description block and selects the first one that does not conflict with other devices in the configuration.

The combination of the choice resource description block and one subchoice resource description block contains the resource and initialization requirements for the configuration. The configuration utility includes the choice and the selected SUBCHOICE resource requirements in the data written to nonvolatile memory for use by the power-up routines.

The following example illustrates a configuration file fragment that specifies a memory allocation that back fills 128K of memory into the base address range between 512K and 640K if only 512K is installed. The remainder of memory on the expansion board is allocated to extended memory. The user selects the total amount of memory on the expansion board and views the subchoice alternatives. The subchoice selection (between back fill and extended memory) does not require input from the user, since the amount of base memory installed is available from the configuration file. The subchoice statement blocks are included in a single choice statement block that is presented to the user:

```
CHOICE = "Add Base and Extended Memory"
    TOTALMEM = 128K-2048K  STEP 128K

;   128K base memory back fill into range 512K-640K
;       (512K base memory already installed)

    SUBCHOICE
        FREE                                    ;128K back fill
            MEMORY = 128K
            ADDRESS = 512K
            MEMTYPE = SYS
        COMBINE                                 ;Extended Memory for the rest
            MEMORY = 0K-1920K  STEP 128K
            ADDRESS = 1M
            MEMTYPE = SYS

;   No base memory back fill
;       (640K base memory already installed)

    SUBCHOICE
        COMBINE                                 ;All Extended Memory
            MEMORY = 128K-2048K  STEP 128K
            ADDRESS = 1M-16M  STEP 128K
            MEMTYPE = SYS
```

Selection of the starting address could be presented to the user as a sequence of CHOICE statements for selection by the user:

```
;   128K base memory back fill into range 512K-640K
;       (512K base memory already installed)

CHOICE = "Add Base and Extended Memory"
    TOTALMEM = 128K-2048K  STEP 128K
    FREE                        ;128K back fill
        MEMORY = 128K
        ADDRESS = 512K
        MEMTYPE = SYS
    COMBINE                     ;Extended Memory for the rest
        MEMORY = 0K-1920K  STEP 128K
        ADDRESS = 1M
        MEMTYPE = SYS

;   No base memory back fill
;       (640K base memory already installed)

CHOICE = "Add Extended Memory"
    TOTALMEM = 128K-2048K  STEP 128K
        COMBINE                 ;All Extended Memory
        MEMORY = 128K-2048K  STEP 128K
        ADDRESS = 1M-16M  STEP 128K
        MEMTYPE = SYS
```

The configuration utility presents each named choice to the user for selection. The user can make the selection or let the configuration utility automatically make the selection.

SUBCHOICE statements are not appropriate if the user might need to make the selection. For example, the user may need to select a serial port as COM1 or COM2. The configuration utility presents the choices to the user, and the user either makes the selection manually or lets the configuration utility select automatically.

SUBCHOICE Statement (Optional)

Syntax:
[SUBCHOICE]

The subchoice statement block begins with a SUBCHOICE statement. The SUBCHOICE statement does not have a name field for display, since subchoice statement blocks are selected automatically by the configuration utility.

SUBFUNCTION Statement Block (Optional)

A function statement block may contain one or more subfunction statement blocks that specify the configuration information for a set of related components with separate resource or initialization requirements. A subfunction statement block provides separate configuration of the function's components.

A subfunction statement block can use any statement that is valid for a function statement block. The syntax of a subfunction statement block is:

```
SUBFUNCTION = "function name"
    [TYPE = "function type"]
    [COMMENTS = "information"]
    [CONNECTION = "connector orientation and description"
    [HELP = "information"]
    CHOICE = "configuration name"
        Resource Description Block
    [CHOICE = "configuration name"
        Resource Description Block]
        .
        .
        .
    [CHOICE = "configuration name"
        Resource Description Block]
```

The configuration utility stores the resource and initialization information from subfunction statement blocks with the function information. Subfunction statement blocks are not stored as separate functions in nonvolatile memory.

Syntax:
SUBFUNCTION = "*name*"

The subfunction statement block begins with a subfunction statement that specifies the *name* of the configuration. The *name* is an ASCII string with a maximum of 90 characters.

During configuration, the configuration utility displays all CHOICE configuration names for the selected subfunction.

The following example illustrates use of subfunction statement blocks to configure the parity and baud rate for an asynchronous communications port. The example includes the statement blocks with type and subtype strings. The resource and initialization statements are omitted for simplicity.

```
FUNCTION = "1200/2400 Baud Modem"
    TYPE = "COM,ASY,MDM"
    SUBFUNCTION = "Port Address"
        CHOICE = "COM1 Serial Port"
            SUBTYPE = "COM1"
        CHOICE = "COM2 Serial Port"
            SUBTYPE = "COM2"
    SUBFUNCTION = "Parity Selection"      ;No SUBTYPE under SF
        CHOICE = "ODD"
            SUBTYPE = "PARITY=ODD"        ;SUBTYPE under CHOICE
        CHOICE = "EVEN"
            SUBTYPE = "PARITY=EVEN"
    SUBFUNCTION = "Baud Rate Selection"
        CHOICE = "1200 Baud"
            SUBTYPE = "BAUD=1200"         ;SUBTYPE under CHOICE
        CHOICE = "2400 Baud"
            SUBTYPE = "BAUD=2400"
```

The type/subtype string for the "1200/2400 Baud Modem" function (with COM1, odd parity and 2400 baud selections) in nonvolatile memory is:

"COM,ASY,MDM;COM1;PARITY=ODD;BAUD=2400"

The example above used SUBTYPE statements under the CHOICE statements but not under the SUBFUNCTION statements. The following example illustrates an alternative method with the SUBTYPE statements under the SUBFUNCTION and the CHOICE statements:

```
FUNCTION = "1200/2400 Baud Modem"
    TYPE = "COM,ASY,MDM"
    SUBFUNCTION = "Port Address"
        CHOICE = "COM1 Serial Port"
            SUBTYPE = "COM1"
        CHOICE = "COM2 Serial Port"
            SUBTYPE = "COM2"
    SUBFUNCTION = "Parity Selection"
        TYPE = PARITY                      ;TYPE under SUBFUNCTION
        CHOICE = "ODD"
            SUBTYPE = "ODD"                ;SUBTYPE under CHOICE
        CHOICE = "EVEN"
            SUBTYPE = "EVEN"
    SUBFUNCTION = "Baud Rate Selection"
        TYPE = BAUD                        ;TYPE under SUBFUNCTION
        CHOICE = "1200 Baud"
            SUBTYPE = "1200"               ;SUBTYPE under CHOICE
        CHOICE = "2400 Baud"
            SUBTYPE = "2400"
```

The type/subtype string for the "1200/2400 Baud Modem" function (with COM1, odd parity and 2400 baud selections) in nonvolatile memory is:

"COM,ASY,MDM;COM1,PARITY;ODD,BAUD;2400"

4.6.3.3 GROUP Statement Block

A group statement block may be used to enclose a set of functionstatement blocks that specify the configuration information for a set of related components with separate resource or initialization requirements.

A set of grouped function statement blocks allows separate configuration of a function's components. A grouped function statement block can use any statement that is valid for independent function statement blocks. The syntax of a grouped set of function statement blocks is:

```
GROUP = "name"
    [TYPE = "type"]
FUNCTION = "name"
    [TYPE = "function type"]
    [COMMENTS = "information"]
    [HELP = "information"]
    CHOICE = "name"
        resource description block
        .
        .
    [CHOICE = "name"
        resource description Block]
FUNCTION = "name"
    [TYPE = "function type"]
    [COMMENTS = "information"]
    [HELP = "information"]
    CHOICE = "name"
        resource description block
        .
        .
    [CHOICE = "name"
        resource description block]
FUNCTION = "name"
    [TYPE = "function type"]
    [COMMENTS = "information"]
    [HELP = "information"]
    CHOICE = "name"
        resource description block
        .
        .
    [CHOICE = "name"
        resource description block]
FUNCTION = "name"
    .
    .
ENDGROUP
```

The configuration utility saves the resource and initialization information for each function specified in the grouped set as a separate function entry in nonvolatile memory. The group statement block may include a TYPE statement. The group type string prepends to each TYPE string in the set of grouped function statement blocks. The configuration utility stores the group type string in nonvolatile memory for a grouped function statement block that omits the type statement.

Presentation of options during configuration and TYPE string prepending in nonvolatile memory are the only differences between a set of grouped FUNCTION statement blocks and a set of independent FUNCTION statement blocks.

GROUP and ENDGROUP Statements (Optional)

Syntax:
```
[GROUP = "name"]
      .
      .
      .
[ENDGROUP]
```

A grouped set of function statement blocks begins with the GROUP statement and ends with an ENDGROUP statement. The group name can be a maximum of 60 characters. Each GROUP statement must have a corresponding ENDGROUP statement.

Example Use of Grouped FUNCTION Statement Blocks

The following configuration file fragment illustrates the use of grouped function statement blocks that specify the configuration options for a fixed disk controller and disk drive. For simplicity, the configuration file fragment includes the TYPE and SUBTYPE statements, but does not include resource or initialization statements. The GROUP statement block and some function statement blocks have a TYPE statement.

```
GROUP = Fixed Disk Drives       ;Fixed disk controller group
    TYPE = "MSD"                ;Prepends to each FUNCTION TYPE
FUNCTION = "Fixed Disk Controller Selection"
    TYPE = "DSKCTL"
    CHOICE = "Primary Controller"
        SUBTYPE = "PRI"
    CHOICE = "Secondary Disk Controller"
        SUBTYPE = "SEC"
FUNCTION = "Device for Unit 1"
    TYPE = "UNIT1"
    CHOICE = "Not Installed"
        SUBTYPE = "DSKDRV,TYP=00"
    CHOICE = "300mb - TYPE 38"
        SUBTYPE = "DSKDRV,TYP=38"
    CHOICE = "130mb - TYPE 43"
        SUBTYPE = "DSKDRV,TYP=43"
FUNCTION = "Device for UNIT 2"
    TYPE = "UNIT2"
    CHOICE = "Not Installed"
        SUBTYPE = "DSKDRV,TYP=00"
    CHOICE = "300mb - TYPE 38"
        SUBTYPE = "DSKDRV,TYP=38"
    CHOICE = "130mb - TYPE 43"
        SUBTYPE = "DSKDRV,TYP=43"
ENDGROUP
```

The grouped function statement blocks are stored separately in nonvolatile memory. The type string for each of the function statement blocks includes the group type string (prepended to the function type string). Nonvolatile memory contains the following type strings (assuming the choice selections are: primary controller with a 300 MB drive for UNIT1 and UNIT2 is not installed).

FUNCTION = "Fixed disk Controller Selection"
TYPE string: MSD,DSKCTL;PRI

FUNCTION = "Device for Unit 1"
TYPE STRING: MSD,UNIT1,DSKDRV,TYP=38

FUNCTION = "Device for Unit 2"
TYPE string: MSD,UNIT2,DSKDRV,TYP=00

4.6.4 Resource Description Block

A resource description block may accompany each CHOICE statement to identify the initialization and system resource requirements of the named configuration. The resource description block can contain any of the following information:

- DMA Channel Description Block--specifies the choice of DMA channels supported, whether the channel can be shared, the channel's data size, the channel's cycle timing, and any initialization necessary
- Interrupt Description Block--specifies the choice of interrupts supported, whether the interrupt can be shared, whether the interrupt is edge or level sensitive, and any initialization necessary
- I/O Port Description Block--specifies the port address, and any initialization necessary
- Memory Description Block--specifies the amount of memory supported, the starting address, and whether the memory is cacheable it also identifies the memory as RAM or ROM, defines the memory usage (system, expanded, virtual or other), and specifies any initialization necessary to configure the memory
- Switch and Jumper Description Blocks--specify the switch and jumper settings for the configuration
- Programmable Port Initialization Block--specifies the initialization for programmable ports for the configuration
- Software Initialization Block--specifies any software initialization necessary The syntax of a DMA resource description block is as follows:

```
[DMA = list
    [SHARE = YES | NO | "text"]
    [SIZE = BYTE | WORD | DWORD]
    [TIMING = DEFAULT | TYPEA | TYPEB | TYPEC]]
```

The syntax of an I/O port resource description block is as follows:

```
[PORT = list/rangelist [STEP = value [COUNT = VALUE]
    [SHARE = YES | NO | "text"]
    [SIZE = BYTE | WORD | DWORD]]
```

The syntax of an interrupt resource description block is as follows:

```
[IRQ = list
    [SHARE = YES | NO | "text"]
    [TRIGGER = LEVEL | EDGE]]
```

The syntax of a memory resource description block is as follows:

```
[MEMORY = rangelist [STEP = value]
    [ADDRESS = rangelist [STEP = value]]
    [WRITABLE = YES | NO]
    [MEMTYPE = SYS | EXP | VIR | OTH]
    [CACHE = YES | NO]
    [SHARE = YES | NO | "text"]
    [SIZE = BYTE | WORD | DWORD]
    [DECODE = 20 | 24 | 32]
```

4.6.4.1 DMA Channel Description Block

A DMA channel description block consists of a group of statements that specifies the DMA channels required by an expansion board function. The configuration file can contain a maximum of four DMA description blocks for any one function. The syntax of a DMA channel description block is:

```
DMA = DMA channel number
    [SHARE = YES | NO | "text"]
    [SIZE = BYTE | WORD | DWORD]
    [TIMING = DEFAULT | TYPEA | TYPEB | TYPEC]
```

An OR operator can be used to separate multiple DMA channel lists (as illustrated in the following syntax) if each list supports identical SHARE, SIZE and TIMING characteristics:

```
DMA = value [| value] ...
    [SHARE = YES | NO | "text"]
    [SIZE = BYTE | WORD | DWORD]
    [TIMING = DEFAULT | TYPEA | TYPEB | TYPEC]
```

Multiple DMA channel description blocks must be used for a function with multiple DMA channels that have different share, size or timing characteristics, as illustrated in the following syntax:

```
DMA = DMA channel number   ;1st DMA channel
    [SHARE = YES | NO | "text"]
    [SIZE = BYTE | WORD | DWORD]
    [TIMING = DEFAULT | TYPEA | TYPEB | TYPEC]
DMA = DMA channel number   ;2nd DMA channel
    [SHARE = YES | NO | "text"]
    [SIZE = BYTE | WORD | DWORD]
    [TIMING = DEFAULT | TYPEA | TYPEB | TYPEC]
```

An expansion board function can request up to four DMA channels. Each channel selected during system configuration is stored in nonvolatile memory with the appropriate share, size and timing characteristics. The DMA device driver can retrieve the DMA information from nonvolatile memory and use it to initialize the DMA device.

The system ROM automatically determines the I/O port address and initialization values and programs the following DMA controller registers:

DMA controller (Extended Mode Register)
- DMA channel cycle timing
- DMA data size and addressing mode DMA controller (DMA Command Register)
- DRQ and DAK* assert level (high/low)
- Fixed or rotating priority The configuration file should not provide initialization values for programming the DMA controller Extended Mode Register. The configuration file should also not provide initialization values for the DMA Command Register priority scheme. If the DMA channel is not shared, the configuration file can specify the DRQ and DAK* assert levels by including the initialization value for the DMA Command Register bits that determine the assert level (DRQ defaults to assert when high, DAK* defaults to assert when low).

DMA Statement (Optional)

Syntax:
DMA = value [| value] ...

The DMA statement marks the beginning of a DMA description block and specifies the DMA channel number (or list of channels or multiple lists of channels) supported by the configuration.

SHARE Statement (Optional)

Syntax:
[SHARE = YES | NO | "*text*"]

The SHARE statement specifies whether the function can share the DMA channel. The default for SHARE is NO. A text identifier can be specified to indicate that the function can only share the DMA channel with a device that has a matching identifier. The identifier can be up to 10 characters.

DMA channels can be shared by two devices that never require the channel simultaneously. For example, a floppy drive and tape drive attached to the same controller could share a DMA channel since the floppy drive and tape drive never use the channel at the same time.

Two devices that may need to transfer data at the same time cannot share a DMA channel. Two network adapters, for example, would have conflicting requirements for a single DMA channel.

SIZE Statement (Optional)

Syntax:
[SIZE = BYTE | WORD | DWORD]

The SIZE statement indicates the DMA device data transfer width as BYTE, WORD or DWORD. The default size is BYTE for DMA channels 0-3 and WORD for channels 4-7.

TIMING Statement (Optional)

Syntax:
[TIMING = DEFAULT | TYPEA | TYPEB | TYPEC]

The TIMING statement indicates the bus cycle type executed by the DMA controller during the transfer. The default transfer cycle type is default, which is compatible with ISA DMA devices. Higher performance ISA devices can use type A or type B for faster transfers. DMA devices that support EISA bus cycles can use type C (burst) DMA transfers, which provide the highest data transfer rate.

The DMA cycle types and timing are described in section 2 of this specification.

Example DMA Channel Request Block

The ACME tape controller can use DMA channel 3 or 5 and cannot share the channel. The ACME tape controller uses 16-bit DMA transfers and can support type B timing. The following diagram illustrates the DMA request block for the ACME tape controller:

```
DMA = 3 | 5
    SHARE = NO
    SIZE = WORD
    TIMING = TYPEB
```

4.6.4.2 Interrupt Description Block

An interrupt description block consists of a group of statements that specifies the interrupt requirements of an expansion board. The configuration file can contain a maximum of seven interrupt description blocks for any one function. The interrupt description block has the following format:

```
IRQ = value [| value] ...
    [SHARE = YES | NO | "text"]
    [TRIGGER = LEVEL | EDGE]
```

Multiple interrupt request blocks must be used for a function with multiple interrupts that have different share and trigger characteristics, as illustrated in the following syntax:

```
IRQ = value
    [SHARE = YES | NO | "text"]
    [TRIGGER = LEVEL | EDGE]
IRQ = value
    [SHARE = YES | NO | "text"]
    [TRIGGER = LEVEL | EDGE]
```

An OR operator can be used to separate multiple interrupts (as illustrated in the following syntax) if each interrupt supports identical share and trigger characteristics:

```
IRQ = value [| value] ...
    [SHARE = YES | NO | "text"]
    [TRIGGER = LEVEL | EDGE]
```

IRQ Statement (Optional)

Syntax:
IRQ = *Interrupt number*

The IRQ statement marks the beginning of an interrupt request block and specifies the interrupt number (or multiple interrupts) supported by the configuration.

Each interrupt selected during system configuration is stored in nonvolatile memory with the appropriate share and trigger characteristics. The interrupt device driver can retrieve the interrupt controller initialization information from nonvolatile memory to determine the method of handling interrupts.

The system ROM automatically determines the I/O port address and initialization values and programs the interrupt controller edge/level register. The configuration file should not provide initialization values for programming the interrupt controller edge/level register.

SHARE Statement (Optional)

Syntax:
[SHARE = YES | NO | "*text*"]

The SHARE statement indicates whether the function can share this interrupt. The default value for this field is NO. For EISA boards capable of sharing interrupts, this field should be SHARE = YES. A text identifier can be specified to indicate that the function can only share the interrupt with a device that has a matching identifier. The identifier can be up to 10 characters.

TRIGGER Statement (Optional)

Syntax:
[TRIGGER = LEVEL | EDGE]

The TRIGGER statement specifies whether the ROM initializes the interrupt controller to edge or level triggered. The default is TRIGGER = EDGE. In most cases, if the SHARE statement is YES, the TRIGGER statement should be set to LEVEL; however, there are some designs that require shared, edge-triggered interrupts, so a TRIGGER = LEVEL statement does not necessarily have to follow a SHARE = YES statement.

Example Interrupt Description Block

The ACME tape controller needs two interrupts. It can use interrupts 12 or 15, but it cannot share the assigned interrupts. The ACME tape controller needs the chosen interrupts to be edge triggered. Note that share and trigger fields could be omitted, because the defaults are used.

```
IRQ = 12 | 15
    SHARE = NO
    TRIGGER = EDGE
```

4.6.4.3 I/O Port Description Block

An I/O port description block consists of a group of statements that specifies the I/O ports used by a device. The configuration file can contain a maximum of 20 I/O port description blocks for any one function. The I/O Port Request Block has the following format:

PORT = range/list [STEP = *value* [COUNT = *value*]]
    [SHARE = YES | NO | "*text*"]
    [SIZE = BYTE | WORD | DWORD]

PORT Statement (Optional)

Syntax:
PORT = list/range [STEP = *value* [COUNT = *value*]]
or
PORT = *list*

The I/O Port Request Block begins with a PORT statement. The PORT statement can specify a single address, a list of addresses, or a rangelist that specifies the selections for the port address.

The STEP parameter that follows the *rangelist* identifies the address increment of the port selections. The COUNT parameter specifies the number of ports allocated from the selected STEP address block. If the COUNT parameter is omitted, the configuration utility uses a default COUNT value equal to the STEP value. If the STEP parameter is omitted, the configuration utility allocates the entire range (a COUNT without STEP is invalid). The following examples illustrate a PORT statement with a *rangelist*:

;allocates 16 ports: 300h-30Fh
PORT = 300h-30Fh

;allocates 4 ports: 300h-303h or 304h-307h or 308h-30Bh or 30Ch-30Fh
PORT = 300h-30Fh STEP = 4

;allocates 2 ports: 300h-301h or 304h-305h or 308h-309h or 30Ch-30Dh
PORT = 300h-30Fh STEP = 4 COUNT = 2

SHARE Statement (Optional)

Syntax:
[SHARE = YES | NO | "*text*"]

The SHARE statement specifies whether the function can share the requested ports. The configuration utility uses a default of NO (the port cannot be shared) if the SHARE statement is omitted. A text identifier can be specified to indicate that the function can only share the port address with a device that has a matching identifier. The identifier may be up to 10 characters.

SIZE Statement (Optional)

Syntax:
[SIZE = BYTE | WORD | DWORD]

The SIZE statement specifies the size of the I/O port as BYTE (8-bit), WORD (16-bit) or DWORD (32-bit). The default size is BYTE.

4.6.4.4 Memory Description Block

The memory description block specifies the amount of memory on an expansion board and its starting address, whether the memory is cacheable, whether it is RAM or ROM, the type of memory (system, expanded, virtual or other), and initialization requirements of the memory. The configuration file can contain a maximum of nine memory description blocks for any one function. The memory request block has the following format:

```
MEMORY = list/range [STEP = value]
    [ADDRESS = rangelist [STEP = value]]
    [WRITABLE = YES | NO]
    [MEMTYPE = SYS | EXP | VIR | OTH]
    [SIZE = BYTE | WORD | DWORD]
    [DECODE = 20 | 24 | 32]
    [CACHE = YES | NO]
    [SHARE = YES | NO | "text"]
```

MEMORY Statement (Optional)

Syntax:
MEMORY = *range* [STEP = *value*]

The MEMORY statement signifies the beginning of the memory description block. The *range* following the MEMORY statement specifies the minimum and maximum amount of memory that can be put on the board. Each possible memory configuration can be listed separately (such as, 1M, 2M, 3M for one to three megabytes) or a minimum-to-maximum range can be specified (1M-3M). A minimum value of 1K is required and the minimum-to-maximum range must be at least 1K. The maximum range value is 64 megabytes.

If a *range* is specified, the STEP field must also be included to define the smallest increment by which additional memory can be added to the board.

ADDRESS Statement (Optional)

Syntax:
ADDRESS = *range* [STEP = *value*]
or
ADDRESS = *list*

The ADDRESS statement specifies the starting address of the memory. The ADDRESS statement is optional for memory if expanded or other is chosen for the memory type. The ADDRESS statement is required for system and virtual memory. The STEP parameter that follows the *range* identifies the addresses within the range that can be used as the starting address. The following example illustrates the valid starting address selections:

MEMORY = 1M
ADDRESS = 1M-4M STEP = 1M

| Starting Address | Ending Address |
|---|---|
| 100000h | 1FFFFFh |
| 200000h | 2FFFFFh |
| 300000h | 3FFFFFh |
| 400000h | 4FFFFFh |

WRITABLE Statement (Optional)

Syntax:
[WRITABLE = YES | NO]

The WRITABLE field indicates whether the memory is RAM or ROM; for ROM this field is NO. The default is YES.

MEMTYPE Statement (Optional)

Syntax:
[MEMTYPE = SYS | EXP | VIR | OTH]

The MEMTYPE field specifies whether the memory is SYStem (base and extended memory), EXPanded (LIM EMS memory available for use by an expanded memory manager), or OTHer (address space used for memory mapped I/O or bank-switched memory). The default is SYS. VIRtual indicates that the address space is used, but no physical memory occupies the address (address of a LIM page frame). Accesses to VIR memory do not generate addresses on the EISA bus. OTH is intended primarily for memory mapped I/O devices such as network adapters. OTH should include an ADDRESS statement only if it resides in the physical address space.

SIZE Statement (Optional)

Syntax:
[SIZE = BYTE | WORD | DWORD]

The SIZE statement identifies the memory as BYTE (8-bit), WORD (16-bit) or DWORD (32-bit) memory. The SIZE defaults to DWORD if the SIZE statement is omitted.

DECODE Statement (Optional)

Syntax:
[DECODE = 20 | 24 | 32]

DECODE is an optional statement that specifies the number of address lines decoded by a memory expansion board. The default is 32 for all memory boards.

CACHE Statement (Optional)

Syntax:
[CACHE = YES | NO]

The CACHE statement indicates whether the memory contents can be stored in cache memory. The memory on a graphics board, for example, generally should not be stored in a cache memory. The default is NO.

SHARE Statement (Optional)

Syntax:
[SHARE = YES | NO | "*text*"]

The SHARE statement indicates whether the memory in this space can be shared by another device. The default is NO. A text identifier can be specified to indicate that the function can only share the memory address range with a device that has a matching identifier. The identifier can be up to 10 characters.

TOTALMEM Statement (Optional)

Syntax:
TOTALMEM = list/range [STEP = *value*]

A choice statement block can contain a TOTALMEM statement that indicates the total amount of memory specified by the CHOICE. The TOTALMEM statement is required for a memory block that can have its allocation split between system memory (SYS), other memory (OTH) and expanded memory (EXP).

The TOTALMEM statement can include each possible memory size or provide a minimum-to-maximum range of possible configurations. A range must include the STEP keyword to indicate the smallest memory increment that can be added to the memory board.

The following example illustrates a fragment of the configuration file for initializing a memory expansion board. The choice statement block includes a TOTALMEM statement from which the user selects the amount of memory installed on the expansion board. The two memory request blocks allow the user to select the memory allocation between system (SYS) and expanded (EXP) memory. The configuration utility uses the TOTALMEM statement to verify that the total SYS, OTH and EXP memory selected by the user does not exceed the memory installed on the memory expansion board. The total amount of memory specified by the TOTALMEM statement does not include memory selected as MEMTYPE = or VIR.

```
CHOICE = "Add Memory"
    TOTALMEM = 4M | 8M | 12M
    MEMORY = 0M | 4M | 8M | 12M
        MEMTYPE = SYS
        ADDRESS = 1M-256M STEP = 1M
    MEMORY = 0M | 4M | 8M | 12M
        MEMTYPE = EXP
```

The following statements are equivalent:

```
TOTALMEM = 4M | 8M | 12M          ;List
TOTALMEM = 4M-12M STEP = 4M       ;Range with STEP
```

The configuration utility also uses the TOTALMEM statement to determine the proper configuration from subchoice statement blocks.

ROM and RAM Memory Configuration Example

ACME has a network board with 64 Kbytes of RAM and a 2 Kbyte ROM. The board can accommodate up to 512 Kbytes of RAM, added in 64 Kbyte increments. The RAM must begin in the 1-2 megabyte range and is writable, but not cacheable. The 2-Kbyte ROM can be accessed at 0C0000h, 0D0000h, or 0E0000h. The ROM is not writable but it is cacheable. None of the board's memory can be shared.

The following example shows the portion of the configuration file that describes the memory, beginning with the RAM, followed by the ROM.

```
        ;NETWORK BOARD RAM
MEMORY = 64K-512K STEP = 64K
    ADDRESS = 1M-1FFFFFh STEP = 64K
    WRITABLE = YES
    MEMTYPE = OTH
    CACHE = NO

        ;NETWORK BOARD ROM
MEMORY = 2K
    ADDRESS = 0C0000h | 0D0000h | 0E0000h
    WRITABLE = NO
    MEMTYPE = OTH
    CACHE = YES
```

4.6.4.5 INIT Statements

INIT statements specify the initializations for alternative configurations. An INIT statement can be used to initialize any of the following:

DMA
IRQ
PORT
MEMORY

The configuration utility determines the initializations for the selected configuration and stores them in nonvolatile memory. The system ROM power-up routine performs the initializations.

I/O Port INIT Statement

Syntax:
INIT = IOPORT(i) [LOC(*bitlist*) ] valuelist
or
INIT = PORTADR(*address*) [[BYTE|WORD|DWORD] *list*

The I/O port INIT statement specifies an I/O port and the binary value to write to the port for the configuration.

The INIT statement can specify the I/O port address, port size, and value directly in the PORTADR(*address*) form of the statement. The default port size is BYTE. This statement syntax provides a shorthand form of specifying I/O port values where no initialization information block is required. When this shorthand format is used, all bits must be specified with a 1, 0, or r (i.e., x's are not allowed to specify bits in this format).

The INIT statement can also indicate the address with an IOPORT(i) statement combined with the IOPORT(i) form of the INIT statement. The port size is specified with the IOPORT(i) statement, not in the INIT statement.

The *list* portion specifies the binary values to initialize the port. The values must be binary.

The INIT statement can include the LOC(*bitlist*) string to reference individual bits. The *bitlist* contains a list or range of bit positions. The elements of the *bitlist* must be in MSBit to LSBit order. A space must be included between elements as a delimiter.

```
INIT = PORTADR(0z800h) WORD 0000111100001111b   ;WORD port
INIT = PORTADR(0z800h) 00001111b                ;Byte port
INIT = PORTADR(0z800h) 001100rr                 ;Byte port with "r" bits
INIT = IOPORT(1)(0z800h) LOC(7-2) 001100        ;Byte port (range)
INIT = IOPORT(2)(0z800h) LOC(7 6 1 0) 0011      ;4 bits specified
INIT = IOPORT(3)(0z800h) 00001111
```

Switch INIT Statement

Syntax:
INIT = SWITCH(i) LOC(*switchlist*) *valuelist*

The switch INIT statement specifies the switch positions and the appropriate setting for the configuration. SWITCH(i) indicates the switch being initialized. LOC(*switchlist*) *valuelist* identifies the switch positions and specifies the setting.

The LOC(*switchlist*) contains a list or range of switch positions. The elements of the *switchlist* must be in ascending order if REVERSE=YES, or descending order if REVERSE=NO. A space must be included between elements as a delimiter.

The *valuelist* specifies the switch setting for each switch position. The *valuelist* must use the same order as the *switchlist*. A DIP switch can be set for "1" to indicate "ON," or "0" to indicate "OFF." The dip switch settings are not delimited with a space. The *valuelist* for a rotary or slide switch indicates the selected position number by a "1" in the appropriate bit position.

Jumper INIT Statement

Syntax:
INIT = JUMPER(i) LOC(*jumperlist*) *valuelist*

The jumper INIT statement specifies the jumper positions and the appropriate setting for the configuration. JUMPER(i) indicates the jumper being initialized. LOC(*jumperlist*) specifies the jumper positions being specified.

The LOC(*jumperlist*) contains a list of jumper positions. The *valuelist* specifies the setting for each jumper position. The *valuelist* must not be delimited with a space and must use the same order as the *jumperlist*.

The *jumperlist* specifies paired and tripole jumpers by their jumper positions. A paired or tripole *jumperlist* can use a range to indicate the jumpers. The elements of the *jumperlist* must be in ascending order if REVERSE=YES, or descending order if REVERSE=NO. A space must be included between elements as a delimiter.

The *jumperlist* specifies inline jumpers by indicating the connection between two posts with a caret. For example, LOC(1^2 3^4 5^6) specifies the jumper between posts 1 and 2, between posts 3 and 4, and between posts 5 and 6. The elements of the *jumperlist* must be in ascending order if REVERSE=YES, or descending order if REVERSE=NO. A space must be included between elements as a delimiter.

Paired and inline jumper *valuelist* settings can be indicated as "1" for "ON" (jumper installed), "0" for "OFF" (jumper not installed). The paired jumper settings are not delimited with a space.

A tripole jumper *valuelist* settings can be indicated as "1" for "ON" (jumper installed in upper or right position), "0" for "OFF" (jumper installed in lower or left position) "n" for jumper not installed. The tripole jumper settings are not delimited with a space.

Software INIT Statement (Optional)

Syntax:
INIT = SOFTWARE(i) "*parameter*" [| *parameter*]...

The software INIT statement specifies the command line *parameter* that invokes a software command for the selected configuration. The (i) indicates the SOFTWARE(i) statement that contains text to display with the *parameters*. The *parameters* specify an ASCII string that appends to a software command, which specified in the SOFTWARE(i) text. For example, the following configuration file fragment illustrates use of the software INIT statement and SOFTWARE(i) statement that specify an entry into an MS-DOS AUTOEXEC.BAT file:

```
SOFTWARE(1) =
    "This example software initialization
    statement indicates that the NET.EXE
    file with command line parameters must
    be placed in the AUTOEXEC.BAT file: \n\n
    NET.EXE /I=n /D=n where:"

FUNCTION = "Expanded Memory Allocation"
    CHOICE = "4 MB Expanded Memory"
        INIT = SOFTWARE(1) "/I=4 /D=3"
```

4.6.5 Resource Group

A resource description block must have one or more group of resource and initialization statements. The elements of the resource description block are grouped together based on their interdependence. All resource and initialization statements must be in a group. The three types of group are:

- LINK groups, in which selection of any one resource in the group determines the selection of all other resources and initializations in the group.
- COMBINE groups, in which each resource selection is independent, but the initialization is determined by the combination of resource selections.
- FREE groups, in which each resource selection is independent, and the initializations are independent of the resource selections.

The groups begin with a keyword (LINK, COMBINE or FREE) and end at the next group keyword or at the end of the resource description block.

4.6.5.1 LINK Groups

The elements of linked group have a direct relationship with each other. The selection of one resource determines the other resources in the group and the initialization. Each statement in a linked group must have the same number of options. If the first option is chosen for one resource, the configuration utility automatically selects the first option for the other resource statements and the initialization statements. The syntax of a linked group is:

```
LINK
    resource statement
    .
    .
    resource statement
    INIT statement
    .
    .
    INIT statement
```

The following example illustrates the use of a linked group that provides selection of the interrupt or DMA channel. The user (or configuration utility) can select the interrupt or the DMA channel, but after making the one selection, the other resource and the initialization must correspond to the same option. An IRQ = 3 selection forces the configuration utility to select DMA = 2 and IOPORT(1) initialization 00001111b. A DMA = 5 selection forces the configuration utility to select IRQ = 4 and IOPORT(1) initialization 11110000b.

```
LINK
    IRQ = 3 | 4
    DMA = 2 | 5
    INIT = IOPORT(1) 00001111b | 11110000b
```

4.6.5.2 COMBINE Groups

The elements of combined groups have an indirect relationship with each other. Each resource selection is independent, but the initialization is directly determined by the combination of resource selections. The syntax of a linked group is:

COMBINE
*resource statement*
.
.
*resource statement*
*INIT statement*
.
.
*INIT statement*

The following example illustrates the use of a combined group that provides selection of a memory size and starting address. The user (or configuration utility) can select any memory size and starting address, and the configuration utility automatically selects the initialization that corresponds to the selected memory size and starting address. The table after the example lists the initialization value for each possible combination.

```
COMBINE
    MEMORY = 4M | 8M        ;Memory size
    ADDRESS = 1M | 4M       ;Starting address
    INIT = IOPORT(2) 00001111b | 01001111b | 10001111b | 11001111b
```

| Memory Size | Starting Address | Port Initialization |
|---|---|---|
| 4M | 1M | 00001111b |
| 4M | 4M | 01001111b |
| 8M | 1M | 10001111b |
| 8M | 4M | 11001111b |

The following example illustrates the use of a combined group in which the starting address selection and the initialization use a range with a step. The user (or configuration utility) can select any memory size and starting address, and the configuration utility automatically selects the initialization that corresponds to the selected memory size and starting address. The table after the example lists the initialization value for each possible combination.

```
COMBINE
    MEMORY = 4M | 8M | 12M
    ADDRESS = 4M-256M STEP = 4M
    INIT = IOPORT(1) 00000000b-10111111b
```

| Memory Size | Starting Address | INIT Value |
|---|---|---|
| 4M | 4M | 00000000b |
| 4M | 8M | 00000001b |
| 4M | 12M | 00000010b |
| 4M | 16M | 00000011b |
| . | . | . |
| . | . | . |
| 4M | 244M | 00111100b |
| 4M | 248M | 00111101b |
| 4M | 252M | 00111110b |
| 4M | 256M | 00111111b |
| . | . | . |
| . | . | . |
| 12M | 244M | 10111100b |
| 12M | 248M | 10111101b |
| 12M | 252M | 10111110b |
| 12M | 256M | 10111111b |

The following COMBINE fragment and INIT table illustrates the initialization value assignment sequence:

COMBINE
*RESOURCE1* 1 | 2 | 3
*RESOURCE2* 1 | 2 | 3
*RESOURCE3* 1 | 2 | 3
INIT = 00001b-11011b

| INIT Value | RESOURCE1 Part of Combination | RESOURCE2 Part of Combination | RESOURCE3 Part of Combination |
|---|---|---|---|
| 00001b | RESOURCE1 option 1 | RESOURCE2 option 1 | RESOURCE3 option 1 |
| 00010b | RESOURCE1 option 1 | RESOURCE2 option 1 | RESOURCE3 option 2 |
| 00011b | RESOURCE1 option 1 | RESOURCE2 option 1 | RESOURCE3 option 3 |
| 00100b | RESOURCE1 option 1 | RESOURCE2 option 2 | RESOURCE3 option 1 |
| 00101b | RESOURCE1 option 1 | RESOURCE2 option 2 | RESOURCE3 option 2 |
| 00110b | RESOURCE1 option 1 | RESOURCE2 option 2 | RESOURCE3 option 3 |
| 00111b | RESOURCE1 option 1 | RESOURCE2 option 3 | RESOURCE3 option 1 |
| 01000b | RESOURCE1 option 1 | RESOURCE2 option 3 | RESOURCE3 option 2 |
| 01001b | RESOURCE1 option 1 | RESOURCE2 option 3 | RESOURCE3 option 3 |
| 01010b | RESOURCE1 option 2 | RESOURCE2 option 1 | RESOURCE3 option 1 |
| 01011b | RESOURCE1 option 2 | RESOURCE2 option 1 | RESOURCE3 option 2 |
| 01100b | RESOURCE1 option 2 | RESOURCE2 option 1 | RESOURCE3 option 3 |
| 01101b | RESOURCE1 option 2 | RESOURCE2 option 2 | RESOURCE3 option 1 |
| 01110b | RESOURCE1 option 2 | RESOURCE2 option 2 | RESOURCE3 option 2 |
| 01111b | RESOURCE1 option 2 | RESOURCE2 option 2 | RESOURCE3 option 3 |
| 10000b | RESOURCE1 option 2 | RESOURCE2 option 3 | RESOURCE3 option 1 |
| 10001b | RESOURCE1 option 2 | RESOURCE2 option 3 | RESOURCE3 option 2 |
| 10010b | RESOURCE1 option 2 | RESOURCE2 option 3 | RESOURCE3 option 3 |
| 10011b | RESOURCE1 option 3 | RESOURCE2 option 1 | RESOURCE3 option 1 |
| 10100b | RESOURCE1 option 3 | RESOURCE2 option 1 | RESOURCE3 option 2 |
| 10101b | RESOURCE1 option 3 | RESOURCE2 option 1 | RESOURCE3 option 3 |
| 10110b | RESOURCE1 option 3 | RESOURCE2 option 2 | RESOURCE3 option 1 |
| 10111b | RESOURCE1 option 3 | RESOURCE2 option 2 | RESOURCE3 option 2 |
| 11000b | RESOURCE1 option 3 | RESOURCE2 option 2 | RESOURCE3 option 3 |
| 11001b | RESOURCE1 option 3 | RESOURCE2 option 3 | RESOURCE3 option 1 |
| 11010b | RESOURCE1 option 3 | RESOURCE2 option 3 | RESOURCE3 option 2 |
| 11011b | RESOURCE1 option 3 | RESOURCE2 option 3 | RESOURCE3 option 3 |

4.6.5.3 Free Groups

The elements of free-form groups have no relationship with each other. Each resource selection is independent and the initializations are independent of the resource selections. The syntax of a free-form group is as follows:

FREE
*resource statements*
*INIT statements*

The following example illustrates the use of a free-form group in which IRQ 2, 3, 4, or 5 can be selected. The IRQ selection is independent of all other resource declarations. The example does not include any IRQ initialization.

```
FREE
    IRQ = 2 | 3 | 4 | 5
```

4.6.6 PORTVAR(j) Variable

Syntax:
IOPORT(i) = PORTVAR(j)
combined with:
Portvar(j) = *address*

The variable, PORTVAR(j), can be used to modify an IOPORT(i) address based on a configuration selection. Each variable must have a separate PORTVAR(j) statement with a different identifier, "i". The "i" can be any positive integer value from 1 to 32767. The PORTVAR(j) variable replaces the address portion of the IOPORT(i) statement. The configuration utility assigns an address to the IOPORT(i) based on a PORTVAR(j) assignment statement within a choice or subchoice statement block.

The following configuration file segment illustrates the use of PORTVAR(j) to initialize a serial port interrupt. The example indicates an initialization value 00000001b is written to port address 3F9h for a COM1 selection or written to port address 2F9h for a COM2 selection. The configuration utility replaces the PORTVAR(3) variable with the port address (3F9h or 2F9h) based on the CHOICE selected.

```
IOPORT(1) = PORTVAR(3)
FUNCTION = "Serial Port"
    CHOICE = "COM1"
        PORTVAR(3) = 3F9h
        INIT = IOPORT(1) 00000001b
    CHOICE = "COM2"
        PORTVAR(3) = 2F9h
        INIT = IOPORT(1) 00000001b
```

4.7 System Board Configuration File

System board configuration files must supply additional information not required by expansion boards to the configuration utility. This information includes the amount of nonvolatile memory available, the number of expansion slots on the system board, the power available at each slot, and the size and type of each expansion slot. The system description block supplies the additional information.

4.7.1 Board Identification Block

The board identification block for system boards uses the same syntax as an expansion board identification block. The CATEGORY statement must equal "sys" and the SLOT statement must equal EMB(0). The syntax of the board identification block is:

```
BOARD
    ID = "7 character ID"
    NAME = "system board product name"
    MFR = "system board manufacturer name"
    CATEGORY = "SYS"
    SLOT = EMB(0)
    AMPERAGE = value          ;System board +5V current usage in mA
```

4.7.2 System Description Block

The system description block includes a SYSTEM statement, the amount of nonvolatile memory, and a description of the available slots. The system description block follows the board identification block in the configuration file. The syntax of the system description block is:

```
SYSTEM
    [NONVOLATILE = value] ;Bytes of nonvolatile memory
    [AMPERAGE = value]    ;Total +5V current (mA) from power supply
    [SLOT(1) = ISA8 | ISA16 | EISA | OTH [,"text"] [,"text"]...]
        [LENGTH = value]
        [SKIRT = YES | NO]
        [BUSMASTER = YES | NO]
    .
    .
    .
    SLOT(n) = ISA8 | ISA16 | EISA | OTH
        [LENGTH = value]
        [SKIRT = YES | NO]
```

SYSTEM Statement (Required)

Syntax:
SYSTEM

The SYSTEM statement identifies the beginning of the system description block. The SYSTEM statement follows the board identification block in the configuration file.

NONVOLATILE Statement (Optional)

Syntax:
NONVOLATILE = *value*

The NONVOLATILE statement specifies the total bytes of EISA nonvolatile memory in the system. The NONVOLATILE statement does not include the 64 bytes of ISA compatible nonvolatile memory.

The configuration data for one expansion slot, one virtual device or one embedded device (including the system board–EMB(0)), can use no more than 340 bytes of nonvolatile memory. A slot with a multifunction expansion board installed can use 340 bytes total for all expansion board functions. EISA systems must support at least 340 bytes of nonvolatile memory for each expansion slot, plus nonvolatile memory for the system board functions.

The system board designer can use the following equation to determine the minimum amount of EISA nonvolatile memory required:

Nonvolatile Memory =
(Expansion Slots + System Board + Embedded Devices + Virtual Devices) * 340

Where:

Expansion Slots = number of expansion connectors
A whole number between 1 and 15

System Board
EMB(0)–system board

Embedded devices = number of embedded devices on system board
A whole number between
1 and (15 - Physical Slots)

Virtual devices = number of system board virtual devices
Virtual devices ≥ 1

The following example illustrates the nonvolatile memory calculation for a system board with 1 embedded device, 8 expansion connectors and 2 virtual devices:

Assumptions:

| | |
|---|---|
| System Board | 1 |
| Physical Slots = | 8 |
| Embedded devices = | 1 |
| Virtual devices = | 2 |
| Total = | 12 |

Minimum Nonvolatile Memory = 12 * 340 = 4080 bytes

AMPERAGE Statement (Optional)

Syntax:
[AMPERAGE = *value*]

An AMPERAGE statement specifies the total amount of +5 volt power (in milliamps) available to expansion devices installed on the expansion bus.

*value* = power supply current

4.7.3 SLOT Statement Block (Optional)

Syntax:
SLOT(i) = ISA8 | ISA16 | EISA | OTH [,"text"] [,"text"]...

The SLOT(i) statement is used to specify an expansion slot as 8-bit ISA (ISA8), 16-bit ISA (ISA16), or 32-bit EISA (EISA). The i represents the slot number.

The SLOT(i) statement does not apply to the system board, embedded devices or virtual devices, when included as part of the system description block.

LENGTH Statement (Optional)

Syntax:
[LENGTH = *value* ]

A LENGTH statement can accompany a SLOT(i) statement to specify the maximum length board (a decimal integer in millimeters) that can be installed in the slot.

System boards should include a LENGTH statement. The configuration utility cannot optimize expansion board slot allocation if system boards do not specify the slot lengths. If the LENGTH statement is omitted, the configuration utility assumes the maximum length of 341 millimeters and assigns slot numbers without regard to slot length.

SKIRT Statement (Optional)

Syntax:
[SKIRT = YES | NO]

Each SLOT(i) statement can also be accompanied by a SKIRT statement that specifies whether the slot supports a skirted expansion board. The default is YES if the SLOT(i) statement does not have an accompanying SKIRT statement.

BUSMASTER Statement (Optional)

Syntax:
[BUSMASTER = YES | NO]

The BUSMASTER statement specifies whether an EISA slot accepts a bus master expansion board. The slot defaults to BUSMASTER = YES if the BUSMASTER statement is omitted from the slot statement block and the slot is an EISA slot.

4.8 EISA System ROM Operations

EISA system ROM provides the following services to support automatic hardware configuration:

- The EISA system ROM power-up routines use the configuration information stored in nonvolatile memory to initialize the system board and expansion boards.
- The EISA system ROM provides BIOS routines that simplify reading and writing configuration data in nonvolatile memory.

4.8.1 EISA System ROM BIOS Routine Calls

Two BIOS routines are called by the configuration utility to initialize nonvolatile memory. One BIOS routine clears configuration information from nonvolatile memory and the other stores configuration information in nonvolatile memory. The BIOS routines are part of the INT15 handler and have the following call interface:

Clear Nonvolatile Memory
INT 15h, AH=D8h, AL=02h (or 82h)

Write Nonvolatile Memory
INT 15h, AH=D8h, AL=03h (or 83h)

Device drivers and the power-up BIOS routines use two other BIOS routine to retrieve configuration information from nonvolatile memory. One BIOS routine returns a subset of the configuration information stored in nonvolatile memory for one expansion board. The other routine returns all the configuration information about one expansion board function. The BIOS routines are called through the INT 15h handler with the following call interface:

Read slot configuration information
INT 15h, AH=D8h, AL=00h (or 80h)

Read function configuration information
INT 15h, AH=D8h, AL=01h (or 81h)

The BIOS routines are bimodal (real or protected mode) and can be called for execution as 32- or 16-bit code. Protected mode execution is accomplished by simulating an INT 15h instruction (push flags, call far) to the address pointed to by the INT 15h vector (0000:0054h). If INT 15h no longer points to the system ROM, then the industry standard entry point for INT 15h, F000:F859h, can be called directly. The INT 15h BIOS routines require 1536 bytes allocated from the stack for temporary RAM variables.

Protected mode operating systems that can create a code segment descriptor can call the INT 15h BIOS routines by creating a descriptor that has a base address of F0000h and executing a far call to the offset address of the industry standard entry point. The code segment descriptor must have a limit of FFFFh, and must have I/O privilege (current privilege level of code segment being executed must be equal to or less than IOPL). The code segment descriptor can have a D-bit of 0h (16-bit addressing and operands) or 1h (32-bit addressing and operands). The address segment D-bit can be set to 0h or 1h (indicating 16- or 32-bit data size) independent of the code segment D-bit setting.

A code segment other than F0000h may be used as long as it includes the 64 Kbytes starting at F0000h and has I/O privilege (current privilege level of code segment being executed must be equal to or less than IOPL).

The INT 15h system ROM BIOS routines adhere to the following conventions:

- Do not perform any segment register-dependent operations (all branch instructions are relative to the instruction pointer)
- Do not change the segment registers (including the code segment)
- Return to the calling routine with the interrupt flag unmodified
- Do not use privileged instructions (LMSW, LSL, etc.)
- Do not write data using a code segment (CS) override

4.8.1.1 Identify System Board Type

A device driver can identify an EISA system board by detecting the upper case ASCII string "EISA" at memory address F000:FFD9h through F000:FFDCh.

4.8.1.2 Read Slot Configuration Information, INT 15h, AH=D8h, AL=00h (or 80h)

This BIOS routine reads a subset of the configuration information for one expansion board or the system board from nonvolatile memory. The BIOS routine returns a summary that includes all functions of the expansion board.

INT 15h, AH=D8h, AL=00h (or 80h)

INPUT:

| | | |
|---|---|---|
| AH = | 0D8h | |
| AL = | 00h (If CS specifies 16-bit addressing) | |
| AL = | 80h (If CS specifies 32-bit addressing) | |
| CL = | Slot Number (including embedded and virtual devices) | |
| | 0 | System board |
| | 1 | Slot 1 |
| | 2 | Slot 2 |
| | n | Slot n |

OUTPUT:

| | | |
|---|---|---|
| AH = | 00h | Successful completion (carry flag = 0) |
| | 80h | Invalid slot number (carry flag = 1) |
| | 82h | Nonvolatile memory corrupt (carry flag = 1) |
| | 83h | Empty slot (carry flag = 1) |
| | 86h | Invalid BIOS routine call (carry flag = 1) |
| | 87h | Invalid system configuration (carry flag = 1) |

AL =

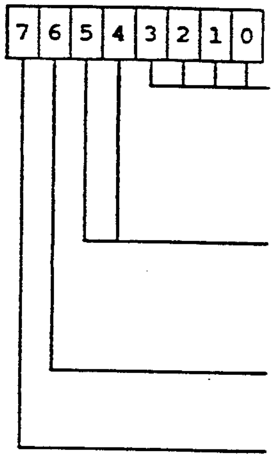

Duplicate ID number
0000 If no duplicate ID
0001 If 1st duplicate ID
.
.
1111 If 15th duplicate ID This nibble indicates which CFG file is loaded when duplicate file names are present. (i.e., the first is called !AAAnnnn.CFG; the next is 1AAAnnnn.CFG, the next is 2AAAnnnn.CFG and so on.

Slot type
00 = Expansion slot
01 = Embedded device
10 = Virtual device
11 = Reserved Product ID
0 = readable
1 = not readable Duplicate ID
0 = No duplicate ID.
1 = Duplicate IDs.

| | | |
|---|---|---|
| BH | = | Major revision level of configuration utility |
| BL | = | Minor revision level of configuration utility |
| CH | = | Checksum (MSByte) of configuration file |
| CL | = | Checksum (LSByte) of configuration file |
| DH | = | Number of device functions |
| DL | = | Combined function information byte<br>Bit 7: Reserved (0)<br>Bit 6: Reserved (0)<br>Bit 5: Slot has one or more port initialization entries<br>Bit 4: Slot has one or more port range entries<br>Bit 3: Slot has one or more DMA entries<br>Bit 2: Slot has one or more interrupt (IRQ) entries<br>Bit 1: Slot has one or more memory entries<br>Bit 0: Slot has one or more function type definitions |
| DI and SI | = | Four byte compressed ID<br>DI (lsb) = Byte 0<br>DI (msb) = Byte 1<br>SI (lsb) = Byte 2<br>SI (msb) = Byte 3 |

4.8.1.3 Read Function Configuration Information, INT 15h, AH=0D8h, AL=01h (or 81h)

This BIOS routine reads all the configuration information for one expansion board function. The BIOS routine transfers the data block that contains the configuration information for the expansion board function to a table in memory. The BIOS routine stores the data block at the starting address pointed to by DS:SI. The table's data structure is defined later in this section.

The caller can execute the "Read Slot Configuration Information" BIOS routine to determine the number of expansion board functions, and execute the "Read Function Configuration Information" BIOS routine to retrieve the data block for each function. The BIOS routine retrieves the function data block indicated by the function number in register CH. The caller can inspect the TYPE and SUBTYPE fields in each data block to identify the function.

INT 15h, AH=0D8h, AL=01h (or 81h)

INPUT:

AH = 0D8h
AL = 01h (If CS specifies 16-bit addressing)
AL = 81h (If CS specifies 32-bit addressing)
CH = Function number to read (0...n-1)
CL = Slot Number (including embedded and virtual slots)
0 = System Board
1 = Slot 1
2 = Slot 2
n = Slot n
DS = Segment for return data buffer
SI = Offset to return data buffer (16-bit call)
ESI = Offset to return data buffer (32-bit call)

OUTPUT:

AH = 00h Successful completion (carry flag = 0)
80h Invalid slot number (carry flag = 1)
81h Invalid function number (carry flag = 1)
82h Nonvolatile memory corrupt; (carry flag = 1)
83h Empty Slot (carry flag = 1)
86h Invalid BIOS routine call (carry flag = 1)
87h Invalid system configuration (carry flag = 1)

Standard Configuration Data Block Structure

The 320-byte data block pointed to by DS:SI contains the configuration information for one expansion board function. The field sizes of the data block are fixed sizes. A configuration file must not specify resources or initializations that cannot fit within this data structure. The 320-byte data block has the following structure:

Four-Byte Compressed ID — Total Bytes = 4, Offset = 00h

| | | |
|---|---|---|
| Byte 0 | | |
| | Bit 7 | Reserved (0) |
| | Bit 6:2 | Character 1 |
| | Bit 1:0 | Character 2 |
| Byte 1 | | |
| | Bit 7:5 | Character 2 |
| | Bit 4:0 | Character 3 |
| Byte 2 | | |
| | Bit 7:4 | 1st hex digit of product number |
| | Bit 3:0 | 2nd hex digit of product number |
| Byte 3 | | |
| | Bit 7:4 | 3rd hex digit of product number |
| | Bit 3:0 | 1-digit product revision number |

ID and Slot Information — Total Bytes = 2, Offset = 04h

| | | |
|---|---|---|
| Byte 0 | | |
| | Bit 7 - | 0= no duplicate ID is present<br>1= duplicate is present |
| | Bit 6 - | 0= ID is readable<br>1= ID is not readable |
| | Bit 5:4 - | Slot type<br>00= expansion slot<br>01= embedded slot<br>10= virtual slot<br>11= reserved |
| | Bit 3:0 - | Numeric identifier for duplicate CFG filenames (IDs)<br>0000 = No duplicate CFG filenames<br>0001 = 1st duplicate (CFG file 1ACE0105)<br>0010 = 2nd duplicate (CFG file 2ACE0105)<br>.<br>.<br>1111 = 15th duplicate (CFG file FACE0105) |
| Byte 1 | | |
| | Bit 7 - | 0= configuration is complete<br>1= configuration is not complete |
| | Bit 6:2 - | Reserved (0) |
| | Bit 1 - | 0= EISA IOCHKERR not supported<br>1= EISA IOCHKERR supported |
| | Bit 0 - | 0= EISA ENABLE not supported (expansion board cannot be disabled)<br>1= EISA ENABLE not supported (board can be disabled) |

EXTENDED INDUSTRY STANDARD ARCHITECTURE
CONFIDENTIAL INFORMATION OF BCPR SERVICES, INC.

CFG File Extension Revision Level

Total Bytes = 2
Offset = 06h

Byte 0 = Minor revision level (0 if no CFG File Extension)
Byte 1 = Major revision level (0 if no CFG File Extension)

Selections

Total Bytes = 26
Offset = 08h

Byte 0 = 1st Selection
Byte 1 = 2nd Selection
.
.
Byte 25 = 26th Selection

Function Information

Total Bytes = 1
Offset = 022h

Byte 0

| | |
|---|---|
| Bit 7 - | 0 = function is enabled<br>1 = function is disabled |
| Bit 6 - | CFG extension Free-form data |
| Bit 5 - | Port initialization entry(s) follows |
| Bit 4 - | Port range entry(s) follows |
| Bit 3 - | DMA entry(s) follows |
| Bit 2 - | Interrupt (IRQ) entry(s) follows |
| Bit 1 - | Memory entry(s) follows |
| Bit 0 - | Type/subtype ASCII string entry follows |

TYPE and SUBTYPE ASCII String

Total Bytes = 80
Offset = 023h

Byte 0 = 1st character of ASCII string
Byte 1 = 2nd character of ASCII string
.
.
Byte 79 = 80th character of ASCII string For example, TYPE = COM,ASY;COM1 produces:

| | |
|---|---|
| Byte 0 = C | Start of TYPE String |
| Byte 1 = O | |
| Byte 2 = M | |
| Byte 3 = , | Delimiter for TYPE string fragments |
| Byte 4 = A | |
| Byte 5 = S | |
| Byte 6 = Y | End of TYPE string |
| Byte 7 = ; | Delimiter for SUBTYPE string |
| Byte 8 = C | Start of SUBTYPE string |
| Byte 9 = O | |
| Byte 10 = M | |
| Byte 11 = 1 | End of SUBTYPE string |
| Byte 12 = 0 | Zero fill to end of field |
| Byte 13 = 0 | |
| . | |
| . | |
| Byte 79 = 0 | |

Memory Configuration

Total Bytes = 63
Offset = 073h

Byte 0 = Memory configuration byte
- Bit 7 - 0 = Last entry
  1 = More entries follow
- Bit 6 - Reserved (0)
- Bit 5 - 0 = Not shared memory
  1 = Shared memory
- Bit 4:3 - Memory Type
  - 00 = SYS (base or extended)
  - 01 = EXP (expanded)
  - 10 = VIRtual
  - 11 = OTHer
- Bit 2 - Reserved (0)
- Bit 1 - 0 = Not Cached
  1 = Cached
- Bit 0 - 0 = Read Only (ROM)
  1 = Read/Write (RAM)

Byte 1 = Memory Data Size
- Bit 7:4 - Reserved (0)
- Bit 3:2 - Decode Size
  - 00 = 20
  - 01 = 24
  - 10 = 32
  - 11 = Reserved (0)
- Bit 1:0 Data Size (Access size)
  - 00 = BYTE
  - 01 = WORD
  - 10 = DWORD
  - 11 = Reserved (0)

Byte 2 = LSByte Memory start address (divided by 100h)
Byte 3 = Middle Byte Memory start address
Byte 4 = MSByte Memory start address
Byte 5 = LSByte Memory size (bytes divided by 400h)
Byte 6 = MSByte Memory size (0 in this word means 64M)

Interrupt Configuration

Total Bytes = 14
Offset = 0B2h

Byte 0
- Bit 7 - 0 = Last entry
  1 = More entries follow
- Bit 6 - 0 = Not Shared
  1 = Shared
- Bit 5 - 0 = Edge Triggered
  1 = Level Triggered
- Bit 4 - Reserved (must be 0)
- Bit 3:0 - Interrupt (0-F)

Byte 1 = Reserved (0)

DMA Channel Description

Total Bytes = 8
Offset = 0C0h

Byte 0
- Bit 7 - 0 = Last entry
  1 = More entries follow
- Bit 6 - 0 = Not Shared
  1 = Shared
- Bit 5:3 - Reserved (0)
- Bit 2:0 - DMA Channel Number (0-7)

Byte 1
- Bit 7:6 - Reserved (0)
- Bit 5:4 - DMA Timing
  - 00 - Default (ISA compatible) timing
  - 01 - Type "A" timing
  - 10 - Type "B" timing
  - 11 - BURST (Type "C") timing
- Bit 3:2 - Transfer size
  - 00 = 8-bit (byte) transfer
  - 01 = 16-bit (word) transfer
  - 10 = 32-bit (dword) transfer
  - 11 = Reserved
- Bit 1:0 - Reserved (0)

Port I/O Information

Total Bytes = 60
Offset = 0C8h

Byte 0
- Bit 7 - 0 = Last entry
  1 = More entries follow
- Bit 6 - 0 = Not Shared
  1 = Shared
- Bit 5 - Reserved (0)
- Bit 4:0 - Number of Ports (minus 1)
  - 00000 = 1 port
  - 00001 = 2 sequential ports
  - .
  - .
  - .
  - 11111 = 32 sequential ports Byte 1 = LSByte I/O Port Address
Byte 2 = MSByte I/O Port address

Initialization Data

Total Bytes = 60
Offset = 0104h

Byte 0 = Initialization Type
- Bit 7 - 0 = Last entry
  - 1 = More entries follow
- Bit 6:3 - Reserved (0)
- Bit 2 - Port value or Mask value
  - 0 - Write value to port
  - 1 - Use mask and value
- Bit 1:0 - Type of access
  - 00 - Byte address (8-bit)
  - 01 - Word address (16-bit)
  - 10 - Dword address (32-bit)
  - 11 - Reserved (0)

Byte 1 = LSByte of port I/O address
Byte 2 = MSByte of port I/O address

IF Byte 0, Bit 2 = 0 (no mask), THEN
Bit 1:0 = Port width to write

| | |
|---|---|
| 00= | Byte 3 = Port value |
| 01= | Byte 3 = LSByte of port value |
| | Byte 4 = MSByte of port value |
| 10= | Byte 3 = LSByte of port value |
| | Byte 4 = 2nd byte of port value |
| | Byte 5 = 3rd byte of port value |
| | Byte 6 = MSByte of port value |
| 11= | Reserved |

IF Byte 0, Bit 2 = 1 (use mask), THEN
Bits 1:0 = Number of bytes/port value/mask

| | |
|---|---|
| 00= | Byte 3 = Port value |
| | Byte 4 = Port mask (byte) |
| 01= | Byte 3 = LSByte of port value |
| | Byte 4 = MSByte of port value |
| | Byte 5 = LSByte of Port mask (word) |
| | Byte 6 = MSByte of Port mask (word) |
| 10= | Byte 3 = LSByte of port value |
| | Byte 4 = 2nd byte of port value |
| | Byte 5 = 3rd byte of port value |
| | Byte 6 = MSByte of port value |
| | Byte 7 = LSByte of port mask (dword) |
| | Byte 8 = 2nd byte of port mask (dword) |
| | Byte 9 = 3rd byte of port mask (dword) |
| | Byte 10 = MSByte of port mask (dword) |
| 11= | Reserved (0) |

Free-form Configuration Data Block Structure

When the Free-form data bit is set in the Function Information byte (bit 6), the 320-byte data structure has the following specific format.

Four-Byte Compressed ID

Total Bytes = 4
Offset = 00h

| | | |
|---|---|---|
| Byte 0 | | |
| | Bit 7 | Reserved (0) |
| | Bit 6:2 | Character 1 |
| | Bit 1:0 | Character 2 |
| Byte 1 | | |
| | Bit 7:5 | Character 2 |
| | Bit 4:0 | Character 3 |
| Byte 2 | | |
| | Bit 7:4 | 1st hex digit of product number |
| | Bit 3:0 | 2nd hex digit of product number |
| Byte 3 | | |
| | Bit 7:4 | 3rd hex digit of product number |
| | Bit 3:0 | 1-digit product revision number |

ID and Slot Information

Total Bytes = 2
Offset = 04h

| | | |
|---|---|---|
| Byte 0 | | |
| | Bit 7 - | 0= no duplicate ID is present<br>1= duplicate is present |
| | Bit 6 - | 0= ID is readable<br>1= ID is not readable |
| | Bit 5:4 - | Slot type<br>00= expansion slot<br>01= embedded slot<br>10= virtual slot<br>11= reserved (0) |
| | Bit 3:0 - | Numeric identifier for duplicate CFG filenames (IDs)<br>0000 = No duplicate CFG filenames<br>0001 = 1st duplicate (CFG file 1ACE0105)<br>0010 = 2nd duplicate (CFG file 2ACE0105)<br>.<br>.<br>1111 = 15th duplicate (CFG file FACE0105) |
| Byte 1 | | |
| | Bit 7 - | 0= configuration is complete<br>1= configuration is not complete |
| | Bit 6:2 - | Reserved (0) |
| | Bit 1 - | 0= EISA IOCHKERR not supported<br>1= EISA IOCHKERR supported |
| | Bit 0 - | 0= EISA ENABLE not supported (expansion board cannot be disabled)<br>1= EISA ENABLE not supported (board can be disabled) |

EXTENDED INDUSTRY STANDARD ARCHITECTURE
CONFIDENTIAL INFORMATION OF BCPR SERVICES, INC.

| | |
|---|---|
| **CFG File Extension Revision Level**<br><br>Byte 0 = Minor revision level (0 if no CFG File Extension)<br>Byte 1 = Major revision level (0 if no CFG File Extension) | Total Bytes = 2<br>Offset = 06h |
| **Selections**<br><br>Byte 0 = 1st Selection<br>Byte 1 = 2nd Selection<br>.<br>.<br>Byte 25 = 26th Selection | Total Bytes = 26<br>Offset = 08h |
| **Function Information**<br><br>Byte 0<br>Bit 7 - 0= function is enabled<br>1= function is disabled<br>Bit 6 - CFG extension Free-form data (=1)<br>Bit 5 - Port initialization entry(s) follows<br>Bit 4 - Port range entry(s) follows<br>Bit 3 - DMA entry(s) follows<br>Bit 2 - Interrupt (IRQ) entry(s) follows<br>Bit 1 - Memory entry(s) follows<br>Bit 0 - Type/subtype ASCII string entry follows | Total Bytes = 1<br>Offset = 022h |
| **TYPE and SUBTYPE ASCII String**<br><br>Byte 0 = 1st character of ASCII string<br>Byte 1 = 2nd character of ASCII string<br>.<br>.<br>Byte 79 = 80th character of ASCII string | Total Bytes = 80<br>Offset = 023h |
| **Freeform Data**<br><br>Byte 0 = Length of following data block<br>Byte 1 = 1st byte of freeform data<br>.<br>.<br>Byte 204 = 204th byte of freeform data | Total Bytes = 2 to 205<br>Offset = 73h |

4.8.1.4 Clear Nonvolatile Memory, INT 15h, AH=D8h, AL=02h (or 82h)

This BIOS routine clears all EISA nonvolatile memory locations. The configuration utility uses the "Clear Nonvolatile Memory" BIOS routine Call prior to writing configuration information to nonvolatile memory.

The Clear Nonvolatile Memory BIOS routine does not clear the 64-byte ISA nonvolatile memory.

INT 15h, AH=D8h, AL=02h (or 82h)

INPUT:

AH = D8h
AL = 02h (If CS specifies 16-bit addressing)
AL = 82h (If CS specifies 32-bit addressing)
BH = Configuration utility major revision level
BL = Configuration utility minor revision level

OUTPUT:

AH = 00h Successful completion (carry flag = 0)
84h Error clearing nonvolatile memory (carry flag = 1)
86h Invalid BIOS routine call (carry flag = 1)
88h Configuration utility not supported (carry flag = 1)

If 88h is returned in AH, indicating an unsupported revision of the configuration utility, then the major revision number of the configuration utility that is supported is returned in AL.

4.8.1.5 Write Nonvolatile Memory INT 15h, AH=D8h, AL=03h (or 83h)

This BIOS routine writes configuration information for one slot into EISA nonvolatile memory. The "Write Nonvolatile Memory" BIOS routine also computes a CRC code (or checksum) after each call. The CRC code (or checksum) is a cumulative calculation that includes all data written to nonvolatile memory since the last "Clear Nonvolatile Memory" BIOS routine Call.

The Write Nonvolatile Memory BIOS routine does not write to the 64-byte ISA configuration memory.

INT 15h, AH=D8h, AL=03h (or 83h)

INPUT:

AH = D8h
AL = 03h (If CS specifies 16-bit addressing)
AL = 83h (If CS specifies 32-bit addressing)
CX = Length of data structure (CX = 0 indicates empty slot)
Length includes two bytes for configuration file checksum
DS = Segment of data buffer
SI = Offset of data buffer (16-bit call)
ESI = Offset of data buffer (32-bit call)

OUTPUT:

AH = 00h Successful completion (carry flag =0)
84h Error writing nonvolatile memory (carry flag = 1)
85h Nonvolatile Memory is full, (carry flag = 1)
86h Invalid BIOS routine call (carry flag = 1)

Standard Configuration Data Block Structure

The structure referenced by DS:SI in the Write Nonvolatile Memory BIOS routine CALL for a slot with a single function has the following format:

| **Four-Byte Compressed ID** | | Total Bytes = 4 |
|---|---|---|
| Byte 0 | | |
| Bit 7 | Reserved (0) | |
| Bit 6:2 | Compressed character 1 | |
| Bit 1:0 | Compressed character 2 | |
| Byte 1 | | |
| Bit 7:5 | Compressed character 2 | |
| Bit 4:0 | Compressed character 3 | |
| Byte 2 | | |
| Bit 7:4 | 1st hex digit of product number | |
| Bit 3:0 | 2nd hex digit of product number | |
| Byte 3 | | |
| Bit 7:4 | 3rd hex digit of product number | |
| Bit 3:0 | 1-digit product revision number | |

ID and Slot Information Total Bytes = 2

Byte 0
- Bit 7 - 0= no duplicate ID is present
  1= duplicate is present
- Bit 6 - 0= ID is readable
  1= ID is not readable
- Bit 5:4 - Slot type
  - 00= expansion slot
  - 01= embedded slot
  - 10= virtual slot
  - 11= reserved (0)
- Bit 3:0 - Numeric identifier for duplicate CFG filenames (IDs)
  0000 = No duplicate CFG filenames
  0001 = 1st duplicate (CFG file 1ACE0105)
  0010 = 2nd duplicate (CFG file 2ACE0105)
  .
  .
  1111 = 15th duplicate (CFG file FACE0105)

Byte 1
- Bit 7 - 0= configuration is complete
  1= configuration is not complete
- Bit 6:2 - Reserved (0)
- Bit 1 - 0= EISA IOCHKERR not supported
  1= EISA IOCHKERR supported
- Bit 0 - 0= EISA ENABLE not supported (expansion board cannot be disabled)
  1= EISA ENABLE not supported (board can be disabled)

CFG File Extension Revision Level Total Bytes = 2

Byte 0 = Minor revision level (0 if no CFG File Extension)
Byte 1 = Major revision level (0 if no CFG File Extension)

Function Length Total Bytes = 2

Length does not include these two bytes, or the checksum at the end of nonvolatile memory
Byte 0 = LSB length of following function entry
Byte 1 = MSB length of following function entry EXTENDED INDUSTRY STANDARD ARCHITECTURE
CONFIDENTIAL INFORMATION OF BCPR SERVICES, INC.

Selections Total Bytes = 2 to 27

Byte 0 = Length of following selections field
Byte 1 = 1st Selection
Byte 2 = 2nd Selection
.
.
Byte 26 = 26th Selection

Function Information Total Bytes = 1

Byte 0
Bit 7 - 0= function is enabled
1= function is disabled
Bit 6 -CFG extension free-form data
Bit 5 - Port initialization entry(s) follows
Bit 4 - Port range entry(s) follows
Bit 3 - DMA entry(s) follows
Bit 2 - Interrupt (IRQ) entry(s) follows
Bit 1 - Memory entry(s) follows
Bit 0 - Type/subtype ASCII string entry follows

TYPE and SUBTYPE ASCII String Total Bytes = 2 to 81

Byte 0 = Length of following ASCII string field
Byte 1 = 1st character of ASCII string
Byte 2 = 2nd character of ASCII string
.
.
Byte 80= 80th character of ASCII string For example, TYPE = COM,ASY;COM1 produces:
Byte 0 = 0Ch Length of string field
Byte 1 = C Start of TYPE string
Byte 2 = O
Byte 3 = M
Byte 4 = , Delimiter for TYPE string fragments
Byte 5 = A
Byte 6 = S
Byte 7 = Y End of TYPE string
Byte 8 = ; Delimiter for SUBTYPE string
Byte 9 = C Start of SUBTYPE string
Byte 10= O
Byte 11= M
Byte 12= 1 End of SUBTYPE string

Memory Configuration Total Bytes = 7 to 63

Byte 0 = Memory configuration byte
Bit 7 - 0 = Last entry
1 = More entries follow
Bit 6 - Reserved (0)
Bit 5 - 0 = Not shared memory
1 = Shared memory
Bit 4:3 - Memory Type
00 = SYStem (base or extended)
01 = EXPanded
10 = VIRtual
11 = OTHer
Bit 2 - Reserved (0)
Bit 1 - 0 = Not Cached
1 = Cached
Bit 0 - 0 = Read Only (ROM)
1 = Read/Write (RAM)

Byte 1 = Memory Data Size
Bit 7:4 - Reserved (0)
Bit 3:2 - Decode Size
00 = 20
01 = 24
10 = 32
11 = Reserved (0)
Bit 1:0 - Data Size (access size)
00 = BYTE
01 = WORD
10 = DWORD
11 = Reserved (0)

Byte 2 = LSByte Memory start address (divided by 100h)
Byte 3 = Middle Byte Memory start address
Byte 4 = MSByte Memory start address
Byte 5 = LSByte Memory size (bytes divided by 400h)
Byte 6 = MSByte Memory size

Interrupt Configuration Total Bytes = 2 to 14

Byte 0
Bit 7 - 0 = Last entry
1 = More entries follow
Bit 6 - 0 = Not Shared
1 = Shared
Bit 5 0 = Edge Triggered
1 = Level Triggered
Bit 4 - Reserved (0)
Bit 3:0 - Interrupt (0-F)
Byte 1 = Reserved (0)

DMA Channel Description Total Bytes = 2 to 8

Byte 0
- Bit 7 - 0 = Last entry
  1 = More entries follow
- Bit 6 - 0 = Not Shared
  1 = Shared
- Bit 5:3 - Reserved (0)
- Bit 2:0 - DMA Channel Number (0-7)

Byte 1
- Bit 7:6 - Reserved (0)
- Bit 5:4 - DMA Timing
  - 00 - Default (ISA compatible) timing
  - 01 - Type "A" timing
  - 10 - Type "B" timing
  - 11 - BURST (Type "C") timing
- Bit 3:2 - Transfer size
  - 00 = 8-bit (byte) transfer
  - 01 = 16-bit (word) transfer
  - 10 = 32-bit (dword) transfer
  - 11 = Reserved (0)
- Bit 1:0 - Reserved (0)

Port I/O Information Total Bytes = 3 to 60

Byte 0
- Bit 7 - 0 = Last entry
  1 = More entries follow
- Bit 6 - 0 = Not Shared
  1 = Shared
- Bit 5 - Reserved (0)
- Bit 4:0 - Number of Ports (minus 1)
  - 00000 = 1 port
  - 00001 = 2 sequential ports
  - .
  - .
  - .
  - 11111 = 32 sequential ports Byte 1 = LSByte I/O Port Address
Byte 2 = MSByte I/O Port address

Initialization Data Total Bytes = 4 to 60

Byte 0 = Initialization Type
- Bit 7 - 0 = Last entry
  - 1 = More entries follow
- Bit 6:3 - Reserved (0)
- Bit 2 - Port value or Mask value
  - 0 - Write value to port
  - 1 - Use mask and value
- Bit 1:0 - Type of access
  - 00 - Byte address (8-bit)
  - 01 - Word address (16-bit)
  - 10 - Dword address (32-bit)
  - 11 - Reserved (0)

Byte 1 = LSByte of port I/O address
Byte 2 = MSByte of port I/O address

If Byte 0, Bit 2 = 0 (no mask), THEN
Bit 1:0 = Port width to write
- 00 = Byte 3 = Port value
- 01 = Byte 3 = LSByte of port value
  Byte 4 = MSByte of port value
- 10 = Byte 3 = LSByte of port value
  Byte 4 = 2nd byte of port value
  Byte 5 = 3rd byte of port value
  Byte 6 = MSByte of port value
- 11 = Reserved (0)

If Byte 0, Bit 2 = 1 (use mask), THEN
Bits 1:0 = Number of bytes/port value/mask
- 00 = Byte 3 = Port value
  Byte 4 = Port mask (byte)
- 01 = Byte 3 = LSByte of port value
  Byte 4 = MSByte of port value
  Byte 5 = LSByte of Port mask (word)
  Byte 6 = MSByte of Port mask (word)
- 10 = Byte 3 = LSByte of port value
  Byte 4 = 2nd byte of port value
  Byte 5 = 3rd byte of port value
  Byte 6 = MSByte of port value
  Byte 7 = LSByte of port mask (dword)
  Byte 8 = 2nd byte of port mask (dword)
  Byte 9 = 3rd byte of port mask (dword)
  Byte 10 = MSByte of port mask (dword)
- 11 = Reserved (0)

| | |
|---|---|
| Configuration Data for 2nd function<br>.<br>.<br>. | Function length<br>.<br>.<br>. |
| Configuration Data for 3rd function<br>.<br>.<br>. | Function length<br>.<br>.<br>. |
| Configuration Data for nth function<br>.<br>.<br>. | Function length for nth function = 00 |
| **Configuration File Checksum**<br>Byte 1 = MSByte of configuration file checksum<br>Byte 0 = LSByte of configuration file checksum | Total Bytes = 2 |

Free-formConfiguration Data Block Structure

When the free-form data bit is set in the Function Information byte (bit 6), the data block pointed to by DS:SI has the following specific format.

| **Four-Byte Compressed ID** | | Total Bytes = 4 |
|---|---|---|
| Byte 0 | | |
| Bit 7 | Reserved (0) | |
| Bit 6:2 | Compressed character 1 | |
| Bit 1:0 | Compressed character 2 | |
| Byte 1 | | |
| Bit 7:5 | Compressed character 2 | |
| Bit 4:0 | Compressed character 3 | |
| Byte 2 | | |
| Bit 7:4 | 1st hex digit of product number | |
| Bit 3:0 | 2nd hex digit of product number | |
| Byte 3 | | |
| Bit 7:4 | 3rd hex digit of product number | |
| Bit 3:0 | 1-digit product revision number | |

ID and Slot Information Total Bytes = 2

Byte 0
- Bit 7 - 0= no duplicate ID is present
  1= duplicate is present
- Bit 6 - 0= ID is readable
  1= ID is not readable
- Bit 5:4 - Slot type
  - 00= expansion slot
  - 01= embedded slot
  - 10= virtual slot
  - 11= reserved (0)
- Bit 3:0 - Numeric identifier for duplicate CFG filenames (IDs)
  0000 = No duplicate CFG filenames
  0001 = 1st duplicate (CFG file 1ACE0105)
  0010 = 2nd duplicate (CFG file 2ACE0105)
  .
  .
  1111 = 15th duplicate (CFG file FACE0105)

Byte 1
- Bit 7 - 0= configuration is complete
  1= configuration is not complete
- Bit 6:2 - Reserved (0)
- Bit 1 - 0= EISA IOCHKERR not supported
  1= EISA IOCHKERR supported
- Bit 0 - 0= EISA ENABLE not supported (expansion board cannot be disabled)
  1= EISA ENABLE not supported (board can be disabled)

CFG File Extension Revision Level Total Bytes = 2

Byte 0 = Minor revision level (0 if no CFG File Extension)
Byte 1 = Major revision level (0 if no CFG File Extension)

EXTENDED INDUSTRY STANDARD ARCHITECTURE
CONFIDENTIAL INFORMATION OF BCPR SERVICES, INC.

| | |
|---|---|
| **Selections**<br><br>Byte 0 = Length of following selections field<br>Byte 1 = 1st Selection<br>Byte 2 = 2nd Selection<br>.<br>.<br>Byte 26 = 26th Selection | Total Bytes = 2 to 27 |
| **Function Information**<br><br>Byte 0<br>Bit 7 - 0= function is not disabled<br>1= function is disabled<br>Bit 6 -CFG extension free-form data (=1)<br>Bit 5 - Port initialization entry(s) follows<br>Bit 4 - Port range entry(s) follows<br>Bit 3 - DMA entry(s) follows<br>Bit 2 - Interrupt (IRQ) entry(s) follows<br>Bit 1 - Memory entry(s) follows<br>Bit 0 - Type/subtype ASCII string entry follows | Total Bytes = 1 |
| **TYPE and SUBTYPE ASCII String**<br><br>Byte 0 = Length of following ASCII string field<br>Byte 1 = 1st character of ASCII string<br>Byte 2 = 2nd character of ASCII string<br>.<br>.<br>Byte 80= 80th character of ASCII string | Total Bytes = 2 to 81 |
| **Free-form Data**<br>Byte 0 = Length of following data block<br>Byte 1 = 1st byte of freeform data<br>.<br>.<br>Byte 204 = 204th byte of freeform data | Total Bytes = 2 to 205 |

The following paragraphs specify the data structure fields that are not obvious from the configuration language specification.

Configuration File Checksum

The configuration file checksum is a 16-bit logical (modula 64k) sum of ASCII values in the configuration file.

Configuration File Extension Revision Level

The Configuration File Extension revision level specifies the revision number for the overlay file. The configuration file extension checks the revision number when reconstructing the user displays from a backup copy of the configuration (a configuration saved to a disk file) or from reading nonvolatile memory (backtracking).

Function Length

Specifies the number of nonvolatile memory bytes that contain the function information. The two bytes of function length are not included in the count. The configuration file checksum bytes are not included.

Selections field

Nonvolatile memory contains numbers that indicate the function choices and resource alternatives selected during configuration. The configuration utility uses the selection numbers during a reconfiguration to display the default selections to a user (backtrack).

The backtrack routine reads selection numbers from nonvolatile memory for display as the defaults. Selections from all group types (COMBINE, LINK or FREE) have a selection number, even if there is only one resource to select.

Note 1: Each memory resource selection number requires one word of storage. Other resource selection numbers require one byte each.

Note 2: The selection numbers for a Function include the selections for its Subfunctions.

1. Selection number of Choice in the Function or Subfunction.
2. Selection number of Subchoice (if it exists).
3. Selection number of alternate choice in each group for LINK and COMBINE groups or the selection number for each resource in a FREE group.
4. When a Read Function Configuration Information BIOS routine call is issued, the information in Subfunctions are included in the Function. Thus the selection numbers in Subfunctions are grouped with the Function selection numbers.

These selection numbers are repeated as needed.

EXAMPLE #1:

```
CFG FILE
FUNCTION = ...
    CHOICE(0) = ...0                    ;CHOICE 0 was chosen
        LINK
            Resource1 = 1 | 2           ;2nd alternate was chosen (1)
            Resource2 = 3 | 4
        FREE
            Resource3 = 5 | 7           ;2nd alternate was chosen (1)
            Resource4 = 6               ;1st resource was chosen (0)
            Resource5 = 7 | 8 | 9       ;3rd alternate was chosen (2)
    CHOICE(1) = ...
        ...
```

4.8.2 Initializing Nonvolatile Memory

The EISA configuration utility begins initializing nonvolatile memory by issuing the "Clear Nonvolatile Memory" BIOS routine Call that clears the configuration information from EISA nonvolatile memory. The configuration utility then issues repetitive "Write Nonvolatile Memory" BIOS routine Calls to load all EISA system board, embedded device, virtual device, and expansion board configuration data.

The configuration utility first builds a data structure that includes the configuration information for slot 0 (the system board), then executes the "Write Nonvolatile Memory" BIOS routine Call with a pointer to the data structure. The configuration utility repeats the sequence for each slot and device.

4.8.3 Power-up Initialization of EISA Systems

EISA systems must assume a reset condition after power-up reset occurs. Expansion boards can decode only the slot-specific I/O addresses used for initialization and must assume a disabled state.

The BIOS power-up routine performs the following steps to initialize EISA systems:

- It confirms the validity of configuration information in nonvolatile memory. If the configuration information is not valid the power-up routine aborts automatic configuration, issues an error message, then continues the power-up sequence.
- It compares the EISA product ID and slot information in nonvolatile memory with the actual installed hardware to confirm that the configuration has not changed. If the expansion board installed in a slot does not match the information stored in nonvolatile memory the power-up routine aborts initialization.
- It uses the configuration data to initialize the system board, expansion boards, embedded devices and virtual devices.
- It enables the system board, expansion boards, embedded devices and virtual devices for operation.

The system ROM automatically determines the I/O port address and initialization values and programs the following registers:

Interrupt controller edge/level register
DMA controller (Extended Mode Register)
    DMA channel cycle timing
    DMA data size and addressing mode
DMA controller (DMA Command Register)
    DRQ and DAK* assert level (high/low)
    Fixed or rotating priority scheme The power-up routine initializes the system board and all EISA expansion boards before determining system memory size or searching for I/O devices (such as printer ports, communications ports, VGA, etc.). Since memory boards that have optional configuration as system or expanded memory are included in the memory size determination, neither an option ROM nor an operating system-dependent device driver is required.

4.8.4 Slot Initialization Sequence
The EISA power-up routine initializes expansion slots, embedded devices, virtual devices, and the system board configuration registers. The initialization takes place during every cold or warm boot.
The flow chart in Figure 103 specifies the EISA slot initialization sequence:
Figure 103 - Power-Up Slot Initialization
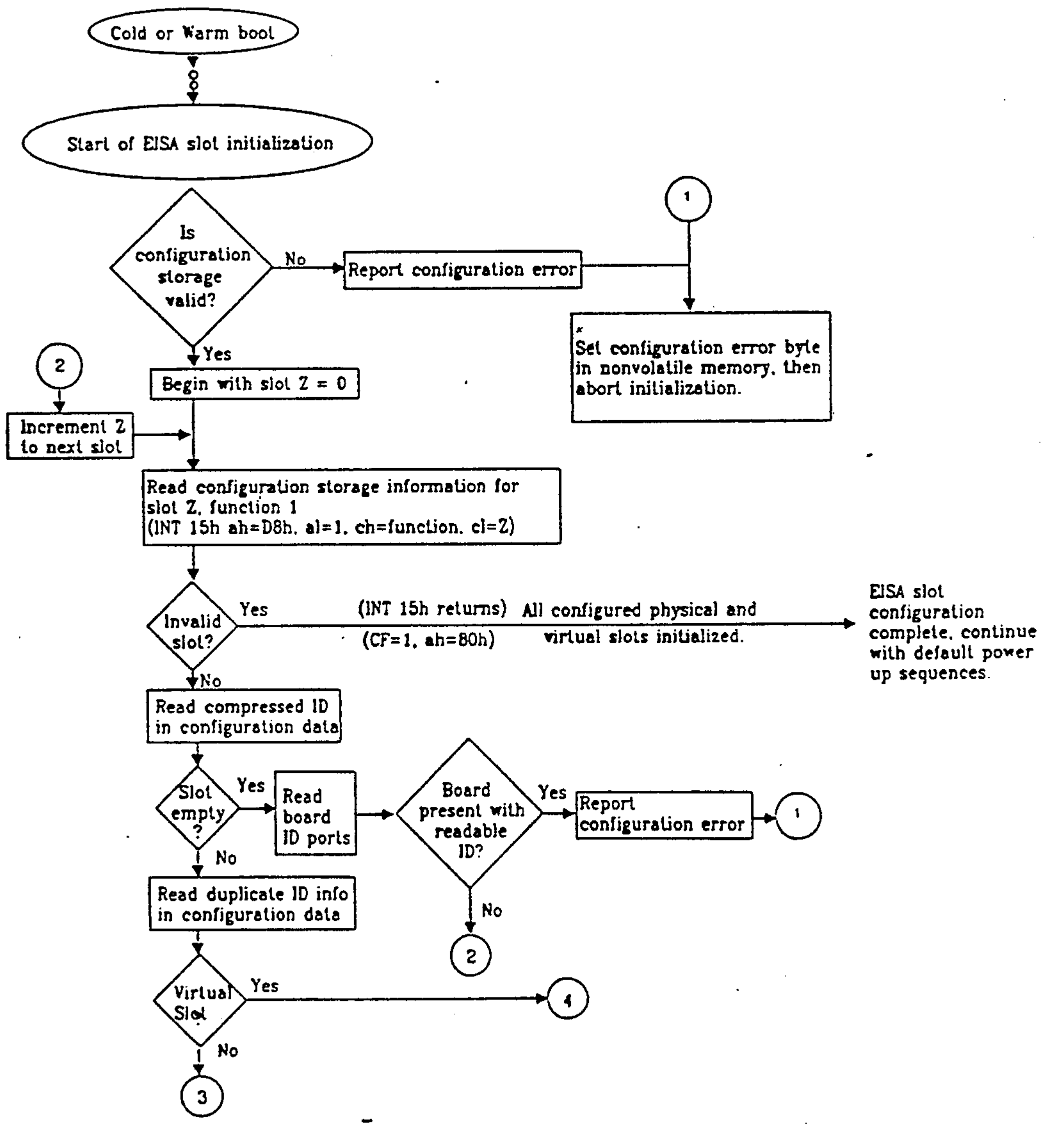

Figure 103 - Power-Up Slot Initialization (Continued)
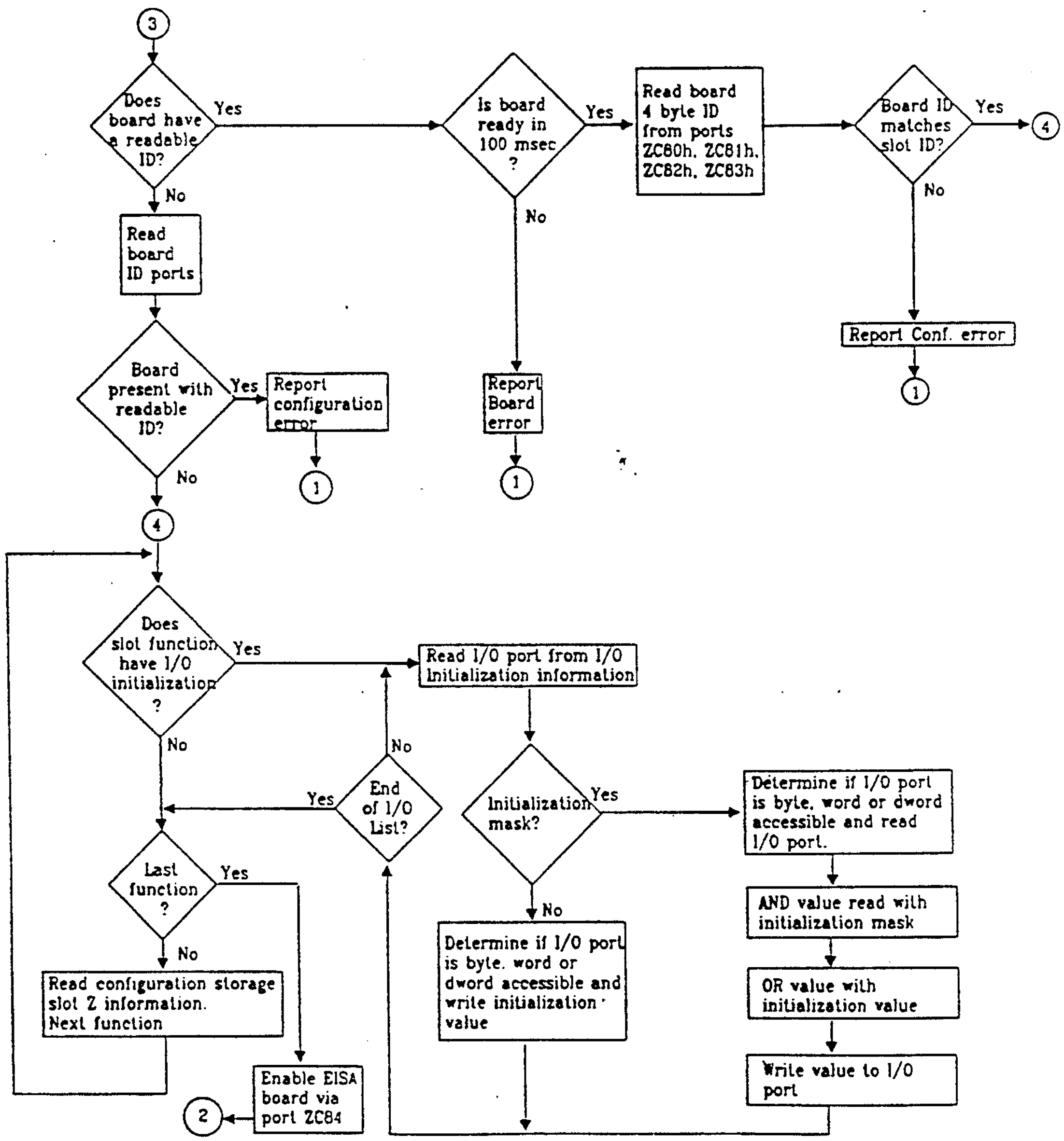

The system ROM power-up routine can initialize critical devices in any order necessary to bring the system up. The power-up routine must then initialize devices sequentially by slot number and function number.

The power-up routine initializes critical devices first, then proceeds to initialize the EISA system board, EMB(0). The power-up routine then begins expansion board initialization beginning with expansion slot 1. The power-up routine issues a "Read Function Configuration Information" BIOS routine Call for slot 1, function 1. The power-up routine checks the product ID field of the data block returned for slot 1 function 1 to determine if the slot was configured as empty or with an expansion board installed.

If nonvolatile memory indicates the slot has an expansion board installed, and the readable ID bit indicates a readable ID, the power-up routine performs the I/O read to confirm that the product ID matches nonvolatile memory. If the product ID read operation indicates a not ready condition on the first try, the power-up routine waits 100 milliseconds, then retries the ID read. The power-up routine issues an error message if the ID read still indicates a not ready condition after the 100 millisecond delay, then aborts initialization.

If the product ID matches nonvolatile memory, the power-up routine performs the initialization by setting the I/O ports to the values indicated in nonvolatile memory and programming the system board controllers to properly allocate the system resources required by the expansion board.

After initializing each of the expansion board functions and the required system resources, the power-up routine enables the expansion board, then issues the "Read Function Configuration Information" BIOS routine Call for slot 2 function 1. The power-up routine continues the process until all functions in all expansion slots, embedded slots and virtual slots are configured.

The power-up routine does not initialize installed EISA or ISA expansion boards that do not have configuration information stored in nonvolatile memory.

4.8.5 Error Handling During Slot Initialization

Several error conditions can arise during slot initialization.

If an expansion board indicates a not ready condition when its product ID is read, the power-up routine waits 100 ms then retries the product ID read. If the expansion board still indicates a not ready condition an appropriate error is displayed and the power-up routine continues EISA expansion board initialization with the next slot.

If the ID of the EISA expansion board does not match the contents of nonvolatile memory then an appropriate error is displayed and the power-up routine continues EISA expansion board initialization with the next slot.

If nonvolatile memory indicates the presence of an EISA board with an ID and no matching board is found then an appropriate error is displayed and the power-up routine continues EISA expansion board initialization with the next slot.

If the ID of a slot is tagged not readable in the nonvolatile memory information then the power up routines attempt to read a valid ID from the slot being initialized. If a valid ID is read from the slot then an appropriate error is displayed and the power-up routine continues EISA expansion board initialization with the next slot.

If the nonvolatile memory information indicates that a slot is empty and a valid ID is read from the slot, then an appropriate error is displayed and the power-up routine continues EISA expansion board initialization with the next slot.

An error is displayed if nonvolatile memory slot information does not match what is determined to be in the slots.

An "incomplete configuration" message is displayed if the nonvolatile memory ID and Slot Information incomplete configuration bit is set.

4.8.6 Noncacheable Memory Map Initialization

EISA systems with cache memory can use the data in nonvolatile memory to construct a noncacheable address map. The power-up routine identifies noncacheable memory address ranges from the configuration information in nonvolatile memory. The power-up routine supplies the noncacheable addresses to hardware that disables the memory cache during accesses to the noncacheable addresses.

4.8.7 Writable Memory Map Initialization

EISA systems can use the data in nonvolatile memory to construct a writable address map. The power-up routine identifies RAM and ROM memory address ranges from the configuration information in nonvolatile memory. The power-up routine supplies the RAM and ROM addresses to hardware that disables memory writes during accesses to the ROM addresses.

4.9 EISA System I/O Address Map

The system I/O address map that follows illustrates the extended I/O address space available for EISA system boards and expansion boards. An EISA system board has 768 bytes of I/O space in addition to the 256 bytes available for ISA system boards. Each EISA expansion slot and embedded device has 1024 bytes of slot-specific I/O address space in addition to the ISA I/O space allocated to expansion boards.

The system I/O address map indicates the I/O address space used for EISA system board devices and EISA expansion board devices. The address map also indicates address ranges that are aliases of the ISA expansion board I/O space (100h-3FFh). The alias addresses may only be used by expansion boards that can assure no conflict occurs between the alias address and normal ISA expansion board I/O addresses (100h-3FFh). The configuration utility does not identify conflicting use of ISA alias addresses.

The system board decodes the EISA slot-specific I/O address ranges and all I/O for system board devices from LA<15:2> with BE*<3:0>. The EISA slot-specific I/O ranges are decoded from LA<15:2> with LA<9:8> zero. The system board decodes LA<15:12> with LA<9:8> zero to generate the slot-specific signals, AENx. The EISA slot-specific device decodes the individual bytes in the I/O range from LA<11:2> with BE*<3:0> (LA<9:8> must be zero). The slot-specific ranges are: 0z000h-0z0FFh, 0z400h-0z4FFh, 0z800h-0z8FFh, 0zC00h-0zCFFh (where "z" represents the slot number). They do not conflict with any ISA expansion board. EISA expansion boards should not use any address (or alias address) in the ISA I/O range (100h-3FFh) except for ISA compatibility.

EISA System I/O Address Map

| I/O address Range (hex): | I/O Range Reserved for |
|---|---|
| 0000-00FF | EISA/ISA System board |
| 0100-03FF | ISA expansion boards |
| 0400-04FF | Reserved, EISA System board |
| controllers | |
| 0500-07FF | Alias of 100h-3FFh |
| 0800-08FF | EISA System board |
| 0900-0BFF | Alias of 100h-3FFh |
| 0C00-0CFF | EISA System board |
| 0D00-0FFF | Alias of 100h-3FFh |
| 1000-10FF | Slot 1 |
| 1100-13FF | Alias of 100h-3FFh |
| 1400-14FF | Slot 1 |
| 1500-17FF | Alias of 100h-3FFh |
| 1800-18FF | Slot 1 |
| 1900-1BFF | Alias of 100h-3FFh |
| 1C00-1CFF | Slot 1 |
| 1D00-1FFF | Alias of 100h-3FFh |
| : | : |
| 0z000-0z0FF | Slot 'z' |
| 0z100-0z3FF | Alias of 100h-3FFh |
| 0z400-0z4FF | Slot 'z' |
| 0z500-0z7FF | Alias of 100h-3FFh |
| 0z800-0z8FF | Slot 'z' |
| 0z900-0zBFF | Alias of 100h-3FFh |
| 0zC00-0zCFF | Slot 'z' |
| 0zD00-0zFFF | Alias of 100h-3FFh |

4.9.1 Expansion Board Address Decoding

An expansion board that uses the slot-specific I/O ranges may, during I/O cycles, decode address bits LA<11:2>, and BE*<3:0> with AENx negated (low) to address any byte in the slot-specific I/O range. An expansion board that does not need the full I/O address range can decode fewer address bits, depending on the number of ports required. The expansion board must, at a minimum, decode address bits LA<9:8> low and AENx negated (low) to assure that the I/O address does not conflict with the ISA expansion board I/O address range.

See section 2.8.7 in this specification for additional information about EISA I/O decoding and the use of AENx to control slot-specific I/O addressing.

A device driver addresses the expansion board slot-specific addresses with a full 16-bit I/O address. The device driver appends the expansion board address bits, <11:0>, to the high order four bits represented by the hexadecimal slot number to form the 16-bit address, <15:0>.

Slot-specific addresses 0zC80h through 0zC83h are reserved for the product ID. Slot-specific address 0zC84h is reserved for expansion board control bits. All other slot-specific addresses can be used by the expansion board for configuration registers and general purpose I/O.

An EISA expansion board can also use the ISA expansion board I/O ranges, but must assure that the addresses do not conflict with other ISA expansion boards.

The following address ranges are not aliases of ISA expansion board I/O addresses and should be used by an EISA expansion board for I/O registers:

| I/O address Range (hex): | I/O Range Reserved for: |
|---|---|
| 1000-10FF | Slot 1 |
| 1400-14FF | Slot 1 |
| 1800-18FF | Slot 1 |
| 1C00-1CFF | Slot 1 |
| 2000-20FF | Slot 2 |
| 2400-24FF | Slot 2 |
| 2800-28FF | Slot 2 |
| 2C00-2CFF | Slot 2 |
| : | : |
| 0z000-0z0FF | Slot 'z' |
| 0z400-0z4FF | Slot 'z' |
| 0z800-0z8FF | Slot 'z' |
| 0zC00-0zCFF | Slot 'z' |

The following address ranges are aliases of ISA expansion board I/O addresses:

| I/O address Range (hex): | I/O Range Reserved for: |
|---|---|
| 1100-13FF | Alias of 100h-3FFh |
| 1500-17FF | Alias of 100h-3FFh |
| 1900-1BFF | Alias of 100h-3FFh |
| 1D00-1FFF | Alias of 100h-3FFh |
| 2100-13FF | Alias of 100h-3FFh |
| 2500-27FF | Alias of 100h-3FFh |
| 2900-2BFF | Alias of 100h-3FFh |
| 2D00-2FFF | Alias of 100h-3FFh |
| ⋮ | ⋮ |
| 0z100-0z3FF | Alias of 100h-3FFh |
| 0z500-0z7FF | Alias of 100h-3FFh |
| 0z900-0zBFF | Alias of 100h-3FFh |
| 0zD00-0zFFF | Alias of 100h-3FFh |

Slot-specific addresses 0zC80h through 0zC83h are reserved for the product ID. Slot-specific address 0zC84h is reserved for expansion board control bits. All other slot-specific addresses can be used by the expansion board for configuration registers and general purpose I/O.

An EISA expansion board that uses the ISA expansion board I/O ranges must assure that the addresses do not conflict with other ISA expansion boards.

4.9.2 Embedded Slot Address Decoding

Embedded slot address decoding works exactly like expansion board address decoding except that the embedded device is integrated onto the system board. The embedded slots use slot numbers that start after the last expansion slot number. For example, the first embedded slot is slot 8 if the EISA system has 7 expansion slots.

4.9.3 System Board Address Decoding

An EISA system board decodes 16 address bits during I/O cycles. The system board configuration registers and controller registers are mapped into the address ranges between 0000h and 0CFFh that are not aliases of ISA expansion board I/O addresses.

The following address ranges are not aliases of ISA expansion board I/O addresses and can be used by an EISA system board for I/O registers:

| I/O address Range (hex): | I/O Range Reserved for: |
|---|---|
| 0000-00FF | ISA System board peripherals |
| 0100-03FF | ISA expansion boards |
| 0400-04FF | Reserved - System board controllers |
| 0800-08FF | System board |
| 0C00-0CFF | System board |

The following address ranges are aliases of ISA expansion board I/O addresses and cannot be used by an EISA system board:

| I/O address Range (hex): | I/O Range Reserved for: |
|---|---|
| 0500-07FF | Alias of 100h-3FFh |
| 0900-0BFF | Alias of 100h-3FFh |
| 0D00-0FFF | Alias of 100h-3FFh |

4.10 EISA Product Identifier (ID)

EISA expansion boards, embedded devices and system boards have a four byte product identifier (ID) that can be read from I/O port addresses 0zC80h through 0zC83h (z=0 for the system board). For example, the system board ID can be read from I/O port addresses 0C80h-0C83h and the slot 1 product ID can be read from I/O port addresses 1C80h-1C83h.

The first two bytes (0zC80h and 0zC81h) contain a compressed representation of the manufacturer code. The manufacturer code is a three character code (uppercase, ASCII characters in range "A"-"Z") chosen by the manufacturer and registered with the firm that distributes this specification. System board and expansion board manufacturers follow the same procedure to choose and register their manufacturer code.

The manufacturer code "ISA" should be used to indicate a generic ISA adapter.

The three character manufacturer code is compressed into three 5-bit values so that it can be incorporated into the two I/O bytes at 0zC80h and 0zC81h. The compression procedure is:

Find hexadecimal ASCII value for each letter
    ASCII for "A" - "Z": "A" = 41h, "Z" = 5Ah Subtract 40h from each ASCII value
    Compressed "A" = 41h-40h = 01h = 0000 0001
    Compressed "Z" = 5Ah-40h = 1Ah = 0001 1010

Retain 5 least significant bits for each letter
    Discard 3 most significant bits (they are always zero)
    Compressed "A" = 00001, Compressed "Z" = 11010

Compressed code = Concatenate "0" and the three 5-bit values
    "AZA" = 0 00001 11010 00001 (a 16-bit value)
    0zC80h = 00000111, 0zC81h = 01000001

The following figures show the format of the product ID (addresses 0zC80h - 0zC83h):

Product ID, 1st byte: 0zC80h

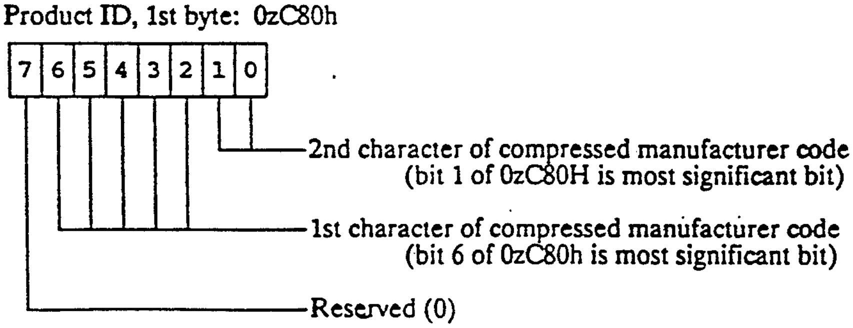

Product ID, 2nd byte: 0zC81h

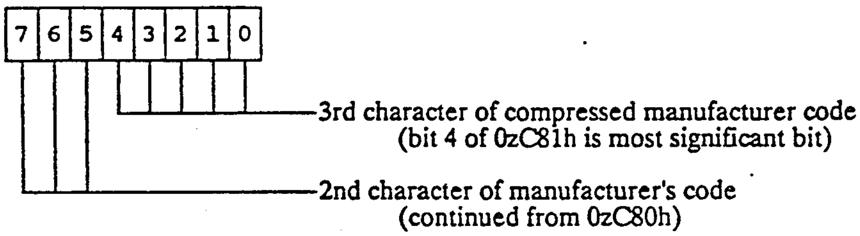

Product ID, 3rd byte: 0zC82h

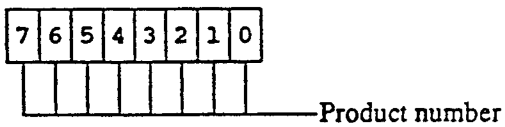

Product ID, 4th byte: 0zC83h

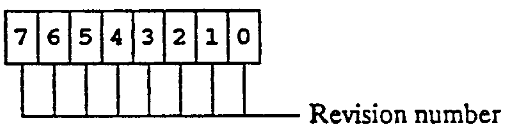

Reporting Not Ready During Access to the Product ID Register

An EISA device that requires a long power-up sequence may report a not ready condition when the power-up routine attempts to read the product ID. The expansion board must complete its power-up sequence and report its product ID within 100 ms after reporting the not ready condition. The expansion board supplies the following data in port 0zC80h to indicate the not ready condition:

Product ID, 1st byte: 0zC80h

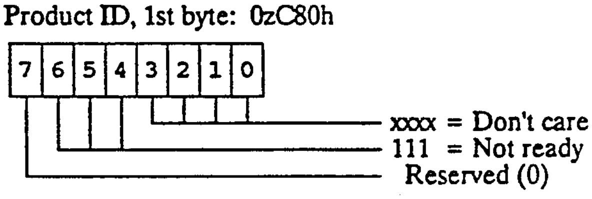

4.10.1 EISA System Board ID

The first two bytes of the system board ID are a compressed representation of the manufacturer code. The third byte and first five bits of the fourth byte can be used by the system board manufacturer for any purpose desired. The least significant 3 bits of the fourth byte indicate the EISA bus revision level.

The compressed system board manufacturer code has the same format as an expansion board manufacturer code and is illustrated in the "EISA Product Identifier" section of this specification.

The I/O addresses for the system board ID bytes are:
System Board ID, 1st byte: 0C80h
System Board ID, 2nd byte: 0C81h
System Board ID, 3rd byte: 0C82h
System Board ID, 4th byte: 0C83h
The following diagrams show the format of the system board ID.
System Board ID, 1st byte: 0C80h
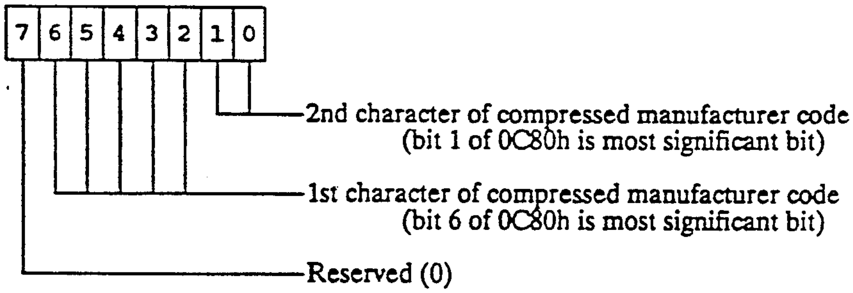
System Board ID, 2nd byte: 0C81h
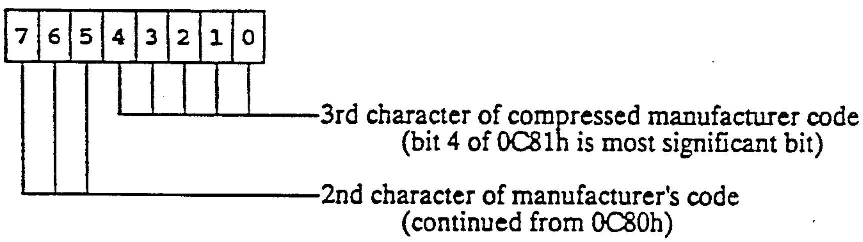
System Board ID, 3rd byte: 0C82h
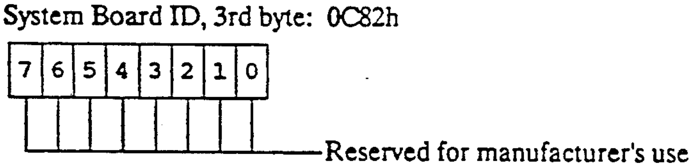
System Board ID, 4th byte: 0C83h
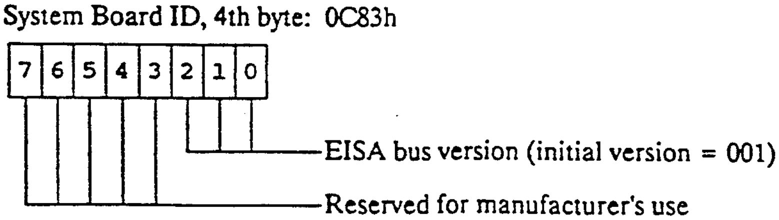

Identifying an EISA Expansion Board

1. Write FFh to 0C80h

The procedure precharges the system board ID register (at I/O address 0C80h).

2. Read 0C80h

If contents of 0C80h equals FFh, discontinue the identification process, the system board does not have a readable ID.

If contents of 0C80h does not equal FFh and the most significant bit is a zero: the system board supports a readable ID that can be read at 0C80h-0C83h.

4.10.2 EISA Expansion Board Product ID

The first two bytes of the 4-byte product ID are a compressed representation of the manufacturer code. The third byte represents the product number and the fourth byte represents the product's revision level.

A revised expansion board that requires a modification to its configuration file must have a new product number and revision level in its ID. A revised expansion board that does not require a modification to the configuration file can use its original product number, with a new revision level.

The system ROM power-up routine reads the first four bytes of the ID to compare against the configuration information stored in nonvolatile memory. A match of the hardware ID and the ID stored in nonvolatile memory confirms that the configuration has not changed since system configuration. Bits 3:0 of the fourth byte are not used by the power-up routine.

Device drivers can use the product ID to determine the type of expansion board installed and the revision level.

The compressed expansion board manufacturer code has the same format as a system board manufacturer code and is illustrated in the "EISA Product Identifier" section of this specification.

The I/O addresses (where "z" is the slot number) for the product ID bytes are:

Product ID, 1st byte: 0zC80h
Product ID, 2nd byte: 0zC81h
Product ID, 3rd byte: 0zC82h
Product ID, 4th byte: 0zC83h The following diagrams illustrate the third and fourth byte of the product ID.
Expansion Board Product ID, 3rd byte: 0zC82h
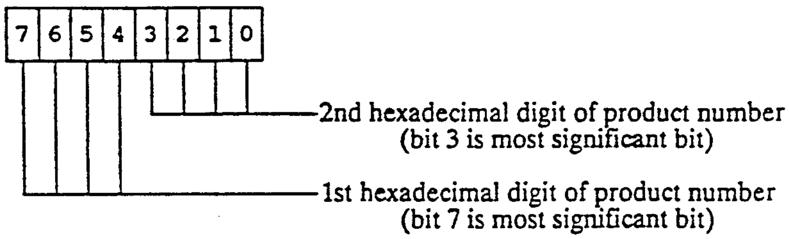
Expansion Board Product ID, 4th byte: 0zC83h
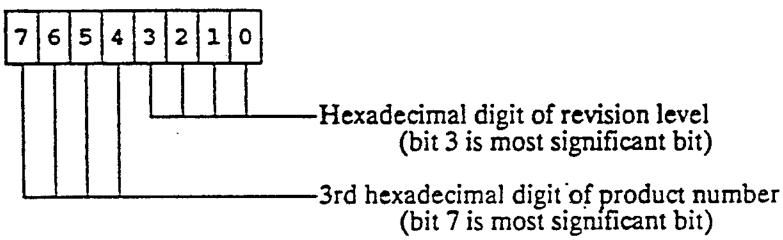

Identifying an EISA Expansion Board

1. Write FFh to 0zC80h

The procedure precharges the expansion board ID register (at I/O address 0zC80h).

2. Read 0zC80h

If contents of 0zC80h equals FFh, discontinue the identification process, the expansion board does not have a readable ID.

If contents of 0zC80h does not equal FFh and the most significant bit is a zero: the expansion board supports a readable ID that can be read at 0zC80h-0zC83h.

4.10.3 EISA Embedded Devices

The ID of an EISA embedded device has the same format as an expansion board product ID. The ID of an embedded device can be accessed through I/O addresses 0zC80h-0zC83h, where "z" is the embedded slot number.

4.11 Expansion Board Control Bits

Port 0zC84h contains ENABLE, IOCHKERR, and IOCHKRST bits for software control of programmable expansion boards. EISA expansion boards must indicate "IOCHKERR=INVALID" in the CFG file if ENABLE and IOCHKERR bits are not supported. The Expansion Board Control Bits are shown in the following figure.

Expansion Board Control Bits - 0zC84h.

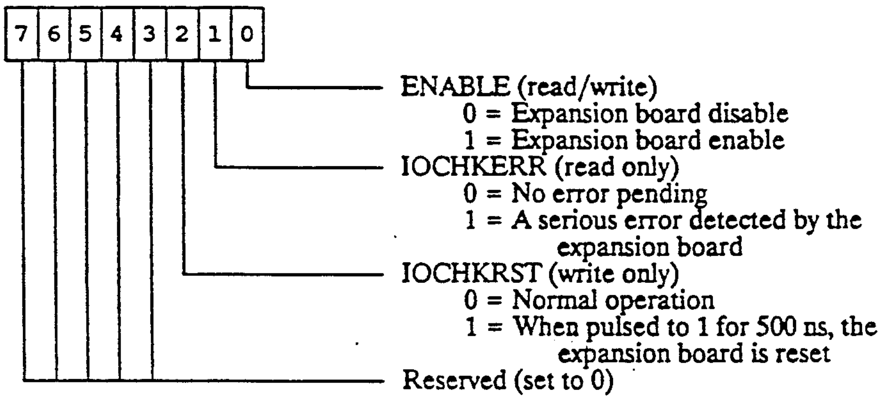

Bit 0 - Enable Bit (Read/Write)

The ENABLE bit can be set to enable an expansion board for operation, or cleared to disable operation. The bit can be read to determine the enabled or disabled state. The expansion board clears ENABLE after sampling RESDRV asserted and enters a disabled state. The expansion board must only decode slot-specific I/O while in the disabled state. The expansion board must disable all bus drivers while in the disabled state, except when responding to slot-specific I/O. EISA expansion boards must fully support the ENABLE bit functions.

Bit 1 - IOCHKERR Bit (Read Only)

The IOCHKERR bit can be read to determine if an expansion board has a pending error. The expansion board indicates a pending error by setting IOCHKERR, clearing the ENABLE bit and entering the disabled state. The expansion board may, but is not required to assert the bus signal IOCHK* when it sets IOCHKERR. Pulsing IOCHKRST resets IOCHKERR. EISA expansion boards must respond to a read access of the IOCHKERR bit. EISA expansion boards that do not need to indicate errors may always respond with the IOCHKERR bit cleared.

An expansion board sets IOCHKERR to indicate that a serious error has occurred. Parity errors and uncorrectable system errors exemplify problems that might cause an expansion board to set IOCHKERR. An expansion board always holds IOCHKERR set while asserting the bus signal IOCHK*. The main CPU or bus master can poll the IOCHKERR bit for each expansion board to determine which board caused an error.

Bit 2 - IOCHKRST Bit (Write Only)

Pulsing IOCHKRST to a "1" for at least 500 ns resets an expansion board's hardware. The expansion board resets all logic, assumes a disabled state, clears IOCHKERR and clears ENABLE when IOCHKRST is pulsed. EISA expansion boards that never set the IOCHKERR bit may ignore write accesses to the IOCHKRST bit.

Example Sequence for an IOCHKERR

The system ROM power-up routine initializes the expansion board and sets the ENABLE bit to begin operation.

The expansion board begins decoding memory and I/O addresses outside the slot-specific I/O range and enables its bus drivers to drive the bus signals.

The device driver determines the slot-specific I/O address from the configuration data in nonvolatile memory. The device driver can then control the device operation.

The expansion board detects a serious error, clears the ENABLE bit, sets its IOCHKERR bit and asserts IOCHK*. The expansion board stops decoding memory addresses and I/O addresses outside its slot specific range and it floats all bus drivers (except the one driving IOCHK*) unless responding to slot-specific I/O.

The expansion board detects a serious error, clears the ENABLE bit, sets its IOCHKERR bit and asserts IOCHK*. The expansion board disables all bus signal drivers except the one driving IOCHK*. The expansion board stops decoding memory addresses and I/O addresses outside its slot specific range.

The assertion of IOCHK* invokes the NMI service routine. The NMI service routine sequentially polls the IOCHKERR bit for each EISA device until it finds a device with IOCHKERR set. The NMI service routine then begins the recovery procedure (restore the operation or disable the expansion board).

To restore the expansion board, correct the error, then pulse IOCHKRST to "1" for at least 500 ns to clear the IOCHKERR bit and negate the IOCHK* bus signal. The NMI service routine can then invoke the device driver to initialize the expansion board and set the ENABLE bit for operation.

To disable the expansion board, the NMI service routine must pulse IOCHKRST to "1" for at least 500 ns to clear the IOCHKERR bit and negate the IOCHK* bus signal. The NMI service routine can also display a message to the user indicating the action taken.

The NMI service routine returns execution to the routine interrupted by NMI. If multiple devices asserted IOCHK*, or if another device asserted IOCHK* during the NMI service, the NMI routine is invoked again to repeat the IOCHKERR poll and recovery procedure.

4.12 System Software Use of Configuration Information

Device drivers and system software can use the configuration information from nonvolatile memory for the following purposes:

- Determine the slot number of an EISA device
- Determine the I/O address of the EISA device registers specified during configuration
- Determine configuration information
- Determine the system resources used by an EISA or ISA device
- Initialize the device for operation Use of the configuration memory by a product dependent device driver may differ from use by a product independent device driver. A device driver is product dependent if the driver is provided for use with a particular product (i.e., an ACE Ethernet network board). A device driver is product independent if the driver is provided for use with products from a variety of vendors (such as a parallel port).

4.12.1 Slot Search by Product Independent Device Driver

A product independent device driver should check the TYPE string of each function in each slot (including expansion slots, embedded devices and virtual devices) to determine the slot in which the desired function is installed. The driver should begin searching at Slot 0, function 1 and sequentially increment through each function of each slot until the last slot has been checked.

The device driver can use the "Read Slot Configuration Information" to determine the number of functions located in any slot, and use the "Read Function Configuration Information" BIOS routine Call to read the configuration information (which includes the TYPE string) for the function. The device driver terminates the search when it finds a function with the desired TYPE string or when the "Read Slot Configuration Information" BIOS routine Call returns an "Invalid slot number" error. The error indicates that all slots have been checked.

Device Driver Search for TYPE String

The following example illustrates a device driver search for a parallel port with TYPE = "PAR."

The device driver performs the search by executing a "Read Slot Configuration Information" BIOS routine Call for each slot to determine if a device is installed and the number of functions present in the slot. The device driver begins the search by executing a "Read Slot Configuration Information" BIOS routine Call for slot 0 to determine the number of functions addressed as slot 0.

The device driver then executes a "Read Function Configuration Information" BIOS routine Call for slot 0 function 1. The BIOS routine reads the function configuration information from nonvolatile memory and writes it to a table in system memory. The device driver inspects the TYPE field in the returned table to determine if the first three characters of the TYPE string equal "PAR," which indicates a parallel port. The device driver continues executing "Read Function Configuration Information" BIOS routine Calls and inspecting the TYPE field for each slot 0 function.

The device driver then executes a "Read Slot Configuration Information" BIOS routine Call for slot 1 to determine the number of functions addressed as slot 1. The device driver requests the function information from nonvolatile memory and inspects the TYPE field for each function in slot 1. The device driver continues the slot search until it locates one or all functions with TYPE = "PAR", or until the "Read Function Configuration Information" BIOS routine Call indicates that all slots have been searched (by returning "invalid slot").

If the device driver finds a function with TYPE = "PAR", it can determine the initialization and resource requirements from the table returned by a "Read Function Configuration Information" BIOS routine Call.

Device Driver Search for SUBTYPE String

A driver can search for a specific configuration of a function by scanning the SUBTYPE strings. The following example illustrates a device driver search for a serial port with SUBTYPE = "COM1."

The device driver first finds an asynchronous communications port by searching for the TYPE string fragment, "COM,ASY." The driver then scans past the remainder of the TYPE field (delimited by the semicolon) and compares the SUBTYPE string fragments to "COM1." If a SUBTYPE string fragment does not match "COM1", the driver continues searching for another TYPE "COM,ASY" and checking the SUBTYPE for "COM1."

4.12.2 Slot Search by a Product Dependent Device Driver

A product dependent device driver should check the product ID of the device in each slot (including expansion slots, embedded devices and virtual devices) to determine the slot in which its corresponding product is installed. The driver should begin searching at Slot 0 and sequentially increment through each slot until the last slot has been checked.

The device driver can use the "Read Slot Configuration Information" BIOS routine Call to read the product ID of the device in any slot. The device driver terminates the search when it finds the correct product ID or when the BIOS routine Call returns an "Invalid slot number" error. The error indicates that all slots have been checked.

4.12.3 Device Driver Initialization for EISA Expansion Boards

The device driver can use information from nonvolatile memory to determine EISA expansion board configuration and initializations necessary to restore expansion board registers to their power-up condition.

The EISA system ROM initializes the following interrupt and DMA controller configurations after performing all I/O initializations indicated in nonvolatile memory. A device driver may not change the configurations:

- Interrupt controller edge/level register
- DMA controller (Extended Mode Register)
  - DMA channel cycle timing
  - DMA data size and addressing mode
- DMA controller (DMA Command Register)
  - Fixed or rotating priority scheme A DMA device that shares the DMA channel may not change the following DMA controller configuration:

- DMA controller (DMA Command Register)
  - DRQ and DAK* assert level (high/low)

The device driver can use the "Read Function Configuration Information" BIOS routine Call to get the configuration parameters from nonvolatile memory. The configuration parameters returned from nonvolatile memory represent the expansion board configuration initialized by the system ROM power-up routines. Subsequent operation of the expansion board may leave the configuration in a different state. Device drivers can read the expansion board configuration registers to determine the configuration after power-up.

4.13 Creating TYPEs and SUBTYPEs for Devices

The TYPE and SUBTYPE identifiers are used by product independent device drivers to identify, initialize and operate an installed device that is compatible with the device driver. System board and expansion board manufacturers must specify consistent and expandable TYPE and SUBTYPE identifiers for their products.

The following guidelines should be followed when creating TYPE and SUBTYPE strings to assure consistency and expandability.

4.13.1 TYPE Strings

The first segment of the TYPE string should identify the most general device characteristics (such as video, communications port) followed by TYPE string segments that identify more detailed device characteristics (such as VGA video adapter, asynchronous communications port). For example, the TYPE string for a VGA video adapter is "VID,VGA", where "VID" identifies a video board and "VGA" indicates VGA compatibility. The TYPE string for the asynchronous communications port is "COM,ASY", where "COM" identifies a communications board and "ASY" indicates compatibility with the PC-AT asynchronous port.

New TYPE segments should be appended to the TYPE string when a device is enhanced with additional capabilities. A device driver compatible with the original product determines its ability to control the device after checking the original TYPE segments. A device driver that supports enhanced capabilities checks the appended TYPE segments to determine the level of capability supported by the device .

For example, the TYPE string for a VGA video adapter (ACE) with a 1024x768 high resolution mode might be: "VID,VGA,ACE1024X768". Device drivers that support VGA identify the video adapter as VGA compatible and device drivers that support 1024x768 identify the video adapter as compatible with the 1024x768 mode.

Another vendor (XYZ) may offer a compatible video adapter with a new 1280x1024 mode. The TYPE string for the 1280x1024 video adapter might be: "VID,VGA,ACE1024X768,XYZ1280X1024". Device drivers that support VGA identify the video adapter as VGA compatible, device drivers that support 1024x768 identify the video adapter as compatible with the 1024x768 mode, and device drivers that support 1280X1024 identify the video adapter as compatible with the 1280X1024 mode.

4.13.2 SUBTYPE Strings

The SUBTYPE string identifies the device options selected during configuration. A device driver can scan the TYPE string to determine that the device is compatible with the driver, then scan the SUBTYPE string to determine the device configuration. For example, the video adapter described above might use the SUBTYPE field to indicate the power-up video display mode.

```
FUNCTION "VGA Video Adapter"
        TYPE = "VID,VGA,ACE1024x768,XYZ1280x1024"
        CHOICE(1) = "VGA Default Mode"
             SUBTYPE = "DMODE=VGA"
        CHOICE(2) = "1024X768" Default Mode
             SUBTYPE = "DMODE=ACE1024X768"
        CHOICE(3) = "1280X1024" Default Mode
             SUBTYPE = "DMODE=XYZ1280X1024"
```

The device driver can utilize the SUBTYPE string to determine the default mode set during power-up. The TYPE/SUBTYPE string for a selection of VGA as the default power-up video mode is:

"VID,VGA,ACE1024x768,XYZ1280x1024;DMODE=VGA"

A device driver should read the device configuration registers for configuration information that changes during device operation. A driver that needs detailed configuration information not specified in the SUBTYPE string should also read the device configuration registers.

4.13.3 Standard TYPE Table

The following TYPEs should be used wherever possible for the applicable devices. System and expansion board manufacturers can create additional TYPEs for devices that do not apply to the standard TYPEs listed here. For example, a manufacturer of a fax board can create a new TYPE = "FAX" or can use the "COM" prefix (i.e., "COM,FAX"). The new TYPEs become a de facto standard if other vendors use the same TYPE.

The standard device TYPEs for commonly used devices that are part of the industry standard system architecture are listed below.

| DEVICE TYPE | DEVICE DESCRIPTION |
|---|---|
| "COM,ASY" | ISA compatible 8250-based serial port |
| "COM,ASY,FIFO" | ISA compatible 16550-based serial port (with FIFO) |
| "COM,SYN" | ISA compatible SDLC port |
| "KEY,nnn,KBD=xx" | Standard keyboards XX=country,<br>nnn = number of keys.<br>083<br>084<br>101<br>103<br>xx = Keyboard Code<br>AE = Arabic - English<br>AF = Arabic - French<br>AU = Australia<br>BE = Belgium<br>BF = Belgium - Flemish<br>CE = Canadian - English<br>CF = Canadian - French<br>CH = China<br>DN = Denmark<br>DU = Dutch<br>EE = European - English<br>FN = Finland<br>FR = France<br>GR = Germany<br>HA = Hungary<br>IT = Italy<br>IS = Israel<br>KA = Kangi<br>LA = Latin America<br>ME = Middle East<br>NE = Netherlands<br>NO = Norway<br>PO = Portugal<br>SP = Spain<br>SW = Sweden<br>ST = Switzerland<br>SF = Swiss - French<br>SG = Swiss - German<br>TA = Taiwan<br>UK = United Kingdom<br>US = United States |

| DEVICE TYPE | DEVICE DESCRIPTION |
|---|---|
| "CPU,8086"<br>"CPU,80286"<br>"CPU,80386SX"<br>"CPU,80386"<br>"CPU,80486" | 8086 compatible microprocessor<br>80286 compatible microprocessor<br>80386SX compatible microprocessor<br>80386 compatible microprocessor<br>80486 compatible microprocessor |
| "MSD,DSKCTL"<br>"MSD,FPYCTL"<br>"MSD,TAPCTL" | ISA compatible fixed disk controller<br>ISA compatible floppy disk controller<br>Primary tape controller |
| "NPX,287"<br>"NPX,387"<br>"NPX,387SX"<br>"NPX,W1167"<br>"NPX,W3167" | Intel 287 numeric coprocessor<br>Intel 387 numeric coprocessor<br>Intel 387SX numeric coprocessor for 386SX<br>Weitek 1167 numeric coprocessor<br>Weitek 3167 numeric coprocessor |
| "JOY" | ISA compatible joystick adapter |
| "PAR"<br>"PAR,BID" | ISA compatible parallel port<br>Bidirectional parallel port |
| "PTR,8042" | 8042 pointing device (mouse) interface |
| "VID,MDA"<br>"VID,MDA,MGA"<br>"VID,CGA"<br>"VID,CGA,RTR"<br>"VID,CGA"<br>"VID,EGA"<br>"VID,VGA" | ISA compatible monochrome adapter<br>Hercules monochrome adapter<br>Requires no write sync during retrace<br>Requires write sync during retrace<br>ISA compatible CGA adapter<br>ISA compatible EGA adapter<br>ISA compatible VGA adapter |

4.14 Configuration Example

This section contains the configuration data structures associated with an example EISA Ethernet communication board. The example illustrates the configuration information for initialization ports, a DMA channel, an interrupt, RAM memory and ROM memory.

The example includes the configuration file, the configuration data structure returned by a "Read Function Configuration Information" BIOS routine Call, and the configuration data structure passed to the "Write Nonvolatile Memory" BIOS routine.

4.14.1 Configuration File

An example of a configuration file for an ethernet controller board is presented on the following pages. The CFG filename for this file is !ACE105.CFG

```
BOARD
    ID = "ACE0105"
    NAME = "ACME Ethernet Interface board - Revision 5"
    MFR = "ACME Board Manufact."
    CATEGORY = "NET"
    SLOT = EISA
    LENGTH = 330
    READID = yes

IOPORT(1) = 0zc94h
    INITVAL = 0000xxxx

IOPORT(2) = 0zc98h
    INITVAL = xxxxxxxxxxxxxxrr

IOPORT(3) = 0zc9ah
    INITVAL = xxxxxxrr

IOPORT(4) = 0zc9bh
    INITVAL = rrrrrxxx

IOPORT(5) = 0ZC85h
    INITVAL = xxxxxxxx

IOPORT(6) = 0ZC86h
    INITVAL = 0rrxxxxx

IOPORT(7) = 0ZC86h
    INITVAL = 1rrxxxxx

SOFTWARE(1) = "ACELINK.EXE - \n if using MS DOS
    Place the following command line in AUTOEXEC.BAT: \n
    \t\tACELINK /S = n /A = n\n
    Use the following values with the
    /S and /A parameters:"
```

```
; Function description starts here

GROUP = "Ethernet network interface"
    TYPE = "NET,ETH"
FUNCTION = "Network Interface Location"
    CHOICE = "File Server Init. - Node 0"
        SUBTYPE = "LAN0"
        FREE
            INIT = SOFTWARE(1) "/S=1 /A=0"
            INIT = IOPORT(5) LOC (5-2) 0000
    CHOICE = "Network user init. - Node 1"
        SUBTYPE = "LAN1"
        FREE
            INIT = SOFTWARE(1) "/S=0 /A=1"
            INIT = IOPORT(5) LOC (5-2) 0001
    CHOICE = "Network user init. - Node 2"
        SUBTYPE = "LAN2"
        FREE
            INIT = SOFTWARE(1) "/S=0 /A=2"
            INIT = IOPORT(5) LOC (5-2) 0010

; Additional detail may be added

    CHOICE = "Network user init. - Node 15"
        SUBTYPE = "LAN15"
        FREE
            INIT = SOFTWARE(1) "/S=0 /A=15"
            INIT = IOPORT(5) LOC (5-2) 1111

FUNCTION = "System resources alloc./init."
    CHOICE = "System Resources"
; DMA channel operates in Type C (burst) timing
        LINK
            DMA = 5 | 7
                SHARE = no
                SIZE = dword
                TIMING = TYPEC
            INIT = IOPORT(5) LOC (0) 0 | 1
; Interrupt is level-sensitive
        LINK
            IRQ = 2 | 5
                SHARE = yes
                TRIGGER = level
            INIT = IOPORT(5) LOC (1) 0 | 1
```

```
; Network board local ROM
        COMBINE
            MEMORY = 2K
                ADDRESS = 0C0000H | 0D0000h | 0E0000h
                MEMTYPE = oth
                WRITABLE = no
                SHARE = no
                SIZE = byte
                CACHE = yes
                DECODE = 32
            INIT = IOPORT(6) LOC (3-0) 1100 | 1101 | 1110

; Network board local Ram
FUNCTION = "Local RAM Initialization"
    CHOICE = "64K RAM"
        SUBTYPE = "64K"
        COMBINE
            MEMORY = 64K
                ADDRESS = 100000H-1F0000H  STEP = 64K
                WRITABLE = yes
                MEMTYPE = oth
                SIZE = dword
                CACHE = no
            INIT = IOPORT(7) LOC(4 3 2 1 0) 00000-01111
    CHOICE = "128K RAM"
        SUBTYPE = "128K"
        COMBINE
            MEMORY = 128K
                ADDRESS = 100000H-1F0000H  STEP = 64K
                MEMTYPE = oth
                WRITABLE = yes
                SIZE = dword
                CACHE = no
            INIT = IOPORT(7) LOC(4 3 2 1 0) 10000-11111
  ENDGROUP
```

```
; Serial Port section
FUNCTION = "Serial Port"
    TYPE = "COM,ASY"
    CHOICE = "COM1"
        SUBTYPE = "COM1"
        FREE
            IRQ = 4
                SHARE = yes
                TRIGGER = level
            PORT = 3f8h-3ffh
                SHARE = no
                SIZE = byte
            INIT = IOPORT(1) LOC (3-0) 0000
            INIT = IOPORT(2) LOC (15-2) 00000011111100
            INIT = IOPORT(3) LOC (7-2) 110000
            INIT = IOPORT(4) LOC (2-0) 010
    CHOICE = "COM2"
        SUBTYPE = "COM2"
        FREE
            IRQ = 3
                SHARE = yes
                TRIGGER = level
            PORT = 2F8h-2ffh
                SHARE = no
                SIZE = byte
            INIT = IOPORT(1) LOC (3-0) 0000
            INIT = IOPORT(2) LOC (15-2) 00000011111100
            INIT = IOPORT(3) LOC (7-2) 110000
            INIT = IOPORT(4) LOC (2-0) 000

    CHOICE = "Port disable"
        SUBTYPE = "Port disable"
        DISABLE = yes
        FREE
            INIT = IOPORT(4) LOC(0) 0
```

4.14.2 Read Slot Configuration Information BIOS Routine

The following example illustrates a "Read Slot Configuration Information" BIOS routine Call. The data block returned by the BIOS routine indicates an ACME Ethernet Board installed in slot 4.

Assume the following register assignments prior to executing the "Read Slot Configuration Information" BIOS routine Call:

INT 15h, AH=D8h, AL=00h

INPUT:

| | | |
|---|---|---|
| AH = | 0D8h | |
| AL = | 0 | ;Read Slot Configuration Information |
| CL = | 4 | ;Slot number for ACME Ethernet Board |

The following register values illustrate the parameters returned by the "Read Slot Configuration Information" INT15 Call:

OUTPUT:

| | | |
|---|---|---|
| AH | = | 00h--Successful Completion (carry flag = 0) |
| AL | = | 00h--No duplicate IDs and board ID is readable |
| BH | = | 01h--Major Revision Level of Configuration Utility |
| BL | = | 01h--Minor Revision Level of Configuration Utility |
| CH | = | ADh--Checksum of Configuration File (MSByte) |
| CL | = | 09h--Checksum of Configuration File (LSByte) |
| DH | = | 04h--Number of Functions on this board |
| DL | = | 00111111b--Combined Function information byte |
| DI and SI | = | Four byte compressed ID<br>DI(lsb) = 04h (byte 0)<br>DI(msb) = 65h (byte 1)<br>SI(lsb) = 01h (byte 2)<br>SI(msb) = 05h (byte 3) |

4.14.3 Read Function Configuration Information BIOS Routine Call

The following examples illustrate the "Read Function Configuration Information" BIOS routine call. The data block returned by the BIOS routine indicates an ACME Ethernet Board installed in slot 4.

Assume the following register assignments prior to executing the "Read Function Configuration Information" INT15 call:

INT 15h, AH=D8h, AL=01h

INPUT:

```
AH =  0D8h
AL =  01h                 ;Read Function Configuration Information
CL =  04h                 ;Slot number for ACME Ethernet Board
CH =  00h                 ;Read the data block for function 0
DS:SI = 29B9:0600         ;pointer to the data block returned
```

The following register values illustrate the parameters returned by the "Read Function Configuration Information" BIOS routine call:

OUTPUT:

AH = 00h Successful completion (carry flag = 0)

The table on the following page illustrates the data block returned by the "Read Function Configuration Information" BIOS routine call for function 0.

EXTENDED INDUSTRY STANDARD ARCHITECTURE
CONFIDENTIAL INFORMATION OF BCPR SERVICES, INC.

| Off-set | Byte # | Value | Description |
|---|---|---|---|
| 00h | 1 | 04h | 1st Byte Expansion Board ID: ACE0105 (0465h) |
| | 2 | 65h | 2nd Byte Expansion Board ID |
| | 3 | 01h | first and second hex digit of product number |
| | 4 | 05h | third digit of product number/1-digit revision number |
| 04h | 5 | 00h | ID and slot information |
| | 6 | 03h | Miscellaneous ID Information |
| 06h | 7 | 01h | Major Configuration Utility Revision Level |
| | 8 | 01h | Minor Configuration Utility Revision Level |
| 08h | 9 | 00h | 1st Selection |
| | 10 | 00h | 2nd Selection |
| | 11 | 0 | Not Used |
| | : | 0 | " |
| 22h | 35 | 21h | Function information (00001111b) |
| 23h | 36 | N | TYPE string starts here |
| | 37 | E | |
| | 38 | T | |
| | 39 | , | Delimiter that separates TYPE string fragments |
| | 40 | E | |
| | 41 | T | |
| | 42 | H | End of TYPE string |
| | 43 | ; | Delimiter to append subtype string |
| | 44 | L | |
| | 45 | A | |
| | 46 | N | |
| | 47 | 0 | End of SUBTYPE string |
| | 48 | 0 | Not Used |
| | : | 0 | " |
| | 104h | 261 | 80h Initialization Byte IOPORT(1) |
| | 262 | 94h | LSB IOPORT ADDRESS |
| | 263 | 4Ch | MSB IOPORT ADDRESS |
| | 264 | 00h | PORT VALUE |
| | 265 | 85h | Initialization Byte IOPORT(2) |
| | 266 | 98h | LSB IOPORT ADDRESS |
| | 267 | 4Ch | MSB IOPORT ADDRESS |
| | 268 | F0h | LST PORT VALUE |
| | 269 | 03h | MSB PORT VALUE |
| | 270 | 03h | LSB PORT MASK |
| | 271 | 00h | MSB PORT MASK |
| | 272 | 84h | Initialization Byte IOPORT(3) |
| | 273 | 9Ah | LSB IOPORT ADDRESS |
| | 274 | 4Ch | MSB IOPORT ADDRESS |
| | 275 | C0h | PORT VALUE |
| | 276 | 03h | PORT MASK |

| Off-set | Byte # | Value | Description |
|---|---|---|---|
| | 277 | 84h | Initialization Byte IOPORT(4) |
| | 278 | 9Bh | LSB IOPORT ADDRESS |
| | 279 | 4Ch | MSB IOPORT ADDRESS |
| | 280 | 00h | PORT VALUE |
| | 281 | F8h | PORT MASK |
| | 282 | 80h | Initialization Byte IOPORT(5) |
| | 283 | 85h | LSB IOPORT ADDRESS |
| | 284 | 4Ch | MSB IOPORT ADDRESS |
| | 285 | 00h | PORT VALUE |
| | 286 | 84h | Initialization Byte IOPORT(6) |
| | 287 | 86h | LSB IOPORT ADDRESS |
| | 288 | 4Ch | MSB IOPORT ADDRESS |
| | 289 | 0Ch | PORT VALUE |
| | 290 | 60h | PORT MASK |
| | 291 | 04h | Initialization Byte IOPORT(7) |
| | 292 | 86h | LSB IOPORT ADDRESS |
| | 293 | 4Ch | MSB IOPORT ADDRESS |
| | 294 | 80h | PORT VALUE |
| | 295 | 60h | PORT MASK |
| 127h | 296 | 00h | Not Used |
| | . | 00h | " |
| 13Fh | . | 00h | " |

The following table illustrates the data block returned by the "Read Function Configuration Information" BIOS routine call for function 1. The register setup is the same as for the last call except CH=01h.

| Off-set | Byte # | Value | Description |
|---|---|---|---|
| 00h | 1 | 04h | 1st Byte Expansion Board ID: ACE0105 (0465h) |
| | 2 | 65h | 2nd Byte Expansion Board ID |
| | 3 | 01h | first and second digit of product number |
| | 4 | 05h | third digit of product number/1-digit revision number |
| 04h | 5 | 00h | ID and slot information |
| | 6 | 03h | Miscellaneous ID Information |
| 06h | 7 | 01h | Major Configuration Utility Revision Level |
| | 8 | 01h | Minor Configuration Utility Revision Level |
| 08h | 9 | 00h | 1st Selection |
| | 10 | 00h | 2nd Selection |
| | 11 | 00h | 3rd Selection |
| | 12 | 00h | 4th Selection |
| | 13 | 00h | 5th Selection |
| | 14 | 00h | Not Used |
| | . | 00h | " |
| | . | 00h | " |

EXTENDED INDUSTRY STANDARD ARCHITECTURE
CONFIDENTIAL INFORMATION OF BCPR SERVICES, INC.

| Off-set | Byte # | Value | Description |
|---|---|---|---|
| 22h | 35 | 0Fh | Function information (00001111b) |
| 23h | 36 | N | TYPE string starts here |
| | 37 | E | |
| | 38 | T | |
| | 39 | , | Delimiter that separates TYPE string fragments |
| | 40 | E | |
| | 41 | T | |
| | 42 | H | End of TYPE string |
| | 43 | 00h | Not Used |
| | . | 00h | " |
| | . | 00h | " |
| 73h | 116 | 18h | Memory Configuration: ROM - (00011000b) |
| | 117 | 08h | ROM memory size (byte) |
| | 118 | 00h | LSByte ROM Start Address (0D0000h/100h = 0D00h) |
| | 119 | 0Ch | Middle Byte ROM Start Address |
| | 120 | 00h | MSByte of ROM Start Address |
| | 121 | 02h | LSByte ROM size (2048/400h = 0002h) |
| | 122 | 00h | MSByte ROM size |
| | 123 | 00h | Not Used |
| | . | 00h | " |
| | . | 00h | " |
| B2h | 179 | 22h | Interrupt configuration: IRQ2 (00100010b) |
| | 180 | 00h | Reserved |
| | 181 | 00h | Not Used |
| | . | 00h | " |
| | . | 00h | " |
| C0h | 193 | 05h | DMA configuration: DMA channel 5 (00000101b) |
| | 194 | 38h | 32-bit BURST transfers (00111000b) |
| | 195 | 00h | Not Used |
| | . | 00h | " |
| | . | 00h | " |
| C8h | 201 | 00h | Not Used |
| | . | 00h | " |
| | . | 00h | " |

The following table illustrates the data block returned by the "Read Function Configuration Information" BIOS routine call for function 2. The register setup is the same as for the last call except CH=02h.

| Off-set | Byte # | Value | Description |
|---|---|---|---|
| 00h | 1 | 04h | 1st Byte Expansion Board ID: ACE0105 (0465h) |
| | 2 | 65h | 2nd Byte Expansion Board ID |
| | 3 | 01h | first and second hex digit of product number |
| | 4 | 05h | third digit of product number/1-digit revision number |
| 04h | 5 | 00h | ID and slot information |
| | 6 | 03h | Miscellaneous ID Information |
| 06h | 7 | 01h | Major Configuration Utility Revision Level |
| | 8 | 01h | Minor Configuration Utility Revision Level |
| 08h | 9 | 00h | 1st Selection |
| | 10 | 00h | 2nd Selection |
| | 11 | 00h | 3rd Selection |
| | 12 | 00h | Not Used |
| | . | 00h | " |
| | . | 00h | " |
| 22h | 35 | 03h | Function information (00000111b) |
| 23h | 36 | N | TYPE string starts here |
| | 37 | E | |
| | 38 | T | |
| | 39 | , | Delimiter that separates TYPE string fragments |
| | 40 | E | |
| | 41 | T | |
| | 42 | H | |
| | 43 | ; | Delimiter to append subtype string |
| | 44 | 6 | |
| | 45 | 4 | |
| | 46 | K | End of SUBTYPE string |
| | 47 | 00h | Not Used |
| | . | 00h | " |
| | . | 00h | " |
| 73h | 116 | 19h | Memory Configuration: RAM - (00011001b) |
| | 117 | 02h | RAM Memory Data Size (Dword) |
| | 118 | 00h | LSByte ROM Start Address (0D0000h/100h = 0D00h) |
| | 119 | 10h | Middle Byte ROM Start Address |
| | 120 | 00h | MSByte of ROM Start Address |
| | 121 | 40h | LSByte ROM size (2048/400h = 0002h) |
| | 122 | 00h | MSByte ROM size |
| | 123 | 00h | Not Used |
| | . | 00h | " |
| | . | 00h | " |

EXTENDED INDUSTRY STANDARD ARCHITECTURE
CONFIDENTIAL INFORMATION OF BCPR SERVICES, INC.

The following table illustrates the data block returned by the "Read Function Configuration Information" BIOS routine call for function 3. The register setup is the same as for the last call except CH=03h.

| Off-set | Byte # | Value | Description |
|---|---|---|---|
| 00h | 1 | 04h | 1st Byte Expansion Board ID: ACE0102 (0465h) |
| | 2 | 65h | 2nd Byte Expansion Board ID |
| | 3 | 01h | first and second digit of product number |
| | 4 | 05h | third digit of product number/1-digit revision number |
| 04h | 5 | 00h | ID and slot information |
| | 6 | 03h | Miscellaneous ID Information |
| 06h | 7 | 01h | Major Configuration Utility Revision Level |
| | 8 | 01h | Minor Configuration Utility Revision Level |
| 08h | 9 | 01h | 1st Selection |
| | 11 | 00h | 2nd Selection |
| | 12 | 00h | 3rd Selection |
| | 13 | 00h | Not Used |
| | : | 00h | " |
| 22h | 35 | 15h | Function information (00011001b) |
| 23h | 36 | C | TYPE string starts here |
| | 37 | O | |
| | 38 | M | |
| | 39 | , | Delimiter that separates TYPE string fragments |
| | 40 | A | |
| | 41 | S | |
| | 42 | Y | End of SUBTYPE string |
| | 43 | ; | Delimiter to append subtype string |
| | 44 | C | |
| | 45 | O | |
| | 46 | M | |
| | 47 | 2 | End of SUBTYPE string |
| | 48 | 00h | Not Used |
| | : | 00h | " |
| B2h | 179 | 23h | Interrupt configuration: IRQ3 (00100011b) |
| | 180 | 00H | Reserved |
| | 181 | 00h | Not Used |
| | : | 00h | " |
| C8h | 201 | 07h | Port IO Range entry (00000011b) |
| | 202 | F8h | LSB Port Address |
| | 203 | 02h | MSB Port Address |
| | 204 | 00h | Not Used |
| | : | 00h | " |

4.14.4 Write Nonvolatile Memory BIOS Routine CALL

The following example illustrates a Write Nonvolatile Memory BIOS routine call.

INT 15h, AH=D8h, AL=03h

INPUT:

AH = 0D8h
AL = 03h
CX = 0041h
DS:SI = 15AA:0244

OUTPUT:

AH = 00h Successful completion (carry flag = 0)

The data structure that is passed to the Write Nonvolatile Memory BIOS routine for the ACME Ethernet board example:

| Off-set | Byte # | Value | Description |
|---|---|---|---|
| 00h | 1 | 04h | 1st Byte Expansion Board ID: ACE0105 (0465h) |
| | 2 | 65h | 2nd Byte Expansion Board ID |
| | 3 | 01h | first and second digit of product number |
| | 4 | 05h | third digit of product number/1-digit revision number |
| 04h | 5 | 00h | ID and slot information (00000000b) |
| | 6 | 03h | Reserved |
| 06h | 7 | 01h | Major Configuration Utility Revision Level |
| | 8 | 01h | Minor Configuration Utility Revision Level<br>00h if no CFG File Extensions |
| 08h | 9 | 34h | LSB length of function 0 entry |
| | 10 | 00h | MSB length of function 0 entry |
| 0Ah | 11 | 02h | Length of following selections field |
| | 12 | 00h | 1st selection |
| | 13 | 00h | 2nd selection |
| 0Dh | 14 | 21h | Function 0 information byte (00100001b) |
| 0Eh | 15 | 0Ch | Length of following ASCII TYPE string |
| 0Fh | 16 | 4Eh | N TYPE string starts here |
| | 17 | 45h | E |
| | 18 | 54h | T |
| | 19 | 2Ch | , Delimiter- separates TYPE string fragments |
| | 20 | 45h | E |
| | 21 | 54h | T |
| | 22 | 48H | H End of TYPE string |
| | 23 | 3Bh | ; Delimiter to append SUBTYPE string |
| | 24 | 4Ch | L SUBTYPE string starts here |
| | 25 | 41h | A |
| | 26 | 4Eh | N |
| | 27 | 30h | 0 |

| Off-set | Byte # | Value | Description |
|---|---|---|---|
| 1Bh | 28 | 80h | Initialization Byte IOPORT(1) |
| | 29 | 94h | LSB IOPORT ADDRESS |
| | 30 | 4Ch | MSB IOPORT ADDRESS |
| | 31 | 00h | PORT VALUE |
| | 32 | 85h | Initialization Byte IOPORT(2) |
| | 33 | 98h | LSB IOPORT ADDRESS |
| | 34 | 4Ch | MSB IOPORT ADDRESS |
| | 35 | F0h | LST PORT VALUE |
| | 36 | 03h | MSB PORT VALUE |
| | 37 | 03h | LSB PORT MASK |
| | 38 | 00h | MSB PORT MASK |
| | 39 | 84h | Initialization Byte IOPORT(3) |
| | 40 | 9Ah | LSB IOPORT ADDRESS |
| | 41 | 4Ch | MSB IOPORT ADDRESS |
| | 42 | C0h | PORT VALUE |
| | 43 | 03h | PORT MASK |
| | 44 | 84h | Initialization Byte IOPORT(4) |
| | 45 | 9Bh | LSB IOPORT ADDRESS |
| | 46 | 4Ch | MSB IOPORT ADDRESS |
| | 47 | 00h | PORT VALUE |
| | 48 | F8h | PORT MASK |
| | 49 | 80h | Initialization Byte IOPORT(5) |
| | 50 | 85h | LSB IOPORT ADDRESS |
| | 51 | 4Ch | MSB IOPORT ADDRESS |
| | 52 | 00h | PORT VALUE |
| | 53 | 84h | Initialization Byte IOPORT(6) |
| | 54 | 86h | LSB IOPORT ADDRESS |
| | 55 | 4Ch | MSB IOPORT ADDRESS |
| | 56 | 0Ch | PORT VALUE |
| | 57 | 60h | PORT MASK |
| | 58 | 04h | Initialization Byte IOPORT(7) |
| | 59 | 86h | LSB IOPORT ADDRESS |
| | 60 | 4Ch | MSB IOPORT ADDRESS |
| | 61 | 80h | PORT VALUE |
| | 62 | 60h | PORT MASK |
| 3Eh | 63 | 1Ah | LSB length of function 1 entry |
| | 64 | 00h | MSB length of function 1 entry |
| | 65 | 05h | Length of following selections field |
| | 66 | 00h | 1st Selection |
| | 67 | 00h | 2nd Selection |
| | 68 | 00h | 3rd Selection |
| | 69 | 00h | 4th Selection |
| | 70 | 00h | 5th Selection |

| Off-set | Byte # | Value | Description |
|---|---|---|---|
| 46h | 71 | 0Fh | Function 1 Information Byte (00001111h) |
| 47h | 72 | 07h | Length of following ASCII string field |
| 48h | 73 | 4Eh | N Type String Starts Here |
| | 74 | 45h | E |
| | 75 | 54h | T |
| | 76 | 2Ch | , Delimiter that separates TYPE string |
| | 77 | 45h | E |
| | 78 | 54h | T |
| | 79 | 48h | H |
| 4Fh | 80 | 18h | Memory Config Byte (00011010b OTH cacheable ROM) Although this memory is cacheable, caching isn't implemented in this configuration and is so represented. |
| | 81 | 08h | Memory Data Size - Byte |
| | 82 | 00h | LSB Mem Start Address (divided by 100h) |
| | 83 | 0Ch | Middle Mem Start Address |
| | 84 | 00h | MSB Memory Start Address |
| | 85 | 02h | LSB Memory Size (bytes divided by 400h) |
| | 86 | 00h | MSB Memory Size (0002*400 = 800h = 2k) |
| 56h | 87 | 22h | Interrupt Configutation Byte Although this interupt may be shared, it doesn't need to be in this configuration and is so represented. |
| | 88 | 00h | Reserved |
| 58h | 89 | 05h | DMA Configutation: DMA Channel 5 (00000101b) |
| | 90 | 38h | 32-bit BURST Transfers (00111000b) |
| 5Ah | 91 | 18h | LSB length of function 2 entry |
| | 92 | 00h | MSB length of function 2 entry |
| | 93 | 03h | Length of following Selections field |
| | 94 | 00h | 1st Selection |
| | 95 | 00h | 2nd Selection |
| | 96 | 00h | 3rd Selection |
| 60h | 97 | 03h | Function 2 Info. Byte |
| 61h | 98 | 0Bh | Length of follow string field |
| 62h | 99 | 4Eh | N |
| | 100 | 45h | E |
| | 101 | 54h | T |
| | 102 | 2Ch | , Delimiter that separates TYPE string |
| | 103 | 45h | E |
| | 104 | 54h | T |
| | 105 | 48h | H |
| | 106 | 3Bh | ; Delimiter to append SUBTYPE string |
| | 107 | 36h | 6 |
| | 108 | 34h | 4 |
| | 109 | 4Bh | K |

| Off-set | Byte # | Value | Description |
|---|---|---|---|
| 6Dh | 110 | 19h | Memory Configuration Byte (00011001b) |
| | 111 | 02h | Memory Data Size (Dword) |
| | 112 | 00h | LSB Memory Start Address (divided by 100h) |
| | 113 | 10h | Middle Mem Start Address |
| | 114 | 00h | MSB Memory Start Address |
| | 115 | 40h | LSB Memory Size (bytes divided by 400h) |
| | 116 | 00h | MSB Memory Size (0040*400 =10000h = 16k) |
| 74h | 117 | 17h | LSB length of function 3 entry |
| | 118 | 00h | MSB length of function 3 entry |
| 76h | 119 | 03h | Length of following selections field |
| | 120 | 01h | 1st Selection |
| | 121 | 00h | 2nd Selection |
| | 122 | 00h | 3rd Selection |
| 7Ah | 123 | 15h | Function 3 Information Byte |
| 7Bh | 124 | 0Ch | Length of following ASCII string field |
| 7Ch | 125 | 43h | C |
| | 126 | 4Fh | O |
| | 127 | 4Dh | M |
| | 128 | 2Ch | , Delimiter that separates TYPE string |
| | 129 | 41h | A |
| | 130 | 53h | S |
| | 131 | 59h | Y |
| | 132 | 3Bh | ; Delimiter to append SUBTYPE string |
| | 133 | 43h | C |
| | 134 | 4Fh | O |
| | 135 | 4Dh | M |
| | 136 | 32h | 2 |
| 88h | 137 | 23h | Interrupt Configuration Byte<br>Although this interupt may be shared, it doesn't need to be in this configuration and is so represented. |
| | 138 | 00h | Reserved |
| 8Ah | 139 | 07h | Port IO Range entry (00000011b) |
| | 140 | F8h | LSB Port Address |
| | 141 | 02h | MSB Port Address |
| 8Dh | 142 | 00h | LSB Last Function Length = 0 |
| | 143 | 00h | MSB Last Function Length = 0 |
| 8Fh | 144 | 09h | LSB Configuration file Checksum |
| | 145 | ADh | MSB Configuration file Checksum |

5. GLOSSARY

8-bit ISA Slave
This slave device interfaces only to the 8-bit data bus and uses only the ISA signals. This is the simplest and slowest of the slave devices and was first developed for use with the IBM PC®.

16-bit EISA Master
A device that uses the EISA control signals to perform bus operations independent of the host CPU. Data accesses are restricted to the lower 16-bits of the data bus, but all EISA control signals are used.

16-bit EISA Slave
A memory or I/O device that uses the EISA control signals to interface to the bus. Data accesses are restricted to the lower 16-bits of the data bus, but all EISA control signals are used.

16-bit ISA Master
A device that uses the ISA bus control signals to perform bus operations independent of the host CPU. Only the 16-bit ISA data bus and ISA control signals are used, limiting speed and performance. Access is possible to host system memory and I/O, as well as to any slave (ISA or EISA) on the bus.

32-bit Connector
The physical bus connector used in Extended Industry Standard Architecture (EISA) computers to extend the address and data size to 32 bits, and provide the fast cycle timing.

32-bit EISA Master
A device that uses the EISA control signals to perform bus operations independent of the host CPU. Data accesses utilize the full 32 bits of the data bus, and all EISA control signals are used.

32-bit EISA Slave
A memory or I/O device that uses the EISA control signals to interface to the bus. Data accesses utilize the full 32-bits of the data bus, and all EISA control signals are used.

Assert
A signal is asserted by driving it to a logical true state. For positive-true signals this state is high logic voltage, and for negative-true signals this state is the low logic voltage.

---

IBM PC is a registered trademark of International Business of Machines.

Bus Cycle
A bus cycle is the action that occurs on the bus in order to transfer data.

Bus Latency
The time that elapses from when a bus master requests control of the bus until the bus master is given control of the bus.

Bus Transfer
A bus transfer is one or more bus cycles. For example, a DMA transfer consists of many DMA read or write cycles.

Byte Lane
A byte lane is one of the four possible bytes that comprise the 32-bit data path on the EISA bus. Each byte lane corresponds to one of the four byte enable signals BE* <3:0>.

DMA Controller
This device provides control of the larger part of the system's DMA (Direct Memory Access) facility. The DMA controller responds to requests from the DMA device and provides address and control signals to the memory slaves and DMA device.

DMA Device
The DMA device is typically located on a peripheral board on the EISA or ISA bus The DMA device initiates DMA transfers, which are controlled by signals generated by the system DMA controller. The DMA device either presents or receives data during a DMA transfer and uses several signals to inform the DMA controller of the status of the transfer.

EISA Bus
A bus which includes all of the features and facilities provided by the industry standard architecture (ISA) bus and also includes extensions defined in this document. The extensions use an additional connector for new signals which, together with the existing ISA signals, provide the ability to perform additional cycles not available on the ISA bus.

EISA Master
A device which uses EISA's extended control signals to perform bus operations independent of the host CPU. The EISA bus master can request control of the bus, and assume complete control of all signals when it is granted the bus. The master can perform all memory and I/O cycles possible on the EISA bus, accessing both the system and any other such device on the EISA or ISA buses.

EISA Slave
A memory or I/O device which uses EISA's extended control signals to interface to the bus. An EISA slave does not initiate bus cycles. It simply responds to the control signals presented by the host CPU or other bus master.

Float
When a signal is floated it is placed in the high impedance state, no longer driving the signal to a logic 1 or 0.

Host CPU
The main system processor. The host CPU typically has its own local bus allowing the CPU to access cache or local memory without using the EISA bus. The host CPU accesses the EISA bus like any other bus master, with the exception of a few special features. The data size of the host CPU does not determine the EISA bus size; the CPU can have a 8-, 16-, or 32-bit data bus and still access the 16- or 32-bit EISA bus.

ISA Bus
The bus used in the Industry Standard Architecture (ISA) computers (originally embodied in the IBM personal computer AT or PCAT. The ISA bus provides the signals needed to perform the basic memory, I/O, and DMA functions of the system.

ISA Connector
The physical bus connector used in the Industry Standard Architecture (ISA) computers (originally embodied in the IBM personal computer AT or PCAT).

ISA Slave
A device that uses the ISA control signals to interface to the bus. An ISA slave does not initiate bus cycles. It responds to the control signals presented by the host CPU or other bus master.

Negate
A signal is negated by driving it to a logical false state. For positive-true signals this state is the low logic voltage, and for negative-true signals this state is the high logic voltage.

Peripheral
A peripheral is a hardware board that plugs into the ISA or EISA bus connectors. The peripheral contains all of the circuitry associated with the function of the board. The peripheral can be either a bus master or a bus slave.

Slot Specific
The term slot specific is used in reference to certain signals of address ranges which are unique to a particular bus connector.

Index

AC Characteristics 155
Address Bus
  Signal Group 8, 10
Address Decoding
  Embedded Slot 387
  Expansion Board 385
  System Board 387
Address Map
  System I/O 229
ADDRESS Statement 341
Addressing Mode 245
AENx 11
AMPERAGE Statement 309, 327, 355
Arbitration
  DMA 256, 258
Arbitration Priorities
  System 139
Auto Initialize 239
Automatic Configuration
  Devices Supported 295
  EISA Expansion Boards 295
  Expansion Boards 295
  ISA Expansion Boards 295
  Procedure 301
  Software Drivers That Require System Resources 296
  System Board 295
  System Board Peripherals That Use Slot-Specific I/O Space 296
  System Board Peripherals That Use System Board I/O Space 296
Back-to-Back I/O Delay 132
BALE 13
Base Address
  8237-Compatible Segment 250
  High Page Segment 251
  Low Page Segment 250
Base Address Register 250, 251
  16-bit I/O 254
  32-bit I/O 255
  8-bit I/O "Count By Byte" Mode (ISA Compatible) 253
Base Word Count Register 248, 249
BCLK 11
Bitlist 304
Block Transfer Mode 237
Board Identification Block 305, 353
  AMPERAGE Statement 309
  BOARD Statement 306
  BUSMASTER Statement 309
  CATEGORY Statement 307
  COMMENTS Statement 310
  DISABLE Statement 310
  HELP Statement 310
  ID Statement 306
  IOCHECK Statement 310
  LENGTH Statement 308
  MFR Statement 307
  NAME Statement 306
  READID Statement 309
  SKIRT Statement 309
  SLOT Statement 307
BOARD Statement 306
Buffer Chaining 240
Buffer Chaining Mode
  Enable/Disable 246
Burst Bus Masters 110
Burst Cycles 42, 50
Burst DMA 73
Burst EISA DMA Devices 122
Bus Access
  Granting 16
  Requesting 16
Bus Arbitration 4, 135
Bus Arbitration Signals 16
Bus grant latency 142
Bus Master 104
  Capabilities 4
  Last Granted 285
Bus Master Arbitration Cycle 147
Bus Master Cycles 27, 42
Bus Master Latency 146
Bus Master Status Latch
  32-bit 286
Bus Reset 282
Bus Signals 19
  AENx 11
  BALE 13
  BCLK 11
  BE*<3:0> 8
  CHRDY 15
  CMD* 13
  DAK* 17
  DRQ 17
  EX16* 12
  EX32 12
  EXRDY 13
  IO16* 15
  IOCHK* 18
  IORC* 14
  IOWC* 14
  IRQ 18
  LOCK* 12
  M-IO 12

Index

M16* 15
MAKx* 16
MASTER16* 17
MRDC* 14
MREQx* 16
MSBURST 11
MWTC* 14
NOWS* 15
OSC 18
REFRESH* 18
RESDRV 18
SBHE* 11
SLBURST 12
SMRDC* 14
SMWTC* 14
START* 13
Summary 19
T-C 17
W-R 13
Bus Timeout 282
BUSMASTER Statement 309, 355
CACHE Statement 343
Capacitive Loading Requirements 154
Cascade Mode 239
CATEGORY Statement 307
CFG File Extension Revision Level 362, 367
Chaining Mode Register 245, 246
Chaining Mode Status Register 247
Channel Interrupt Status Register 247
CHOICE Statement 322, 325
CHOICE Statement Block 325
AMPERAGE Statement 327
CHOICE Statement 325
DISABLE Statement 325
SUBTYPE Statement 326
TOTALMEM Statement 327
CHRDY 15
Clear Byte Pointer 243
Clear Mask Register 243
Clock 18
CMD* 13
COMBINE Groups 349
COMMENTS Statement 310, 316, 320, 324
COMPRESSED Cycles 42, 48
Compressed ID 361, 366
Compressed Manufacturer Code 389
Configuration File 404
Board Identification Block 305
CHOICE Statement Block 325
Format 305
FUNCTION Statement Block 322
Initialization Information Block 311
Resource Description Block 334
Resource Groupings 348
SUBCHOICE Statement Block 327
Syntax 301
System Board 353
Board Identification Block 353
BUSMASTER Statement 355
LENGTH Statement 355
NONVOLATILE Statement 354
SKIRT Statement 355
SLOT Statement Block 355
System Description Block 353
System Statement 353
Configuration File Filenames 300
Configuration Files 298
Configuration Information,
System Software Use of 397
Configuration Utility 297
CONNECTION Statement 324
Counter Latch Command 292
Counter Read Operation 291
Counter Read-Back Command 292
Counter Status Byte 293
CPU Latency 144
Current Address,
8237 Compatible Segment 251
High Page Segment 252
Low Page Segment 252
Current Address Register 251, 252
Current Word Count Register 249, 250
D<15:8> 9
D<23:16> 9
D<31:24> 9
D<7:0> 10
DAK*<3:0> 17
DAK*<7:5> 17
Data Bus
Signal Group 8
Data Bus Translations 79
16- or 32-bit DMA Device to 8- or 16-bit ISA Memory 94
16-bit DMA Device to 32-bit EISA Memory 93
16-bit EISA Bus Master to 32-bit EISA Slave 83
16-bit ISA Bus Master to EISA Slaves 86
32-/16-bit EISA Bus Master to 8-bit ISA Slave 85
32-bit DMA Device to 16-bit EISA Memory 92
32-bit EISA Bus Master to 16-bit EISA Slave 79

Index

Read Cycles 80
Write Cycles 81
32-bit EISA Bus Master to 16-bit ISA Slave 83
Read Cycles 84
Write Cycles 85
8-bit DMA Device to 16- or 32-bit EISA Memory 93
Data Bus
D<15:8> 9
D<23:16> 9
D<31:24> 9
D<7:0> 10
Data Size Translation 4
Data Transfer Protocol
Synchronous 2
Data Transfer Type 257
DC Characteristics 151
DECODE Statement 343
Demand Transfer Mode 238
DISABLE Statement 310, 325
DMA
32-bit Address Support 2
Acknowledge 17
Addressing
32-bit 253
ISA Compatible 252
Arbitration Priority 256
Auto-initialize 239
Block Mode, 235
Block Transfer Mode 237
Buffer Chaining 240
Burst DMA Timing 244
Cascade Mode 236, 239
Cycle Types 3
DEMAND Mode 235
Demand Transfer Mode 238
Description 235
Enhanced Functions 2
ISA Compatible BLOCK Mode 143
ISA Compatible Demand Mode 143
ISA Compatible Timing Mode 236
Master Condition 236
Registers
High Page 236
Low Page 236
Request 17
Ring Buffers 241
Single Transfer Mode 237
Slave Condition 237
Software Commands 243
Clear Byte Pointer 243
Clear Mask Register 243
Master Clear 243
Terminal Count 260
Timing Mode 244, 245
Transfer Combinations 261, 262
Transfer Types 239
Type "A," Timing 244
Type "B," Timing 244
Word Count
32-bit 253
ISA Compatible 252
DMA Channel Description 364
DMA Channel Description Block 334, 335
DMA Channel Mode Select 257
DMA Channel Select 245, 246, 256, 257, 258
DMA Command Register 256
DMA Controller 235, 236
DMA Controller Registers 243
Base Address Register 250
Base Word Count Register 248
Chaining Mode Register 245
Chaining Mode Status Register 247
Channel Interrupt Status Register 247
Current Address Register 251
Current Word Count Register 249
DMA Command Register 256
DMA Status Register 260
Extended Mode Register 243
Mask Registers 258
Mask Status Register 259
Mode Register 257
Request Register 258
DMA Cycles 55
Burst 55
ISA Compatible 55
Type "A" 55, 63
Type "B" 55, 68
Type "C" 73
DMA device
Data Transfer Timing Size 235
DMA Devices 115
Data Transfers from 3
Performance 3
DMA Latency 143
DMA Statement 336
DMA Status Register 260
DMA Transfers
Misaligned 131
Downshift Burst Bus Masters 113
DRAM
Refresh 18
DRQ<3:0> 17

Index

DRQ<7:5> 17
Edge/Level Triggered Control Register 275
EISA
  Features 6
  Pin-out 226
EISA Bus 8
  Signals 8
EISA Connector 213
  Compatibility 213
  Environmental Performance 215
  Materials 215
  Physical Characteristics 214
  Specifications 215
EISA CPU Cycles 42
EISA Devices 97
  Burst Bus Masters 122
  Burst DMA Devices 122
  Bus Masters 104
  DMA Devices 115
  Downshift Burst Bus Masters 113
  I/O Slaves 103
  Memory Slaves 97
  Non-Burst EISA DMA Devices 119
  System Board 131
EISA System Configuration 294
Electrical Specifications 151
Embedded Devices 394
End of Interrupt
  Automatic 277
  Command 277
  Handling 277
EX16* 12
EX32* 12
Expansion Board
  Identifying 392, 394
Expansion Board Control Bits 395
  Enable 395
  IOCHKERR 395, 396
  IOCHKRST 396
Expansion Board Identifier 299
EXRDY 13
Extended Addressing Mode 235
Extended Mode Register 243
FACTORY Statement 316, 320
Fail-safe Timer 281
Fixed Priority Mode 278
Flow Diagrams 43
Free Groups 351
Free-form Configuration Data Block Structure 365
Free-form Data 375
Fully Nested Mode 277
FUNCTION Statement 322, 323
FUNCTION Statement Block 322
  CHOICE Statement Block 325
  COMMENTS Statement 324
  CONNECTION Statement 324
  FUNCTION Statement 323
  HELP Statement 324
  SUBCHOICE Statement Block 327
  SUBFUNCTION Statement Block 329
  TYPE Statement 323
GROUP and ENDGROUP Statements 333
GROUP Statement Block 331
  ENDGROUP Statement 333
  GROUP Statement 333
HELP Statement 310, 316, 320, 324
I/O Address Decoding 134
I/O Address Map
  EISA System 384
I/O Addresses 228
I/O Control Functions
  System Board 228
I/O Cycles
  16-bit 39
  8-bit 31
  Standard 42
I/O Delay
  Back-to-Back 132
I/O Port Description Block 334, 339
I/O Port Initialization 299
I/O Port Initialization Statement Block 311
I/O Ports
  System Board 230
I/O Slaves 103
ID and Slot Information 361, 366
ID Statement 306
In-Service Register 276
INIT Statements 345
  I/O Ports 345
  Jumper 346
  Software 347
  Switch 346
Initialization and Control Registers 268
Initialization Data 365
Initialization for EISA Expansion Boards, By Device Driver 399
Initialization Information Block 311
  I/O Port Initialization 311
    INITVAL Statement 312
    IOPORT(i) Statement 312
    SIZE Statement 312
  Jumper Configuration Statement Block 317
    COMMENTS Statement 320

Index

FACTORY Statement 320
HELP Statement 320
INITVAL Statement 320
JTYPE Statement 317
LABEL Statement 319
NAME Statement 317
REVERSE Statement 318
VERTICAL Statement 318
SOFTWARE(i) Statement 321
Switch Configuration
COMMENTS Statement 316
FACTORY Statement 316
HELP Statement 316
INITVAL Statement 315
LABEL Statement 315
NAME Statement 313
REVERSE Statement 314
STYPE Statement 314
SWITCH(i) Statement 313
VERTICAL Statement 314
Switch Configuration Statement Block 313
Initialization of EISA Systems 379
Initialization Sequence
Slot 380
INITVAL Statement 312, 315, 320
Intelligent Peripherals
See Bus Master
Interrupt 18
See also, End of Interrupt 277
Interrupt Controller 265
BIOS Initialization Sequence 267
Edge/Level Control Register 275
I/O Address Map 265
In-Service Register 276
Initialization 266
Initialization and Control Registers 268
Initialization Command Word 1 268
Initialization Command Word 2 269
Initialization Command Word 3 270
Initialization Command Word 4 271
Initialization Command Words 268
Interrupt Mask Register 271
Interrupt Request Register 276
Master 265
Modes
Fixed Priority 278
Fully Nested 277
Polled 279
Rotating Priority 278
Special Fully Nested 278
Special Mask 280
Operation Control Word 2 272
Operation Control Word 3 274
Slave 265
Interrupt Description Block 334, 338
Interrupt Mask Register 271, 272
Interrupt Request Register 276
Interrupt requests
Multiple 278
Interrupt Sequence 265
Interrupts
Clear 279
Edge/Level Triggered 4
Non-maskable 281
Pending 278
Interval timer
Control Word Format 289
Counter Initial Count Value 291
Counter Latch Command 292
Counter Operating Modes 290
Counter Read Operation 291
Counter Read-Back Command 292
Functions 288
Monitoring Status 291
Programming 289
Interval Timers 287
IO16* 15
IOCHECK Statement 310
IOCHK* 18
IOPORT(i) Statement 312
IORC* 14
IOWC* 14
IRQ 18
IRQ Statement 338
ISA,
Compatibility with 1
ISA CPU Cycles 27
ISA Cycles 23
JTYPE Statement 317
Jumper Configuration Statement Block 317
JUMPER(i) Statement 317
Jumperlist 304
LABEL Statement 315, 319
Latency
CPU 144
DMA 143
EISA Bus Master 146
NMI 145
Refresh 144
LENGTH Statement 355
LINK Groups 348
List 303
Load Capacitance 155
LOC(jumperlist) 318

Index

LOC(switchlist) 314
LOCK* 12, 95
Locked Cycles 95
M16* 15
Main Memory Access 131
MAKx* 16
Mask Registers 258
  Write All Mask Bits 259
  Write Single Mask Bit 259
Master Clear 243
MASTER16* 17
Mechanical Specifications 213
Memory Capacity 1
Memory Configuration 363
Memory Cycles
  16-bit 35
  8-bit 27
  Standard 42
Memory Description Block 334, 341
Memory Map Initialization
  Noncacheable 383
  Writable 383
Memory Refresh 149, 282
Memory Slave 97
MEMORY Statement 341
MEMTYPE Statement 342
MFR Statement 307
Misaligned DMA Memory Reads (I/O Writes) 131
Misaligned DMA Memory Writes (I/O Reads) 131
Misaligned DMA Transfers 131
Mode Register 257
MRDC* 14
MREQx* 16
MSBURST* 11, 50, 73, 74, 122
MWTC* 14
M-IO 12, 83
NAME Statement 306, 313, 317
NMI 18, 281
  Enable/Disable 285
  Real-time Clock Address Port 285
  Software NMI Generation Port 285
NMI Latency 145
NMI Status and Control Port
  Extended 284
NMI Status and Control Ports 283
No Wait State
  See NOWS* 15
Non-burst DMA Devices 119
Non-maskable Interrupts
  Assertion of IOCHK* 281
  Bus Reset 282
  Bus Timeout 282
  Fail-Safe Timer Timeout 281
  Memory Refresh 282
  Parity Error from System Memory 281
  See also NMI 281
  Software Generated NMI 282
  Speaker Control 282
Nonvolatile Memory
  Initializing 379
NONVOLATILE Statement 354
NOWS* 15
OSC 18
Parameterlist 304
Parity Error
  System Memory 281
Pin-out 226
Poll Command 276
Polled Mode 279
Port I/O Information 364
PORT Statement 340
PORTVAR(j) Variable 352
Power Consumption 151
Power-up Routine 379
Priority
  Fixed 139
  Rotating 139
Product ID 299
  EISA Expansion Board 392
Product Identifier 389
Programmable Port Initialization Block 334
Rangelist 303
READID Statement 309
Refresh Controller 149
Refresh Latency 144
REFRESH* 18, 97, 149
Request Register 258
RESDRV 18
Reset
  Hardware 18
Resource Description Block 334
  DMA Channel Description Block 335
    DMA Statement 336
    SHARE Statement 337
    SIZE Statement 337
    TIMING Statement 337
  I/O Port Description Block 339
    PORT Statement 340
    SHARE Statement 340
    SIZE Statement 340
  Interrupt Description Block
    IRQ Statement 338

Index

SHARE Statement 339
TRIGGER Statement 339
Memory Description Block 341
ADDRESS Statement 341
CACHE Statement 343
DECODE Statement 343
MEMORY Statement 341
MEMTYPE Statement 342
SHARE Statement 343
SIZE Statement 342
TOTALMEM Statement 327, 343
WRITABLE Statement 342
Resource Group 348
Resource Groupings
Combine 348
Free 348
Link 348
REVERSE Statement 314, 318
Ring Buffer
Data Structure 242
Ring Buffers 241
ROM BIOS Routine Calls
Clear Nonvolatile Memory 368
EISA System 356
Identify System Board Type 357
Read Function Configuration Information 359, 408
Read Slot Configuration Information 358, 408
Write Nonvolatile Memory 368, 416
ROM Operations
EISA System 356
Rotating Priority Mode 278
SBHE* 11
Scatter-gather 4
Semaphores 12
SHARE Statement 337, 339, 340, 343
Signal Routing 154
Signal Translations 236
Signal Usage
EISA Expansion Boards 22
ISA Expansion Boards 21
System Board 20
Single Transfer Mode 237
SIZE Statement 312, 337, 340, 342
SKIRT Statement 309, 355
SLBURST* 12, 73
Slot Initialization
Error Handling 382
Slot Search
by a Product Dependent Device Driver 398
by Product Independent Device Driver 397
SLOT Statement 307
EISA 308
EMB[(n)] 308
ISA16 308
ISA8 307
ISA8OR16 308
OTHER 308
VIR 308
SLOT Statement Block 355
Slot-specific I/O 132
SMRDC* 14
SMWTC* 14
Software Commands 243
Software Generated NMI 282
Software Initialization Block 334
SOFTWARE(Initialization) Statement Block 321
Speaker Control 282
Special Fully Nested Mode 278
Special Mask Mode 280
Standard Configuration Data Block Structure 360, 369
START* 13, 15
STYPE Statement 314
SUBCHOICE Statement 329
SUBCHOICE Statement Block 327
SUBCHOICE Statement 329
SUBFUNCTION Statement 330
SUBFUNCTION Statement Block 329
AMPERAGE Statement 327
SUBFUNCTION Statement 329, 330
SUBTYPE Statement 326
SUBTYPE
Creating 400
SUBTYPE ASCII String 362, 367
SUBTYPE Statement 326
SUBTYPE String
Device Driver Search 398
SUBTYPE Strings 401
Switch and Jumper Description Blocks 334
Switch Configuration Statement Block 313
SWITCH(i) Statement 313
Switchlist 304
System Arbitration Priorities 139
System Board 131
I/O Address Decoding 134
System Board ID 390
System Configuration
Automatic 5
System Description Block 353
System Resource Requests 299
DMA channels 299

We claim:

1. For use with a computer system having a fault tolerant, intelligent mass storage disk array subsystem, the disk subsystem having a microprocessor based controller, a method for rebuilding a replacement disk drive within the array without system processor supervision or suspension of system operations comprising:

reading disk array and disk drive status information and fault tolerance mode for the disk array from reserved sectors on all disk drives within the drive array;

reading disk array and disk drive status information and fault tolerance mode for the disk array from reserved sectors on all disk drives within the drive array;

determining if one or more of the drives in the array has been replaced from disk drive status information;

reading all sectors on the replacement drive, thereby causing a failed sector read to occur when attempting to read the replacement drive sectors, indicating a sector to be restored;

generating rebuild commands for the replacement disk by writing to each failed sector utilizing the active fault tolerance mode;

queueing the rebuild commands; and executing the rebuild commands by the microprocessor controller independent of the computer system processor, thereby restoring data to the replacement disk drive.

2. The method of claim 1, wherein determining if one or more of the disk drives in the disk array is a replacement drive includes running a drive array check program by the microprocessor controller at each computer system power-up.

3. The method of claim 1, wherein determining if one or more of the disk drives in the disk array is a replacement drive includes running a drive array check program at periodic intervals by the microprocessor controller.

4. The method of claim 2, wherein determining if one or more of the disk drives in the disk array is a replacement drive includes comprising individual disk drive information to a disk array configuration template maintained by the microprocessor controller.

5. The method of claim 3, wherein determining if one or more of the disk drives in the disk array is a replacement drive includes comparing individual disk drive information to a disk array configuration template maintained by the microprocessor controller.

6. The method of claim 1, wherein reading all sectors on the replaced drive includes creating an information packet for each sector on the drive, the information packet including drive array and disk drive information from a disk array configuration template, a read command and physical drive parameters indicating the location of the sector to be read.

7. The method of claim 6, wherein generating rebuild commands includes:

creating a rebuild header command, including information from the drive array and disk drive configuration template, the fault tolerance mode and instructions to activate the fault recovery mode;

changing the read command for each sector in the replacement drive to a write command; and linking all of the write commands to the rebuild command header.

8. The method of claim 7, wherein the method of restoring data to the replacement disk drive includes writing the restored data to the replacement disk from a mirror data disk.

9. The method of claim 7, wherein the method of restoring data to the replacement disk drive includes, generating the restored data utilizing an XOR parity technique from data on the remaining disks within the array.

10. The method of claim 9, wherein the method of generating the restored data includes generating the restored data utilizing a dedicated XOR parity engine within the disk array subsystem.

* * * * *

UNITED STATES PATENT AND TRADEMARK OFFICE
CERTIFICATE OF CORRECTION

PATENT NO. : 5,101,492

DATED : March 31, 1992

INVENTOR(S) : Stephen M. Schultz, et al.

It is certified that error appears in the above-identified patent and that said Letters Patent is hereby corrected as shown below:

Col. 883,

In Claim 1, please delete lines 12-15.

Col. 884,

In Claim 4, line 2, please delete "comprising" and replace with --comparing--.

Signed and Sealed this

First Day of February, 1994

*Attest:*

BRUCE LEHMAN

*Attesting Officer*

*Commissioner of Patents and Trademarks*